US012520717B2

(12) United States Patent
Ko et al.

(10) Patent No.: US 12,520,717 B2
(45) Date of Patent: Jan. 6, 2026

(54) LIGHT-EMITTING DEVICE AND ELECTRONIC APPARATUS INCLUDING SAME

(71) Applicant: Samsung Display Co., Ltd., Yongin-si (KR)

(72) Inventors: Soobyung Ko, Yongin-si (KR); Sujin Shin, Yongin-si (KR); Eunsoo Ahn, Yongin-si (KR); Jaejin Lyu, Yongin-si (KR); Jihyung Lee, Yongin-si (KR); Junghoon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1112 days.

(21) Appl. No.: 17/305,557

(22) Filed: Jul. 9, 2021

(65) Prior Publication Data

US 2022/0024958 A1 Jan. 27, 2022

(30) Foreign Application Priority Data

Jul. 13, 2020 (KR) ........................ 10-2020-0086448

(51) Int. Cl.

| | |
|---|---|
| ***C07F 1/00*** | (2006.01) |
| ***C07F 15/00*** | (2006.01) |
| ***H10K 50/11*** | (2023.01) |
| ***H10K 50/16*** | (2023.01) |
| ***H10K 50/17*** | (2023.01) |
| ***H10K 59/12*** | (2023.01) |
| ***H10K 85/30*** | (2023.01) |
| ***H10K 85/40*** | (2023.01) |
| ***H10K 85/60*** | (2023.01) |
| ***H10K 101/10*** | (2023.01) |
| ***H10K 101/20*** | (2023.01) |
| ***H10K 101/30*** | (2023.01) |
| ***H10K 101/40*** | (2023.01) |
| *G02B 5/20* | (2006.01) |

(52) U.S. Cl.

CPC ............. *H10K 85/636* (2023.02); *C07F 1/00* (2013.01); *C07F 15/0086* (2013.01); *H10K 59/12* (2023.02); *H10K 85/346* (2023.02); *H10K 85/40* (2023.02); *H10K 85/6572* (2023.02); *H10K 85/6574* (2023.02); *H10K 85/658* (2023.02); *G02B 5/20* (2013.01); *H10K 50/11* (2023.02); *H10K 50/16* (2023.02); *H10K 50/171* (2023.02); *H10K 2101/10* (2023.02); *H10K 2101/20* (2023.02); *H10K 2101/30* (2023.02); *H10K 2101/40* (2023.02)

(58) Field of Classification Search

CPC .... H10K 85/654; H10K 85/658; H10K 50/11; H10K 50/16; H10K 50/171; H10K 50/18; H10K 2101/10; H10K 2101/30; H10K 2101/40; H10K 59/12; H10K 50/121; H10K 2101/20; H10K 2101/90; H10K 85/657; H10K 85/636; H10K 85/346; C07F 15/0086; C07F 1/00

See application file for complete search history.

(56) References Cited

U.S. PATENT DOCUMENTS

| | | | |
|---|---|---|---|
| 7,381,479 | B2 | 6/2008 | Lamansky et al. |
| 7,393,599 | B2 | 7/2008 | Thompson et al. |
| 7,585,573 | B2 | 9/2009 | Lee et al. |
| 7,776,458 | B2 | 8/2010 | Ragini et al. |
| 8,106,199 | B2 | 1/2012 | Jabbour et al. |
| 8,389,725 | B2 | 3/2013 | Li et al. |
| 8,669,364 | B2 | 3/2014 | Li et al. |
| 8,680,760 | B2 | 3/2014 | Cheng et al. |
| 8,816,080 | B2 | 8/2014 | Li et al. |

(Continued)

FOREIGN PATENT DOCUMENTS

| | | |
|---|---|---|
| CN | 104370974 A | 2/2015 |
| CN | 109384802 A | 2/2019 |

(Continued)

OTHER PUBLICATIONS

Min et al. US 2021/0171548 A1 as evidenced by Table of Isotopic Masses and Natural Abundance (2014). Retrieved on Apr. 5, 2025 from https://issuu.com/e_generation/docs/stable-isotopes. (Year: 2014).*

(Continued)

*Primary Examiner* — Amanda L. Aguirre

(74) *Attorney, Agent, or Firm* — Womble Bond Dickinson (US) LLP

(57) ABSTRACT

A light-emitting device includes a first compound represented by Formula 1; and a second compound, a third compound, a fourth compound, or any combination thereof, each having a specific formula:

Formula 1

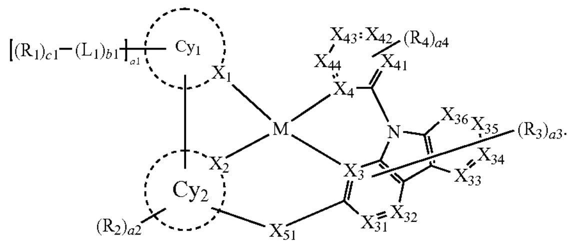

emitting device may have excellent driving voltage, current density, high luminescence efficiency, and long lifespan, and may be used in the manufacture of a high quality electronic apparatus.

19 Claims, 7 Drawing Sheets

(56) References Cited

U.S. PATENT DOCUMENTS

| | | | | |
|---|---|---|---|---|
| 8,846,940 | B2 | 9/2014 | Li et al. | |
| 8,946,417 | B2 | 2/2015 | Jian et al. | |
| 9,051,344 | B2 | 6/2015 | Lin et al. | |
| 9,076,974 | B2 | 7/2015 | Li et al. | |
| 9,203,039 | B2 | 12/2015 | Li et al. | |
| 9,221,857 | B2 | 12/2015 | Li et al. | |
| 9,224,963 | B2 | 12/2015 | Li et al. | |
| 9,238,668 | B2 | 1/2016 | Li et al. | |
| 9,312,502 | B2 | 4/2016 | Li et al. | |
| 9,324,957 | B2 | 4/2016 | Li et al. | |
| 9,331,290 | B2 | 5/2016 | Stoessel et al. | |
| 9,382,273 | B2 | 7/2016 | Li et al. | |
| 9,425,415 | B2 | 8/2016 | Li et al. | |
| 9,698,359 | B2 | 7/2017 | Li et al. | |
| 9,899,614 | B2 | 2/2018 | Li et al. | |
| 10,008,678 | B2 | 6/2018 | Tsai et al. | |
| 10,211,414 | B2 | 2/2019 | Li et al. | |
| 10,700,295 | B2 | 6/2020 | Bochmann et al. | |
| 2005/0287394 | A1 | 12/2005 | Yang et al. | |
| 2008/0018221 | A1 | 1/2008 | Egen et al. | |
| 2009/0072734 | A1 | 3/2009 | Harada et al. | |
| 2014/0309428 | A1 | 10/2014 | Egen et al. | |
| 2019/0051841 | A1 | 2/2019 | Sim et al. | |
| 2019/0109287 | A1 | 4/2019 | Wu et al. | |
| 2019/0119312 | A1 | 4/2019 | Chen et al. | |
| 2019/0131544 | A1 | 5/2019 | Park et al. | |
| 2019/0153308 | A1 | 5/2019 | Li et al. | |
| 2019/0296254 | A1 | 9/2019 | Ko et al. | |
| 2019/0322928 | A1 | 10/2019 | Li et al. | |
| 2020/0199164 | A1 | 6/2020 | Kim et al. | |
| 2021/0171548 | A1* | 6/2021 | Min | C07F 15/0086 |
| 2021/0367167 | A1* | 11/2021 | Lee | H10K 85/346 |
| 2022/0013738 | A1* | 1/2022 | Han | H10K 85/346 |
| 2022/0093878 | A1* | 3/2022 | Kim | H10K 85/346 |

FOREIGN PATENT DOCUMENTS

| | | | |
|---|---|---|---|
| CN | 110299457 | A | 10/2019 |
| EP | 3544076 | A1 | 9/2019 |
| JP | 2007-045742 | A | 2/2007 |
| JP | 2008-140786 | A | 6/2008 |
| JP | 2019-169710 | A | 10/2019 |
| JP | 2021-084910 | A | 6/2021 |
| KR | 10-0730115 | B1 | 6/2007 |
| KR | 10-2013-0095259 | A | 8/2013 |
| KR | 10-2014-0144152 | A | 12/2014 |
| KR | 10-1636100 | B1 | 7/2016 |
| KR | 10-2018-0055853 | A | 5/2018 |
| KR | 10-2019-0112232 | A | 10/2019 |
| KR | 10-2020-0076583 | A | 6/2020 |
| WO | 2006/106826 | A1 | 10/2006 |
| WO | 2006/109526 | A1 | 10/2006 |
| WO | WO 2012/121936 | A2 | 9/2012 |

OTHER PUBLICATIONS

Han, Si Hyun et al: "Ideal blue thermally activated delayed fluorescence emission assisted by a thermally activated delayed fluorescence assistant dopant through a fast reverse intersystem crossing mediated cascade energy transfer process", Journal of Materials Chemistry C, vol. 7, 10,Jan. 1, 2019, pp. 3082-3089, XP055687954, GN ISSN:2050-7226, DOI: 10.1039/C8TC06575F.

Liang, Xiao et al: "Peripheral Amplification of Multi-Resonance Induced Thermally Activated Delayed Fluorescence for Highly Efficient OLEDs", Angewandte Chemie International Edition, vol. 57, No. 35, Jul. 30, 2018 (Jul. 30, 2018), pp. 11316-11320, XP055537488, ISSN: 1433-7851, DOI: 10.1002/anie.201806323.

* cited by examiner

LIGHT-EMITTING DEVICE AND ELECTRONIC APPARATUS INCLUDING SAME

CROSS-REFERENCE TO RELATED APPLICATION

This application claims priority to and the benefit of Korean Patent Application No. 10-2020-0086448, filed on Jul. 13, 2020, in the Korean Intellectual Property Office, the entire content of which is incorporated herein by reference.

BACKGROUND

1. Field

One or more aspects of embodiments of the present disclosure relate to a light-emitting device and an electronic apparatus including the light-emitting device.

2. Description of Related Art

Light-emitting devices are self-emission devices that have wide viewing angles, high contrast ratios, short response times, and excellent characteristics in terms of brightness, driving voltage, and/or response speed.

Light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state to thereby generate light.

SUMMARY

One or more aspects of embodiments of the present disclosure are directed toward a light-emitting device having high luminescence efficiency and long lifespan and an electronic apparatus including the light-emitting device.

Additional aspects will be set forth in part in the description which follows and, in part, will be apparent from the description, or may be learned by practice of the presented embodiments of the disclosure.

According to one or more embodiments, a light-emitting device may include:

a first electrode;

a second electrode facing the first electrode; and an interlayer located between the first electrode and the second electrode, the interlayer including an emission layer, wherein the interlayer may include:

i) a first compound represented by Formula 1; and ii) a second compound including at least one π electron-deficient nitrogen-containing $C_1$-$C_{60}$ cyclic group, a third compound including a group represented by Formula 3, a fourth compound capable of emitting delayed fluorescent light, or any combination thereof, and the first compound, the second compound, the third compound, and the fourth compound may be different from one another:

Formula 1

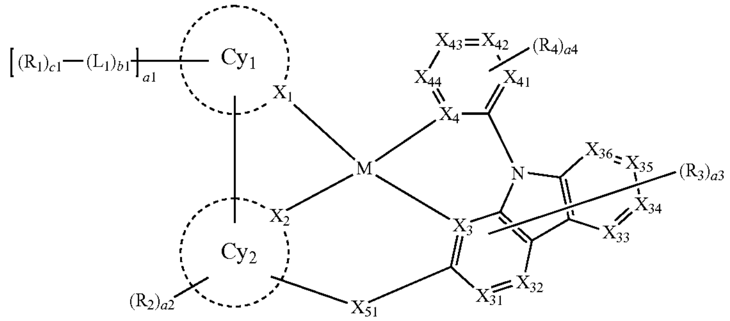

Formula 3

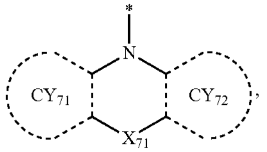

wherein, in Formula 1, M may be platinum (Pt), palladium (Pd), gold (Au), nickel (Ni), silver (Ag), or copper (Cu), in Formula 1, $X_1$ to $X_4$ may each independently be C or N, in Formula 1, i) a bond between $X_1$ and M may be a coordinate bond, and ii) one of a bond between $X_2$ and M, a bond between $X_3$ and M, and a bond between $X_4$ and M may be a coordinate bond, and the other two bonds may each be a covalent bond, in Formula 1, ring $CY_1$ may be i) a $X_1$-containing 5-membered ring, ii) a $X_1$, containing 5-membered ring condensed with at least one 6-membered ring, or iii) a $X_1$-containing 6-membered ring, in Formula 1, ring $CY_2$ may be a $C_3$-$C_{60}$ carbocyclic group or a $C_1$-$C_{60}$ heterocyclic group, in Formula 1, $X_{31}$ to $X_{36}$ and $X_{41}$ to $X_{44}$ may each independently be C or N, in Formula 1, $X_{51}$ may be *—N($R_5$)—*', *—B($R_5$)—*', *—P($R_5$)—*', *—C($R_{5a}$)($R_{5b}$)—*', *—Si($R_{5a}$)($R_{5b}$)—*, *—Ge($R_{5a}$)($R_{5b}$)—*', *—S—*', *—Se—*', *—O—*', *—C(═O)—*', *—S(═O)—*', *—S(═O)$_2$—*', *—C($R_5$)=*', *═C($R_5$)—*', *—C($R_{5a}$)═C($R_{5b}$)—*', *—C(═S)—*', or *—C≡C—*', and * and *' may each indicate a binding site to an adjacent atom, in Formula 1, $L_1$ may be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, in Formula 1, b1 may be an integer from 1 to 5, in Formula 1, $R_1$ to $R_5$, $R_{5a}$, and $R_{5b}$ may each independently be a group represented by Formula 1-1, a group represented by Formula 1-2, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$($Q_2$), —C(═O)($Q_1$), —S(═O)$_2$($O_1$), or —P(═O)($Q_1$)($Q_2$), Formula 1-1

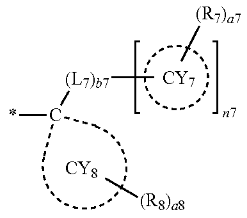

Formula 1-2

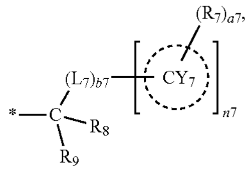

wherein, in Formula 1, c1 may be an integer from 0 to 5, a1 and a4 may each independently be an integer from 0 to 4, a2 may be an integer from 0 to 10, and a3 may be an integer from 0 to 6, provided that the sum of a1 to a4 may be 1 or greater, and at least one of *-$(L_1)_{b1}$-$(R_1)_{c1}$(s) in the number of a1, at least one of $R_2$(s) in the number of a2, at least one of $R_3$(s) in the number of a3, at least one of $R_4$(s) in the number of a4, or any combination thereof may each independently be the group represented by Formula 1-1 or the group represented by Formula 1-2, in Formulae 1-1 and 1-2, $L_7$ may be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, in Formulae 1-1 and 1-2, b7 may be an integer from 1 to 5, in Formulae 1-1 and 1-2, ring $CY_7$ may be a $C_3$-$C_{60}$ carbocyclic group or a $C_1$-$C_{60}$ heterocyclic group, in Formulae 1-1 and 1-2, n7 may be an integer from 1 to 5, in Formula 1-1, ring $CY_8$ may be a non-aromatic $C_3$-$C_{60}$ carbocyclic group or a non-aromatic $C_1$-$C_{60}$ heterocyclic group, in Formulae 1-1 and 1-2, $R_7$ to $R_9$ may each be understood by referring to the description of $R_1$ provided herein, in Formulae 1-1 and 1-2, a7 and a8 may each independently be an integer from 0 to 20, in Formula 3, ring $CY_{71}$ and ring $CY_{72}$ may each independently be a TT electron-rich $C_3$-$C_{60}$ cyclic group or a pyridine group, in Formula 3, $X_{71}$ may be a single bond or a linking group including O, S, N, B, C, Si, or any combination thereof, in Formula 3, * indicates a binding site to an adjacent atom, at least two groups represented by *-$(L_1)_{b1}$-$(R_1)_{c1}$ in the number of a1 may optionally be bound to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, at least two of $R_2$(s) in the number of a2 may optionally be bound to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, at least two of $R_3$(s) in the number of a3 may optionally be bound to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, at least two of $R_4$(s) in the number of a4 may optionally be bound to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, at least two of $R_1$ to $R_5$, $R_{5a}$, and $R_{5b}$(s) may optionally be bound to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, and $R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each independently unsubstituted or substituted with deuterium, —F, —$C_1$, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group unsubstituted or substituted with deuterium, —F, a cyano group, a $C_1$-$C_{60}$ alkyl group, a $C_1$-$C_{60}$ alkoxy group, a phenyl group, a biphenyl group, a pyridinyl group, a pyrimidinyl group, a pyridazinyl group, a pyrazinyl group, a triazinyl group, or any combination thereof; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each independently unsubstituted or substituted with deuterium, —F, a cyano group, a $C_1$-$C_{60}$ alkyl group, a $C_1$-$C_{60}$ alkoxy group, a phenyl group, a biphenyl group, a pyridinyl group, a pyrimidinyl group, a pyridazinyl group, a pyrazinyl group, a triazinyl group, or any combination thereof, and the following compounds may be excluded from the third compound:

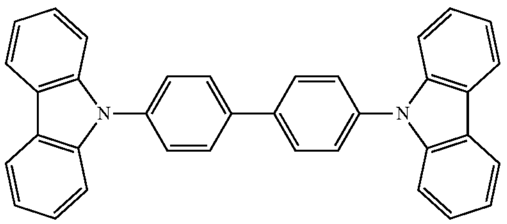

CBP

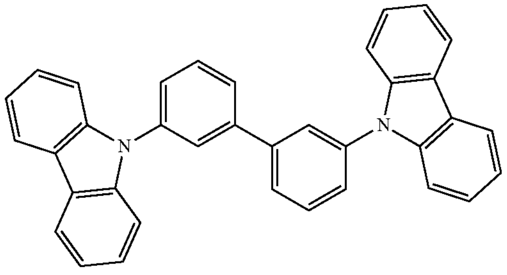

mCBP

According to one or more embodiments, an electronic apparatus may include the light-emitting device.

According to one or more embodiments, an organometallic compound may be represented by Formula 1:

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
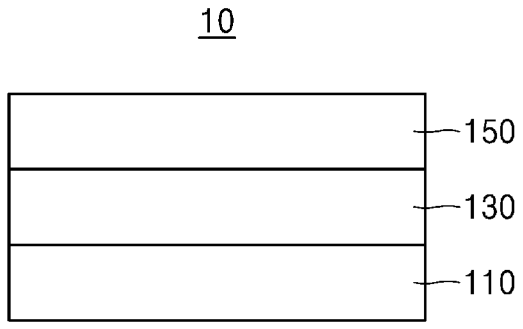
FIG. 1 is a schematic cross-sectional view of a light-emitting device according to one or more embodiments.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Expressions such as "at least selected from," "one of," and "selected from," when preceding a list of elements, modify the entire list of elements and do not modify the individual elements of the list. Further, the use of "may" when describing embodiments of the present disclosure refers to "one or more embodiments of the present disclosure."

A light-emitting device may include: a first electrode; a second electrode facing the first electrode; an interlayer between the first electrode and the second electrode and including an emission layer, wherein the interlayer may include:

i) a first compound represented by Formula 1; and ii) a second compound including at least one π electron-deficient nitrogen-containing $C_1$-$C_{60}$ cyclic group, a third compound including a group represented by Formula 3, a fourth compound capable of emitting delayed fluorescent light, or any combination thereof, and the first compound, the second compound, the third compound, and the fourth compound may be different from one another:

Formula 1

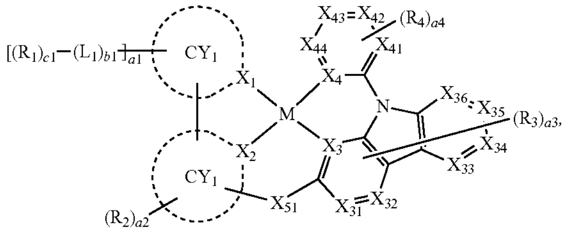

wherein Formula 1 may be understood by referring to the description of Formula 1 provided herein.

Formula 3

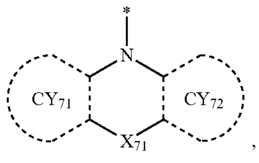

, wherein, in Formula 3, ring $CY_{71}$ and ring $CY_{72}$ may each independently be a π electron-rich $C_3$-$C_{60}$ cyclic group or a pyridine group, in Formula 3, $X_{71}$ may be a single bond or a linking group including O, S, N, B, C, Si, or any combination thereof, and in Formula 3, * indicates a binding site to an adjacent atom.

the following compounds may be excluded from the third compound:

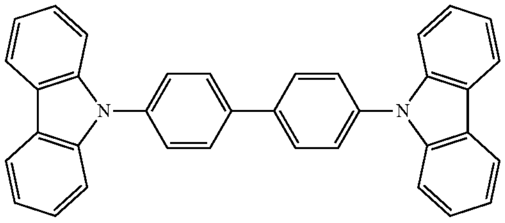

CBP

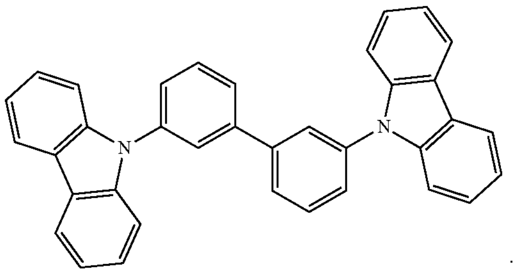

mCBP

Descriptions of the First Compound to the Fourth Compound

The second compound may include a pyridine group, a pyrimidine group, a pyrazine group, a pyridazine group, a triazine group, or any combination thereof.

In some embodiments, the light-emitting device may further include at least one of the second compound and the third compound, in addition to the first compound.

In some embodiments, the light-emitting device may further include the fourth compound, in addition to the first compound.

In some embodiments, the light-emitting device may include the first compound, the second compound, the third compound, and the fourth compound.

In some embodiments, the interlayer may include the second compound. The interlayer may further include, in addition to the first compound and the second compound, the third compound, the fourth compound, or any combination thereof.

In some embodiments, a difference (an absolute value) between the triplet energy level (in electron Volts, eV) of the fourth compound and the singlet energy level (in electron Volts, eV) of the fourth compound may be about 0 eV or higher and about 0.5 eV or lower (or, about 0 eV or higher and about 0.3 eV or lower).

In some embodiments, the fourth compound may be a compound including at least one cyclic group including boron (B) and nitrogen (N) as ring-forming atoms.

In some embodiments, the fourth compound may be a $C_8$-$C_{60}$ polycyclic group-containing compound including at least two cyclic groups that are condensed with each other sharing a boron atom (B).

In some embodiments, the fourth compound may include a condensed ring in which at least one third ring may be condensed with at least one fourth ring, the third ring may be a cyclopentane group, a cyclohexane group, a cycloheptane group, a cyclooctane group, a cyclopentene group, a cyclohexene group, a cycloheptene group, a cyclooctene group, an adamantane group, a norbornene group, a norobornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and the fourth ring may be a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

In one or more embodiments, the interlayer may include the fourth compound. The interlayer may include, in addition to the first compound and the fourth compound, the second compound, the third compound, or any combination thereof.

In one or more embodiments, the interlayer may include the third compound. In some embodiments, the third compound may not include a compound represented by Formula 3-1.

The emission layer in the interlayer may include: i) the first compound; and ii) the second compound, the third compound, the fourth compound, or any combination thereof.

The emission layer may emit phosphorescent light or fluorescent light emitted from the first compound. In some embodiments, phosphorescent light or fluorescent light emitted from the first compound may be blue light.

In some embodiments, the emission layer in the light-emitting device may include the first compound and the second compound, and the first compound and the second compound may form an exciplex.

In some embodiments, the emission layer in the light-emitting device may include the first compound, the second compound, and the third compound, and the first compound and the second compound may form an exciplex.

In some embodiments, the emission layer in the light-emitting device may include the first compound and the fourth compound, and the fourth compound may serve to improve color purity, luminescence efficiency, and/or lifespan characteristics of the light-emitting device.

In some embodiments, the second compound may include a compound represented by Formula 2:

Formula 2

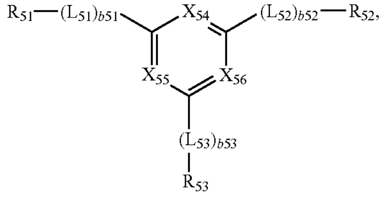

wherein, in Formula 2, $L_{51}$ to $L_{53}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b51 to b53 may each independently be an integer from 1 to 5, $X_{54}$ may be N or $C(R_{54})$, $X_{55}$ may be N or $C(R_{55})$, $X_{56}$ may be N or $C(R_{56})$, and at least one selected from $X_{54}$ to $X_{56}$ may be N, $R_{51}$ to $R_{56}$ may respectively be understood by referring to the descriptions of $R_{51}$ to $R_{56}$ provided herein, and $R_{10a}$ may be understood by referring to the description of $R_{10a}$ provided herein.

In one or more embodiments, the third compound may include a compound represented by Formula 3-1, a compound represented by Formula 3-2, a compound represented by Formula 3-3, a compound represented by Formula 3-4, a compound represented by Formula 3-5, or any combination thereof:

Formula 3-1

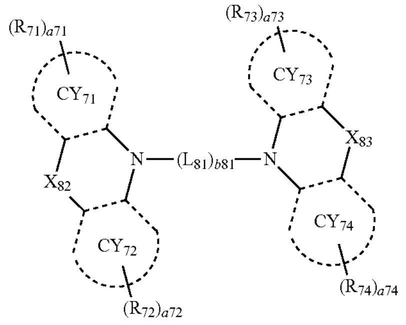

Formula 3-2

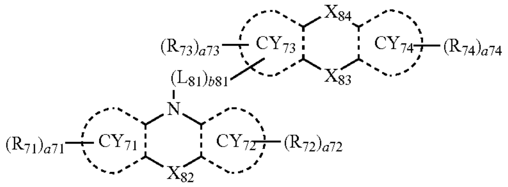

Formula 3-3

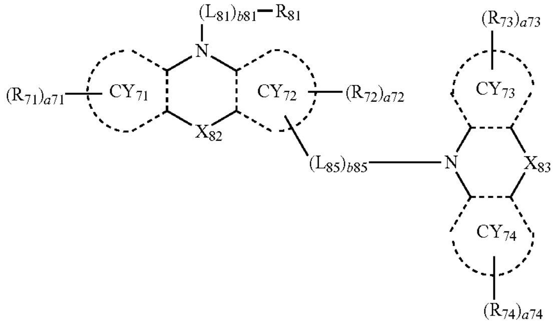

Formula 3-4

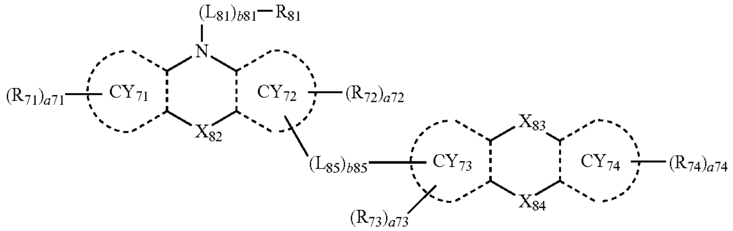

Formula 3-5

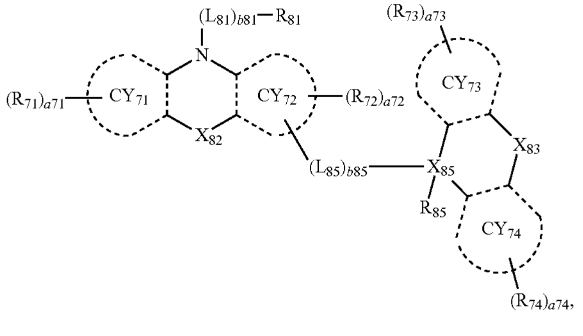

wherein, in Formulae 3-1 to 3-5, ring $CY_{71}$ to ring $CY_{74}$ may each independently be a π electron-rich $C_3$-$C_{60}$ cyclic group or a pyridine group, $X_{82}$ may be a single bond, O, S, N-[$(L_{82})_{b82}$-R82], $C(R_{82a})(R_{82b})$, or $Si(R_{82a})(R_{82b})$, $X_{83}$ may be a single bond, O, S, N-[$(L_{83})_{b83}$-$R_{83}$], $C(R_{83a})(R_{83b})$, or $Si(R_{83a})(R_{83b})$, $X_{84}$ may be O, S, N-[$(L_{84})_{b84}$-$R_{84}$], $C(R_{84a})(R_{84b})$, or $Si(R_{84a})(R_{84b})$, $X_{85}$ may be C or Si, $L_{81}$ to $L_{85}$ may each independently be a single bond, *—$C(Q_4)(Q5)$-*', *—$Si(Q_4)(Q_5)$-*', a π electron-rich $C_3$-$C_{60}$ cyclic group unsubstituted or substituted with at least one $R_{10a}$, or a pyridine group unsubstituted or substituted with at least one $R_{10a}$, wherein $Q_4$ and $Q_5$ may each be understood by referring to the description of $Q_1$ provided herein, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may respectively be understood by referring to the descriptions of $R_{71}$ to $R_{74}$, $R_{81}$ to $R_{85}$, $R_{82a}$, $R_{82b}$, $R_{83a}$, $R_{83b}$, $R_{84a}$, and $R_{84b}$ provided herein, a71 to a74 may each independently be an integer from 0 to 20, and $R_{10a}$ may be understood by referring to the description of $R_{10a}$ provided herein.

In some embodiments, the fourth compound may be a compound represented by Formula 502, a compound represented by Formula 503, or any combination thereof:

Formula 502

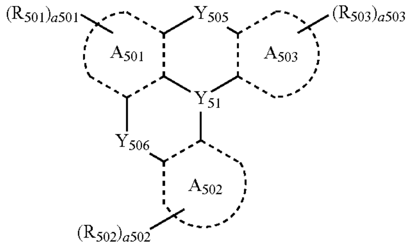

Formula 503

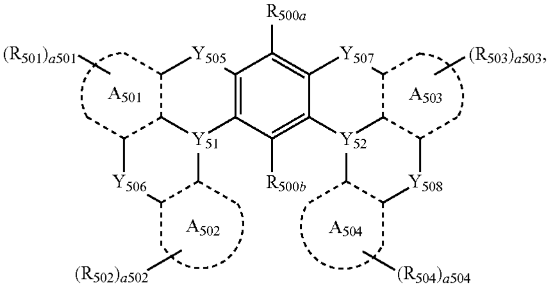

wherein, in Formulae 502 and 503, ring $A_{501}$ to ring $A_{504}$ may each independently be a $C_3$-$C_{60}$ carbocyclic group or a $C_1$-$C_{60}$ heterocyclic group, $Y_{505}$ may be O, S, $N(R_{505})$, $B(R_{505})$, $C(R_{505a})(R_{505b})$, or $Si(R_{505a})(R_{505b})$, $Y_{506}$ may be O, S, $N(R_{506})$, $B(R_{506})$, $C(R_{506a})(R_{506b})$, or $Si(R_{506a})(R_{506b})$, $Y_{507}$ may be O, S, $N(R_{507})$, $B(R_{507})$, $C(R_{507a})(R_{507b})$, or $Si(R_{507a})(R_{507b})$, $Y_{508}$ may be O, S, $N(R_{508})$, $B(R_{508})$, $C(R_{508a})(R_{508b})$, or $Si(R_{508a})(R_{508b})$, $Y_{51}$ and $Y_{52}$ may each independently be B, P(=O), or S(=O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may respectively be understood by referring to the descriptions of $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ provided herein, a501 to a504 may each independently be an integer from 0 to 20, and $R_{10a}$ may be understood by referring to the description of $R_{10a}$ provided herein.

Descriptions of Formulae

In Formula 1, M may be platinum (Pt), palladium (Pd), gold (Au), nickel (Ni), silver (Ag), or copper (Cu).

In Formula 1, $X_1$ to $X_4$ may each independently be C or N.

In some embodiments, in Formula 1, $X_1$ may be C, and C may be a carbon atom in a carbene moiety.

In one or more embodiments, in Formula 1, $X_1$ may be N.

In one or more embodiments, in Formula 1, $X_2$ and $X_3$ may each be C, and $X_4$ may be N.

In Formula 1, i) a bond between $X_1$ and M may be a coordinate bond, and ii) one of a bond between $X_2$ and M, a bond between $X_3$ and M, and a bond between $X_4$ and M may be a coordinate bond, and the other two bonds may each be a covalent bond.

In some embodiments, in Formula 1, a bond between $X_2$ and M and a bond between $X_3$ and M may each be a covalent bond, and a bond between $X_4$ and M may be a coordinate bond.

In Formula 1, ring $CY_1$ may be i) a $X_1$-containing 5-membered ring, ii) a $X_1$, containing 5-membered ring condensed with at least one 6-membered ring, or iii) a $X_1$-containing 6-membered ring. In some embodiments, in Formula 1, ring $CY_1$ may be i) a $X_1$-containing 5-membered ring or ii) a $X_1$-containing 5-membered ring condensed with at least one 6-membered ring. For example, ring $CY_1$ may include a 5-membered ring bound to M in Formula 1 via $X_1$.

In some embodiments, the $X_1$-containing 5-membered ring in ring $CY_1$ in Formula 1 may be a pyrrole group, a pyrazole group, an imidazole group, a triazole group, an oxazole group, an isooxazole group, a thiazole group, an isothiazole group, an oxadiazole group, or a thiadiazole group.

In some embodiments, the 6-membered ring that may be condensed to the $X_1$-containing 5-membered ring in ring $CY_1$ in Formula 1 or the $X_1$-containing 6-membered ring may be a benzene group, a pyridine group, or a pyrimidine group.

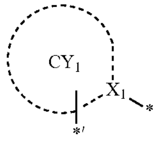

In some embodiments, in Formula 1, a group represented by may be represented by one of Formulae CY1-1 to CY1-42:

CY1-1

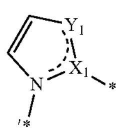

CY1-2

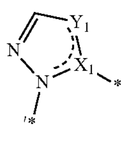

-continued
CY1-3
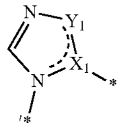
CY1-4
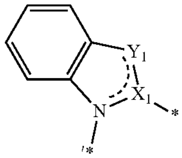
CY1-5
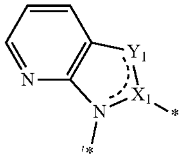
CY1-6
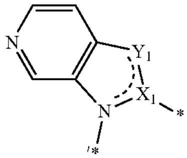
CY1-7
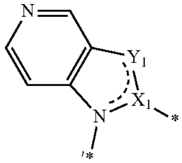
CY1-8
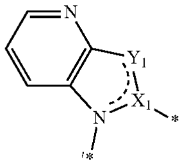
CY1-9
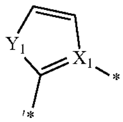
CY1-10
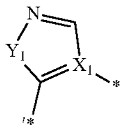
CY1-11
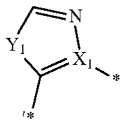
CY1-12
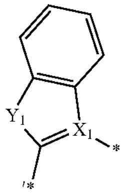
-continued
CY1-13
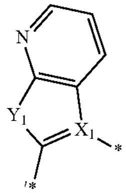
CY1-14
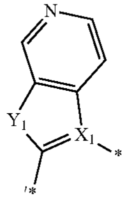
CY1-15
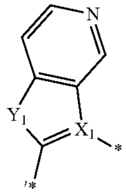
CY1-16
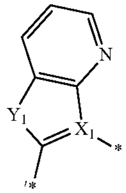
CY1-17
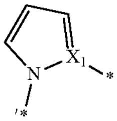
CY1-18
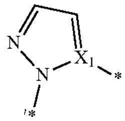
CY1-19
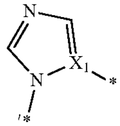
CY1-20
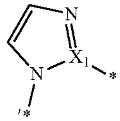
CY1-21
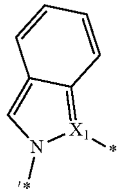

-continued
CY1-22
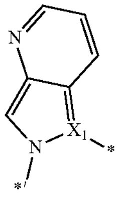
CY1-23
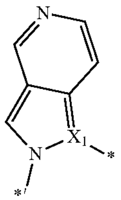
CY1-24
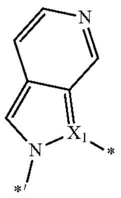
CY1-25
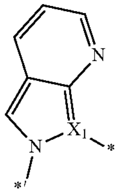
CY1-26
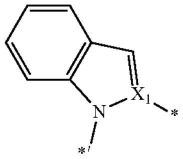
CY1-27
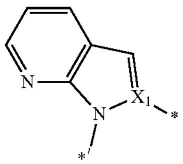
CY1-28
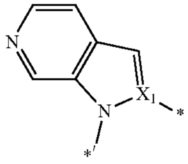
CY1-29
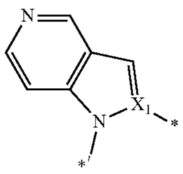
-continued
CY1-30
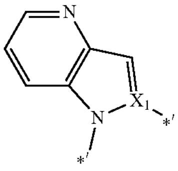
CY1-31
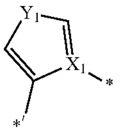
CY1-32
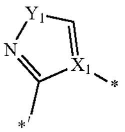
CY1-33
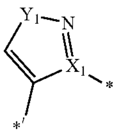
CY1-34
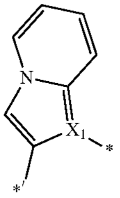
CY1-35
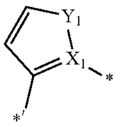
CY1-36
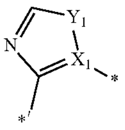
CY1-37
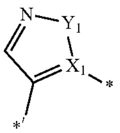
CY1-38
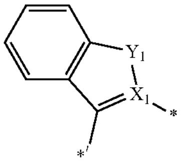
CY1-39
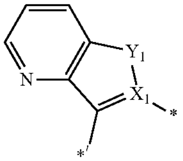

-continued

CY1-40

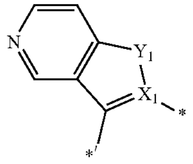

CY1-41

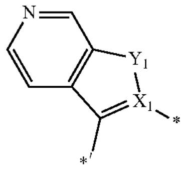

CY1-42

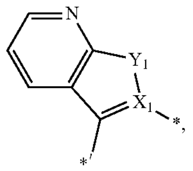

wherein, in Formulae CY1-1 to CY1-42, $Y_1$ may be O, S, N, C, or Si,

* indicates a binding site to M in Formula 1, and

*' indicates a binding site to an adjacent atom in Formula 1.

In some embodiments, in Formulae CY1-1 to CY1-8, $X_1$ may be C, and $X_1$ in Formulae CY1-9 to CY1-42 may be N.

In Formula 1, ring $CY_2$ may be a $C_3$-$C_{60}$ carbocyclic group or a $C_1$-$C_{60}$ heterocyclic group.

In some embodiments, ring $CY_2$ may be a benzene group, a pyridine group, a pyrimidine group, a naphthalene group, a dibenzofuran group, a dibenzothiophene group, a carbazole group, a fluorene group, or a dibenzosilole group.

In some embodiments, in Formula 1, a group represented by

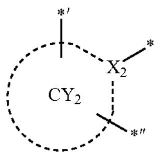

may be a group represented by one of Formulae CY2-1 to CY2-11:

CY2-1

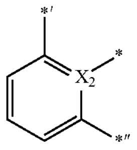

CY2-2

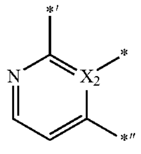

-continued

CY2-3

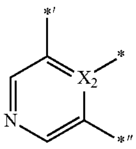

CY2-4

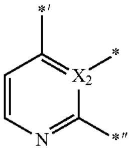

CY2-5

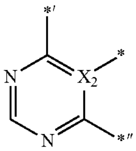

CY2-6

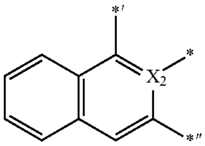

CY2-7

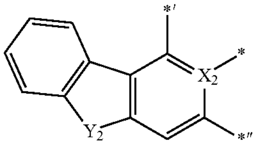

CY2-8

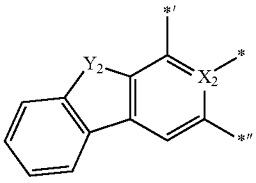

CY2-9

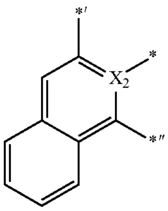

CY2-10

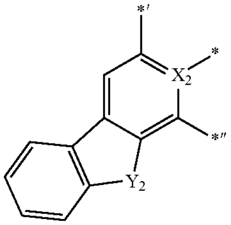

-continued

CY2-11

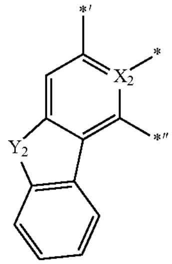

wherein, in Formulae CY2-1 to CY2-11, $Y_2$ may be O, S, N, C, or Si,

* indicates a binding site to M in Formula 1,

*' indicates a binding site to ring $CY_1$ in Formula 1, and

*" indicates a binding site to $X_{51}$ in Formula 1.

In Formula 1, $X_{31}$ to $X_{36}$ and $X_{41}$ to $X_{44}$ may each independently be C or N.

In some embodiments, in Formula 1, $X_{31}$ to $X_{36}$ and $X_{41}$ to $X_{44}$ may each be C.

In Formula 1, $X_{51}$ may be *—N($R_5$)—*', *—B($R_5$)—*', *—P($R_5$)—*, *—C($R_{5a}$)($R_{5b}$)—*', *—Si($R_{5a}$)($R_{5b}$)—*', *—Ge($R_{5a}$)($R_{5b}$)—*', *—S—*', *—Se—*', *—O—*', *—C(═O)—*', *—S(═O)—*', *—S(═O)$_2$—*', *—C($R_5$)═*', *═C($R_5$)—*', *—C($R_{5a}$)═C($R_{5b}$)—*', *—C(═S)—*', or *—C≡C—*'. * and *' each indicate a binding site to an adjacent atom. $R_5$, $R_{5a}$, and $R_{5b}$ may respectively be understood by referring to the descriptions of $R_5$, $R_{5a}$, and $R_{5b}$ provided herein. $R_{5a}$ and $R_{5b}$ may optionally be bound to each other to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$ (e.g., Compound 109, and/or the like).

In some embodiments, in Formula 1, $X_{51}$ may be *—N($R_5$)—*', *—B($R_5$)—*', *—C($R_{5a}$)($R_{5b}$)—*', *—Si($R_{5a}$)($R_{5b}$)—*', *—S—*', or *—O—*'.

$L_1$ in Formula 1 may be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In Formula 1, b1 indicates the number of $L_1$(s), and b1 may be an integer from 1 to 5. When b1 is 2 or greater, at least two $L_1$(s) may be identical to different from each other. In some embodiments, b1 may be 1 or 2.

In Formula 1, $R_1$ to $R_5$, $R_{5a}$, and $R_{5b}$ may each independently be a group represented by Formula 1-1, a group represented by Formula 1-2, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —C(═O)($Q_1$), —S(═O)$_2$($O_1$), or —P(═O)($Q_1$)($Q_2$):

Formula 1-1

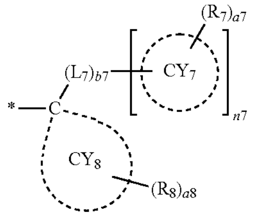

Formula 1-2

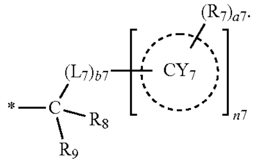

Formulae 1-1 and 1-2 may each be understood by referring to the descriptions of Formulae 1-1 and 1-2 provided herein.

In Formula 1, c1 may be an integer from 0 to 5, a1 and a4 may each independently be an integer from 0 to 4, a2 may be an integer from 0 to 10, and a3 may be an integer from 0 to 6, provided that the sum of a1 to a4 may be 1 or greater, and at least one of *-$(L_1)_{b1}$-$(R_1)_{c1}$(s) in the number of a1, at least one of $R_2$(s) in the number of a2, at least one of $R_3$(s) in the number of a3, at least one of $R_4$(s) in the number of a4, or any combination thereof may each independently be the group represented by Formula 1-1 or the group represented by Formula 1-2. For example, the organometallic compound represented by Formula 1 may include the group represented by Formula 1-1, the group represented by Formula 1-2, or any combination thereof.

In some embodiments, in Formula 1, a4 may be an integer from 1 to 4, at least one of $R_4$(s) in the number of a4 may each independently be the group represented by Formula 1-1 or the group represented by Formula 1-2.

$L_7$ in Formulae 1-1 and 1-2 may be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In Formulae 1-1 and 1-2, b7 indicates the number of $L_7$(s), and b7 may be an integer from 1 to 5. When b7 is 2 or greater, at least two $L_7$(s) may be identical to different from each other. In some embodiments, b7 may be 1 or 2.

In Formulae 1-1 and 1-2, ring $CY_7$ may be a $C_3$-$C_{60}$ carbocyclic group or a $C_1$-$C_{60}$ heterocyclic group.

In some embodiments, in Formulae 1-1 and 1-2, ring $CY_7$ may be i) a first ring, ii) a second ring, iii) a condensed ring in which at least two first rings are condensed, iv) a condensed ring in which at least two second rings are condensed, or v) a condensed ring in which at least one first ring and at least one second ring are condensed, the first ring may be a cyclopentane group, a cyclohexane group, a cycloheptane group, a cyclooctane group, a cyclopentene group, a cyclohexene group, a cycloheptene group, a cyclooctene group, an adamantane group, a norbornene group, a norobornane group, a bicyclo[1.1.1]pentane group, a bicyclo[2.1.1]hexane group, a bicyclo[2.2.2]octane group, or a benzene group, and the second ring may be a pyrrole group, a furan group, a thiophene group, a silole group, a pyrazole group, an imidazole group, a triazole group, an oxazole group, an isooxazole group, a thiazole group, an isothiazole group, an oxadiazole group, a thiadiazole group, a pyridine group, a pyrimidine group, a pyridazine group, a pyrazine group, a triazine group, a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

In one or more embodiments, in Formulae 1-1 and 1-2, ring $CY_7$ may be a benzene group, a naphthalene group, a phenanthrene group, a carbazole group, a [1,2]azaborinino[1,2-a][1,2]azaborinine group, or a benzo[1,2]azaborinino[1,2-a][1,2]azaborinine group.

In one or more embodiments, in Formulae 1-1 and 1-2, ring $CY_7$ may be a group represented by one of Formulae CY7-1 to CY7-33:

CY7-1

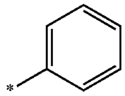

CY7-2

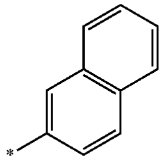

CY7-3

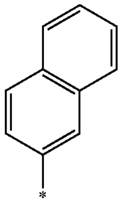

CY7-4

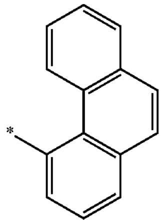

CY7-5

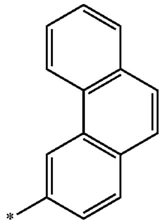

CY7-6

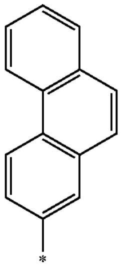

-continued

CY7-7

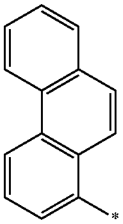

CY7-8

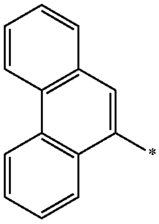

CY7-9

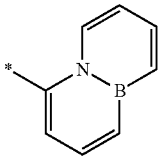

CY7-10

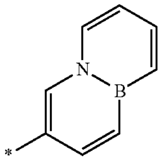

CY7-11

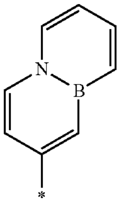

CY7-12

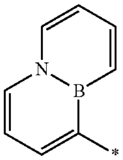

CY7-13

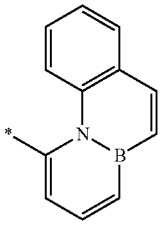

-continued
CY7-14
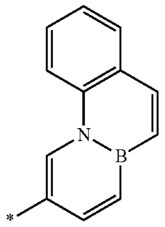
CY7-15
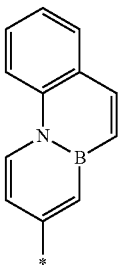
CY7-16
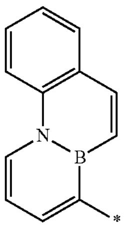
CY7-17
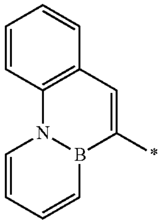
CY7-18
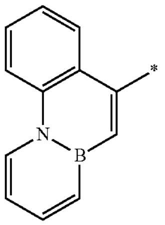
CY7-19
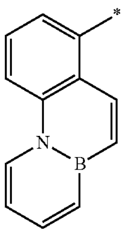
-continued
CY7-20
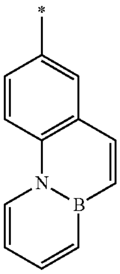
CY7-21
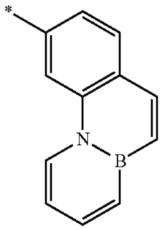
CY7-22
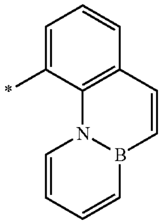
CY7-23
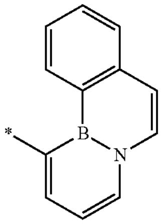
CY7-24
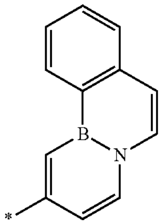
CY7-25
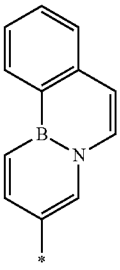

-continued

CY7-26

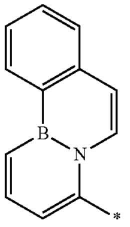

CY7-27

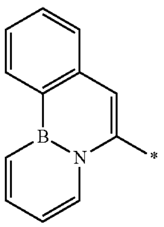

CY7-28

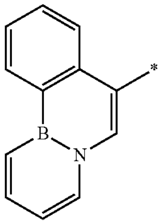

CY7-29

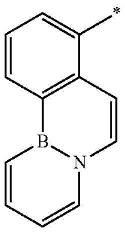

CY7-30

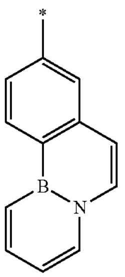

CY7-31

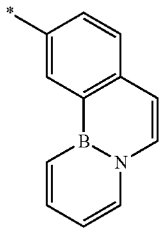

-continued

CY7-32

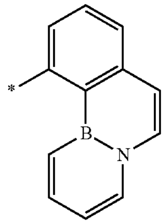

CY7-33

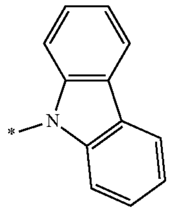

In Formulae CY7-1 to CY7-33, * indicates a binding site to $L_7$ in Formulae 1-1 and 1-2.

In Formulae 1-1 and 1-2, n7 indicates the number of groups represented by

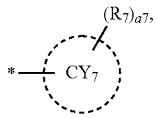

and n7 may be an integer from 1 to 5. When n7 is 2 or greater, at least two groups represented by

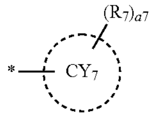

may be identical to or different from each other. In some embodiments, n7 may be 1.

In Formula 1-1, ring $CY_8$ may be a non-aromatic $C_3$-$C_{60}$ carbocyclic group or a non-aromatic $C_1$-$C_{60}$ heterocyclic group.

In some embodiments, in Formula 1-1, ring $CY_8$ may be a cyclopentane group, a cyclohexane group, a cycloheptane group, a cyclooctane group, a cyclopentene group, a cyclohexene group, a cycloheptene group, a cyclooctene group, an adamantane group, a norbornene group, a norobornane group, a bicyclo[1.1.1]pentane group, a bicyclo[2.1.1]hexane group, or a bicyclo[2.2.2]octane group.

In one or more embodiments, in Formula 1-1, ring $CY_8$ may be a group represented by one of Formulae CY8-1 to CY8-8:

CY8-1

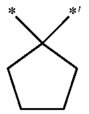

-continued

CY8-2

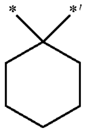

CY8-3

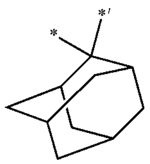

CY8-4

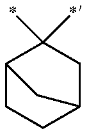

CY8-5

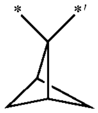

CY8-6

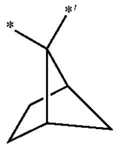

CY8-7

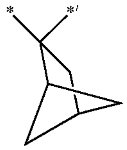

CY8-8

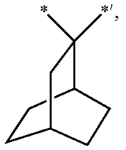

wherein, in Formulae CY8-1 to CY8-8, * indicates a binding site to an adjacent atom in Formula 1, and *' indicates a binding site to $L_7$ in Formula 1-1.

In Formulae 1-1 and 1-2, $R_7$ to $R_9$ may each be understood by referring to the descriptions of $R_1$ provided herein.

In Formulae 1-1 and 1-2, a7 and a8 may respectively indicate the number of $R_7$(S) and $R_8$(s), and a7 and a8 may each independently be an integer from 0 to 20. When a7 is 2 or greater, at least two $R_7$(s) may be identical to or different from each other. When a8 is 2 or greater, at least two $R_8$(s) may be identical to or different from each other.

In Formula 1, i) at least two of groups represented by $*-(L_1)_{b1}-(R_1)_{c1}$ in the number of a1 may optionally be bound to each other (via a single bond, a double bond, or a first linking group) to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, ii) at least two of $R_2$(s) in the number of a2 may optionally be bound to each other (via a single bond, a double bond, or a first linking group) to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, iii) at least two of $R_3$ in the number of a3 may optionally be bound to each other (via a single bond, a double bond, or a first linking group) to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, iv) at least two of $R_4$ in the number of a4 may optionally be bound to each other (via a single bond, a double bond, or a first linking group) to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, and/or v) at least two of $R_1$ to $R_5$, $R_{5a}$, and $R_{5b}$ may optionally be bound to each other (via a single bond, a double bond, or a first linking group) to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$. The first linking group may be selected from $*-N(R_{95})-*'$, $*-B(R_{95})-*'$, $*-P(R_{95})-*$, $*-C(R_{95a})(R_{95b})-*'$, $*-Si(R_{95a})(R_{95b})-*'$, $*-Ge(R_{95a})(R_{95b})-*'$, $*-Se-*'$, $*-C(=O)-*'$, $*-S(=O)-*'$, $*-S(=O)_2-*'$, $*-C(R_{95})=*'$, $*=C(R_{95})-*'$, $*-C(R_{95a})=C(R_{95b})-*'$, $*-C(=S)-*'$, and $*-C \equiv C-*'$, and $R_{95}$, $R_{95a}$, and $R_{95b}$ may each be understood by referring to the description of $R_{10a}$ provided herein.

In some embodiments, the first compound represented by Formula 1 may include at least one deuterium.

In one or more embodiments, the group represented by Formula 1-1 and the group represented by Formula 1-2 may each include at least one deuterium.

In one or more embodiments, in Formula 1, 1) a1 may not be 0, and 2) in at least one of $*-(L_1)_{b1}-(R_1)_{c1}$ in a1 number of $*-(L_1)_{b1}-(R_1)_{c1}$(s), i) $L_1$ may not be a single bond, and ii) at least one of $R_1$(s) in the number of c1 may be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In one or more embodiments, in Formula 1, the group represented by $*-(L_1)_{b1}-(R_1)_{c1}$ may include at least one deuterium.

In one or more embodiments, in Formula 1, the group represented by

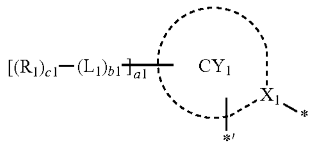

may be represented by one of Formulae CY1 (1) to CY1(6):

CY1(1)

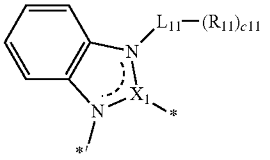

CY1(2)

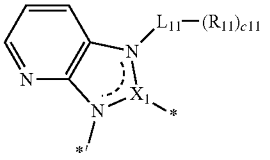

-continued

CY1(3)

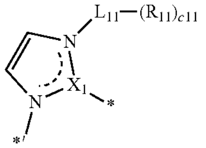

CY1(4)

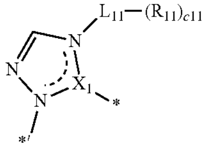

CY1(5)

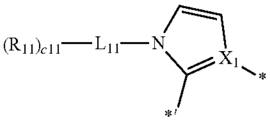

CY1(6)

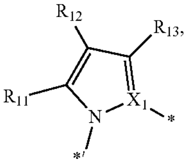

wherein, in Formulae CY1 (1) to CY1 (6), $X_1$ may be selected from O, S, $N(R_{21})$, $C(R_{21})(R_{22})$, and $Si(R_{21})(R_{22})$, $L_{11}$ and c11 may respectively be understood by referring to the descriptions of $L_1$ and c1 provided herein, $R_{11}$ to $R_{13}$ may each be understood by referring to the description of $R_1$ provided herein, wherein $R_{11}$ to $R_{13}$ may not each be hydrogen,

* indicates a binding site to M in Formula 1, and

*' indicates a binding site to an adjacent atom in Formula 1.

In some embodiments, in Formulae CY1(1) to CY1(5), 1) L-n may not be a single bond, and 2) at least one of R-M(S) in the number of c11 may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In some embodiments, in Formulae CY1(1) to CY1(4), $X_1$ may be C, and in Formulae CY1(5) and CY1(6), $X_1$ may be N.

In some embodiments, L-n in Formulae CY1(1) to CY1 (5) may be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

In one or more embodiments, the group represented by

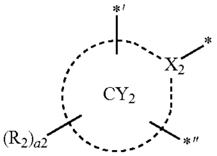

in Formula 1 may be one of groups represented by Formulae CY2(1) to CY2(26):

CY2(1)

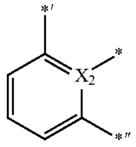

CY2(2)

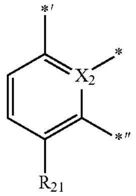

CY2(3)

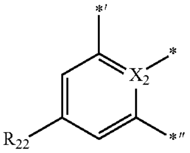

CY2(4)

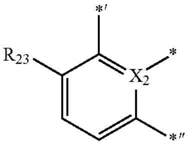

CY2(5)

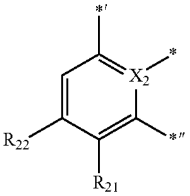

CY2(6)

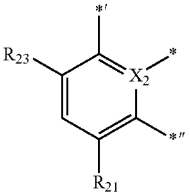

CY2(7)

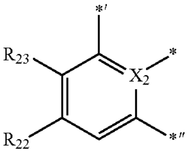

CY2(8)

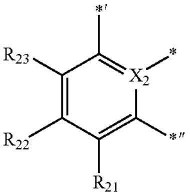

CY2(9)

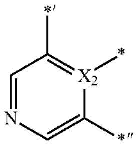

-continued
CY2(10)
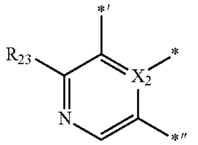
CY2(11)
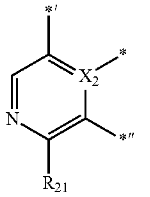
CY2(12)
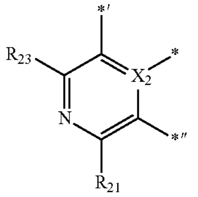
CY2(13)
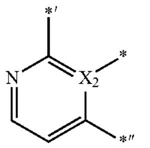
CY2(14)
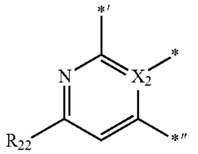
CY2(15)
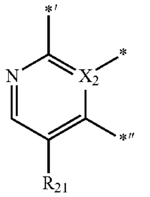
CY2(16)
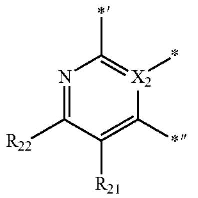
CY2(17)
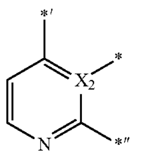
CY2(18)
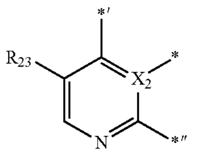
-continued
CY2(19)
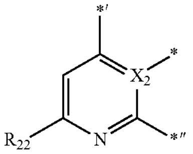
CY2(20)
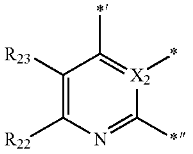
CY2(21)
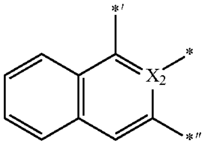
CY1(22)
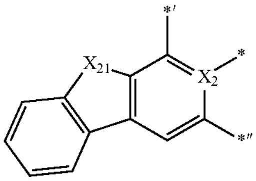
CY2(23)
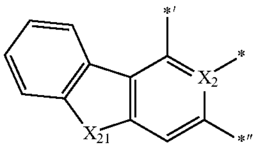
CY2(24)
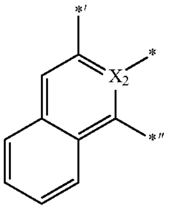
CY2(25)
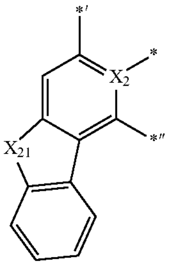
CY2(26)
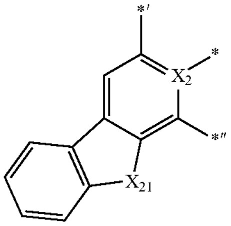
wherein, in Formulae CY2(1) to CY2(26),
$X_2$ may be understood by referring to the description of $X_{21}$ provided herein, $X_{21}$ may be selected from O, S, $N(R_{21})$, $C(R_{21})(R_{22})$, and $Si(R_{21})(R_{22})$, $R_{21}$ to $R_{23}$ may each be understood by referring to the description of $R_2$ provided herein, wherein $R_{21}$ to $R_{23}$ may not each be hydrogen,

* indicates a binding site to M in Formula 1, and

*' indicates a binding site to ring CY1 in Formula 1, and

*" indicates a binding site to $X_{51}$ in Formula 1.

In one or more embodiments, in Formula 1, the group represented by

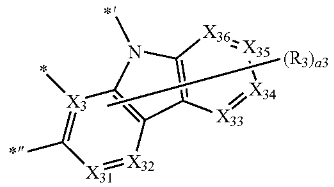

may be a group represented by one of Formulae CY3(1) to CY3(7):

CY3(1)

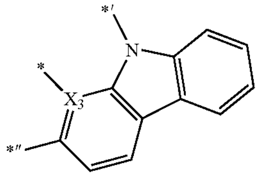

CY3(2)

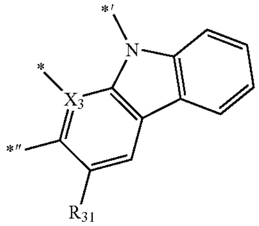

CY3(3)

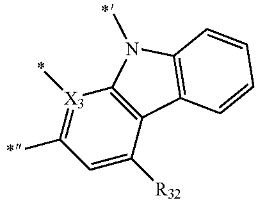

CY3(4)

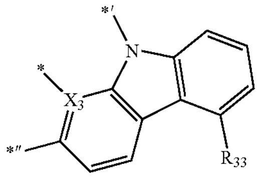

CY3(5)

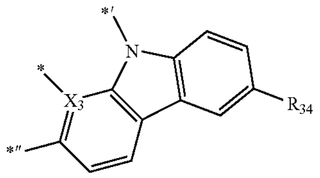

-continued

CY3(6)

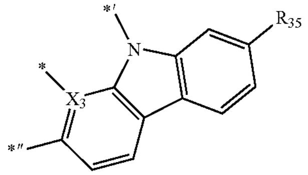

CY3(7)

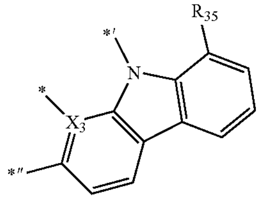

, wherein, in Formulae CY3(1) to CY3(7), $X_3$ may be understood by referring to the description of $X_3$ provided herein, $R_{31}$ to $R_{36}$ may each be understood by referring to the description of $R_3$ provided herein, wherein $R_{31}$ to $R_{36}$ may not each be hydrogen,

* indicates a binding site to M in Formula 1,

*' indicates a binding site to an adjacent atom in Formula 1, and

*" indicates a binding site to $X_{51}$ in Formula 1.

In one or more embodiments, in Formula 1, the group represented by

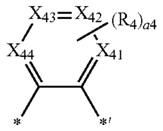

may be a group represented by one of Formulae CY4(1) to CY4(8):

CY4(1)

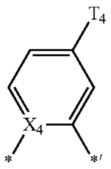

CY4(2)

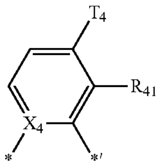

CY4(3)

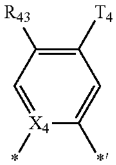

-continued

CY4(4)

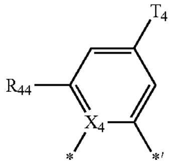

CY4(5)

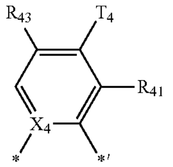

CT4(6)

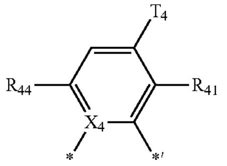

CY4(7)

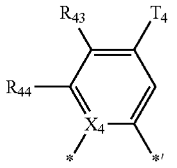

CY4(8)

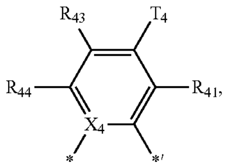

wherein, in Formulae CY4(1) to CY4(8), $X_4$ may be understood by referring to the description of $X_4$ provided herein, $T_4$ may be the group represented by Formula 1-1 or the group represented by Formula 1-2, $R_{41}$, $R_{43}$, and $R_{44}$ may each be understood by referring to the description of $R_4$ provided herein, wherein $R_{41}$, $R_{43}$, and $R_{44}$ may not each be hydrogen,

* indicates a binding site to M in Formula 1, and

*' indicates a binding site to an adjacent atom in Formula 1.

In Formula 2, b51 to b53 may respectively indicate the number of $L_{51}$(s) to $L_{53}$(s), and b51 to b53 may each be an integer from 1 to 5. When b51 is 2 or greater, at least two $L_{51}$(s) may be identical to or different from each other, when b52 is 2 or greater, at least two $L_{52}$(s) may be identical to or different from each other, and when b53 is 2 or greater, at least two $L_{53}$(s) may be identical to or different from each other. In some embodiments, b51 to b53 may each independently be 1 or 2.

In Formulae 1, 1-1, 1-2 and 2, $L_1$, $L_7$, and $L_{51}$ to $L_{53}$ may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzooxasiline group, a dibenzothiasiline group, a dibenzodihydroazasiline group, a dibenzodihydrodisiline group, a dibenzodihydrosiline group, a dibenzodioxane group, a dibenzooxathiene group, a dibenzooxazine group, a dibenzopyran group, a dibenzodithiine group, a dibenzothiazine group, a dibenzothiopyran group, a dibenzocyclohexadiene group, a dibenzodihydropyridine group, or a dibenzodihydropyrazine group, each independently unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl (dibenzothienyl) group, a dibenzosilolyl group, a dimethyldibenzosilolyl group, a diphenyldibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof, wherein $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In some embodiments, in Formula 2, a bond between $L_{51}$ and $R_{51}$, a bond between $L_{52}$ and $R_{52}$, a bond between $L_{53}$ and $R_{53}$, a bond between at least two $L_{51}$(s), a bond between at least two $L_{52}$(s), a bond between at least two $L_{53}$(s), a bond between $L_{51}$ and a carbon atom between $X_{54}$ and $X_{55}$ in Formula 2, a bond between $L_{52}$ and a carbon atom between $X_{54}$ and $X_{56}$ in Formula 2, and a bond between $L_{53}$ and a carbon atom between $X_{55}$ and $X_{56}$ in Formula 2 may each be a "carbon-carbon single bond".

In Formula 2, $X_{54}$ may be N or $C(R_{54})$, $X_{55}$ may be N or $C(R_{55})$, $X_{56}$ may be N or $C(R_{56})$, and at least one selected from $X_{54}$ to $X_{56}$ may be N, wherein $R_{54}$ to $R_{56}$ may respectively be understood by referring to the descriptions of $R_{54}$ to $R_{56}$ provided herein. In some embodiments, two or three of $X_{54}$ to $X_{56}$ may each be N.

In the present specification, $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$ and $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$($Q_2$), —C(═O)($Q_1$), —S(═O)$_2$($Q_1$), or —P(═O)($Q_1$)($Q_2$). $Q_1$ to $Q_3$ may respectively be understood by referring to the descriptions of $Q_1$ to $Q_3$ provided herein.

In some embodiments, i) in Formula 1, $R_1$ to $R_5$, $R_{5a}$, and $R_{5b}$, other than the group represented by Formula 1-1 and the group represented by Formula 1-2, ii) in Formulae 1-1 and 1-2, $R_7$ to $R_9$, iii) $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, and iv) $R_{10a}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl (thienyl) group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl (benzothienyl) group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each independently unsubstituted or substituted with deuterium, —F, —Cl, —Br, —I, —$CD_3$, —$CD_2FI$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(═O)($Q_{31}$), —S(═O)$_2$($Q_{31}$), —P(═O)($Q_{31}$)($Q_{32}$), or any combination thereof; or —C($Q_1$)($Q_2$)($Q_3$), —Si($Q_1$($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), wherein $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each independently unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

Formula 91

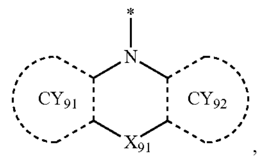

, wherein, in Formula 91, ring CY91 to ring CY92 may each independently be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $X_{91}$ may be a single bond, O, S, N($R_{91}$), B($R_{91}$), C($R_{91a}$)($R_{91b}$), or Si($R_{91a}$)($R_{91b}$), $R_{91}$, $R_{91a}$, and $R_{91b}$ may respectively be understood by referring to the descriptions of $R_{82}$, $R_{82a}$, and $R_{82b}$ provided herein, $R_{10a}$ may be understood by referring to the description of $R_{10a}$ provided herein, and

* indicates a binding site to an adjacent atom.

In some embodiments, in Formula 91, ring CY91 and ring CY92 may each independently be a benzene group, a pyridine group, a pyrimidine group, a pyrazine group, a pyridazine group, or a triazine group, each independently unsubstituted or substituted with at least one $R_{10a}$, $R_{91}$, $R_{91a}$ and $R_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each independently unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In one or more embodiments, i) in Formula 1, $R_1$ to $R_5$, $R_{5a}$, $R_{5b}$, and $R_7$ to $R_9$, other than the group represented by Formula 1-1 and the group represented by Formula 1-2, ii) $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, and iii) $R_{10a}$ may each independently be hydrogen, deuterium, —F, a cyano group, a nitro group, —$CH_3$, —$CD_3$, —$CD_2FI$, —$CDH_2$, —$CF_3$, —$CF_2H$, —$CFH_2$, a group represented by one of Formulae 9-1 to 9-19, a group represented by one of Formulae 10-1 to 10-246, —C($Q_1$)($Q_2$)($Q_3$), —Si($Q_1$)($Q_2$)($Q_3$), or —P(=O)($Q_1$)($Q_2$), wherein $Q_1$ to $Q_3$ may respectively be understood by referring to the descriptions of $Q_1$ to $Q_3$ provided herein:

9-1

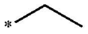

9-2

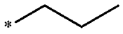

9-3

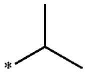

9-4

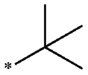

9-5

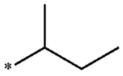

9-6

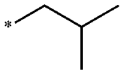

9-7

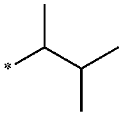

9-8

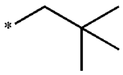

9-9

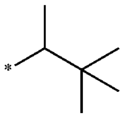

9-10

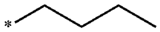

9-11

9-12

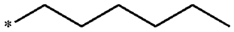

9-13

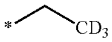

-continued 9-14

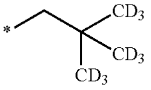

9-15

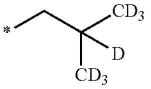

9-16

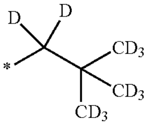

9-17

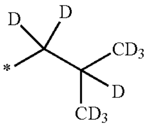

9-18

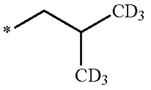

9-19

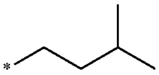

10-1

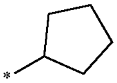

10-2

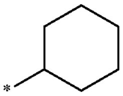

10-3

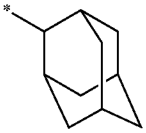

10-4

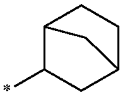

10-5

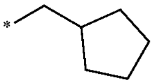

10-6

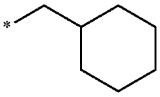

10-7

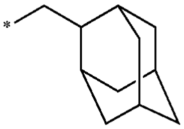

10-8

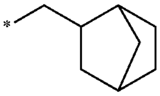

-continued
10-9
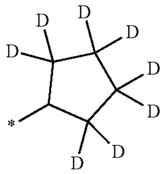
10-10
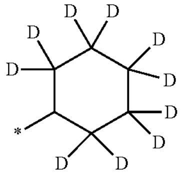
10-11
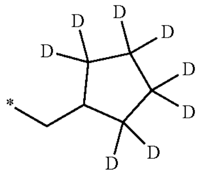
10-12
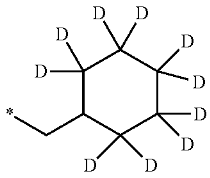
10-13
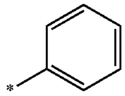
10-14
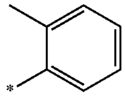
10-15
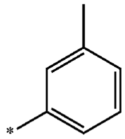
10-16
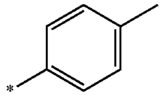
10-17
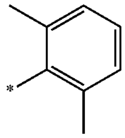
10-18
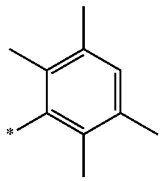
-continued
10-19
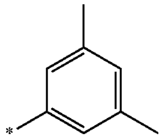
10-20
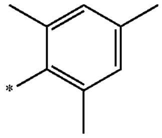
10-21
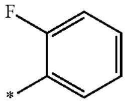
10-22
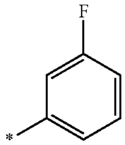
10-23
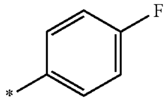
10-24
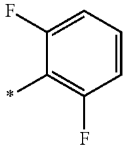
10-25
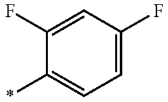
10-26
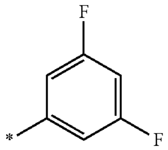
10-27
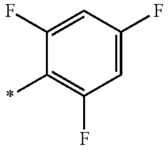
10-28
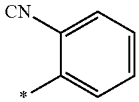
10-29
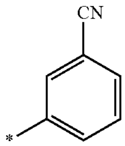

-continued
10-30
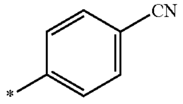
10-31
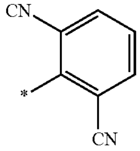
10-32
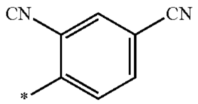
10-33
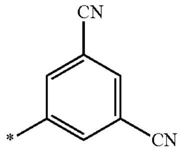
10-34
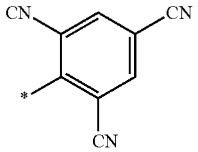
10-35
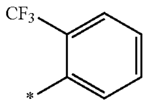
10-36
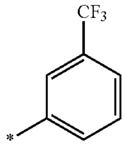
10-37
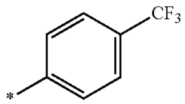
10-38
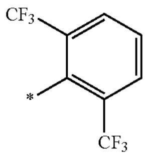
10-39
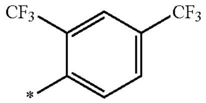
10-40
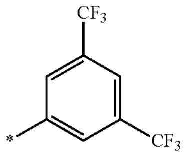
-continued
10-41
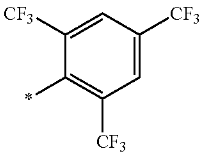
10-42
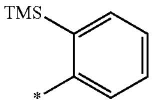
10-43
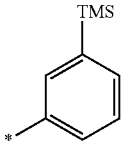
10-44
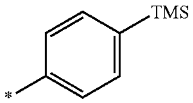
10-45
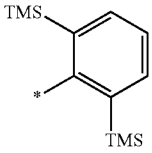
10-46
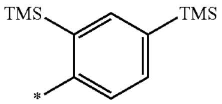
10-47
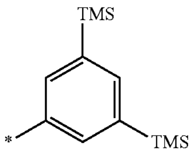
10-48
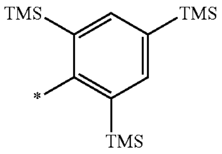
10-49
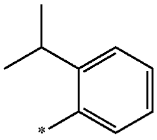
10-50
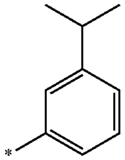
10-51
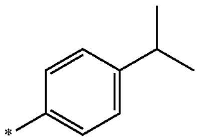

-continued
10-52
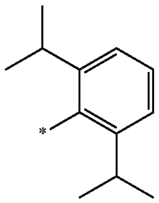
10-53
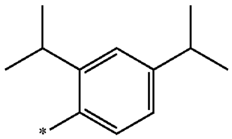
10-54
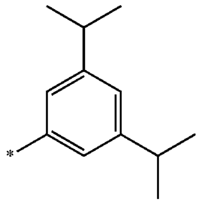
10-55
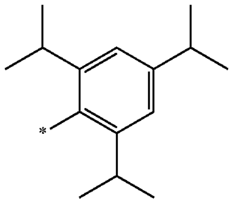
10-56
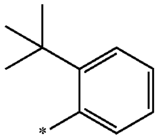
10-57
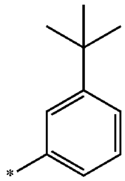
10-58
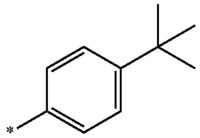
10-59
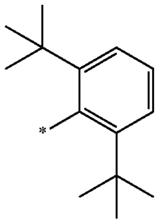
-continued
10-60
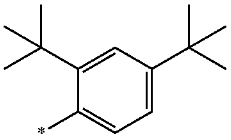
10-61
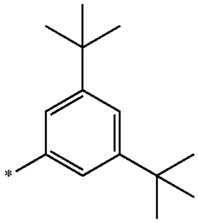
10-62
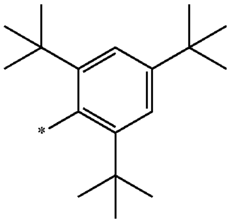
10-63
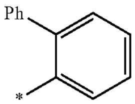
10-64
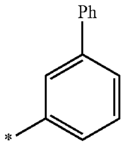
10-65
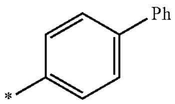
10-66
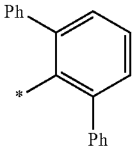
10-67
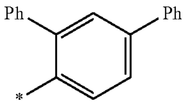
10-68
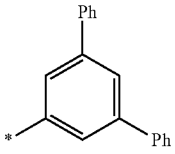
10-69
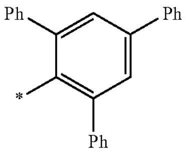

-continued
10-70
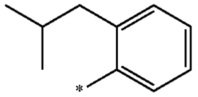
10-71
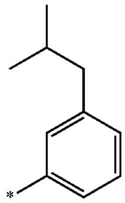
10-72
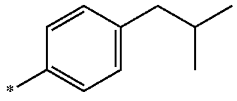
10-73
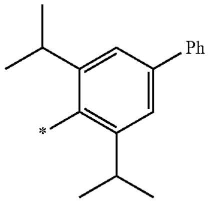
10-74
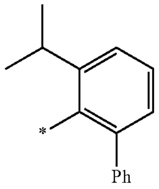
10-75
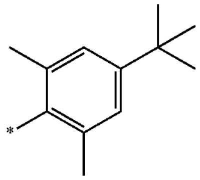
10-76
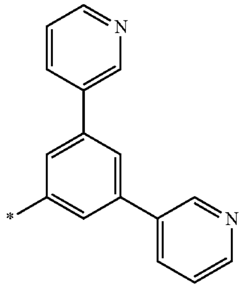
10-77
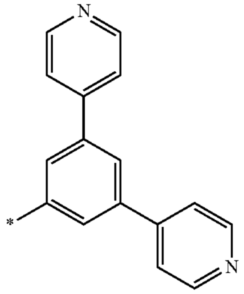
-continued
10-78
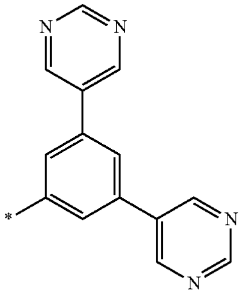
10-79
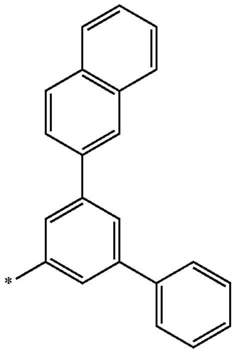
10-80
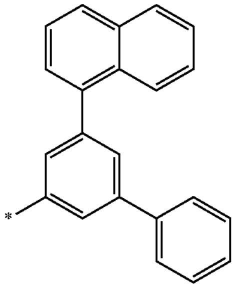
10-81
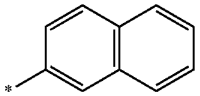
10-82
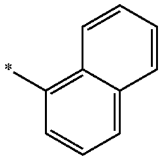
10-83
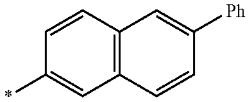
10-84
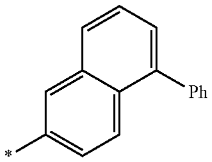

-continued
10-85
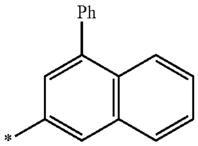
10-86
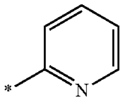
10-87
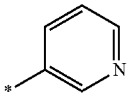
10-88
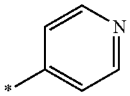
10-89
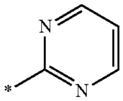
10-90
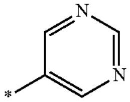
10-91
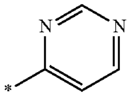
10-92
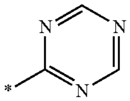
10-93
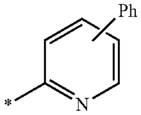
10-94
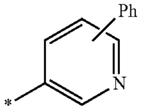
10-95
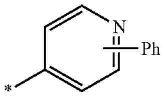
10-96
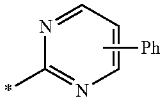
10-97
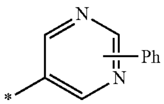
-continued
10-98
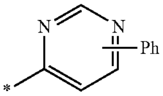
10-99
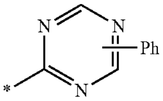
10-100
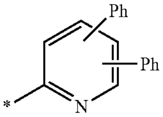
10-101
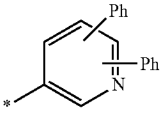
10-102
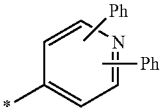
10-103
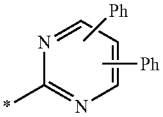
10-104
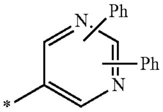
10-105
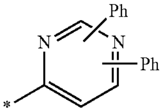
10-106
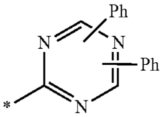
10-107
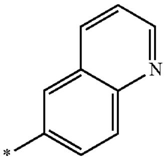
10-108
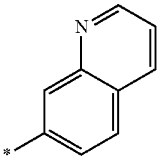
10-109
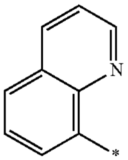

-continued
10-110
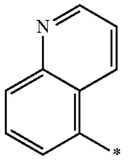
10-111
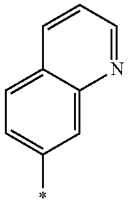
10-112
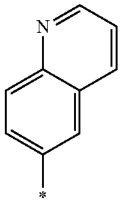
10-113
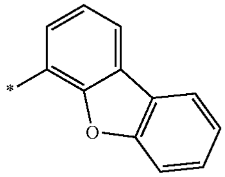
10-114
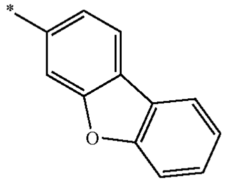
10-115
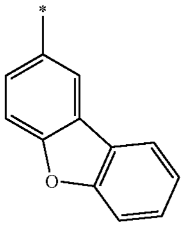
10-116
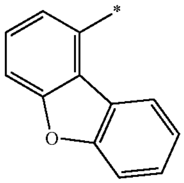
10-117
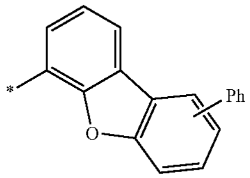
-continued
10-118
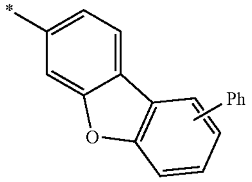
10-119
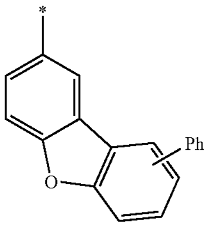
10-120
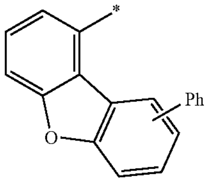
10-121
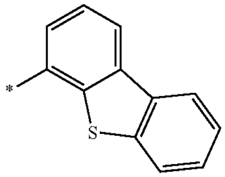
10-122
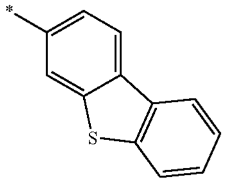
10-123
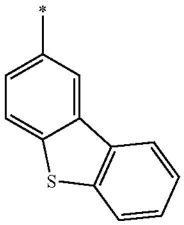
10-124
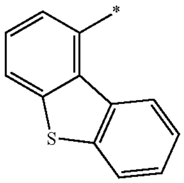
10-125
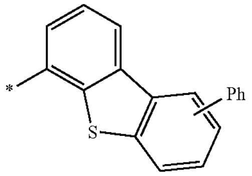

-continued
10-126
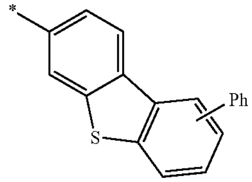
10-127
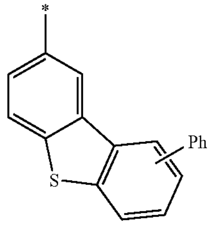
10-128
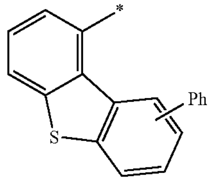
10-129
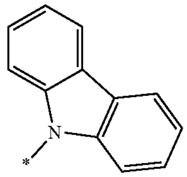
10-130
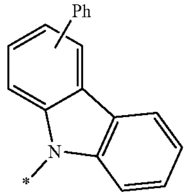
10-131
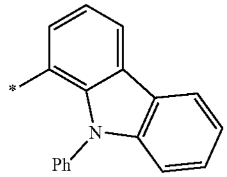
10-132
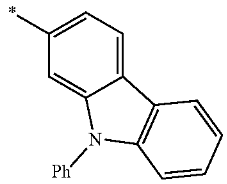
10-133
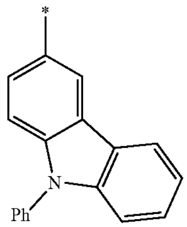
-continued
10-134
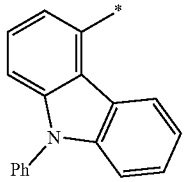
10-135
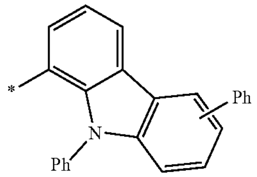
10-136
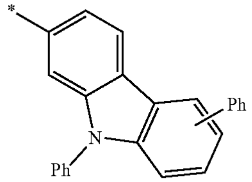
10-137
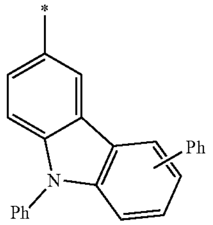
10-138
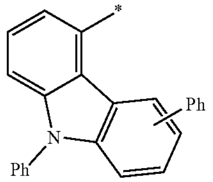
10-139
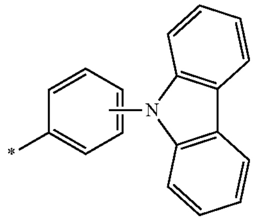
10-140
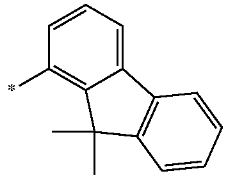
10-141
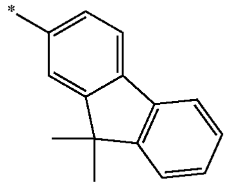

-continued
10-142
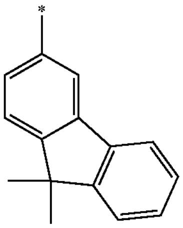
10-143
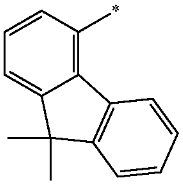
10-144
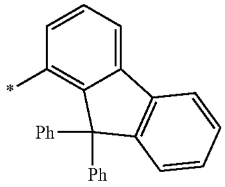
10-145
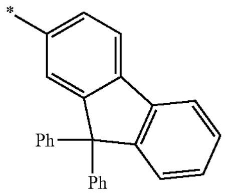
10-146
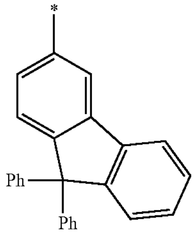
10-147
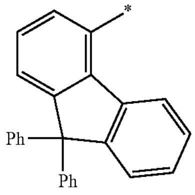
10-148
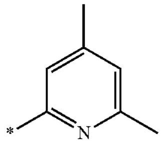
10-149
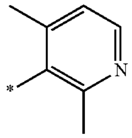
-continued
10-150
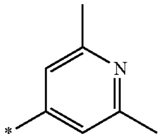
10-151
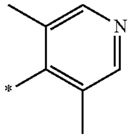
10-152
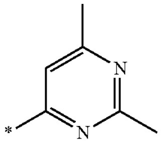
10-153
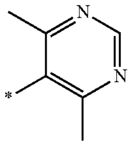
10-154
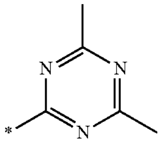
10-155
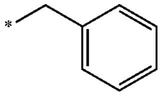
10-156
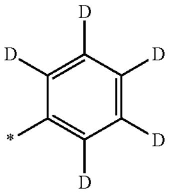
10-157
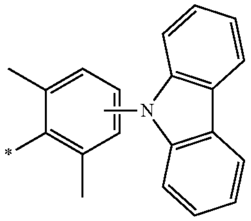
10-158
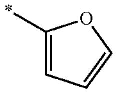
10-159
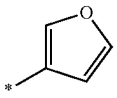
10-160
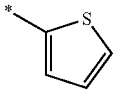

-continued
10-161
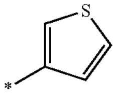
10-162
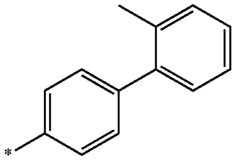
10-163
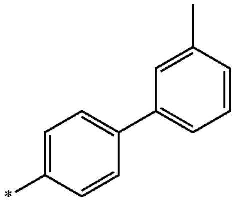
10-164
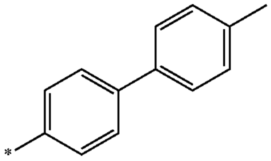
10-165
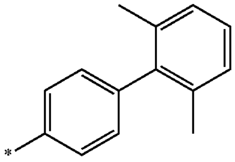
10-166
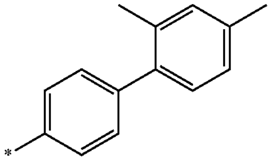
10-167
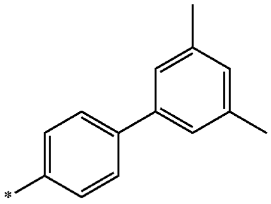
10-168
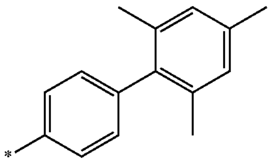
10-169
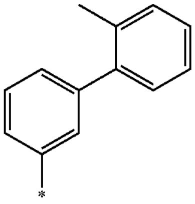
-continued
10-170
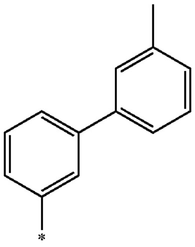
10-171
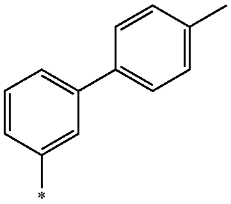
10-172
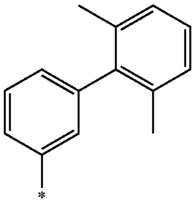
10-173
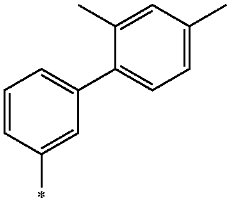
10-174
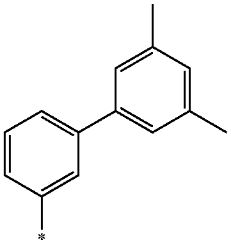
10-175
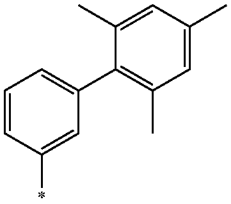
10-176
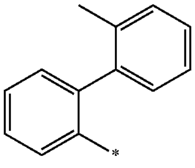

-continued
10-177
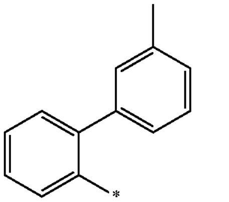
10-178
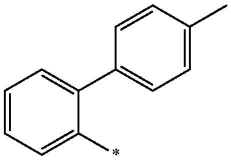
10-179
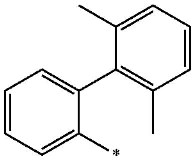
10-180
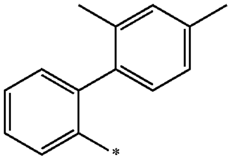
10-181
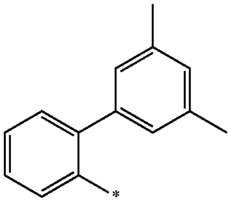
10-182
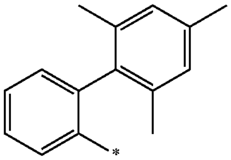
10-183
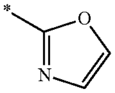
10-184
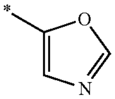
10-185
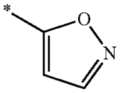
10-186
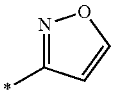
-continued
10-187
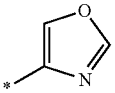
10-188
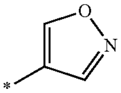
10-189
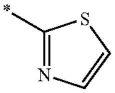
10-190
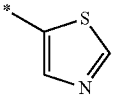
10-191
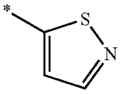
10-192
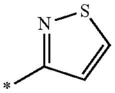
10-193
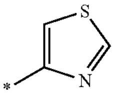
10-194
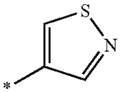
10-195
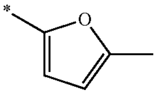
10-196
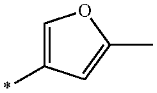
10-197
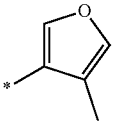
10-198
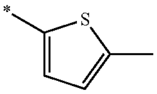
10-199
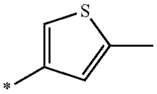
10-200
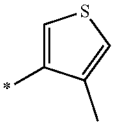

-continued
10-201
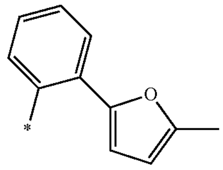
10-202
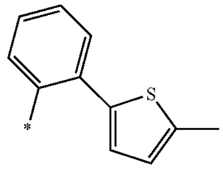
10-203
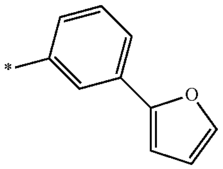
10-204
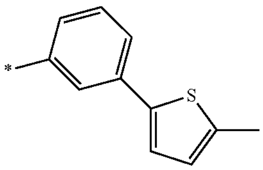
10-205
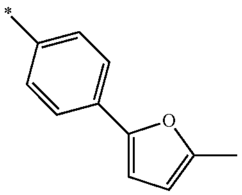
10-206
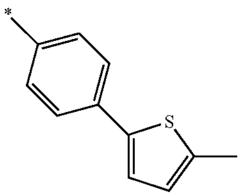
10-207
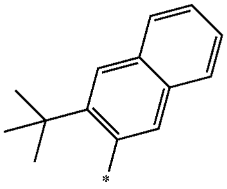
10-208
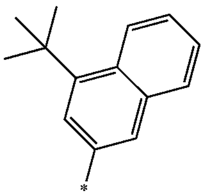
-continued
10-209
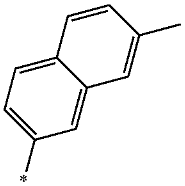
10-210
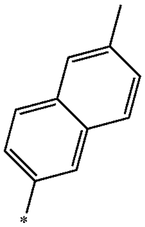
10-211
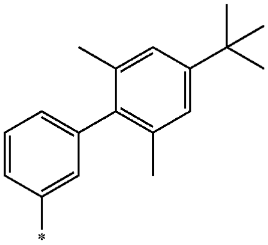
10-212
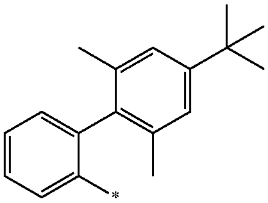
10-213
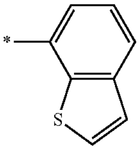
10-214
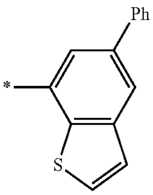
10-215
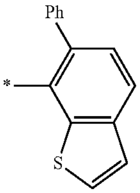
10-216
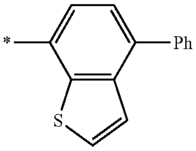

-continued
10-217
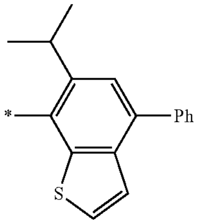
10-218
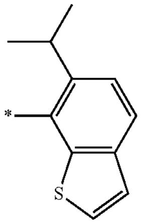
10-219
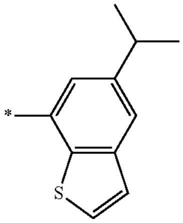
10-220
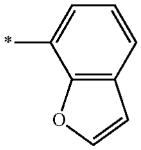
10-221
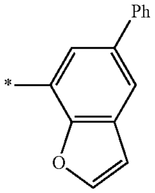
10-222
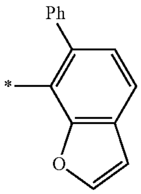
10-223
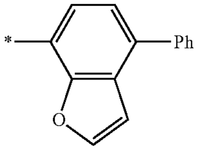
-continued
10-224
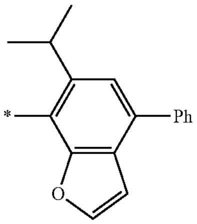
10-225
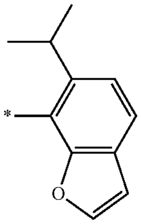
10-226
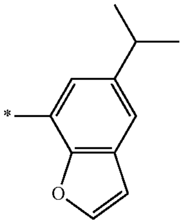
10-227
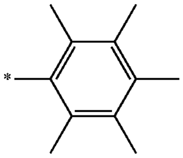
10-228
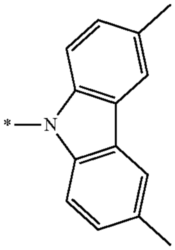
10-229
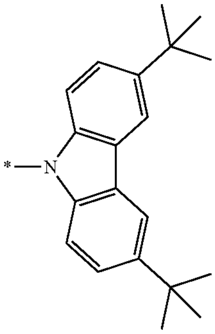

-continued
10-230
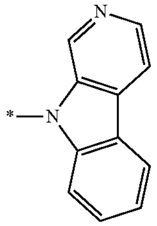
10-231
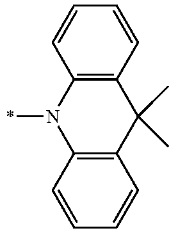
10-232
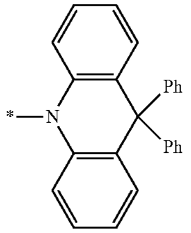
10-233
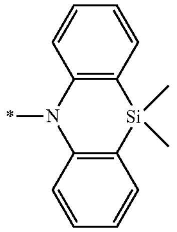
10-234
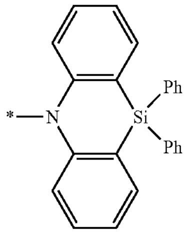
10-235
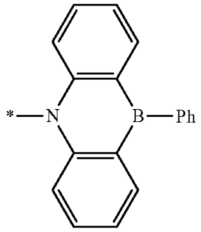
10-236
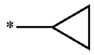
-continued
10-237
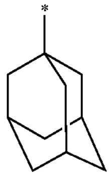
10-238
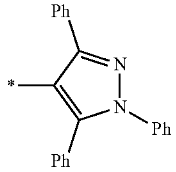
10-239
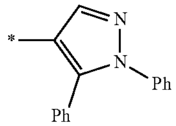
10-240
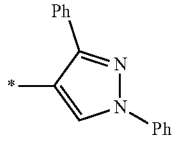
10-241
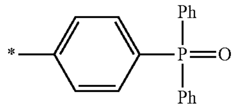
10-242
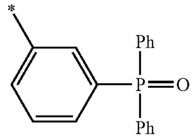
10-243
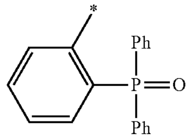
10-244
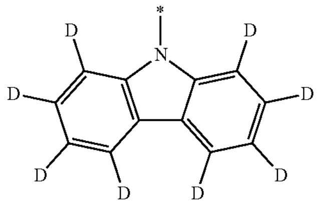
10-245
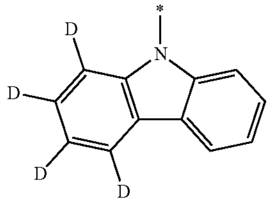

-continued 10-246

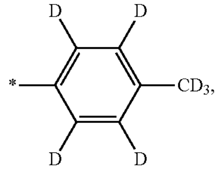

wherein, in Formulae 9-1 to 9-19 and 10-1 to 10-246, * indicates a binding site to an adjacent atom, "Ph" represents a phenyl group, and "TMS" represents a trimethylsilyl group.

In Formulae 3-1 to 3-5, 502, and 503, a71 to a74 and a501 to a504 may respectively indicate the number of $R_{71}$(s) to $R_{74}$(s) and $R_{501}$(s) to $R_{504}$(s), and a71 to a74 and a501 to a504 may each independently be an integer from 0 to 20. When a71 is 2 or greater, at least two $R_{71}$(s) may be identical to or different from each other, when a72 is 2 or greater, at least two $R_{72}$(s) may be identical to or different from each other, when a73 is 2 or greater, at least two $R_{73}$(s) may be identical to or different from each other, when a74 is 2 or greater, at least two $R_{74}$(s) may be identical to or different from each other, when a501 is 2 or greater, at least two $R_{501}$(s) may be identical to or different from each other, when a502 is 2 or greater, at least two $R_{502}$(s) may be identical to or different from each other, when a503 is 2 or greater, at least two $R_{503}$(s) may be identical to or different from each other, and when a504 is 2 or greater, at least two $R_{504}$(s) may be identical to or different from each other. a71 to a74 and a501 to a504 may each independently be an integer from 0 to 8.

In Formula 1, i) at least two of groups represented by $*-(L_1)_{b1}-(R_1)_{c1}$ in the number of a1 may optionally be bound to each other (via a single bond, a double bond, or a first linking group) to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, ii) at least two of $R_2$(s) in the number of a2 may optionally be bound to each other (via a single bond, a double bond, or a first linking group) to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, iii) at least two of $R_3$ in the number of a3 may optionally be bound to each other (via a single bond, a double bond, or a first linking group) to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, iv) at least two of $R_4$ in the number of a4 may optionally be bound to each other (via a single bond, a double bond, or a first linking group) to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and v) at least two of $R_1$ to $R_5$, $R_{5a}$, and $R_{5b}$ may optionally be bound to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$. The first linking group may be selected from $*-N(R_{95})-*'$, $*-B(R_{95})-*'$, $*-P(R_{95})-*'$, $*-C(R_{95a})(R_{95b})-*'$, $*-Si(R_{95a})(R_{95b})-*'$, $*-Ge(R_{95a})(R_{95b})-*'$, $*-S-*'$, $*-Se-*'$, $*-O-*'$, $*-C(=O)-*'$, $*-S(=O)-*'$, $*-S(=O)_2-*'$, $*-C(R_{95})=*'$, $*=C(R_{95})-*'$, $*-C(R_{95a})=C(R_{95b})-*'$, $*-C(=S)-*'$, and $*-C\equiv C-*'$, and $R_{95}$, $R_{95a}$, and $R_{95b}$ may each be understood by referring to the description of $R_1$ provided herein.

In some embodiments, in Formula 2, the group represented by $*-(N_{51})_{b51}-R_{51}$ and the group represented by $*-(L_{52})_{b52}-R_{52}$ may not be a phenyl group.

In some embodiments, in Formula 2, the group represented by $*-(L_{51})_{b51}-R_{51}$ may be identical to the group represented by $*-(L_{52})_{b52}-R_{52}$.

In one or more embodiments, in Formula 2, the group represented by $*-(L_{51})_{b51}-R_{51}$ and the group represented by $*-(L_{52})_{b52}-R_{52}$ may be different from each other.

In one or more embodiments, in Formula 2, b51 and b52 may each independently be 1, 2, or 3, $L_{51}$ and $L_{52}$ may each independently be a benzene group, a pyridine group, a pyrimidine group, a pyridazine group, a pyrazine group, or a triazine group, each independently unsubstituted or substituted with at least one $R_{10a}$.

In some embodiments, in Formula 2, $R_{51}$ and $R_{52}$ may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $-C(Q_1)(Q_2)(Q_3)$, or $-Si(Q_1)(Q_2)(Q_3)$, wherein $Q_1$ to $Q_3$ may each independently be a $C_3$-$C_{60}$ carbocyclic group or a $C_1$-$C_{60}$ heterocyclic group, each independently unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In some embodiments, in Formula 2, the group represented by $*-(L_{51})_{b51}-R_{51}$ may be a group represented by one of Formulae CY51-1 to CY51-26, in Formula 2, the group represented by $*-(L_{52})_{b52}-R_{52}$ may be a group represented by one of Formulae CY52-1 to CY52-26, and/or in Formula 2, the group represented by $*-(L_{53})_{b53}-R_{53}$ may be a group represented by one of Formulae CY53-1 to CY53-27, $-C(Q_1)(Q_2)(Q_3)$, or $-Si(Q_1)(Q_2)(Q_3)$:

CY51-1

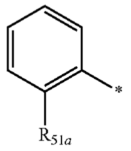

CY51-2

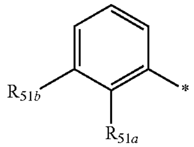

CY51-3

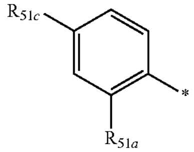

-continued
CY51-4
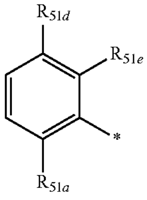
CY51-5
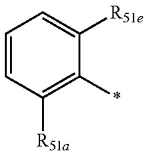
CY51-6
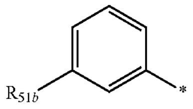
CY51-7
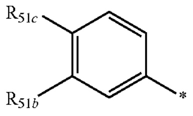
CY51-8
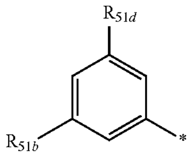
CY51-9
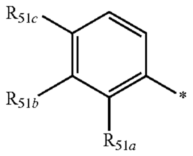
CY51-10
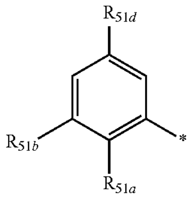
CY51-11
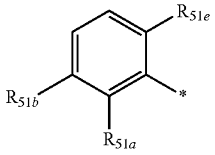
CY51-12
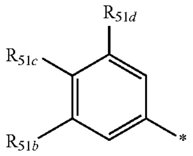
CY51-13
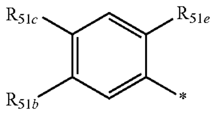
-continued
CY51-14
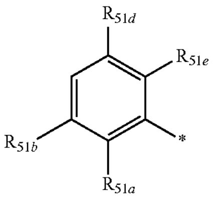
CY51-15
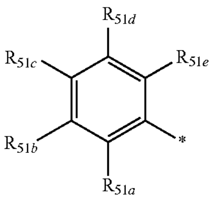
CY51-16
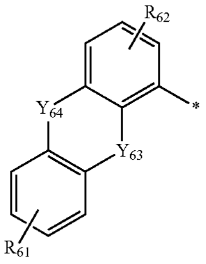
CY51-17
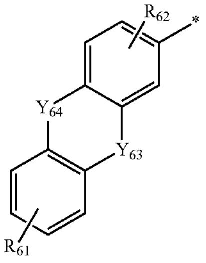
CY51-18
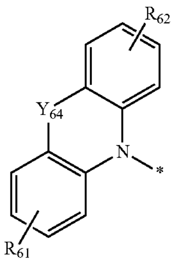
CY51-19
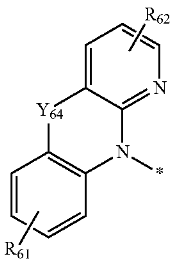

-continued
CY51-20
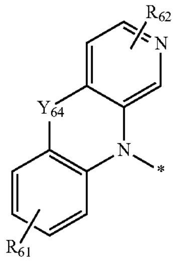
CY51-21
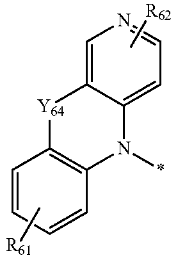
CY51-22
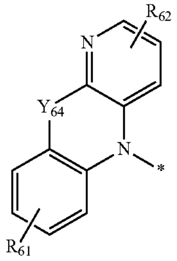
CY51-23
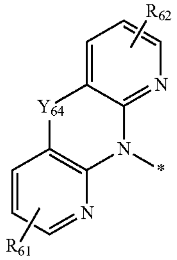
CY51-24
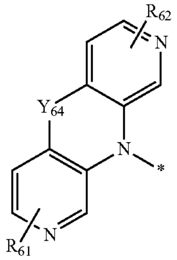
CY51-25
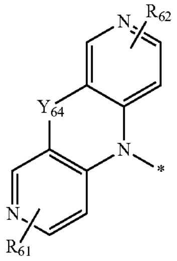
-continued
CY51-26
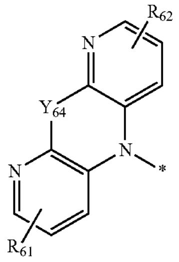
CY52-1
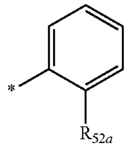
CY52-2
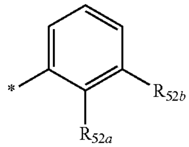
CY52-3
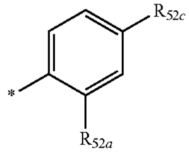
CY52-4
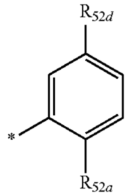
CY52-5
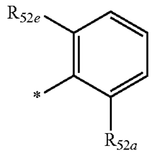
CY52-6
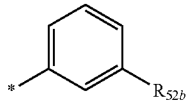
CY52-7
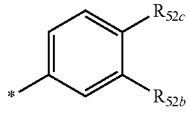
CY52-8
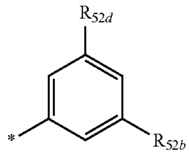

-continued
CY52-9
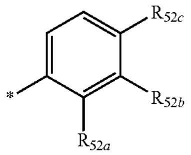
CY52-10
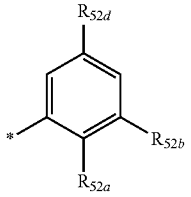
CY52-11
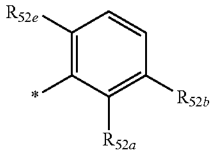
CY52-12
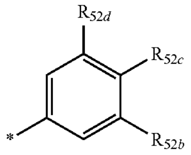
CY52-13
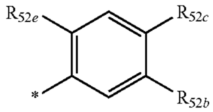
CY52-14
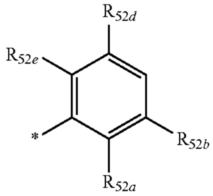
CY52-15
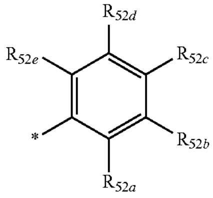
CY52-16
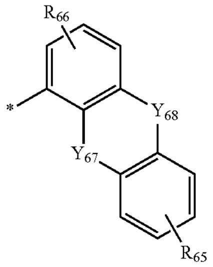
-continued
CY52-17
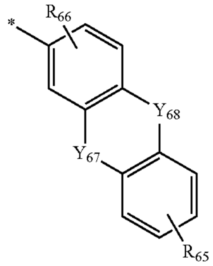
CY52-18
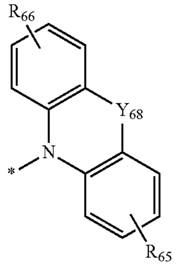
CY52-19
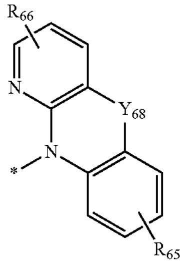
CY52-20
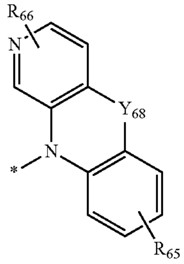
CY52-21
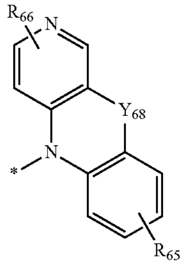
CY52-22
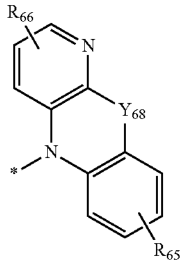

-continued
CY52-23
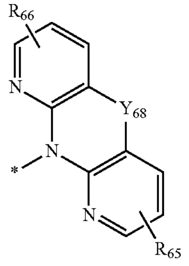
CY52-24
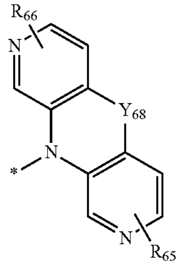
CY52-25
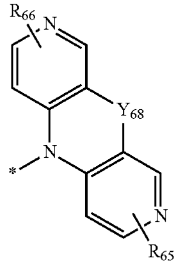
CY52-26
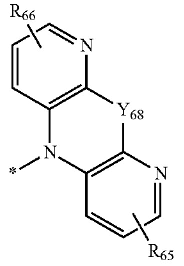
CY53-1
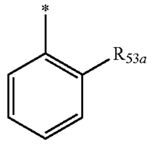
CY53-2
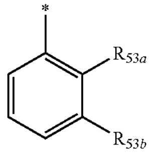
CY53-3
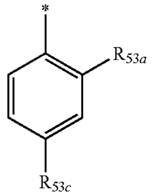
-continued
CY53-4
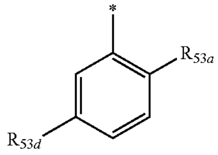
CY53-5
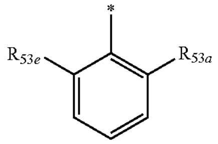
CY53-6
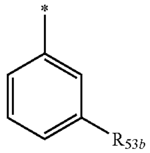
CY53-7
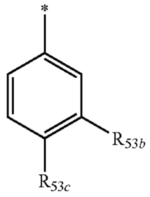
CY53-8
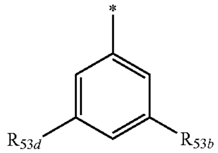
CY53-9
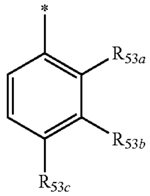
CY53-10
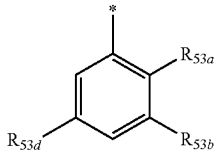
CY53-11
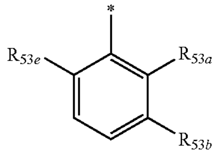
CY53-12
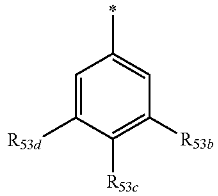

-continued
CY53-13
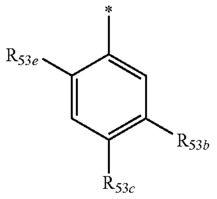
CY53-14
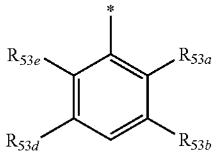
CY53-15
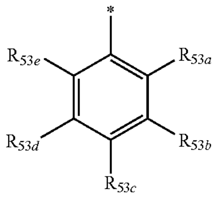
CY53-16
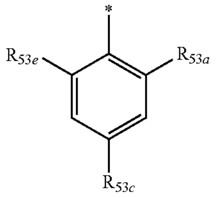
CY53-17
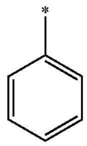
CY53-18
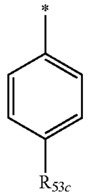
CY53-19
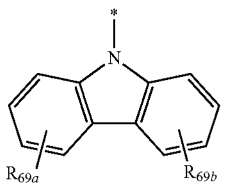
CY53-20
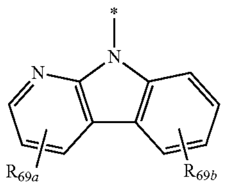
-continued
CY53-21
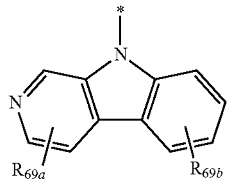
CY53-22
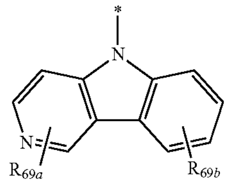
CY53-23
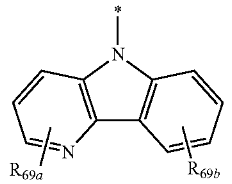
CY53-24
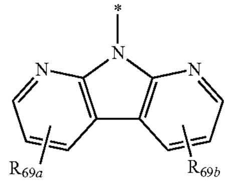
CY53-25
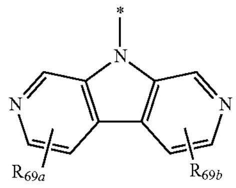
CY53-26
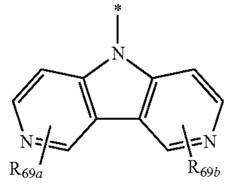
CY53-27
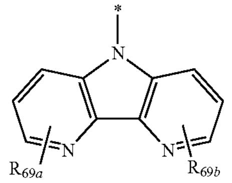
,
wherein, in Formulae CY51-1 to CY51-26, CY52-1 to CY52-26, and CY53-1 to CY53-27,
$Y_{63}$ may be a single bond, O, S, $N(R_{63})$, $B(R_{63})$, $C(R_{63a})(R_{63b})$, or $Si(R_{63a})(R_{63b})$,
$Y_{64}$ may be a single bond, O, S, $N(R_{64})$, $B(R_{64})$, $C(R_{64a})(R_{64b})$, or $Si(R_{64a})(R_{64b})$,
$Y_{67}$ may be a single bond, O, S, $N(R_{67})$, $B(R_{67})$, $C(R_{67a})(R_{67b})$, or $Si(R_{67a})(R_{67b})$,
$Y_{68}$ may be a single bond, O, S, $N(R_{68})$, $B(R_{68})$, $C(R_{68a})(R_{68b})$, or $Si(R_{68a})(R_{68b})$, $Y_{63}$ and $Y_{64}$ in Formulae CY51-16 and CY51-17 may not be a single bond at the same time, $Y_{67}$ and $Y_{68}$ in Formulae CY52-16 and CY52-17 may not be a single bond at the same time, $R_{51a}$ to $R_{51e}$, $R_{61}$ to $R_{64}$, $R_{63a}$, $R_{63b}$, $R_{64a}$, and $R_{64b}$ may each be understood by referring to the description of $R_{51}$, and $R_{51a}$ to $R_{51e}$ may not each be hydrogen, $R_{52a}$ to $R_{52e}$, Res to $R_{68}$, $R_{67a}$, $R_{67b}$, $R_{68a}$, and $R_{68b}$ may each be understood by referring to the description of $R_{52}$, and $R_{52a}$ to $R_{52e}$ may not each be hydrogen, $R_{53a}$ to $R_{53e}$, $R_{69a}$, and $R_{69b}$ may each be understood by referring to the description of $R_{53}$, and $R_{53a}$ to $R_{53e}$ may not each be hydrogen, and

* indicates a binding site to an adjacent atom.

In some embodiments, $R_{51a}$ to $R_{51e}$ and $R_{52a}$ to $R_{52e}$ in Formulae CY51-1 to CY51-26 and Formula CY52-1 to 52-26 may each independently be:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each independently unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or $—C(Q_1)(Q_2)(Q_3)$ or $—Si(Q_1)(Q_2)(Q_3)$, wherein $Q_1$ to $Q_3$ may each independently be a phenyl group, a naphthyl group, a pyridinyl group, a pyrimidinyl group, a pyridazinyl group, a pyrazinyl group, or a triazinyl group, each independently unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof, in Formulae CY51-16 and CY51-17, i) $Y_{63}$ may be O or S, and $Y_{64}$ may be $Si(R_{64a})(R_{64b})$, or ii) $Y_{63}$ may be $Si(R_{63a})(R_{63b})$, and $Y_{64}$ may be O or S, in Formulae CY52-16 and CY52-17, i) $Y_{67}$ may be O or S, and $Y_{68}$ may be $Si(R_{68a})(R_{68b})$, or ii) $Y_{67}$ may be $Si(R_{67a})(R_{67b})$, and $Y_{68}$ may be O or S.

In Formulae 3-1 to 3-5, $L_{81}$ to $L_{85}$ may each independently be:

a single bond; or $*—C(Q_4)(Q_5)-*'$ or $*—Si(Q_4)(Q_5)—*'$; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each independently unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof, wherein $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In some embodiments, in Formulae 3-1 and 3-2, the group represented by

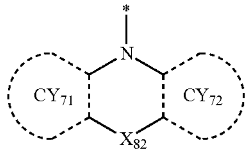

may be a group represented by one of Formulae CY71-1 (1) to CY71-1(8), and/or in Formulae 3-1 and 3-3, the group represented by

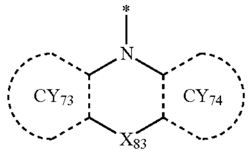

may be a group represented by one of Formulae CY71-2(1) to CY71-2(8), and/or in Formulae 3-2 and 3-4, the group represented by

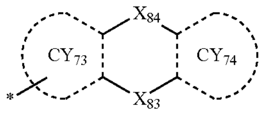

may be a group represented by one of Formulae CY71-3(1) to CY71-3(32), and/or in Formulae 3-3 to 3-5, the group represented by

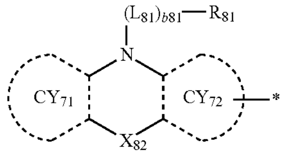

may be a group represented by one of Formulae CY71-4(1) to CY71-4(32), and/or in Formula 3-5, the group represented by

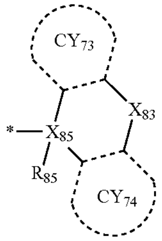

may be a group represented by one of Formulae CY71-5(1) to CY71-5(8):

CY71-1(1)

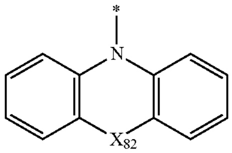

CY71-1(2)

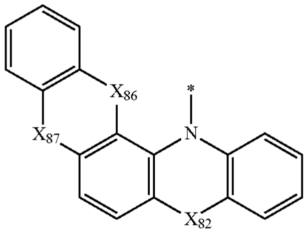

CY71-1(3)

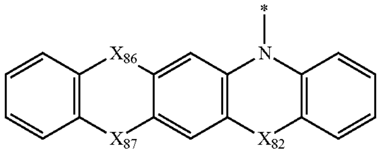

CY71-1(4)

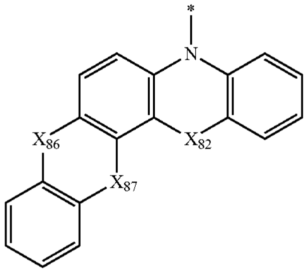

CY71-1(5)

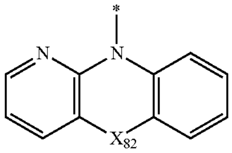

CY71-1(6)

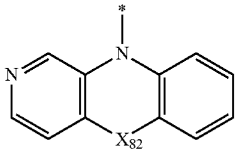

CY71-1(7)

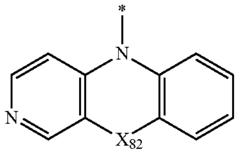

CY71-1(8)

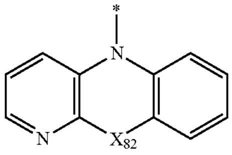

-continued
CY71-2(1)
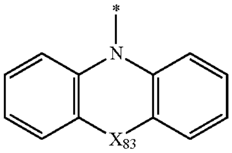
CY71-2(2)
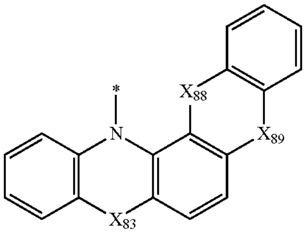
CY71-2(3)
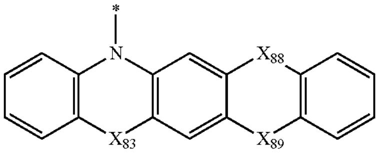
CY71-2(4)
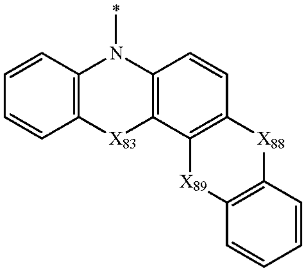
CY71-2(5)
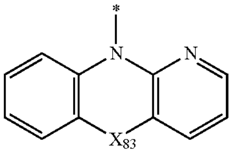
CY71-2(6)
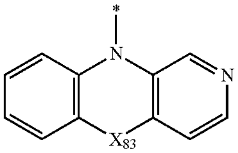
CY71-2(7)
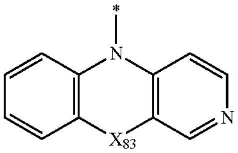
CY71-2(8)
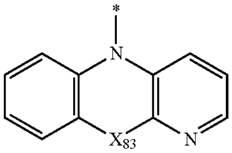
-continued
CY71-3(1)
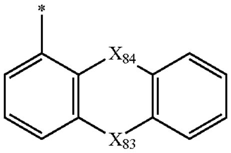
CY71-3(2)
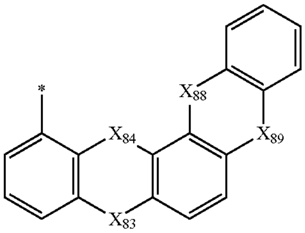
CY71-3(3)
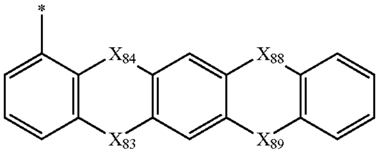
CY71-3(4)
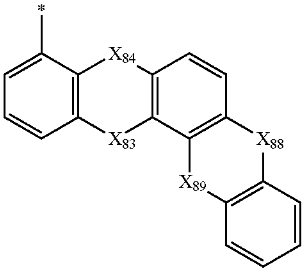
CY71-3(5)
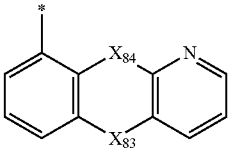
CY71-3(6)
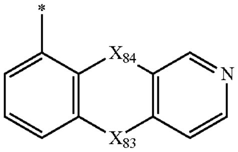
CY71-3(7)
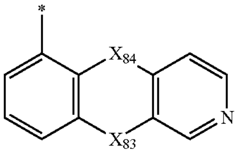
CY71-3(8)
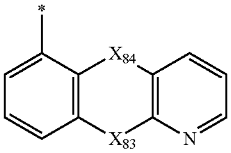
CY71-3(9)
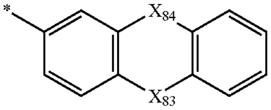

-continued
CY71-3(10)
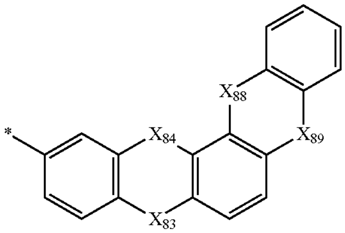
CY71-3(11)
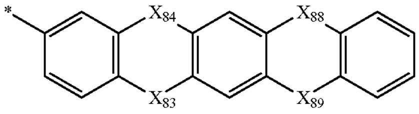
CY71-3(12)
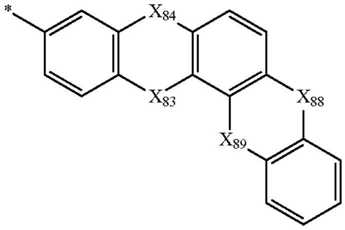
CY71-3(13)
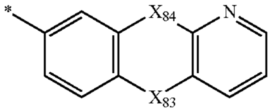
CY71-3(14)
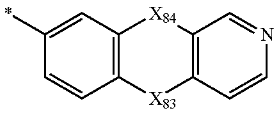
CY71-3(15)
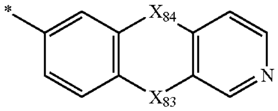
CY71-3(16)
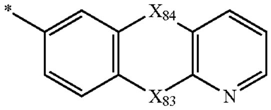
CY71-3(17)
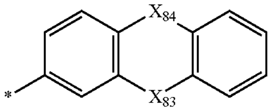
CY71-3(18)
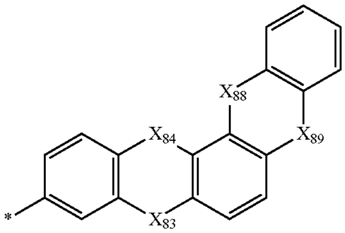
CY71-3(19)
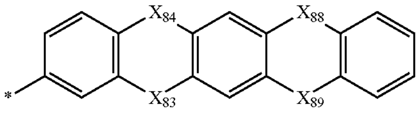
-continued
CY71-3(20)
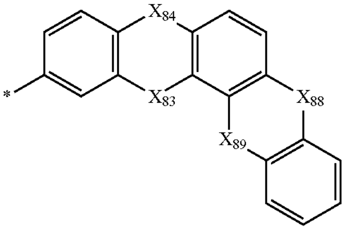
CY71-3(21)
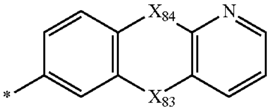
CY71-3(22)
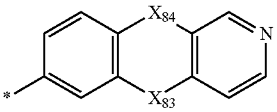
CY71-3(23)
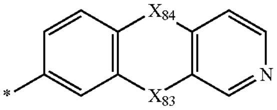
CY71-3(24)
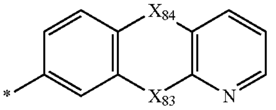
CY71-3(25)
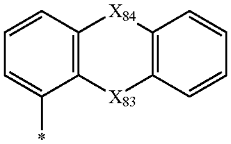
CY71-3(26)
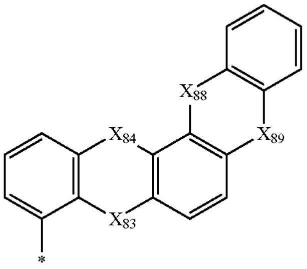
CY71-3(27)
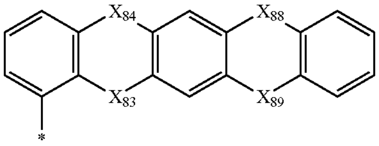
CY71-3(28)
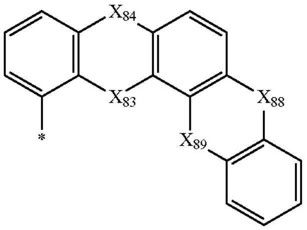

-continued
CY71-3(29)
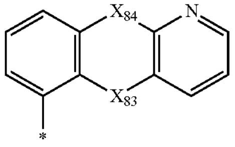
CY71-3(30)
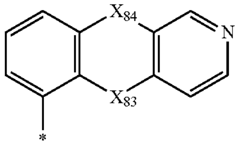
CY71-3(31)
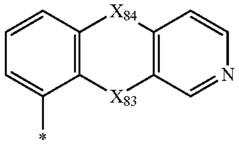
CY71-3(32)
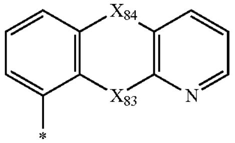
CY71-4(1)
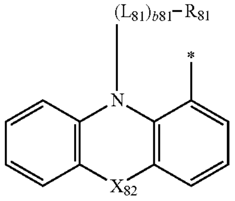
CY71-4(2)
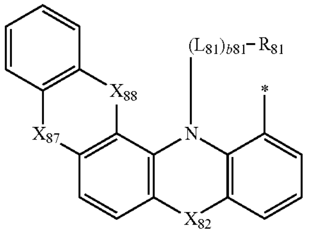
CY71-4(3)
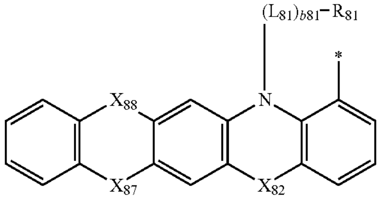
CY71-4(4)
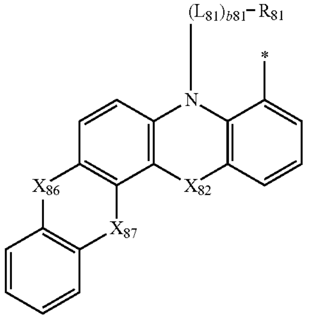
-continued
CY71-4(5)
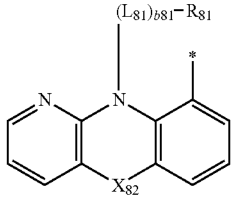
CY71-4(6)
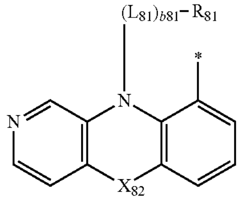
CY71-4(7)
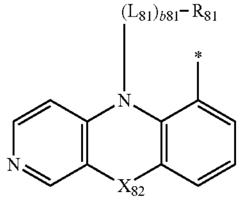
CY71-4(8)
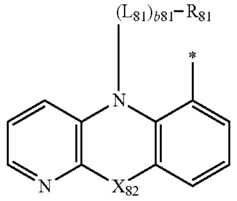
CY71-4(9)
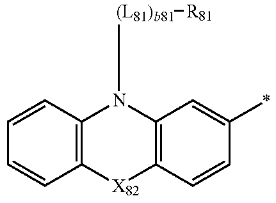
CY71-4(10)
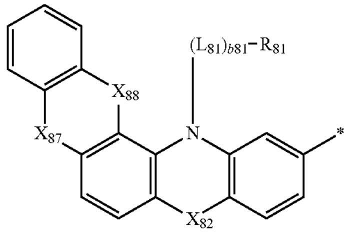
CY71-4(11)
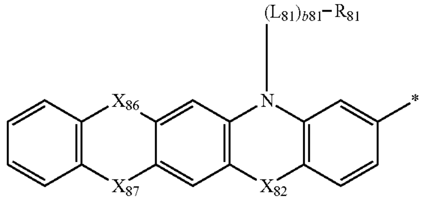

-continued
CY71-4(12)
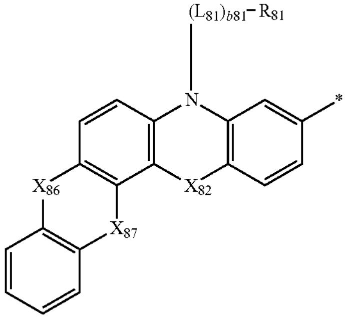
CY71-4(13)
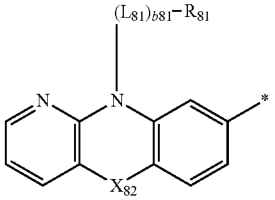
CY71-4(14)
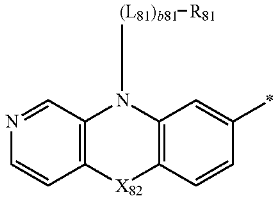
CY71-4(15)
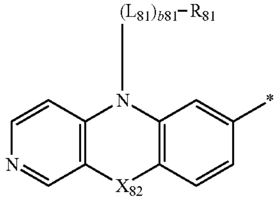
CY71-4(16)
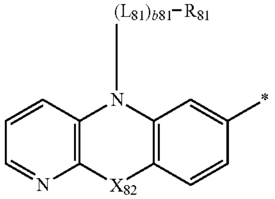
CY71-4(17)
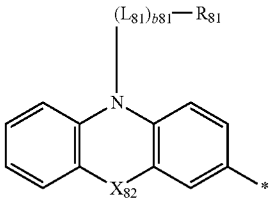
CY71-4(18)
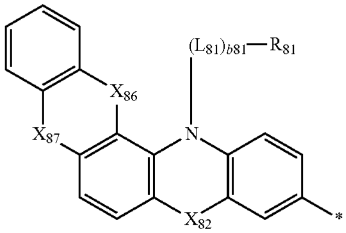
-continued
CY71-4(19)
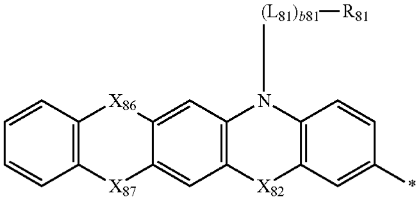
CY71-4(20)
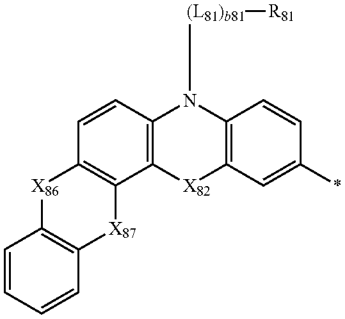
CY71-4(21)
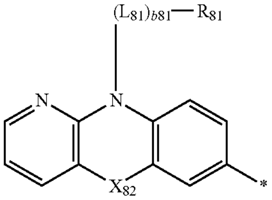
CY71-4(22)
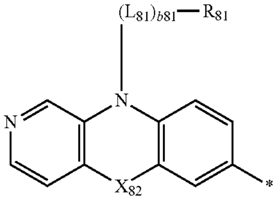
CY71-4(23)
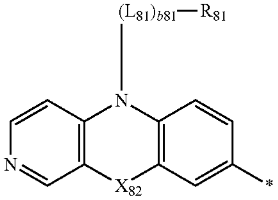
CY71-4(24)
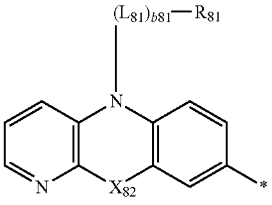
CY71-4(25)
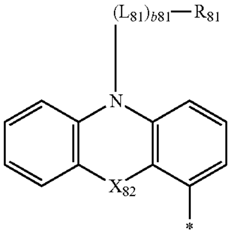

-continued
CY71-4(26)
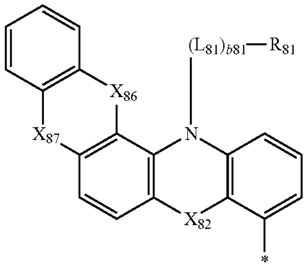
CY71-4(27)
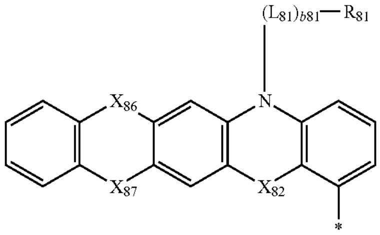
CY71-4(28)
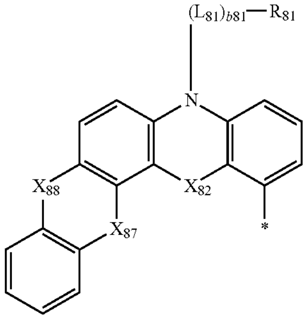
CY71-4(29)
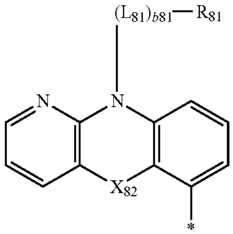
CY71-4(30)
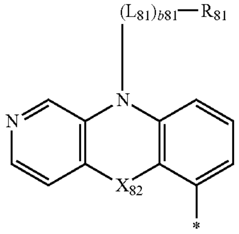
CY71-4(31)
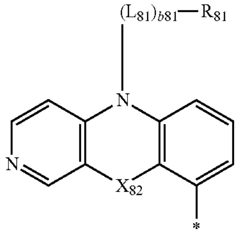
-continued
CY71-4(32)
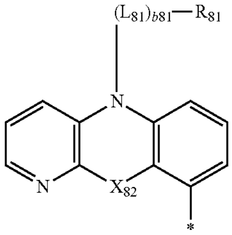
CY71-5(1)
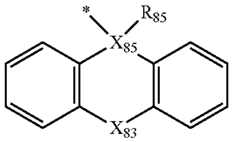
CY71-5(2)
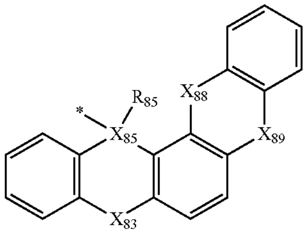
CY71-5(3)
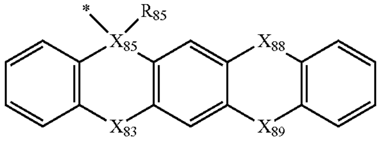
CY71-5(4)
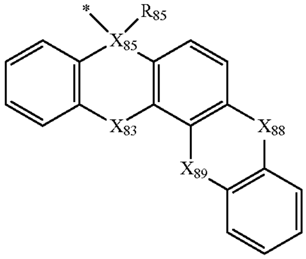
CY71-5(5)
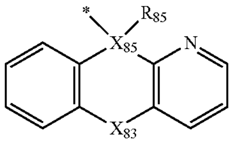
CY71-5(6)
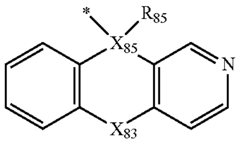
CY71-5(7)
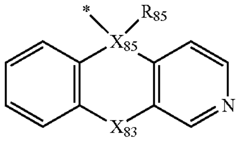

-continued

CY71-5(8)

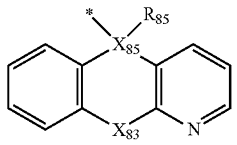

, wherein, in Formulae CY71-1 (1) to CY71-1 (8), CY71-2(1) to CY71-2(8), CY71-3(1) to CY71-3(32), CY71-4(1) to CY71-4(32), and CY71-5(1) to CY71-5(8), $X_{82}$ to $X_{85}$, $L_{81}$, b81, $R_{81}$, and $R_{85}$ may respectively be understood by referring to the descriptions of $X_{82}$ to $X_{85}$, $L_{81}$, b81, $R_{81}$, and $R_{85}$ provided herein, $X_{86}$ may be a single bond, O, S, N($R_{86}$), B($R_{86}$), C($R_{86a}$)($R_{86b}$), or Si($R_{86a}$)($R_{86}$), $X_{87}$ may be a single bond, O, S, N($R_{87}$), B($R_{87}$), C($R_{87a}$)($R_{87b}$), or Si($R_{87a}$)($R_{87b}$), in Formulae CY71-1 (1) to CY71-1 (8) and CY71-4(1) to CY71-4(32), $X_{86}$ and $X_{87}$ may not be a single bond at the same time, $X_{88}$ may be a single bond, O, S, N($R_{88}$), B($R_{88}$), C($R_{88a}$)($R_{88b}$), or Si($R_{88a}$)($R_{88b}$), $X_{89}$ may be a single bond, O, S, N($R_{89}$), B($R_{89}$), C($R_{89a}$)($R_{89b}$), or Si($R_{89a}$)($R_{89b}$), in Formulae CY71-2(1) to CY71-2(8), CY71-3(1) to CY71-3(32), and CY71-5(1) to CY71-5(8), $X_{88}$ and $X_{89}$ may not be a single bond at the same time, and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ may each be understood by referring to the description of $R_{81}$ provided herein.

Detailed Examples of Compounds

In some embodiments, the first compound (the organometallic compound represented by Formula 1) may include (e.g., may be) at least one of Compounds D1 to D315, at least one of Compounds 1 to 120, or any combination thereof:

D1

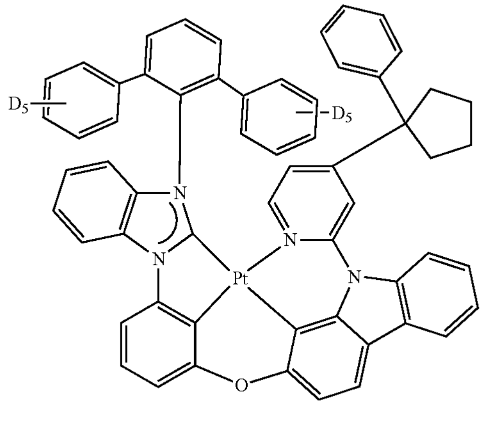

-continued

D2

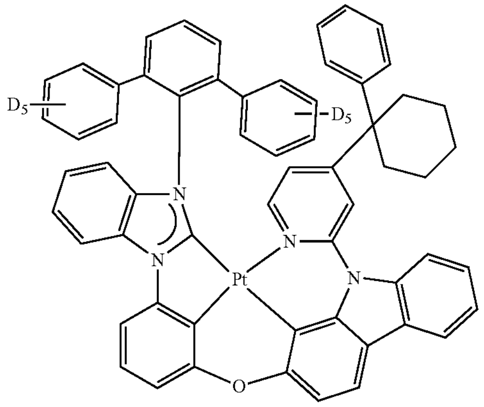

D3

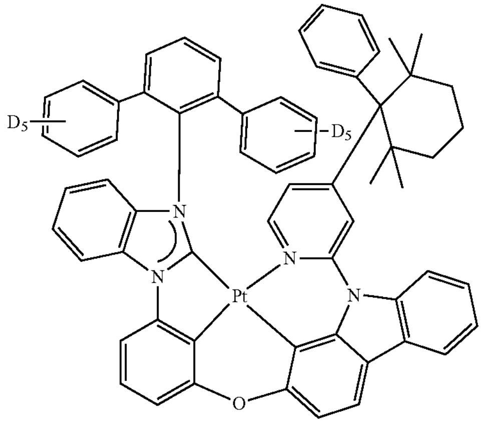

D4

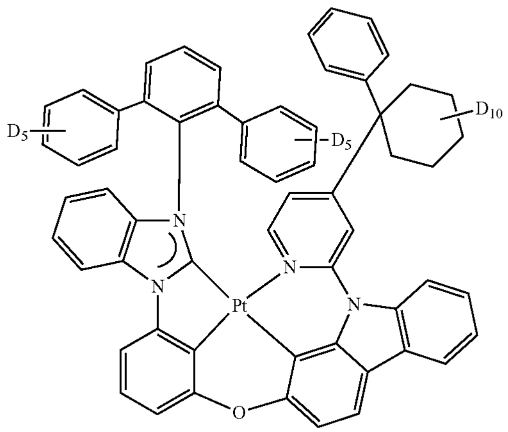

-continued
D5
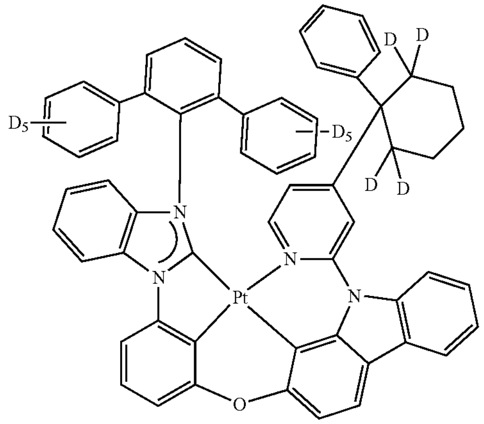
D6
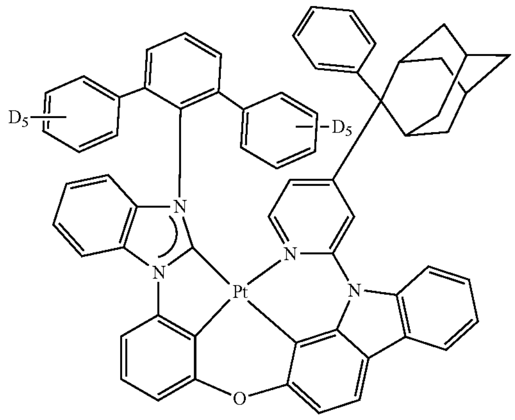
D7
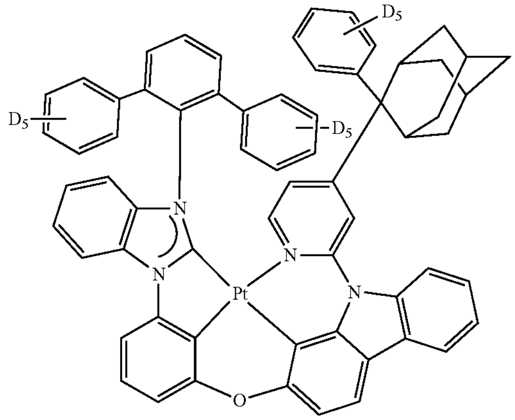
-continued
D8
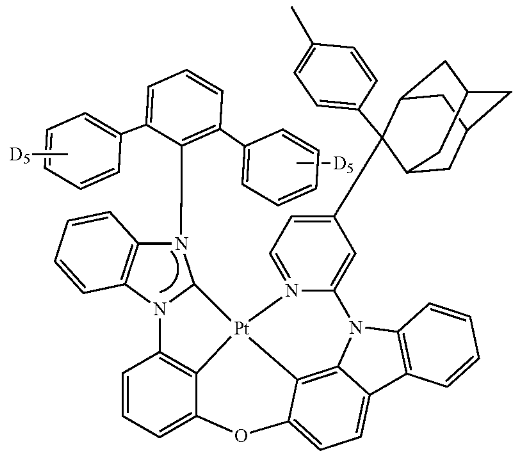
D9
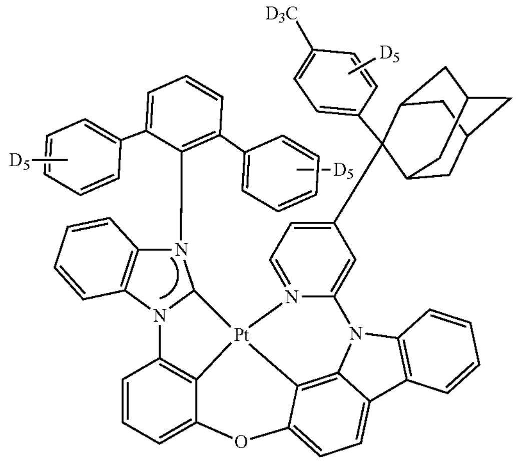
D10
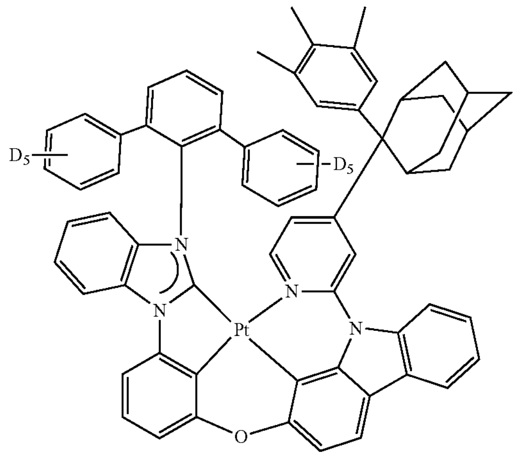

-continued
D11
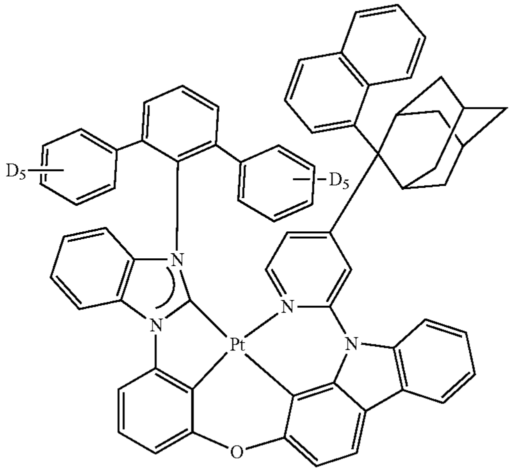
D12
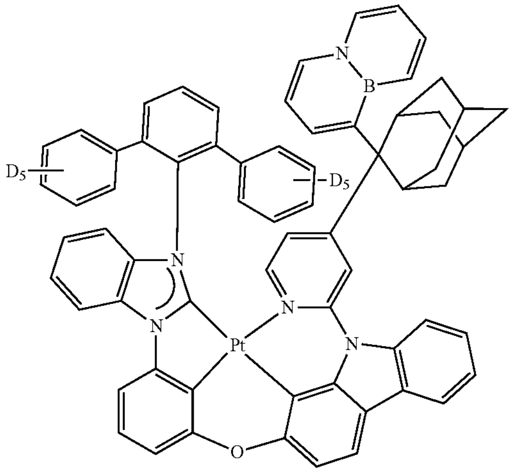
D13
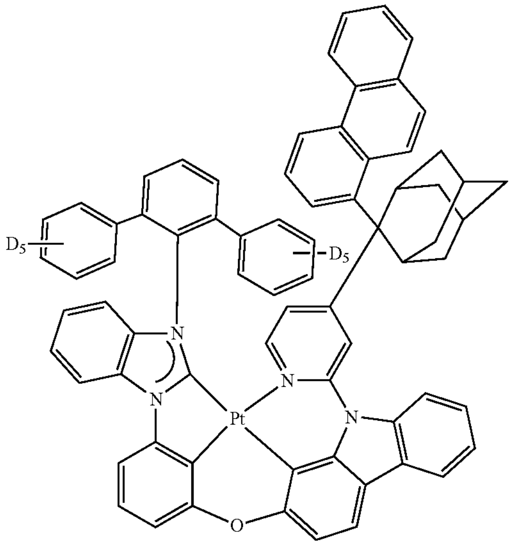
-continued
D14
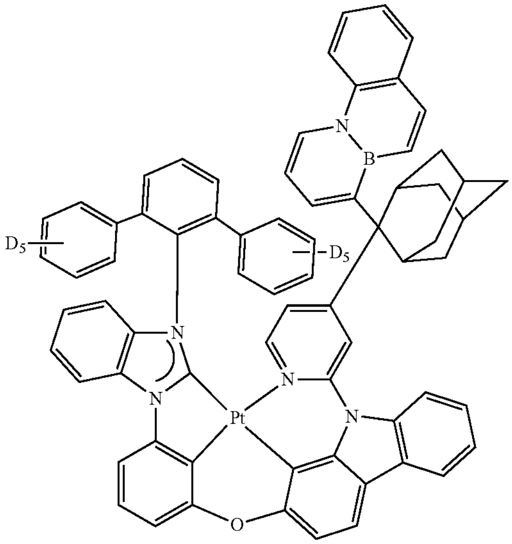
D15
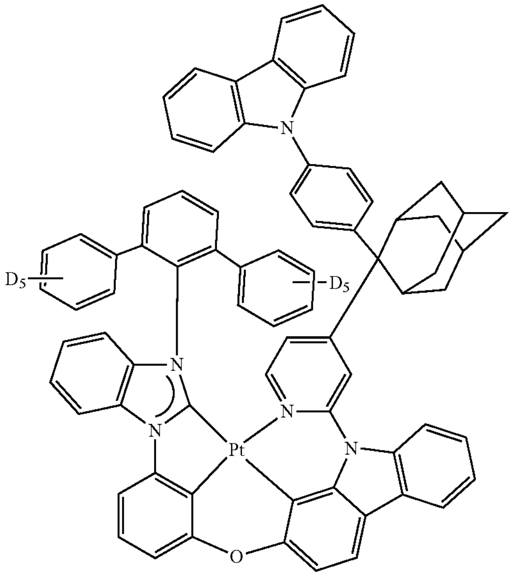
D16
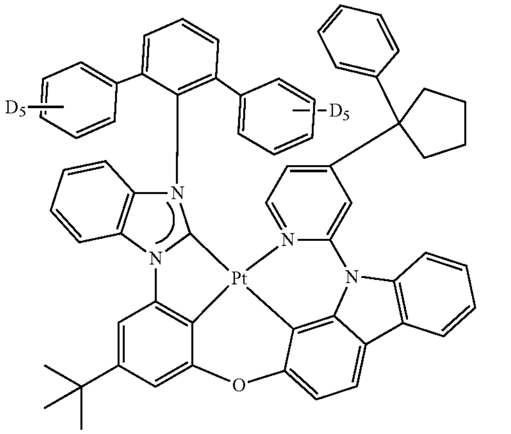

-continued
D17
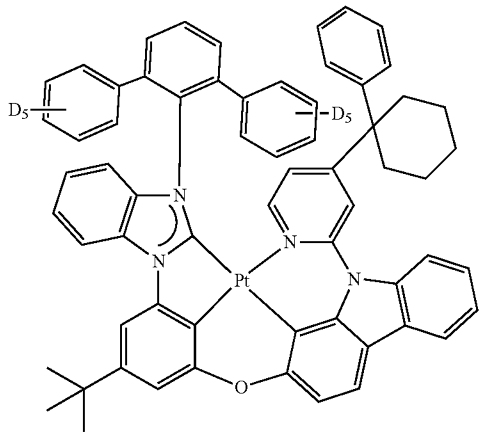
D18
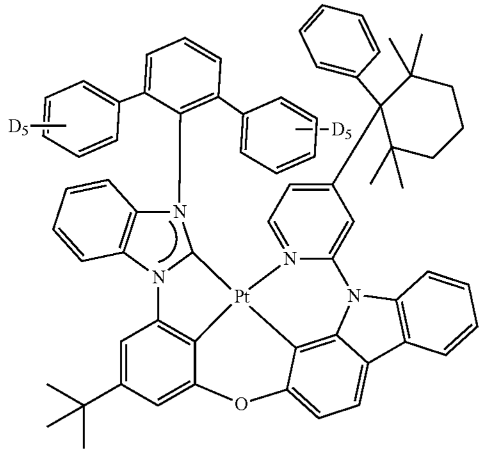
D19
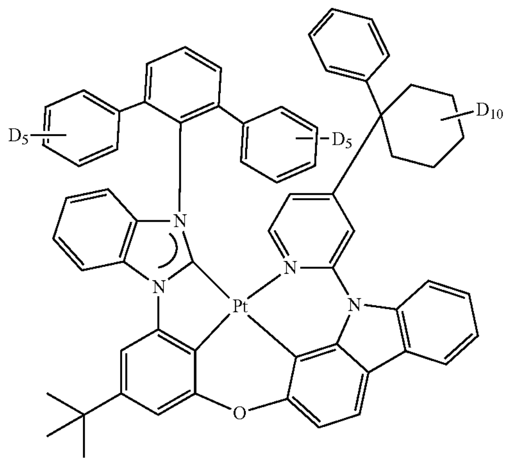
-continued
D20
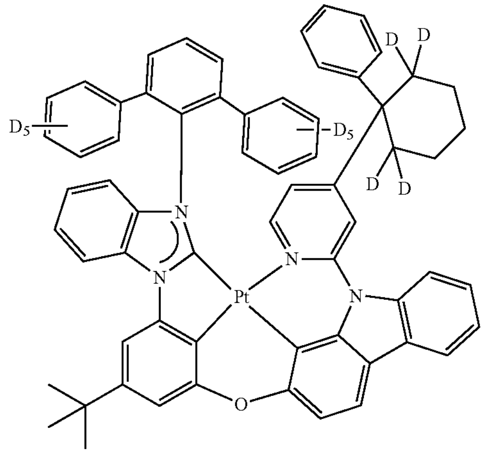
D21
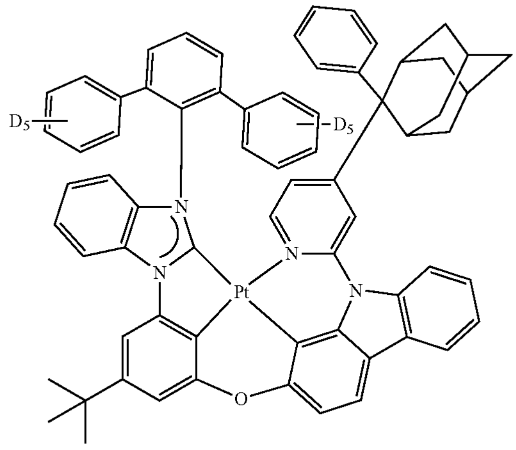
D22
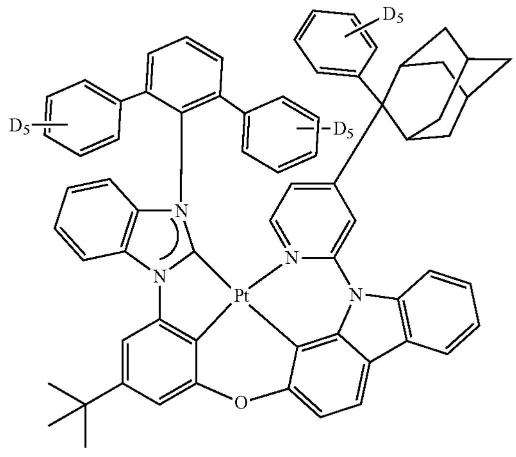

-continued
D23
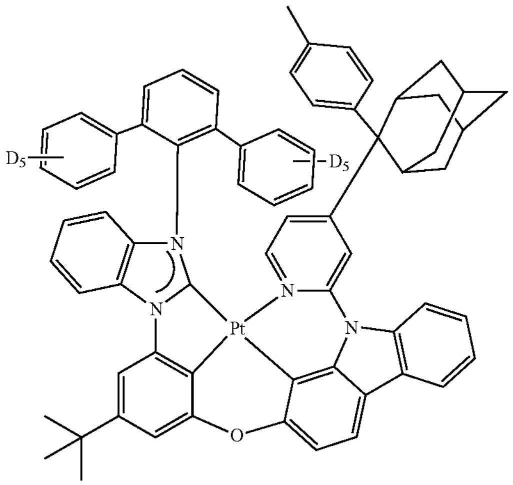
D24
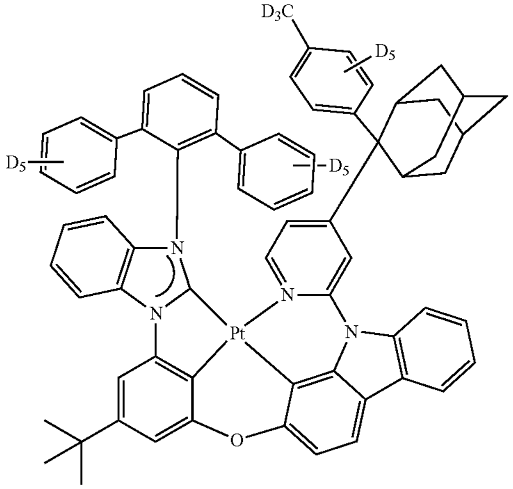
D25
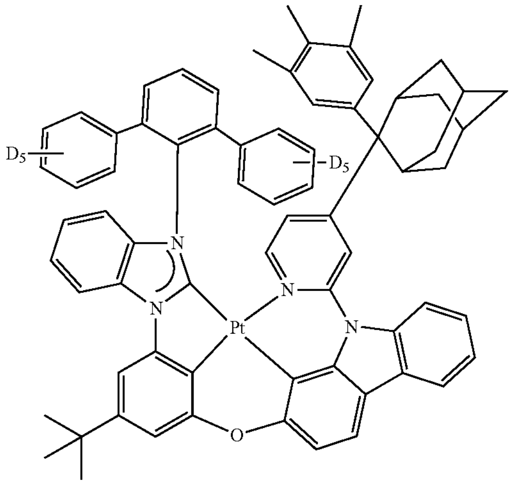
-continued
D26
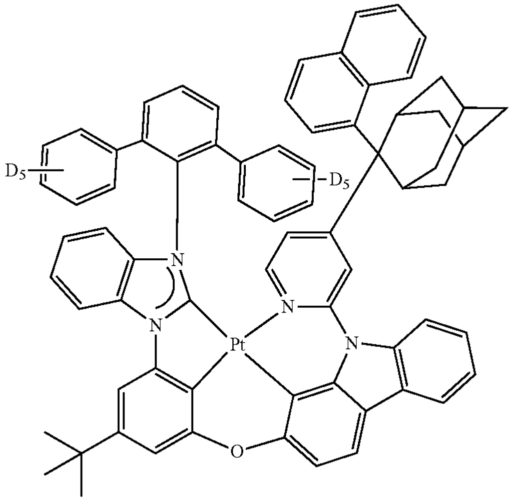
D27
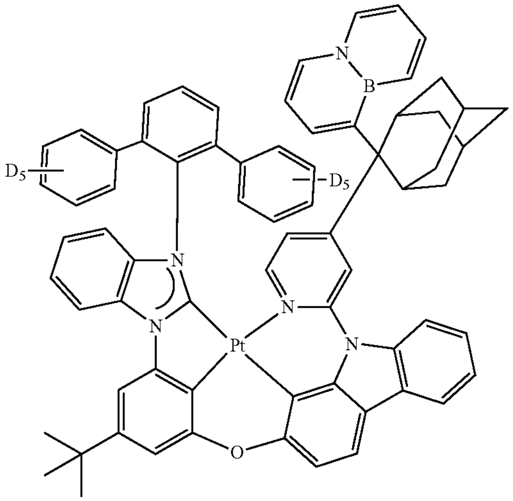
D28
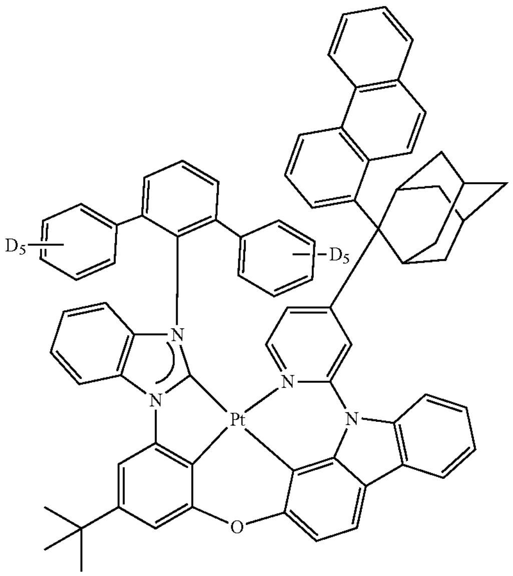

-continued
D29
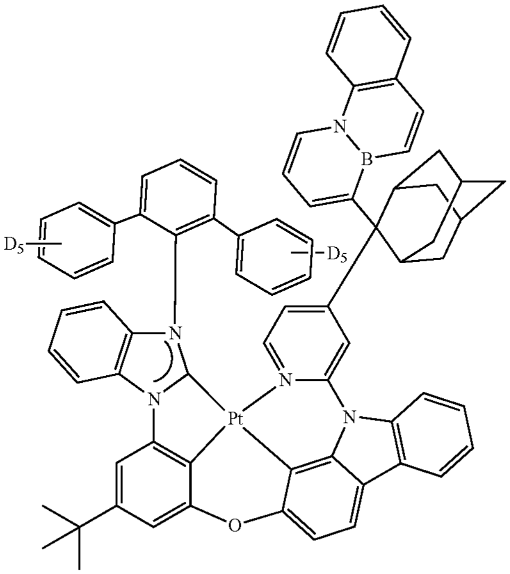
D30
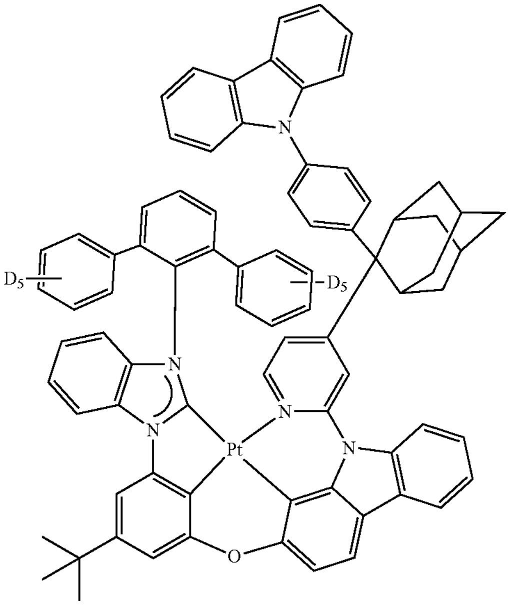
-continued
D31
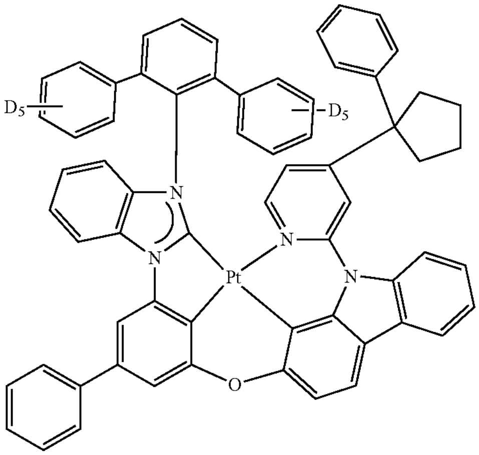
D32
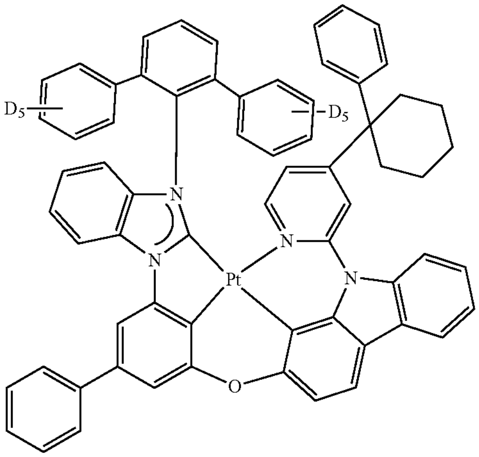
D33
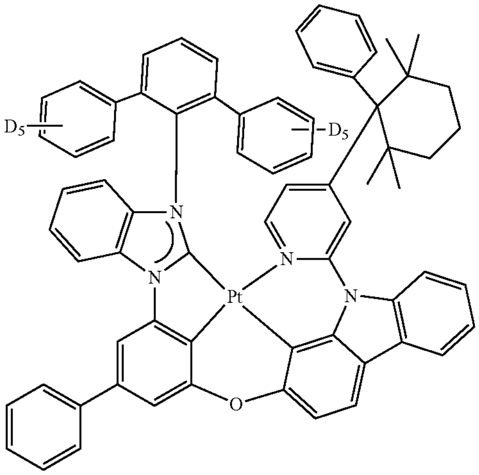

-continued
D34
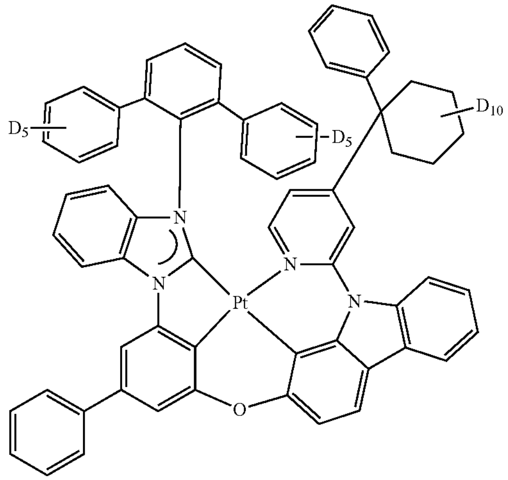
D35
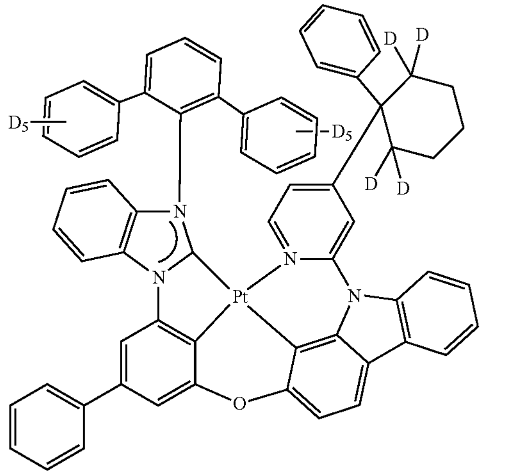
D36
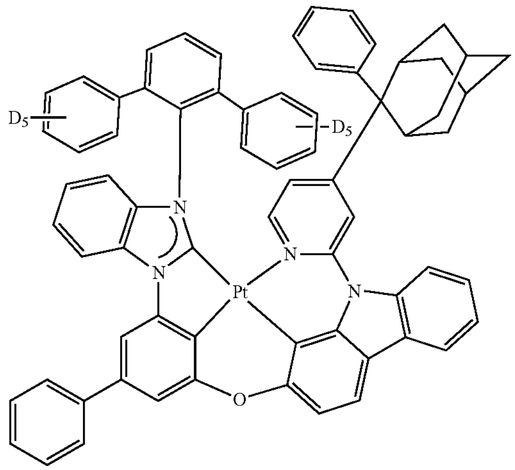
-continued
D37
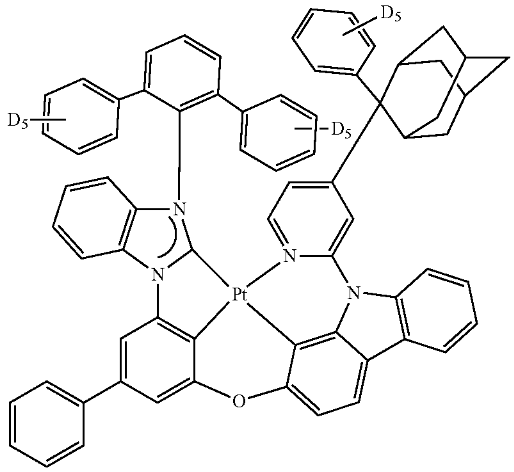
D38
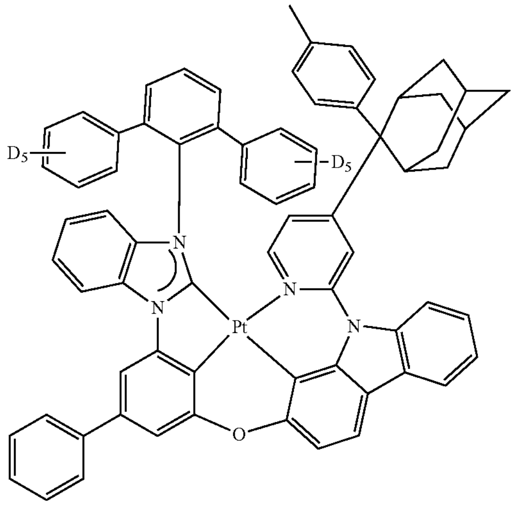
D39
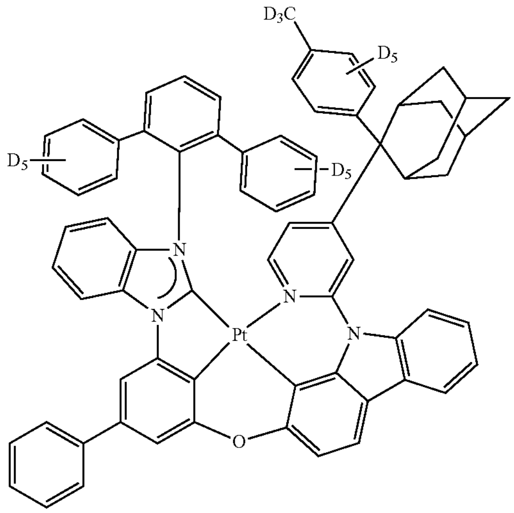

-continued
D40
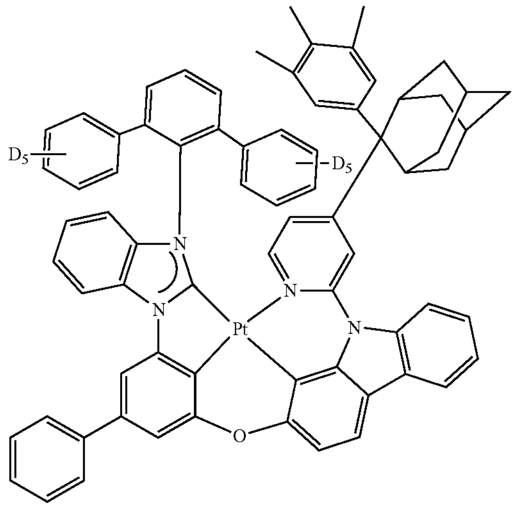
D41
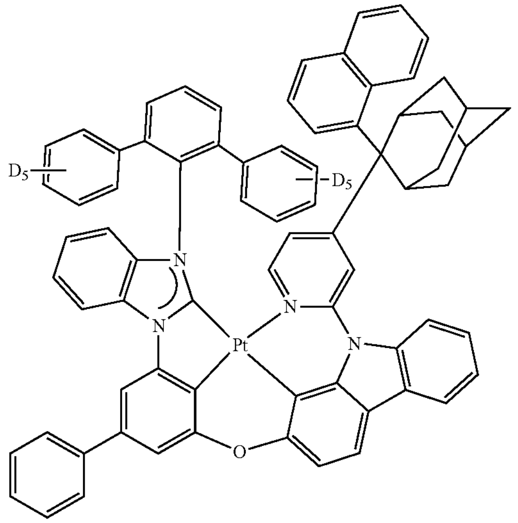
D42
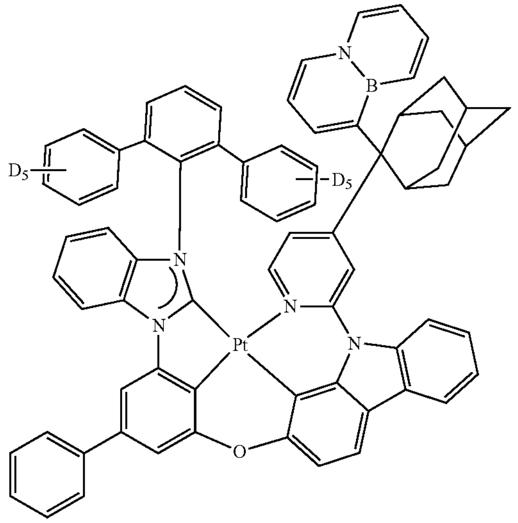
-continued
D43
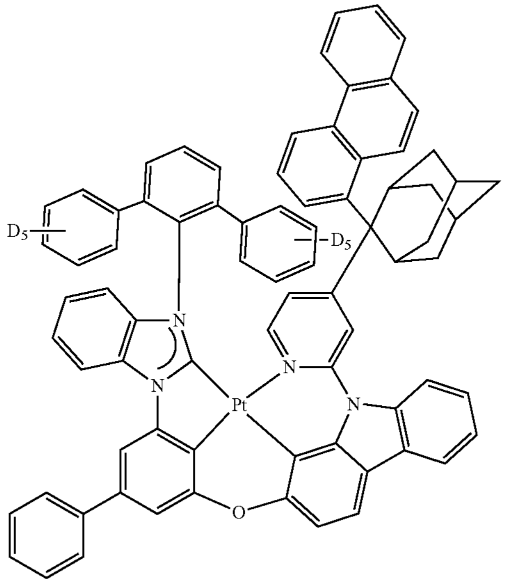
D44
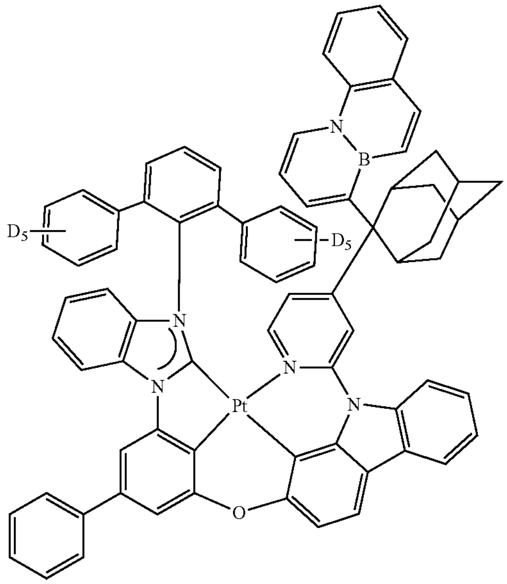

-continued
D45
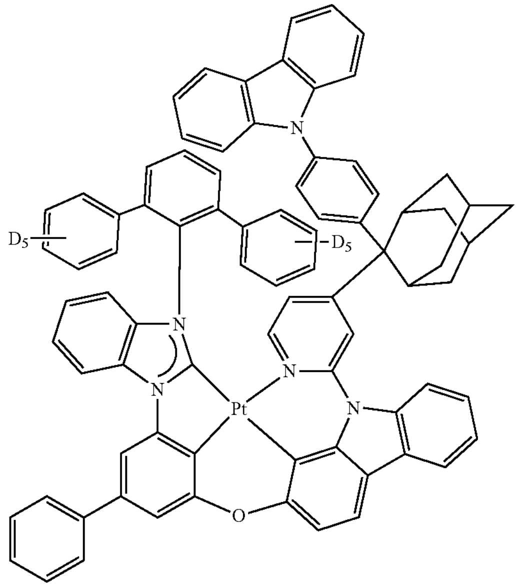
D46
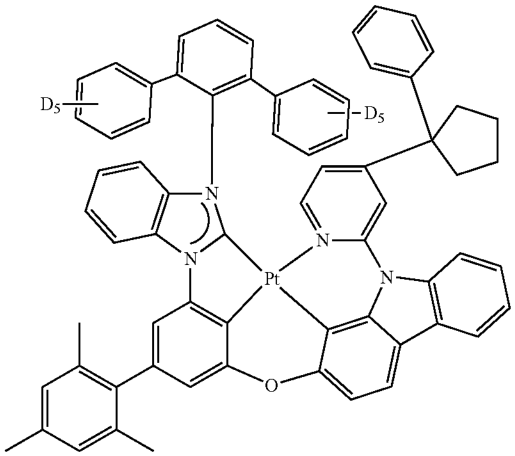
D47
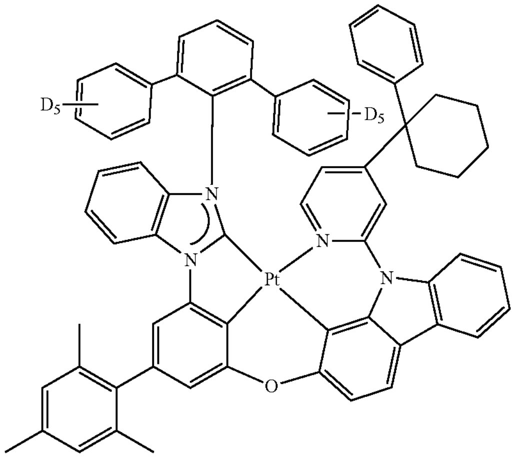
D48
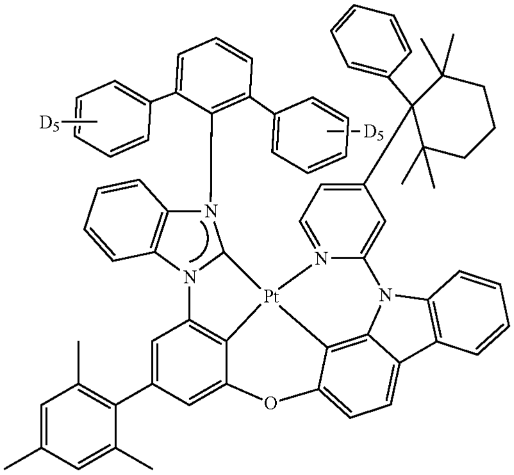
D49
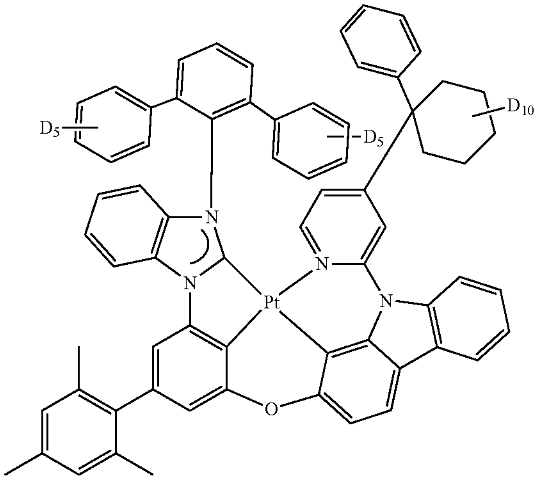
D50
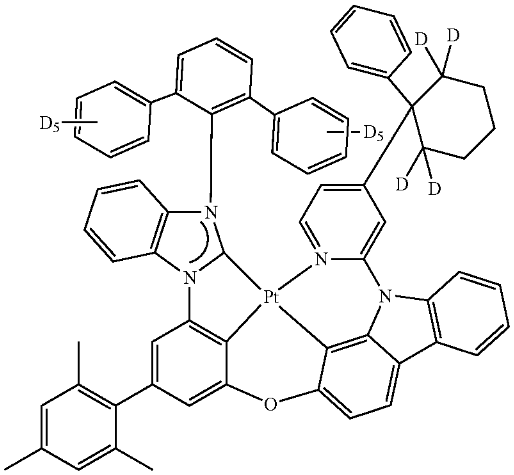

-continued
D51
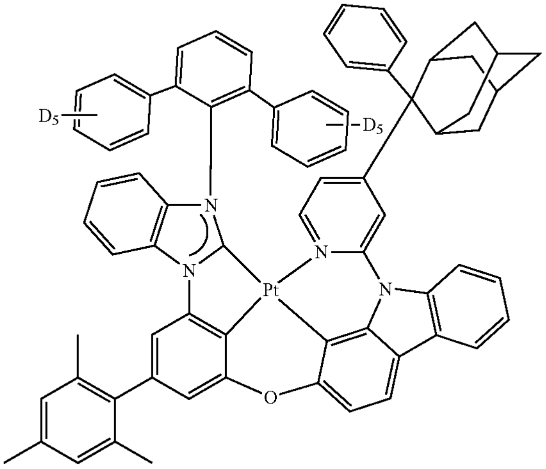
D52
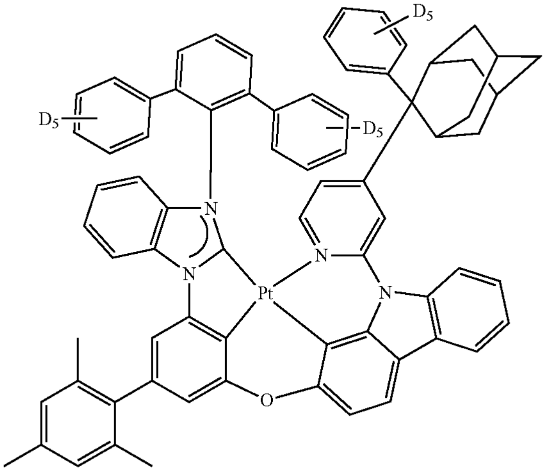
D53
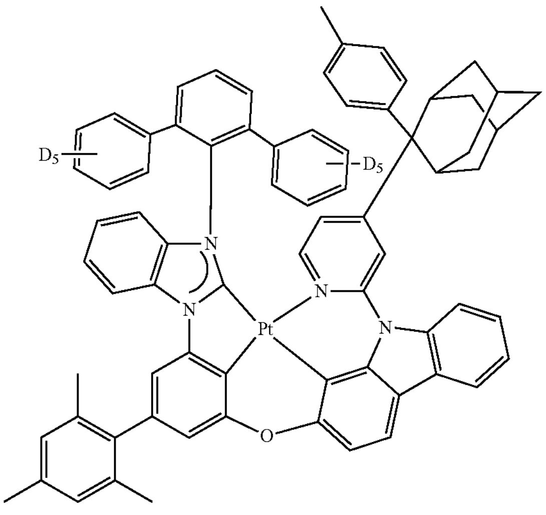
-continued
D54
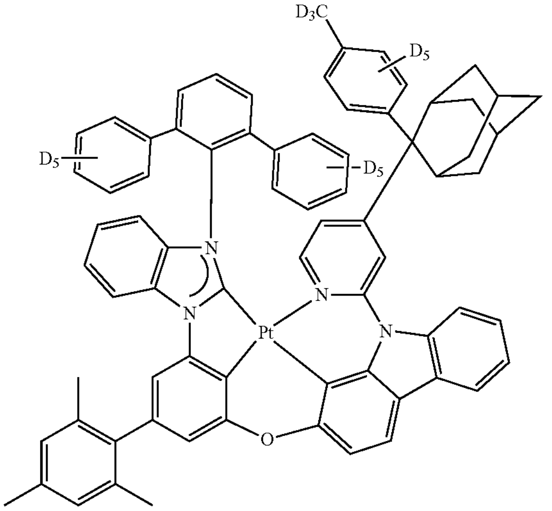
D55
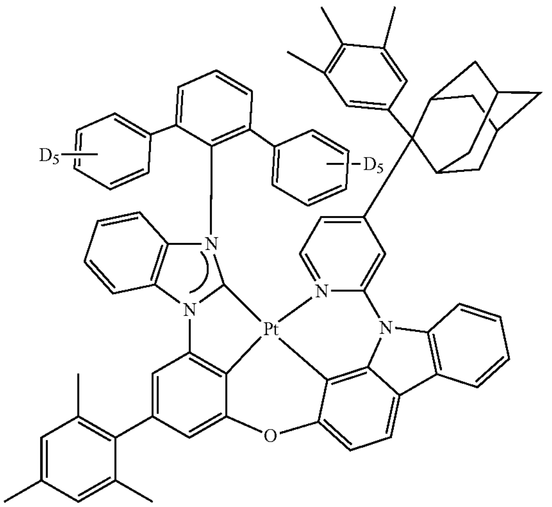
D56
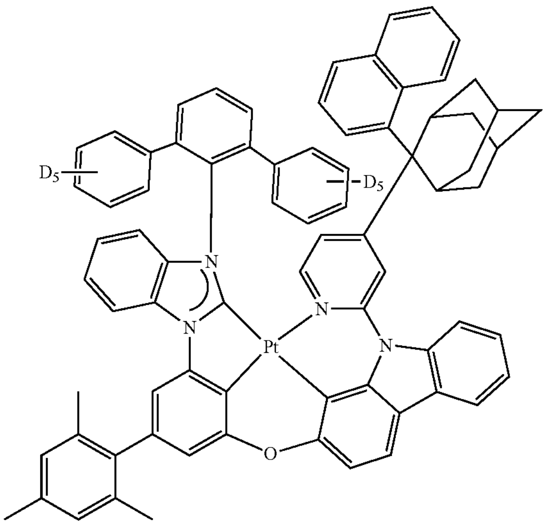

D57
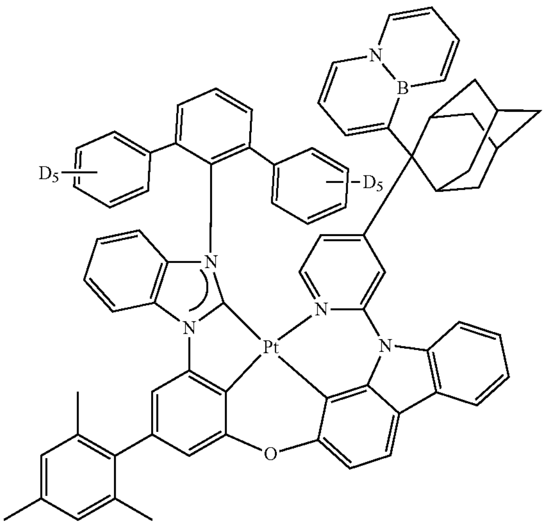
D58
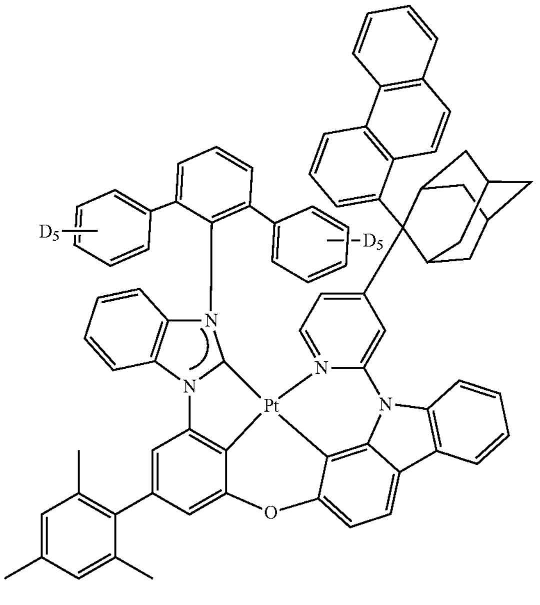
D59
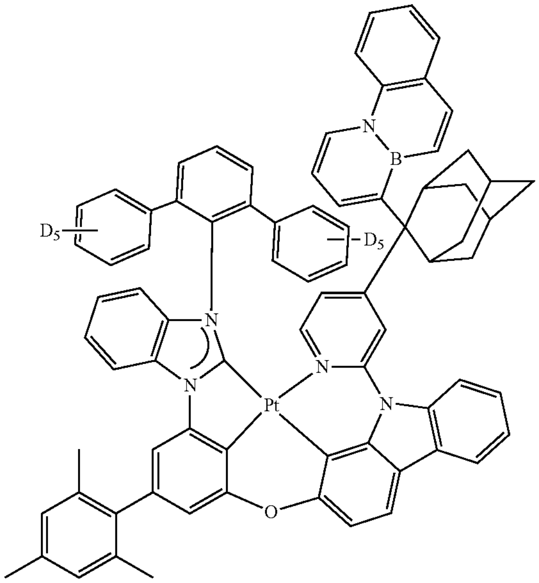
D60
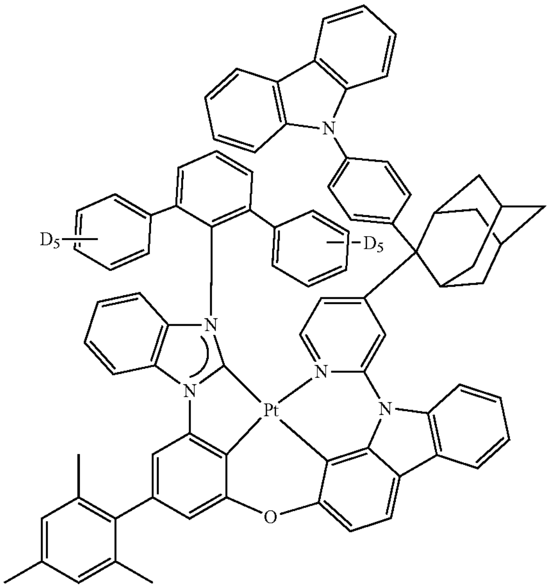

-continued
D61
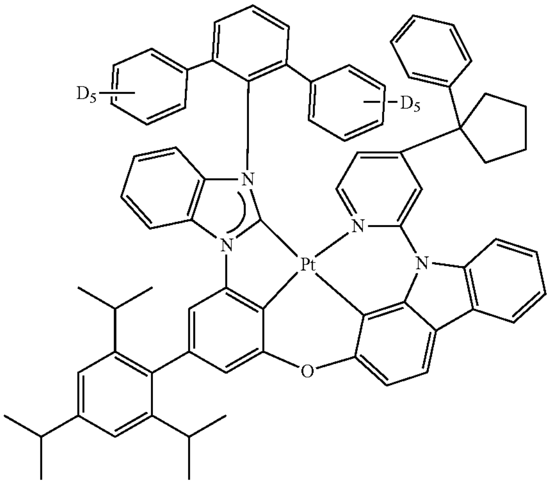
D62
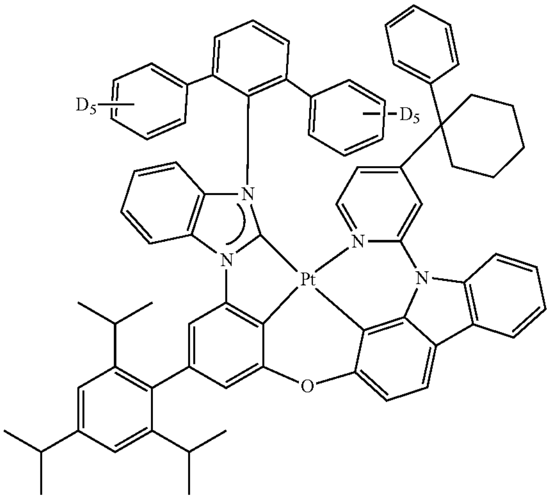
D63
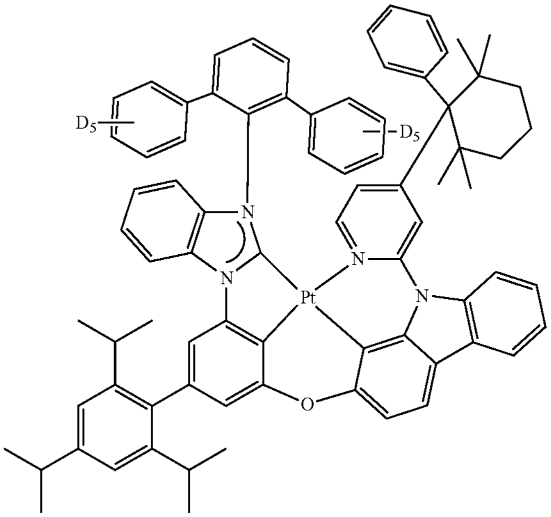
-continued
D64
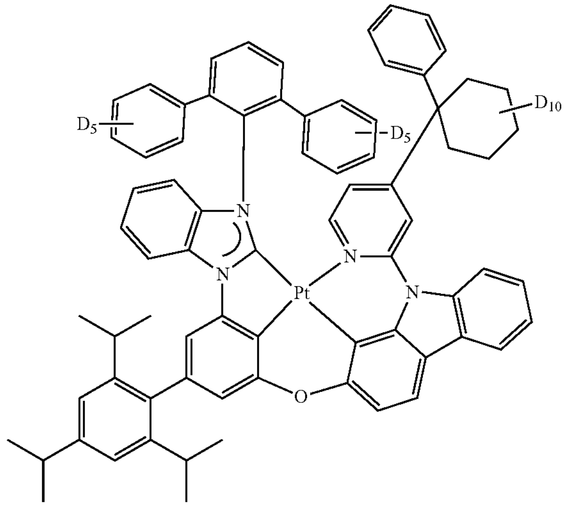
D65
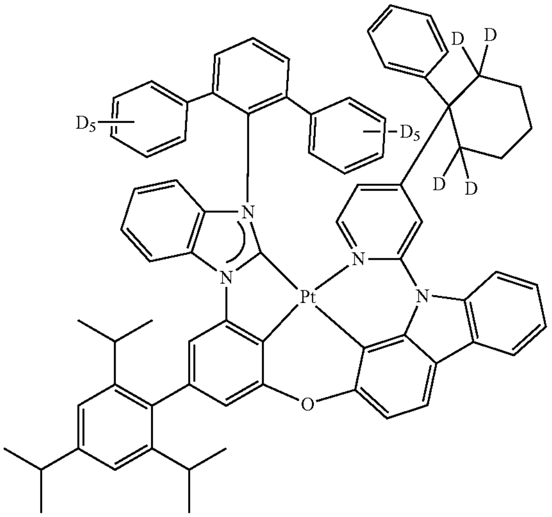
D66
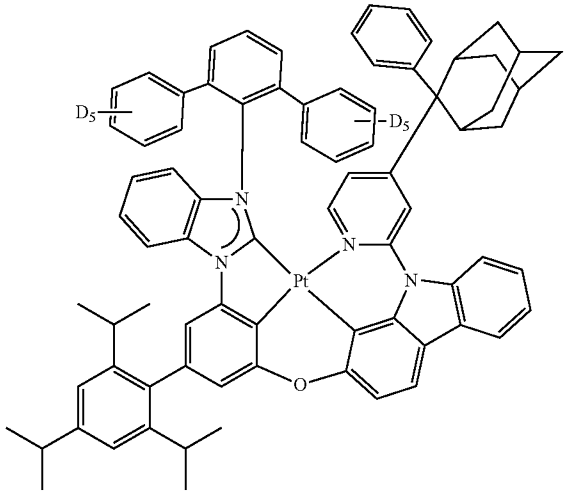

-continued
D67
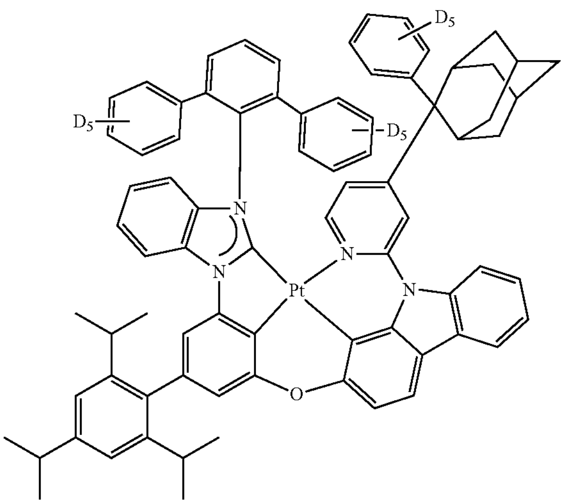
D68
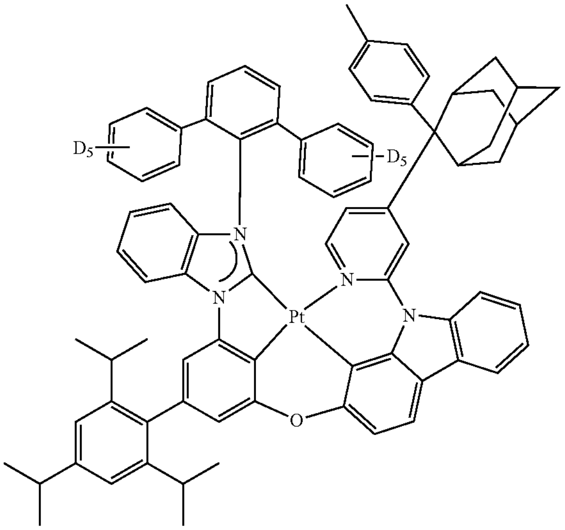
D69
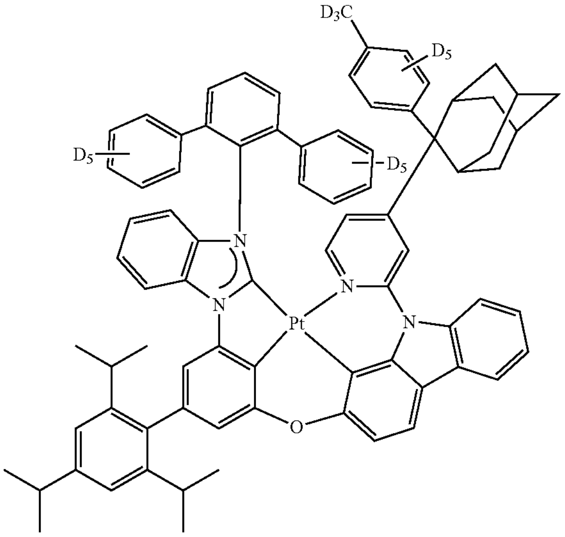
-continued
D70
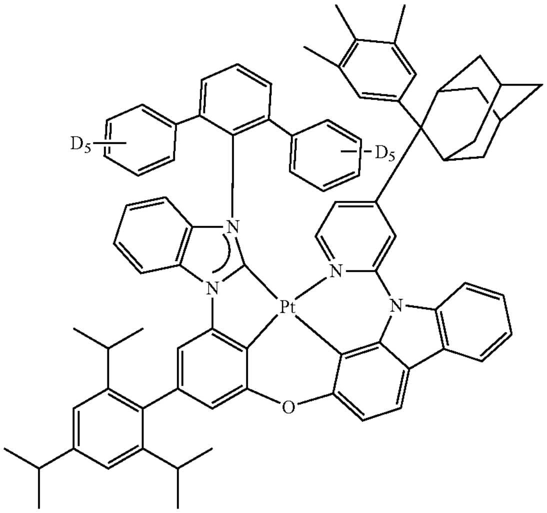
D71
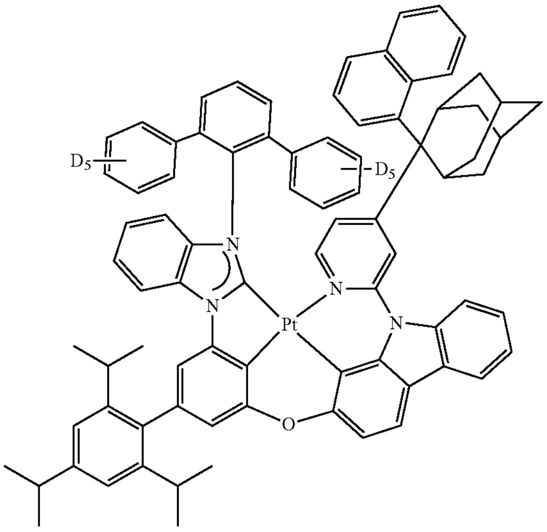
D72
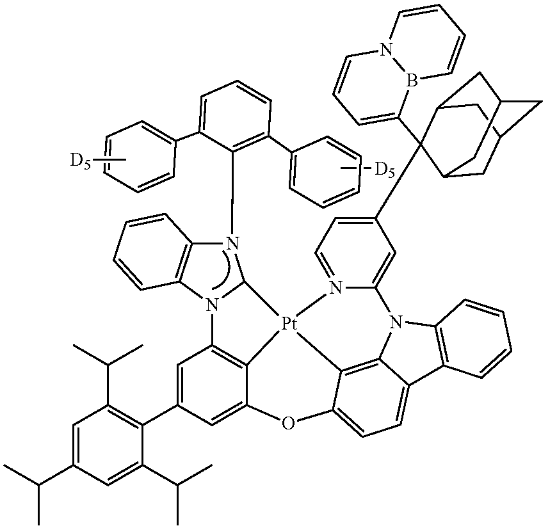

-continued
D73
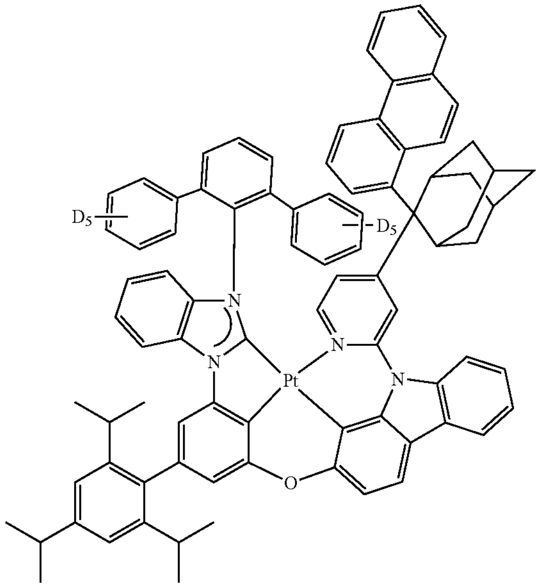
D74
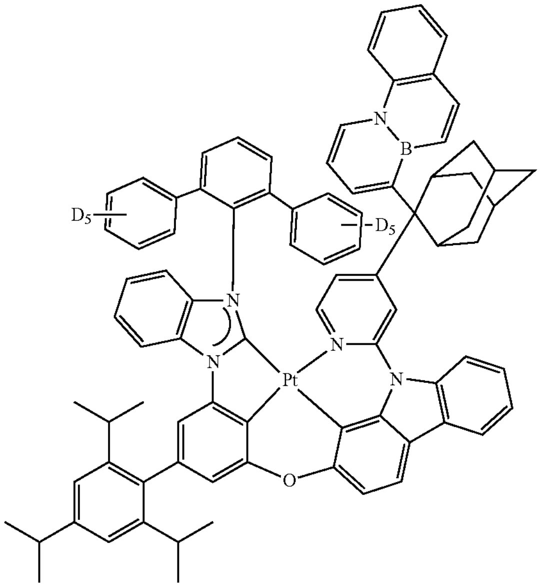
-continued
D75
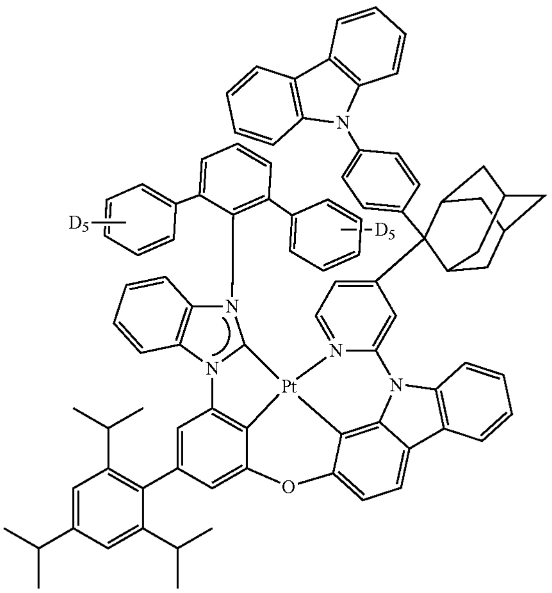
D77
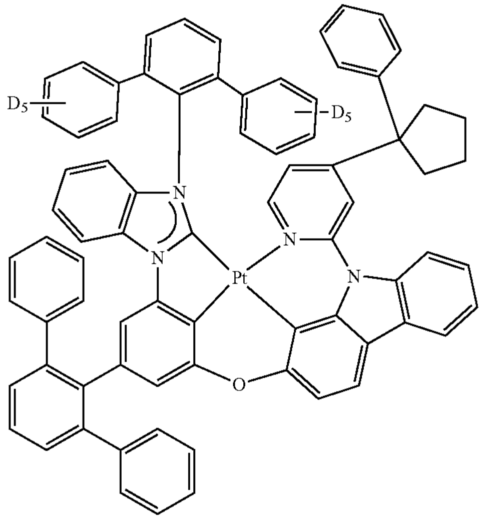
D78
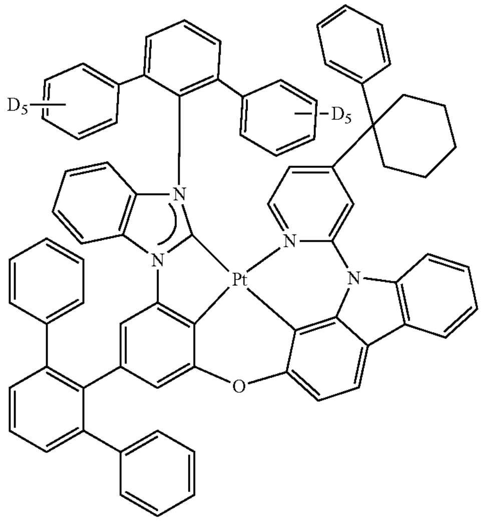

-continued
D79
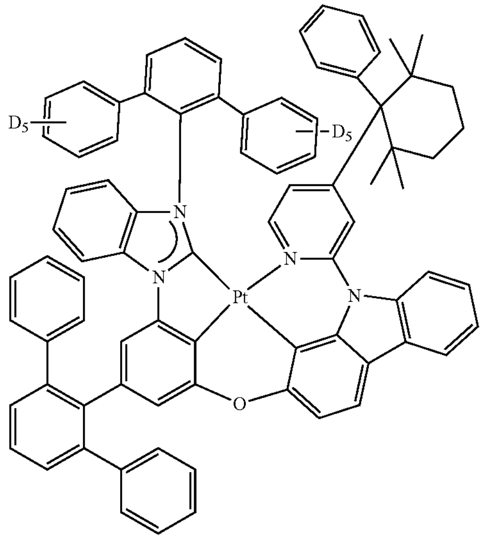
D79
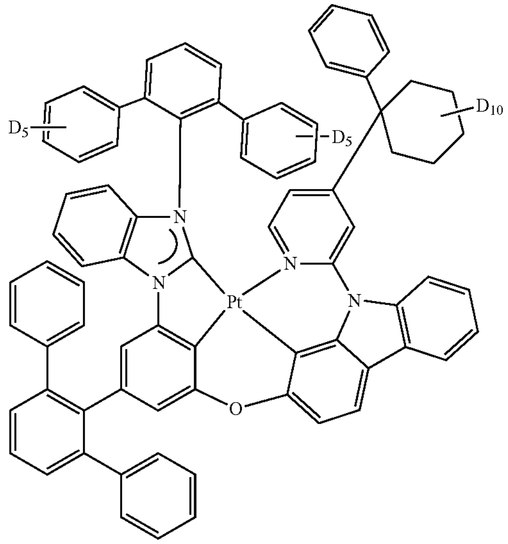
D80
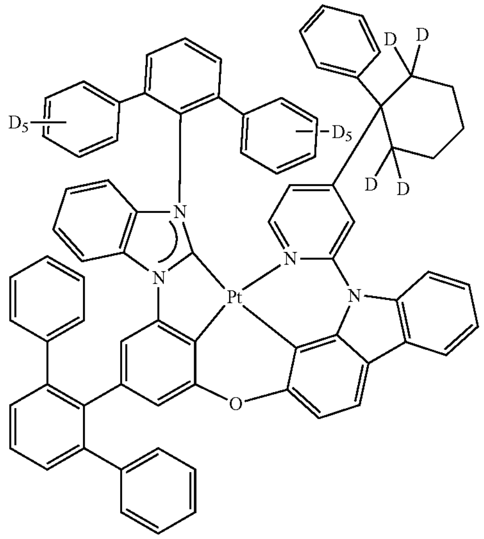
-continued
D81
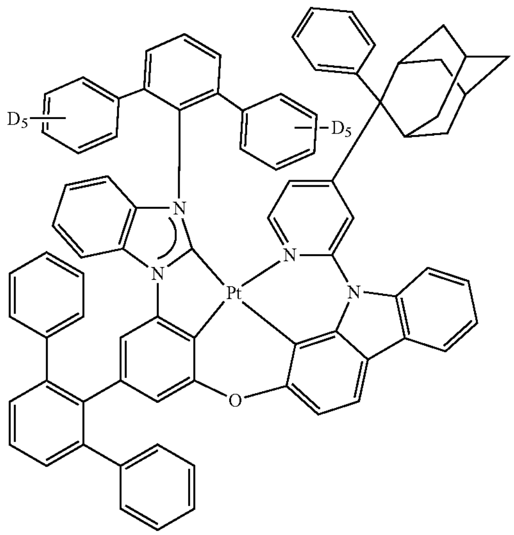
D82
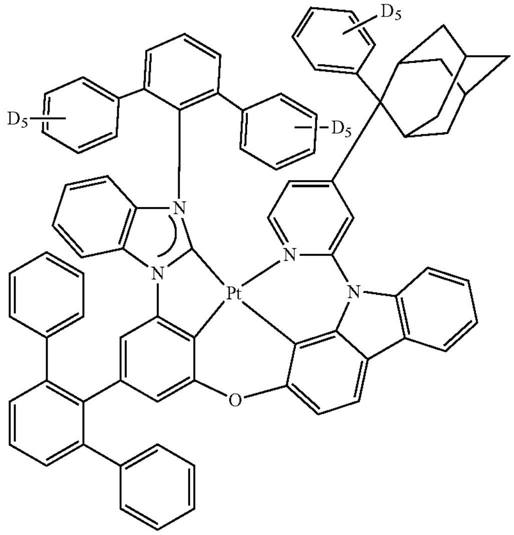

D83
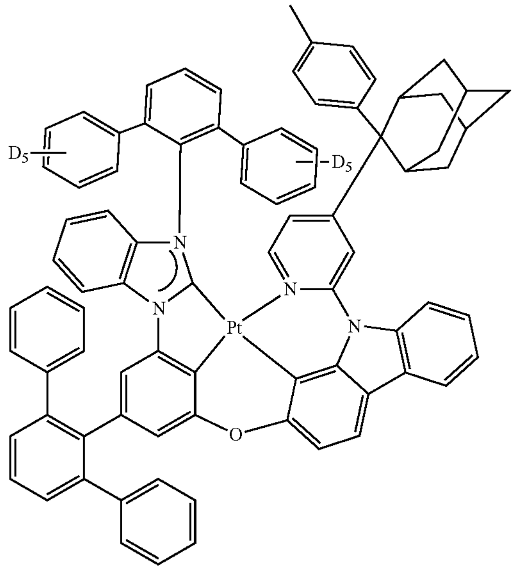
D85
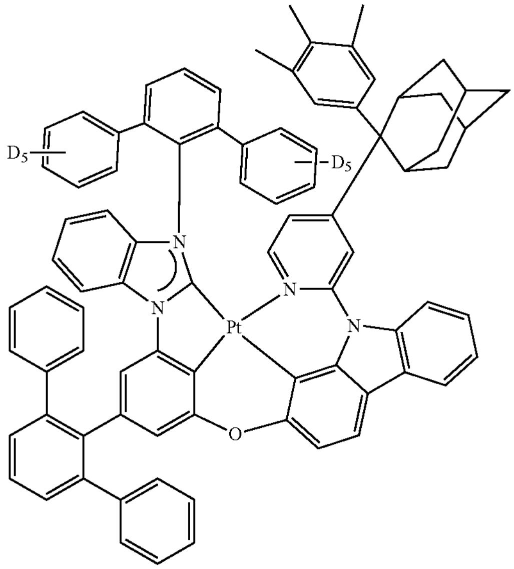
D84
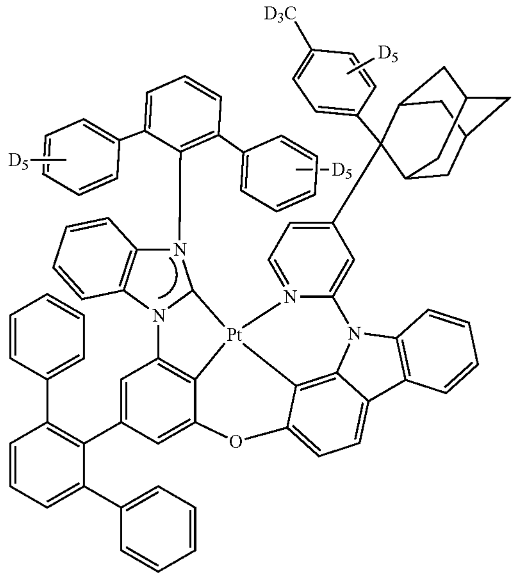
D86
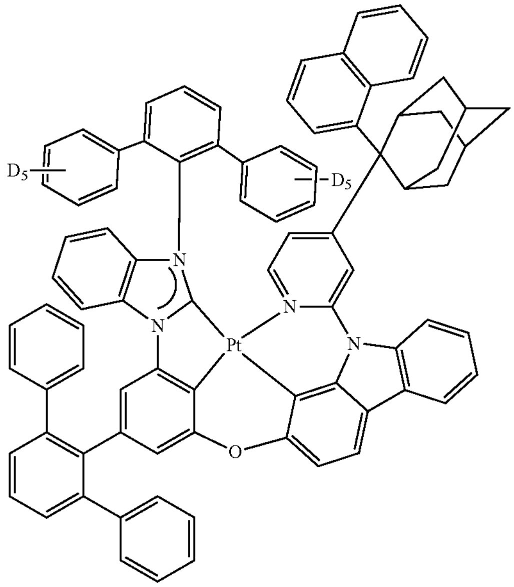

-continued
D87
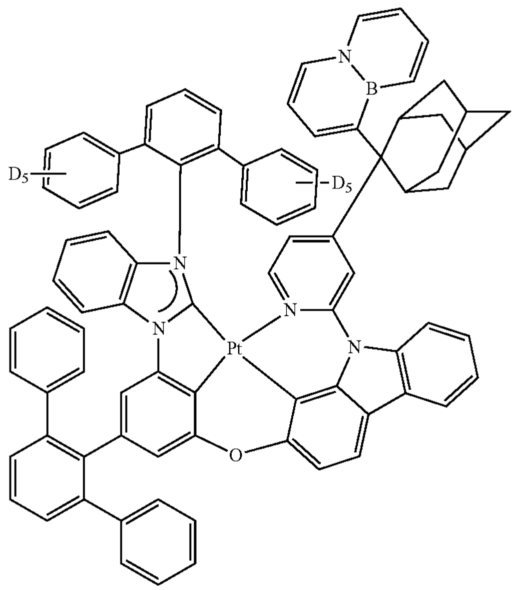
D88
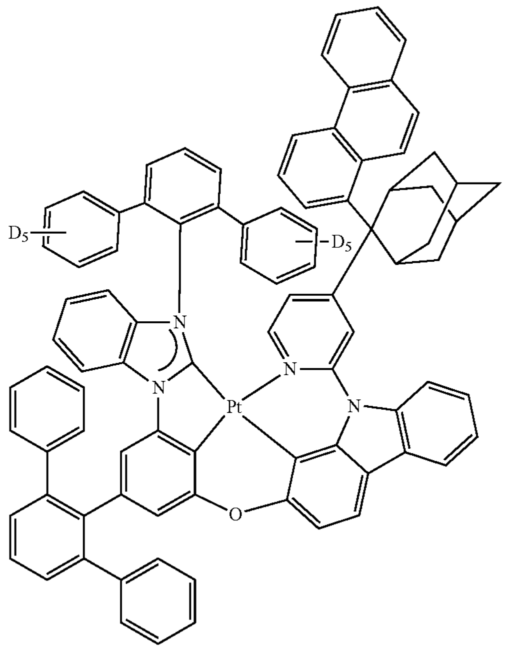
-continued
D89
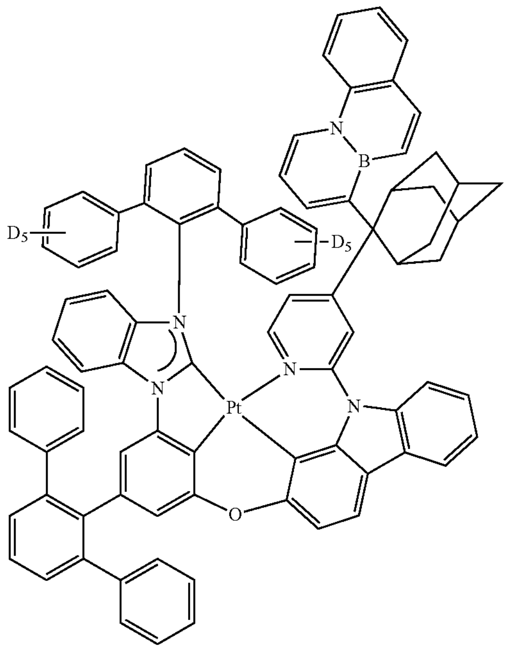
D90
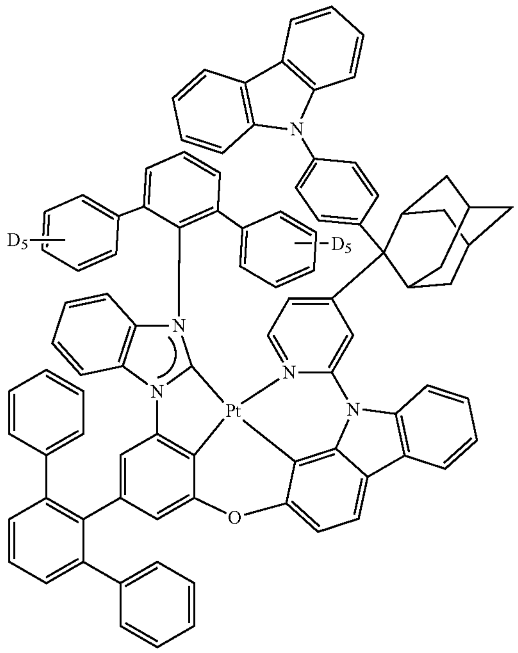

-continued
D91
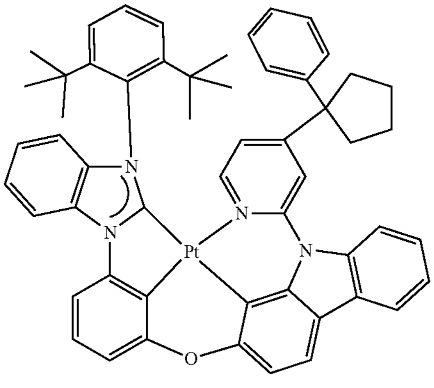
D92
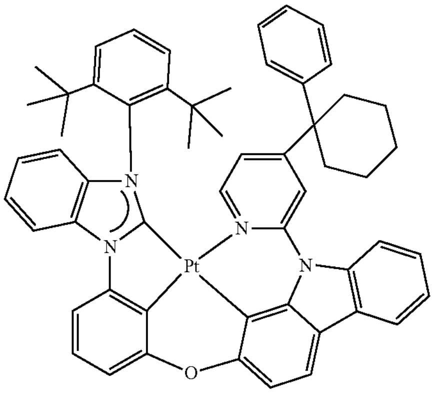
D93
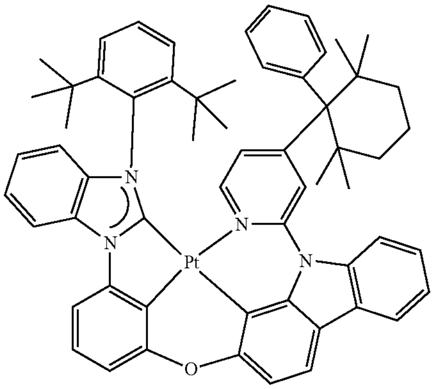
D94
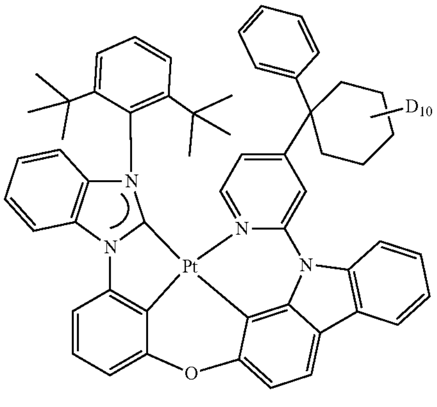
-continued
D95
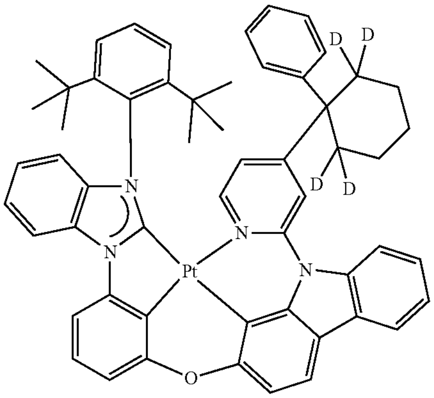
D96
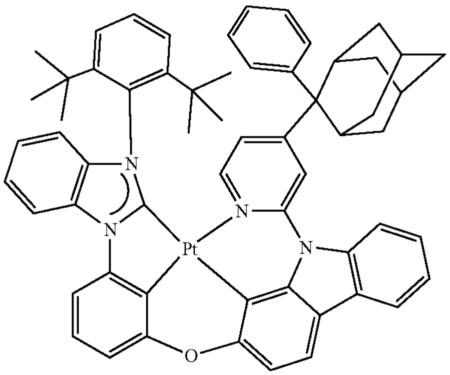
D97
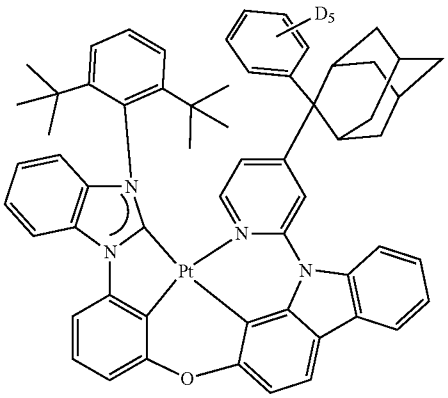
D98
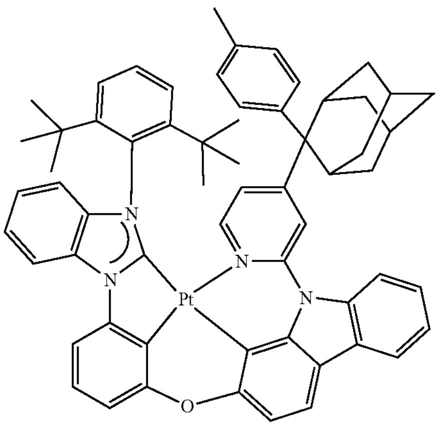

-continued
D99
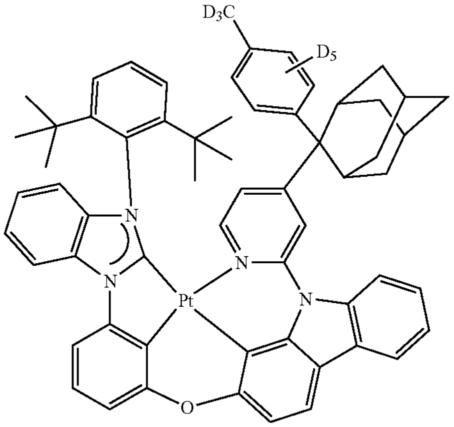
D100
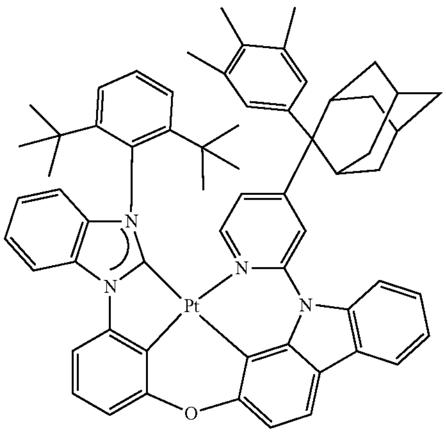
D101
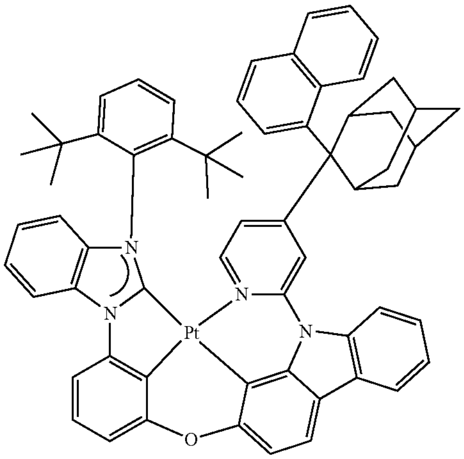
-continued
D102
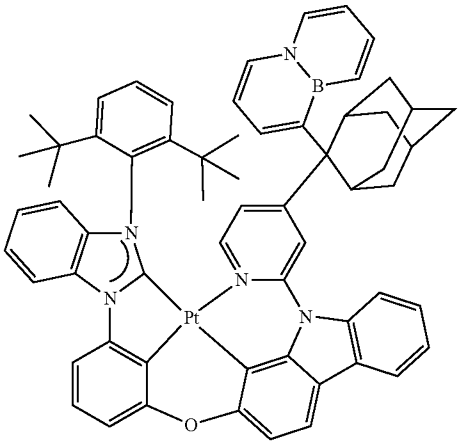
D103
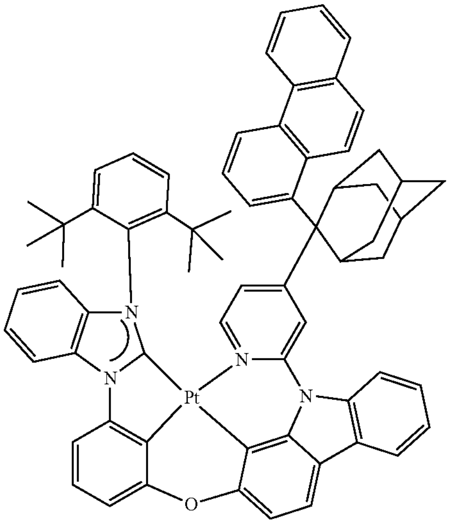
D104
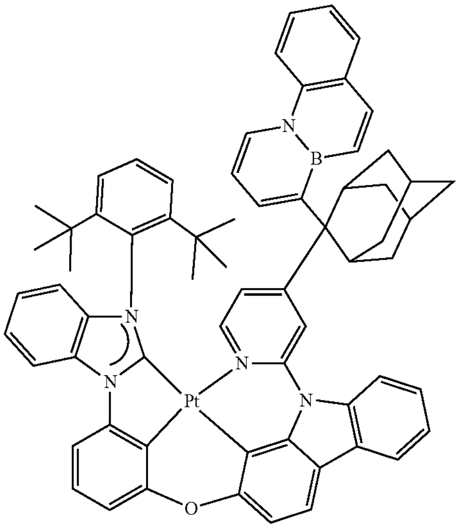

D105
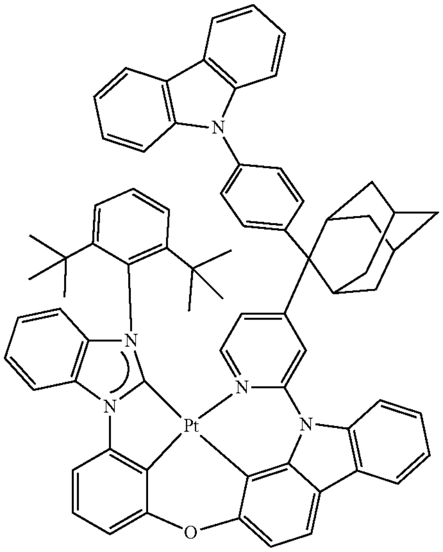
D106
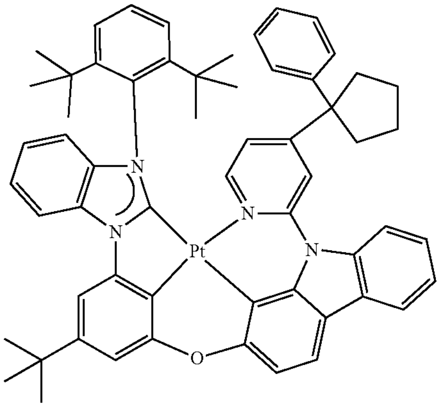
D107
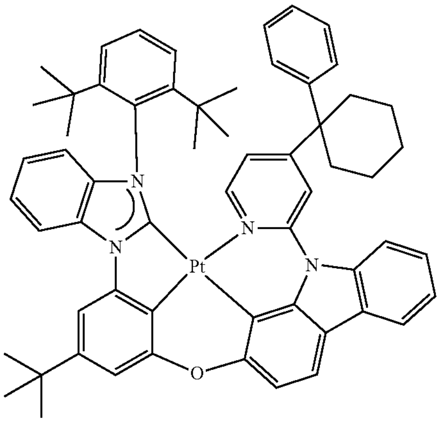
D108
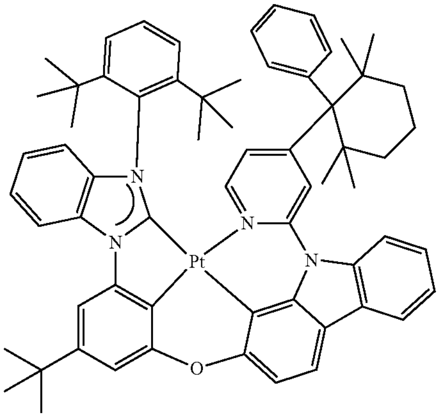
D109
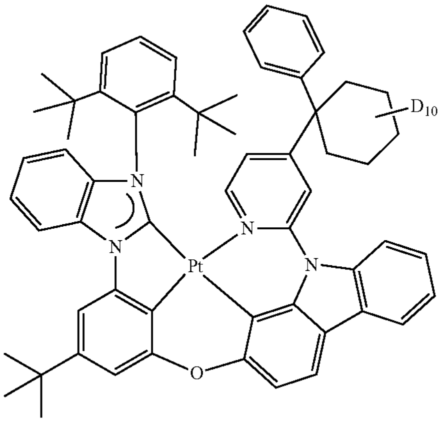
D110
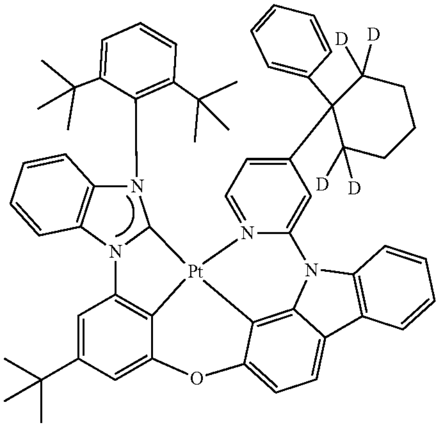

-continued
D111
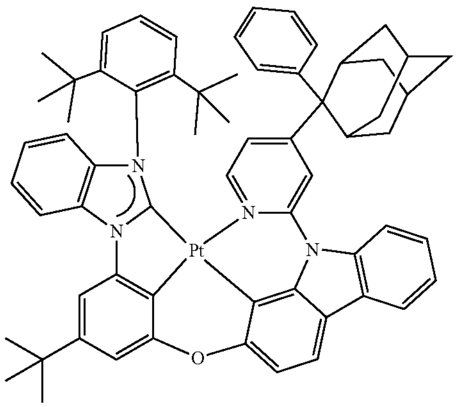
D112
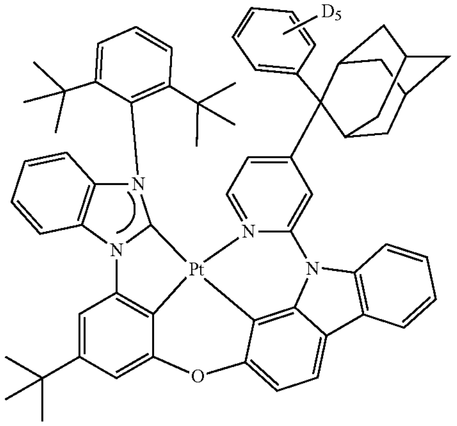
D113
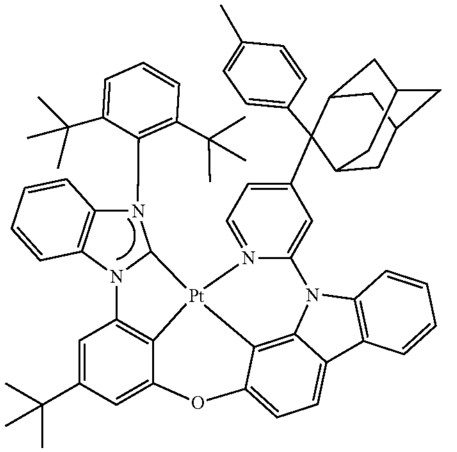
-continued
D114
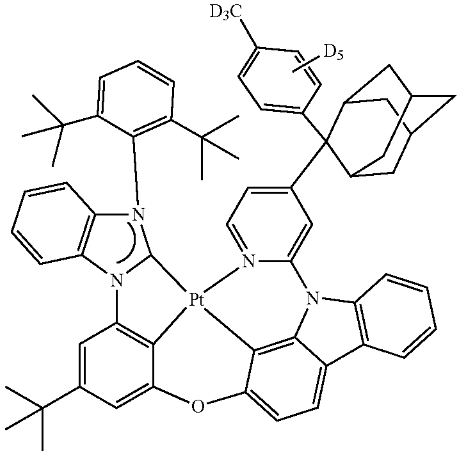
D115
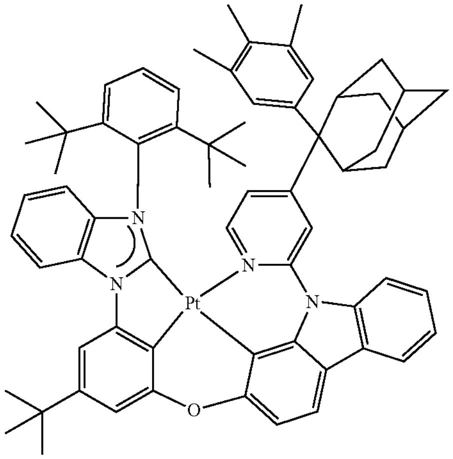
D116
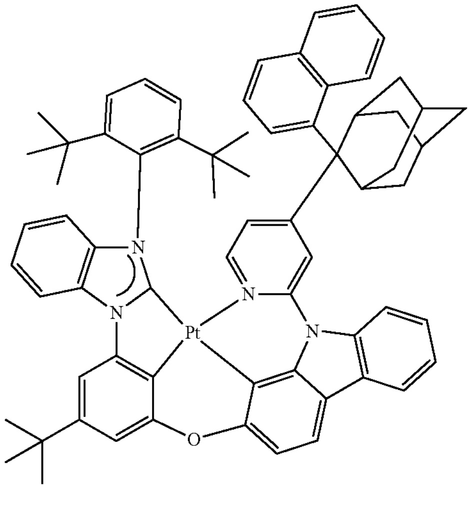

-continued
D117
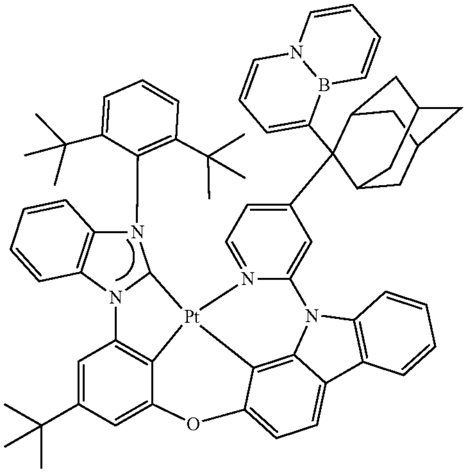
D118
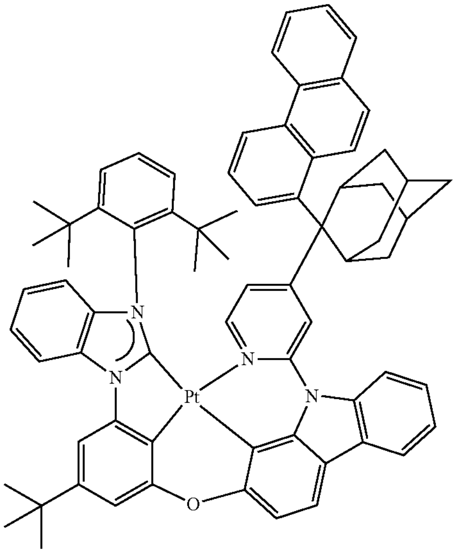
D119
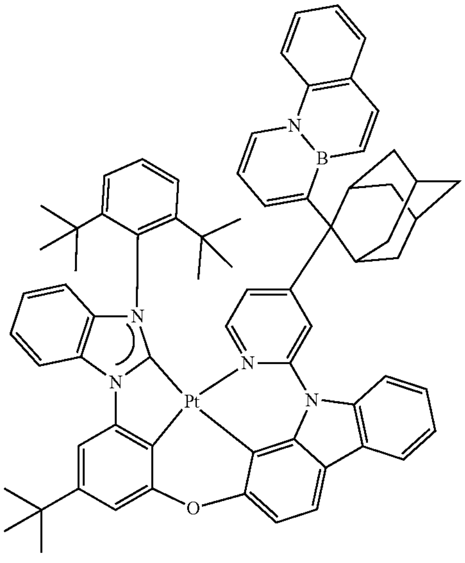
-continued
D120
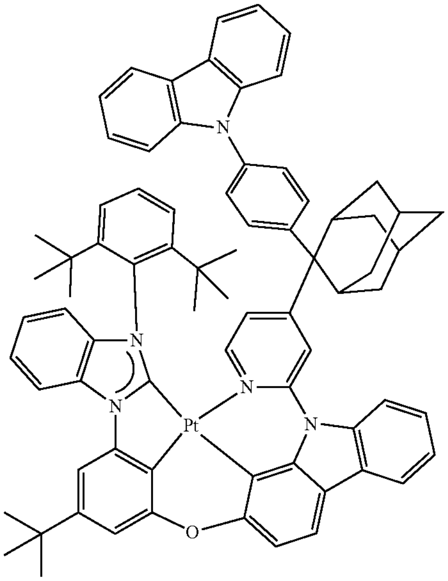
D121
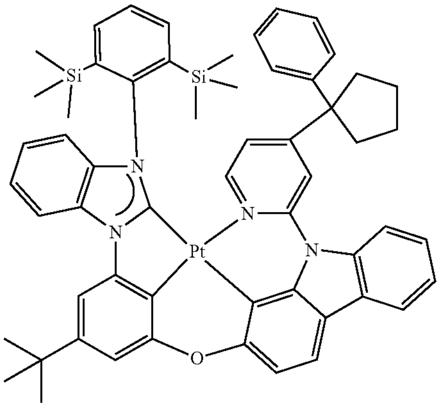
D122
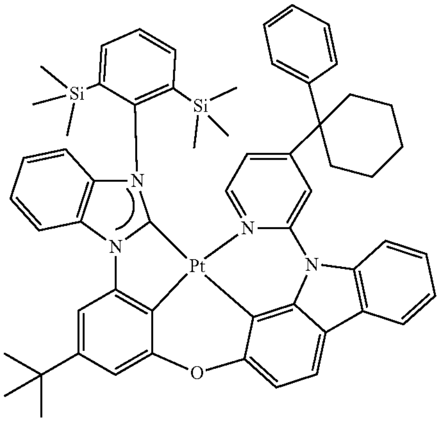

-continued
D123
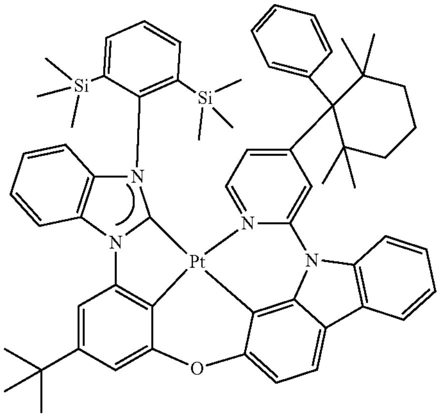
D124
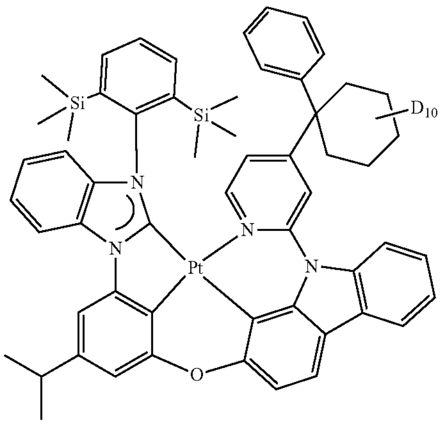
D125
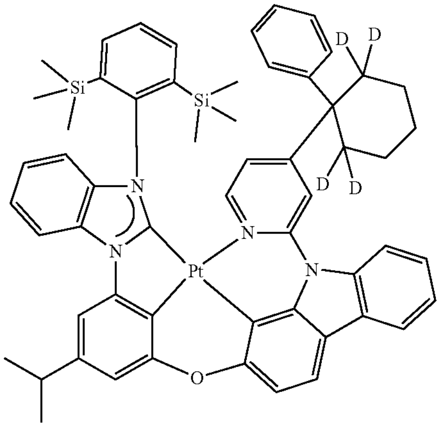
-continued
D126
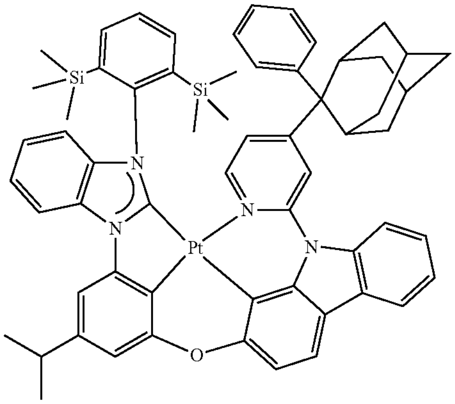
D127
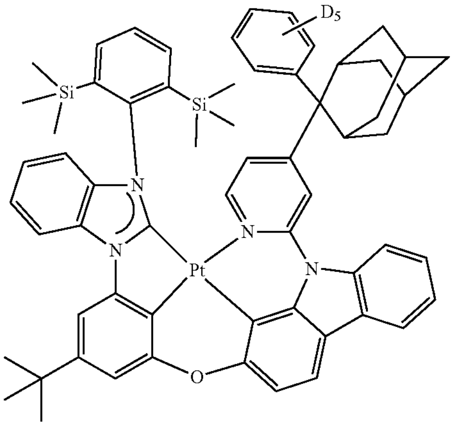
D128
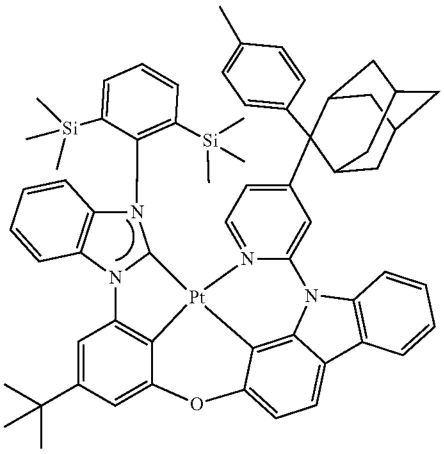

-continued
D129
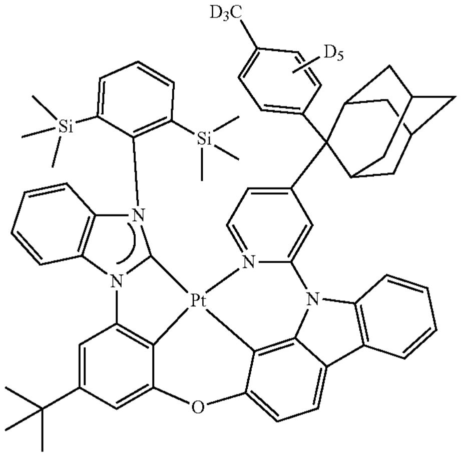
D130
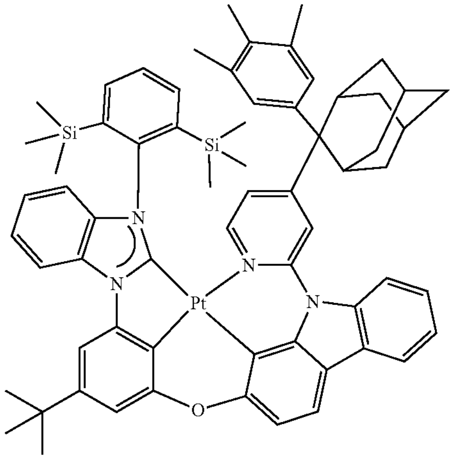
D131
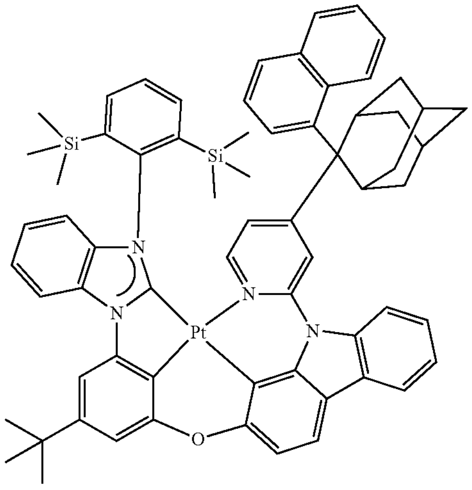
-continued
D132
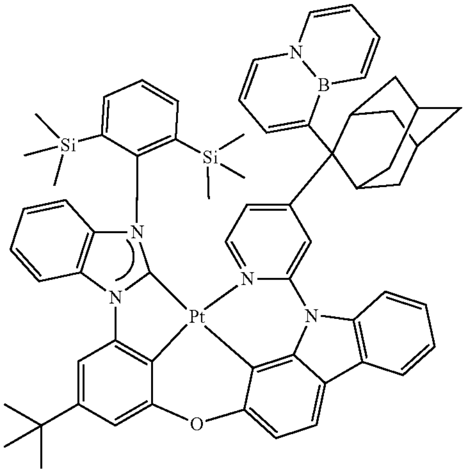
D133
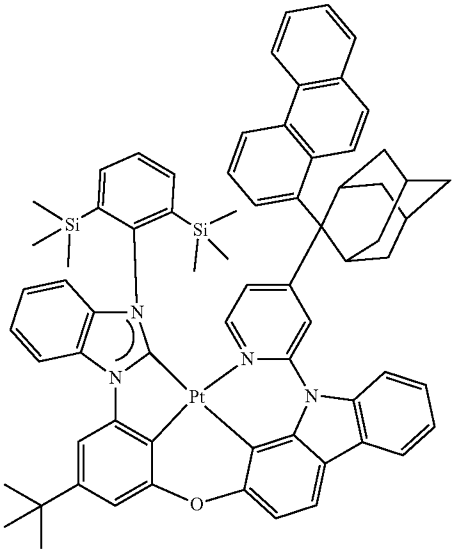
D134
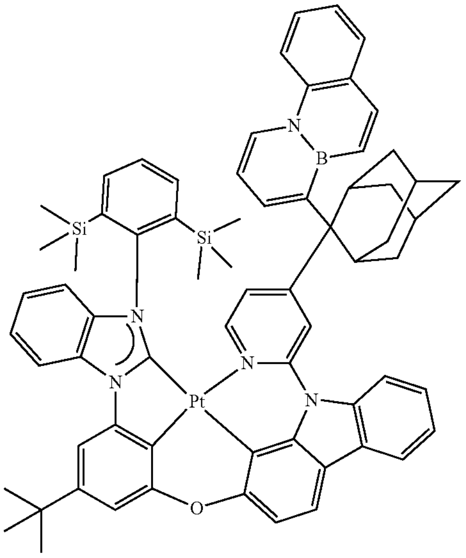

-continued
D135
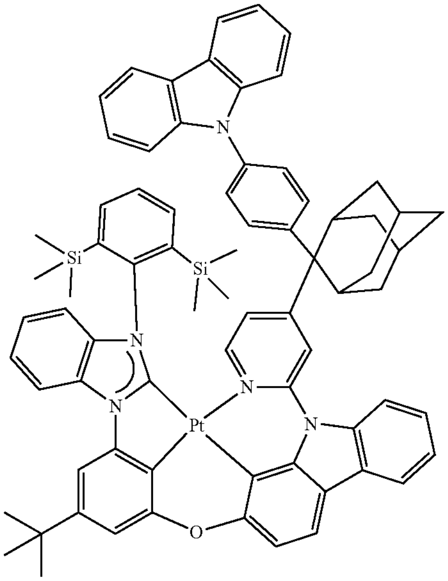
D136
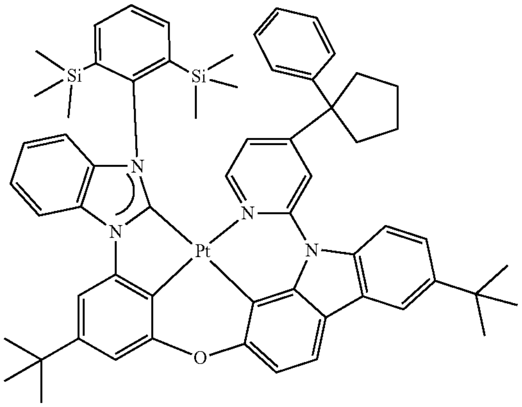
D137
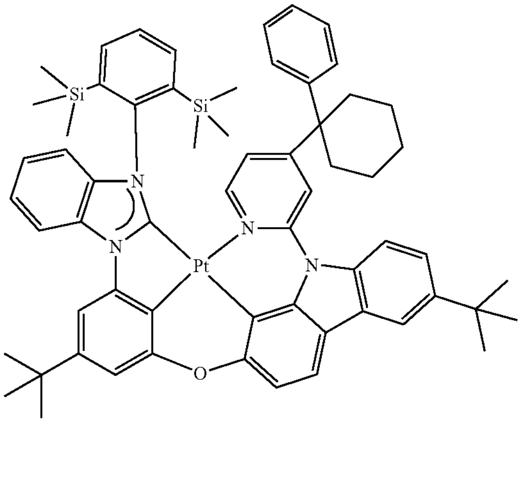
-continued
D138
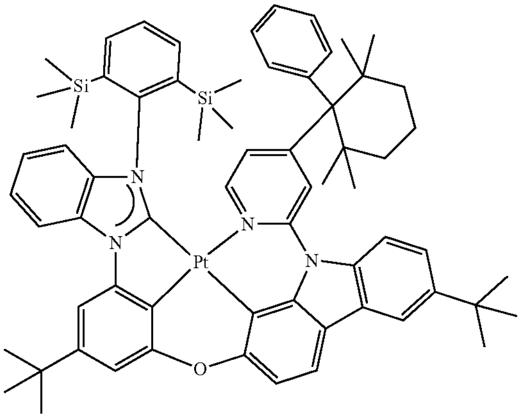
D139
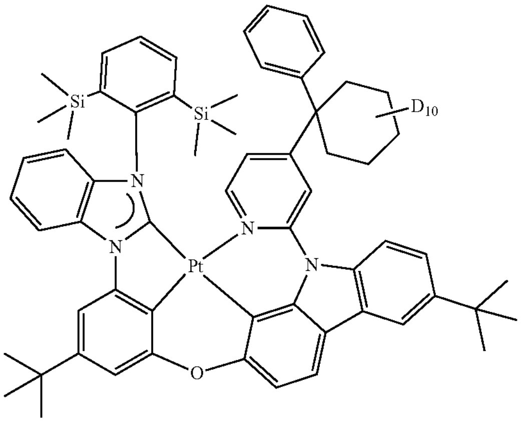
D140
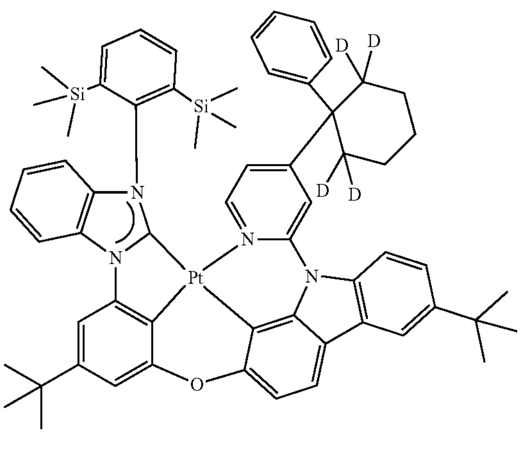

-continued
D141
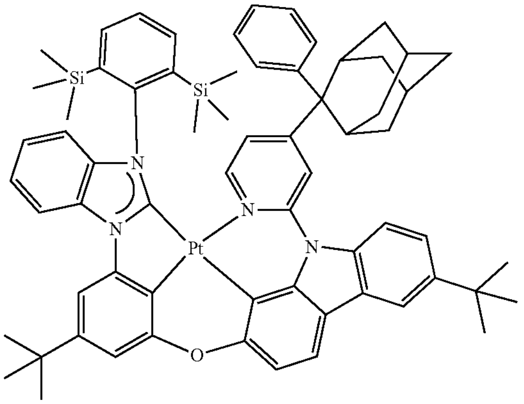
D142
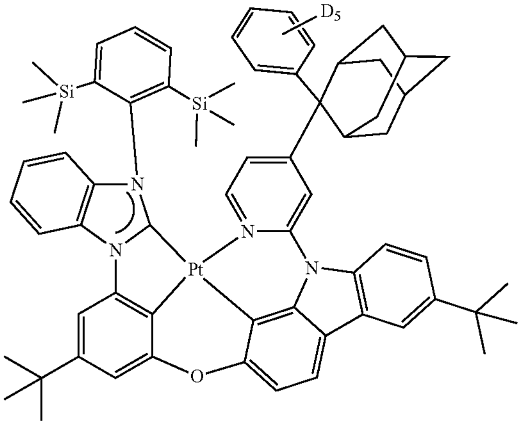
D143
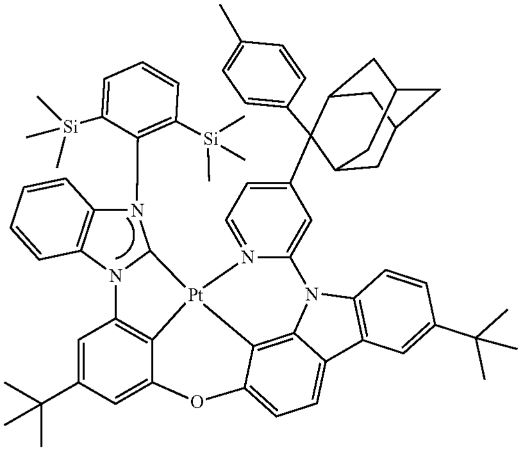
-continued
D144
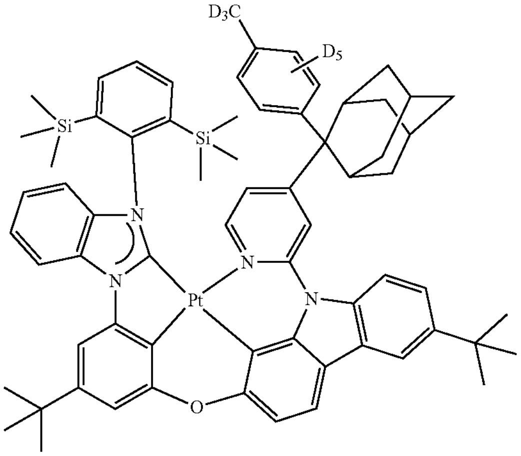
D145
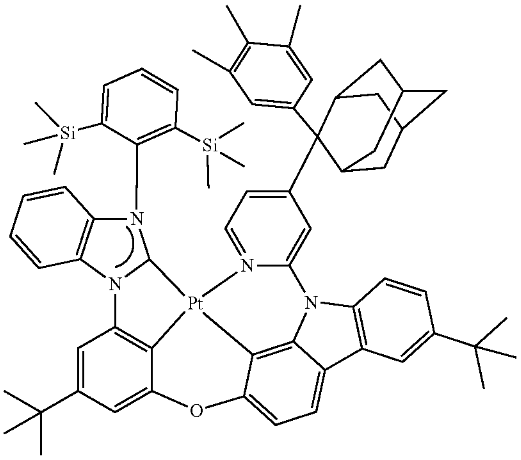
D146
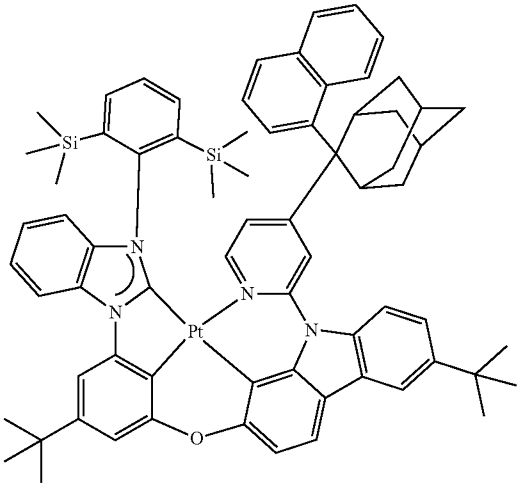

-continued
D147
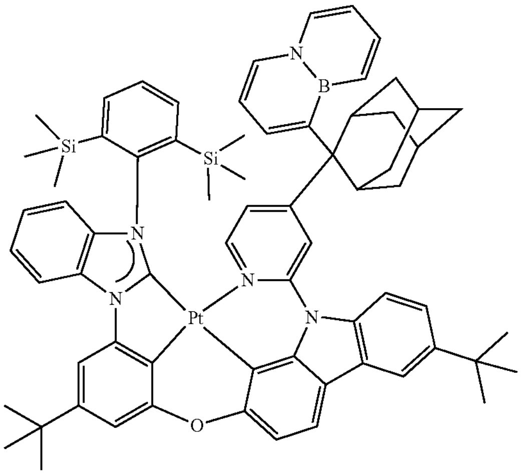
D148
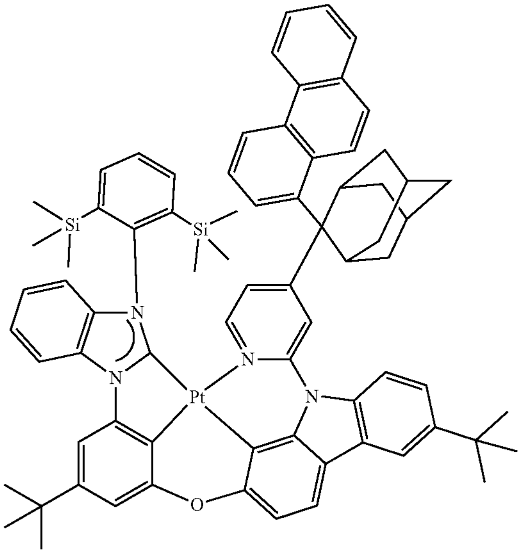
D149
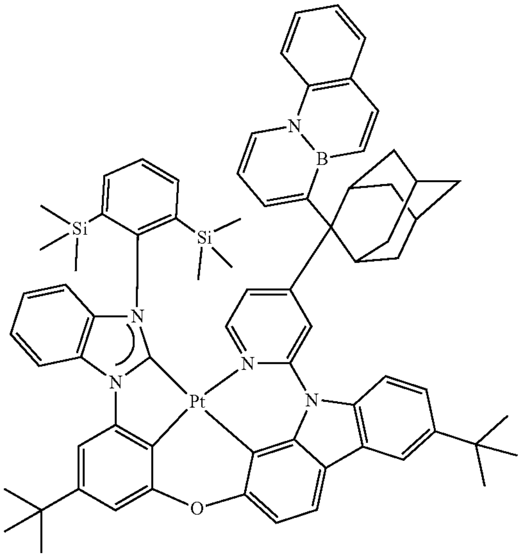
D150
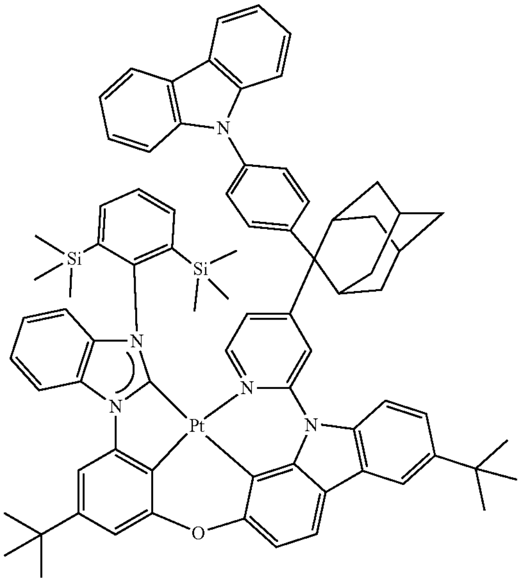
D151
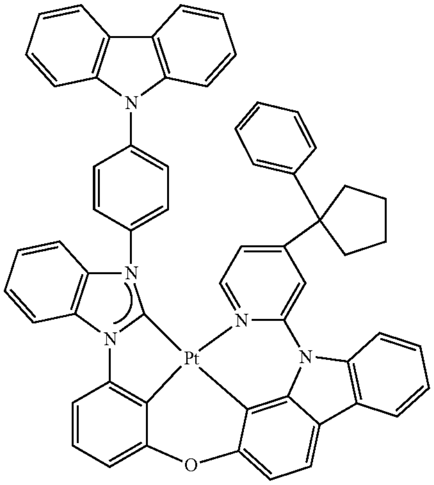
D152
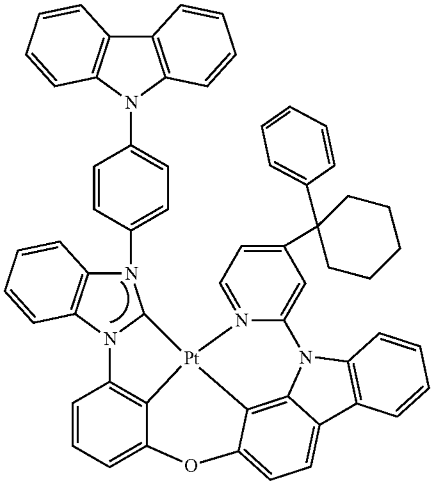

-continued
D153
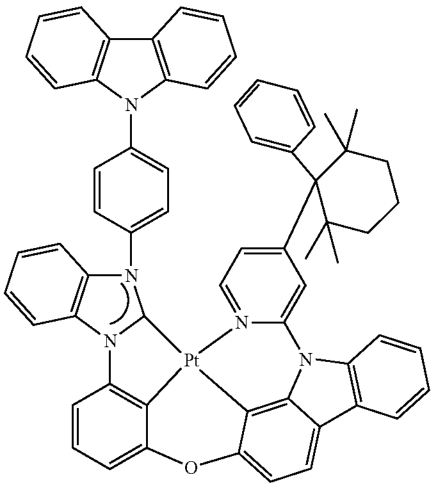
D154
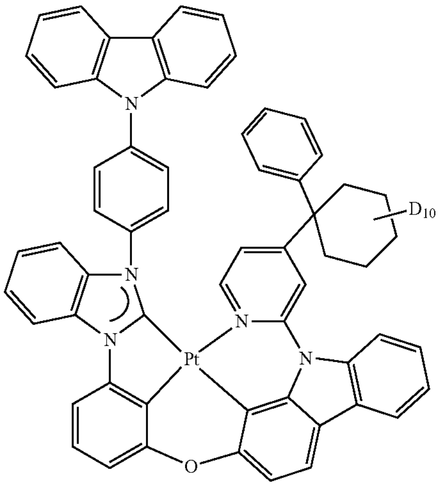
D155
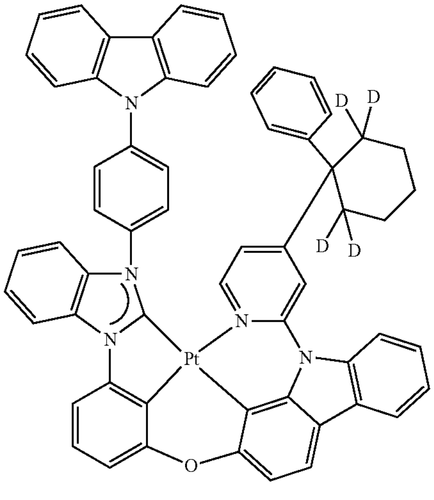
-continued
D156
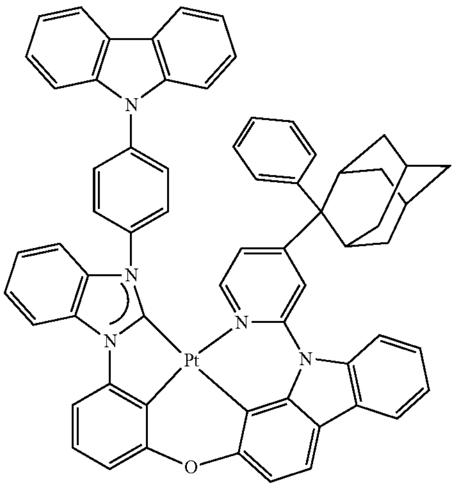
D157
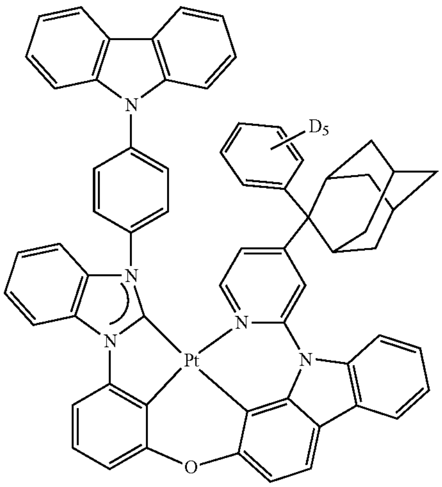
D158
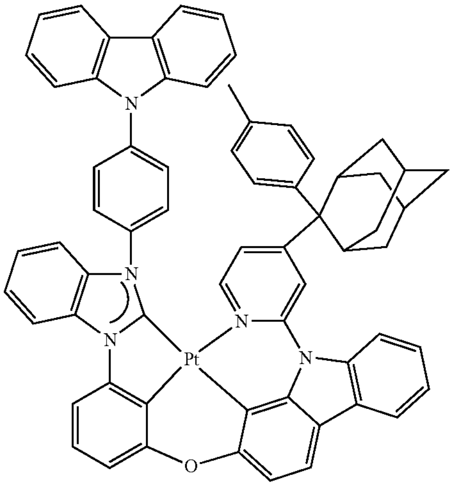

-continued
D159
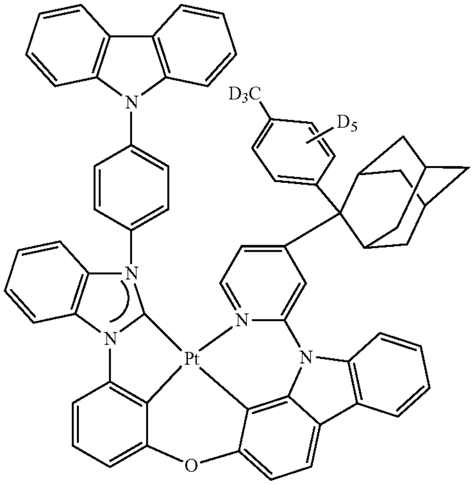
D160
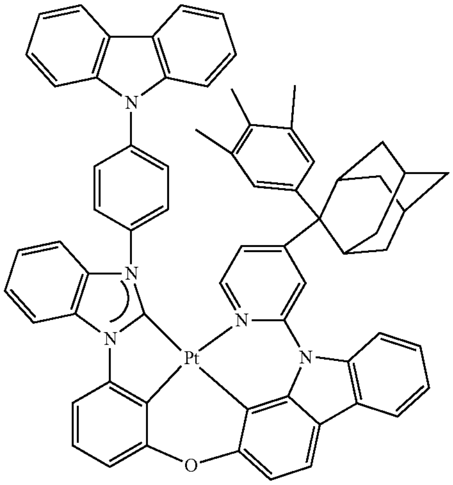
D161
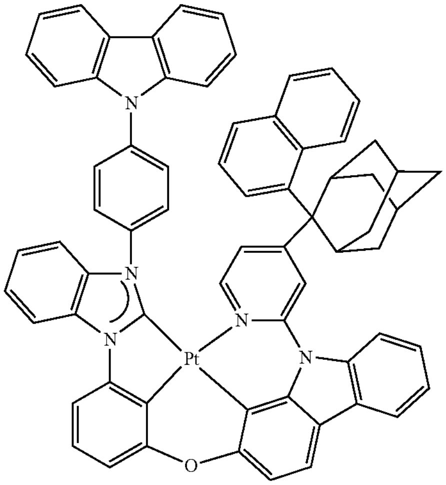
-continued
D162
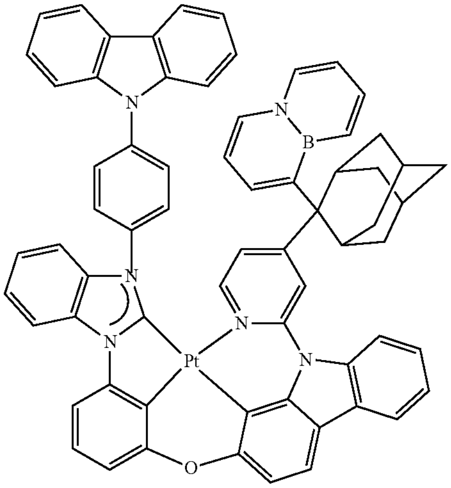
D163
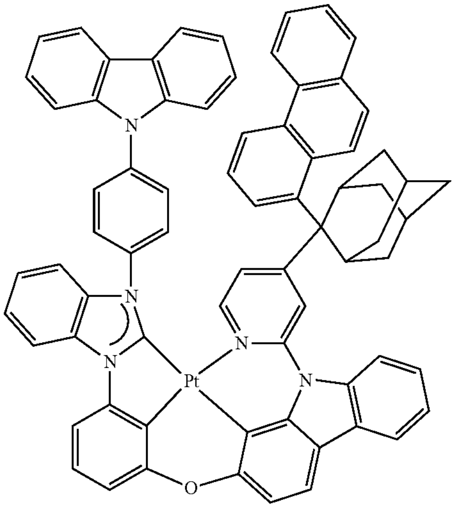
D164
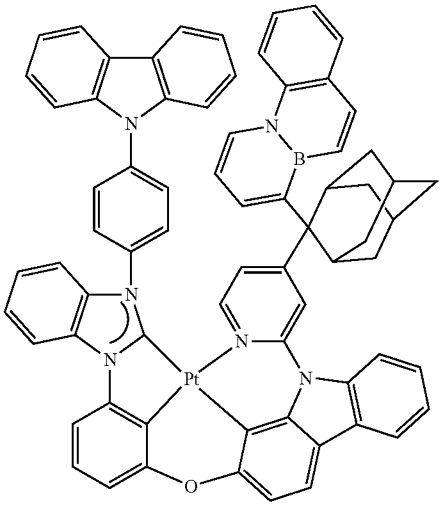

-continued
D165
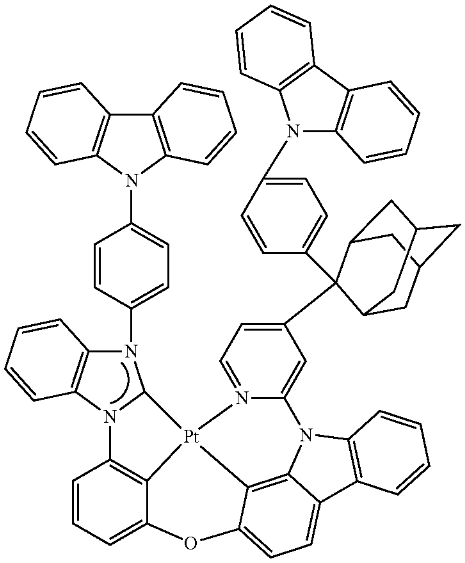
D166
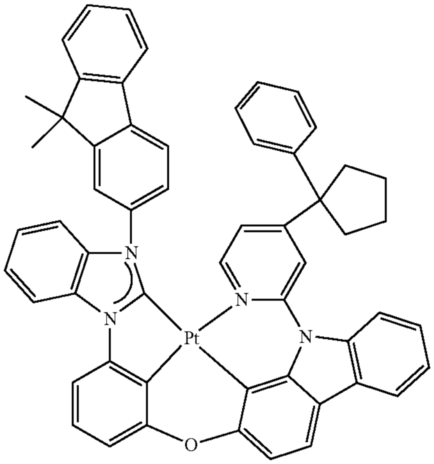
D167
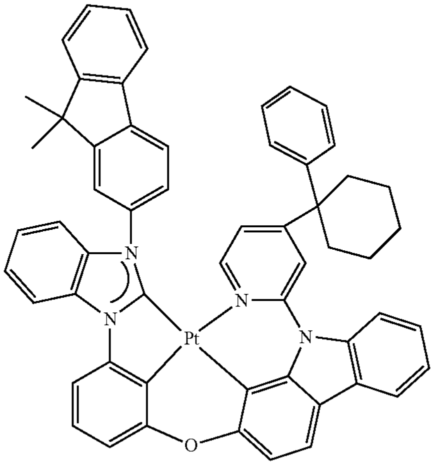
-continued
D168
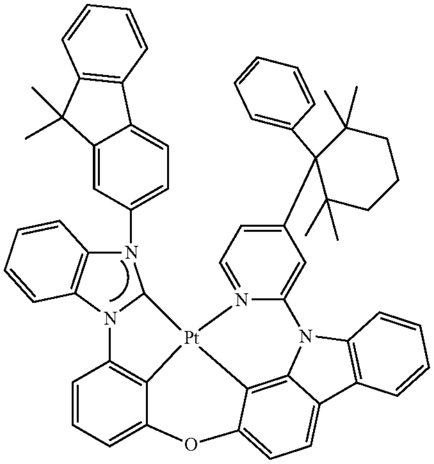
D169
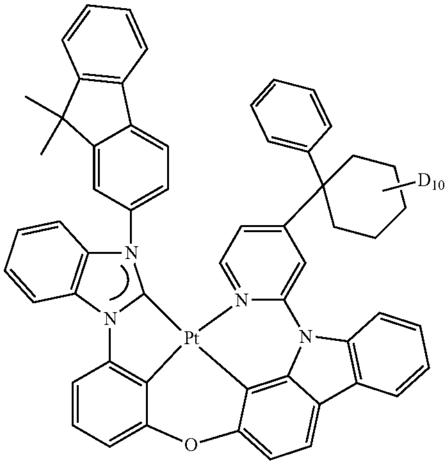
D170
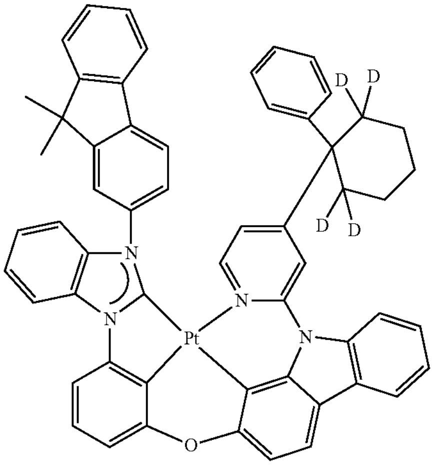

-continued
D171
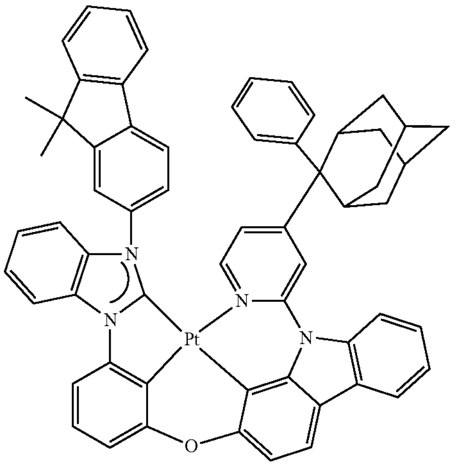
D172
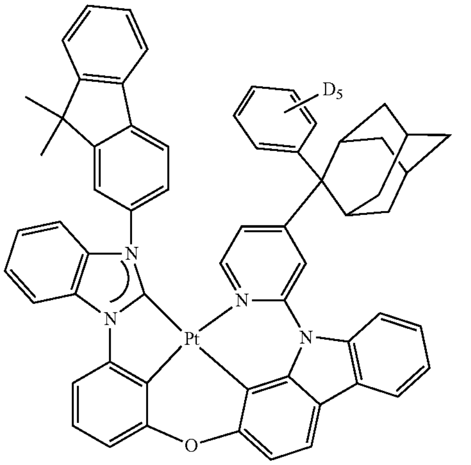
D173
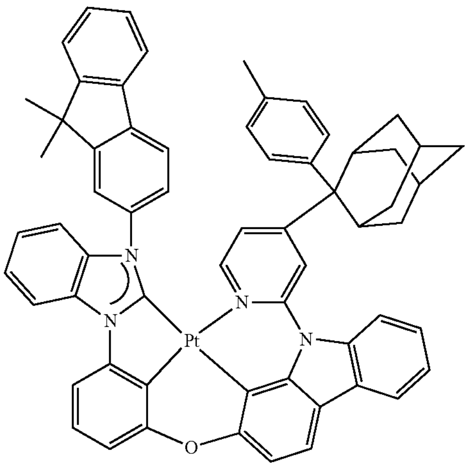
-continued
D174
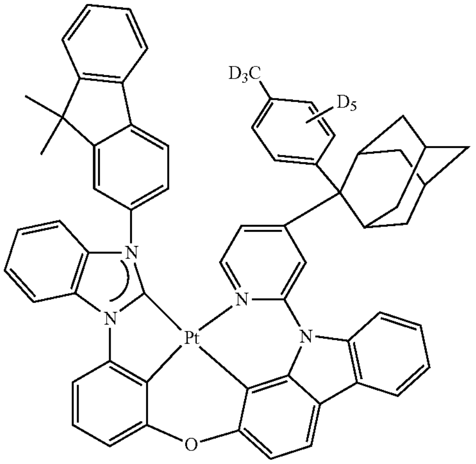
D175
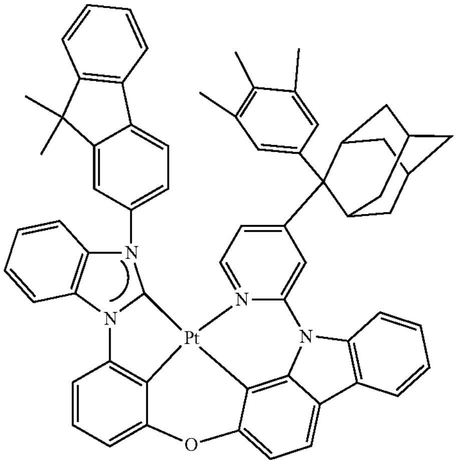
D176
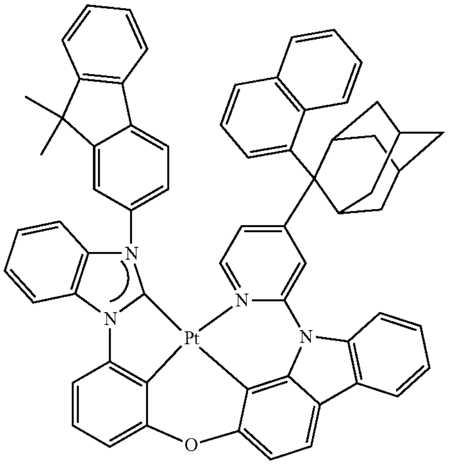

D177
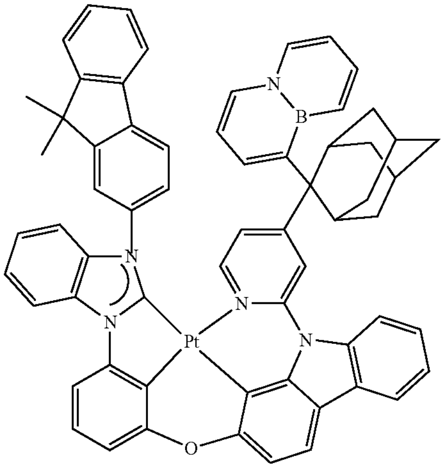
D178
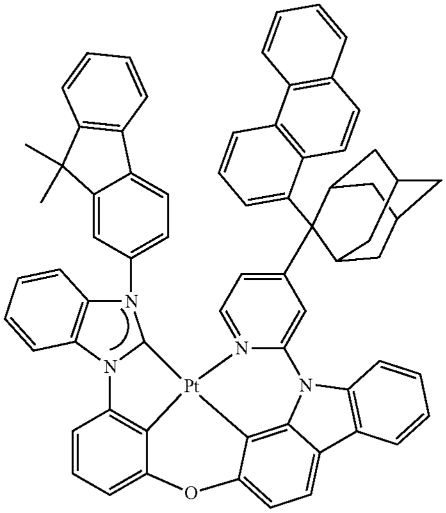
D179
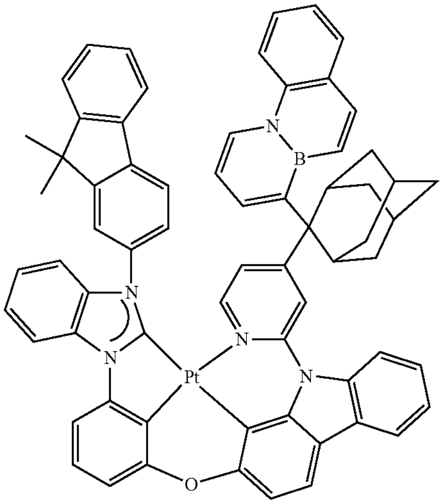
D180
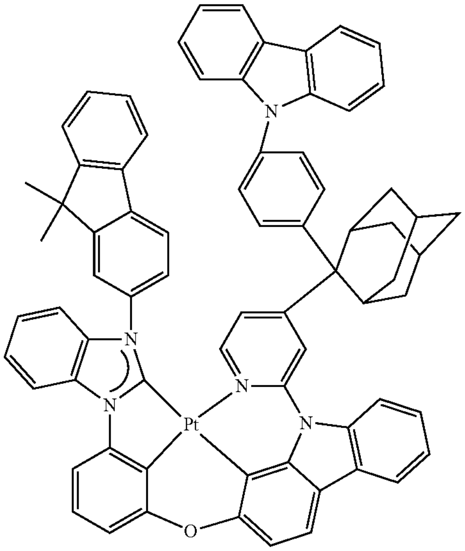
D181
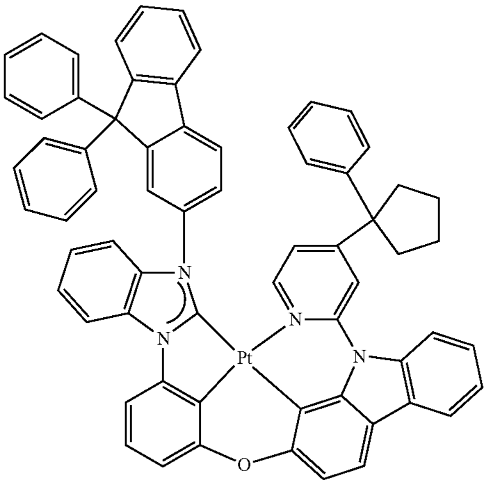
D182
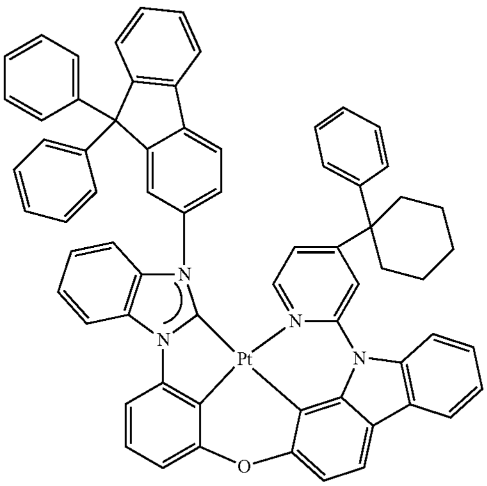

-continued
D183
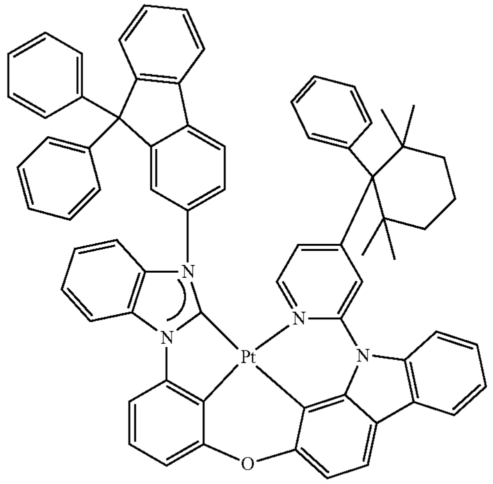
D184
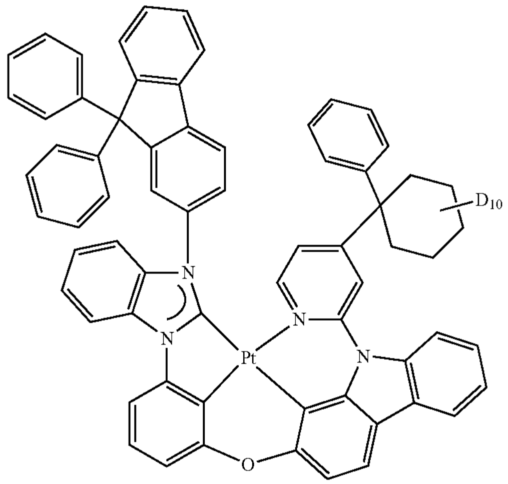
D185
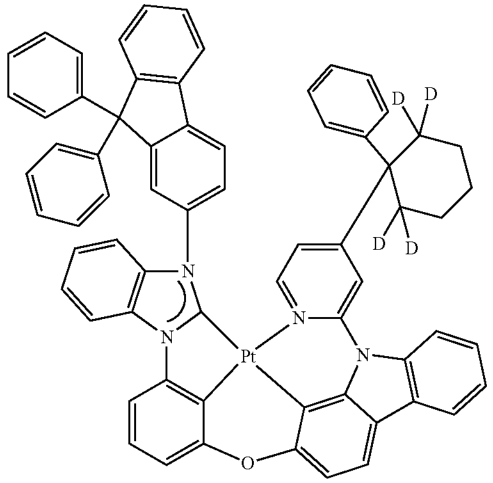
-continued
D186
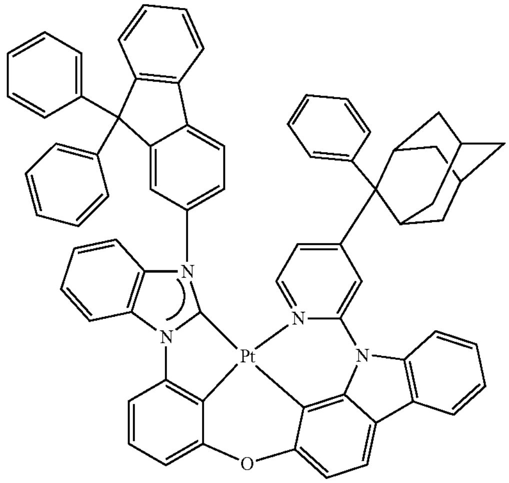
D187
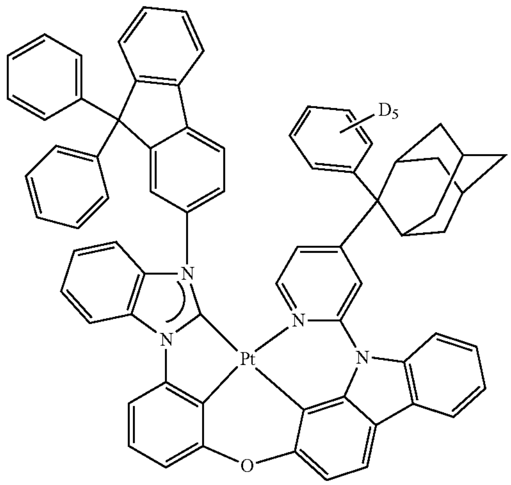
D188
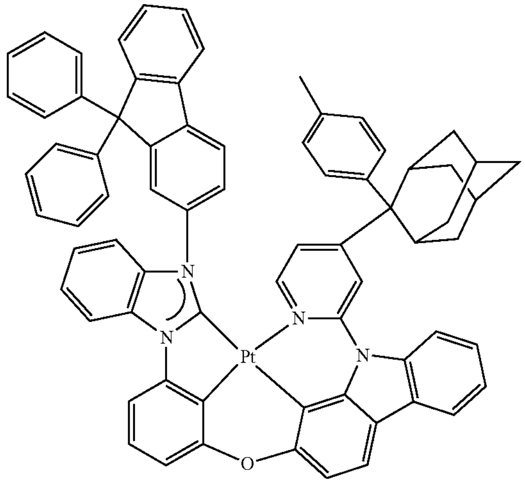

-continued
D189
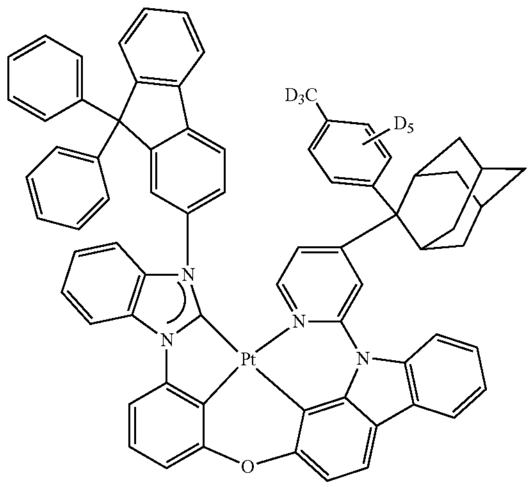
D190
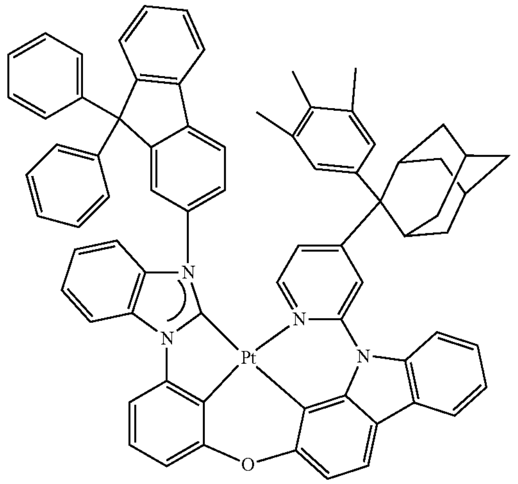
D191
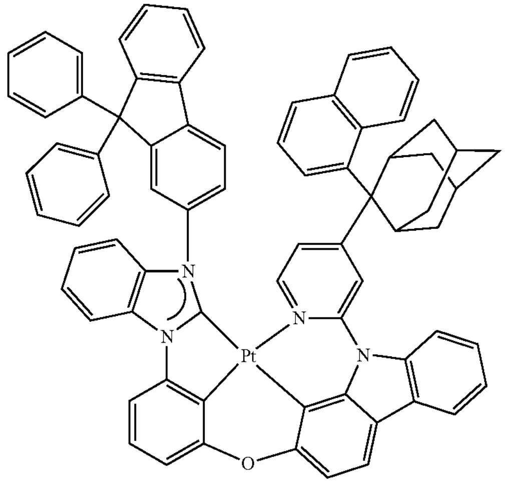
-continued
D192
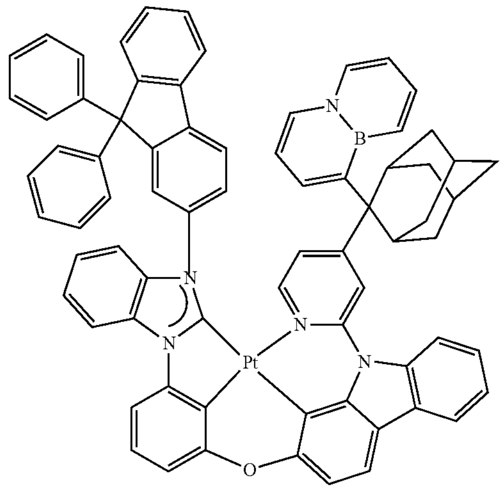
D193
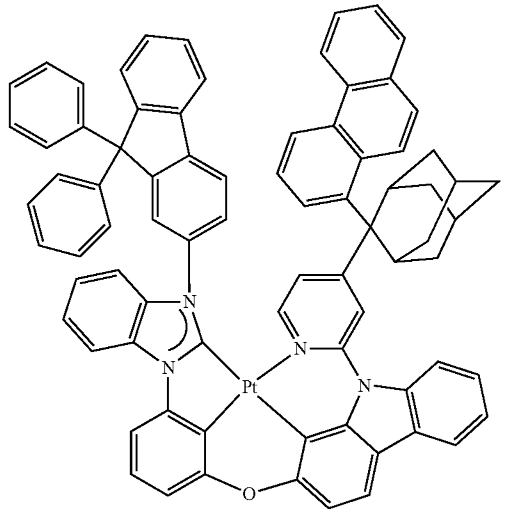
D194
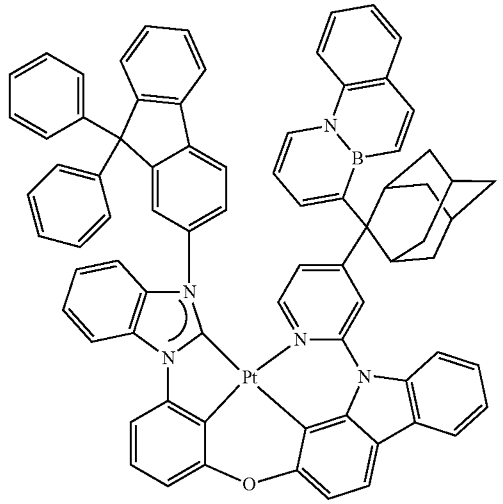

-continued
D195
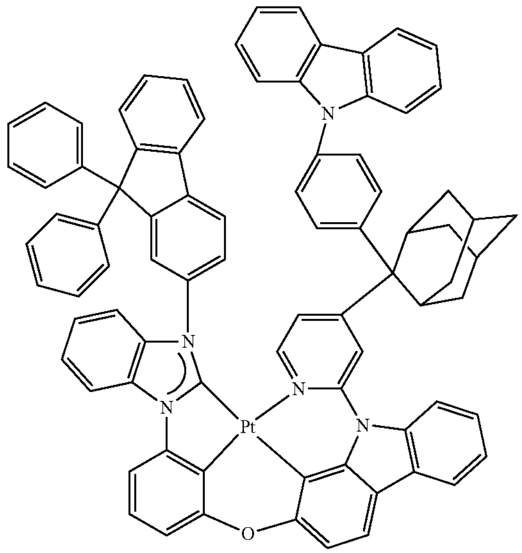
D196
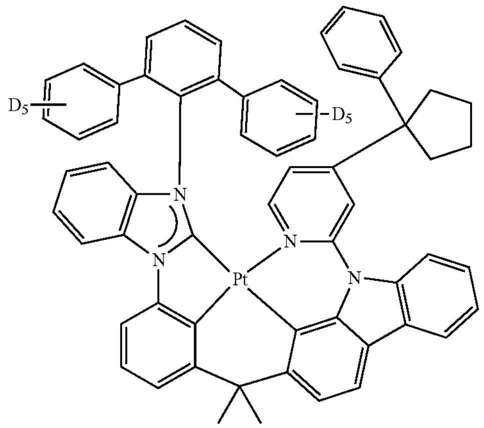
D197
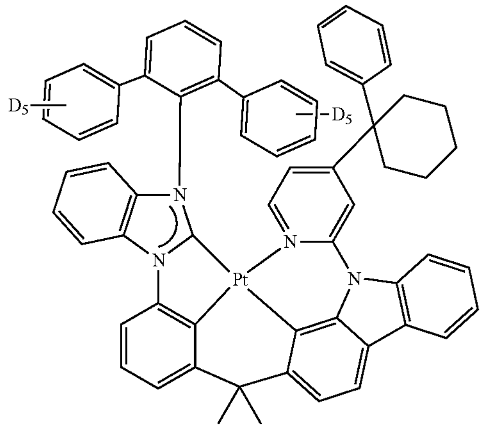
-continued
D198
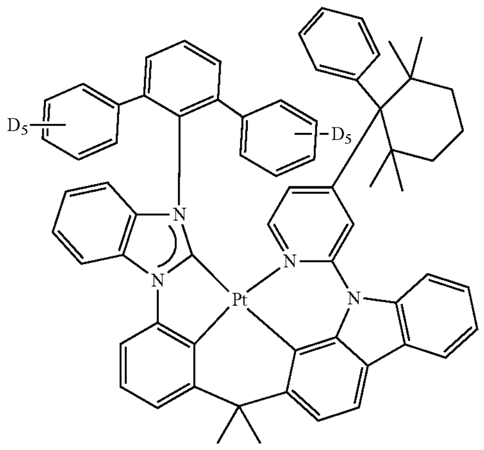
D199
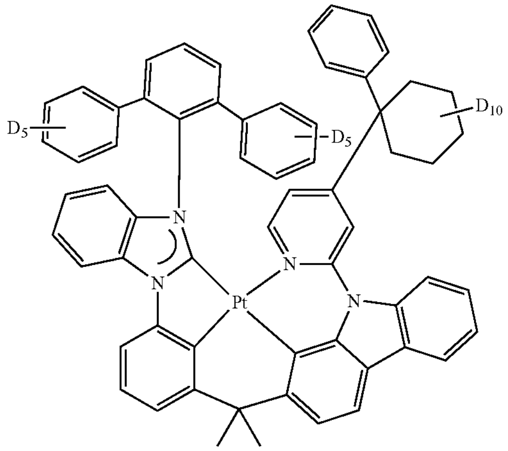
D200
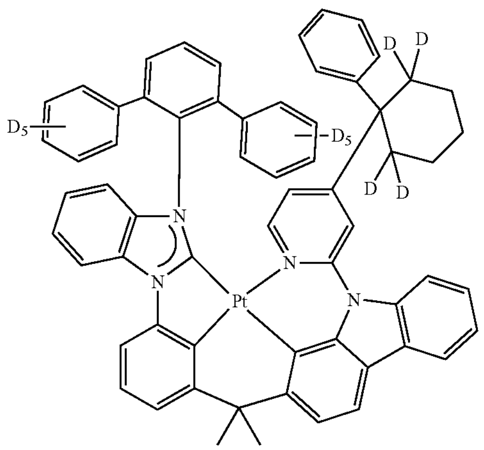

-continued
D201
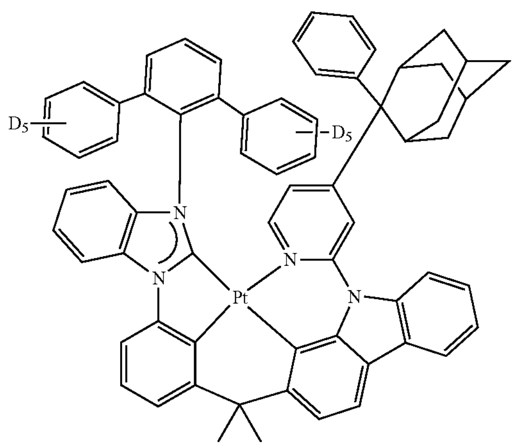
D202
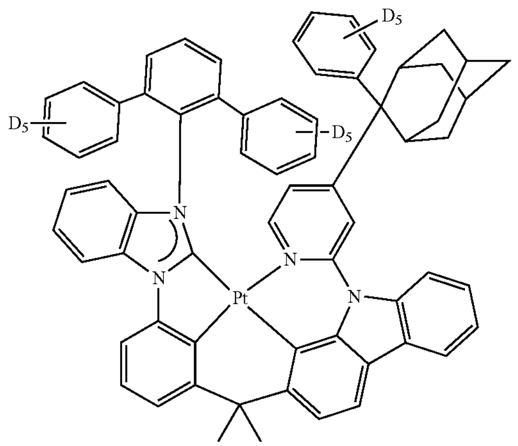
D203
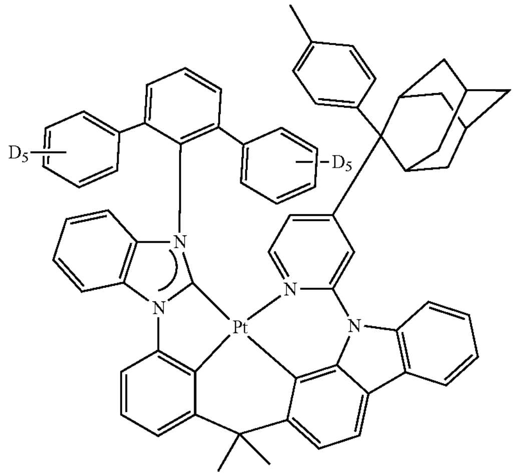
-continued
D204
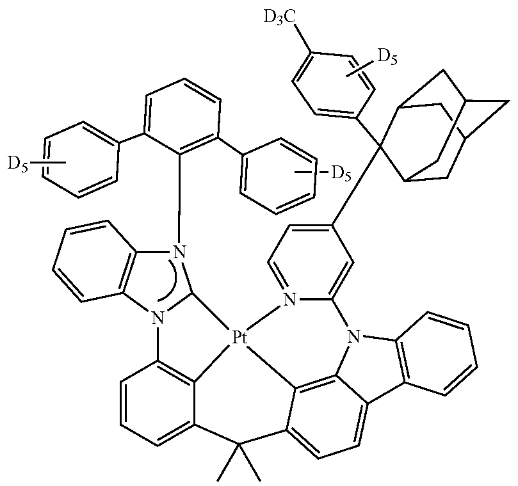
D205
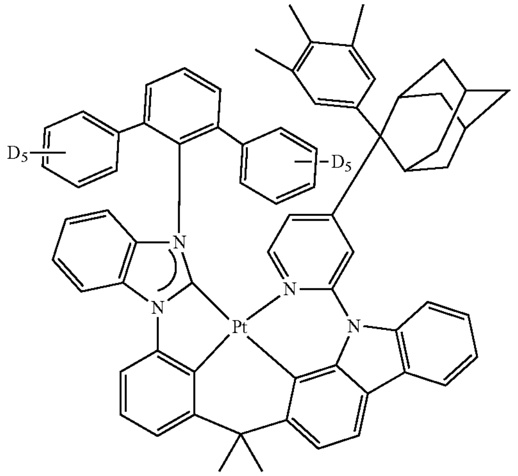
D206
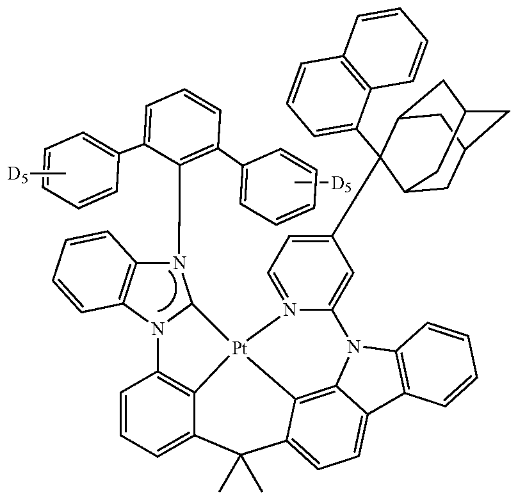

D207
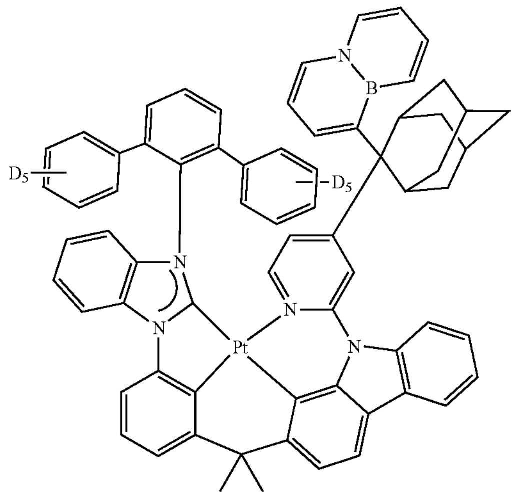
D208
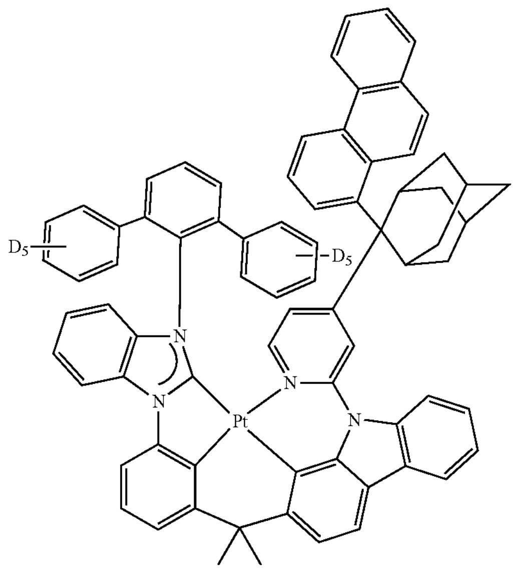
D209
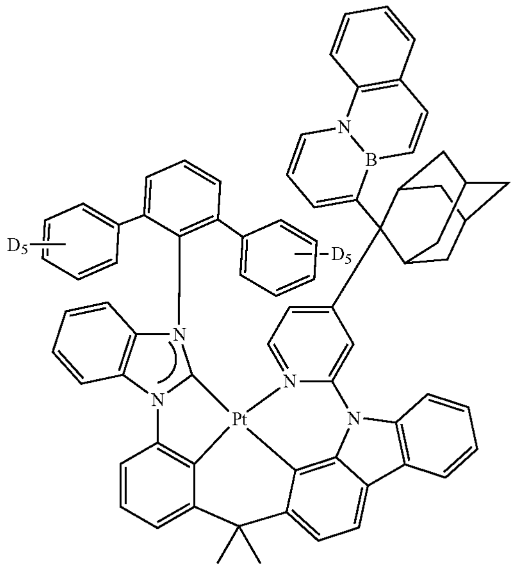
D210
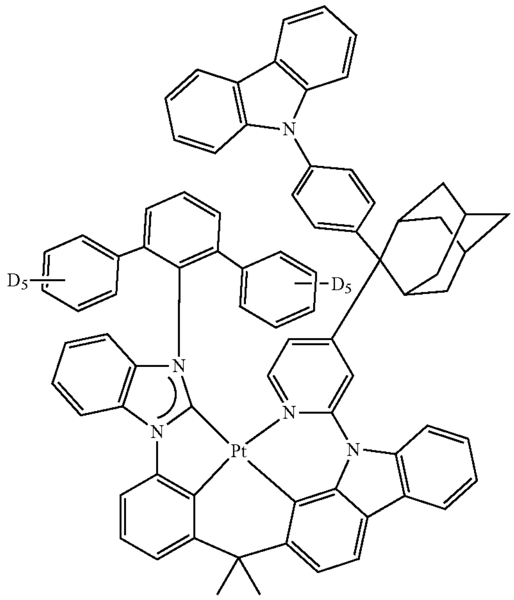
D211
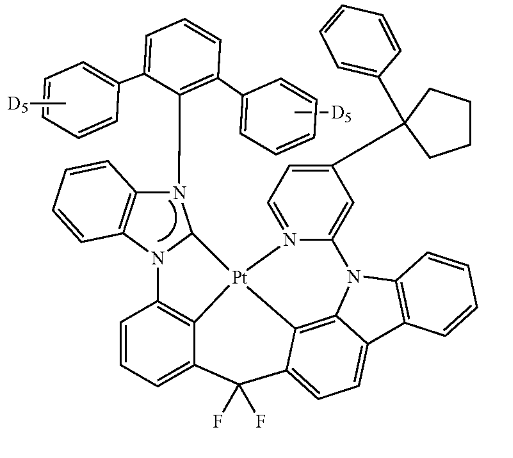

-continued
D212
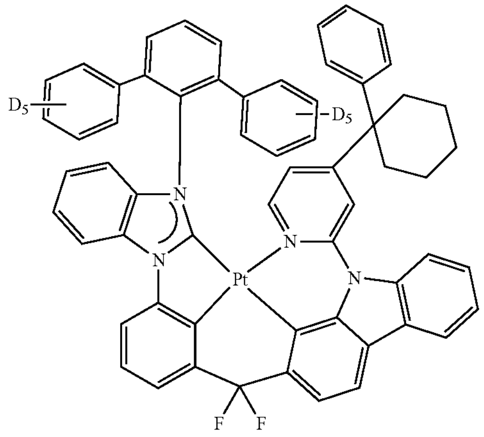
D213
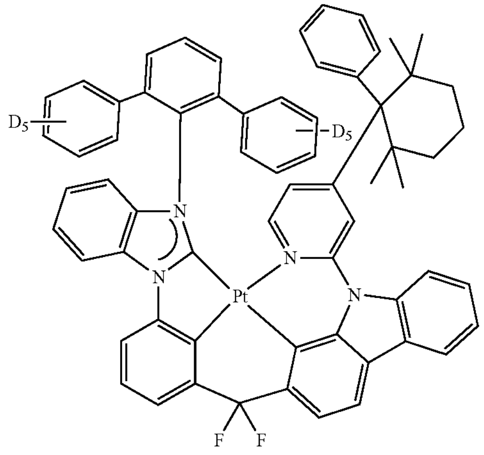
D214
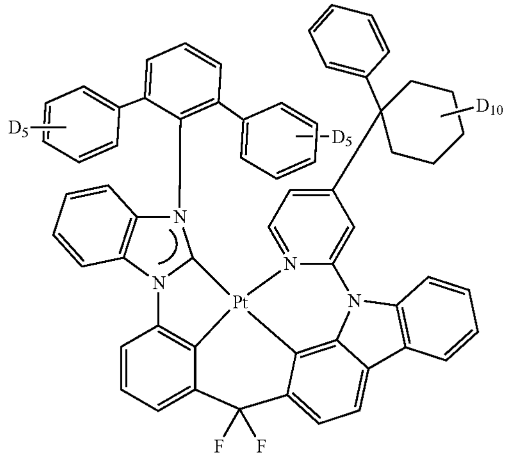
-continued
D215
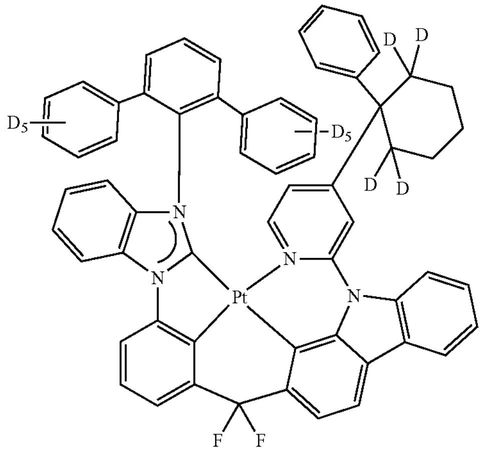
D216
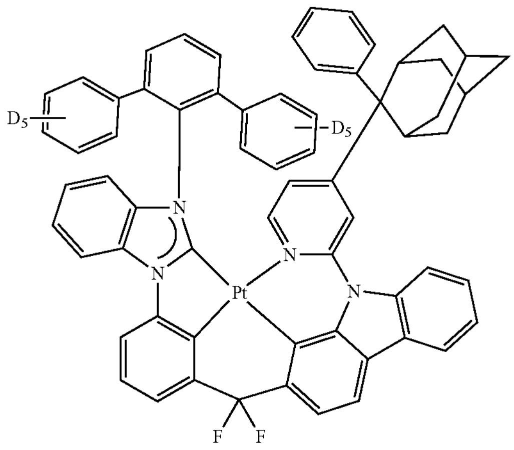
D217
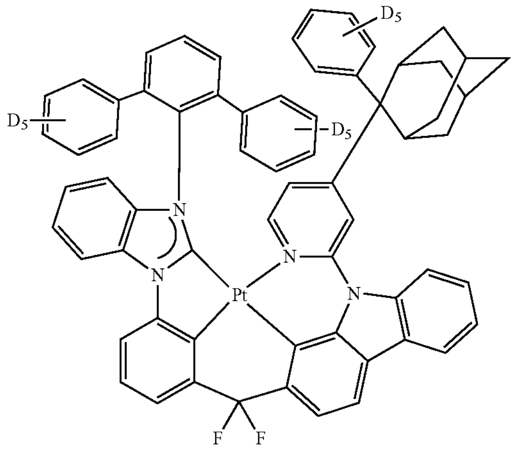

-continued
D218
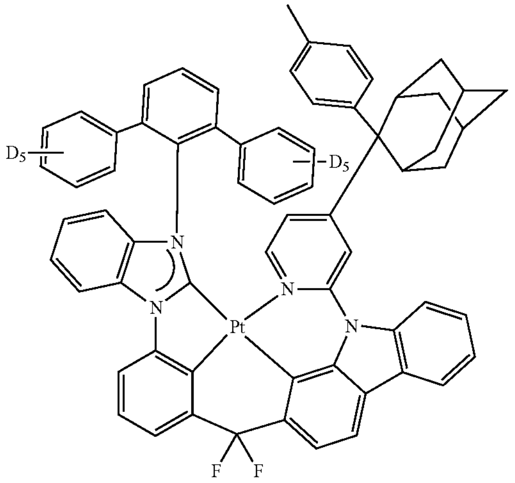
D219
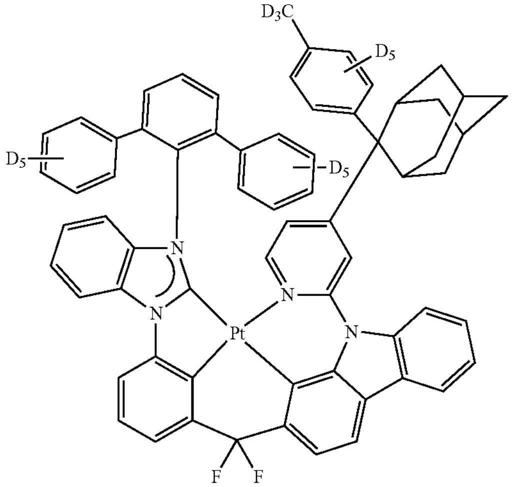
D220
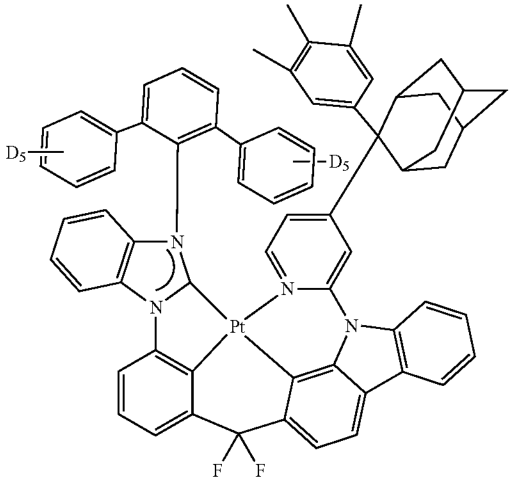
-continued
D221
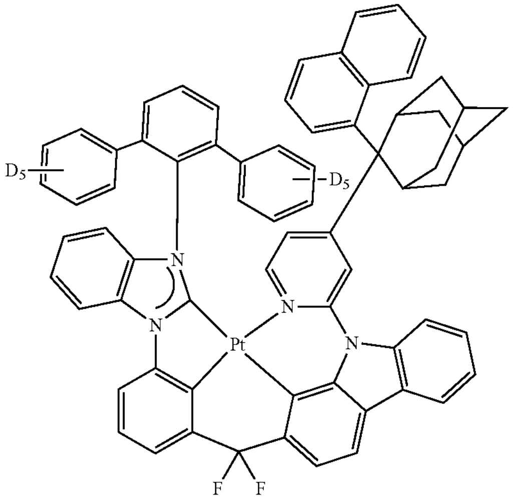
D222
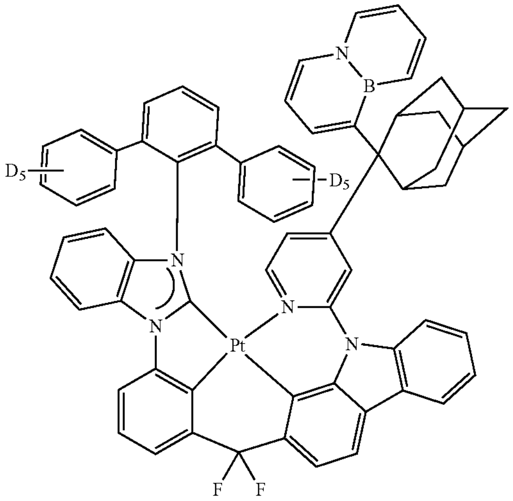
D223
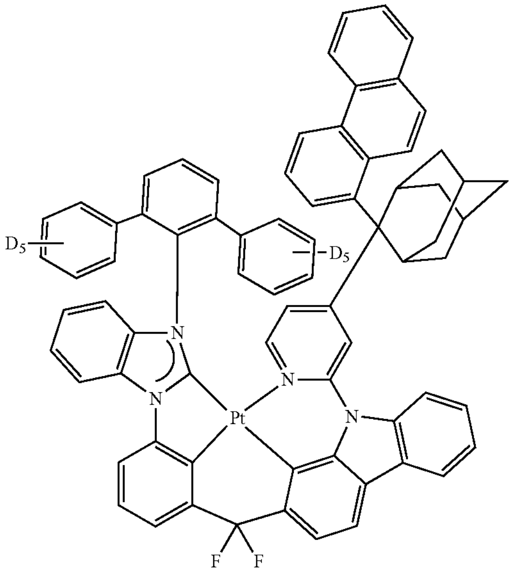

D224
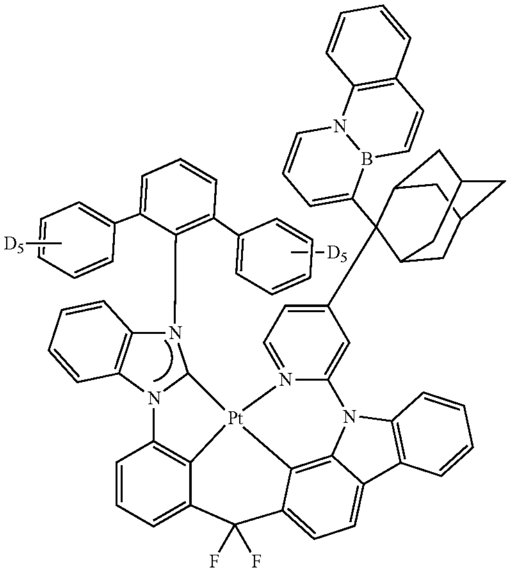
D225
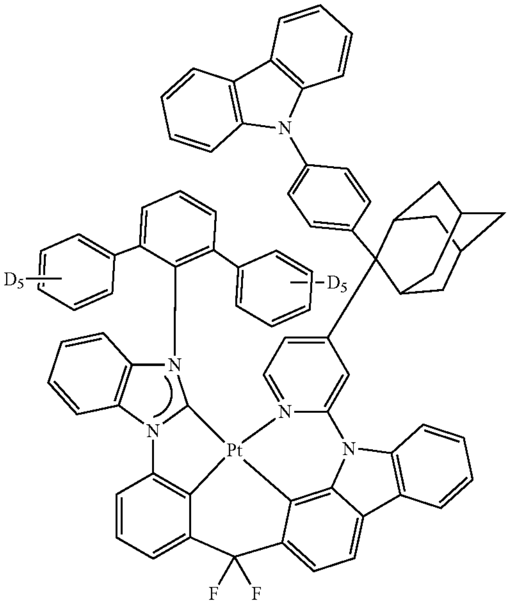
D226
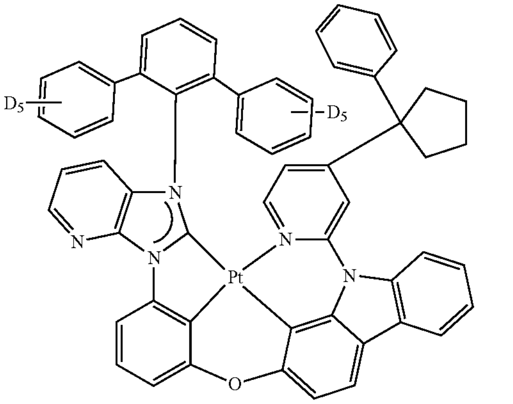
D227
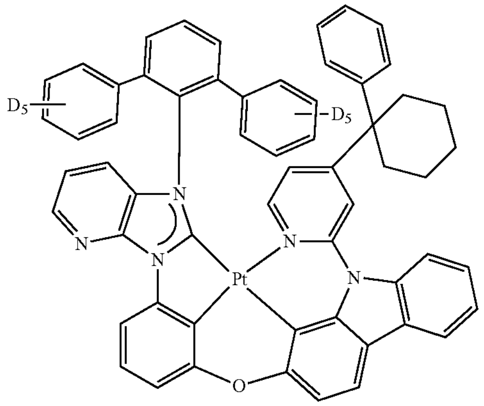
D228
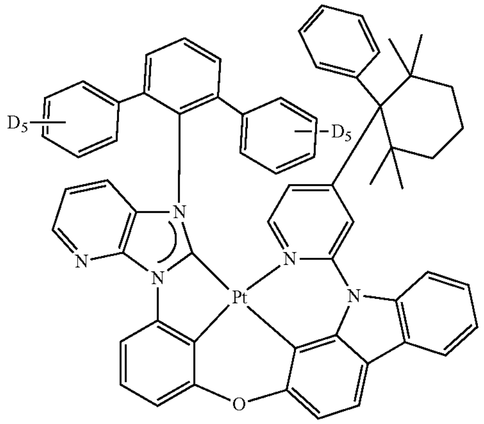
D229
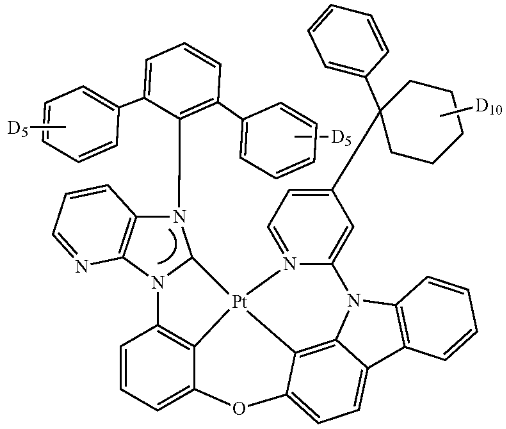

-continued
D230
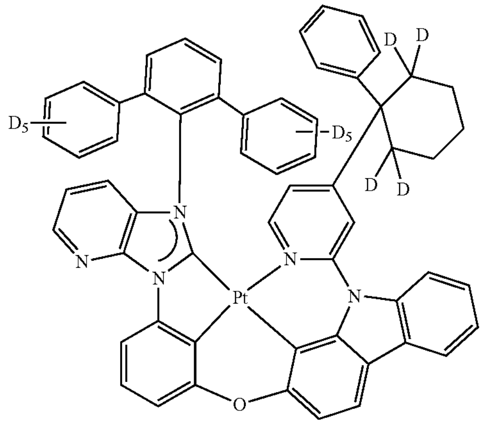
D231
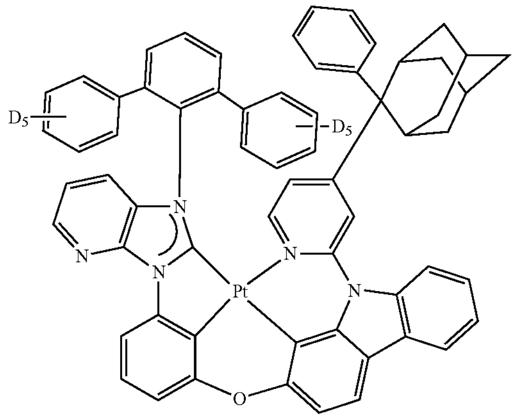
D232
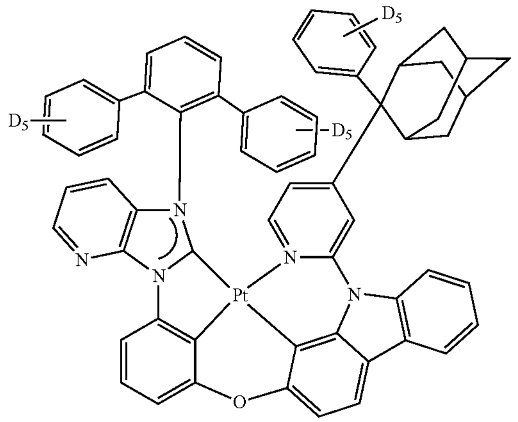
-continued
D233
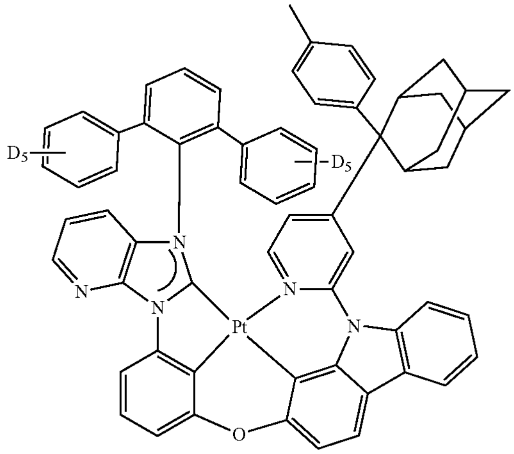
D234
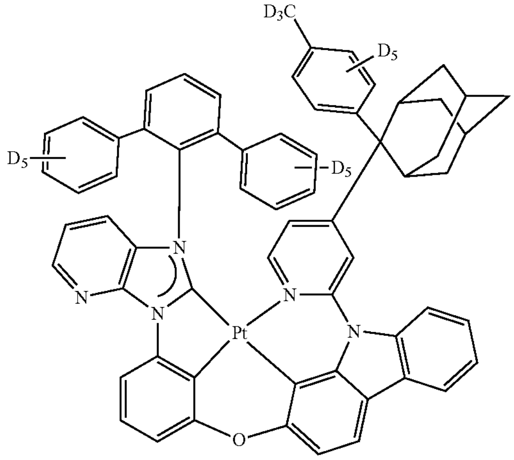
D235
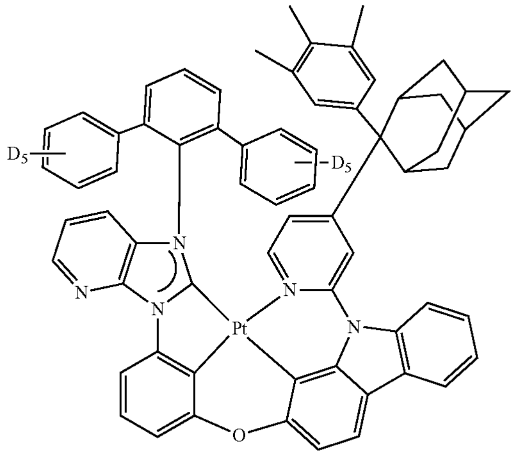

-continued
D236
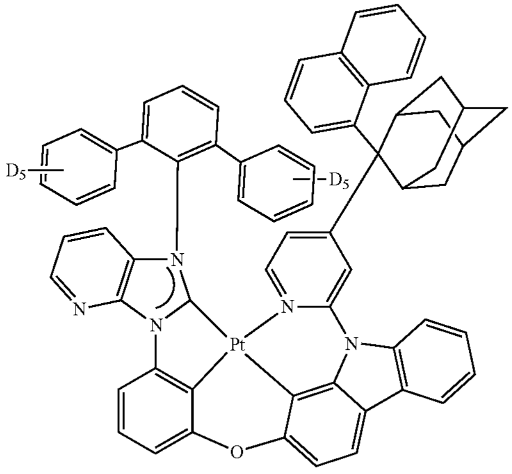
D237
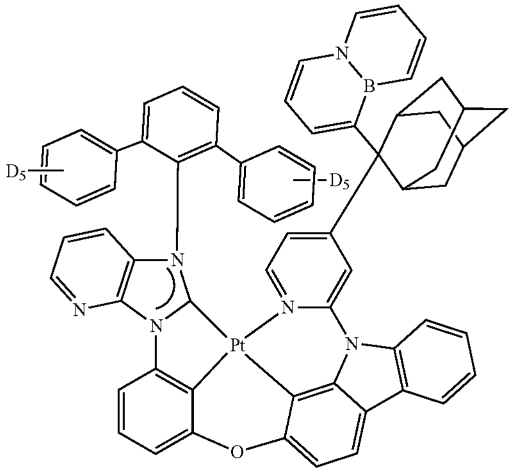
D238
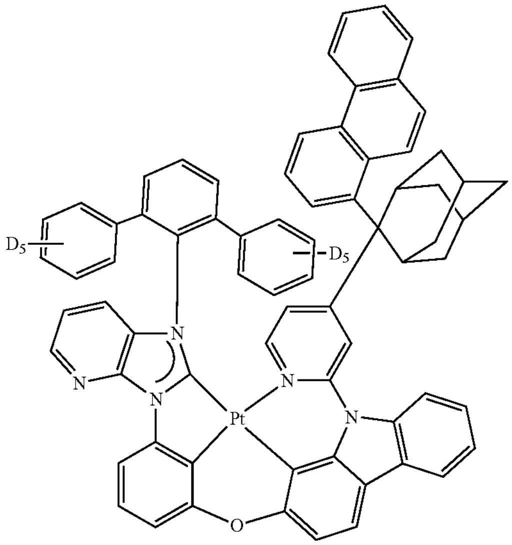
-continued
D239
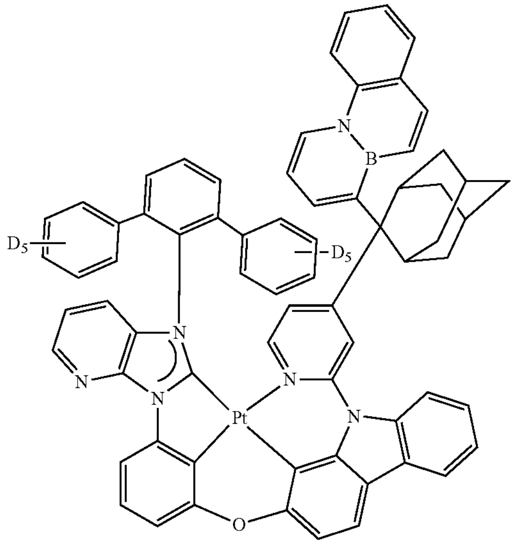
D240
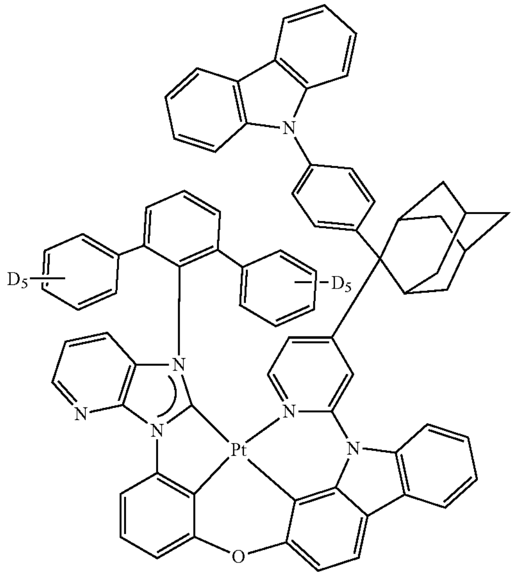
D241
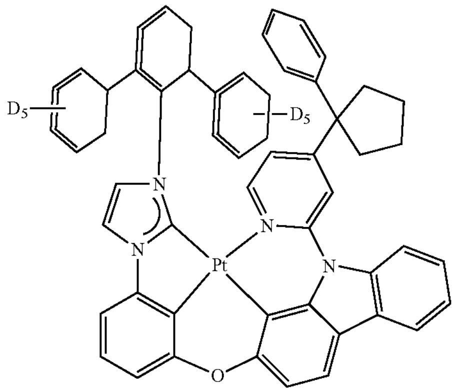

-continued
D242
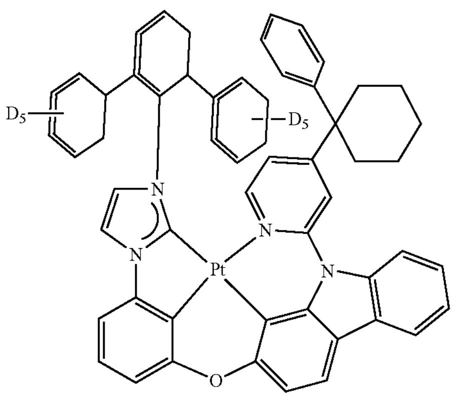
D243
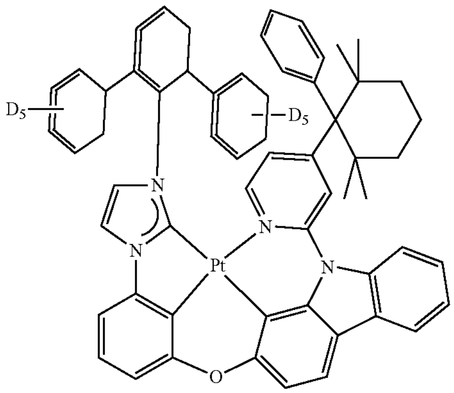
D244
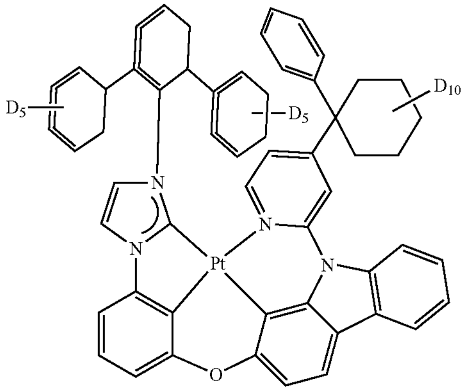
D245
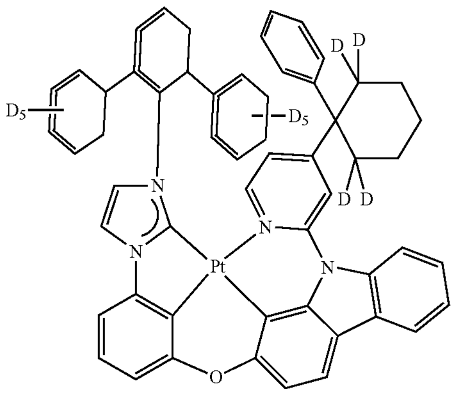
-continued
D246
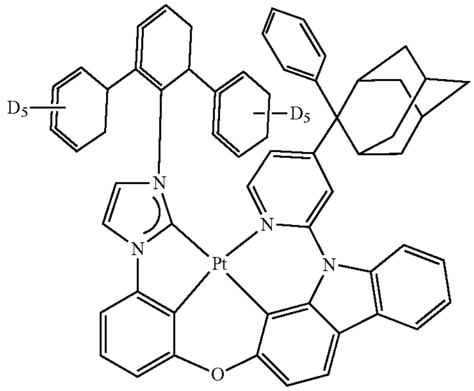
D247
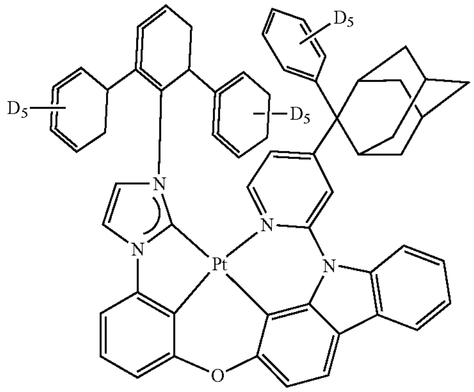
D248
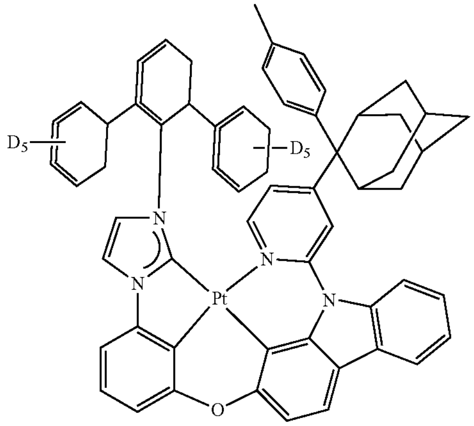
D249
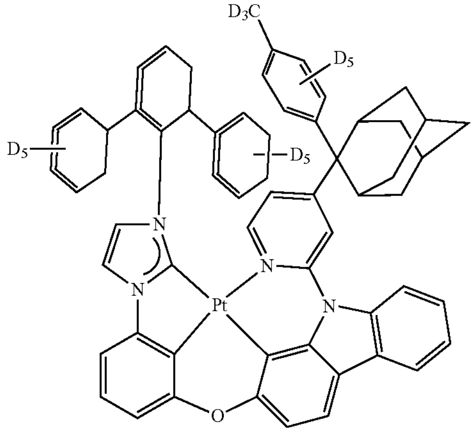

-continued
D250
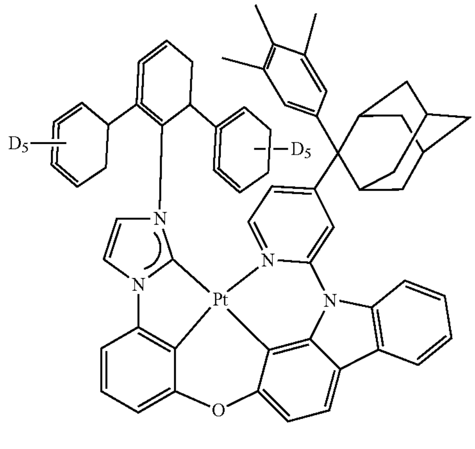
D251
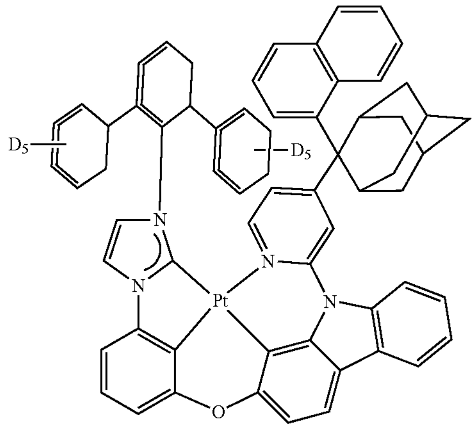
D252
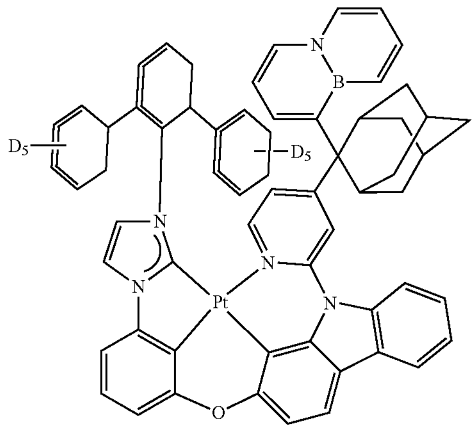
-continued
D253
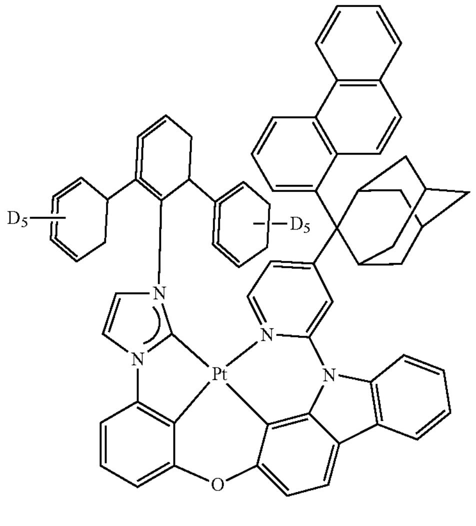
D254
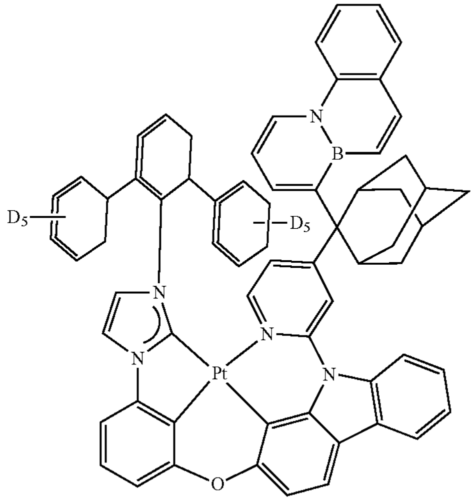
D255
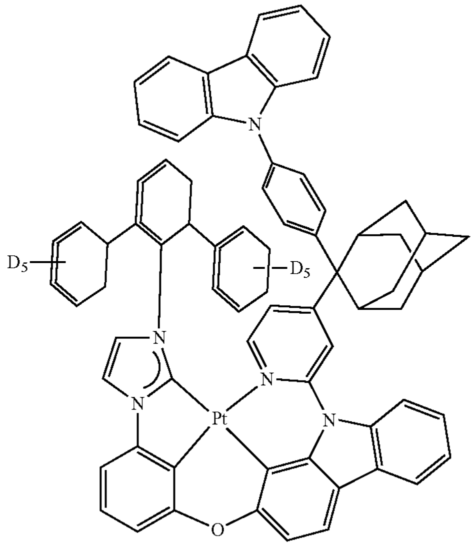

-continued
D256
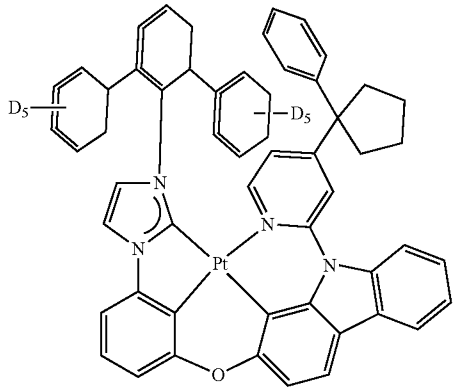
D257
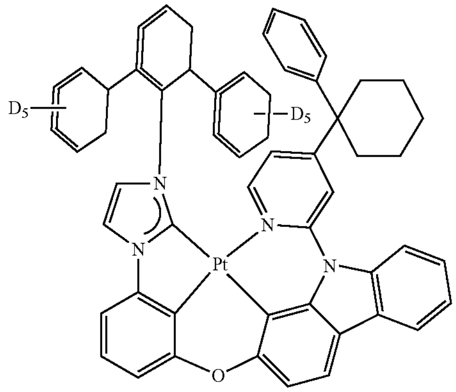
D258
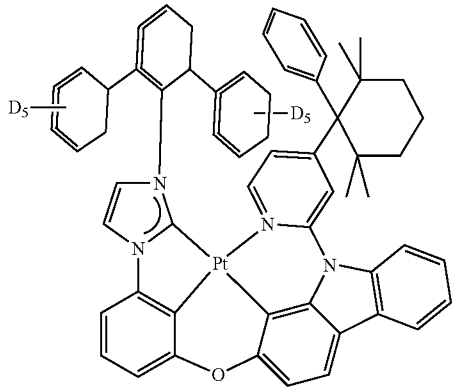
D259
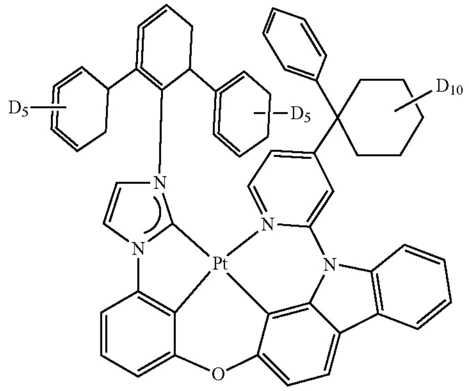
-continued
D260
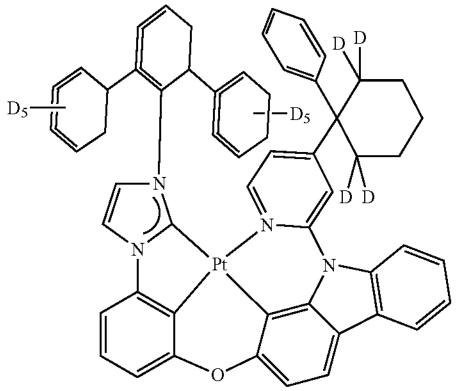
D261
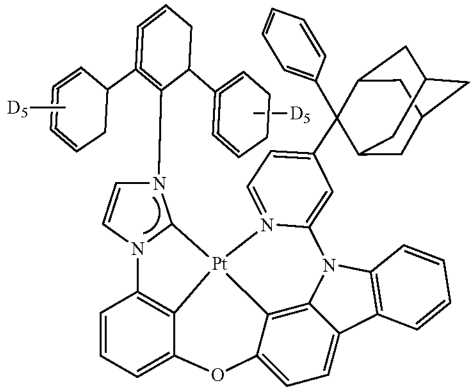
D262
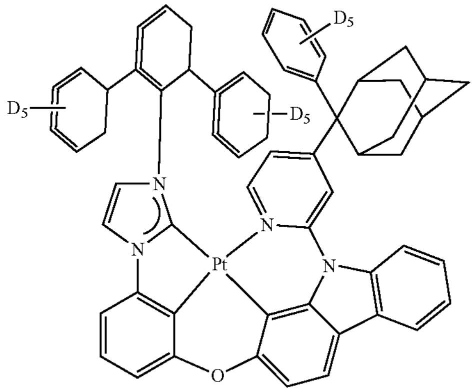
D263
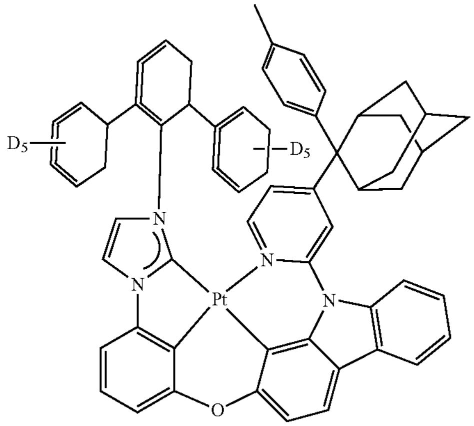

-continued
D264
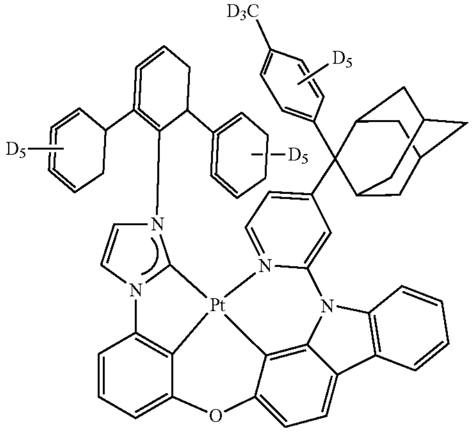
D265
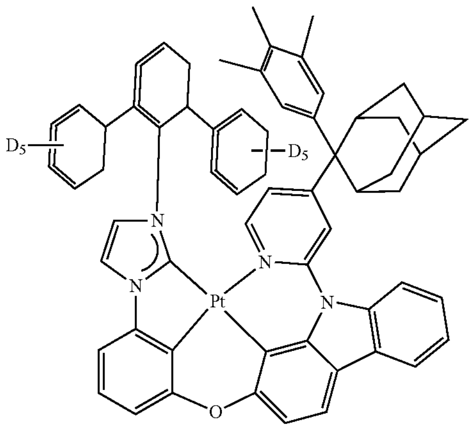
D266
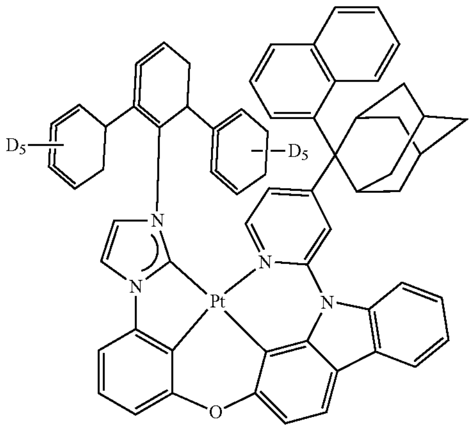
-continued
D267
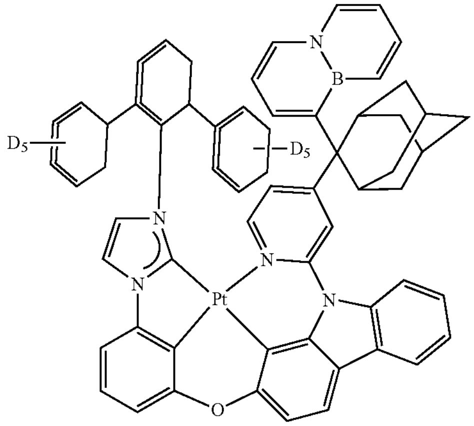
D268
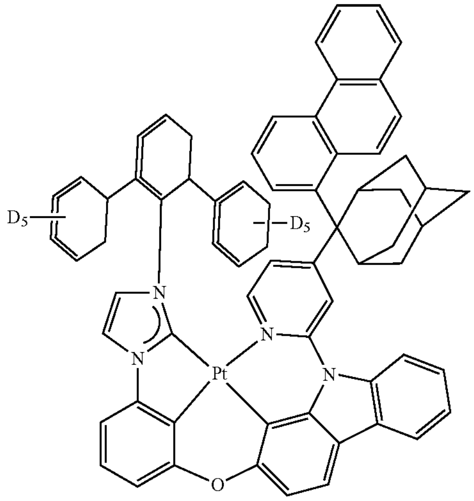
D269
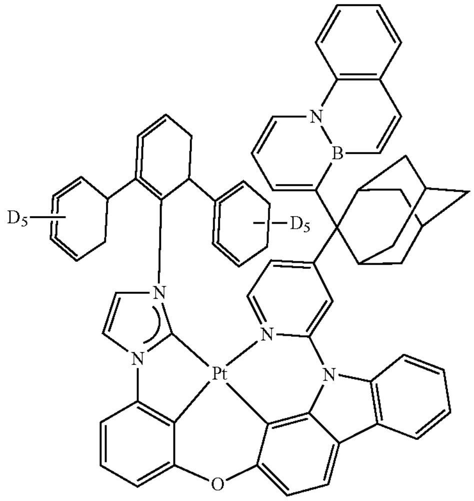

-continued
D270
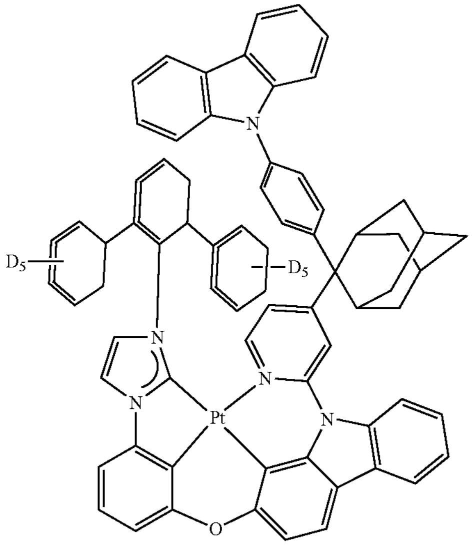
D271
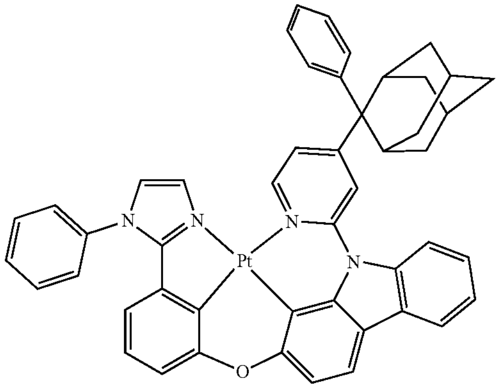
D272
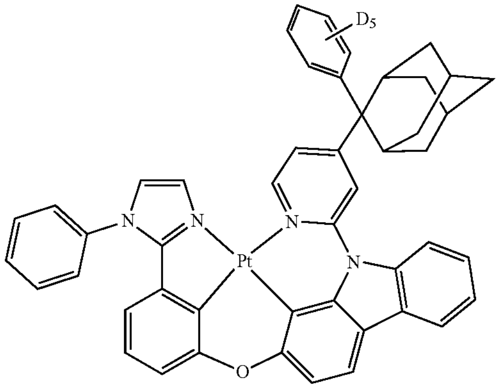
-continued
D273
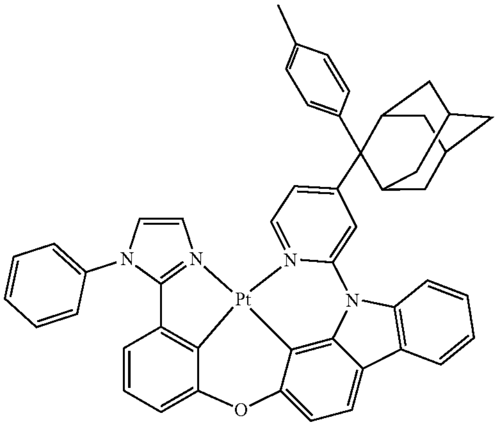
D274
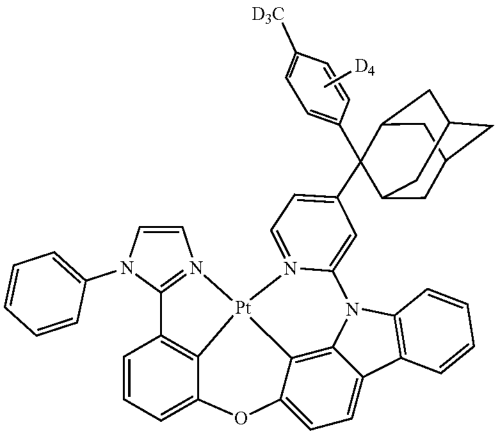
D275
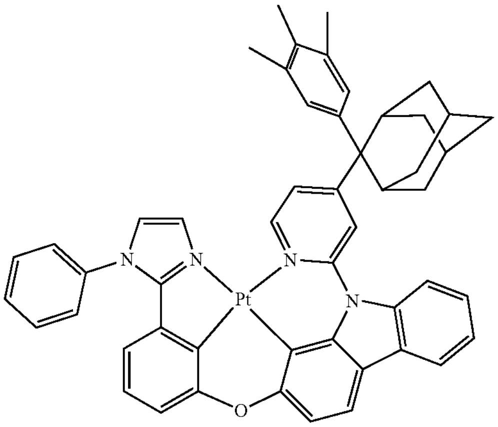

-continued
D276
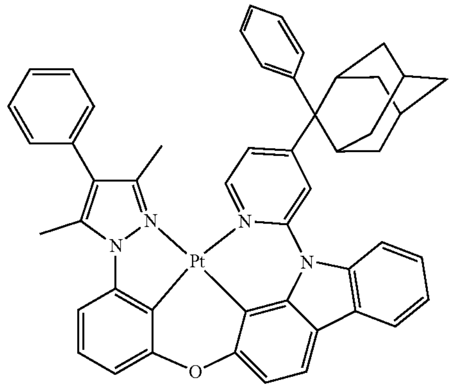
D277
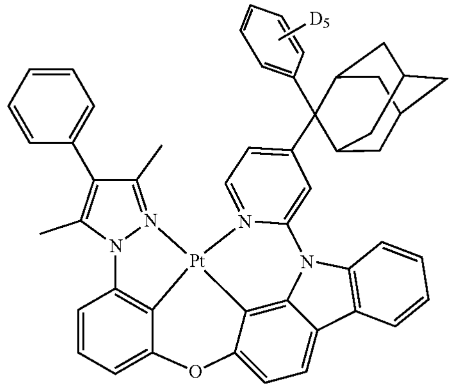
D278
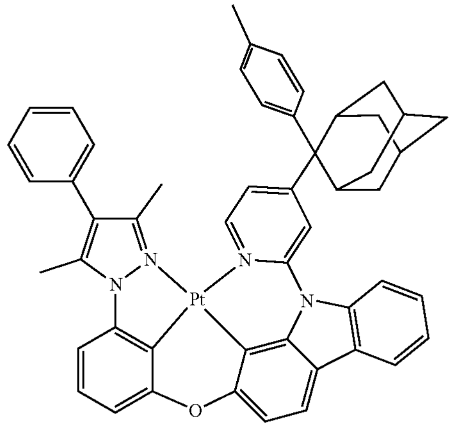
D279
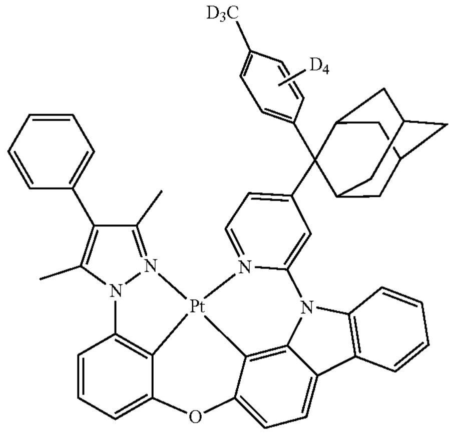
-continued
D280
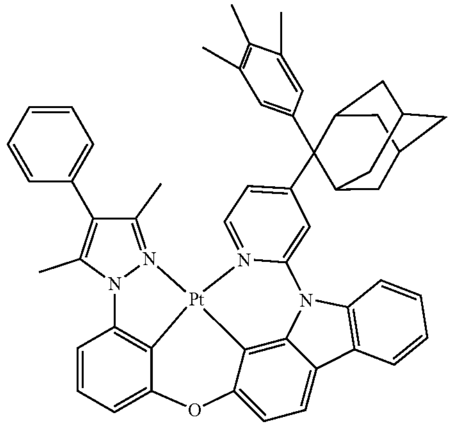
D281
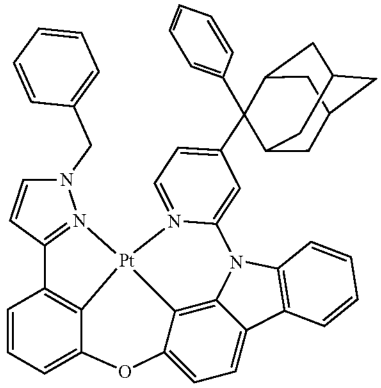
D282
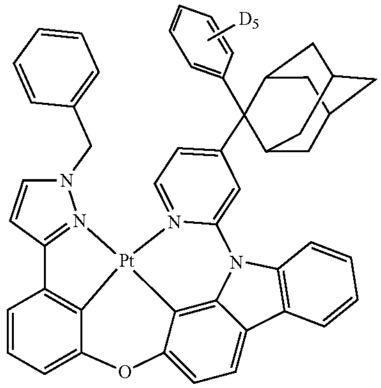
D283
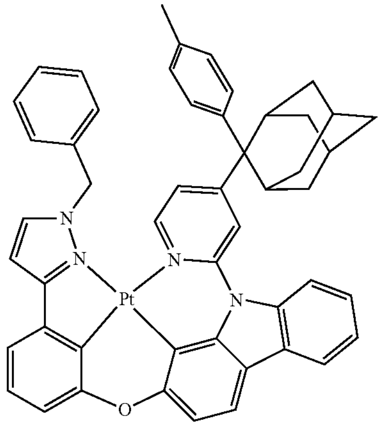

-continued
D284
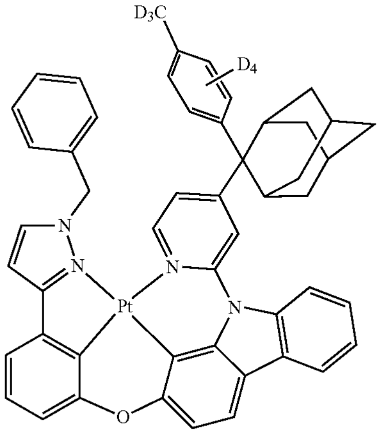
D285
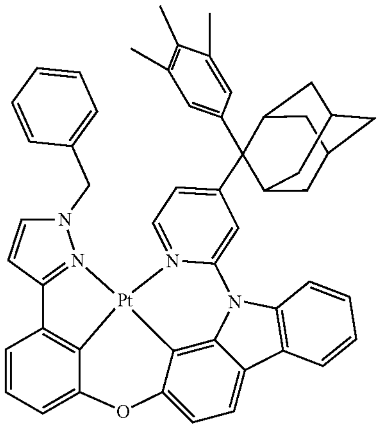
D286
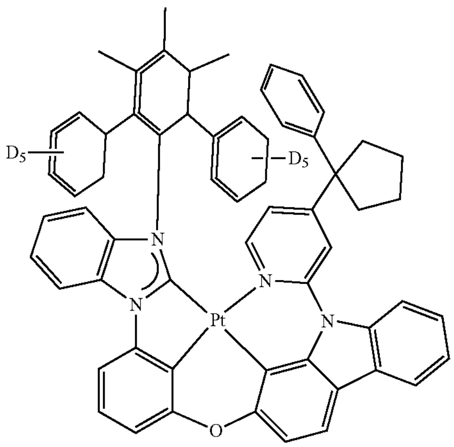
-continued
D287
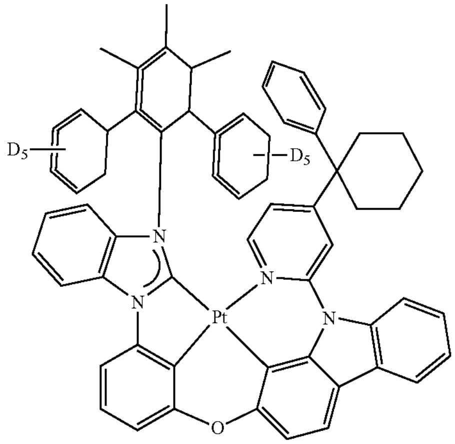
D288
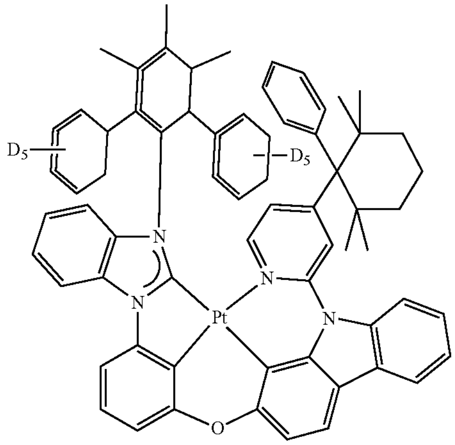
D289
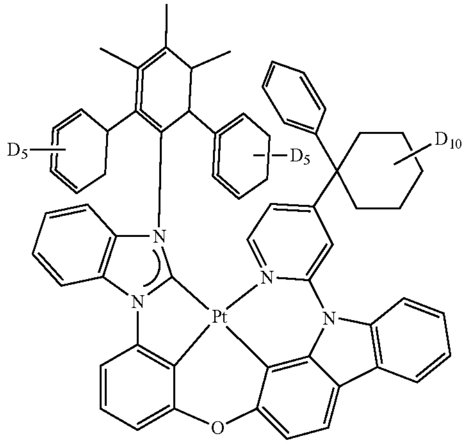

-continued
D290
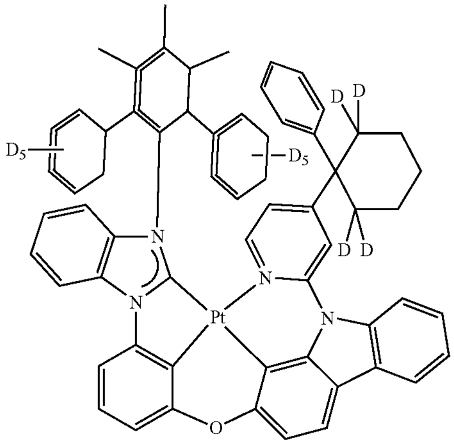
D291
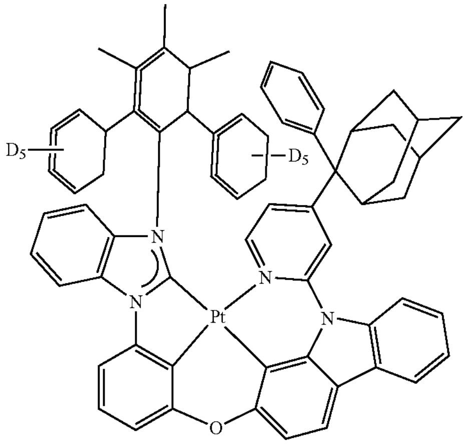
D292
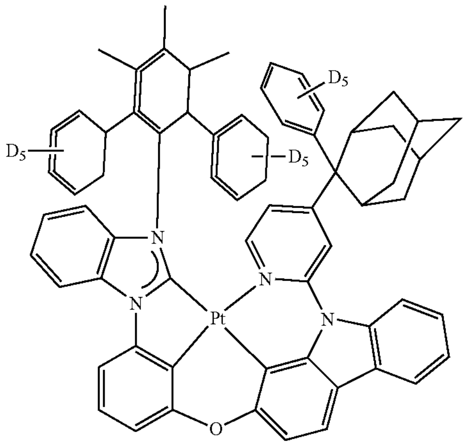
-continued
D293
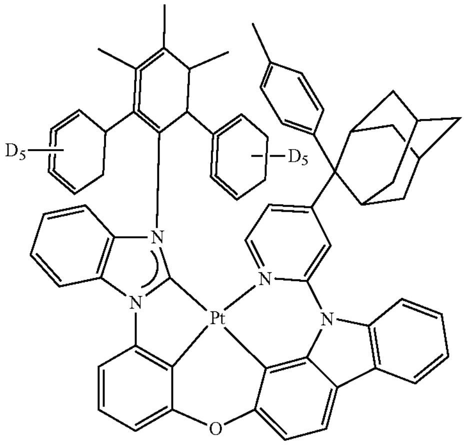
D294
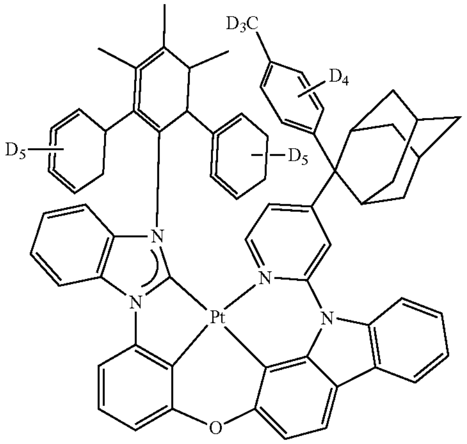
D295
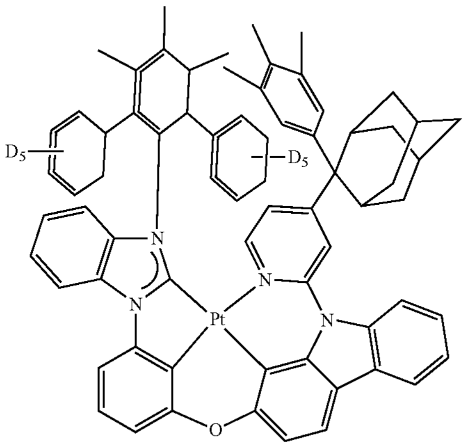

-continued
D296
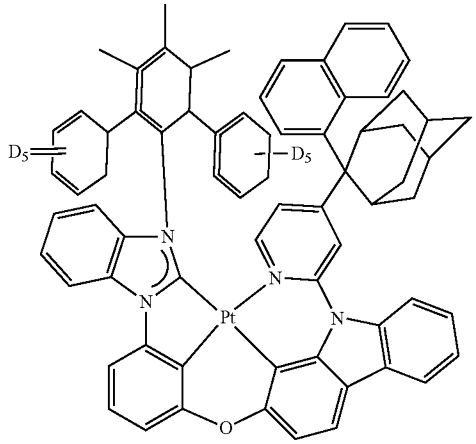
D297
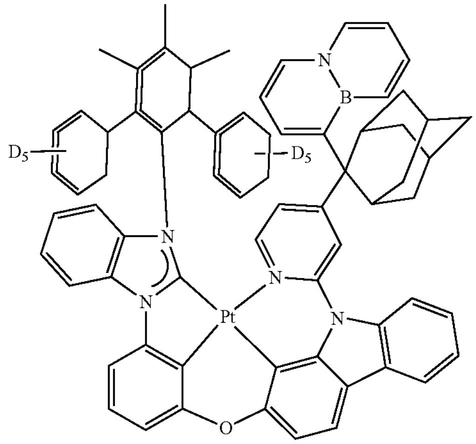
D298
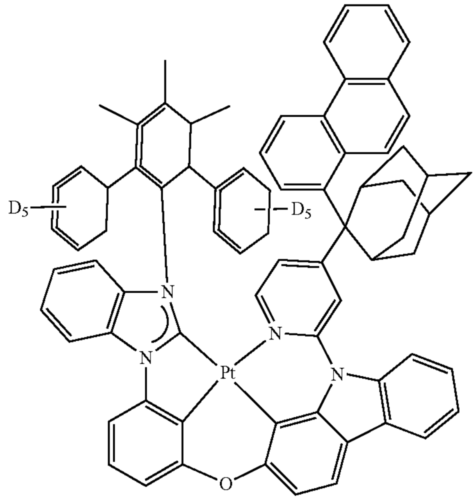
-continued
D299
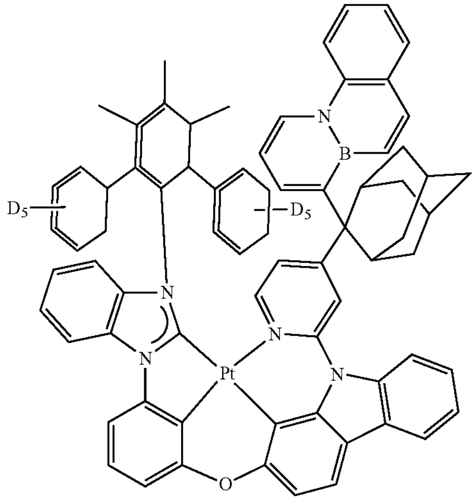
D300
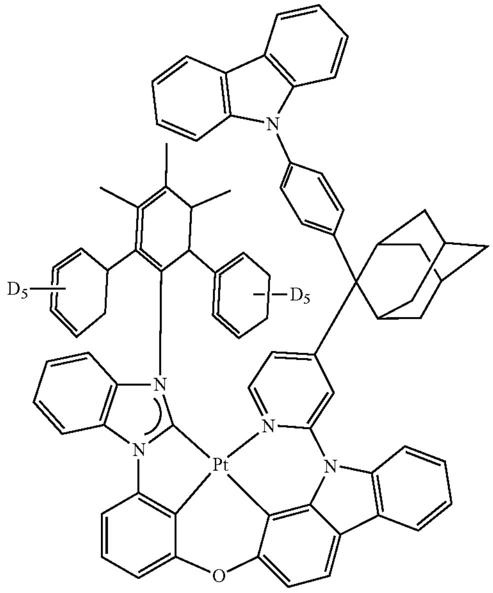
D301
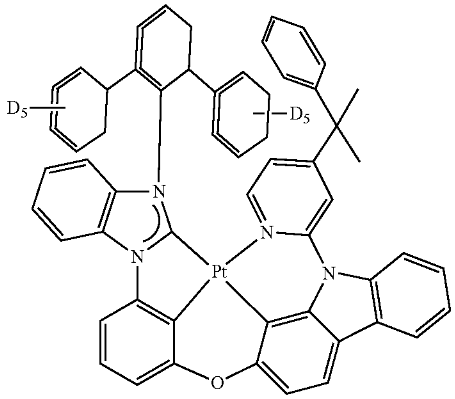

-continued
D302
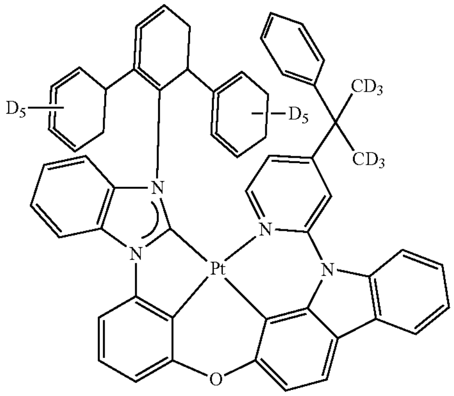
D303
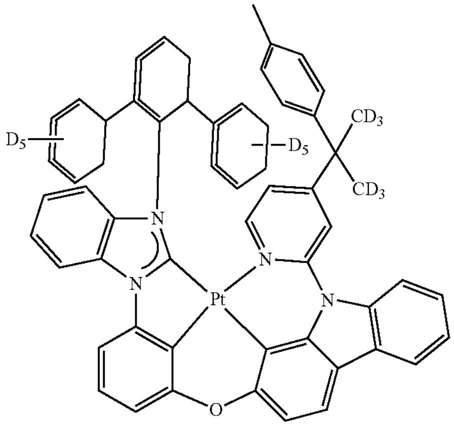
D304
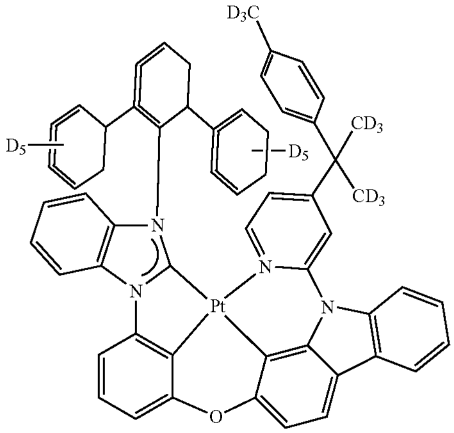
-continued
D305
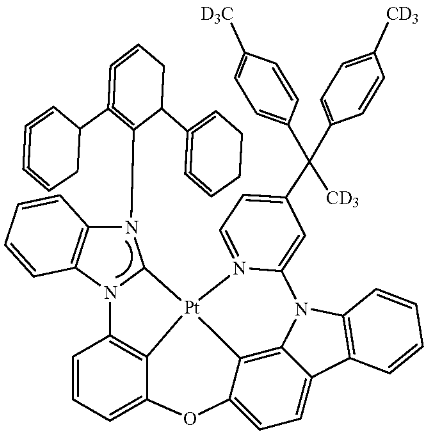
D306
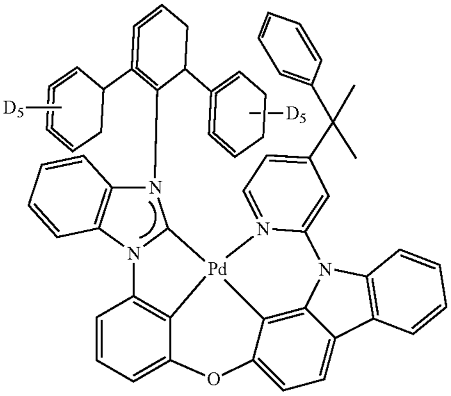
D307
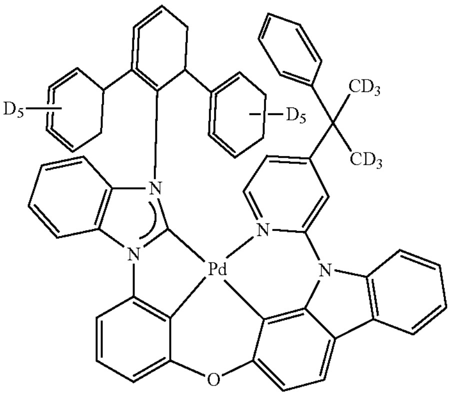

-continued
D308
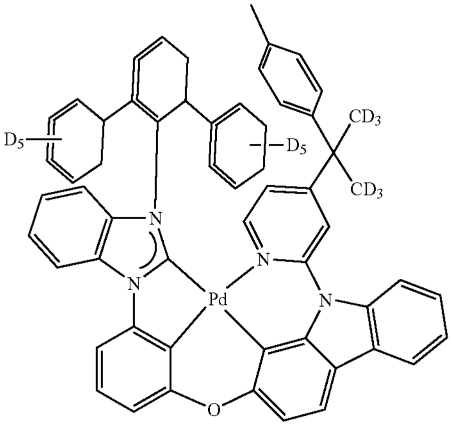
D309
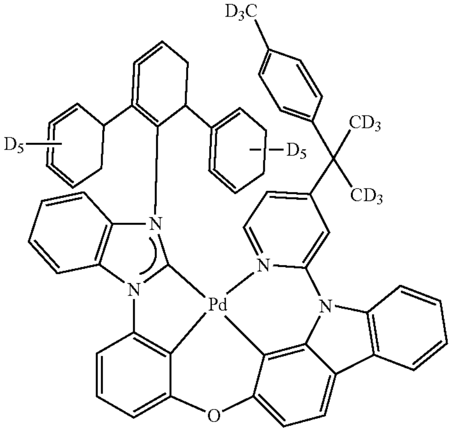
D310
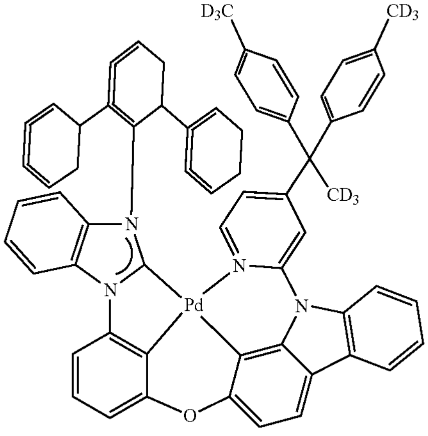
-continued
D311
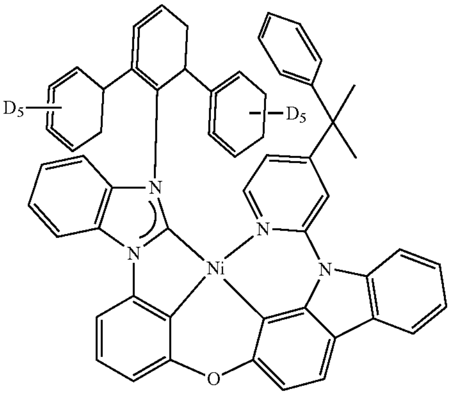
D312
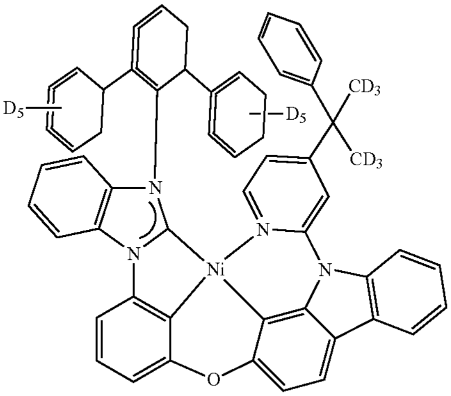
D313
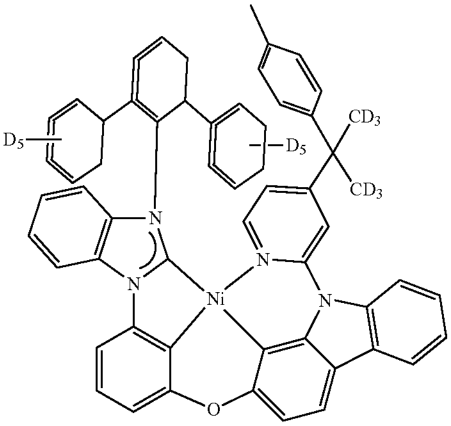
D314
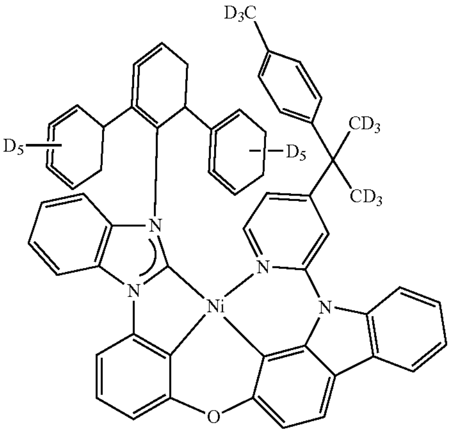

-continued
D315
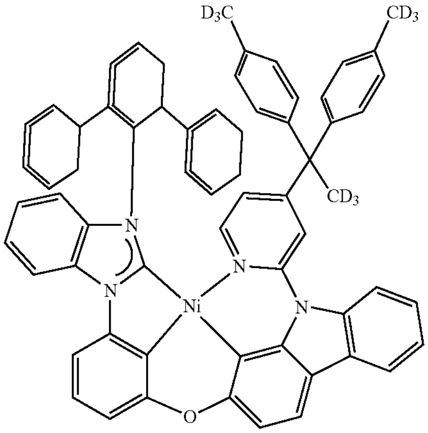
1
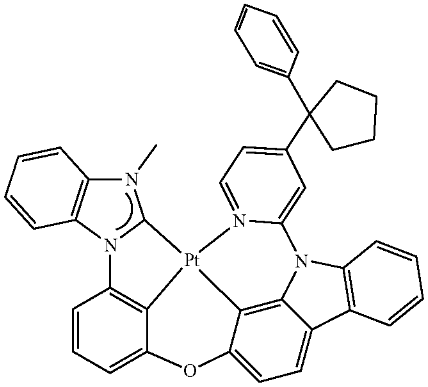
2
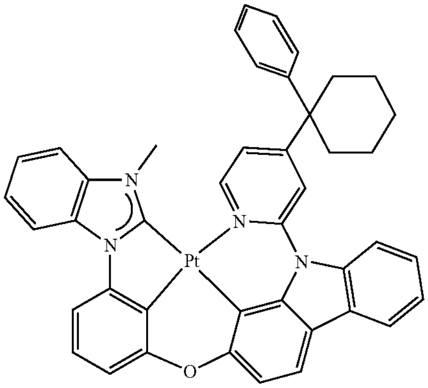
3
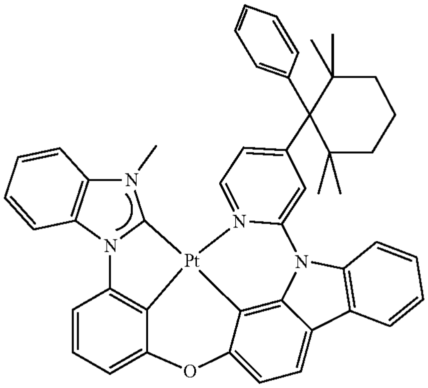
-continued
4
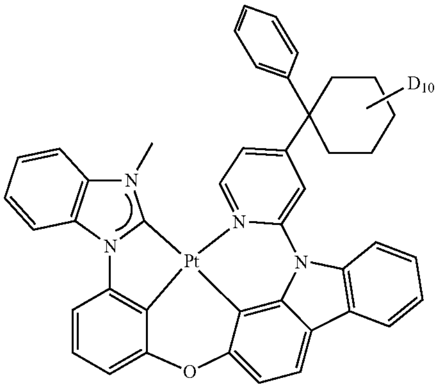
5
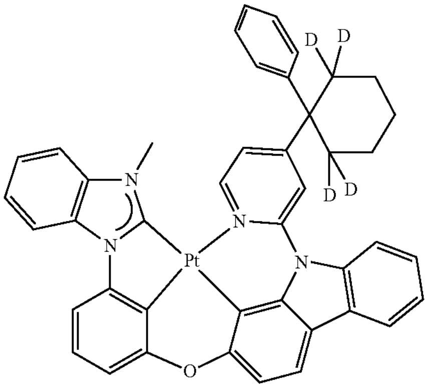
6
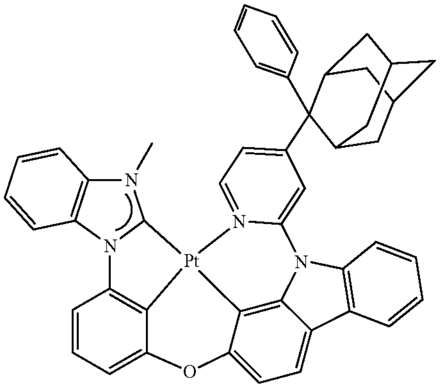
7
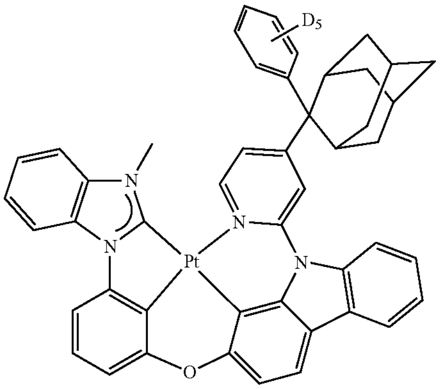

-continued
8
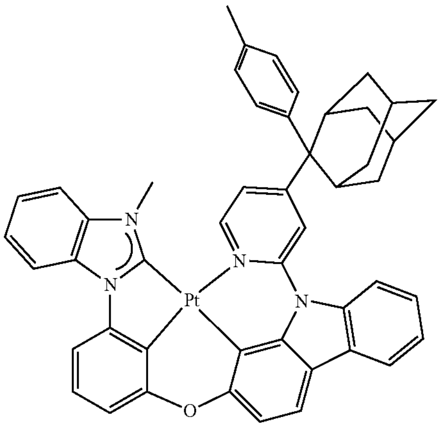
9
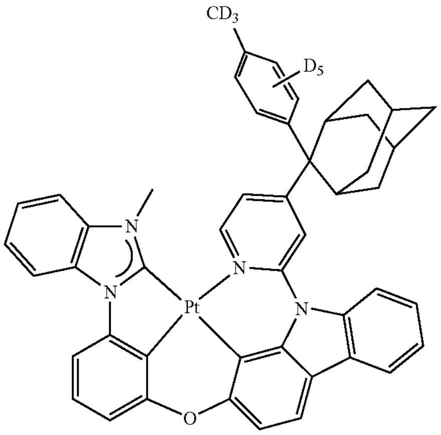
10
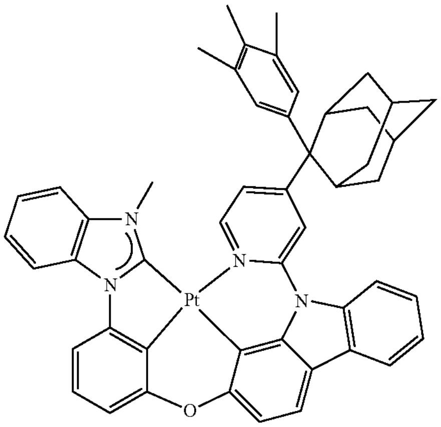
-continued
11
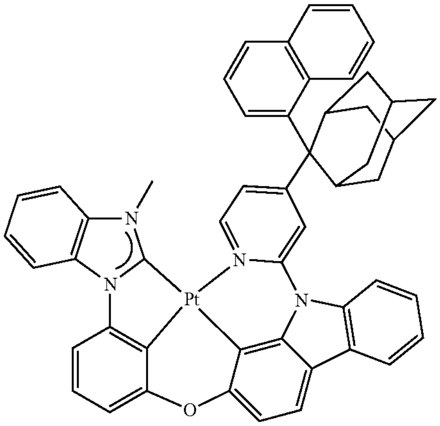
12
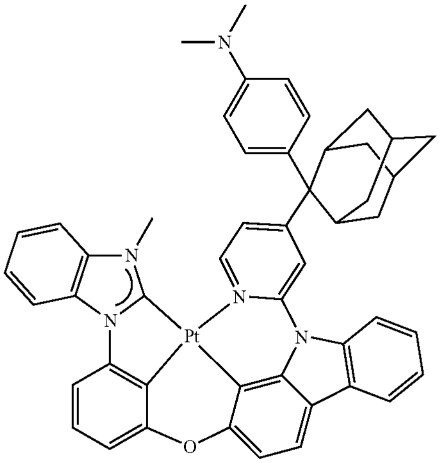
13
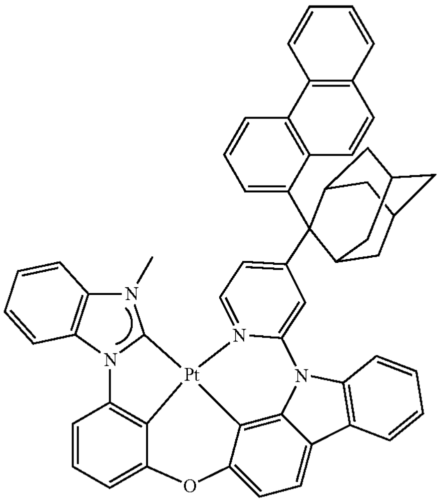

-continued
14
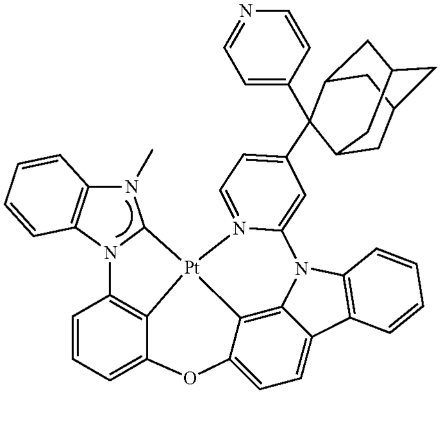
15
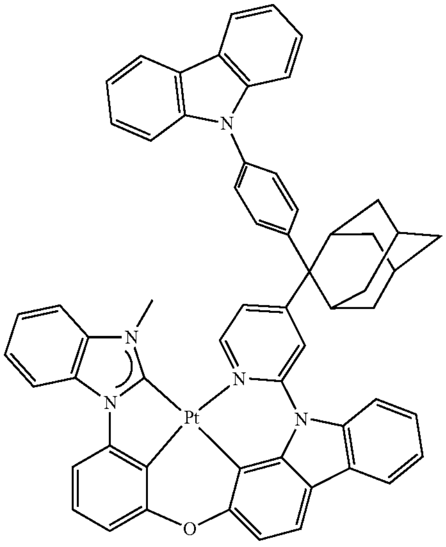
16
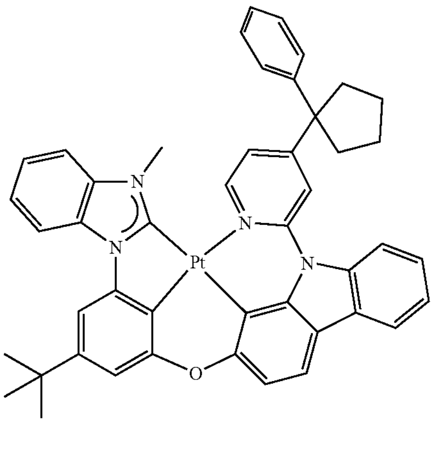
-continued
17
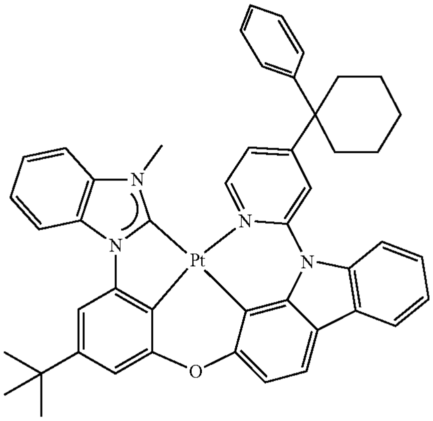
18
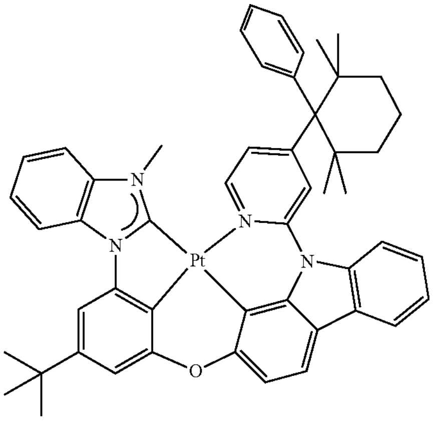
19
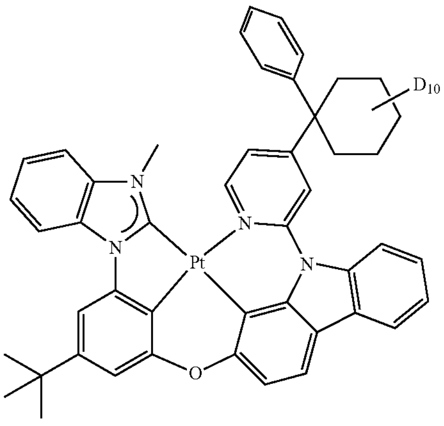

-continued
20
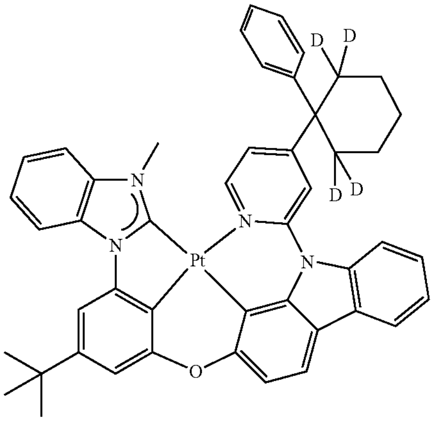
21
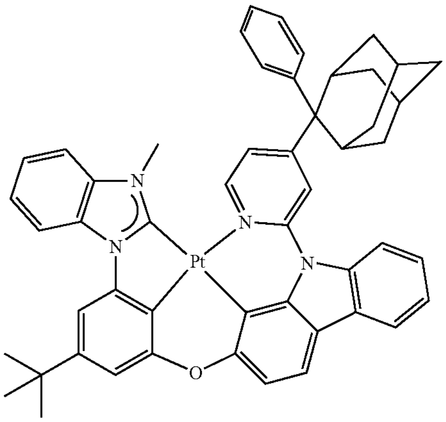
22
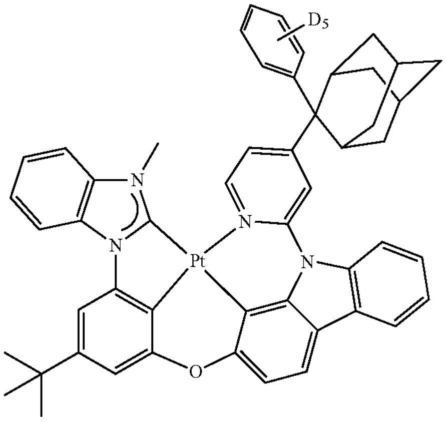
-continued
23
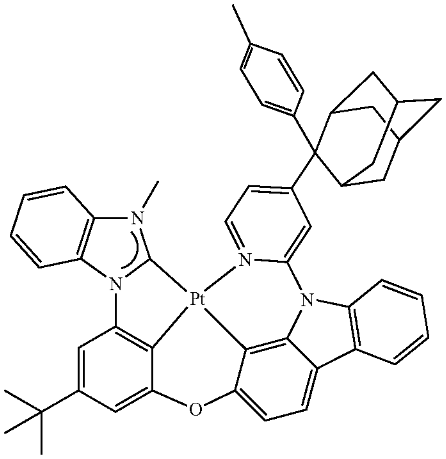
24
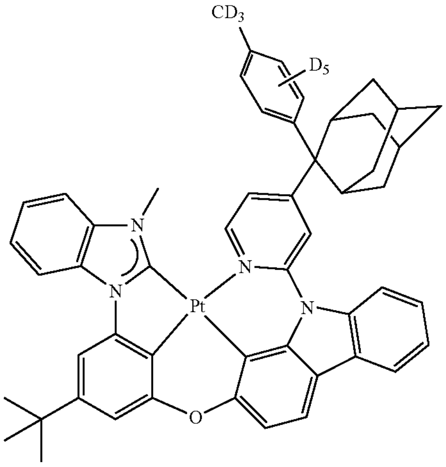
25
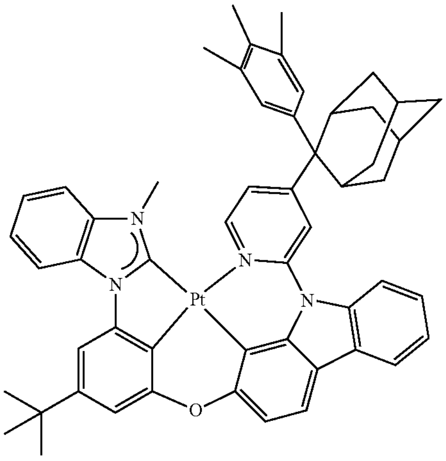

-continued
26
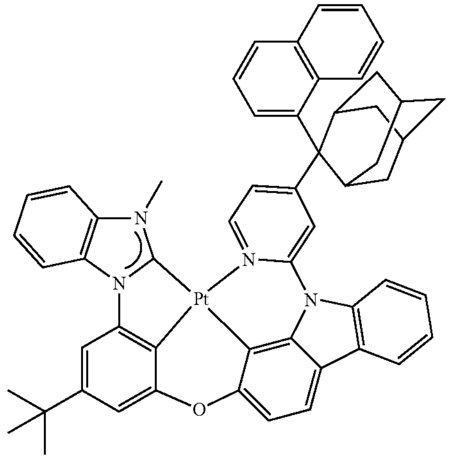
27
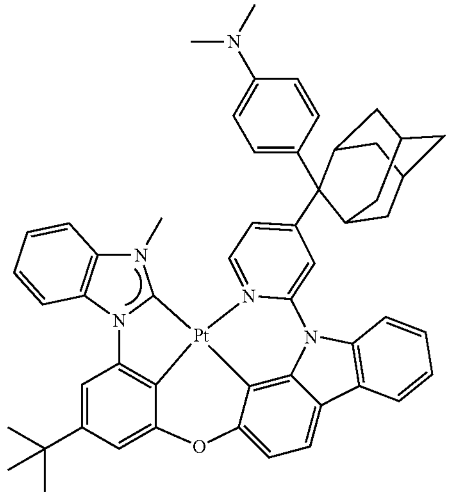
28
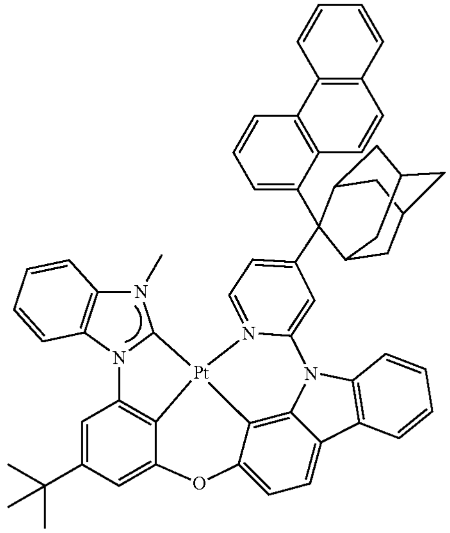
-continued
29
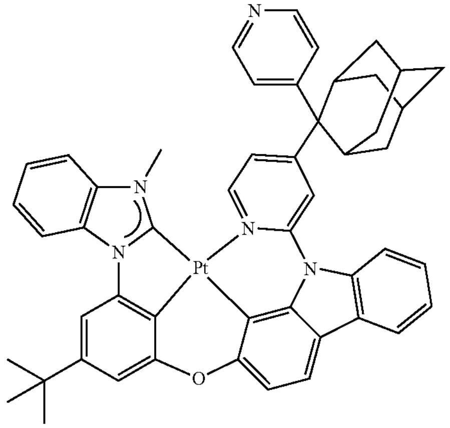
30
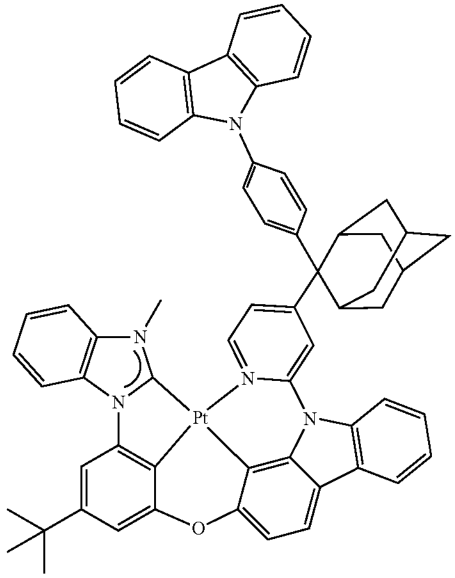
31
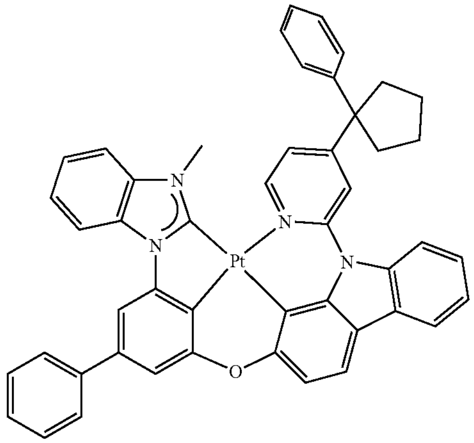

-continued
32
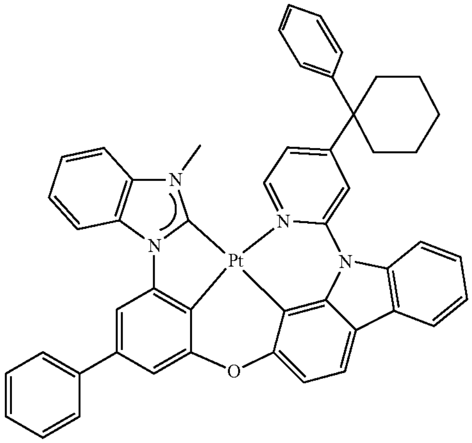
33
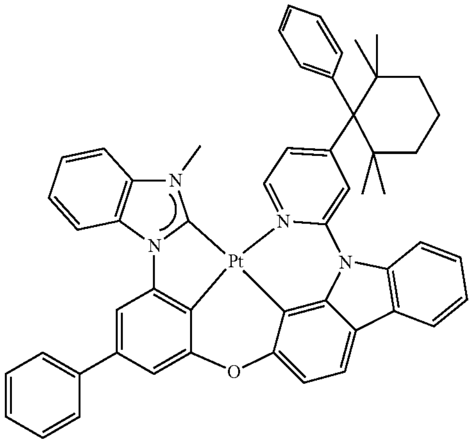
34
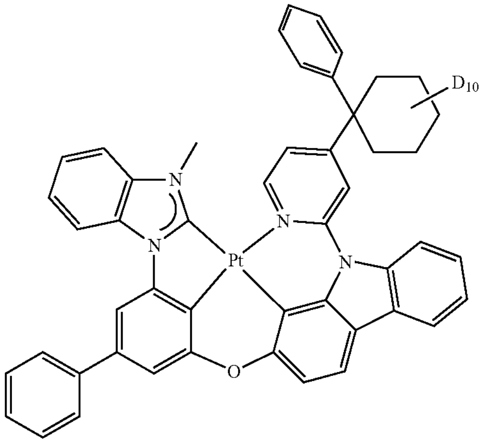
-continued
35
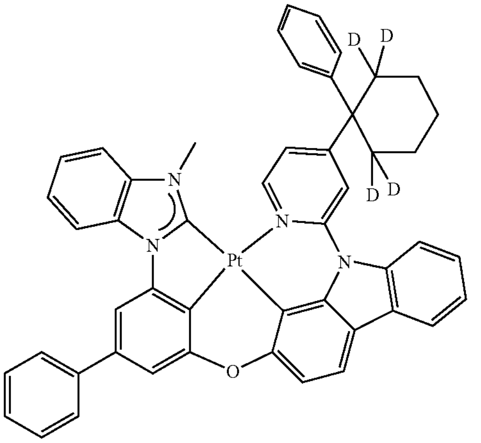
36
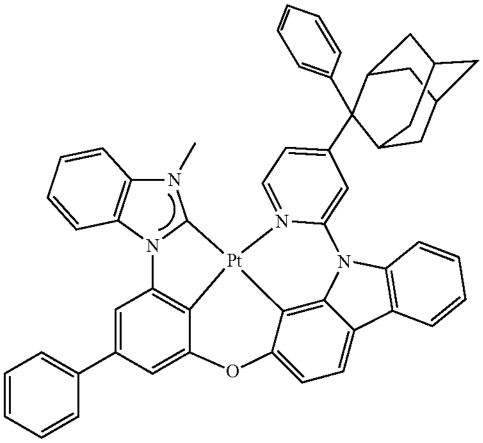
37
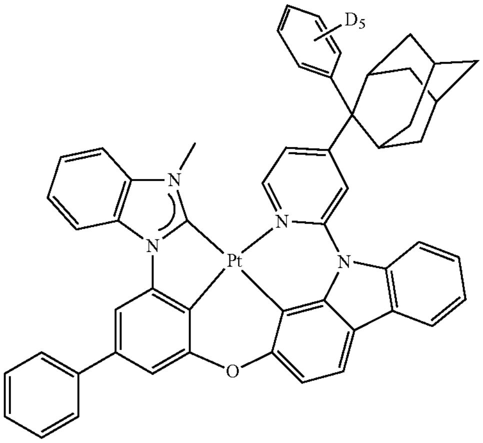

-continued
38
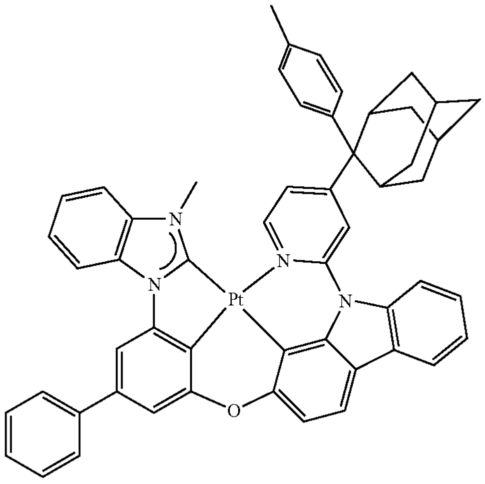
39
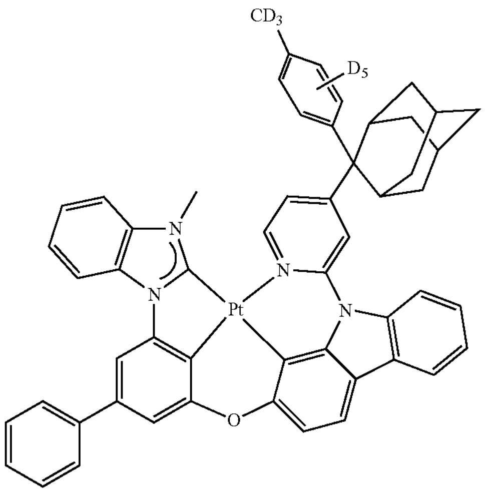
40
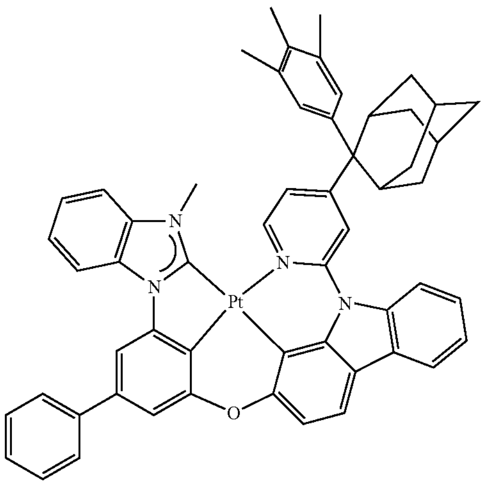
-continued
41
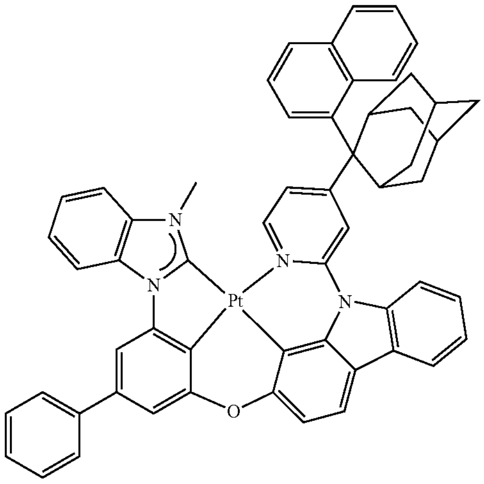
42
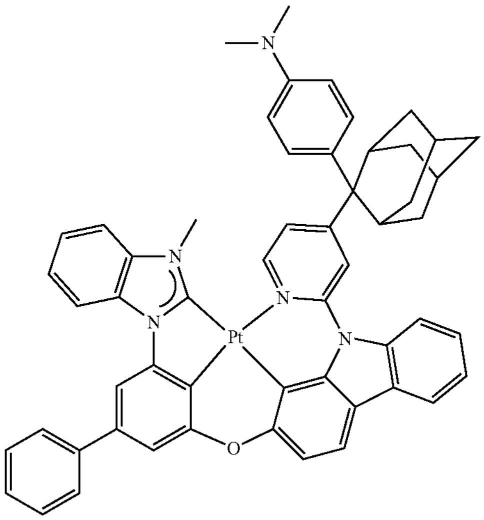
43
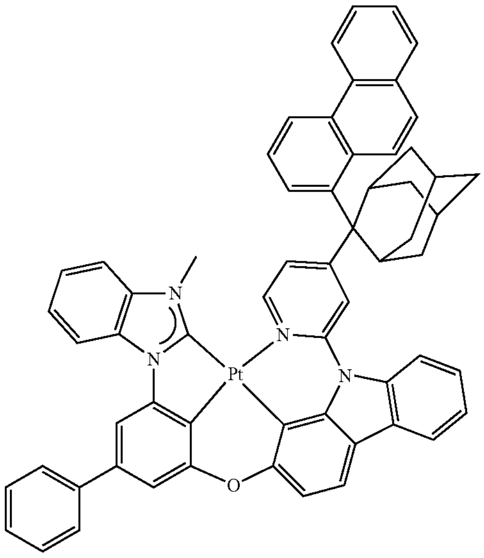

-continued
44
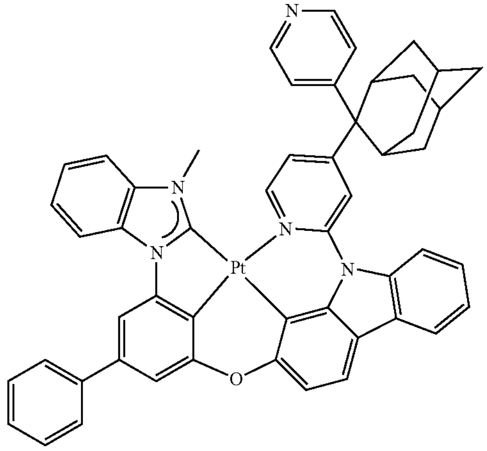
45
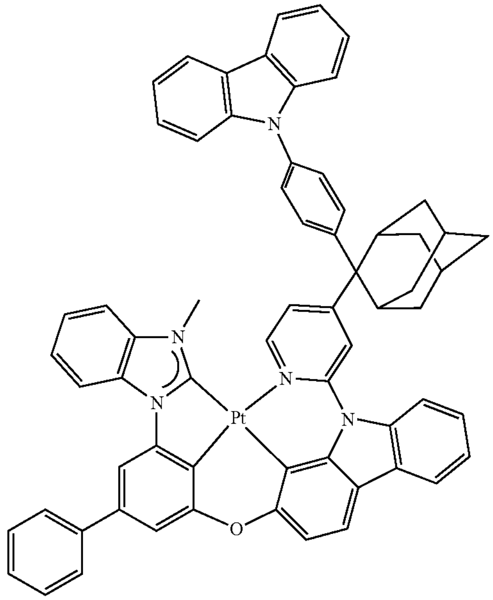
46
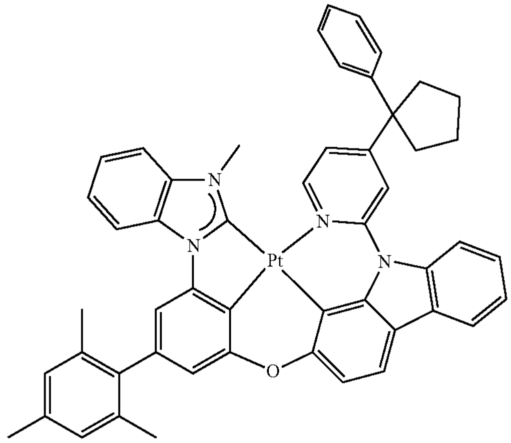
-continued
47
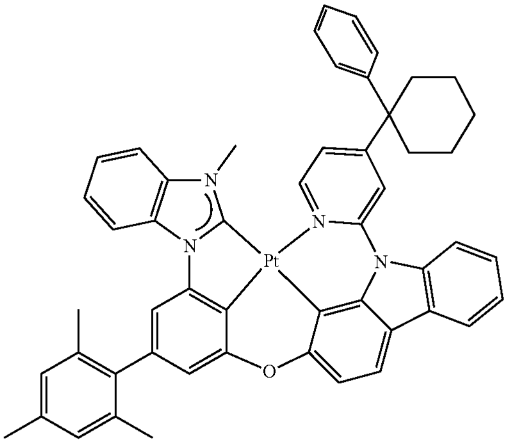
48
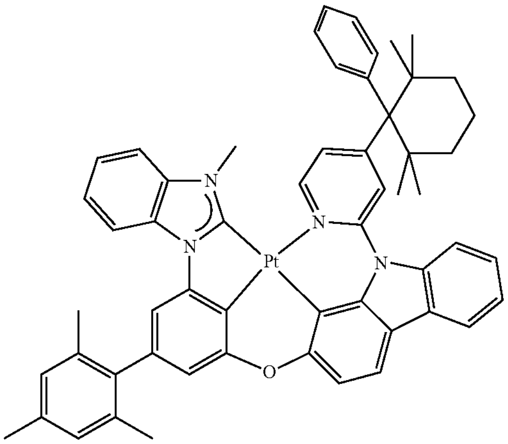
49
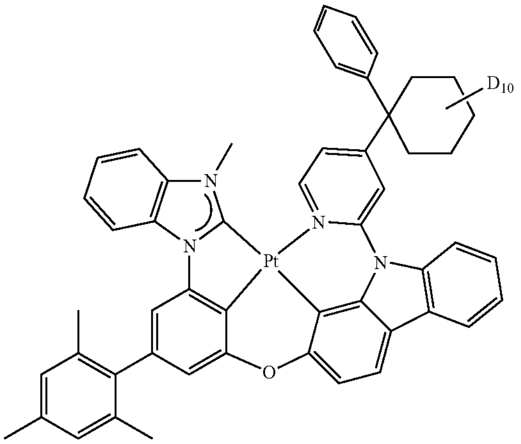

50
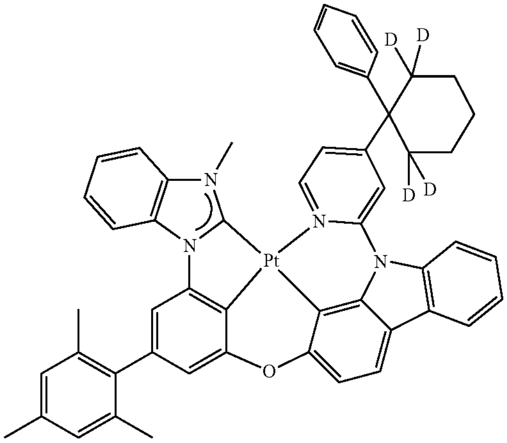
51
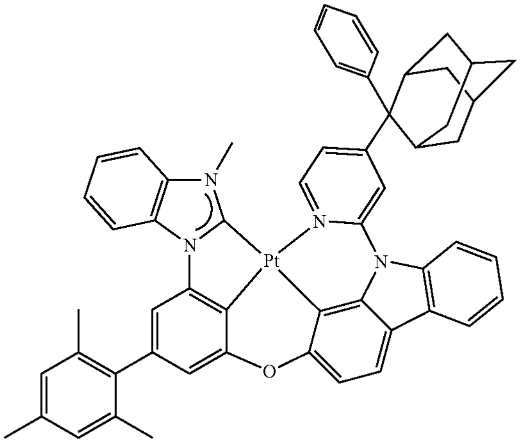
52
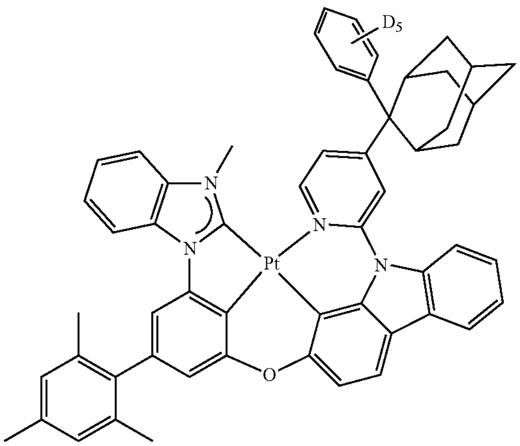
53
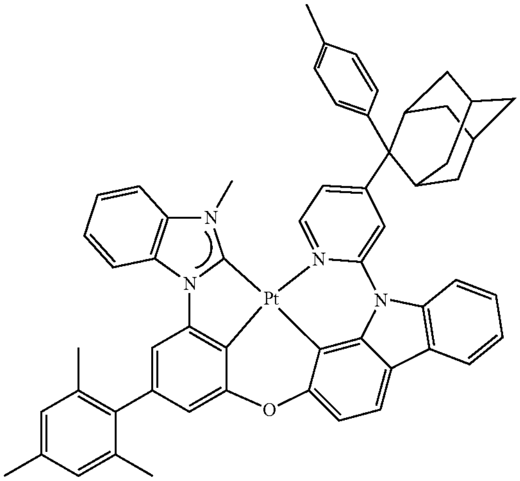
54
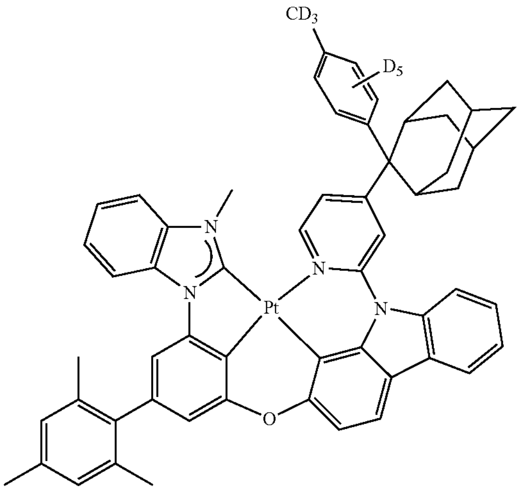
55
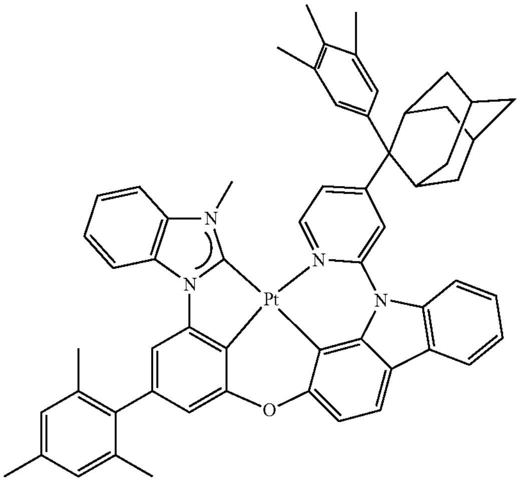

-continued
56
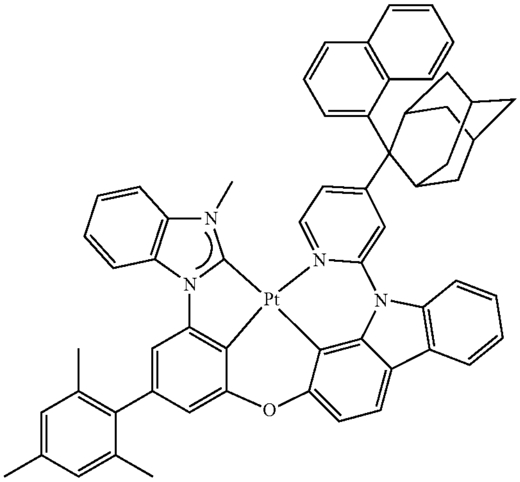
57
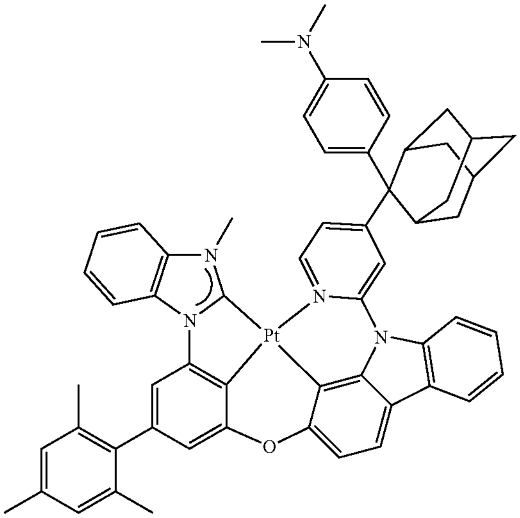
58
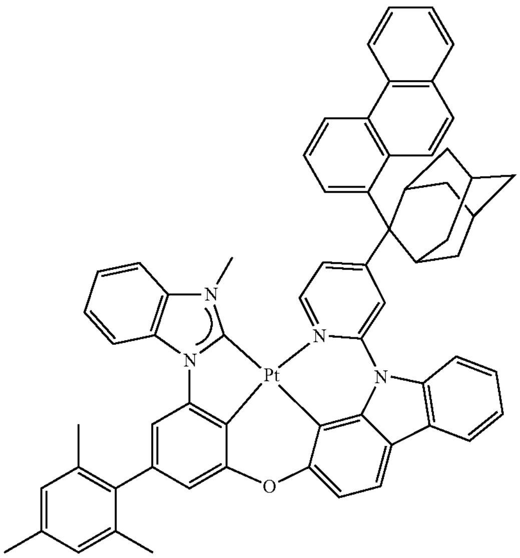
59
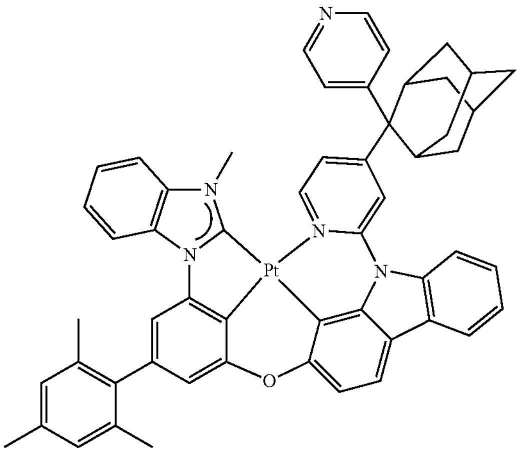
60
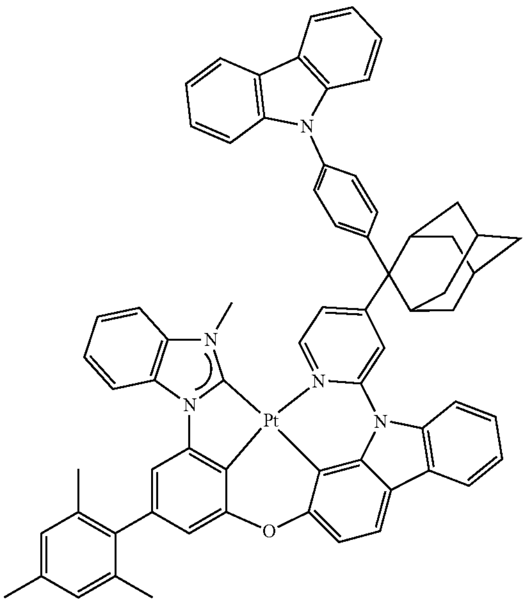
61
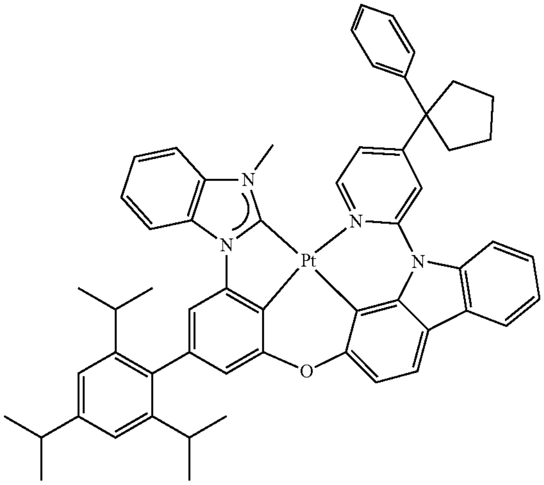

-continued
62
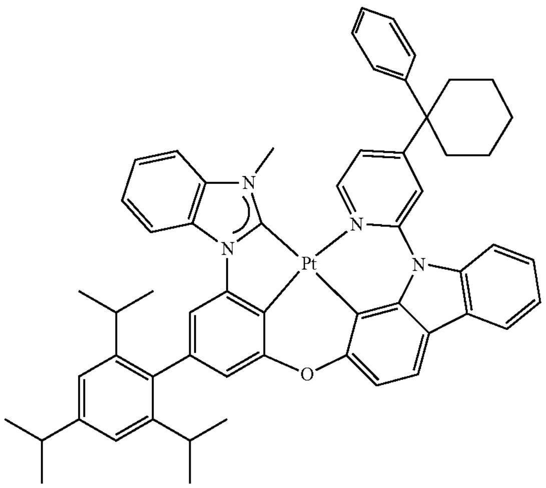
63
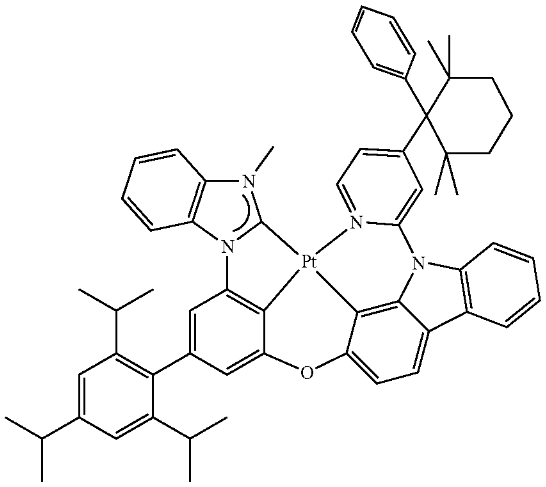
64
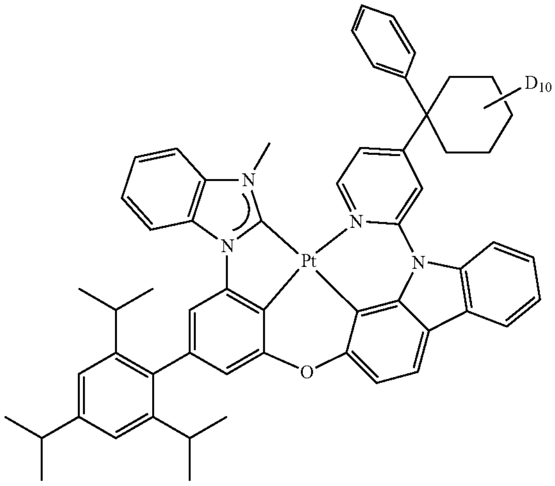
-continued
65
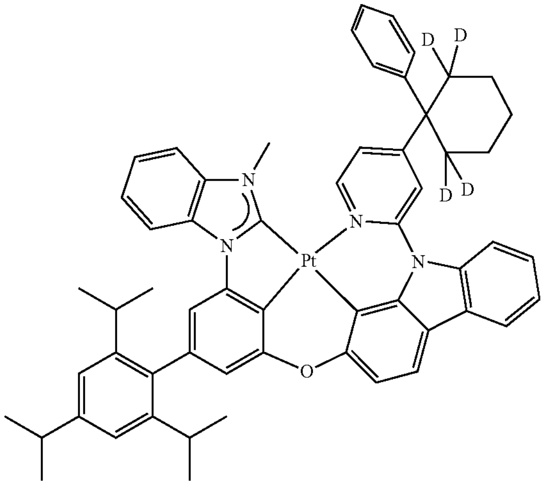
66
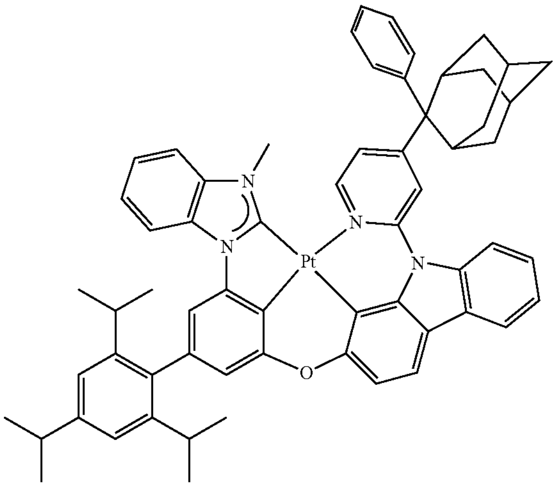
67
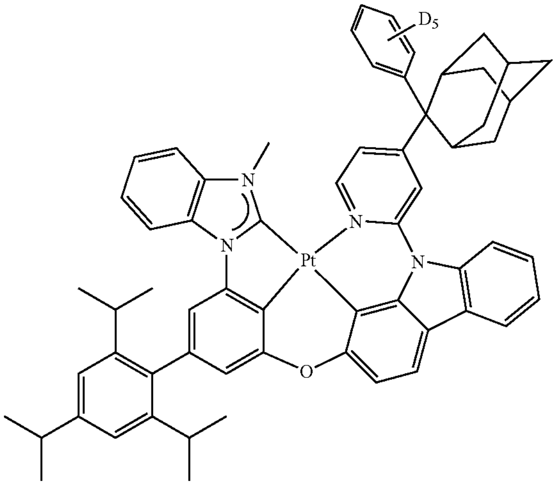

-continued
68
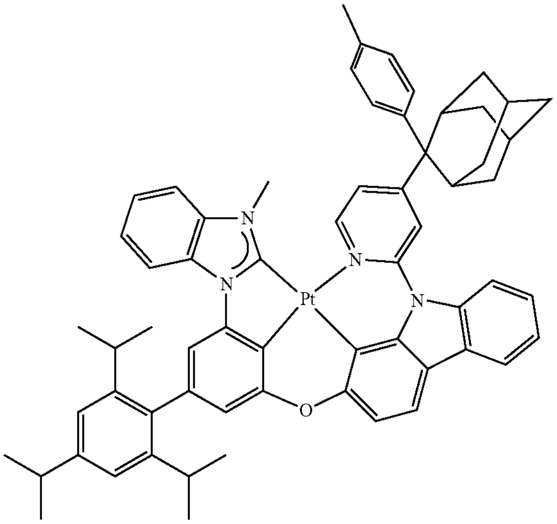
69
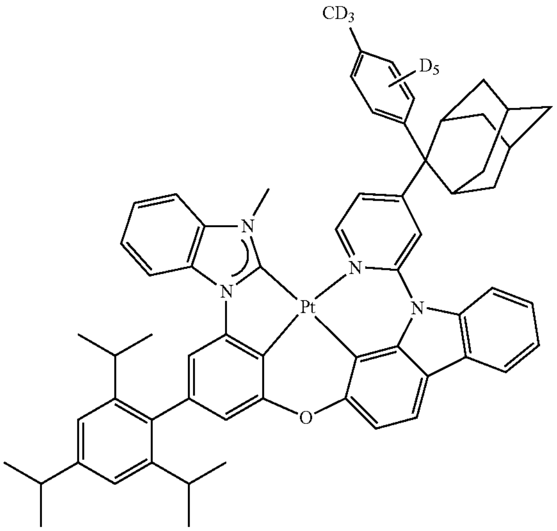
70
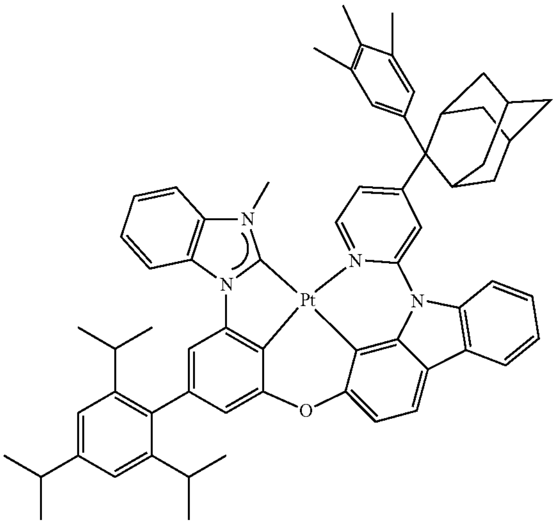
-continued
71
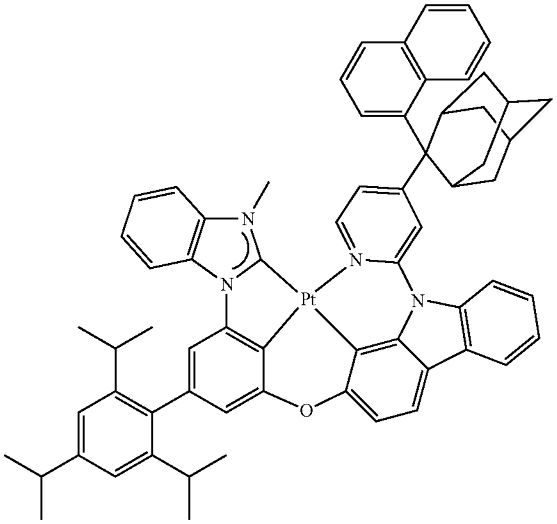
72
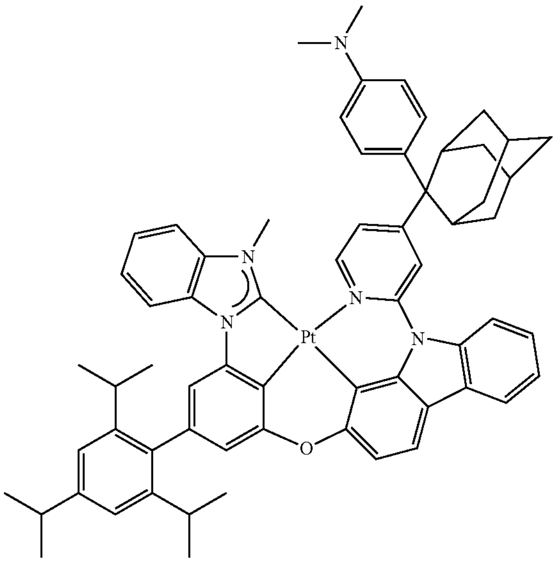

-continued
73
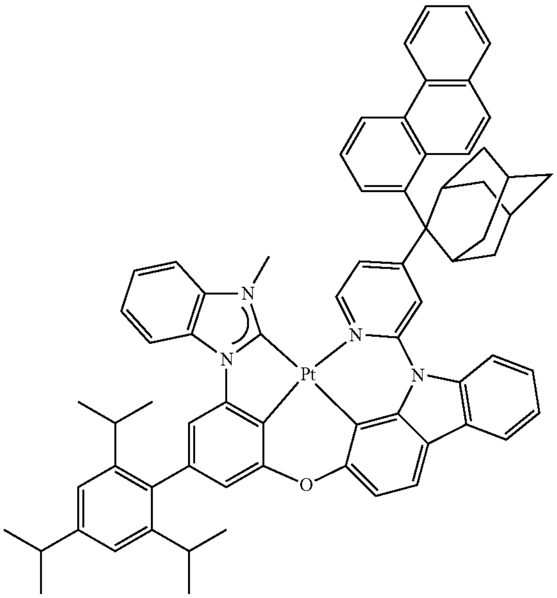
74
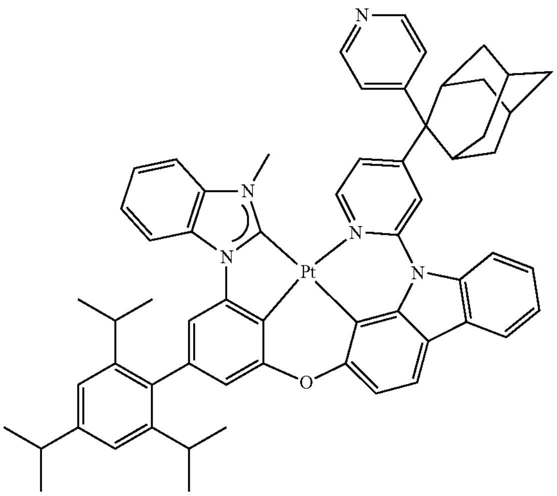
-continued
75
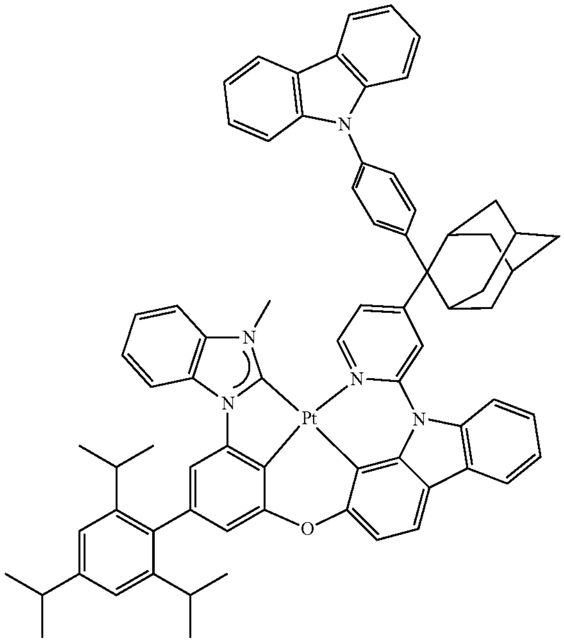
76
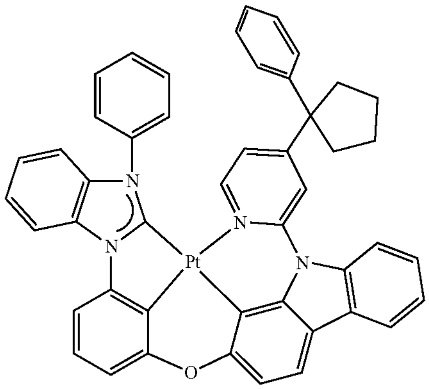
77
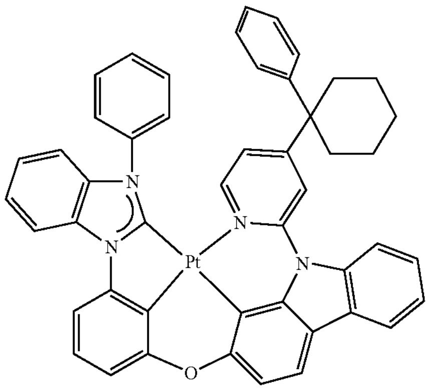

-continued
78
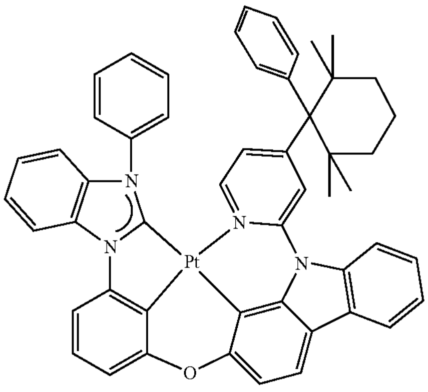
79
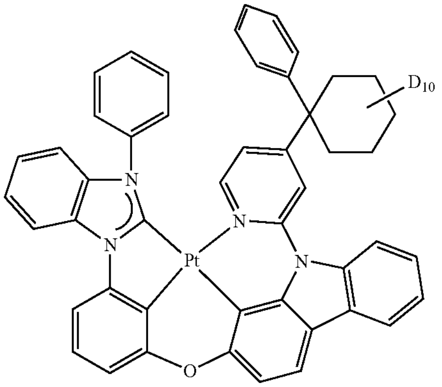
80
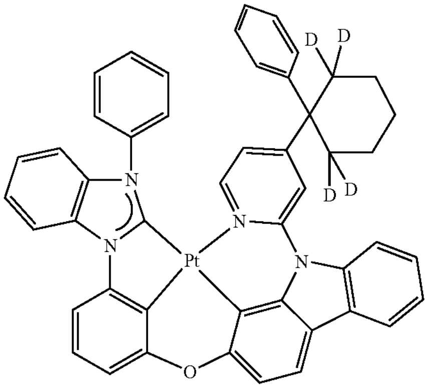
81
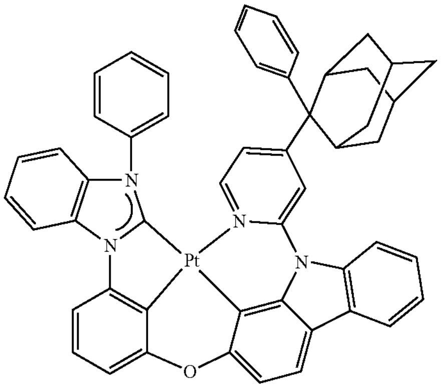
-continued
82
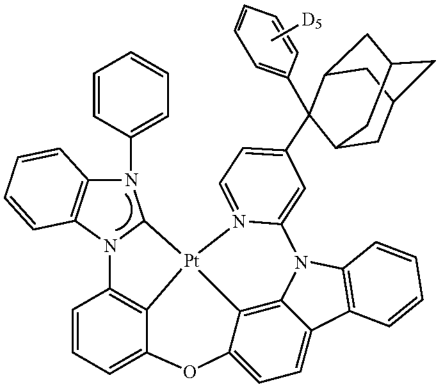
83
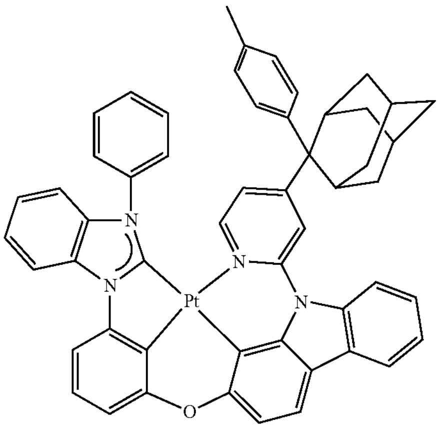
84
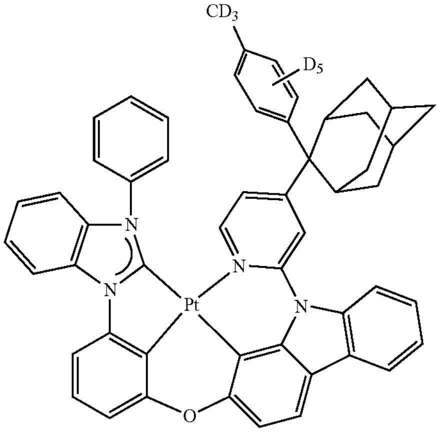

-continued
85
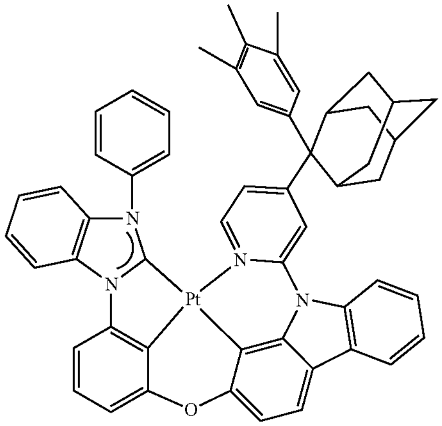
86
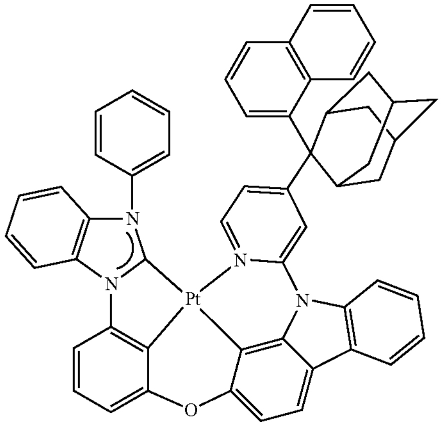
87
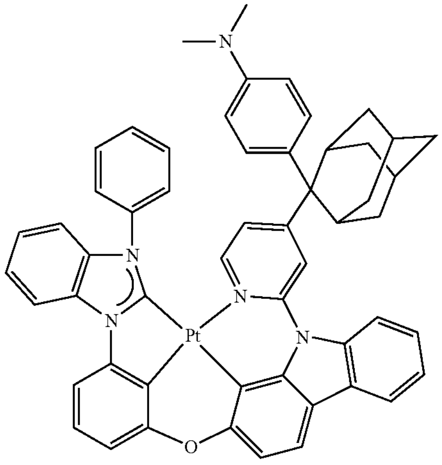
-continued
88
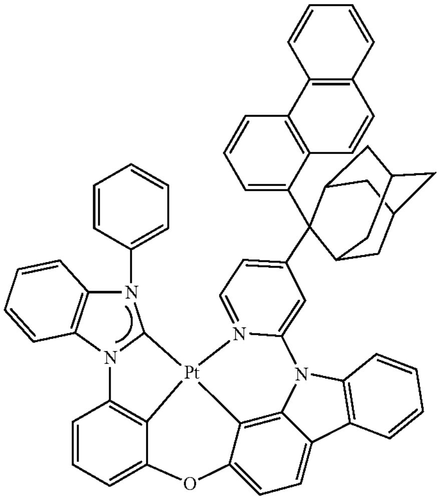
89
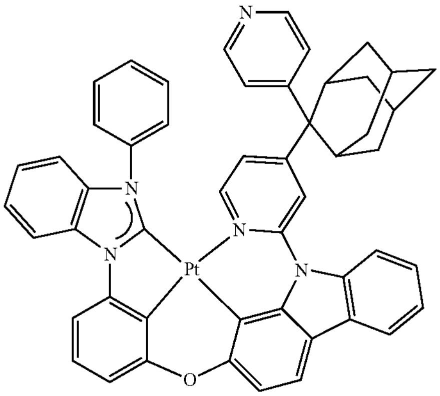
90
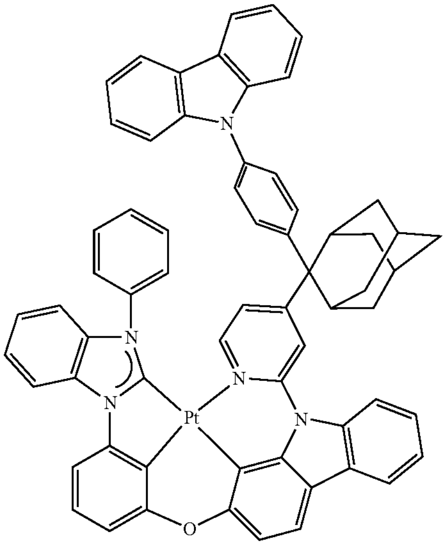

-continued
91
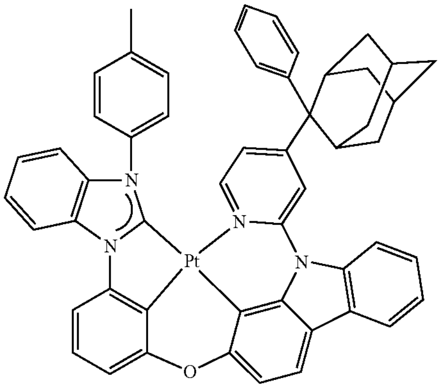
92
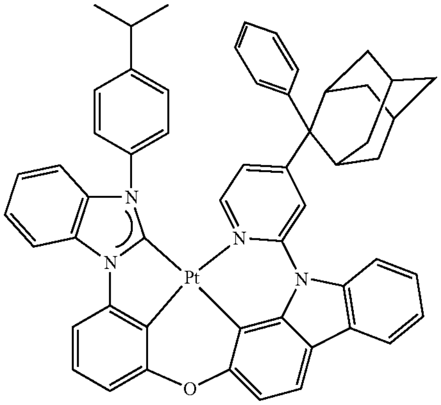
93
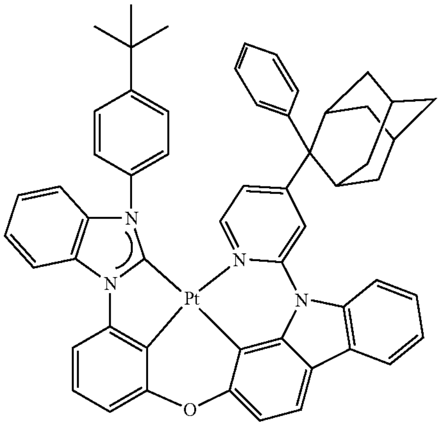
94
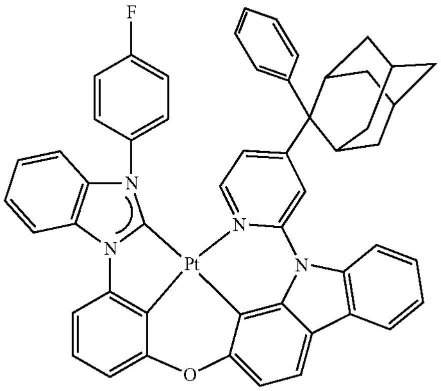
-continued
95
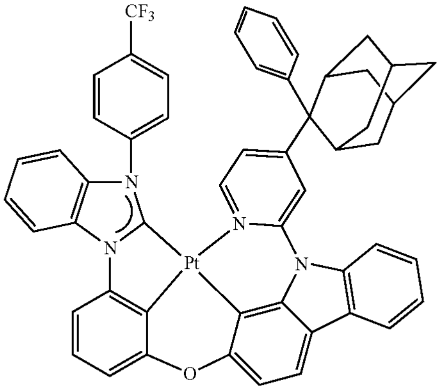
96
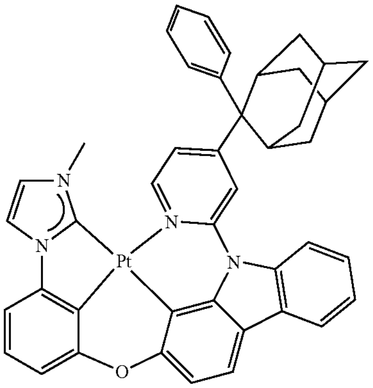
97
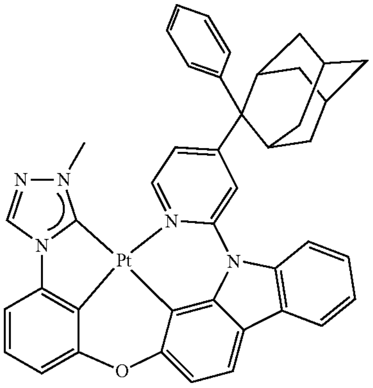
98
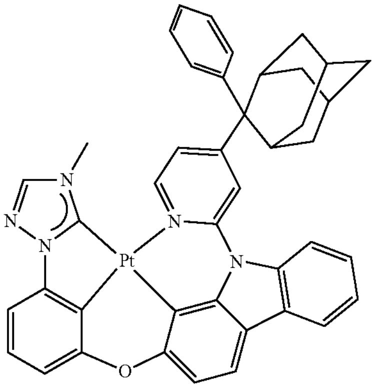

-continued
99
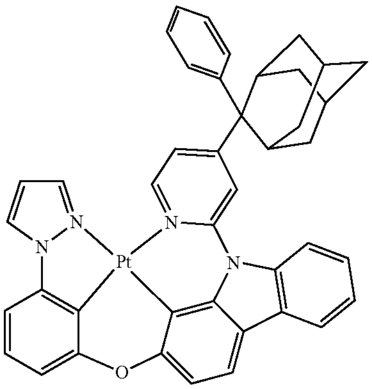
100
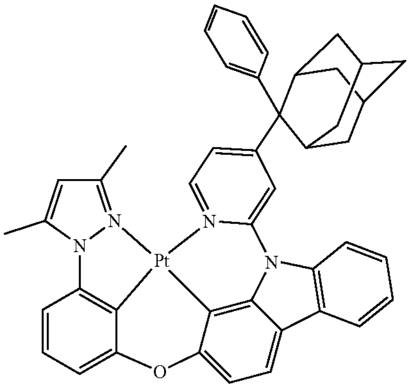
101
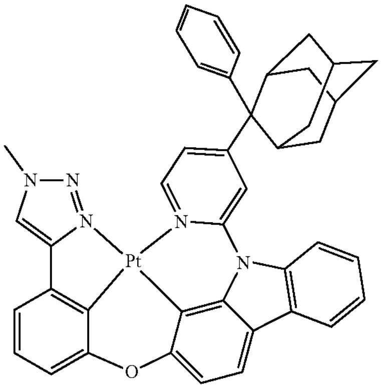
102
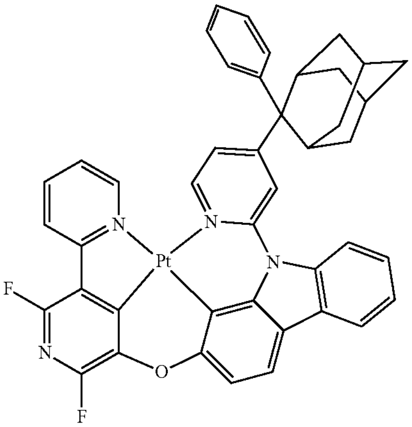
-continued
103
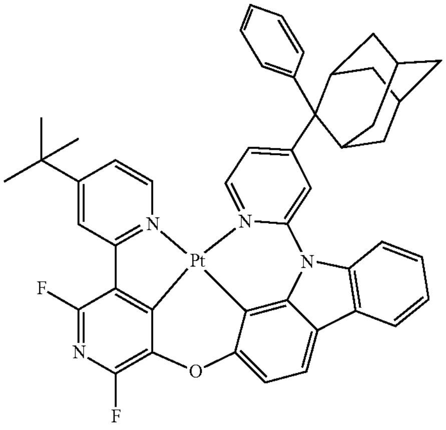
104
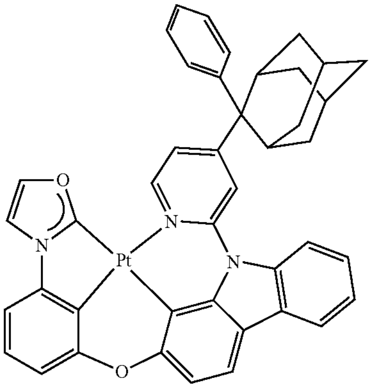
105
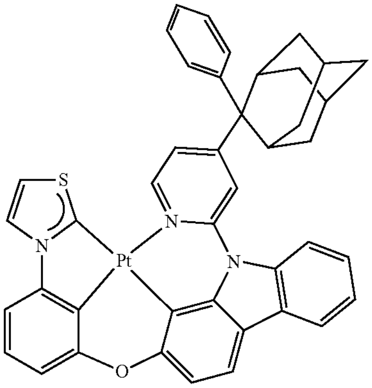
106
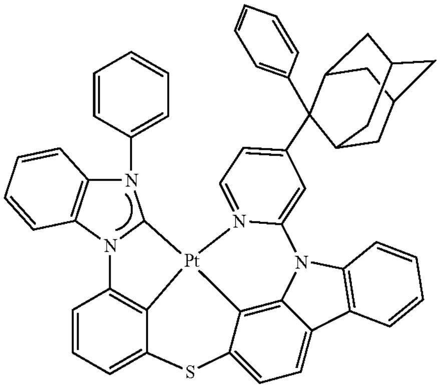

-continued
107
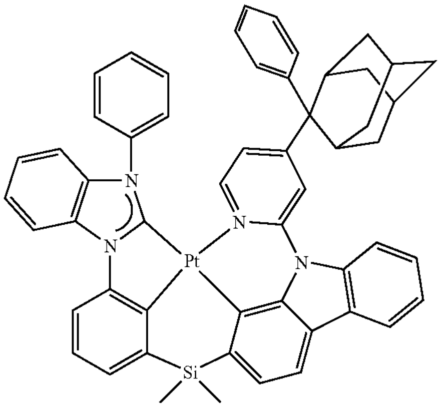
108
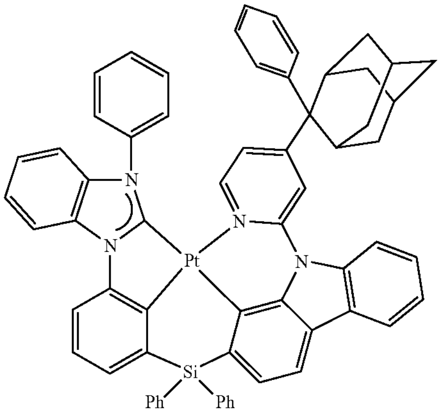
109
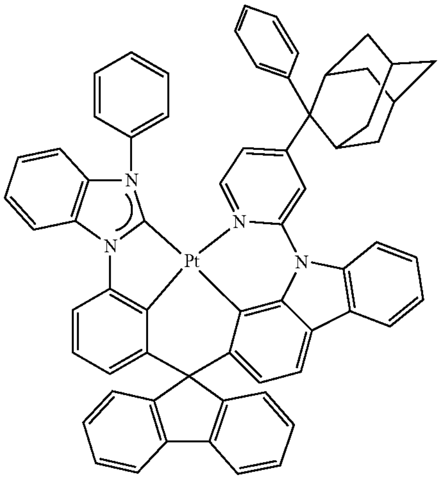
-continued
110
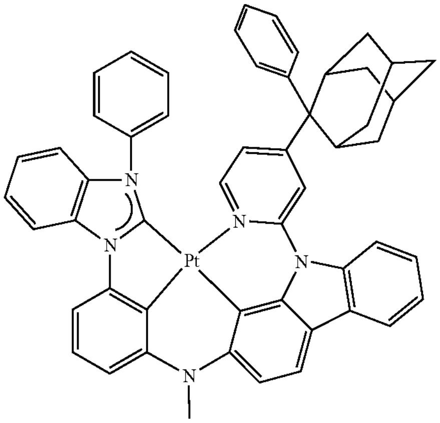
111
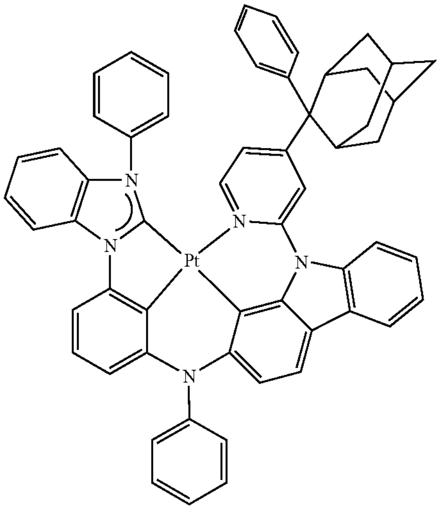
112
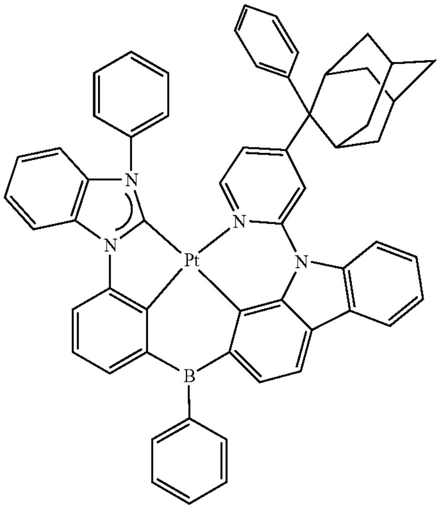

-continued
113
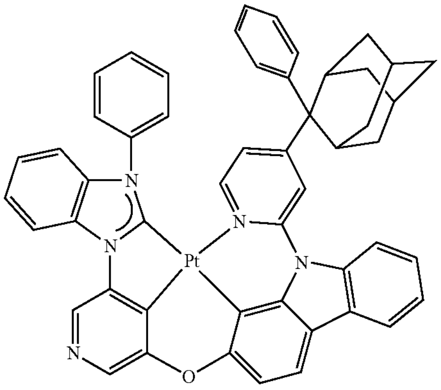
114
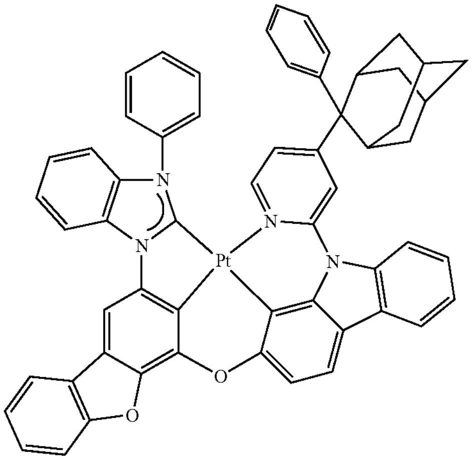
115
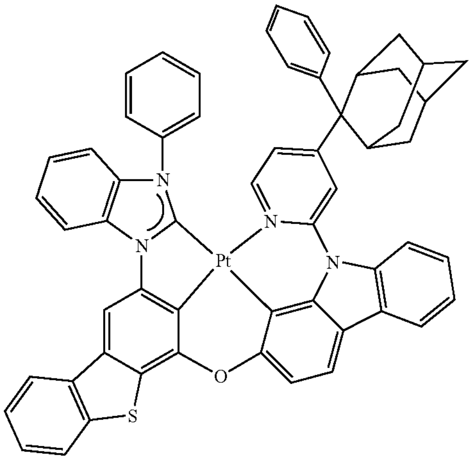
-continued
116
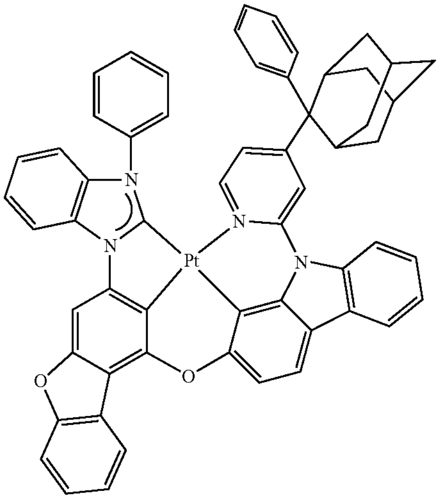
117
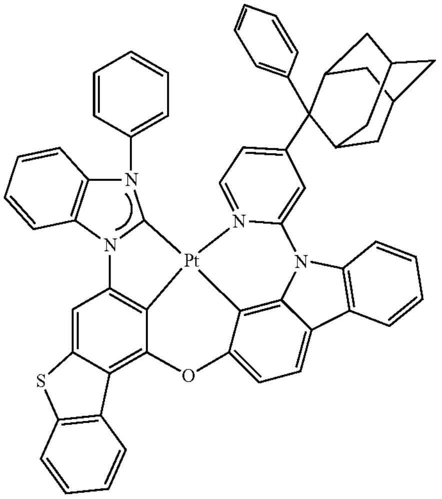
118
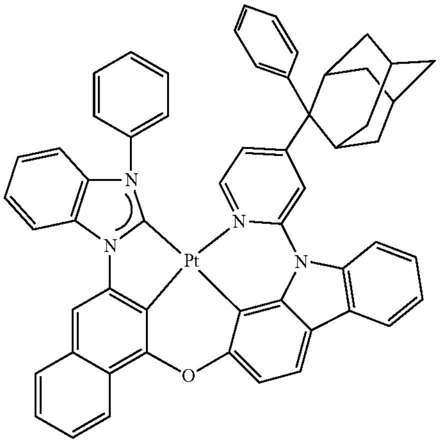

-continued
119
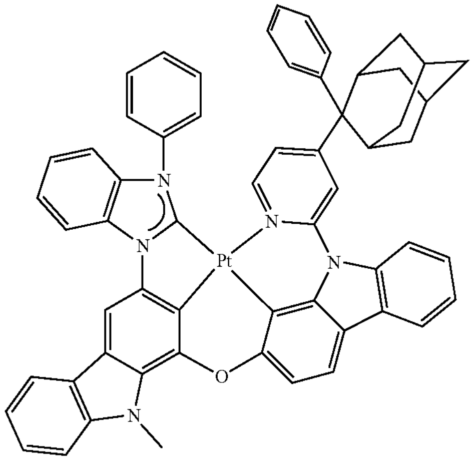
120
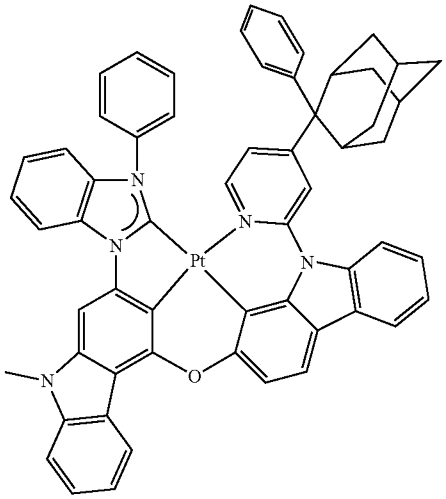
.
In one or more embodiments, the second compound may include (e.g., may be) at least one of Compounds ETH1 to ETH84:
ETH1
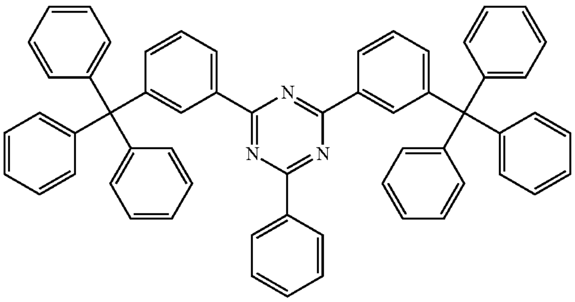
-continued
ETH2
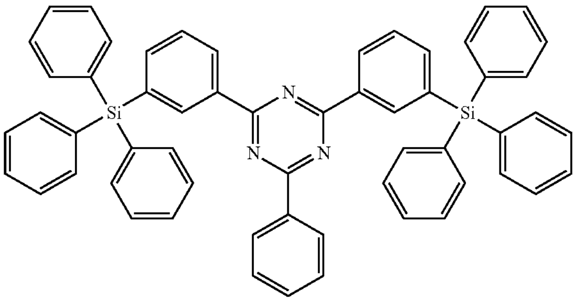
ETH3
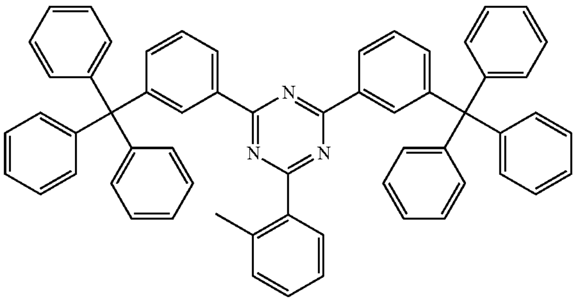
ETH4
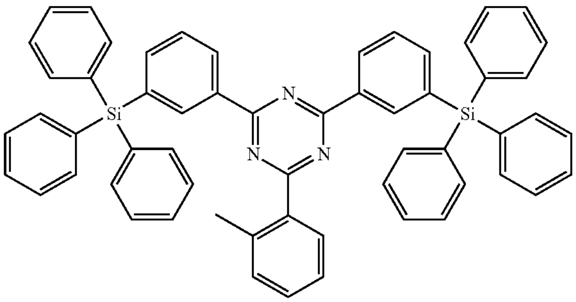
ETH5
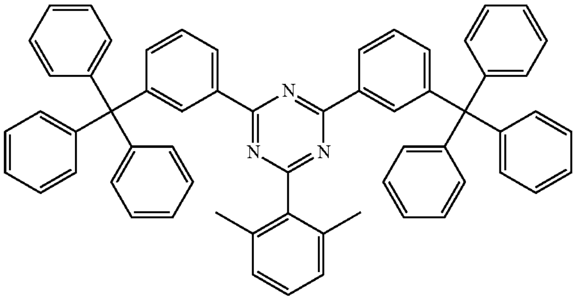
ETH6
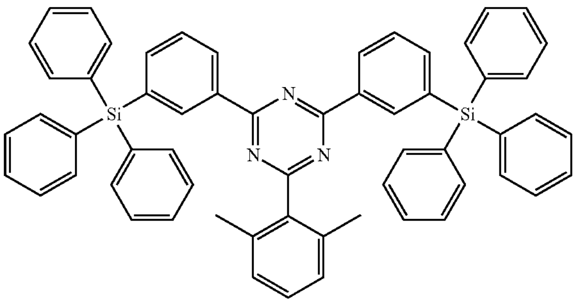

-continued
ETH7
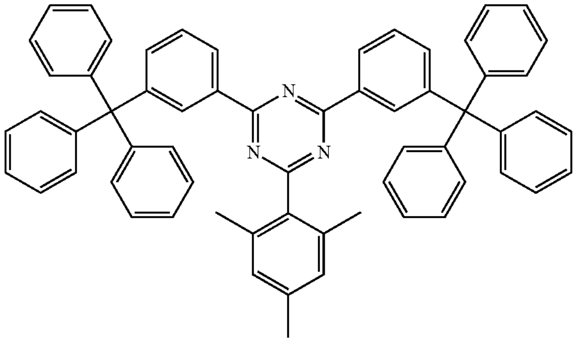
ETH8
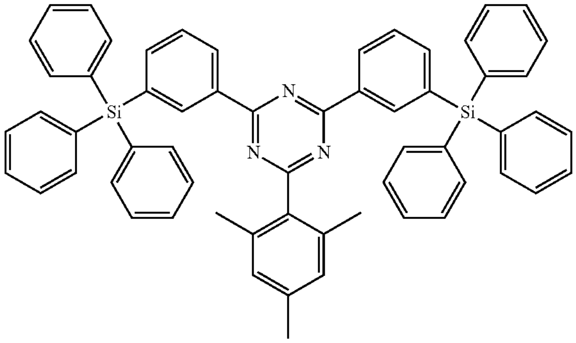
ETH9
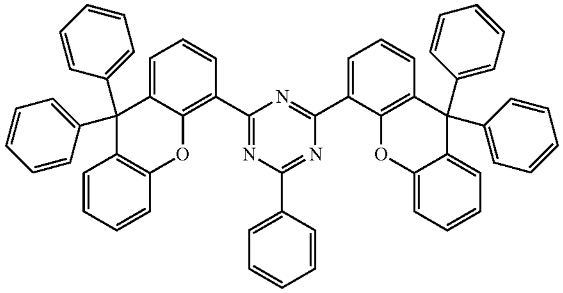
ETH10
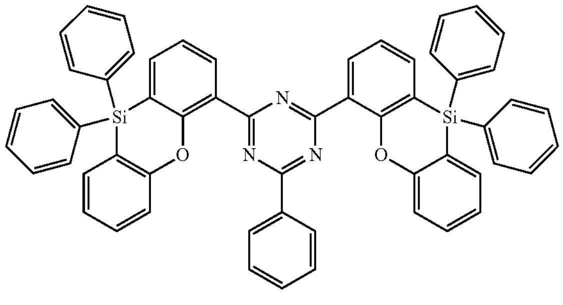
-continued
ETH11
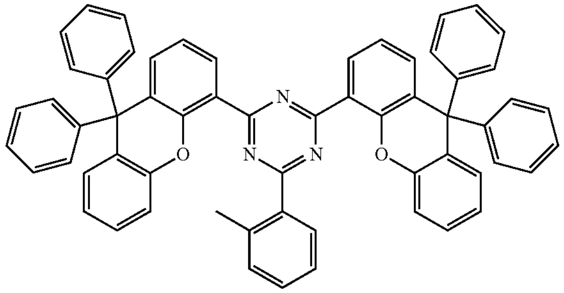
ETH12
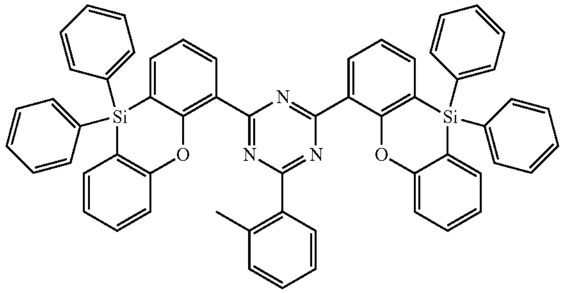
ETH13
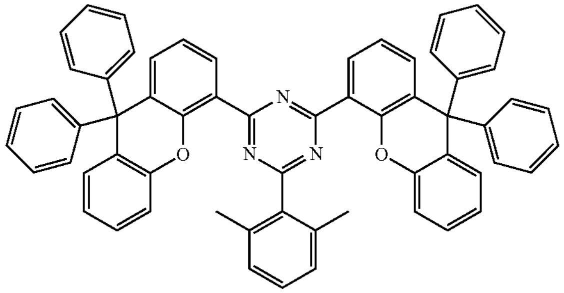
ETH14
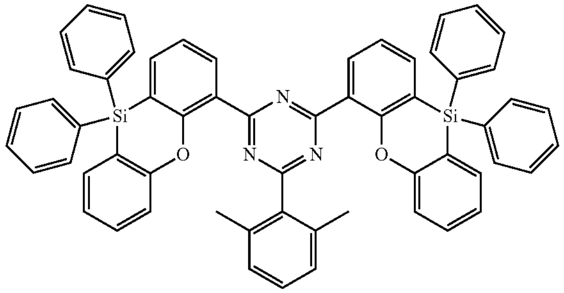
ETH15
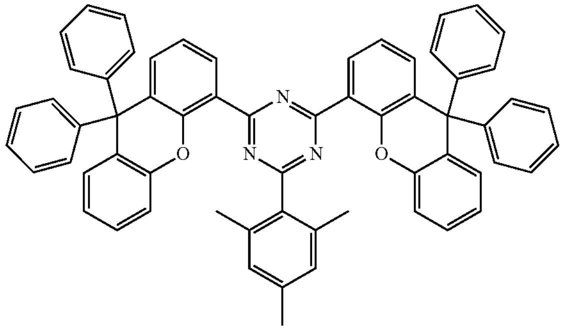

-continued
ETH15
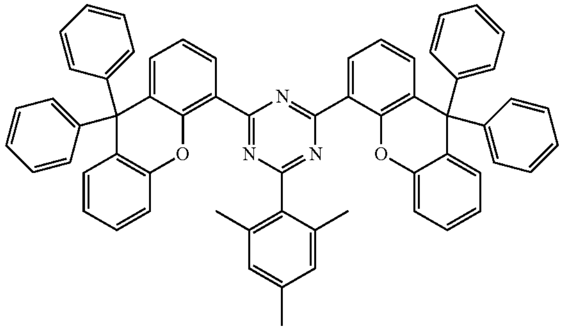
ETH16
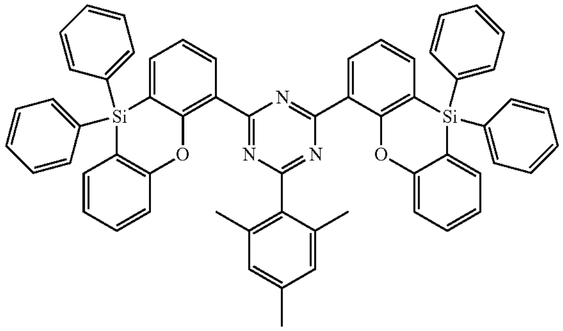
ETH17
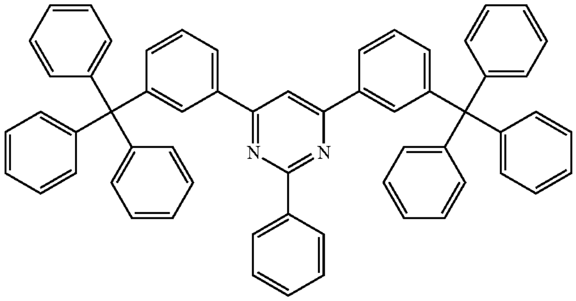
ETH18
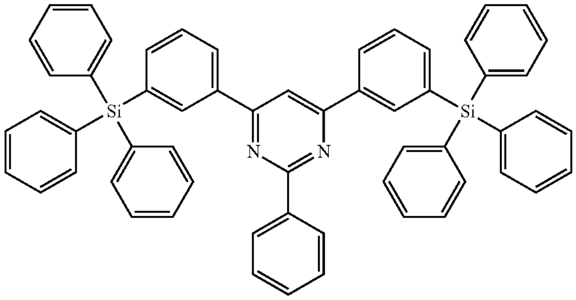
-continued
ETH19
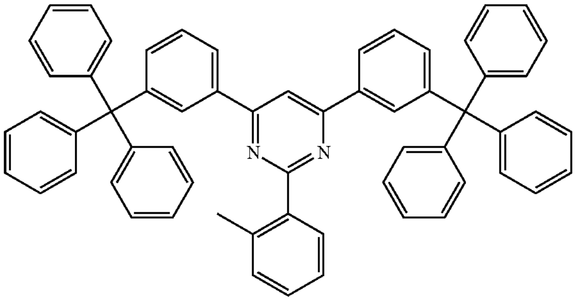
ETH20
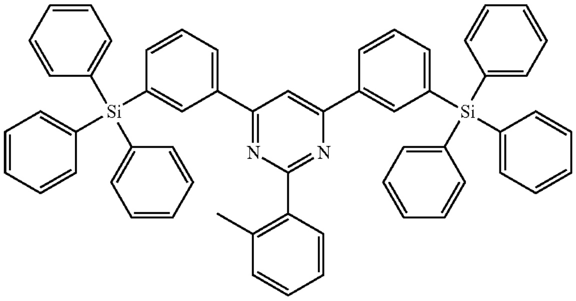
ETH21
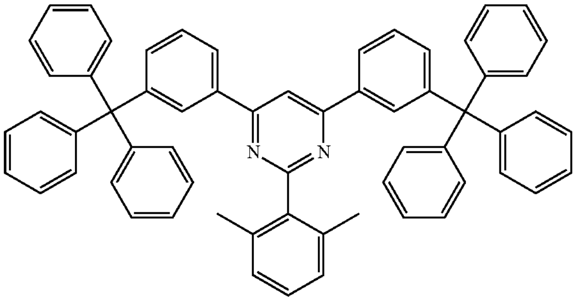
ETH22
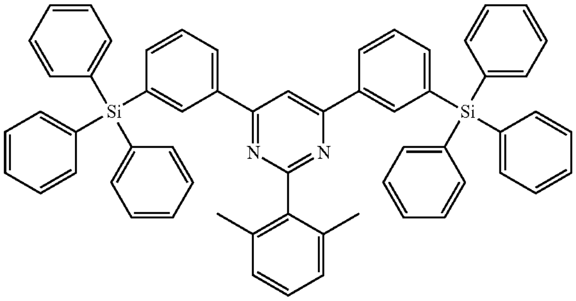

-continued
ETH23
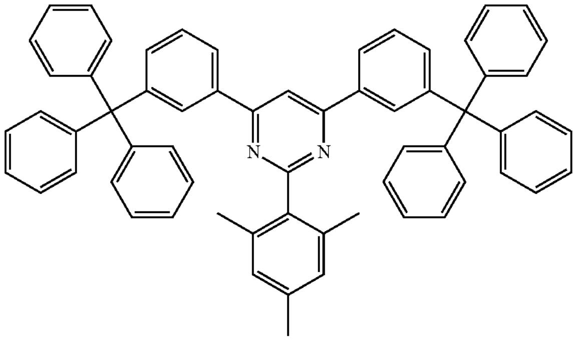
ETH24
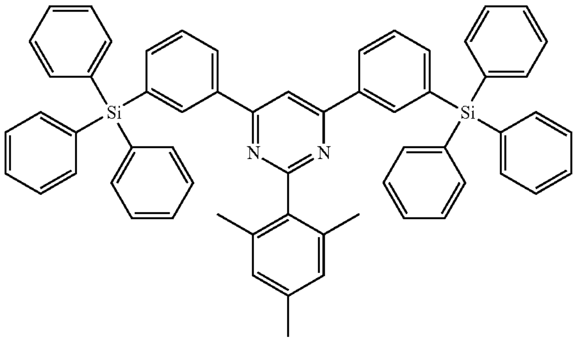
ETH25
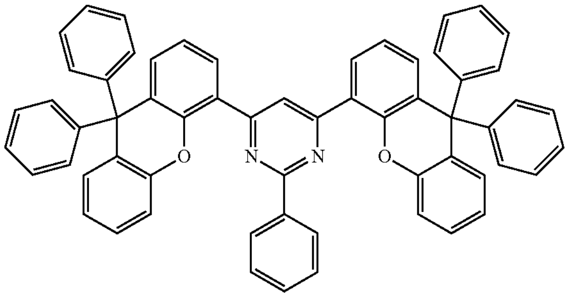
ETH26
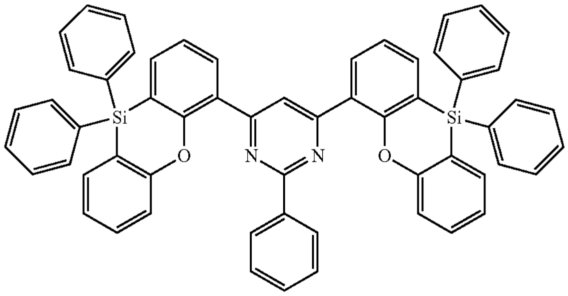
-continued
ETH27
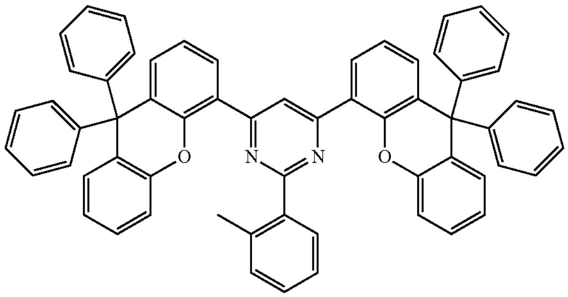
ETH28
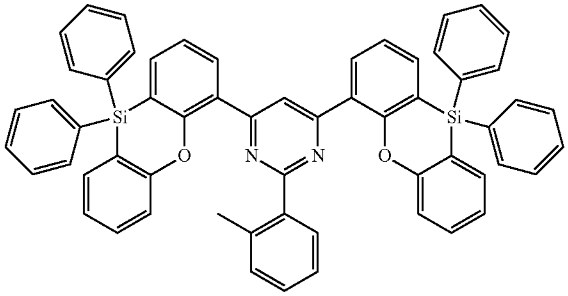
ETH29
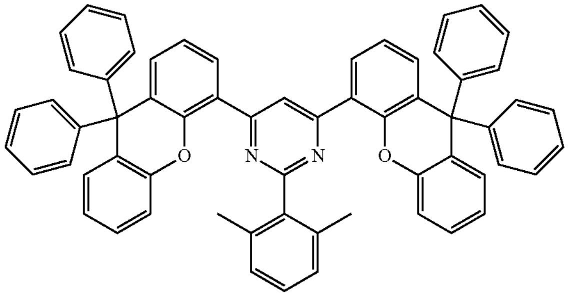
ETH30
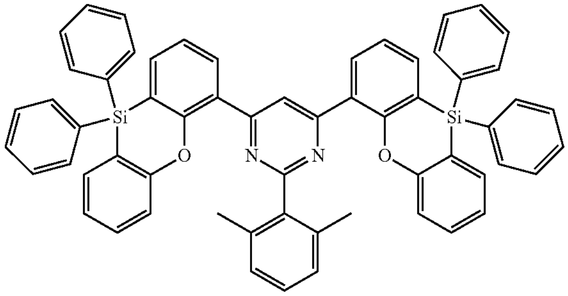
ETH31
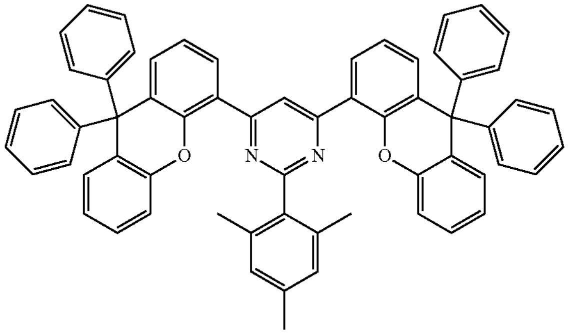

-continued
ETH32
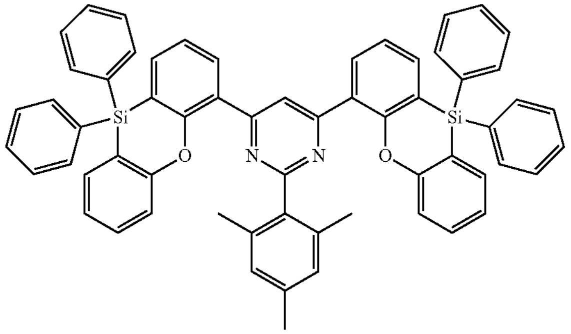
ETH33
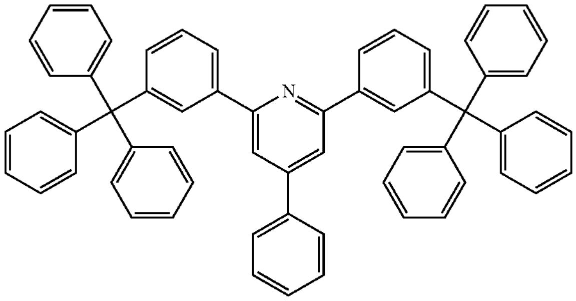
ETH34
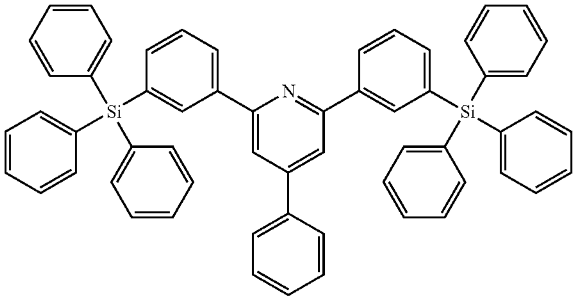
ETH35
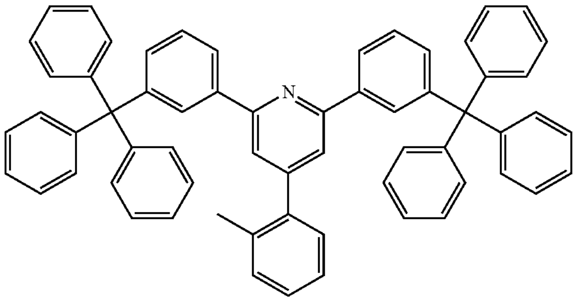
-continued
ETH36
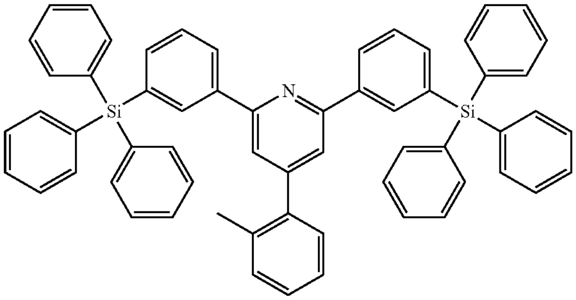
ETH37
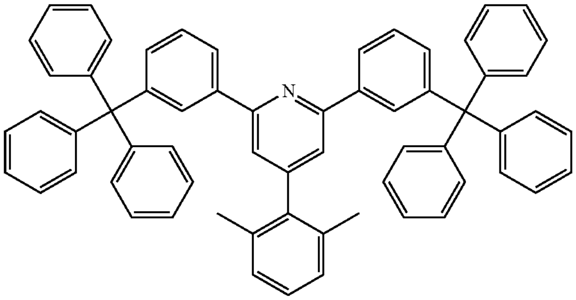
ETH38
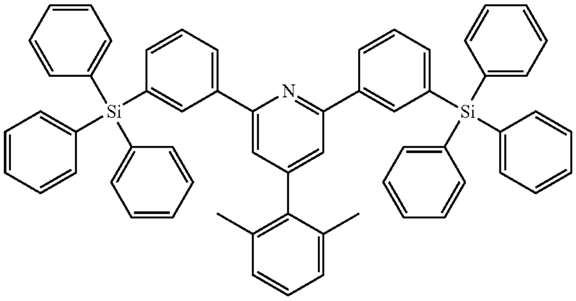
ETH39
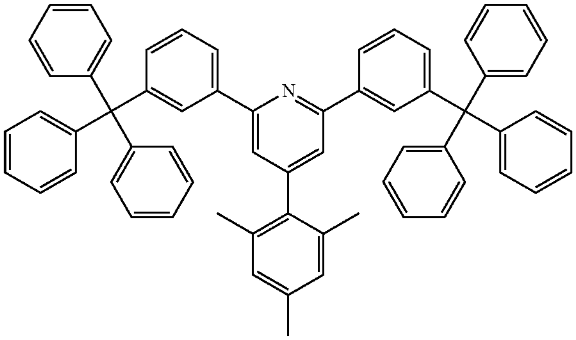

-continued
ETH40
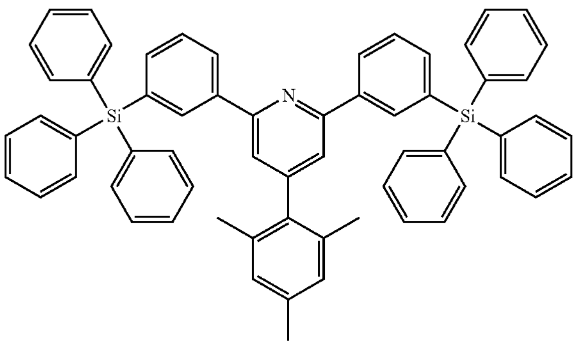
ETH41
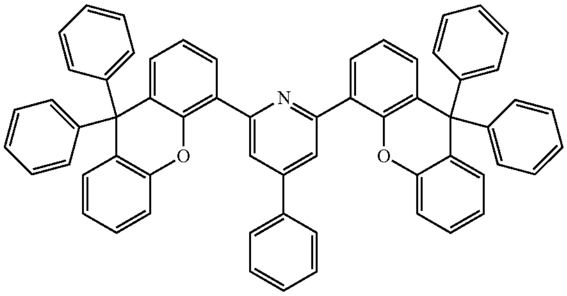
ETH42
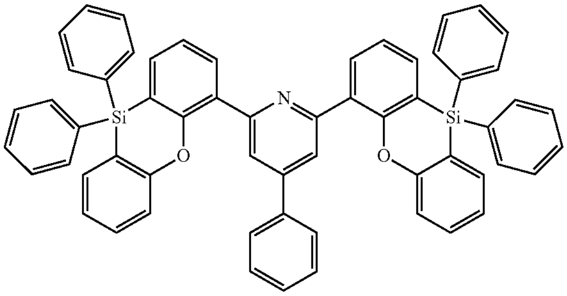
ETH43
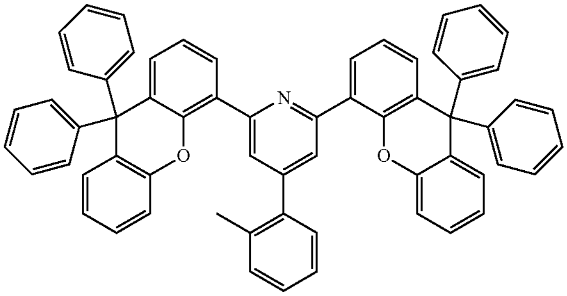
ETH44
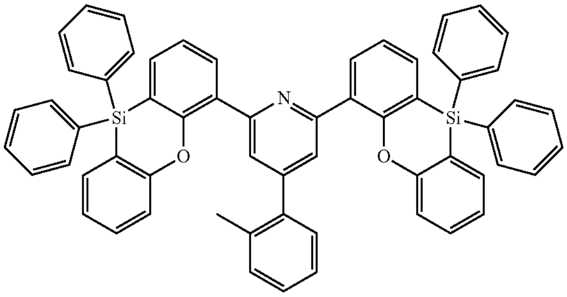
-continued
ETH45
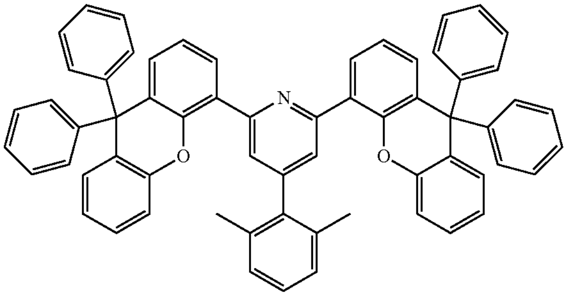
ETH46
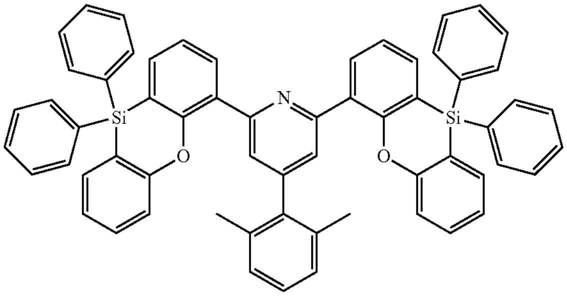
ETH47
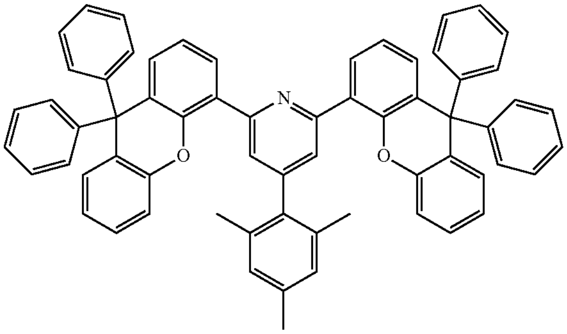
ETH48
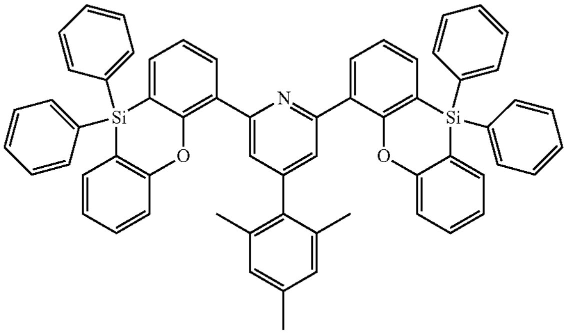

-continued
ETH49
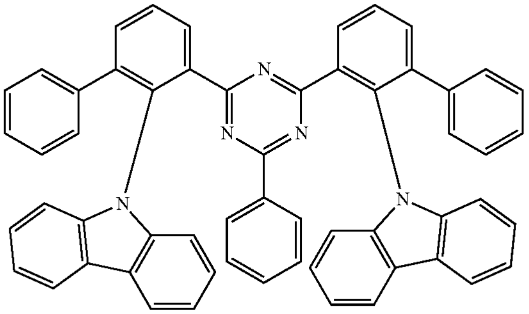
ETH50
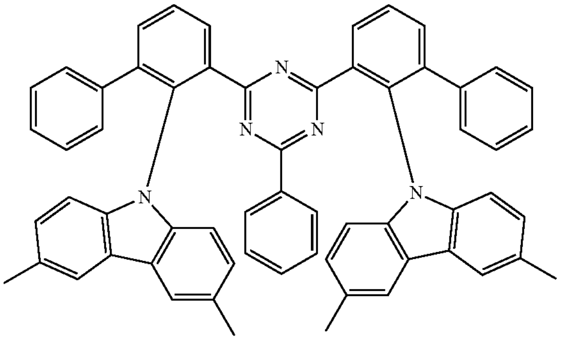
ETH51
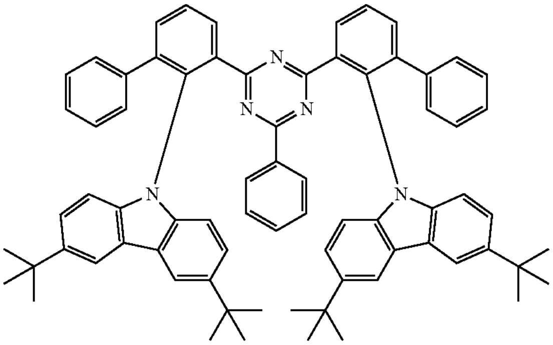
ETH52
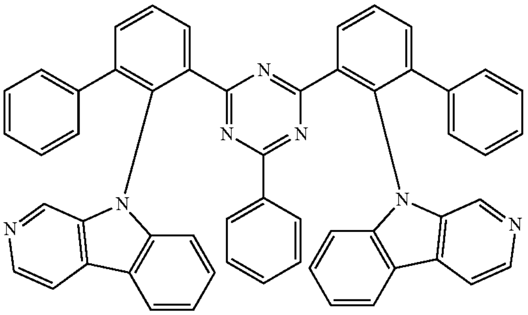
-continued
ETH53
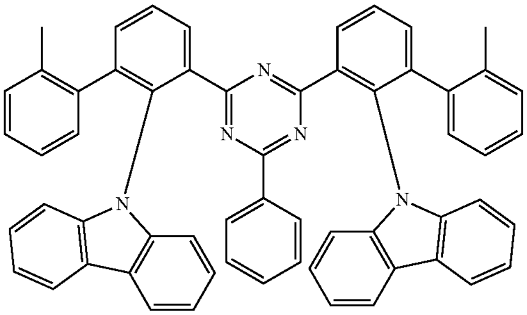
ETH54
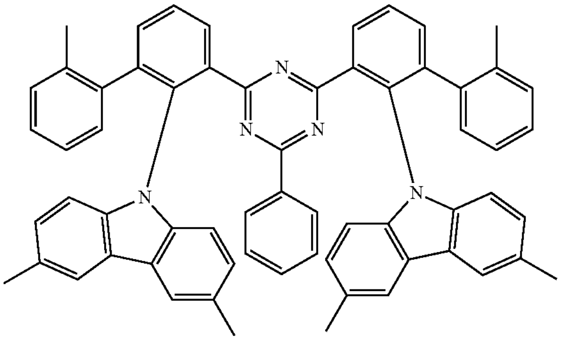
ETH55
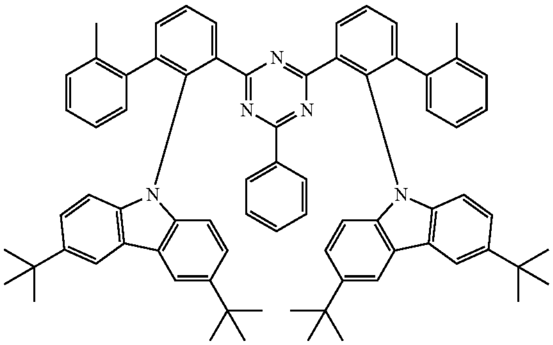
ETH56
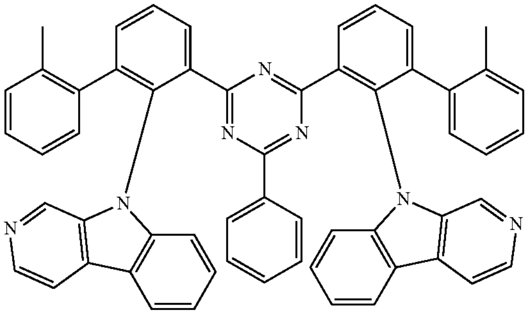

-continued
ETH57
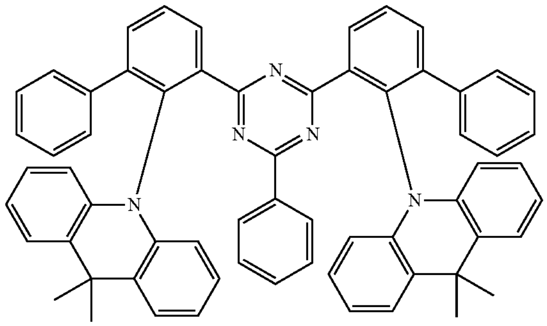
ETH58
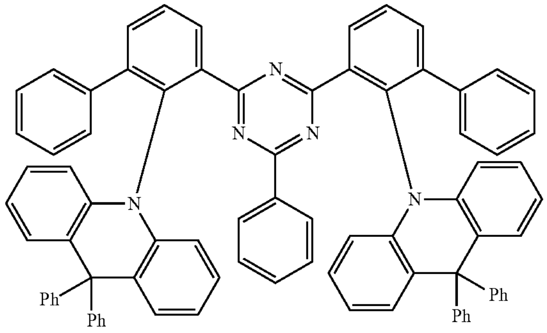
ETH59
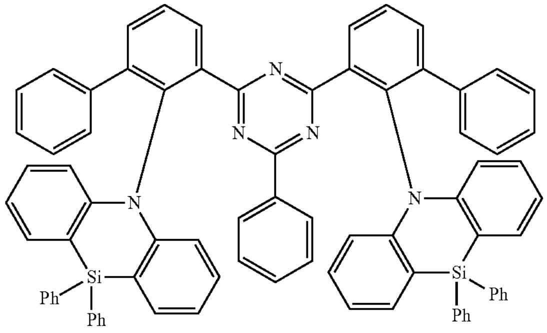
ETH60
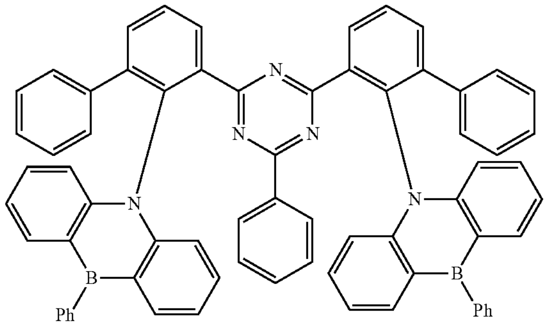
-continued
ETH61
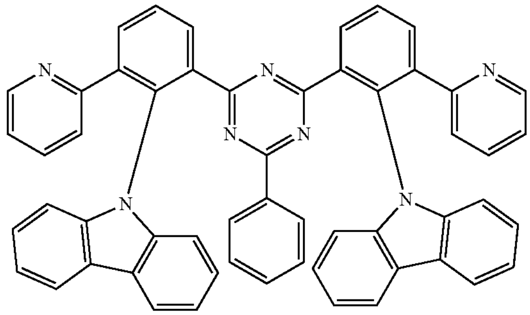
ETH62
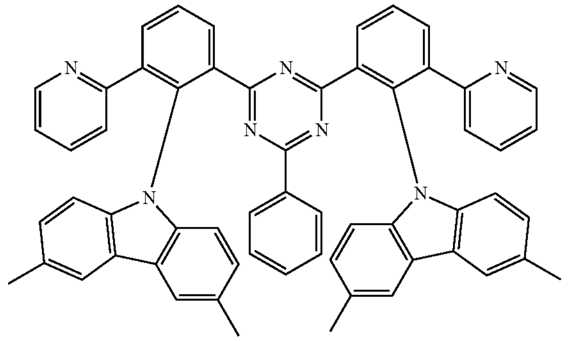
ETH63
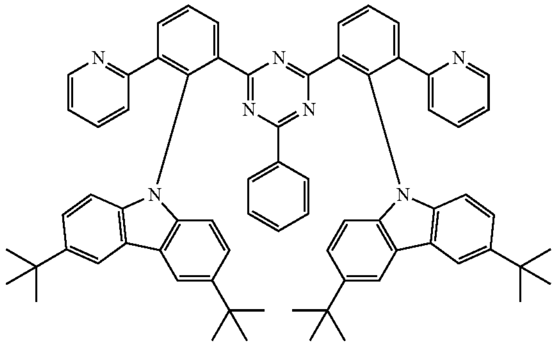
ETH64
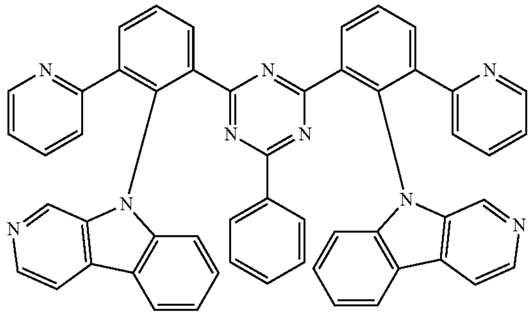

-continued
ETH65
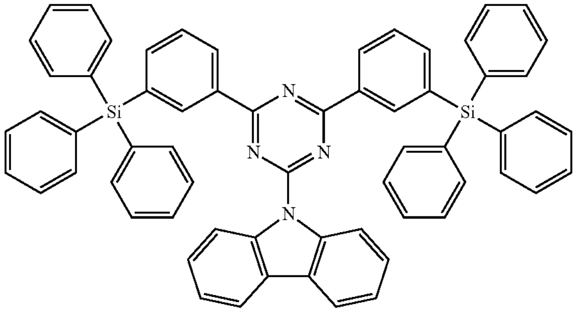
ETH66
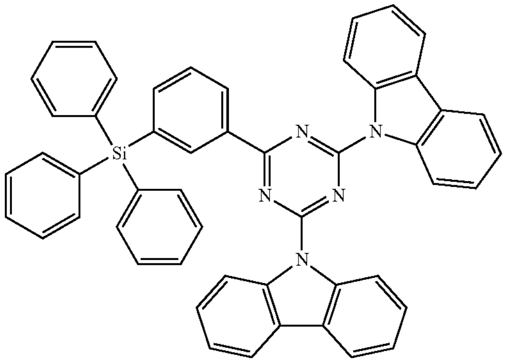
ETH67
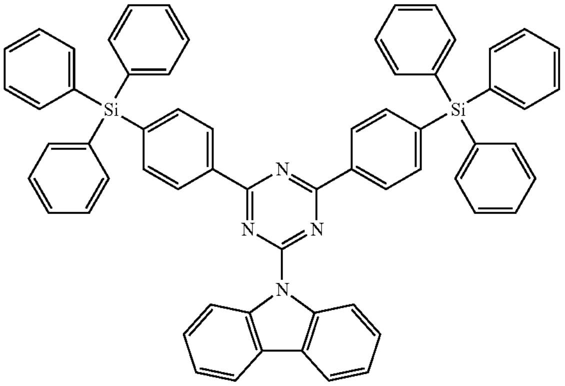
ETH68
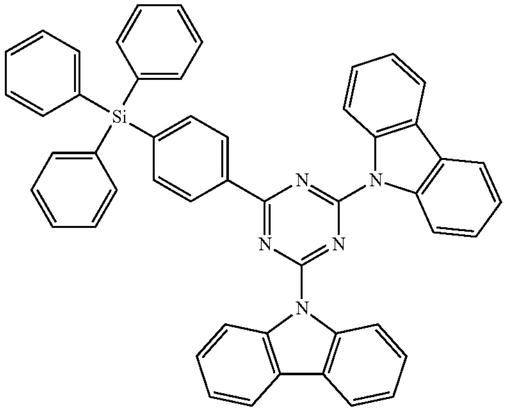
-continued
ETH69
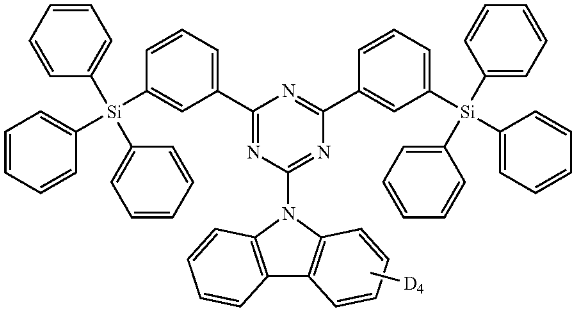
ETH70
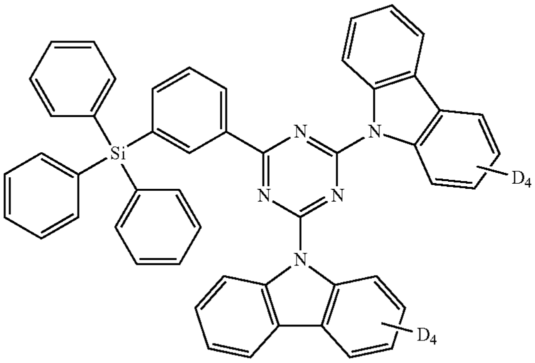
ETH71
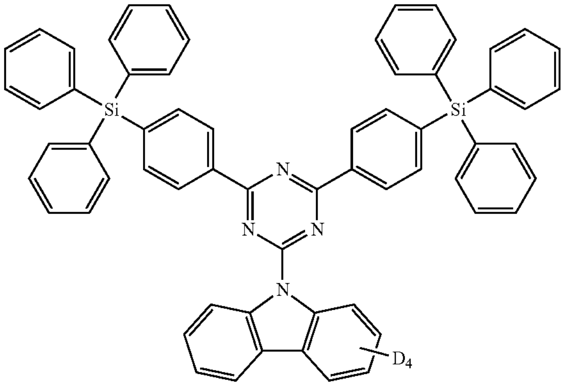
ETH72
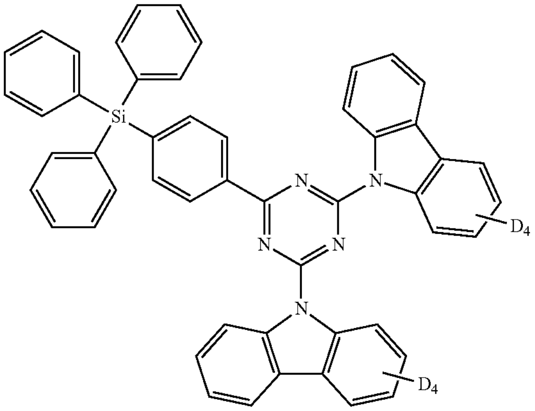

-continued
ETH73
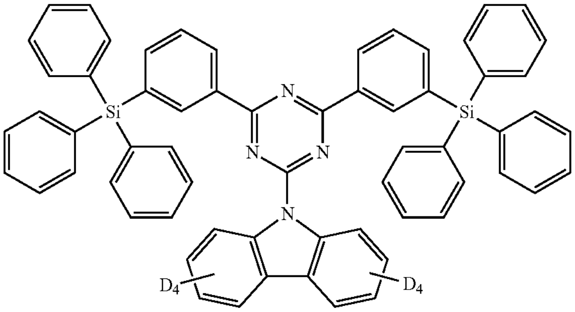
ETH74
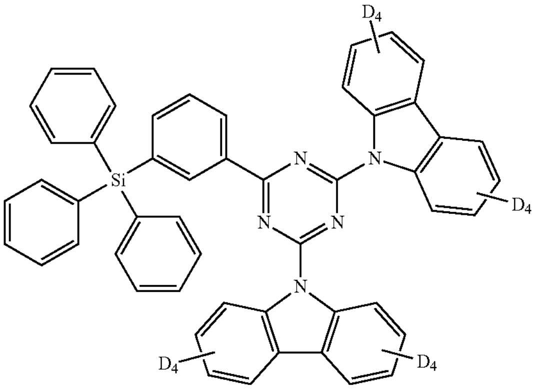
ETH75
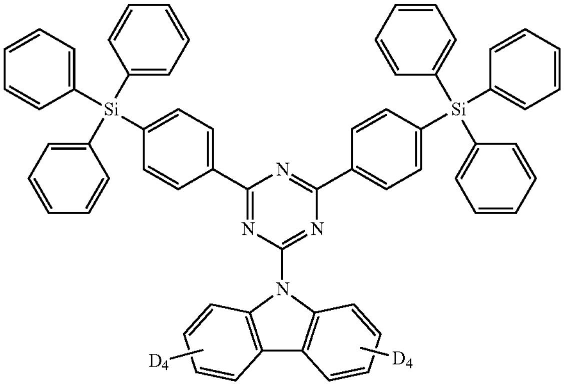
ETH76
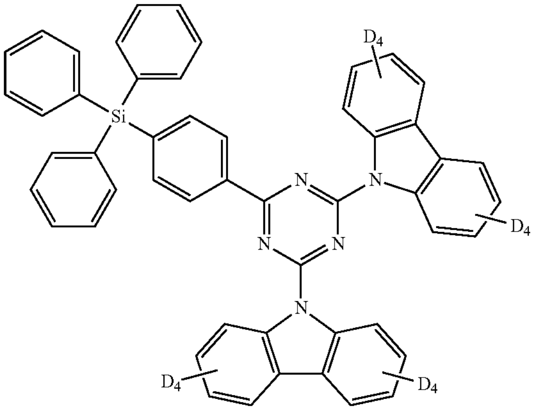
-continued
ETH77
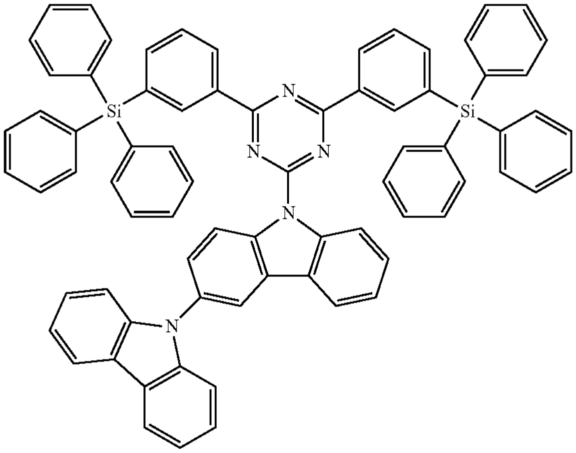
ETH78
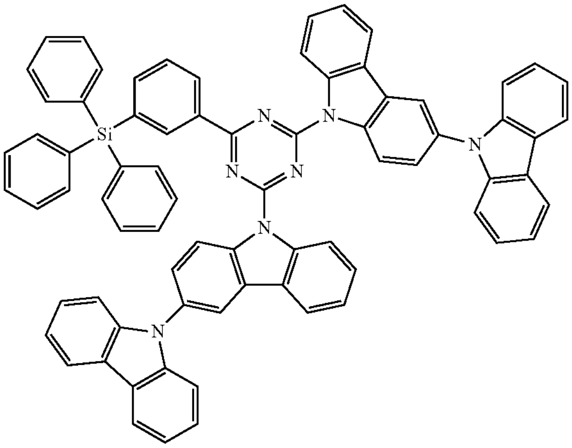
ETH79
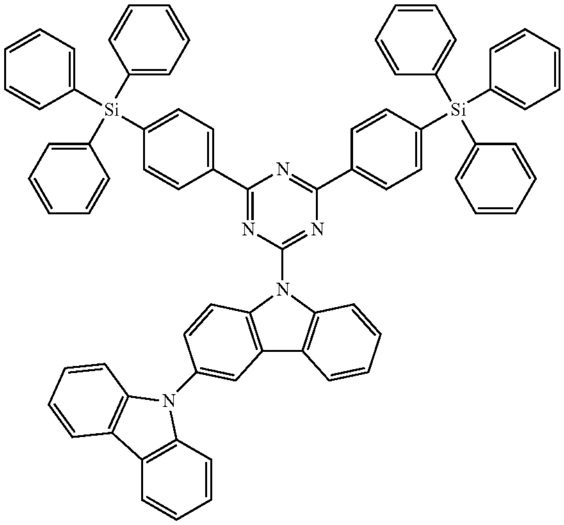

-continued
ETH80
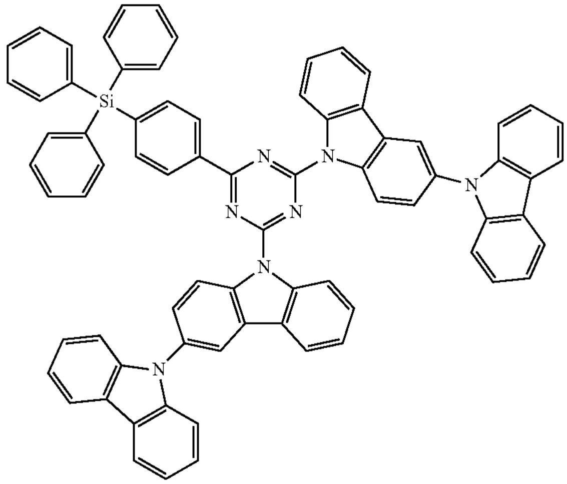
ETH81
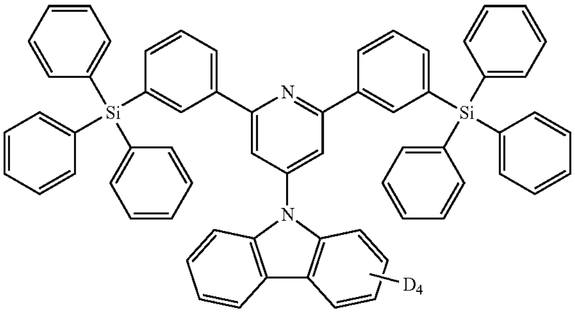
ETH82
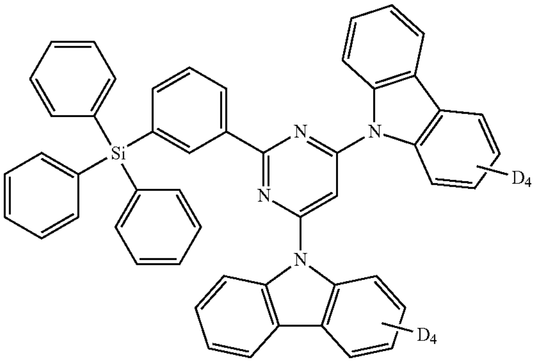
ETH83
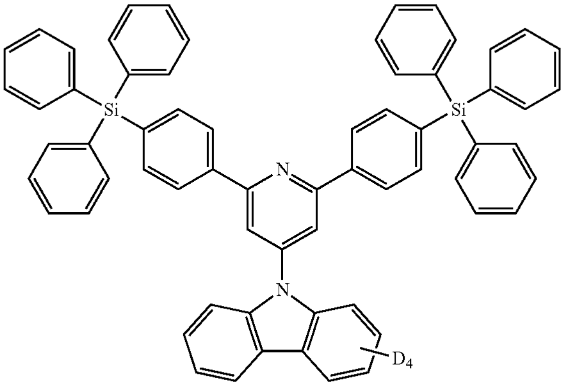
-continued
ETH84
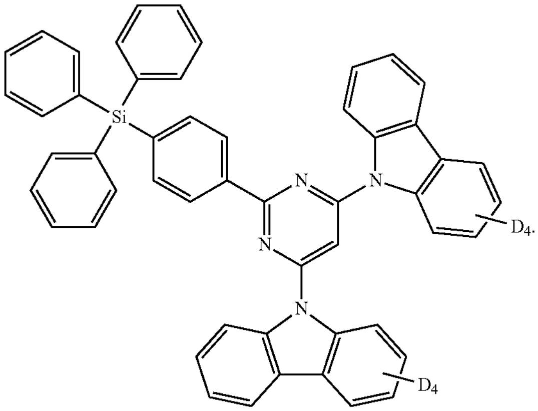
In one or more embodiments, the third compound may include (e.g., may be) at least one of Compounds HTH1 to HTH52:
HTH1
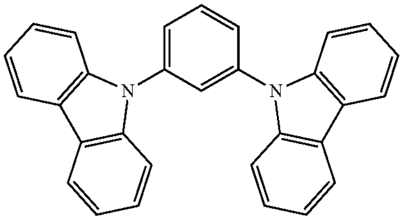
HTH2
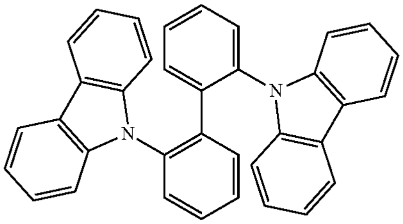
HTH3
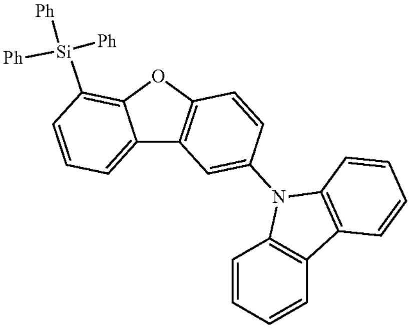

-continued
HTH4
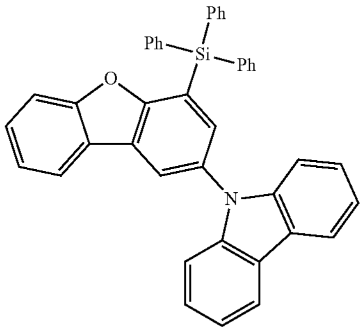
HTH5
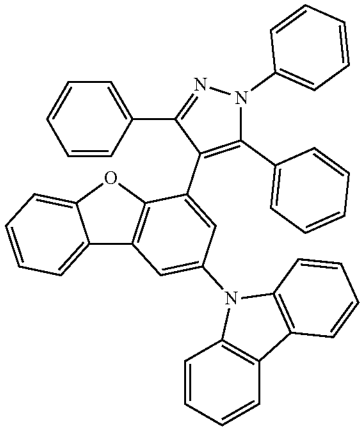
HTH6
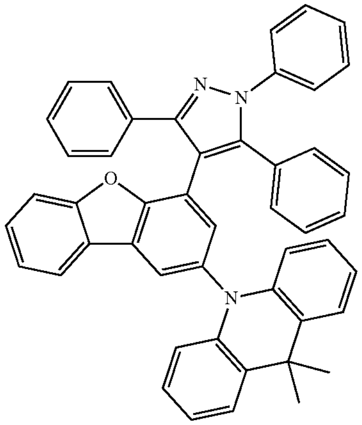
HTH7
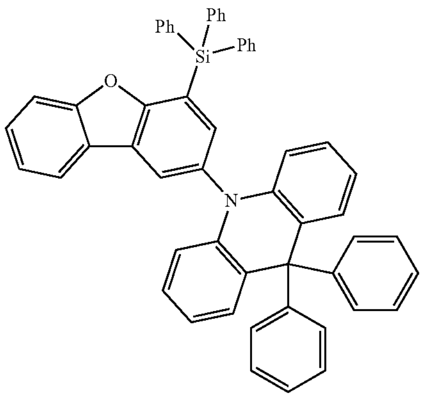
-continued
HTH8
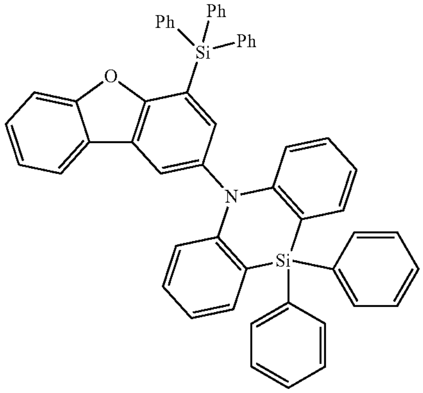
HTH9
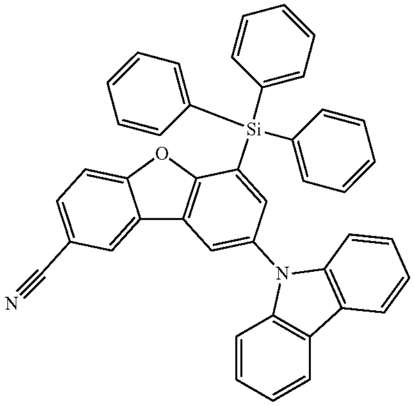
HTH10
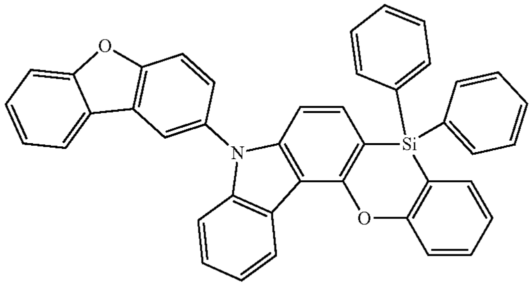
HTH11
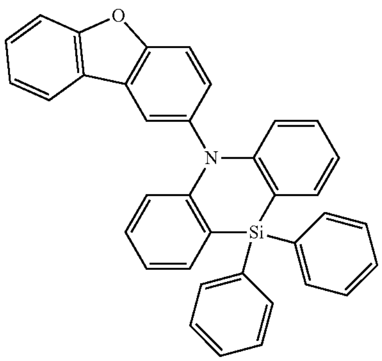

-continued
HTH12
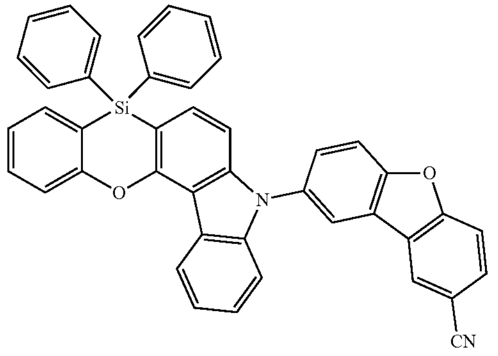
HTH13
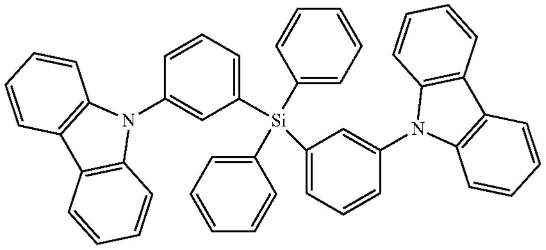
HTH14
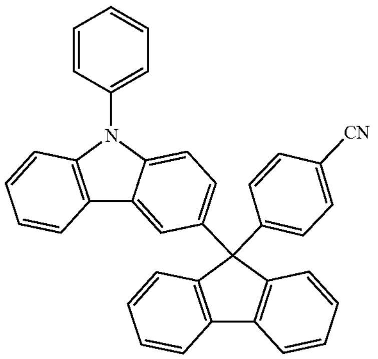
HTH15
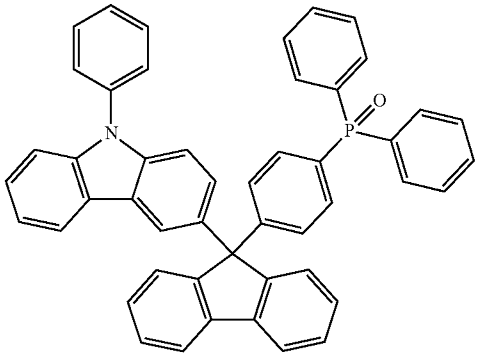
-continued
HTH16
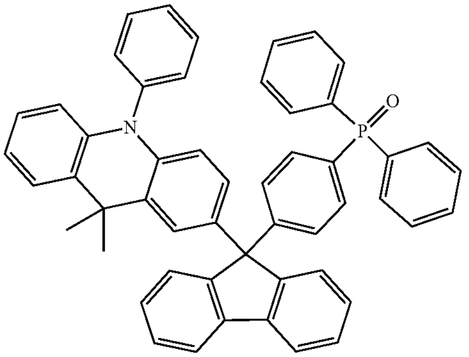
HTH17
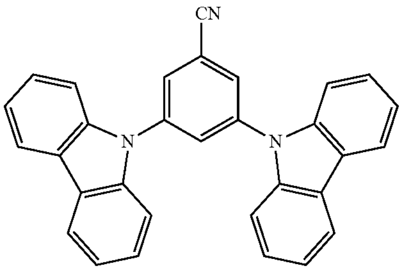
HTH18
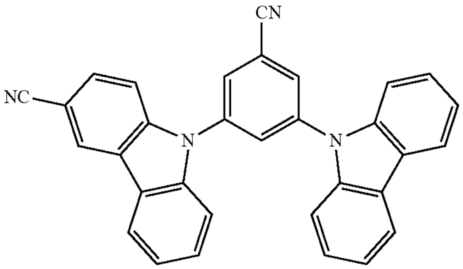
HTH19
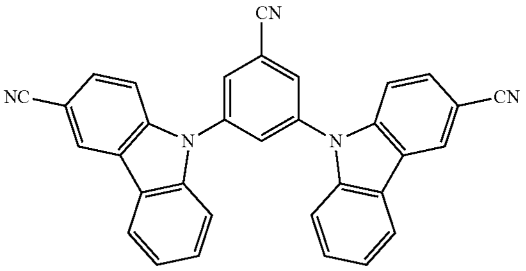
HTH20
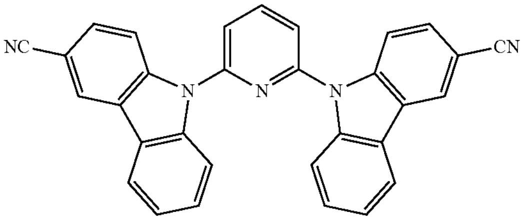

-continued
HTH21
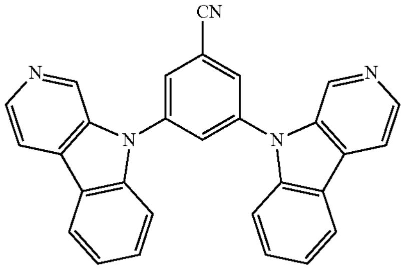
HTH22
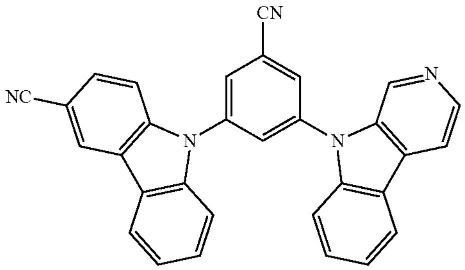
HTH23
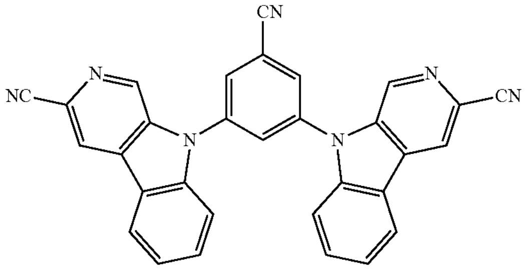
HTH24
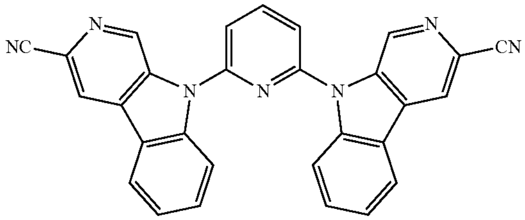
HTH25
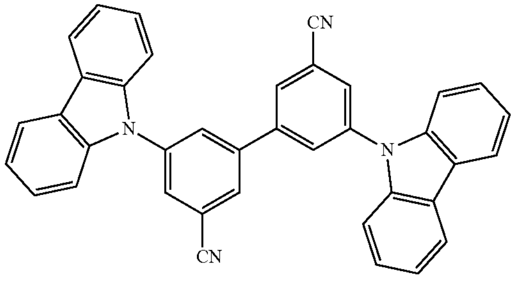
-continued
HTH26
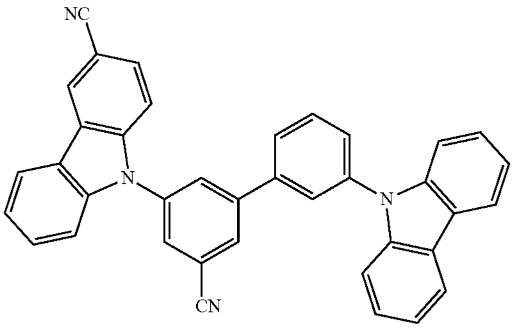
HTH27
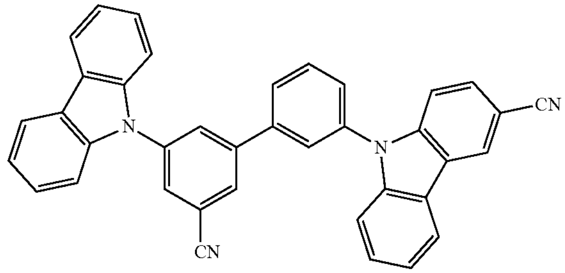
HTH28
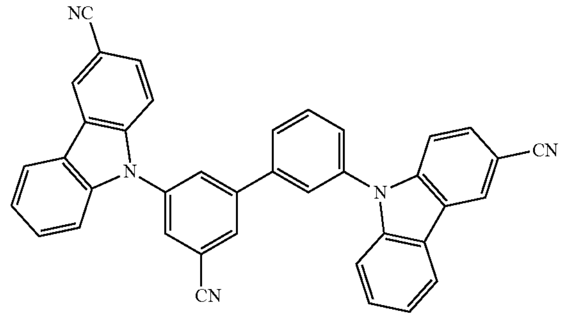
HTH29
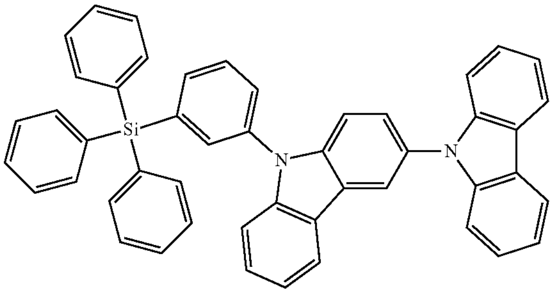

-continued
HTH30
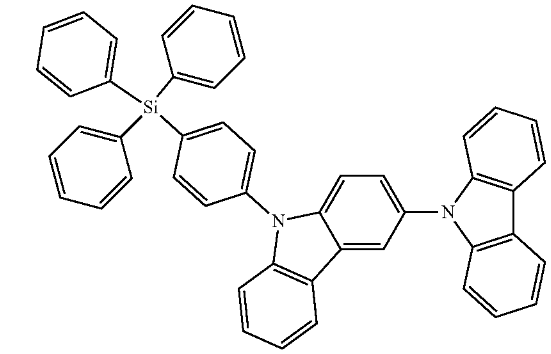
HTH31
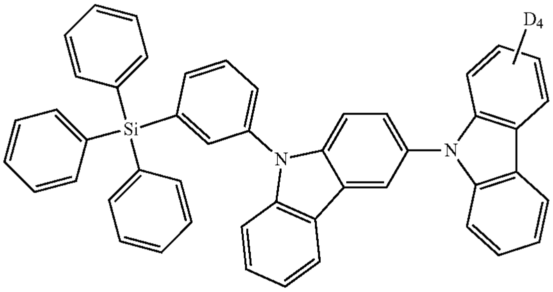
HTH32
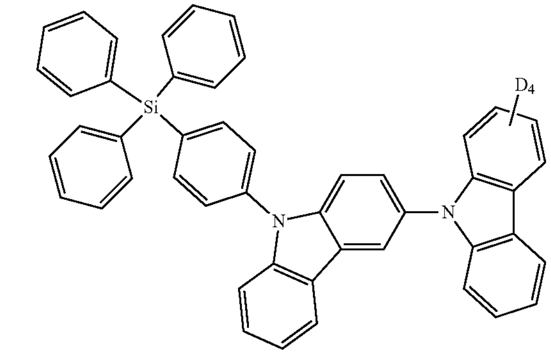
HTH33
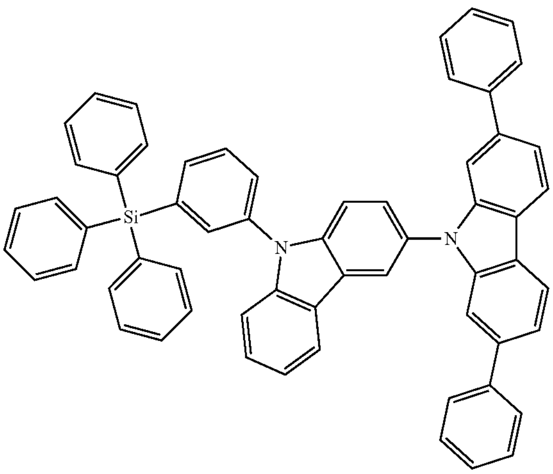
-continued
HTH34
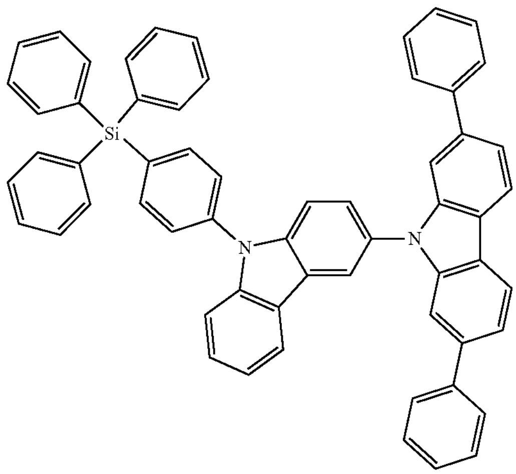
HTH35
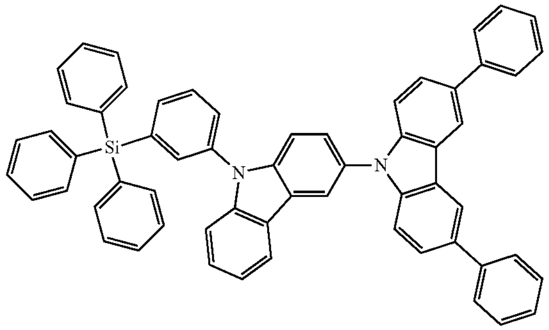
HTH36
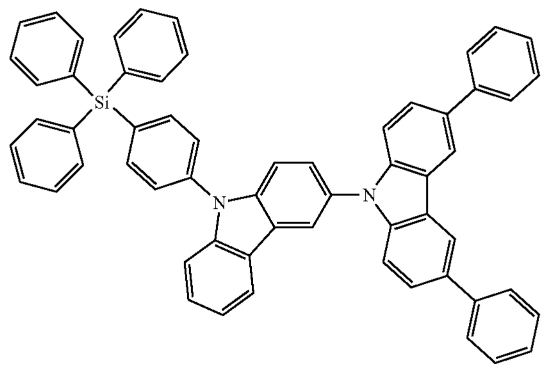
HTH37
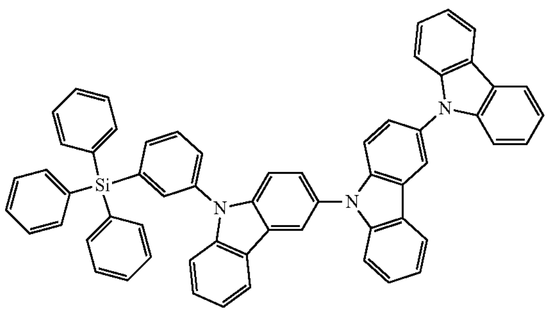

-continued
HTH38
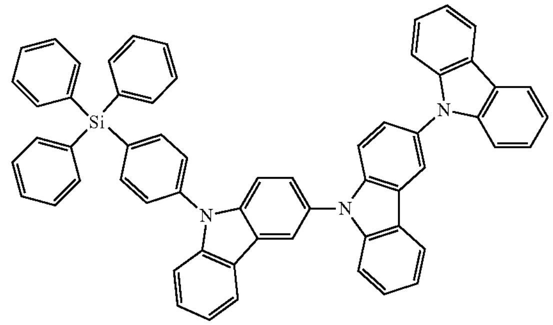
HTH39
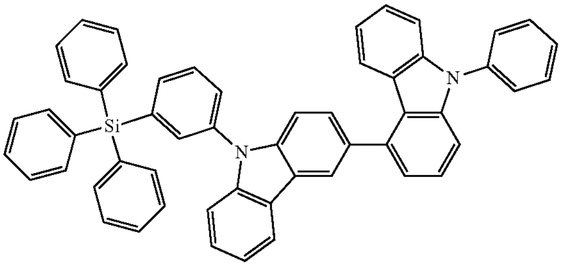
HTH40
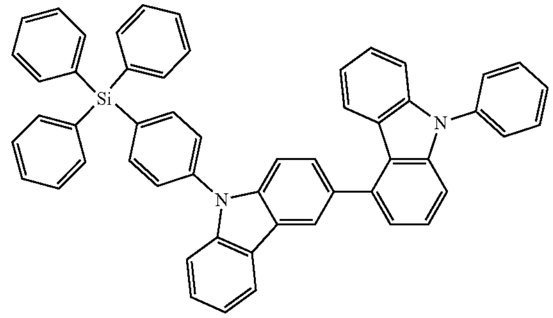
HTH41
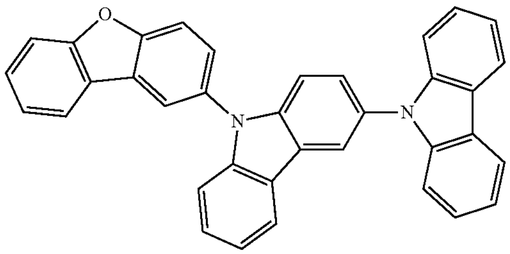
HTH42
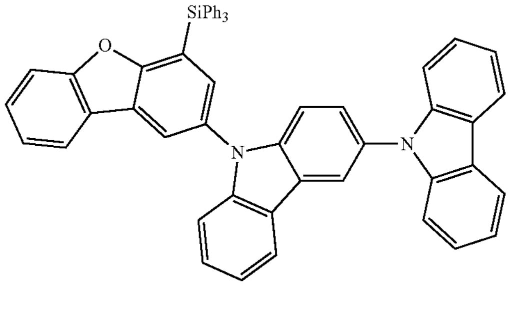
-continued
HTH43
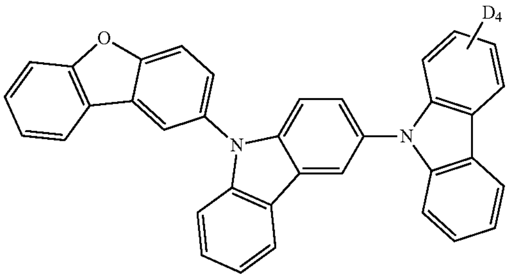
HTH44
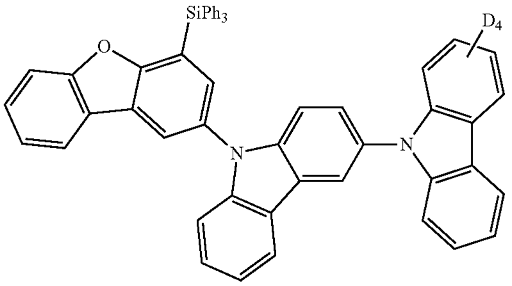
HTH45
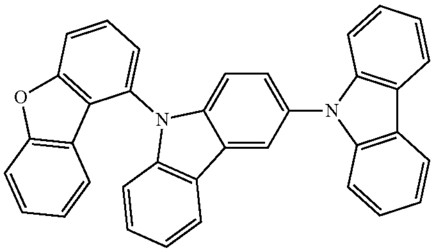
HTH46
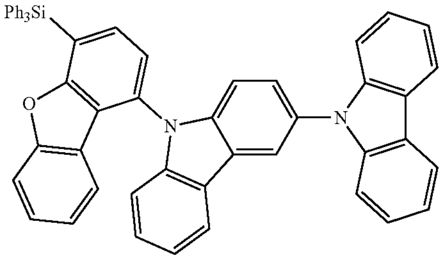
HTH47
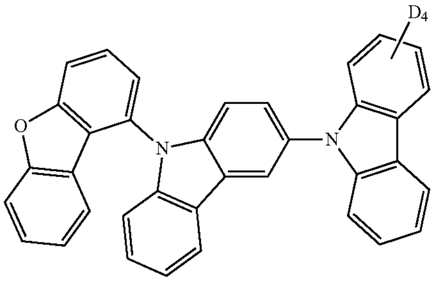

-continued
HTH48
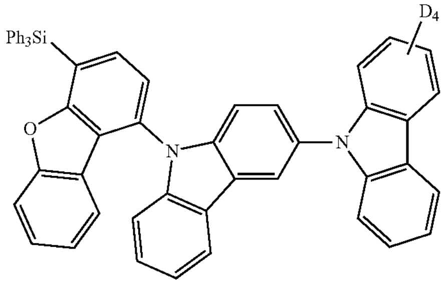
HTH49
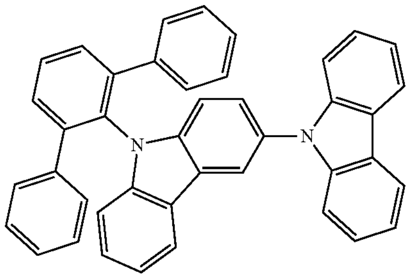
HTH50
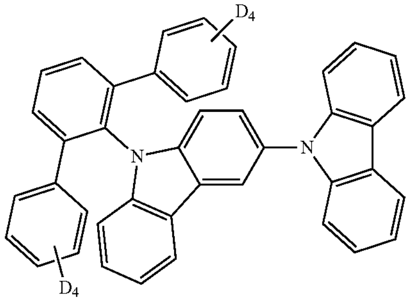
HTH51
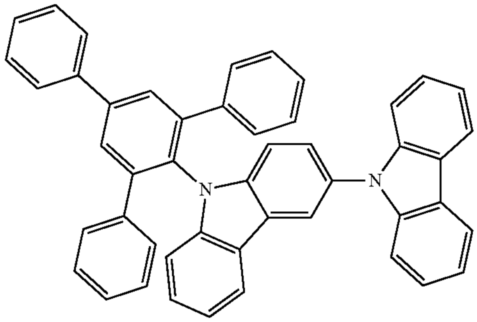
HTH52
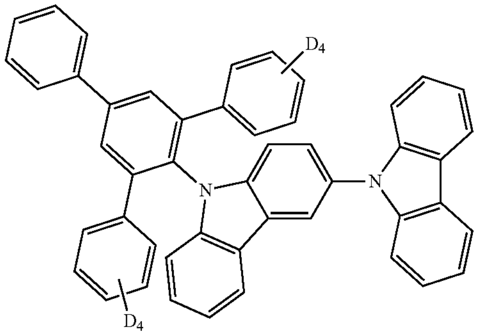
.
In one or more embodiments, the fourth compound may include (e.g., may be) at least one of Compounds DFD1 to DFD14:
DFD1
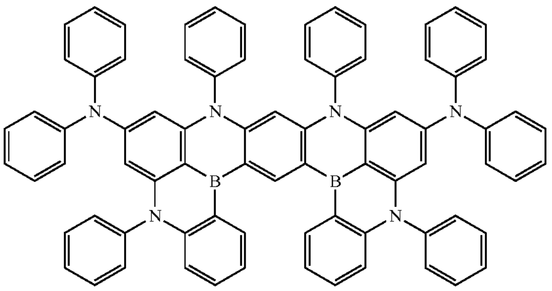
DFD2
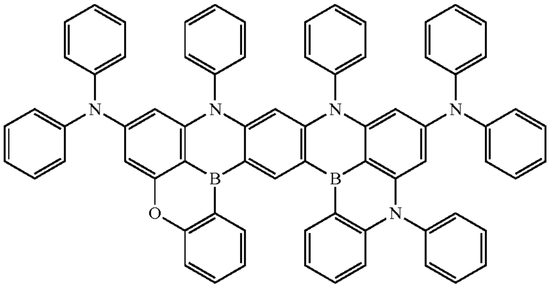
DFD3
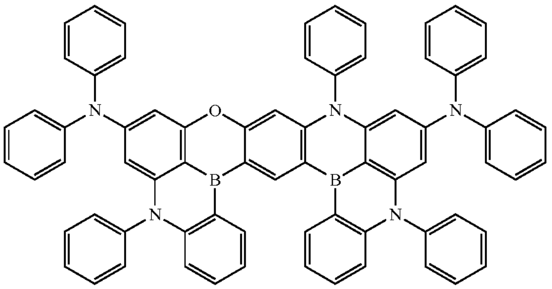
DFD4
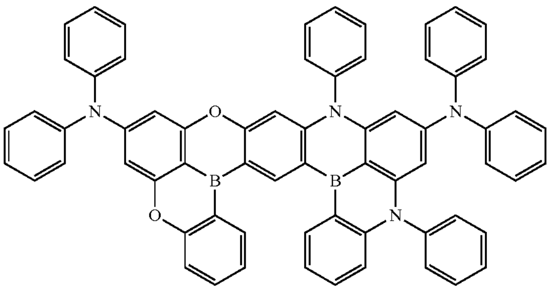

-continued
DFD5
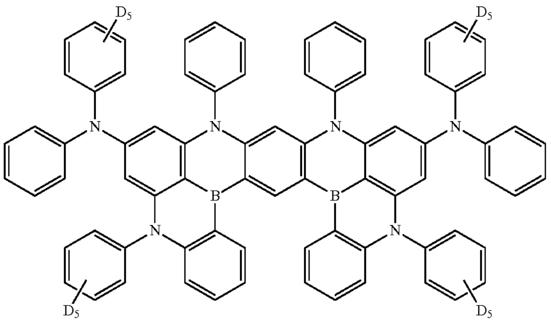
DFD6
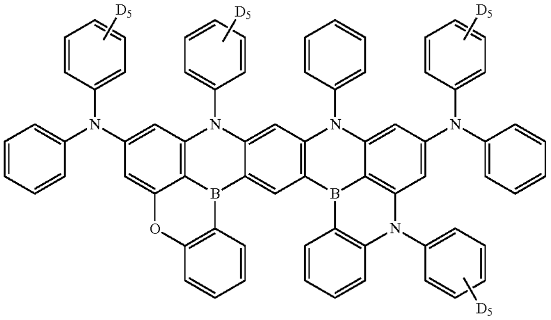
DFD7
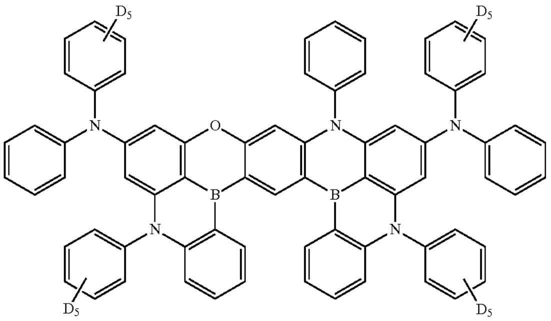
DFD8
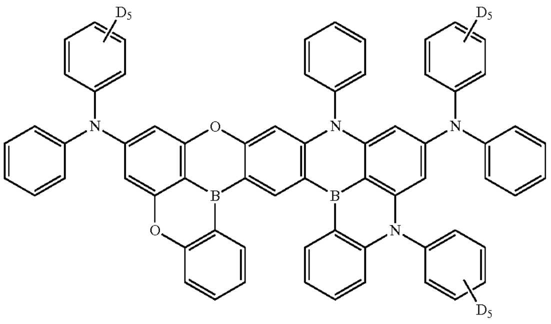
-continued
DFD9
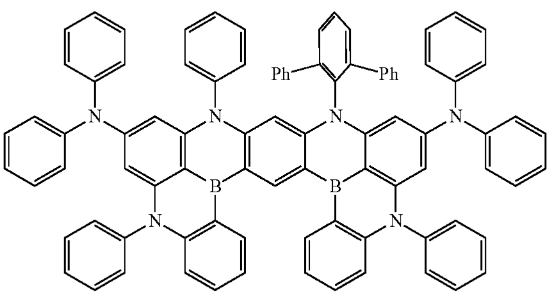
DFD10
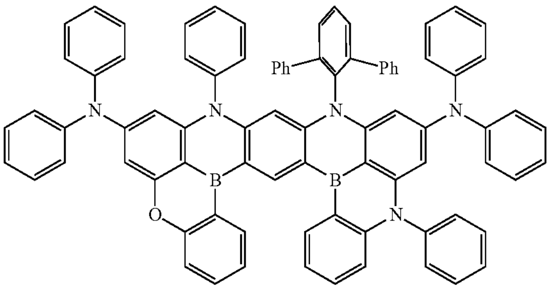
DFD11
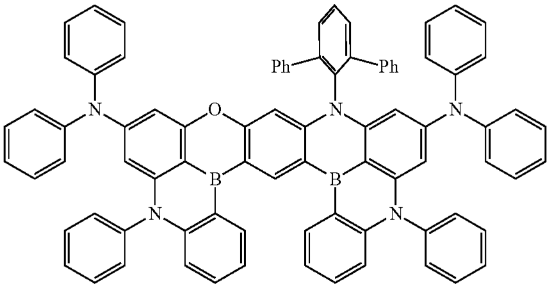
DFD12
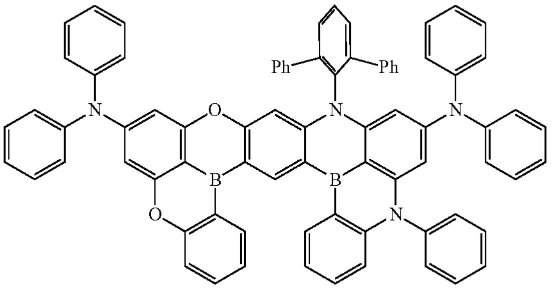
DFD13
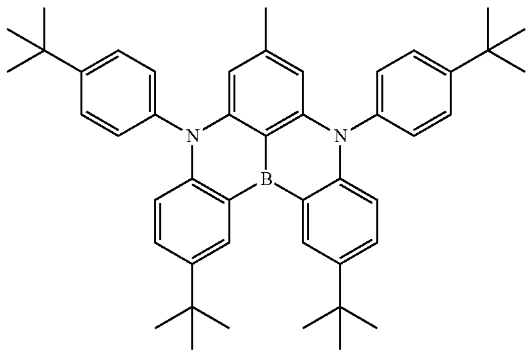

-continued

DFD14

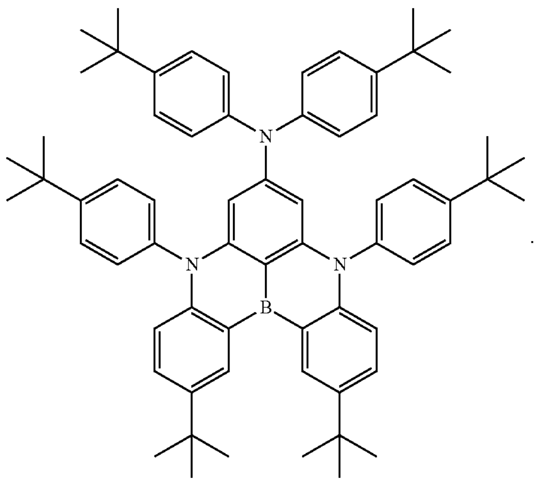

In the Compounds, "Ph" represents a phenyl group, "$D_5$" represents substitution with five deuterium atoms, and "$D_4$" represents substitution with four deuterium atoms. In some embodiments the group represented by

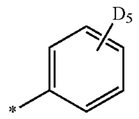

may be identical to the group represented by

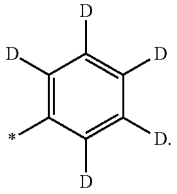

In some embodiments, the light-emitting device may satisfy at least one of Conditions 1 to 4:

LUMO energy level (eV) of the third compound>LUMO energy level (eV) of the first compound, Condition 1

LUMO energy level (eV) of the first compound>LUMO energy level (eV) of the second compound, Condition 2

HOMO energy level (eV) of the first compound>HOMO energy level (eV) of the third compound, and Condition 3

HOMO energy level (eV) of the third compound>HOMO energy level (eV) of the second compound. Condition 4

The HOMO and LUMO energy levels of the first compound, the second compound, and the third compound may each be a negative value, and the HOMO and LUMO energy levels may be actual measurement value according to the methods described in Evaluation Example 1 provided herein.

In one or more embodiments, the absolute value of a difference between the LUMO energy level of the first compound and the LUMO energy level of the second compound may be about 0.1 eV or higher and about 1.0 eV or lower, the absolute value of a difference between the LUMO energy level of the first compound and the LUMO energy level of the third compound may be about 0.1 eV or higher and about 1.0 eV or lower, the absolute value of a difference between the HOMO energy level of the first compound and the HOMO energy level of the second compound may be 1.25 eV or lower (e.g., about 1.25 eV or lower and about 0.2 eV or higher), and the absolute value of a difference between the HOMO energy level of the first compound and the HOMO energy level of the third compound may be 1.25 eV or lower (e.g., about 1.25 eV or lower and about 0.2 eV or higher).

When the relationships between LUMO energy level and HOMO energy level satisfy the conditions as described above, the balance between holes and electrons injected into the emission layer can be made.

The light-emitting device may have a structure of a first embodiment or a second embodiment:

Descriptions of First Embodiment

According to the first embodiment, the first compound may be included in an emission layer in an interlayer of a light-emitting device, wherein the emission layer may further include a host, the first compound may be different from the host, and the emission layer may emit phosphorescent light or fluorescent light emitted from the first compound. According to the first embodiment, the first compound may be a dopant or an emitter. In some embodiments, the first compound may be a phosphorescent dopant or a phosphorescent emitter.

Phosphorescent light or fluorescent light emitted from the first compound may be blue light.

The emission layer may further include an ancillary dopant. The ancillary dopant may serve to improve luminescence efficiency from the first compound by effectively (or suitably) transferring energy to a dopant or the first compound as an emitter.

The ancillary dopant may be different from the first compound and the host.

In some embodiments, the ancillary dopant may be a delayed fluorescence-emitting compound.

In some embodiments, the ancillary dopant may be a compound including at least one cyclic group including boron (B) and nitrogen (N) as ring-forming atoms.

Descriptions of Second Embodiment

According to the second embodiment, the first compound may be included in an emission layer in an interlayer of a light-emitting device, wherein the emission layer may further include a host and a dopant, the first compound may be different from the host and from the dopant, and the emission layer may emit phosphorescent light or fluorescent light (e.g., delayed fluorescent light) emitted from the dopant.

For example, the first compound in the second embodiment may serve as an ancillary dopant that transfers energy to a dopant (or an emitter), not as a dopant (or an emitter) itself.

In some embodiments, the first compound in the second embodiment may serve as an emitter and as an ancillary dopant that transfers energy to a dopant (or an emitter).

For example, phosphorescent light or fluorescent light emitted from the dopant (or the emitter) in the second embodiment may be blue phosphorescent light or blue fluorescent light (e.g., blue delayed fluorescent light).

The dopant (or the emitter) in the second embodiment may be a phosphorescent dopant material (e.g., the organometallic compound represented by Formula 1, the organometallic compound represented by Formula 401, or any combination thereof) or a fluorescent dopant material (e.g, the compound represented by Formula 501, the compound represented by Formula 502, the compound represented by Formula 503, or any combination thereof).

In the first embodiment and the second embodiment, the blue light may be blue light having a maximum emission wavelength in a range of about 390 nanometers (nm) to about 500 nm, about 410 nm to about 490 nm, about 430 nm to about 480 nm, about 440 nm to about 475 nm, or about 455 nm to about 470 nm.

The ancillary dopant in the first embodiment may include, e.g. the fourth compound represented by Formula 502 or Formula 503.

The host in the first embodiment and the second embodiment may be any suitable host material (e.g., the compound represented by Formula 301, the compound represented by 301-1, the compound represented by Formula 301-2, or any combination thereof).

In some embodiments, the host in the first embodiment and the second embodiment may be the second compound, the third compound, or any combination thereof.

In one or more embodiments, the light-emitting device may further include at least one of a first capping layer located outside a first electrode or a second capping layer located outside a second electrode, and at least one of the first capping layer or the second capping layer may include the organometallic compound represented by Formula 1. The first capping layer and the second capping layer may respectively be understood by referring to the descriptions of the first capping layer and the second capping layer provided herein.

In some embodiments, the light-emitting device may include:

a first capping layer located outside the first electrode and including the organometallic compound represented by Formula 1;

a second capping layer located outside the second electrode and including the organometallic compound represented by Formula 1; or the first capping layer and the second capping layer.

The expression that an "(interlayer and/or a capping layer) includes at least one organometallic compound represented by Formula 1" as used herein may be construed as meaning that the "(interlayer and/or the capping layer) may include one organometallic compound of Formula 1 or two or more different organometallic compounds of Formula 1".

For example, the interlayer and/or the capping layer may include Compound D1 only as the organometallic compound. In this embodiment, Compound D1 may be included in the emission layer of the light-emitting device. In some embodiments, Compounds D1 and D2 may be included in the interlayer as organometallic compounds. In this embodiment, Compounds D1 and D2 may be included in the same layer (for example, both Compounds D1 and D2 may be included in an emission layer) or in different layers (for example, Compound D1 may be included in an emission layer, and Compound D2 may be included in an electron transport region).

The term "interlayer" as used herein refers to a single layer and/or a plurality of all layers located between a first electrode and a second electrode in a light-emitting device.

According to one or more embodiments, an electronic apparatus may include the light-emitting device. The electronic apparatus may further include a thin-film transistor. In some embodiments, the electronic apparatus may further include a thin-film transistor including a source electrode and drain electrode, and a first electrode of the light-emitting device may be electrically connected to the source electrode or the drain electrode. The electronic apparatus may further include a color filter, a color-conversion layer, a touchscreen layer, a polarization layer, or any combination thereof. The electronic apparatus may be understood by referring to the description of the electronic apparatus provided herein.

According to one or more embodiments, an organometallic compound may be represented by Formula 1, wherein Formula 1 may be understood by referring to the description of Formula 1 provided herein.

In the organometallic compound represented by Formula 1, the sum of a1 to a4 may be 1 or greater, and at least one of *-$(L_1)_{b1}$-$(R_1)_{c1}$(s) in the number of a1, at least one of $R_2$(s) in the number of a2, at least one of $R_3$(s) in the number of a3, at least one of $R_4$(s) in the number of a4, or any combination thereof may each independently be the group represented by Formula 1-1 or the group represented by Formula 1-2:

Formula 1-1

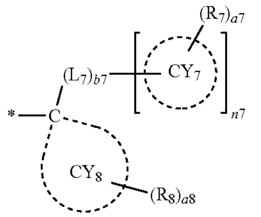

Formula 1-2

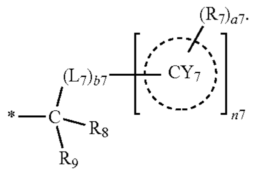

For example, the organometallic compound represented by Formula 1 may include the group represented by Formula 1-1 and/or the group represented by Formula 1-2.

A moiety represented by ring CY7 in Formulae 1-1 and 1-2, a moiety represented by ring CY8 in Formula 1-1, and $R_8$ and $R_9$ in Formula 1-2 may each have a high triplet energy level (e.g., a triplet energy level as high as 0.01 eV). Accordingly, in Formula 1, energy transfer by metal to ligand charge transfer, and energy transfer by intramolecular through-space charge transfer, may both be activated. In addition, Formulae 1-1 and 1-2 may each have structural rigidity due to ring CY7.

Therefore, a light-emitting device (e.g., an organic light-emitting device) including the organometallic compound represented by Formula 1 (or the first compound represented by Formula 1) may have high color purity, high luminescence efficiency, low driving voltage, and long lifespan characteristics.

In one or more embodiments, the organometallic compound represented by Formula 1 may emit blue light. In some embodiments, the organometallic compound represented by Formula 1 may emit blue light having a maximum emission wavelength in a range of about 390 nm to about 500 nm, about 410 nm to about 490 nm, about 430 nm to about 480 nm, about 440 nm to about 475 nm, or about 455 nm to about 470 nm.

In one or more embodiments, the organometallic compound represented by Formula 1 may have a color purity of a bottom emission CIEx coordinate in a range of about 0.12 to about 0.15, or about 0.13 to about 0.14, and a bottom emission CIEy coordinate in a range of about 0.06 to about 0.25, about 0.10 to about 0.20, or about 0.13 to about 0.20.

Methods of synthesizing the organometallic compound represented by Formula 1 may be easily understood to those of ordinary skill in the art by referring to Synthesis Examples and Examples described herein.

Description of FIG. 1

FIG. 1 is a schematic view of a light-emitting device 10 according to one or more embodiments. The light-emitting device 10 may include a first electrode 110, an interlayer 130, and a second electrode 150.

hereinafter, the structure of the light-emitting device 10 according to one or more embodiments and a method of manufacturing the light-emitting device 10 according to one or more embodiments will be described in connection with FIG. 1.

First Electrode 110

In FIG. 1, a substrate may be additionally located under the first electrode 110 or above the second electrode 150. The substrate may be a glass substrate and/or a plastic substrate. The substrate may be a flexible substrate including plastic having excellent heat resistance and durability, for example, polyimide, polyethylene terephthalate (PET), polycarbonate, polyethylene naphtalate, polyarylate (PAR), polyetherimide, or any combination thereof.

The first electrode 110 may be formed by depositing or sputtering, onto the substrate, a material for forming the first electrode 110. When the first electrode 110 is an anode, a high work function material that may easily (or suitably) inject holes may be used as a material for a first electrode 110.

The first electrode 110 may be a reflective electrode, a semi-transmissive electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combinations thereof. In some embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure including (e.g., consisting of) a single layer or a multi-layered structure including two or more layers. In some embodiments, the first electrode 110 may have a triple-layered structure of ITO/Ag/ITO.

Interlayer 130

The interlayer 130 may be on the first electrode 110. The interlayer 130 may include an emission layer.

The interlayer 130 may further include a hole transport region between the first electrode 110 and the emission layer, and an electron transport region between the emission layer and the second electrode 150.

The interlayer 130 may further include metal-containing compounds such as organometallic compounds, inorganic materials such as quantum dots, and/or the like, in addition to various organic materials.

The interlayer 130 may include: i) at least two emitting units sequentially stacked between the first electrode 110 and the second electrode 150; and ii) a charge-generation layer located between the at least two emitting units. When the interlayer 130 includes the at least two emitting units and the charge generation layer, the light-emitting device 10 may be a tandem light-emitting device.

Hole Transport Region in Interlayer 130

The hole transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The hole transport region may include a hole injection layer (HIL), a hole transport layer (HTL), an emission auxiliary layer, an electron blocking layer (EBL), or any combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order.

The hole transport region may include the compound represented by Formula 201, the compound represented by Formula 202, or any combination thereof:

Formula 201

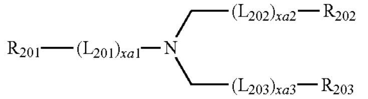

Formula 202

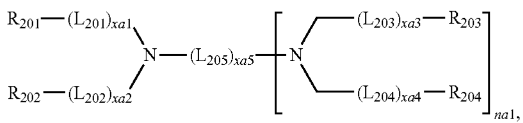

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (e.g., a carbazole group and/or the like) that is unsubstituted or OC substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In some embodiments, Formulae 201 and 202 may each include at least one of groups represented by Formulae CY201 to CY217:

CY201

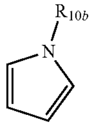

CY202

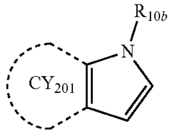

CY203

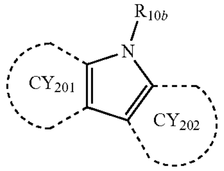

CY204

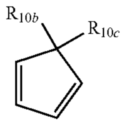

CY205

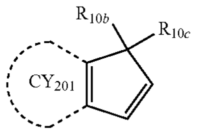

CY206

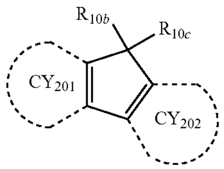

-continued

CY207

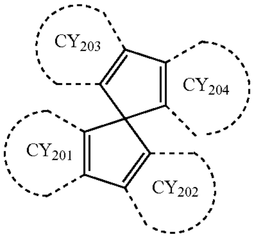

CY208

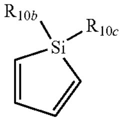

CY209

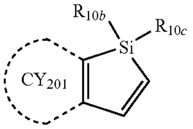

CY210

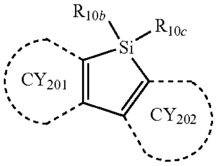

CY211

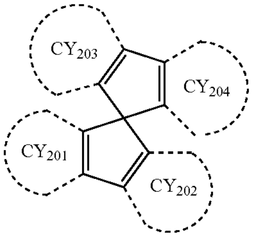

CY212

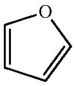

CY213

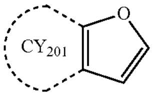

CY214

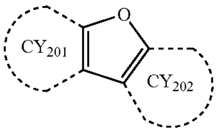

CY215

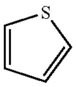

CY216

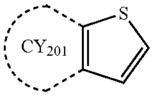

-continued

CY217

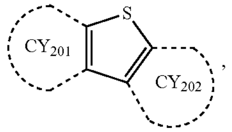

wherein, in Formulae CY201 to CY217, $R_{10b}$ and $R_{10c}$ may each be understood by referring to the descriptions of $R_{10a}$, ring CY201 to ring CY204 may each independently be a $C_3$-$C_{20}$ carbocyclic group or a $C_1$-$C_{20}$ heterocyclic group, and hydrogen atoms in Formulae CY201 to CY217 may each independently be unsubstituted or substituted with $R_{10a}$.

In some embodiments, in Formulae CY201 to CY217, ring CY201 to ring CY204 may each independently be a benzene group, a naphthalene group, a phenanthrene group, or an anthracene group.

In one or more embodiments, Formulae 201 and 202 may each include at least one of groups represented by Formula CY201 to CY203.

In one or more embodiments, Formula 201 may include at least one of groups represented by Formulae CY201 to CY203 and at least one of groups represented by Formulae CY204 to CY217.

In one or more embodiments, in Formula 201, xa1 may be 1, $R_{201}$ may be a group represented by any one of Formulae CY201 to CY203, xa2 may be 0, and $R_{202}$ may be a group represented by any one of Formulae CY204 to CY207.

In one or more embodiments, Formula 201 and 202 may each not include groups represented by Formulae CY201 to CY203.

In one or more embodiments, Formula 201 and 202 may each not include groups represented by Formulae CY201 to CY203, and include at least one of groups represented by Formulae CY204 to CY217.

In one or more embodiments, Formula 201 and 202 may each not include groups represented by Formulae CY201 to CY217.

In some embodiments, the hole transport region may include one selected from Compounds HT1 to HT44, m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate) (PANI/PSS), and any combinations thereof:

HT1

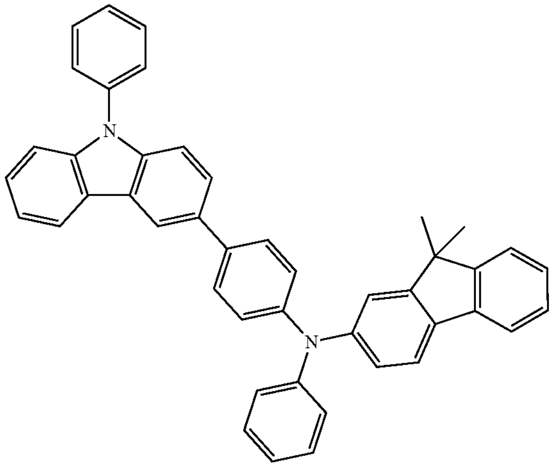

HT2

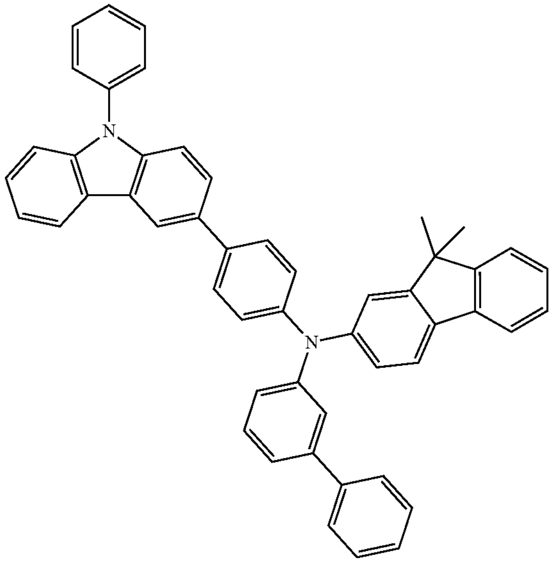

-continued
HT3
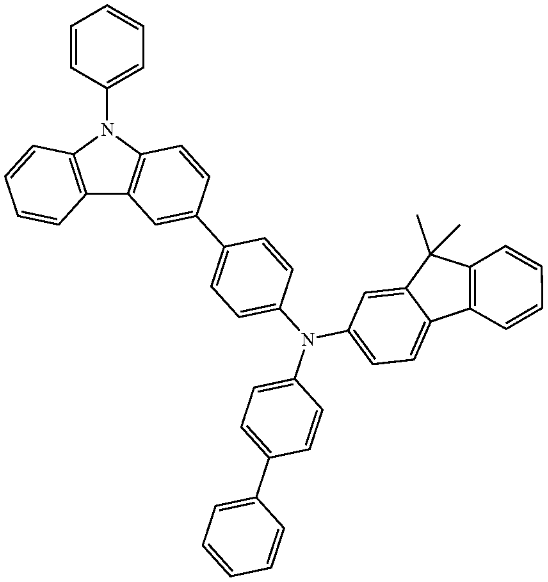
HT4
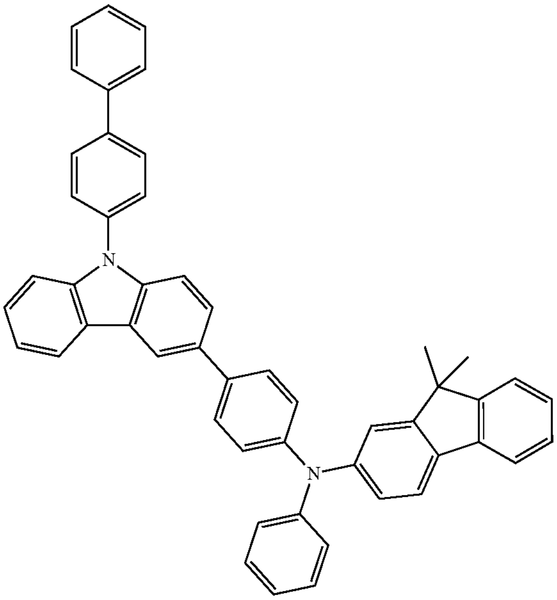
HT5
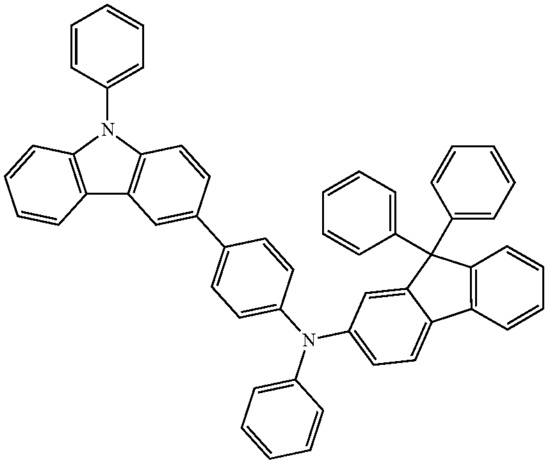
HT6
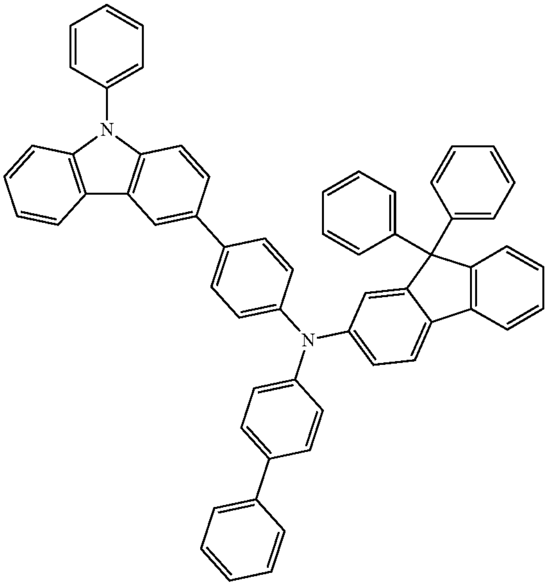

-continued
HT7
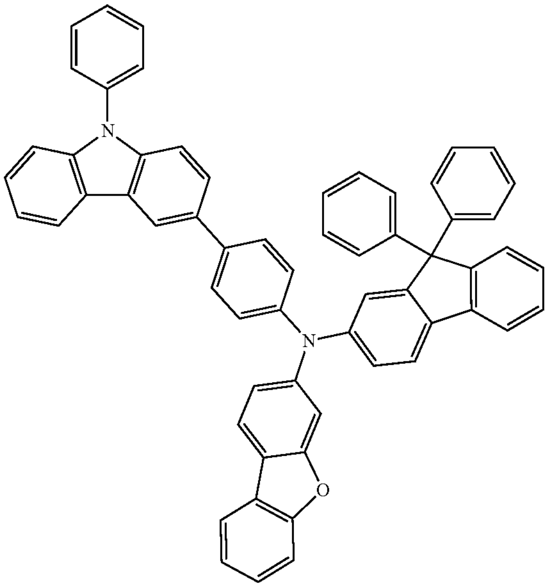
HT8
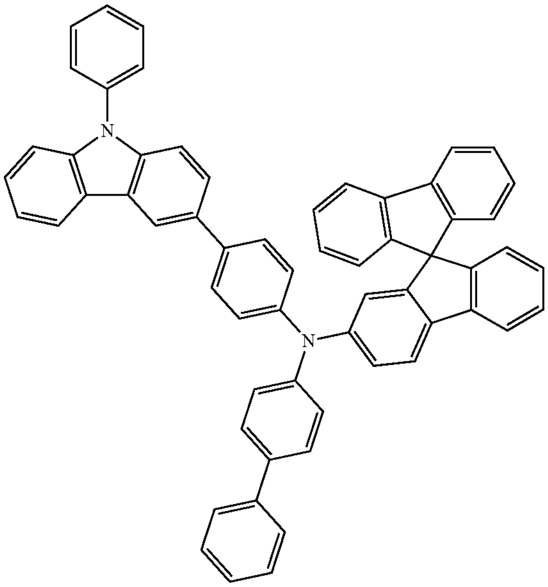
HT9
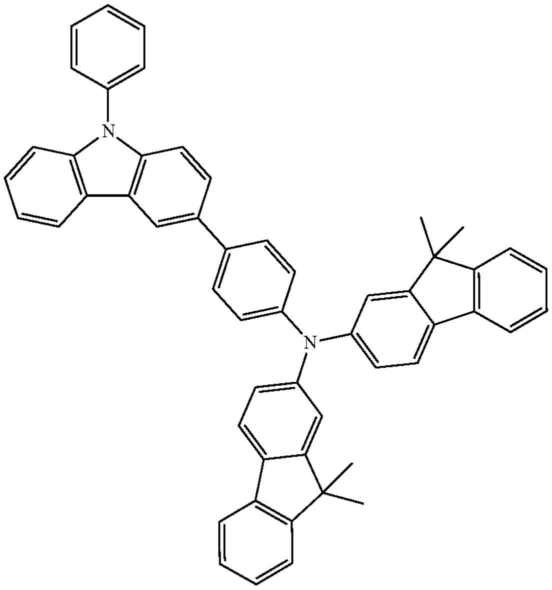
HT10
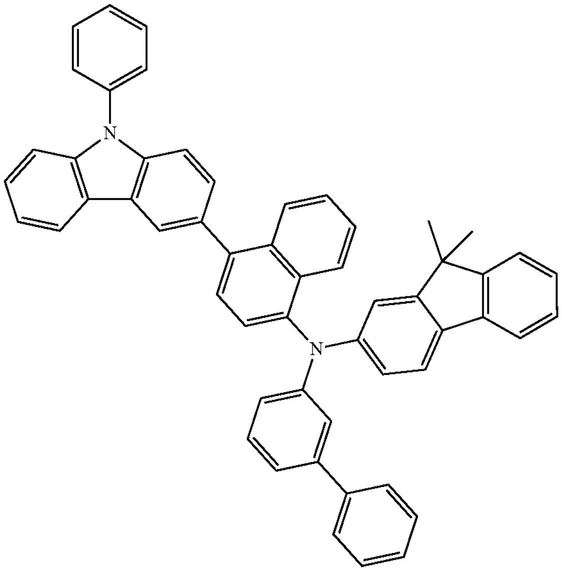

-continued
HT11
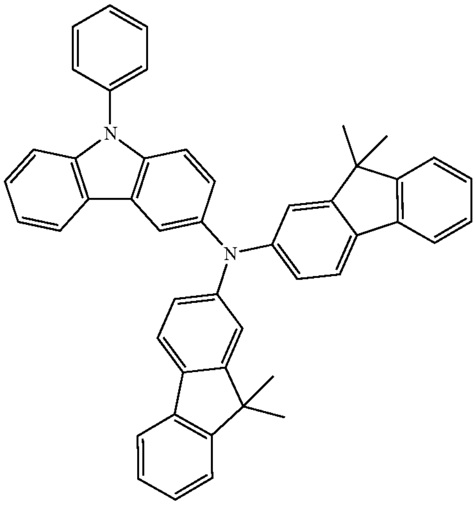
HT12
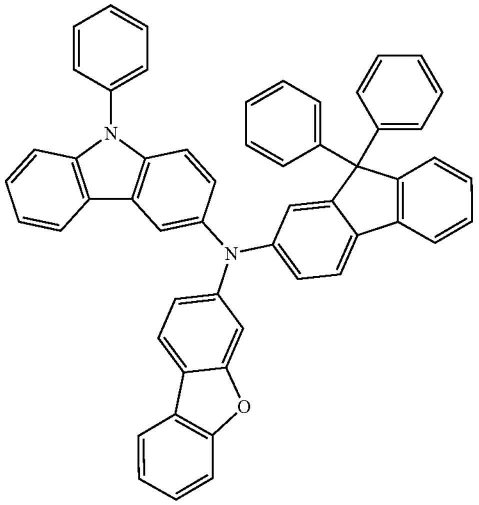
HT13
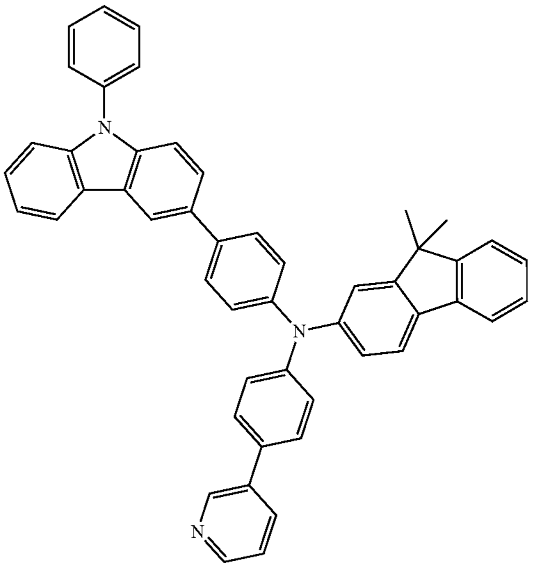
HT14
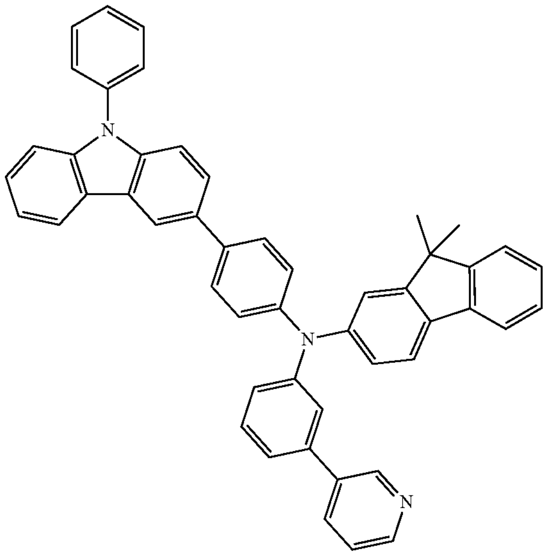
HT15
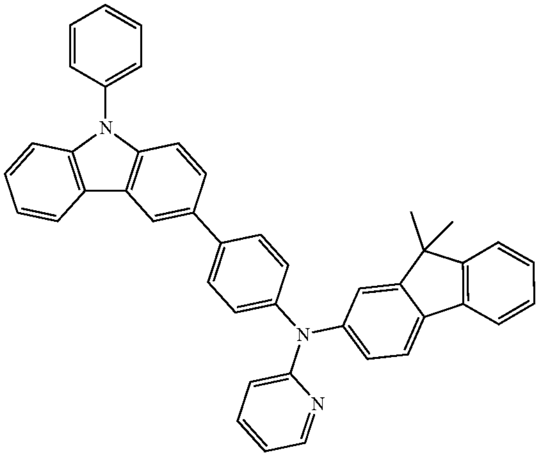
HT16
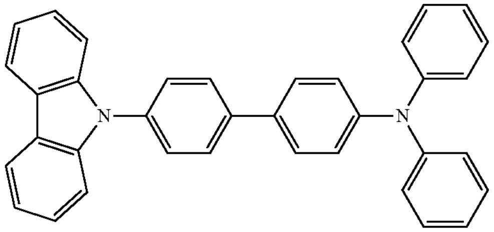

-continued
HT17
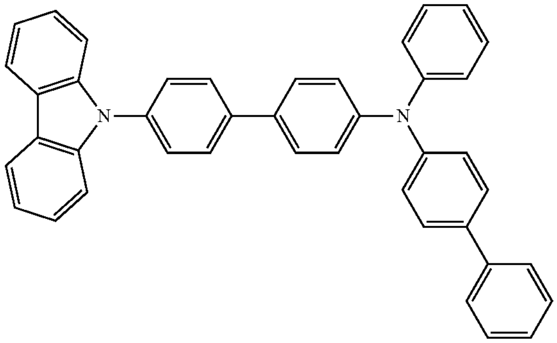
HT18
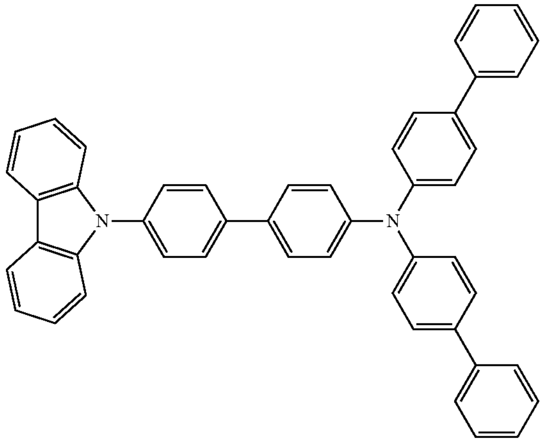
HT19
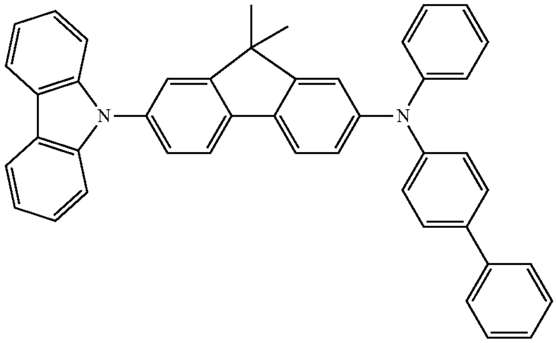
HT20
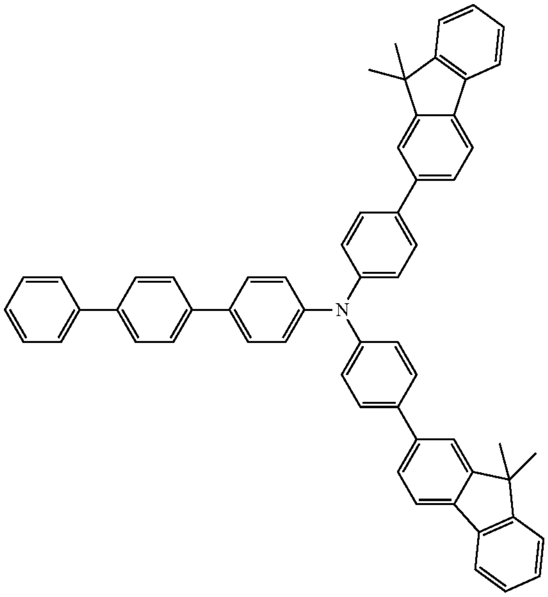

-continued
HT21
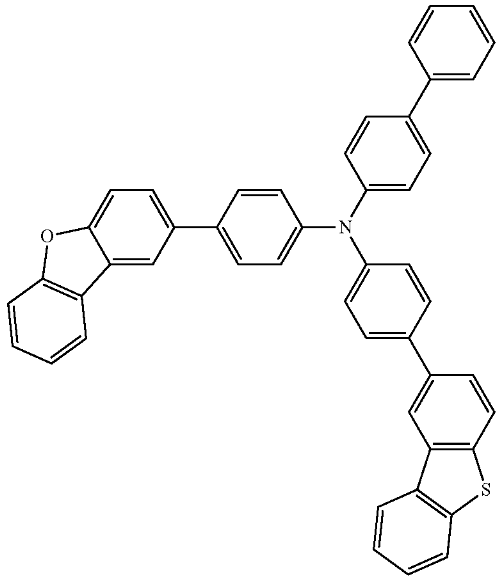
HT22
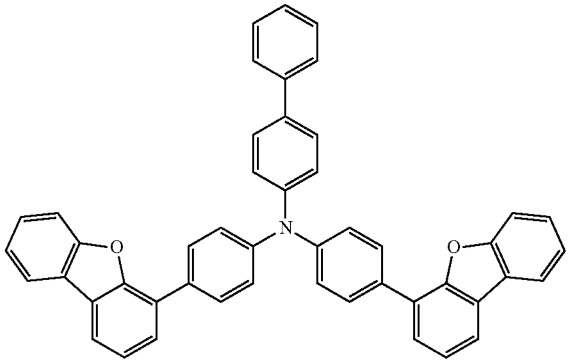
HT23
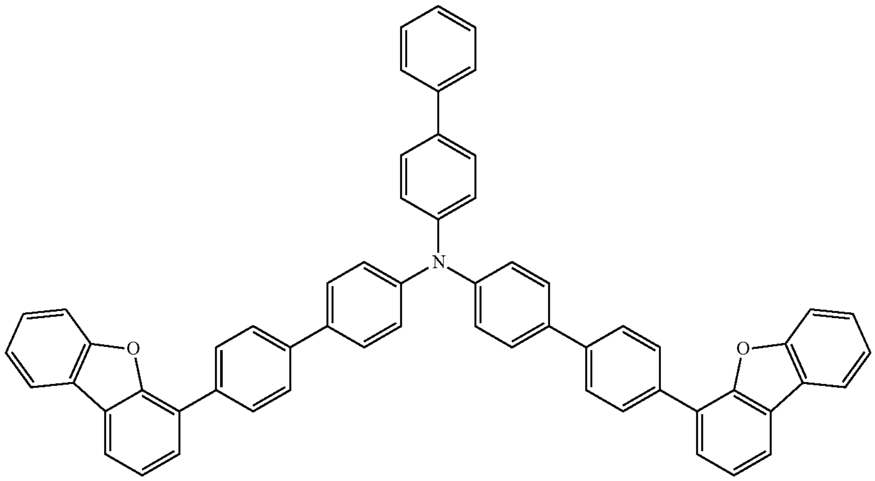
HT24
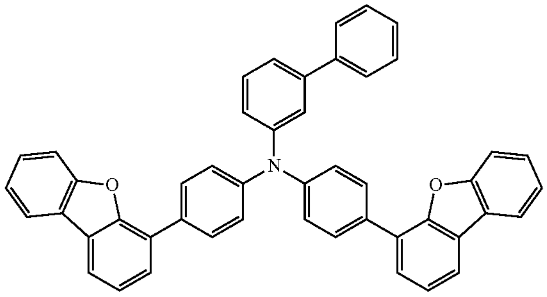
HT25
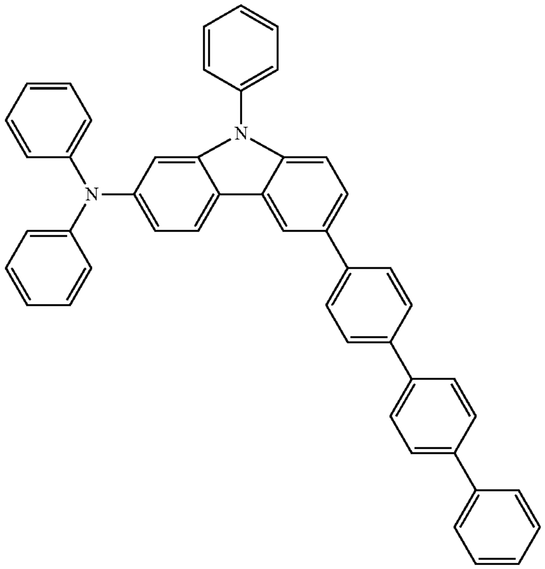

-continued
HT26
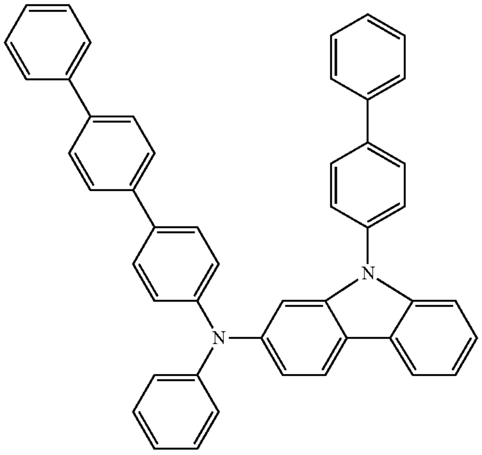
HT27
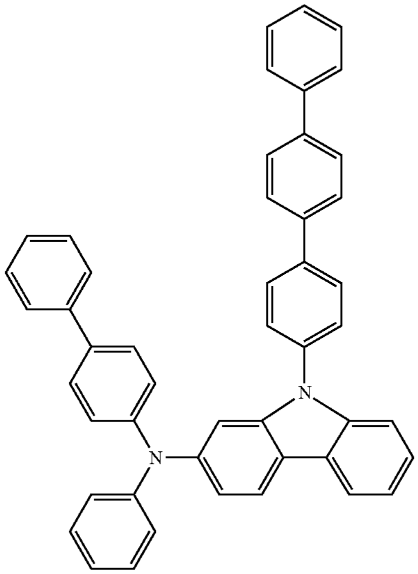
HT28
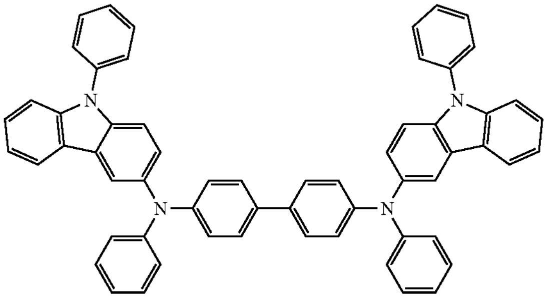
HT29
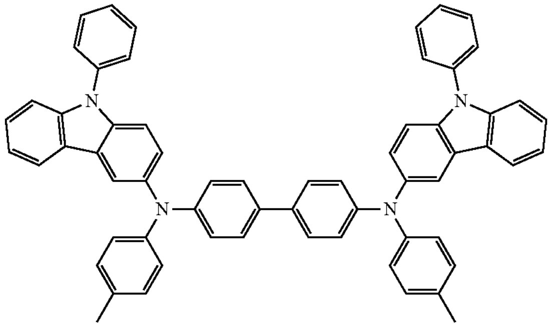
HT30
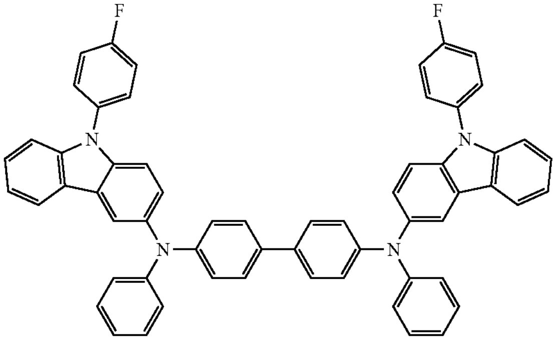
HT31
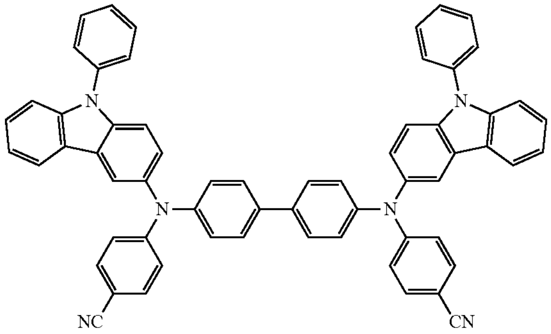

-continued
HT32
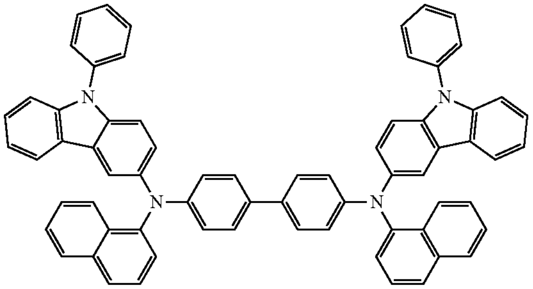
HT33
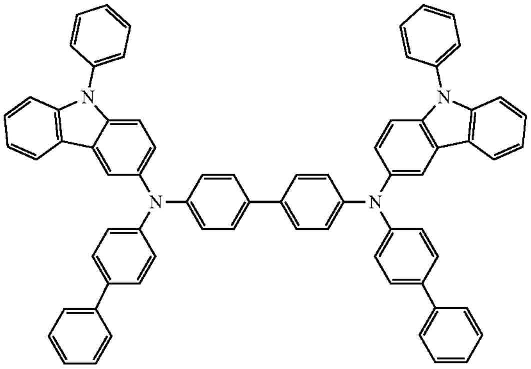
HT34
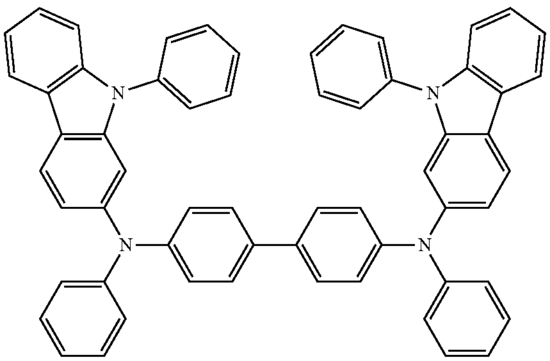
HT35
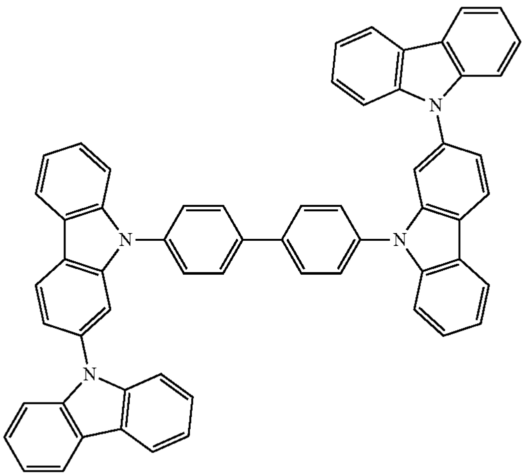
HT36
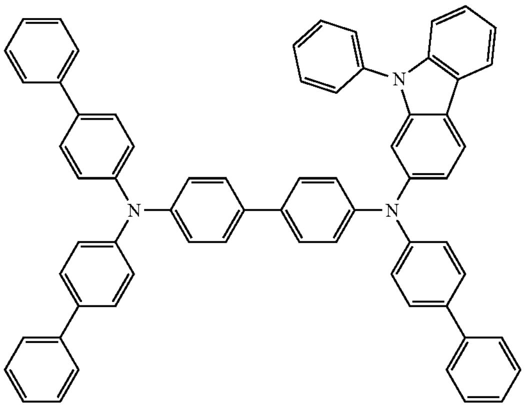
HT37
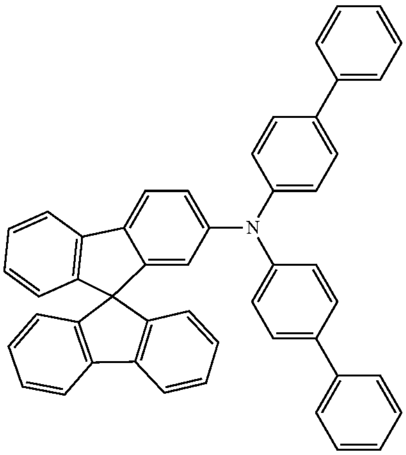

-continued
HT38
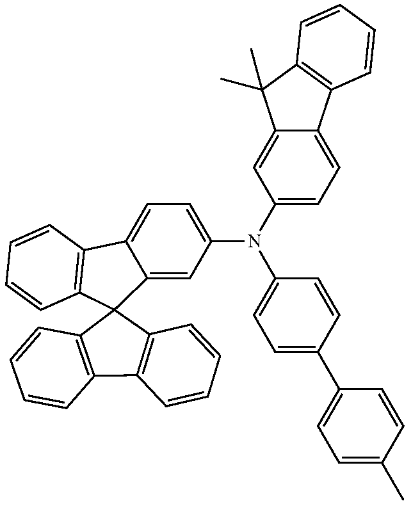
HT39
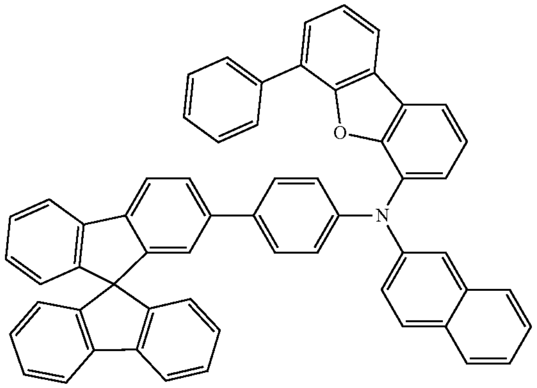
HT40
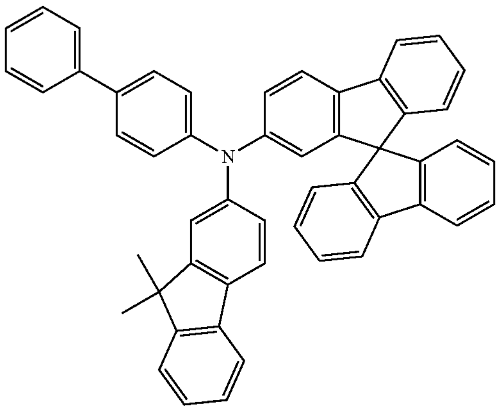
HT41
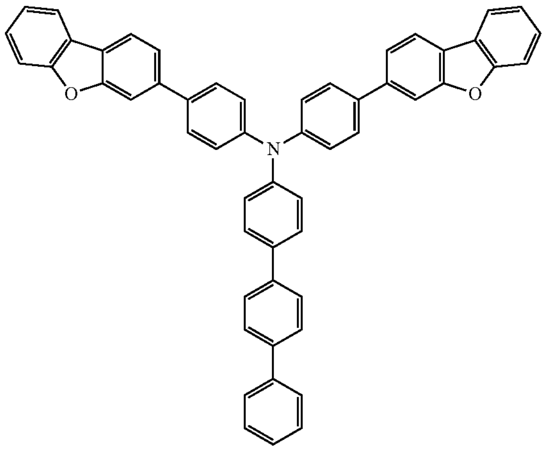
HT42
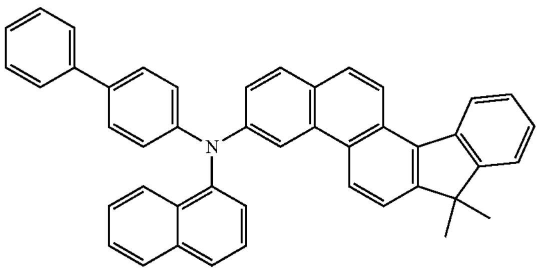
HT43
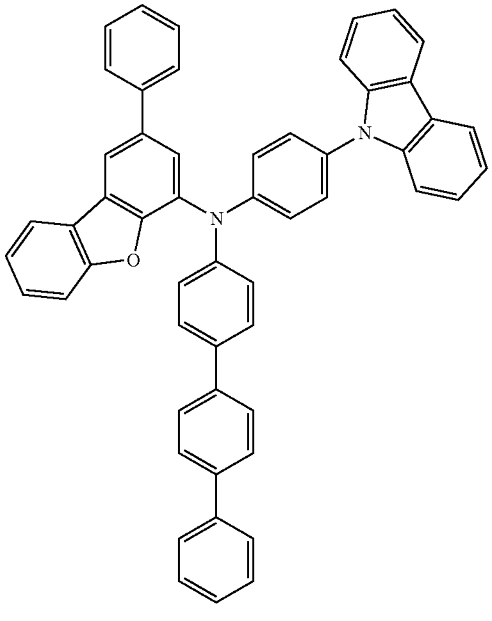

-continued
HT44
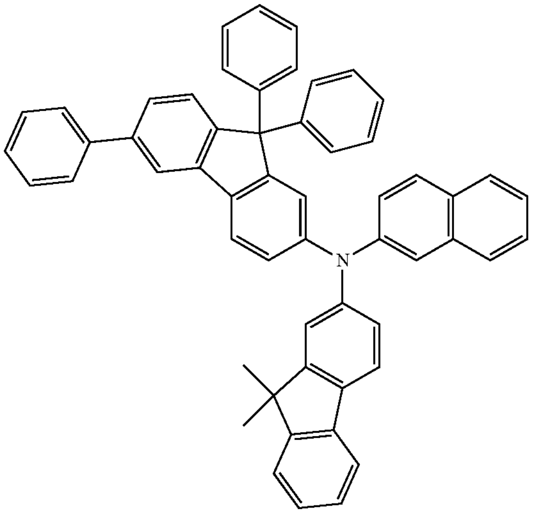
m-MTDATA
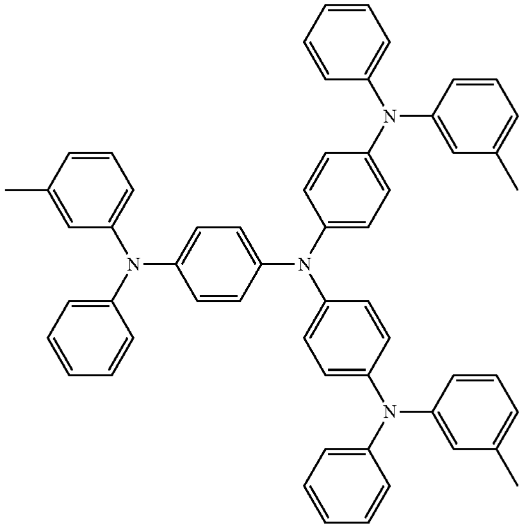
TDATA
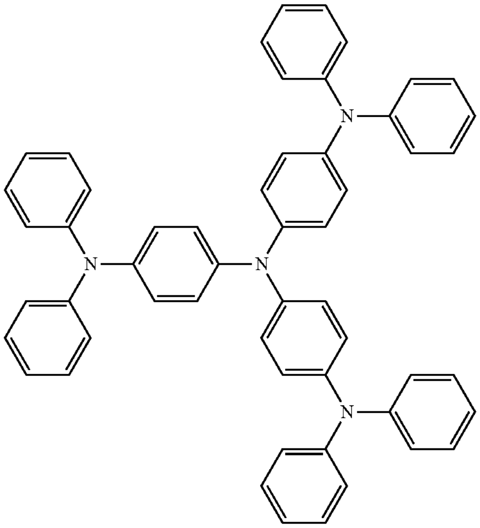
2-TNATA
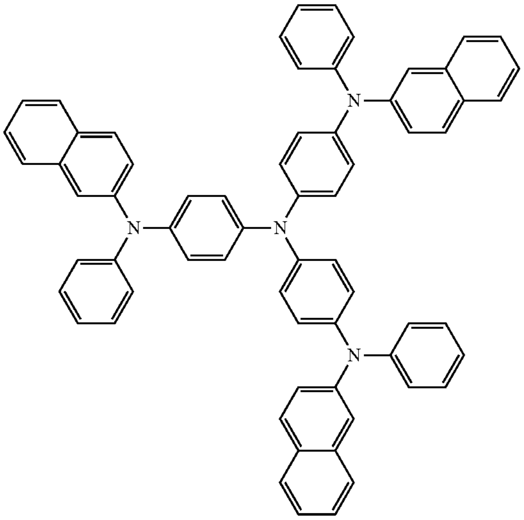
NPB
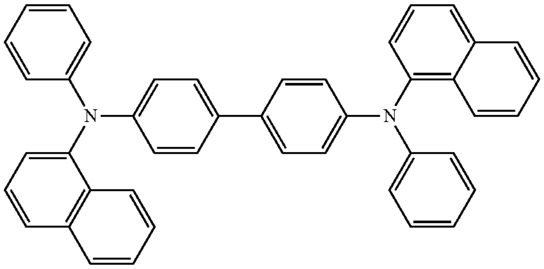
β-NPB
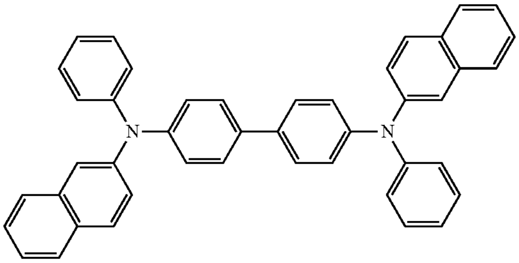

-continued

TPD

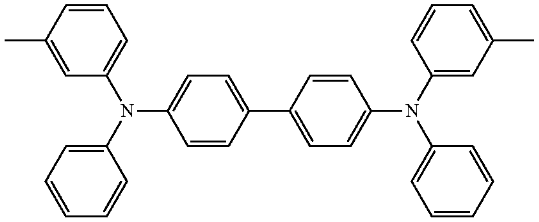

Spiro-TPD

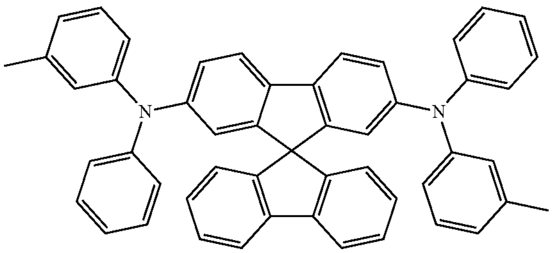

Spiro-NPB

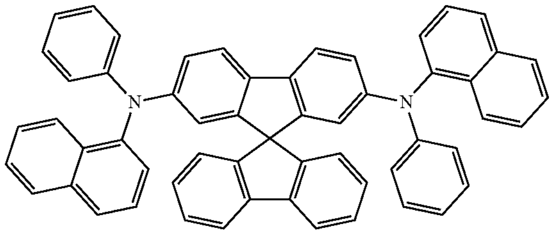

methylated-NPB

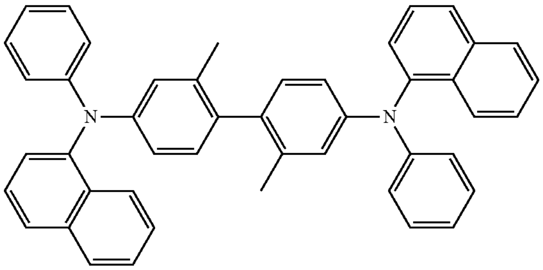

TAPC

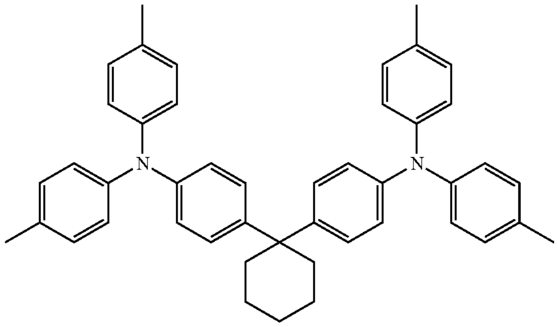

HMTPD

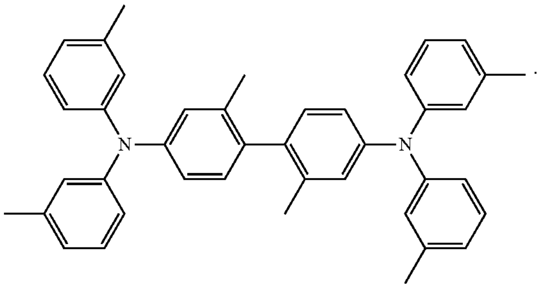

The thickness of the hole transport region may be in a range of about 50 (Angstroms) Å to about 10,000 Å, and in some embodiments, about 100 Å to about 4,000 Å. When the hole transport region includes a hole injection layer, a hole transport layer, or any combination thereof, the thickness of the hole injection layer may be in a range of about 100 Å to about 9,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of their respective ranges, excellent (or improved) hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may each independently include any of the aforementioned materials.

p-Dopant

The hole transport region may include a charge generating material, as well as the aforementioned materials, to improve conductive properties of the hole transport region.

The charge generating material may be substantially homogeneously or non-homogeneously dispersed (for example, as a single layer consisting of charge generating material) in the hole transport region.

The charge generating material may include, for example, a p-dopant.

In some embodiments, a lowest unoccupied molecular orbital (LUMO) energy level of the p-dopant may be −3.5 eV or less.

In some embodiments, the p-dopant may include a quinone derivative, a cyano group-containing compound, elements EL1 and EL2-containing compound, or any combination thereof.

Examples of the quinone derivative may include TCNQ, F4-TCNQ, and the like.

Examples of the cyano group-containing compound include HAT-CN, a compound represented by Formula 221, and the like:

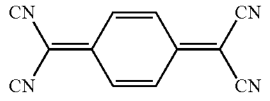

TCNQ

-continued

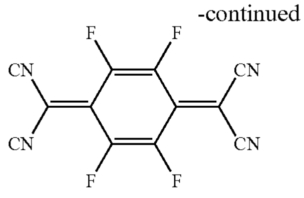

F4-TCNQ

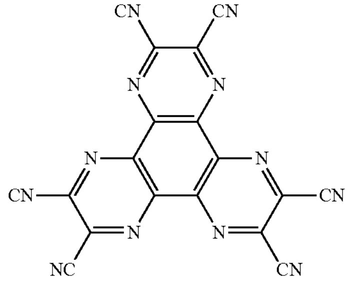

HAT-CN

Formula 221

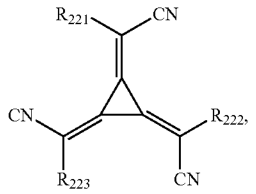

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, each independently substituted with a cyano group; —F; —Cl; —Br; —I; a $C_1$-$C_{20}$ alkyl group substituted with a cyano group, —F, —Cl, —Br, —I, or any combination thereof; or any combination thereof.

In the elements EL1 and EL2-containing compound, element EL1 may be metal, metalloid, or a combination thereof, and element EL2 may be non-metal, metalloid, or a combination thereof.

Non-limiting examples of the metal may include: an alkali metal (e.g., lithium (Li), sodium (Na), potassium (K), rubidium (Rb), cesium (Cs), and/or the like); an alkaline earth metal (e.g., beryllium (Be), magnesium (Mg), calcium (Ca), strontium (Sr), barium (Ba), and/or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (To), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); post-transition metal (e.g., zinc (Zn), indium (In), tin (Sn), and/or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium(Lu), and/or the like); and the like.

Non-limiting examples of the metalloid may include silicon (Si), antimony (Sb), tellurium (Te), and the like.

Non-limiting examples of the non-metal may include oxygen (O), halogen (e.g., F, Cl, Br, I, and the like), and the like.

For example, the elements EL1 and EL2-containing compound may include a metal oxide, a metal halide (e.g., metal fluoride, metal chloride, metal bromide, metal iodide, and/or the like), a metalloid halide (e.g., a metalloid fluoride, a metalloid chloride, a metalloid bromide, a metalloid iodide, and/or the like), a metal telluride, or any combination thereof.

Non-limiting examples of the metal oxide may include tungsten oxide (e.g., WO, $W_2O_3$, $WO_2$, $WO_3$, $W_2O_5$, and/or the like), vanadium oxide (e.g., VO, $V_2O_3$, $VO_2$, $V_2O_5$, and/or the like), molybdenum oxide (MoO, $Mo_2O_3$, $MoO_2$, $MoO_3$, $Mo_2O_5$, and/or the like), rhenium oxide (e.g., $ReO_3$, and/or the like), and the like.

Non-limiting examples of the metal halide may include alkali metal halide, alkaline earth metal halide, transition metal halide, post-transition metal halide, lanthanide metal halide, and the like.

Non-limiting examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Non-limiting examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Non-limiting examples of the transition metal halide may include titanium halide (e.g., $TiF_4$, $TiCl_4$, $TiBr_4$, $TiI_4$, and/or the like), zirconium halide (e.g., $ZrF_4$, $ZrCl_4$, $ZrBr_4$, $ZrI_4$, and/or the like), hafnium halide (e.g., $HfF_4$, $HfCl_4$, $HfBr_4$, $HfI_4$, and/or the like), vanadium halide (e.g., $VF_3$, $VCl_3$, $VBr_3$, $VI_3$, and/or the like), niobium halide (e.g., $NbF_3$, $NbCl_3$, $NbBr_3$, $NbI_3$, and/or the like), tantalum halide (e.g., $TaF_3$, $TaCl_3$, $TaBr_3$, $TaI_3$, and/or the like), chromium halide (e.g., $CrF_3$, $CrCl_3$, $CrBr_3$, $CrI_3$, and/or the like), molybdenum halide (e.g., $MoF_3$, $MoCl_3$, $MoBr_3$, $MoI_3$, and/or the like), tungsten halide (e.g., $WF_3$, $WCl_3$, $WBr_3$, $WI_3$, and/or the like), manganese halide (e.g., $MnF_2$, $MnCl_2$, $MnBr_2$, $MnI_2$, and/or the like), technetium halide (e.g., $TcF_2$, $TcCl_2$, $TcBr_2$, $TcI_2$, and/or the like), rhenium halide (e.g., $ReF_2$, $ReCl_2$, $ReBr_2$, $ReI_2$, and/or the like), iron halide (e.g., $FeF_2$, $FeCl_2$, $FeBr_2$, $FeI_2$, and/or the like), ruthenium halide (e.g., $RuF_2$, $RuCl_2$, $RuBr_2$, $RuI_2$, and/or the like), osmium halide (e.g., $OsF_2$, $OsCl_2$, $OsBr_2$, $OsI_2$, and/or the like), cobalt halide (e.g., $CoF_2$, $CoCl_2$, $CoBr_2$, $CoI_2$, and/or the like), rhodium halide (e.g., $RhF_2$, $RhCl_2$, $RhBr_2$, $RhI_2$, and/or the like), iridium halide (e.g., $IrF_2$, $IrCl_2$, $IrBr_2$, $IrI_2$, and/or the like), nickel halide (e.g., $NiF_2$, $NiCl_2$, $NiBr_2$, $NiI_2$, and/or the like), palladium halide (e.g., $PdF_2$, $PdCl_2$, $PdBr_2$, $PdI_2$, and/or the like), platinum halide (e.g., $PtF_2$, $PtCl_2$, $PtBr_2$, $PtI_2$, and/or the like), copper halide (e.g., CuF, CuCl, CuBr, CuI, and/or the like), silver halide (e.g., AgF, AgCl, AgBr, AgI, and/or the like), gold halide (e.g., AuF, AuCl, AuBr, AuI, and/or the like), and the like.

Non-limiting examples of the post-transition metal halide may include zinc halide (e.g., $ZnF_2$, $ZnCl_2$, $ZnBr_2$, $ZnI_2$, and/or the like), indium halide (e.g., $InI_3$ and/or the like), tin halide (e.g., $SnI_2$ and/or the like), and the like.

Non-limiting examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and the like.

Non-limiting examples of the metalloid halide may include antimony halide (e.g., $SbCl_5$ and/or the like) and the like.

Non-limiting examples of the metal telluride may include alkali metal telluride (e.g., $Li_2Te$, $Na_2Te$, $K_2Te$, $Rb_2Te$, $Cs_2Te$, and/or the like), alkaline earth metal telluride (e.g., BeTe, MgTe, CaTe, SrTe, BaTe, and/or the like), transition metal telluride (e.g., $TiTe_2$, $ZrTe_2$, $FIfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and/or the like), post-transition metal telluride (e.g., ZnTe and/or the like), lanthanide metal telluride (e.g., LaTe, CeTe, PrTe, NdTe, PmTe, EuTe, GdTe, TbTe, DyTe, HoTe, ErTe, TmTe, YbTe, LuTe, and/or the like), and the like.

Emission Layer in Interlayer 130

When the light-emitting device 10 is a full color light-emitting device, the emission layer may be patterned into a red emission layer, a green emission layer, and/or a blue emission layer, according to a sub-pixel. In one or more embodiments, the emission layer may have a stacked structure. The stacked structure may include two or more layers selected from a red emission layer, a green emission layer, and a blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

In some embodiments, the emission layer may include a host and a dopant (or an emitter). In some embodiments, the emission layer may further include an ancillary dopant that promotes energy transfer to a dopant (or an emitter), in addition to the host and the dopant (or the emitter). When the emission layer includes the dopant (or the emitter) and the ancillary dopant, the dopant (or the emitter) may be different from the ancillary dopant.

The first compound may serve as the dopant (or the emitter) or as the ancillary dopant.

The amount of the dopant (or the emitter) in the emission layer may be in a range of about 0.01 parts to about 15 parts by weight based on 100 parts by weight of the host.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Host

The host in the emission layer may include the second compound, the third compound, or any combination thereof.

In some embodiments, the host may further include a compound represented by Formula 301:

$$[Ar_{301}]_{xb11}\text{-}[(L_{301})_{xb1}\text{-}R_{301}]_{xb21},$$ Formula 301 wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each be understood by referring to the description of $Q_1$ provided herein.

In some embodiments, when xb11 in Formula 301 is 2 or greater, at least two $Ar_{301}$(s) may be bound via a single bond.

In some embodiments, the host may include a compound represented by Formula 301-1, a compound represented by Formula 301-2, or any combination thereof:

Formula 301-1

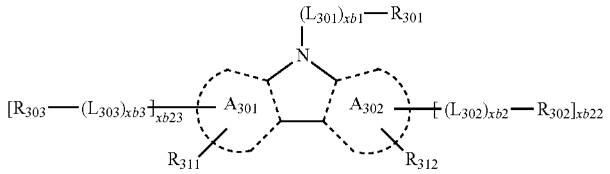

Formula 301-2

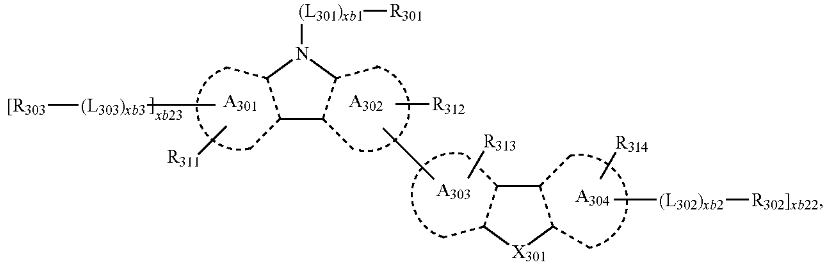

wherein, in Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may respectively be understood by referring to the descriptions of $L_{301}$, xb1, and $R_{301}$ provided herein, $L_{302}$ to $L_{304}$ may each be understood by referring to the description of $L_{301}$ provided herein, xb2 to xb4 may each be understood by referring to the description of xb1 provided herein, and $R_{302}$ to $R_{305}$ and $R_{311}$ to $R_{314}$ may each be understood by referring to the description of $R_{301}$ provided herein.

In some embodiments, the host may include an alkaline earth metal complex. For example, the host may include a Be complex (e.g., Compound H55), a Mg complex, a Zn complex, or any combination thereof.

In some embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

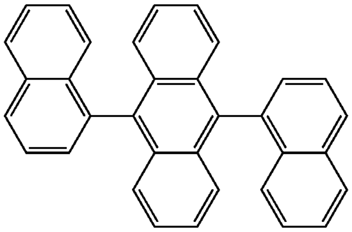

H2

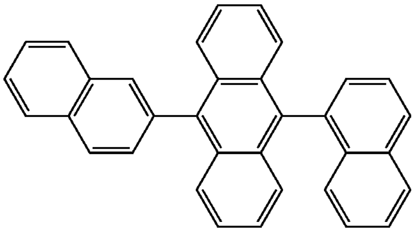

H3

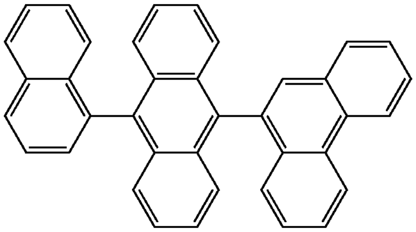

H4

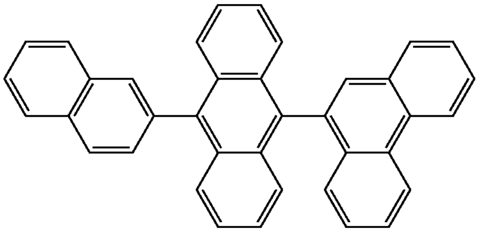

H5

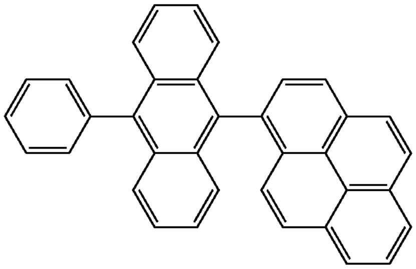

H6

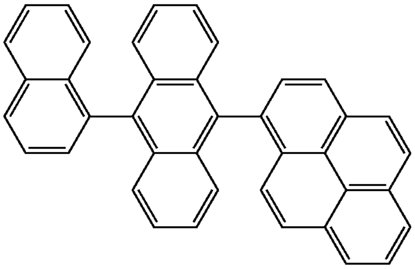

H7

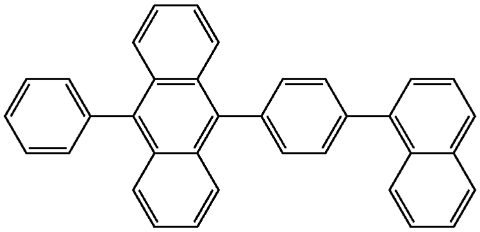

H8

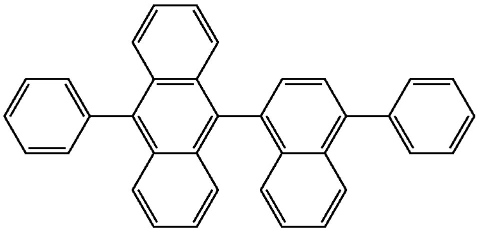

H9

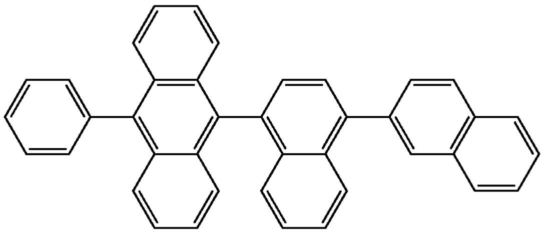

H10

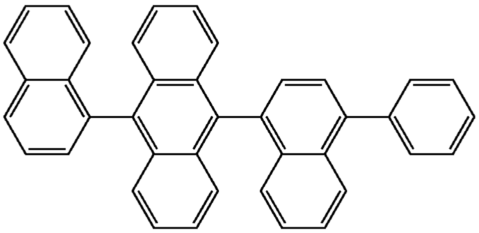

-continued
H11
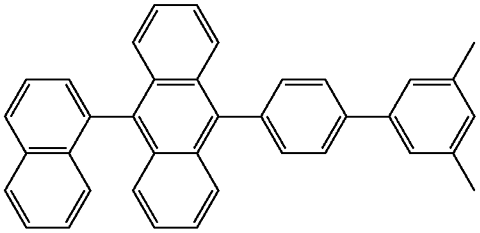
H12
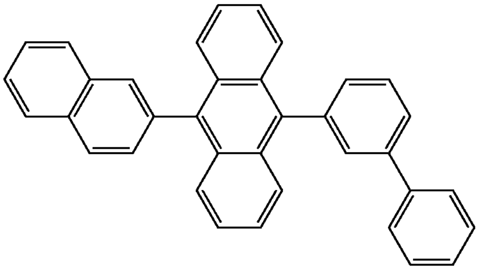
H13
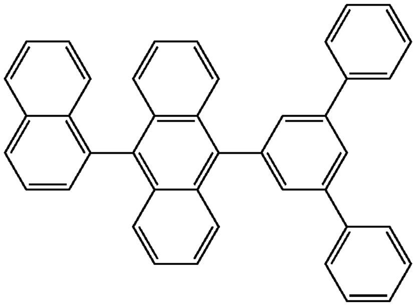
H14
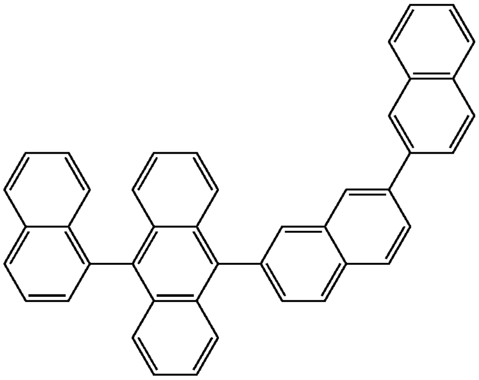
H15
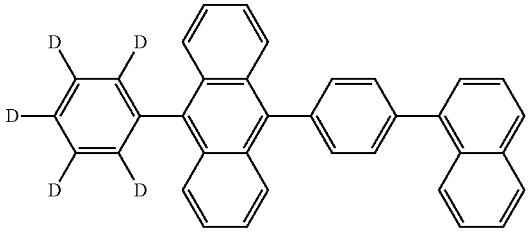
H16
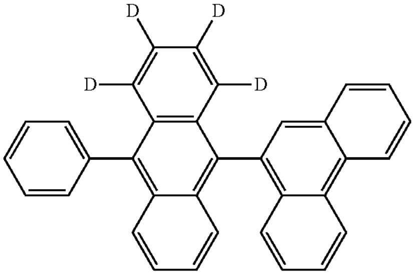
H17
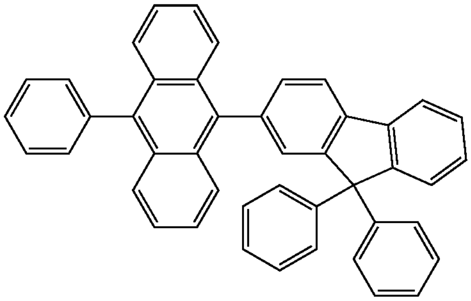
H18
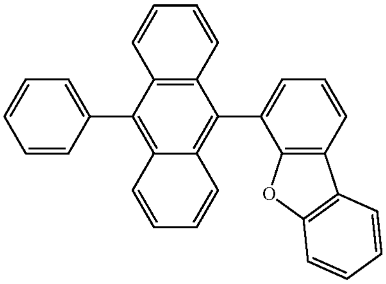
H19
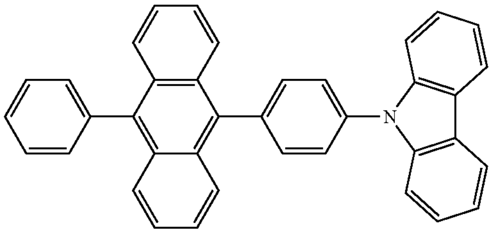
H20
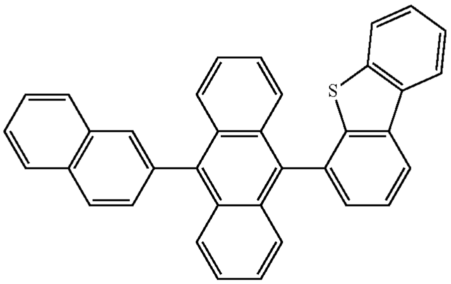

-continued
H21
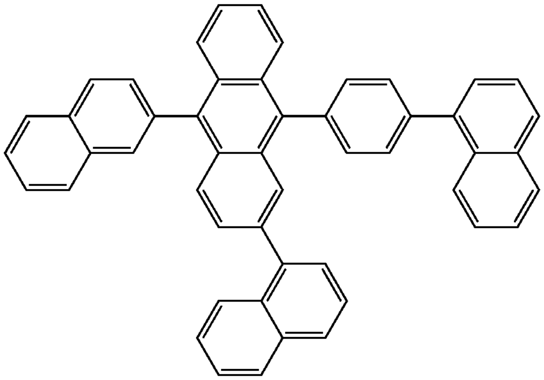
H22
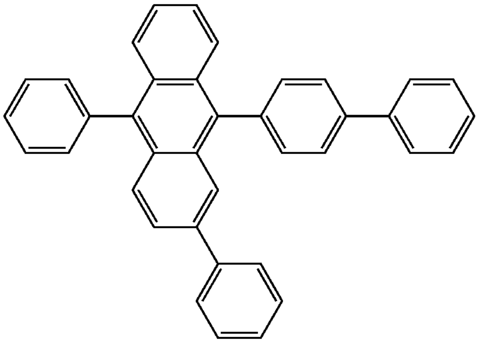
H23
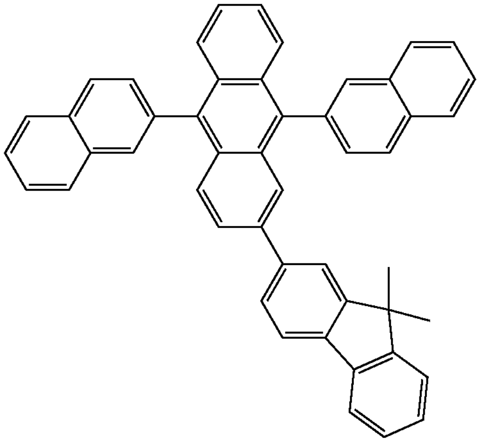
H24
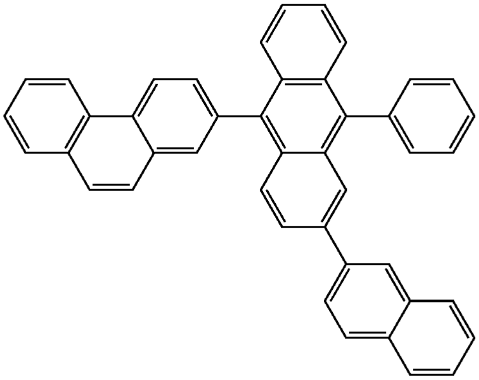
H25
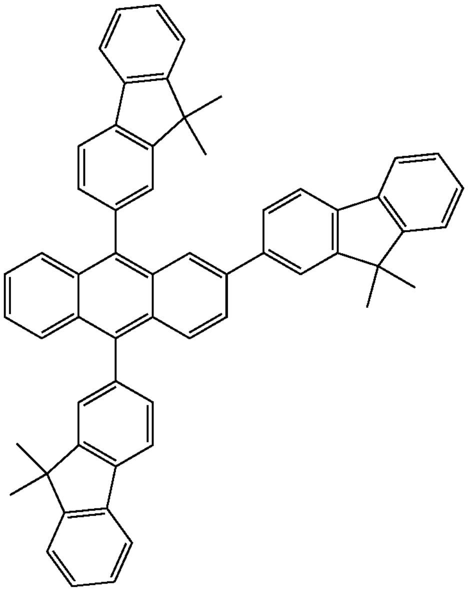
H26
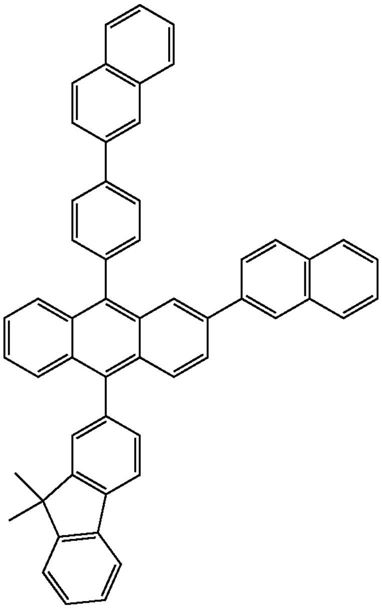

-continued
H27
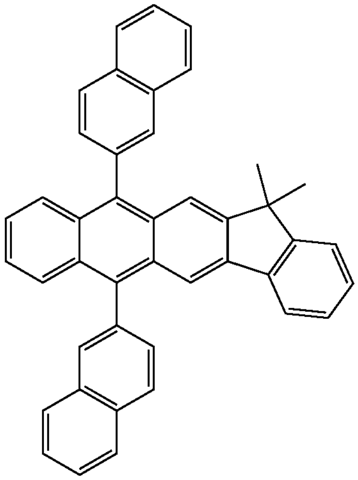
H28
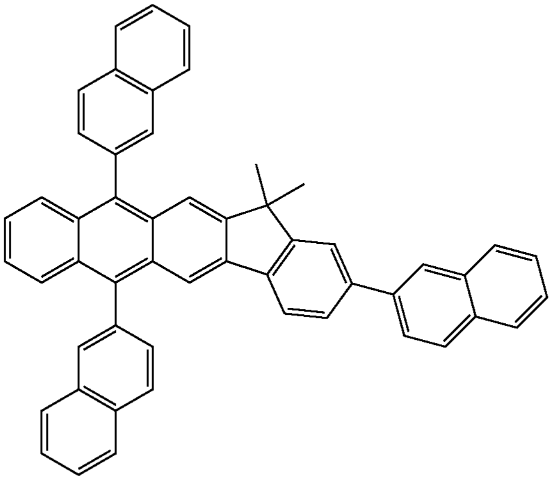
H29
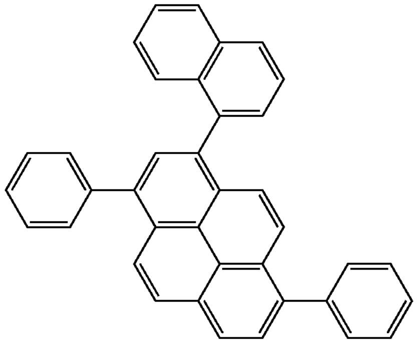
H30
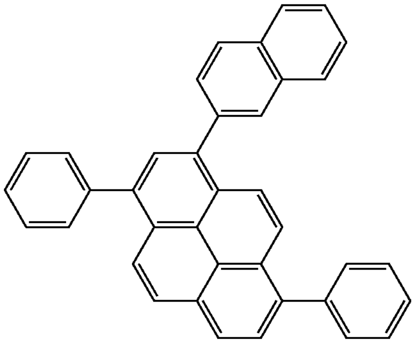
H31
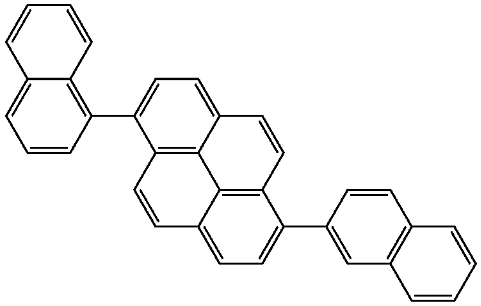
H32
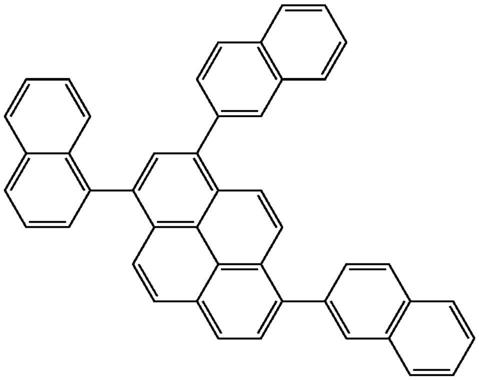
H33
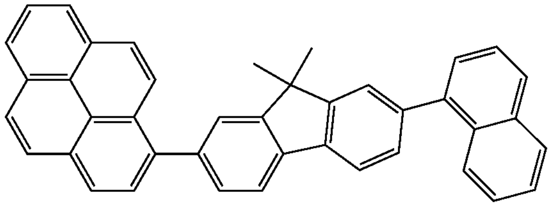
H34
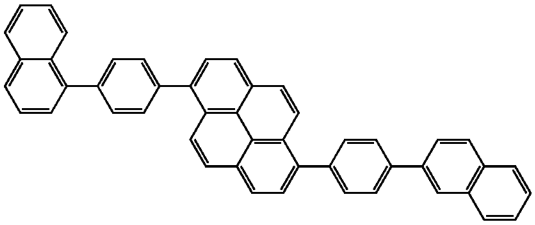

-continued
H35
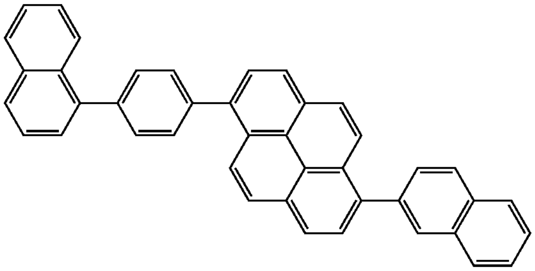
H36
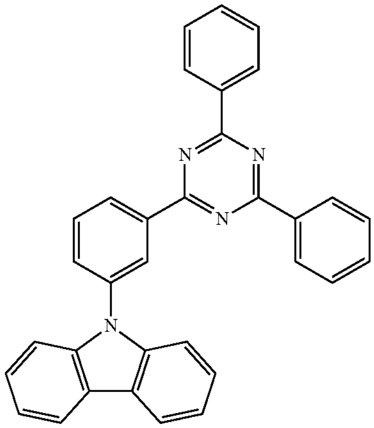
H37
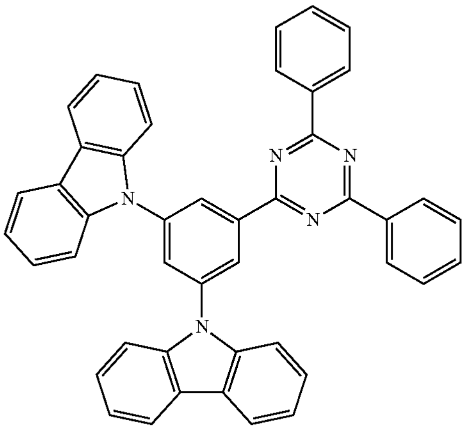
H38
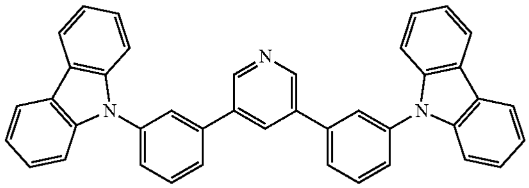
H39
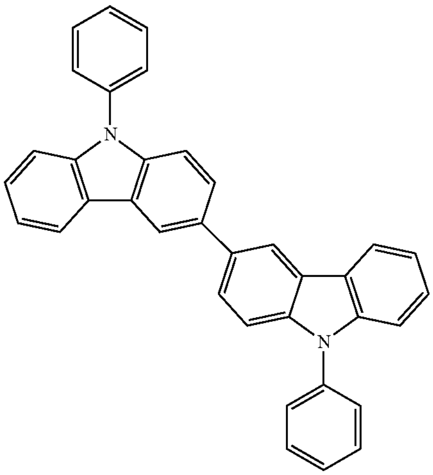
H40
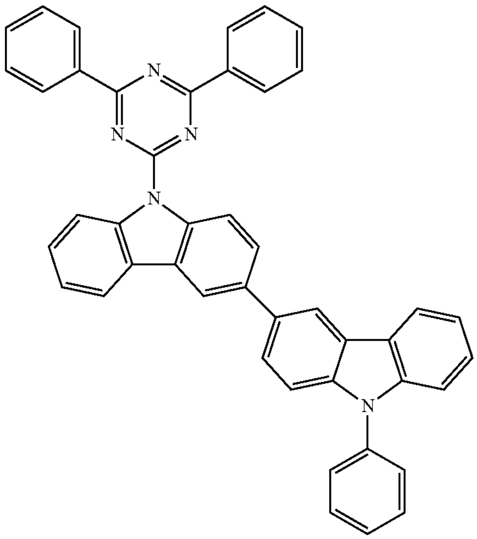

-continued
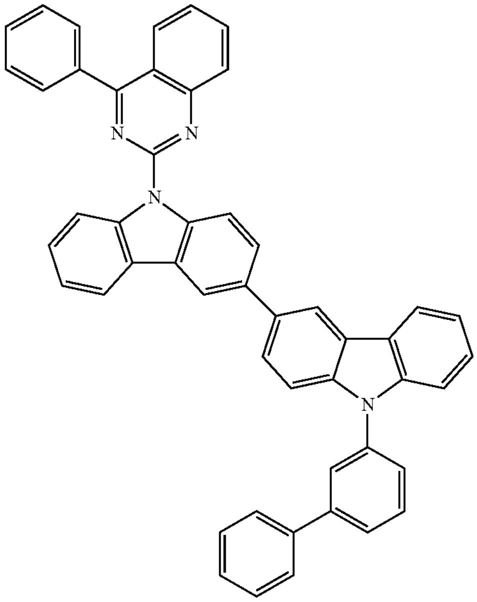
H41
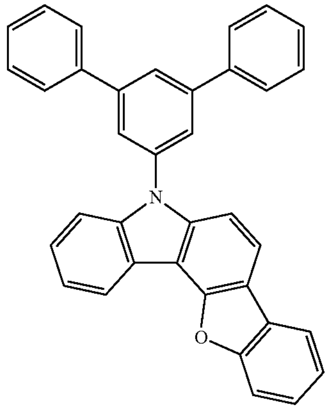
H42
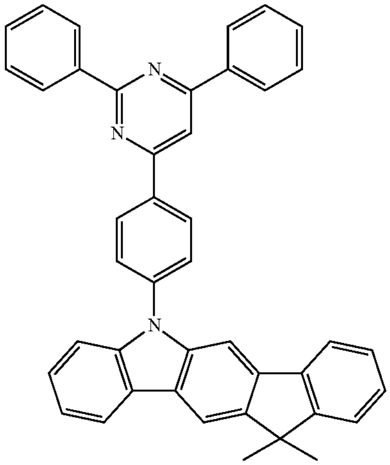
H43
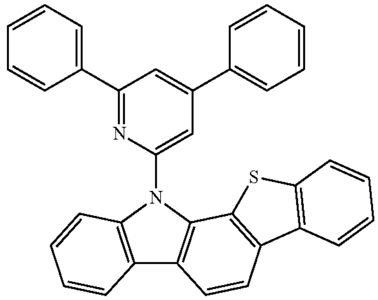
H44
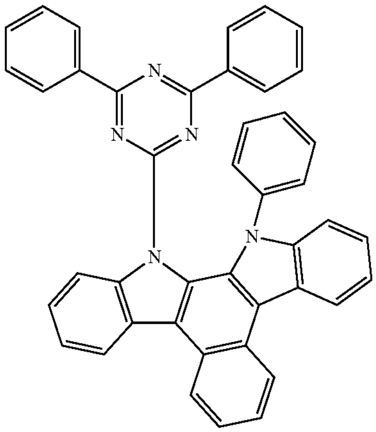
H45
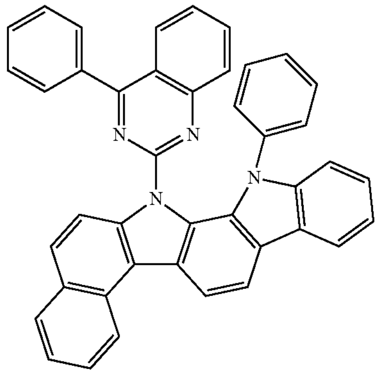
H46

-continued
H47
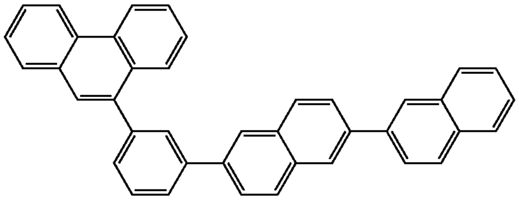
H48
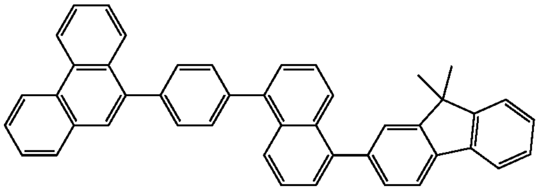
H49
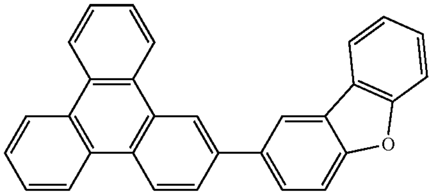
H50
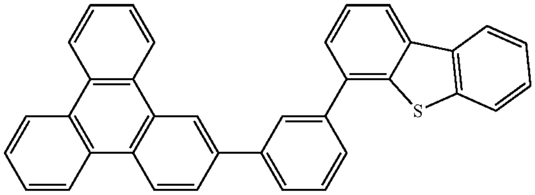
H51
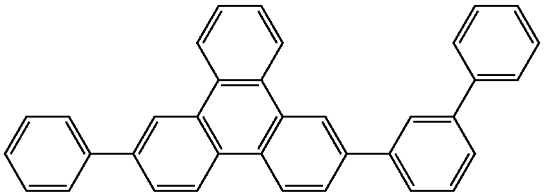
H52
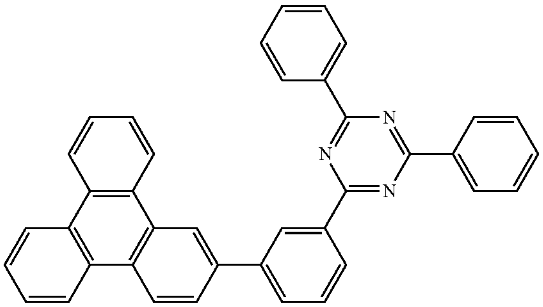
H53
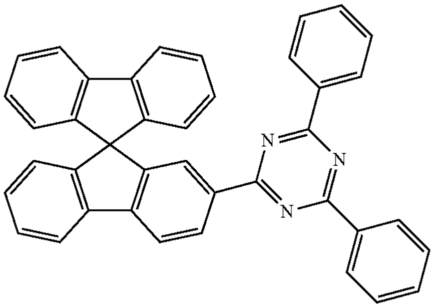
H54
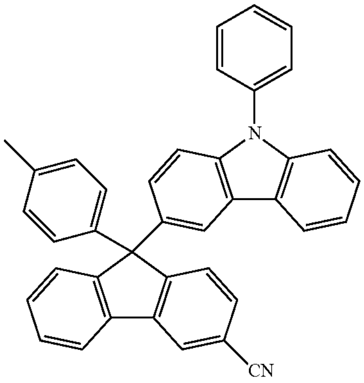
H55
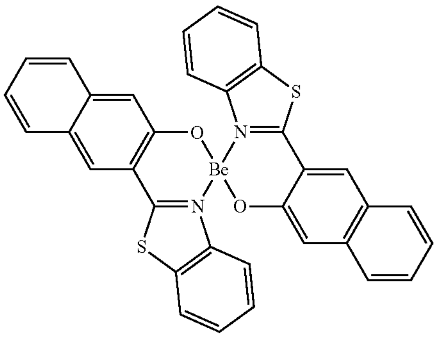
H56
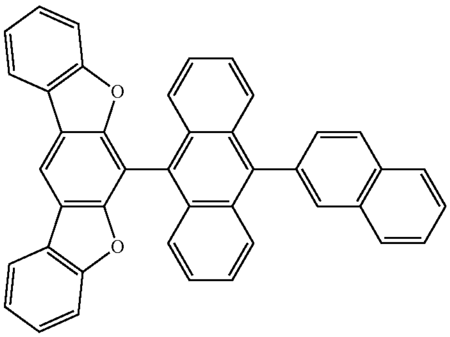

-continued
H57
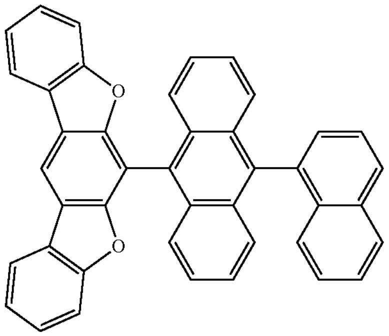
H58
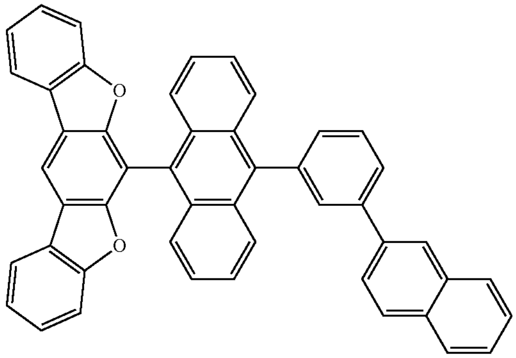
H59
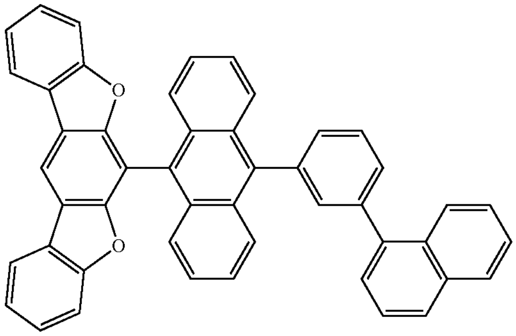
H60
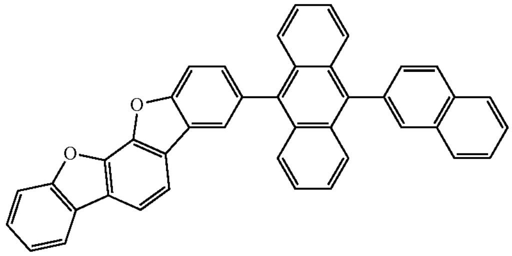
H61
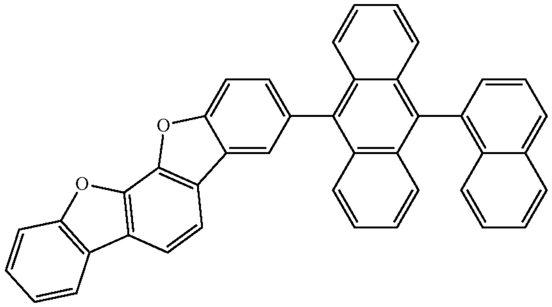
H62
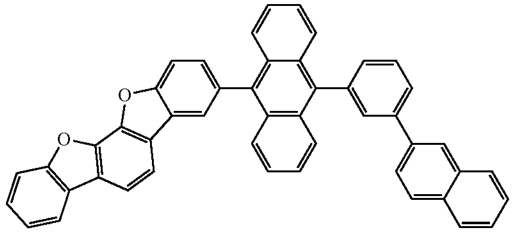
H63
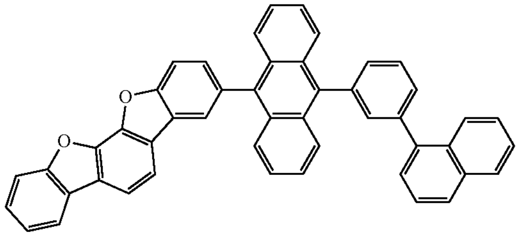
H64
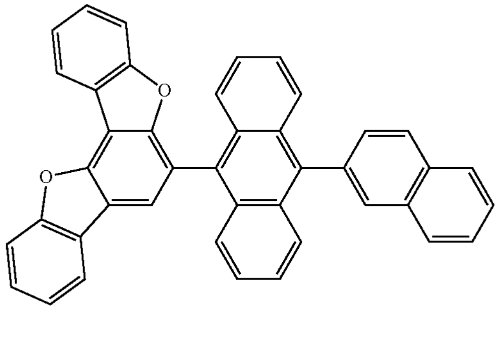

-continued
H65
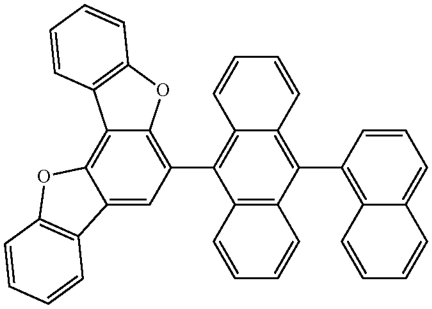
H66
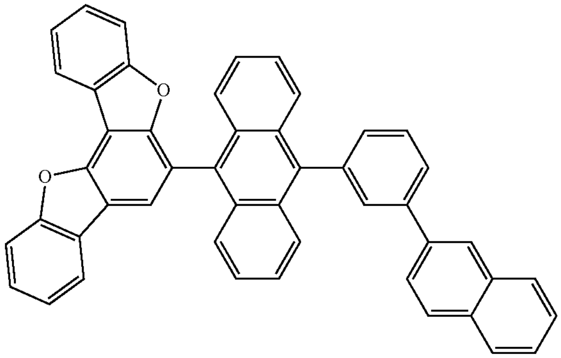
H67
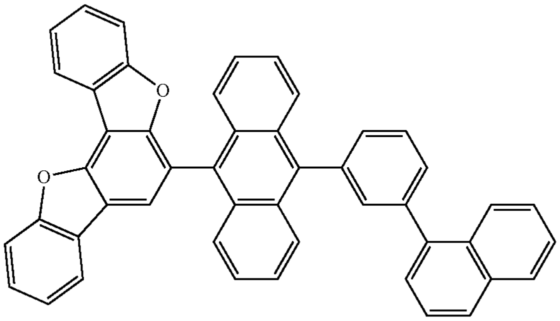
H68
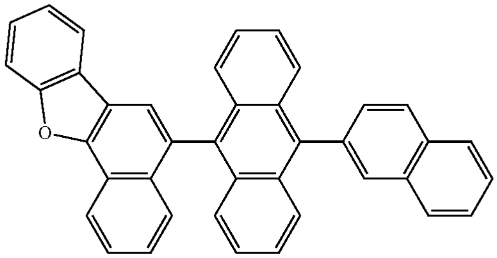
H69
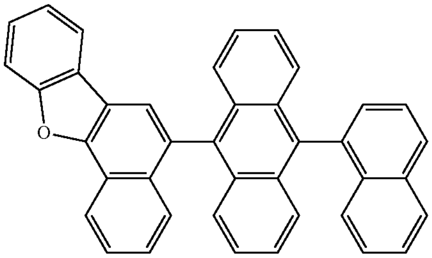
H70
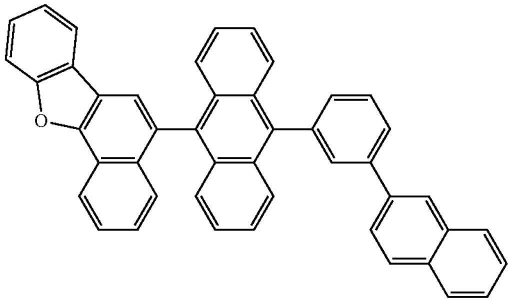
H71
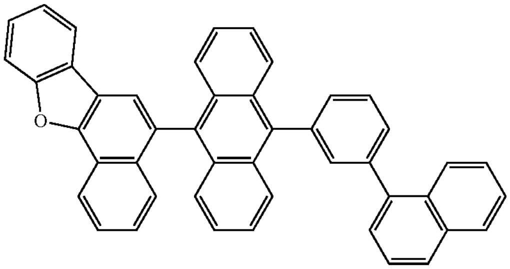
H72
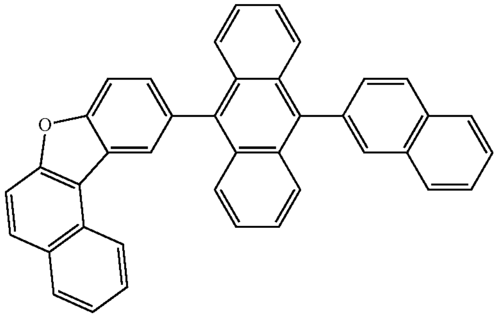

-continued
H73
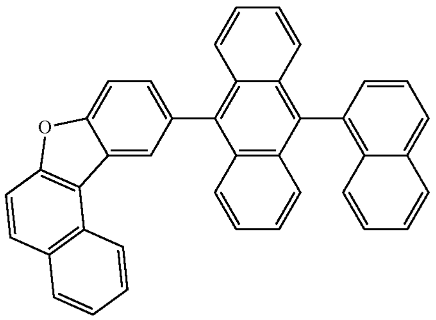
H74
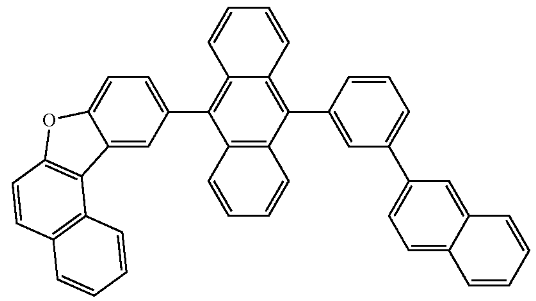
H75
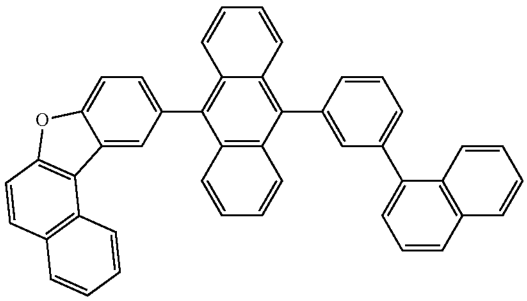
H76
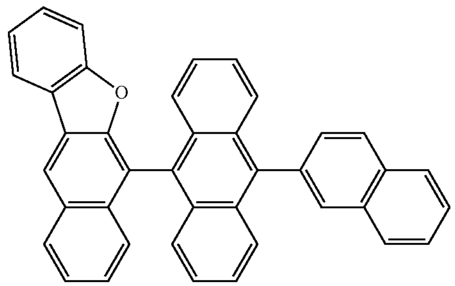
H77
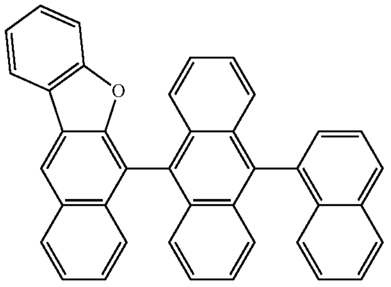
H78
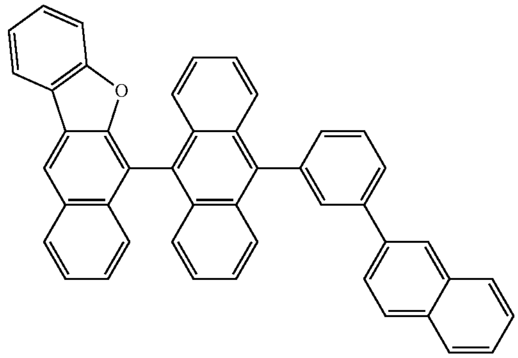
H79
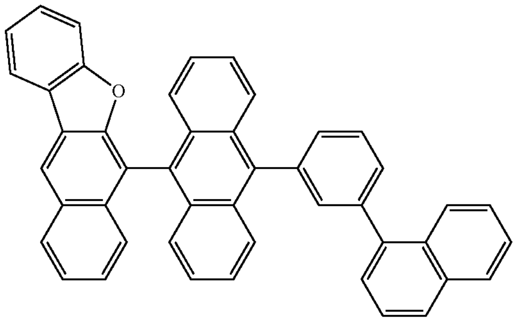
H80
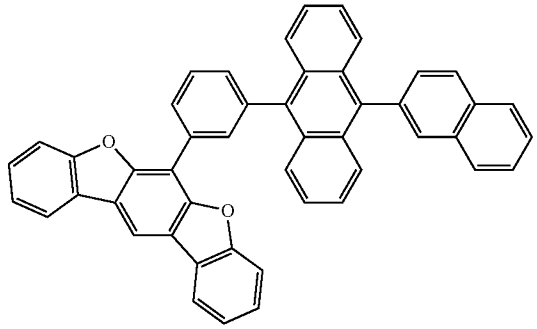

-continued
H81
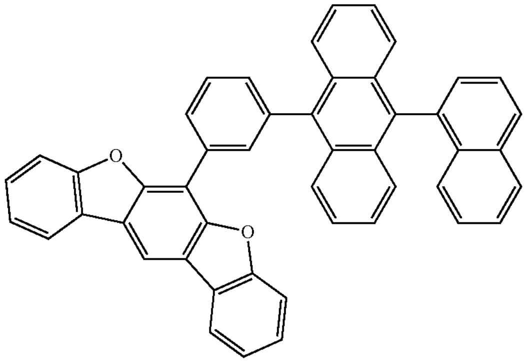
H82
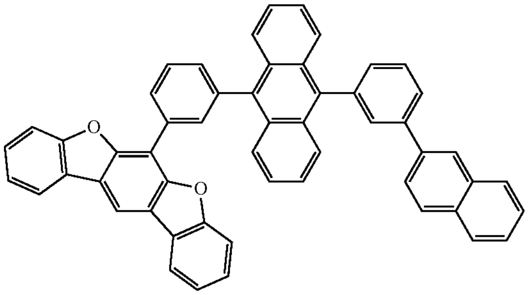
H83
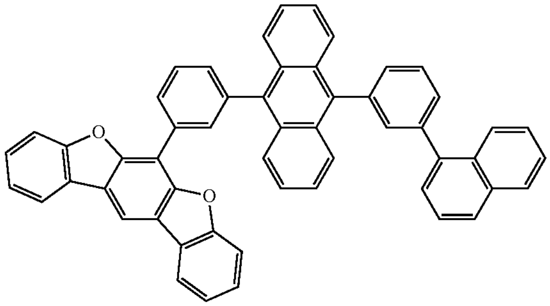
H84
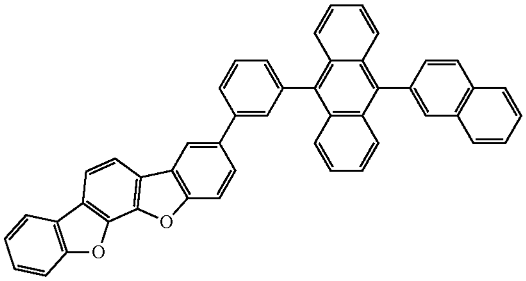
H85
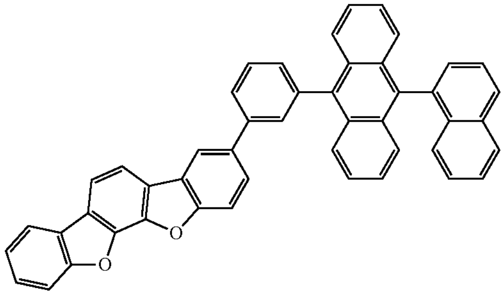
H86
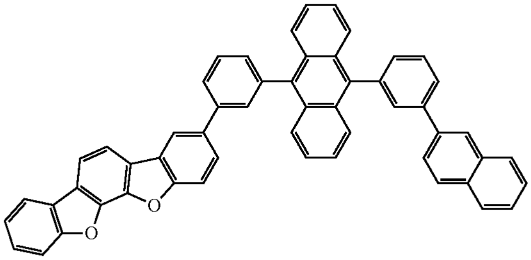
H87
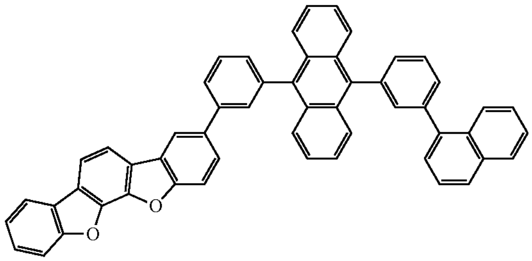
H88
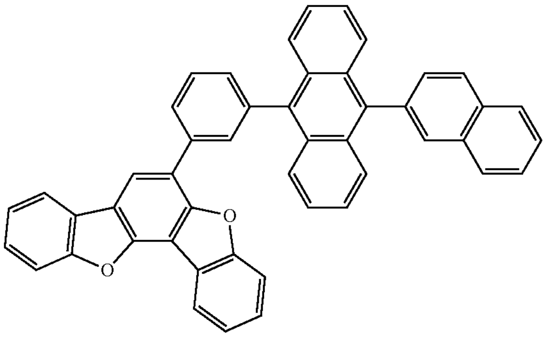

-continued
H89
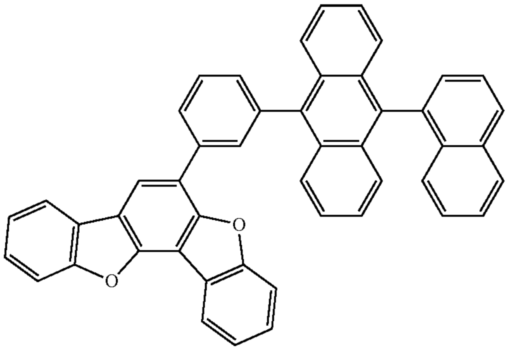
H90
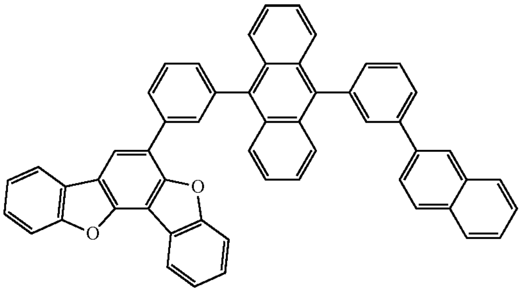
H91
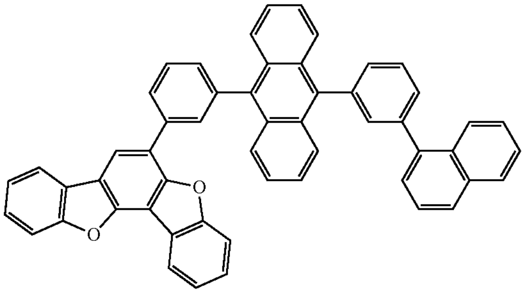
H92
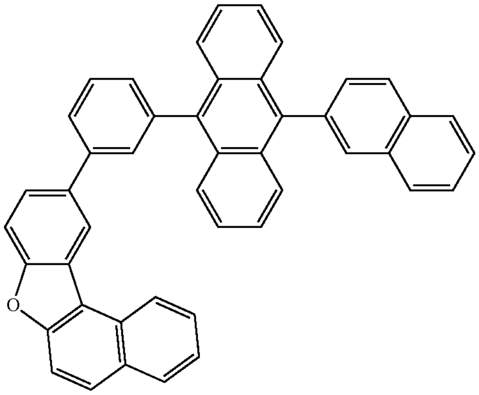
H93
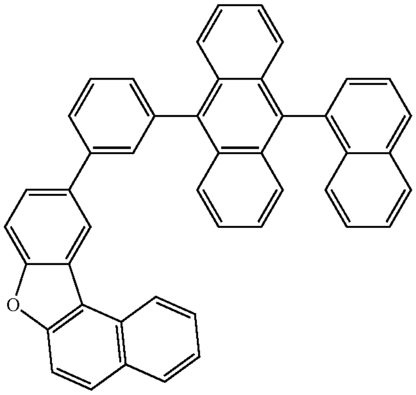
H94
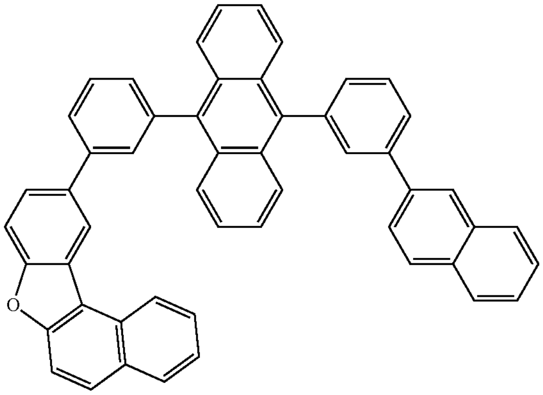
H95
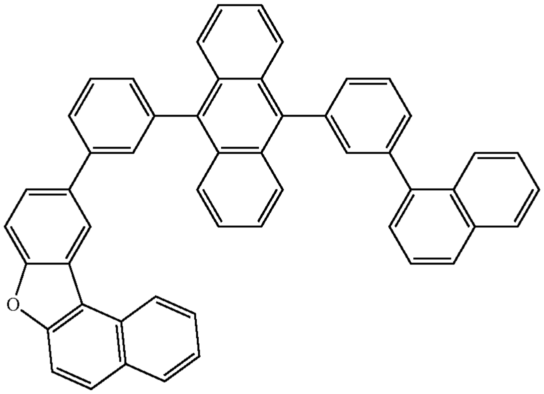
H96
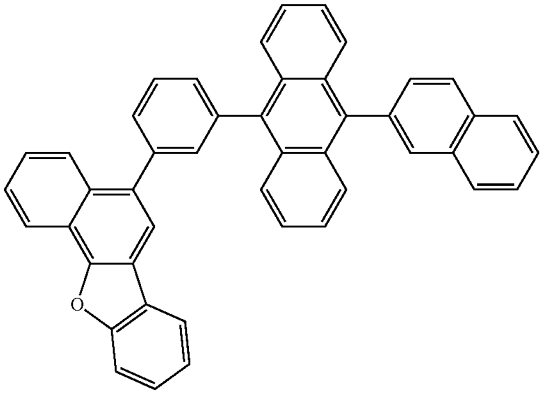

-continued
H97
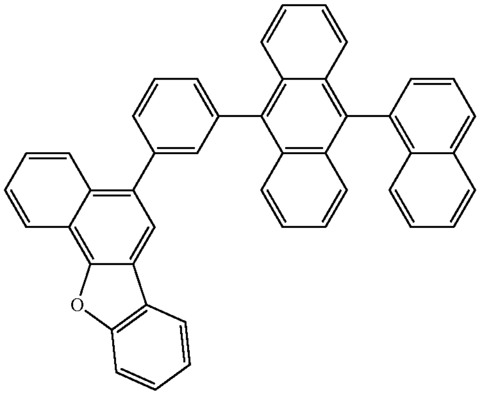
H98
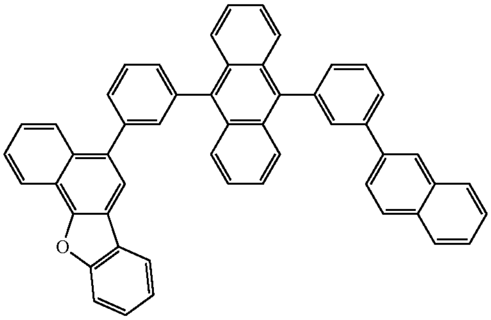
H99
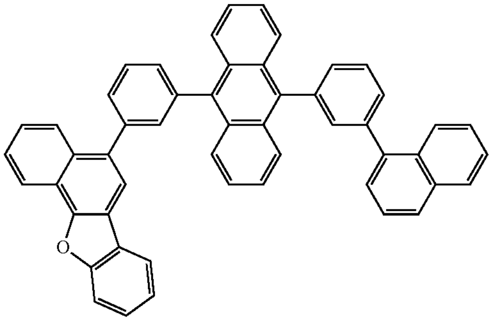
H100
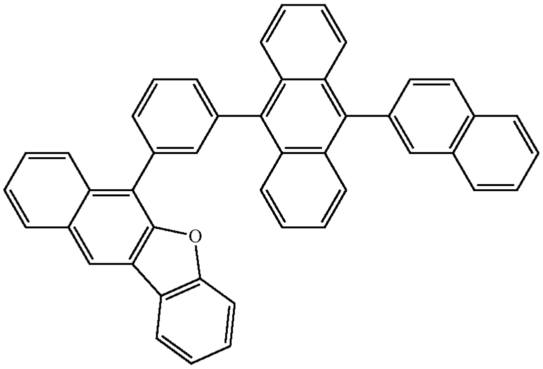
H101
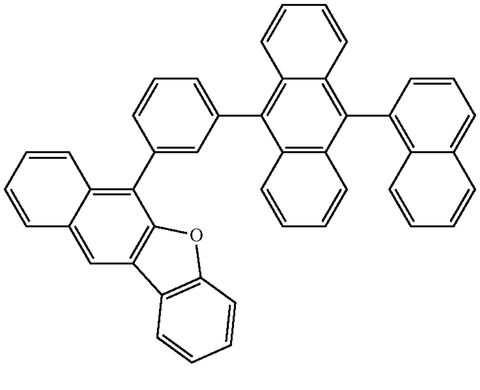
H102
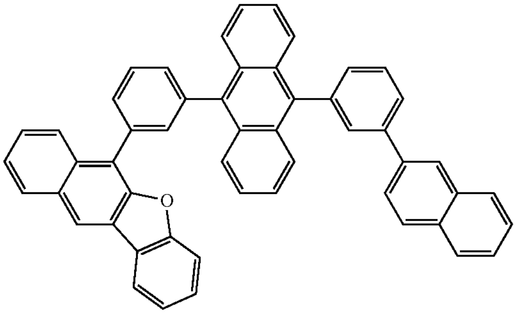
H103
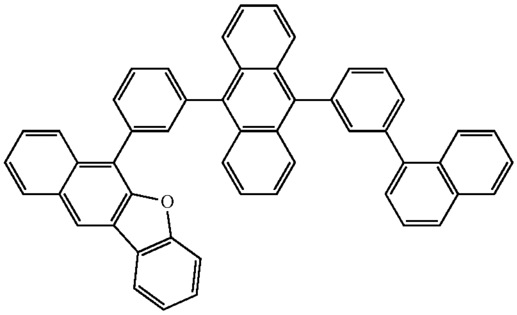
H104
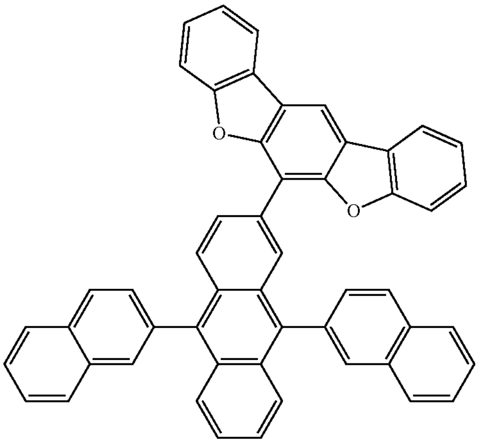

-continued
H105
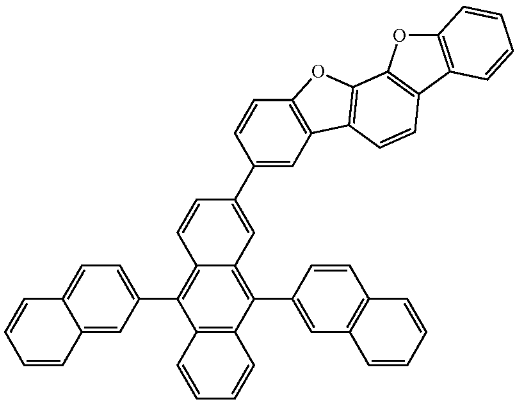
H106
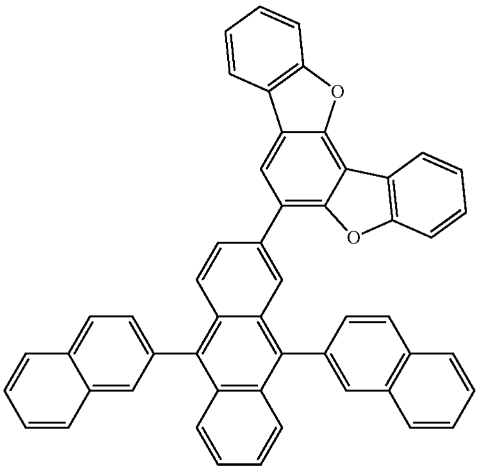
H107
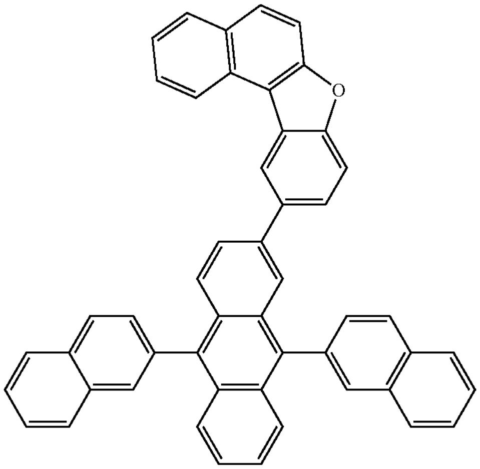
H108
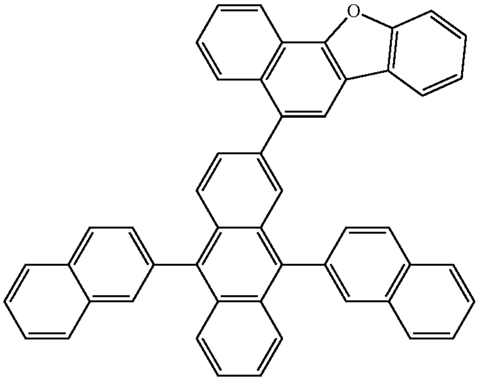
H109
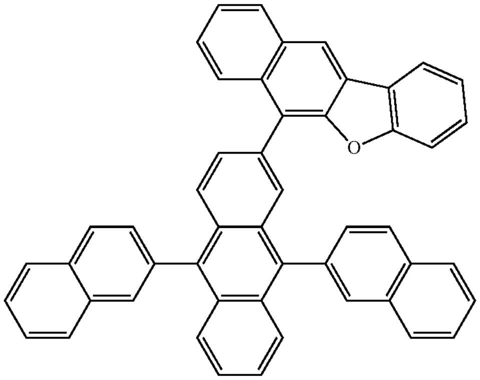
H110
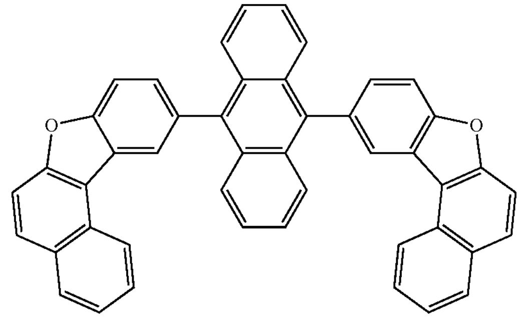
H111
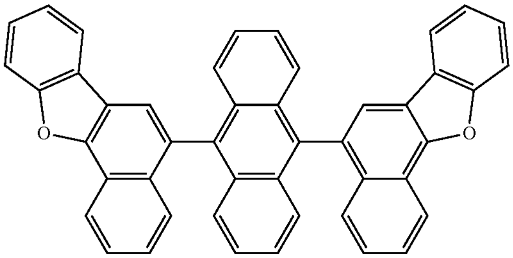
H112
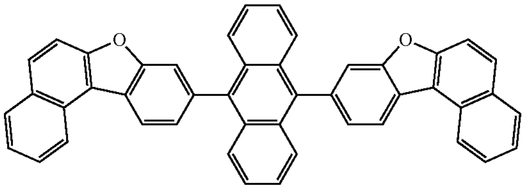

-continued
H113
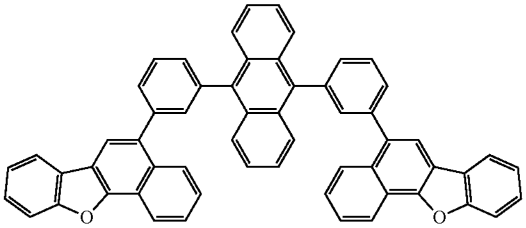
H114
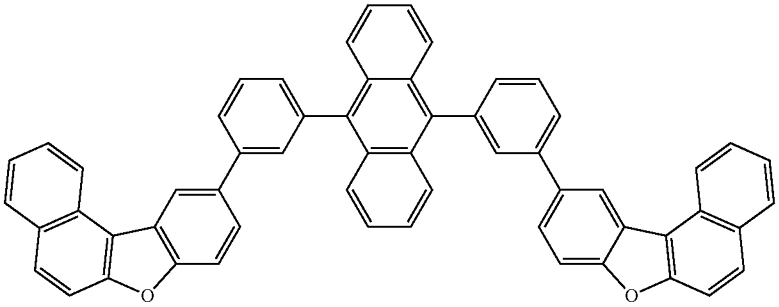
H115
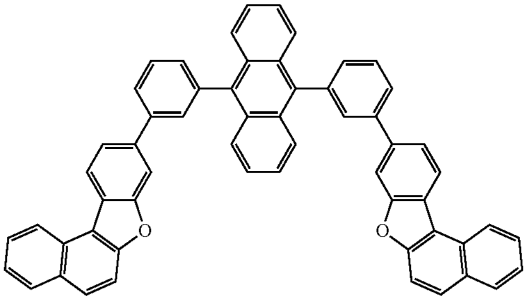
H116
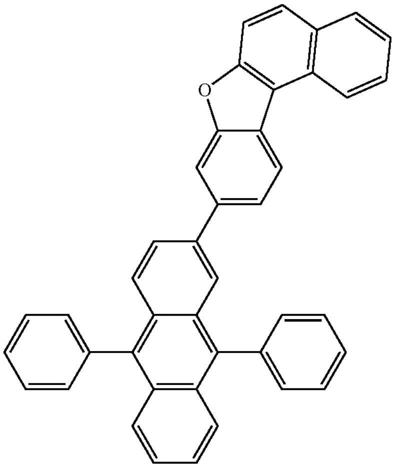
H117
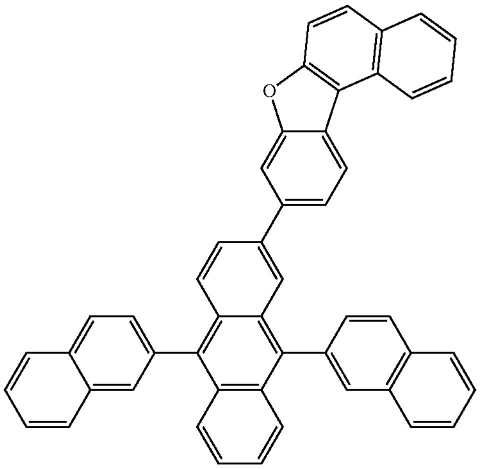
H118
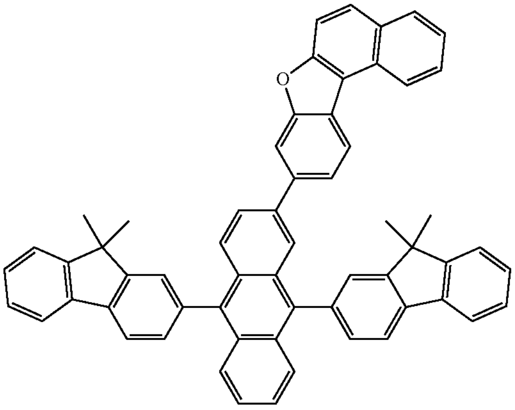

-continued
H119
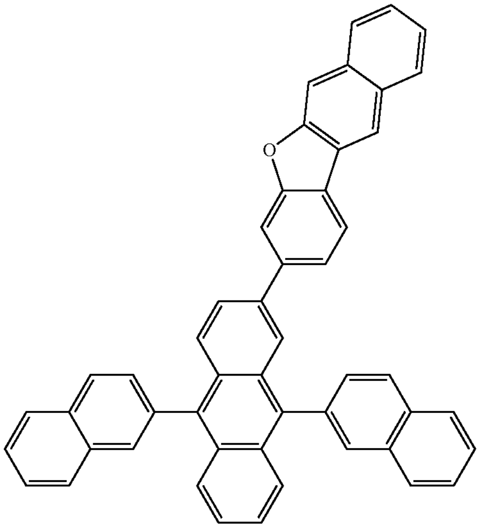
H120
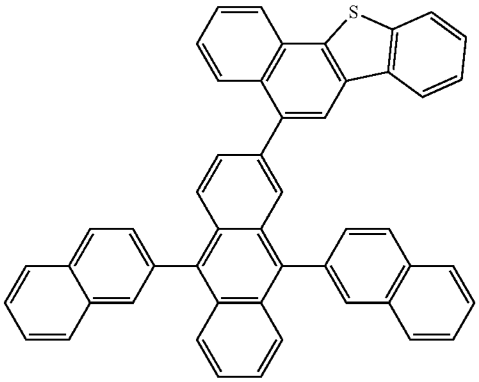
H121
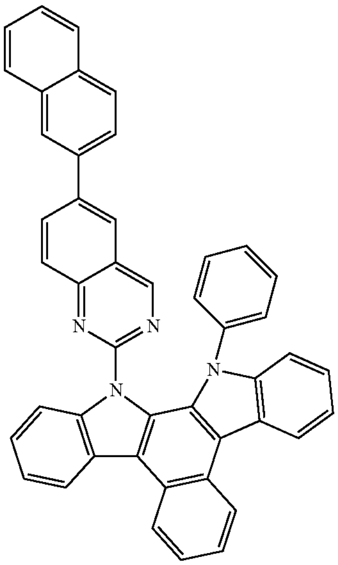
H122
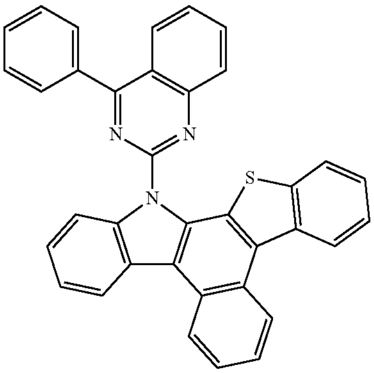
H123
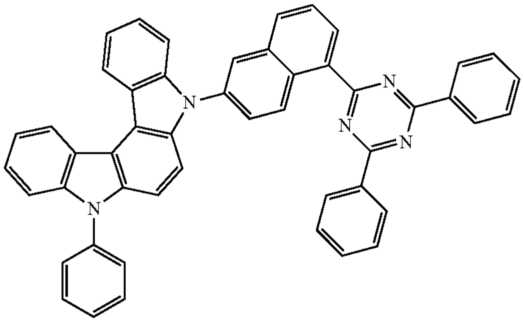
H124
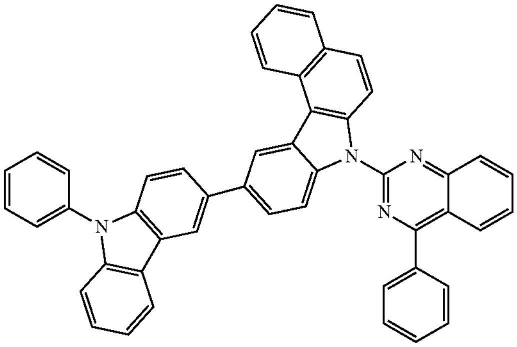
.

In some embodiments, the host may include a silicon-containing compound, a phosphine oxide-containing compound, or any combination thereof.

The host may include one type (or kind) of compound only, or two or more different types (or kinds) of compounds. As such, embodiments may be modified in various ways.

Phosphorescent Dopant

The emission layer may include the first compound described herein as a phosphorescent dopant.

In some embodiments, the emission layer may include the first compound, and when the first compound serves as an ancillary dopant, the emission layer may include a phosphorescent dopant.

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In some embodiments, the phosphorescent dopant may include an organometallic complex represented by Formula 401:

Formula 401

$M(L_{401})_{xc1}(L_{402})_{xc2}$

Formula 402

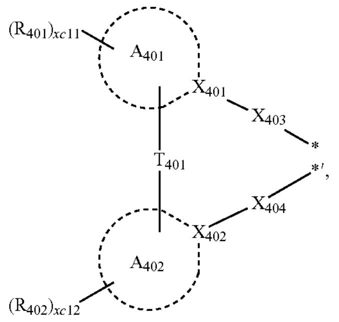

wherein, in Formulae 401 and 402,

M may be transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be understood by referring to the description of $Q_1$ provided herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be understood by referring to the description of $Q_1$ provided herein, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) $X_{401}$ and $X_{402}$ may both be nitrogen.

In one or more embodiments, when xc1 in Formula 401 is 2 or greater, two ring $A_{401}$(s) of at least two $L_{401}$(s) may optionally be bound via $T_{402}$ as a linking group, and/or two ring $A_{402}$(s) may optionally be bound via $T_{403}$ as a linking group (see e.g., Compounds PD1 to PD4 and PD7). $T_{402}$ and $T_{403}$ may each be understood by referring to the description of $T_{401}$ provided herein.

$L_{402}$ in Formula 401 may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus group (e.g., a phosphine group and/or a phosphite group).

The phosphorescent dopant may be, for example, one of Compounds PD1 to PD25 or any combination thereof:

PD1

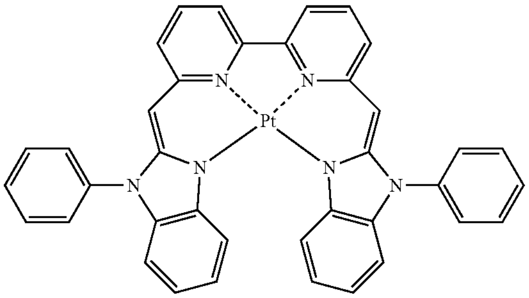

PD2

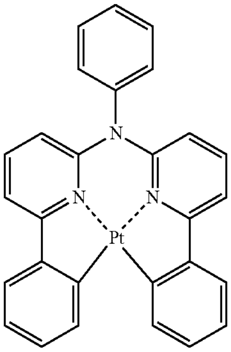

-continued
PD3
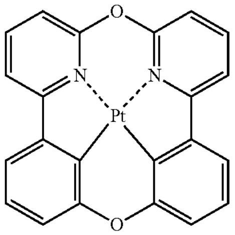
PD4
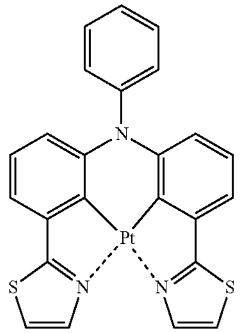
PD5
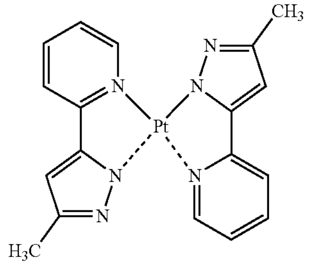
PD6
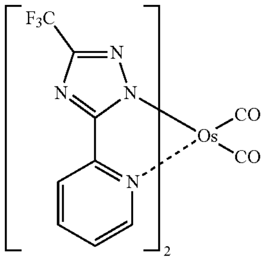
PD7
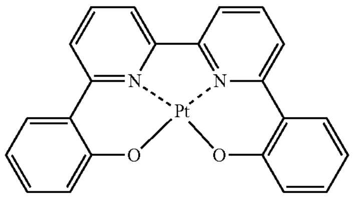
PD8
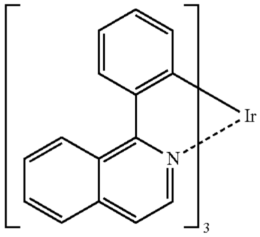
-continued
PD9
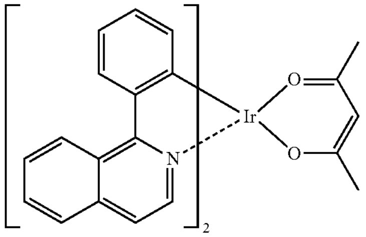
PD10
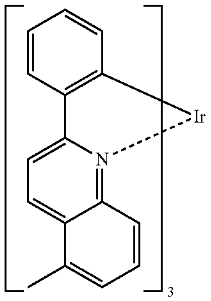
PD11
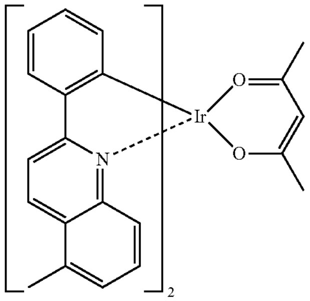
PD12
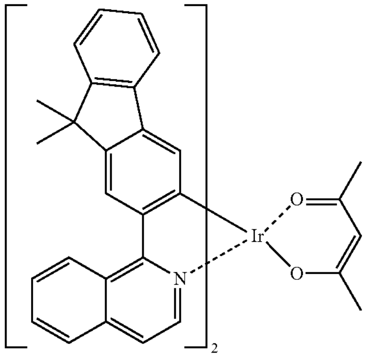
PD13
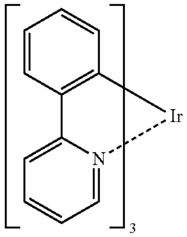

PD14
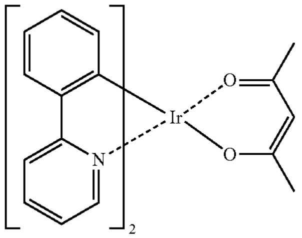
PD15
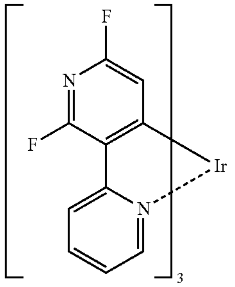
PD16
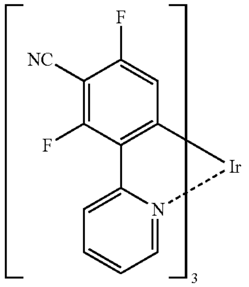
PD17
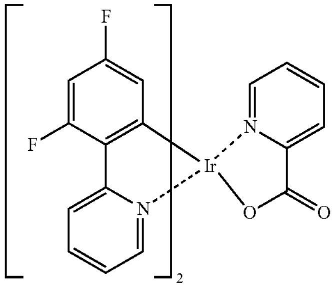
PD18
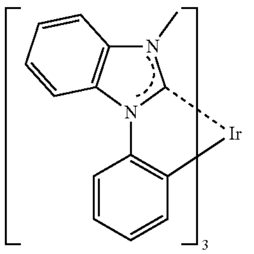
PD19
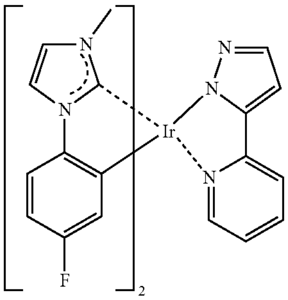
PD20
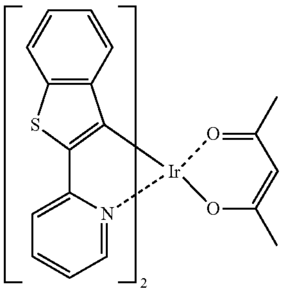
PD21
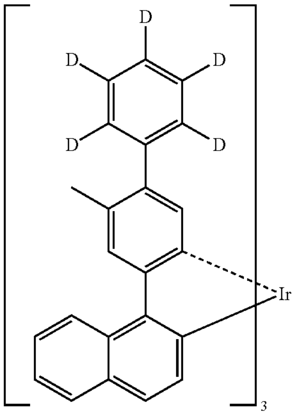
PD22
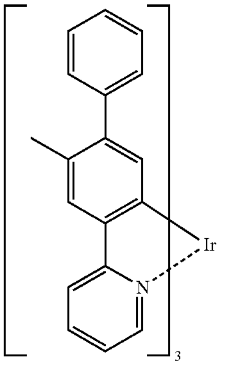

-continued

PD23

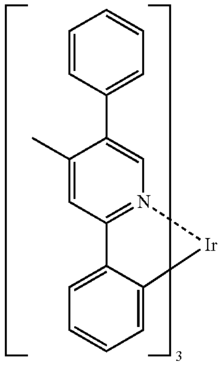

PD24

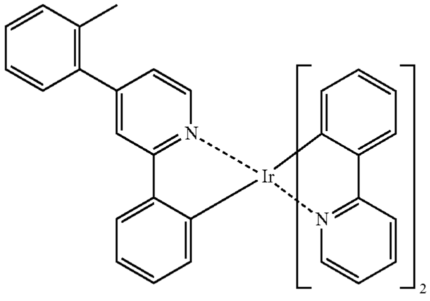

PD25

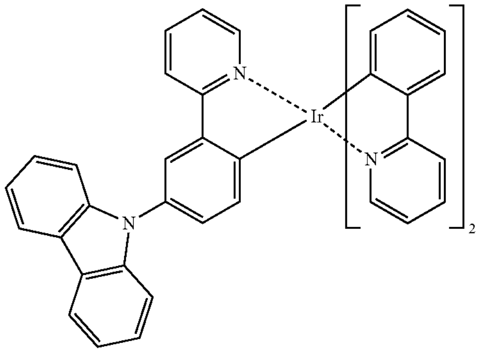

Fluorescent Dopant

In some embodiments, the emission layer may include the first compound, and when the first compound serves as an ancillary dopant, the emission layer may include a fluorescent dopant.

In some embodiments, the emission layer may include the first compound, and when the first compound serves as a phosphorescent dopant, the emission layer may include an ancillary dopant.

The fluorescent dopant and the ancillary dopant may each independently include an arylamine compound, a styrylamine compound, a boron-containing compound, or any combination thereof.

In some embodiments, the fluorescent dopant and the ancillary dopant may each independently include the compound represented by Formula 501:

Formula 501

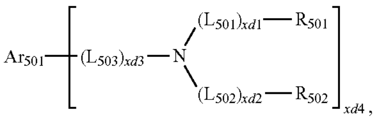

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In some embodiments, in Formula 501, $Ar_{501}$ may include a condensed ring group (e.g., an anthracene group, a chrysene group, and/or a pyrene group), in which at least three monocyclic groups are condensed.

In some embodiments, xd4 in Formula 501 may be 2.

In some embodiments, the fluorescent dopant and the ancillary dopant may each independently include one of Compounds FD1 to FD36, DPVBi, DPAVBi, or any combination thereof:

FD1

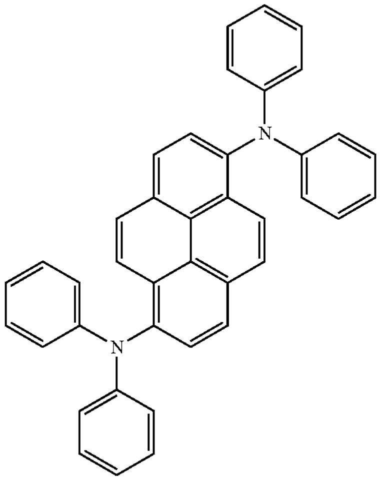

FD2

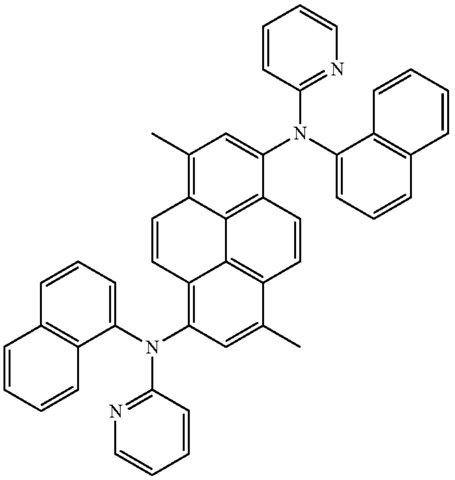

-continued
FD3
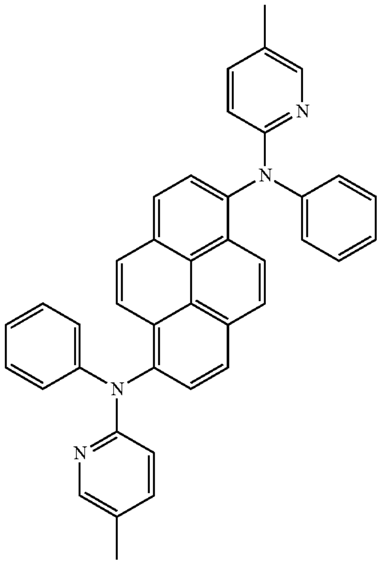
FD4
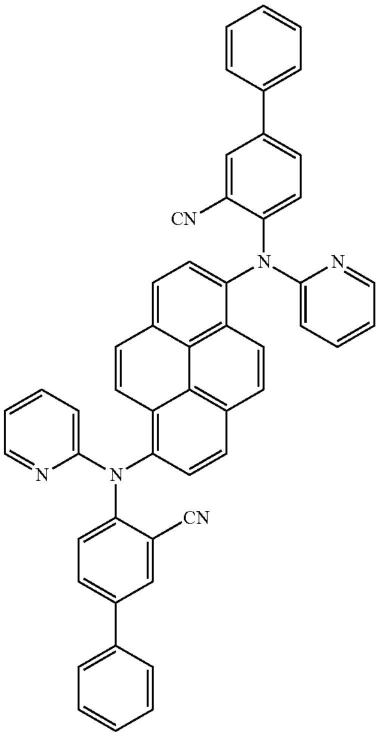
FD5
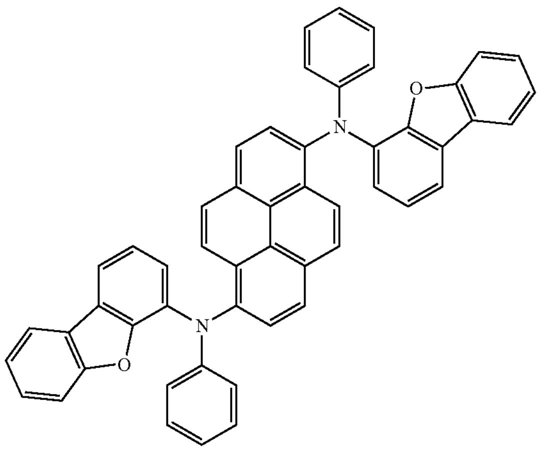
FD6
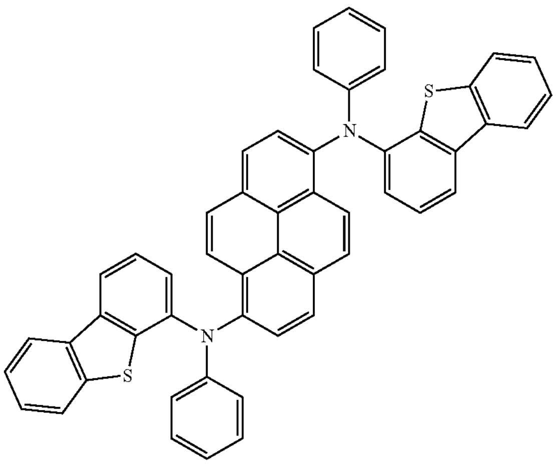

-continued
FD7
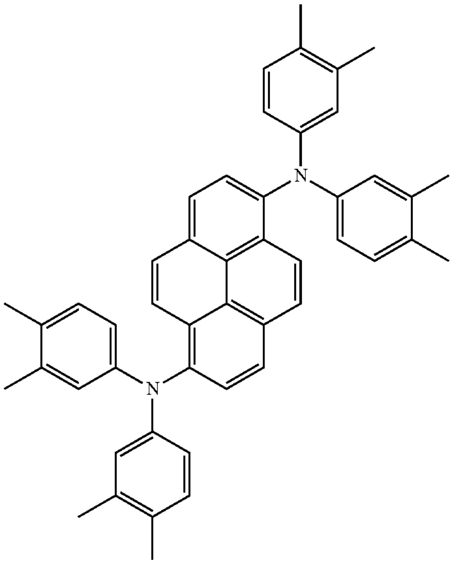
FD8
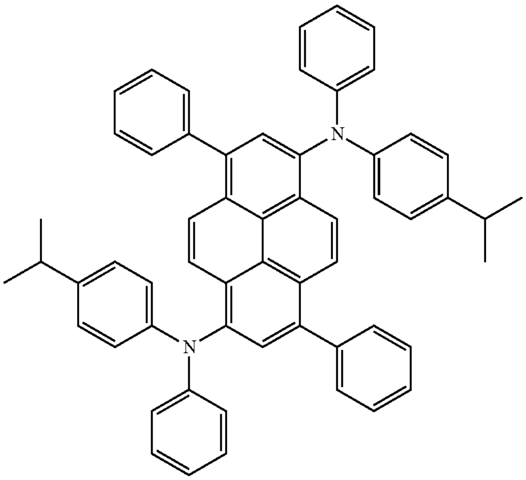
FD9
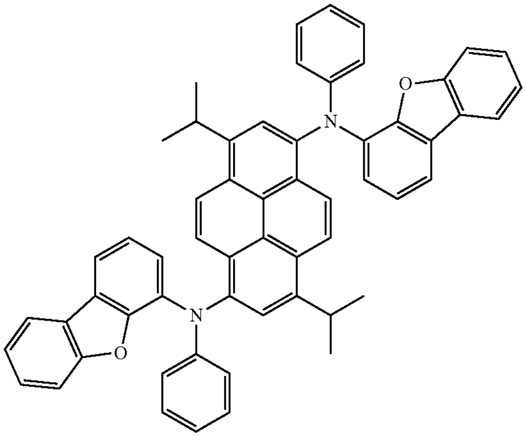
FD10
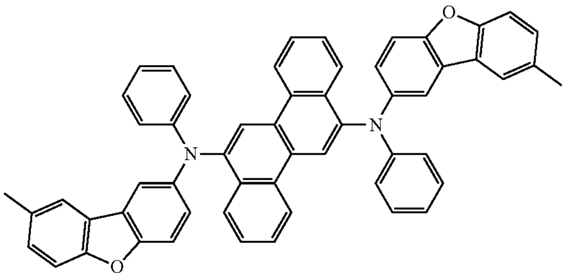
FD11
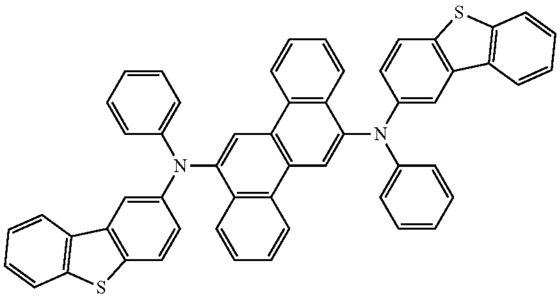
FD12
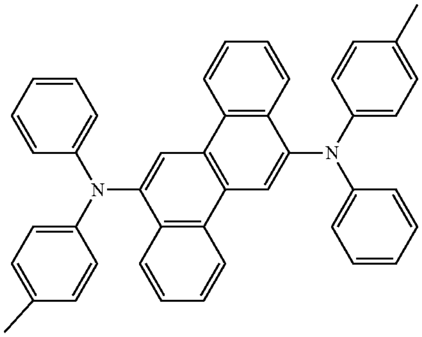

-continued
FD13
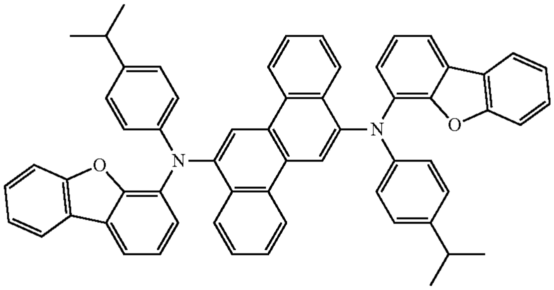
FD14
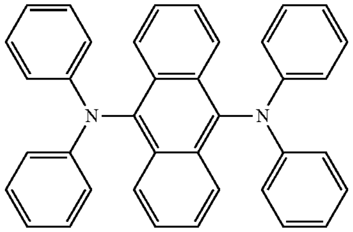
FD15
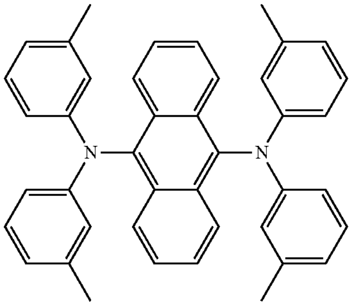
FD16
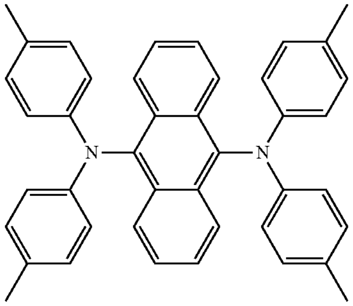
FD17
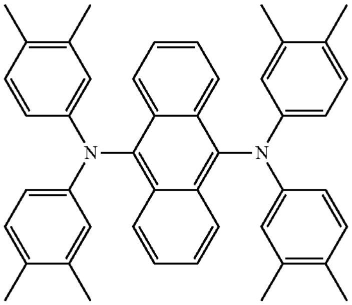
FD18
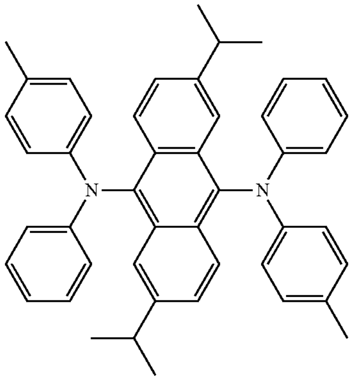
FD19
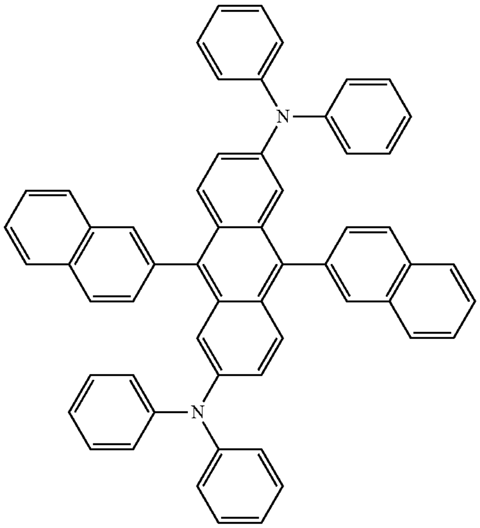
FD20
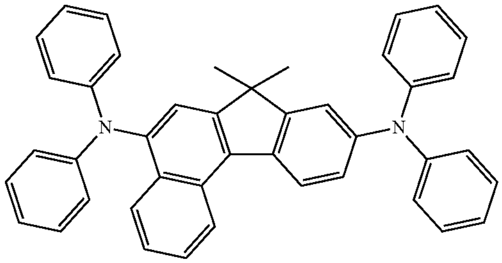

-continued
FD21
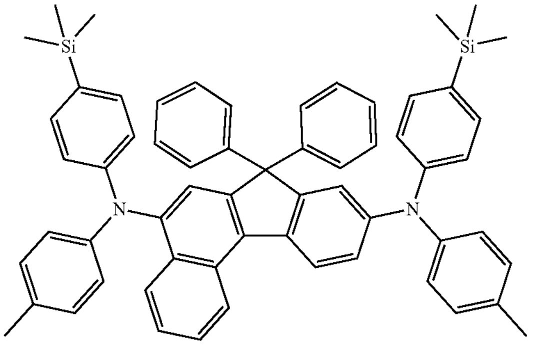
FD22
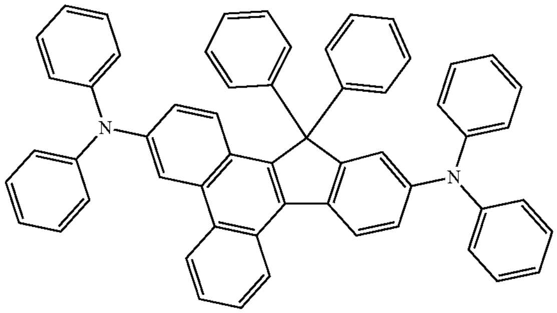
FD23
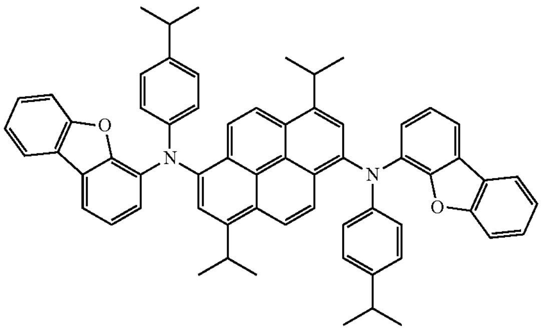
FD24
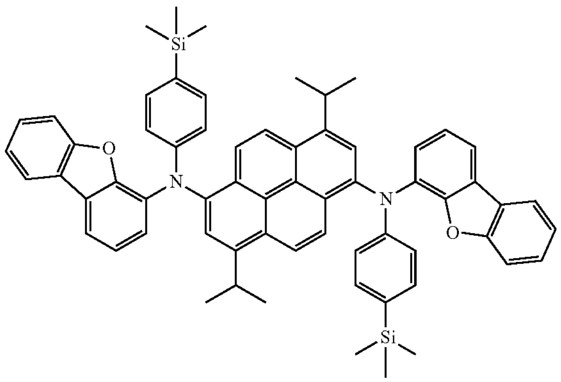
FD25
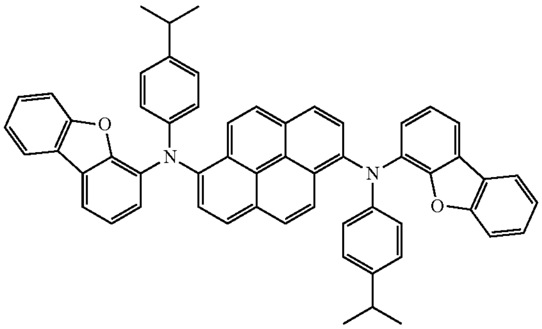
FD26
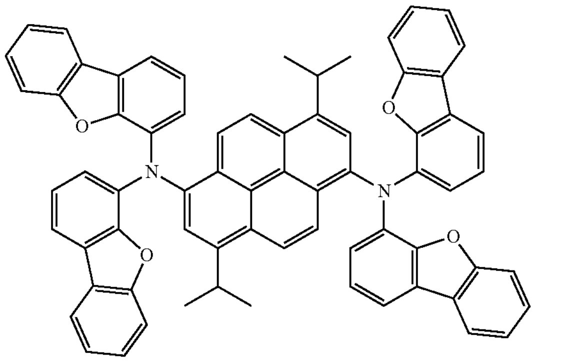
FD27
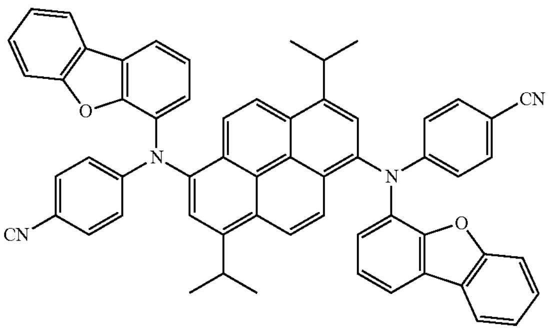
FD28
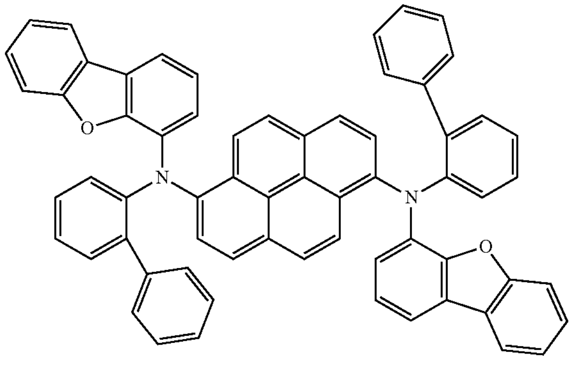

-continued
FD29
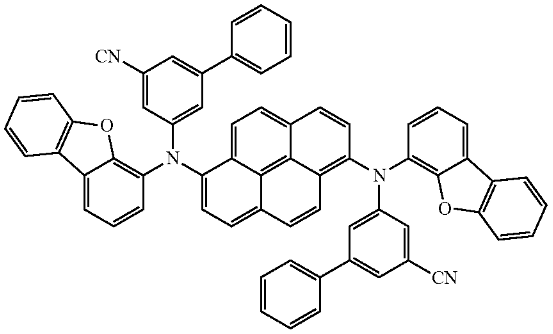
FD30
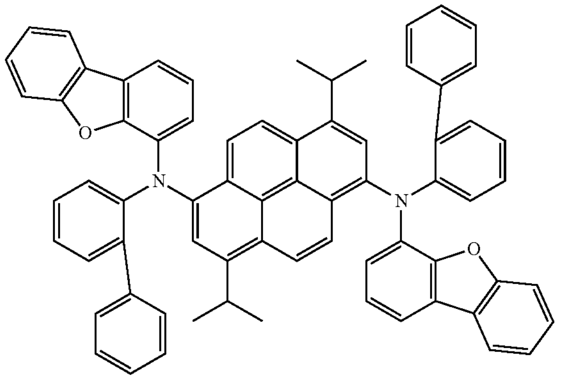
FD31
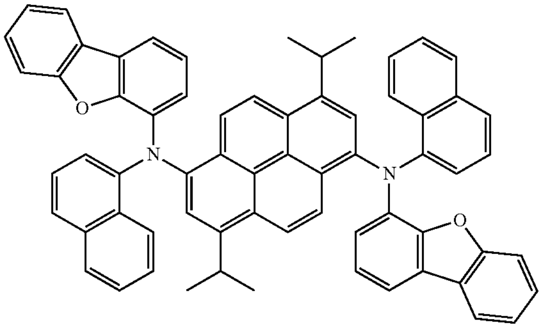
FD32
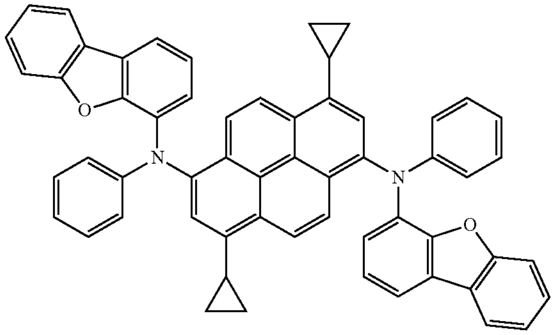
FD33
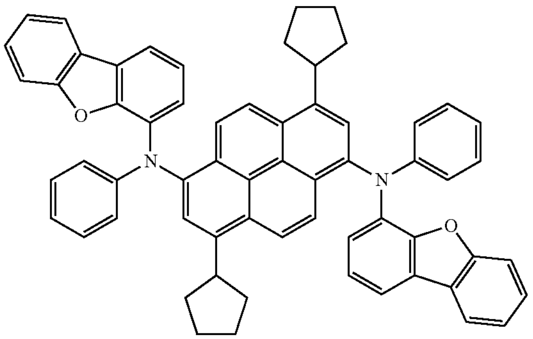
FD34
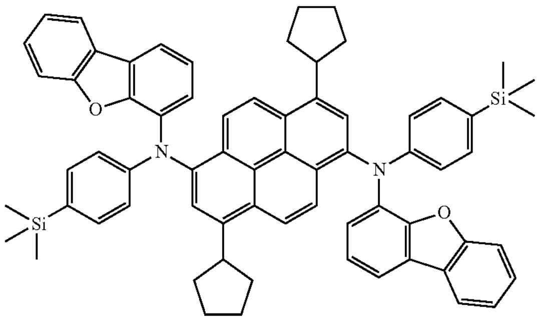
FD35
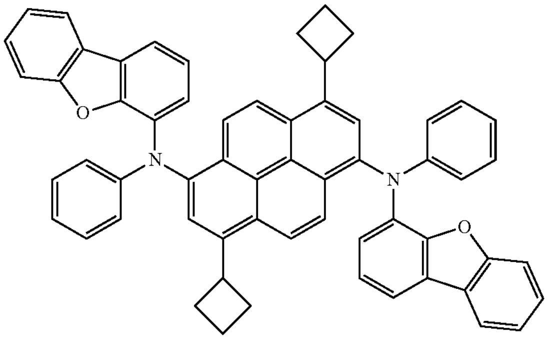
FD36
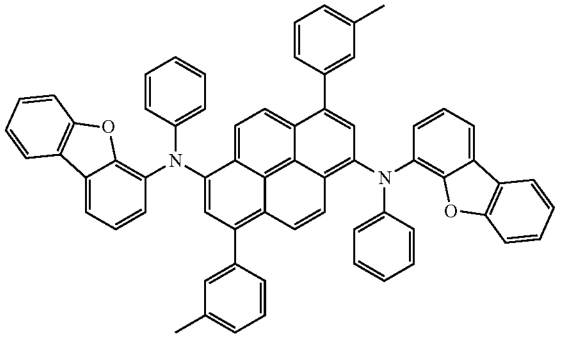

-continued

DPVBi

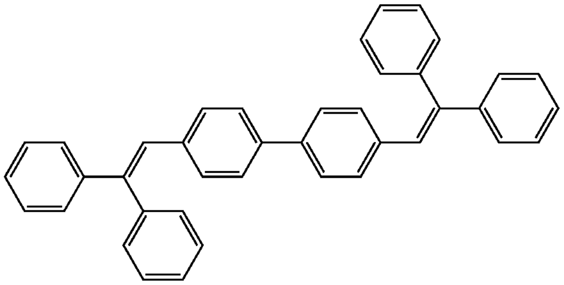

DPAVBi

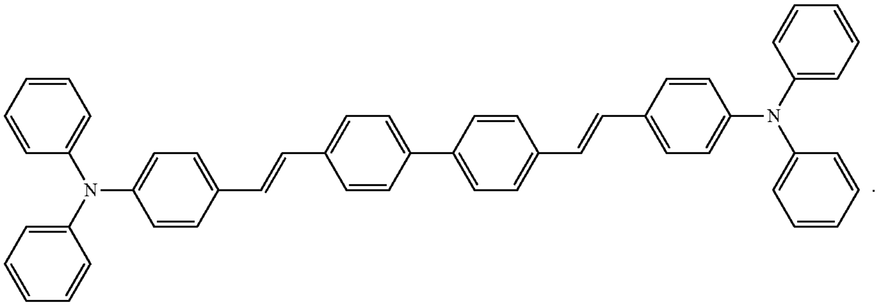

In some embodiments, the fluorescent dopant and the ancillary dopant may each independently include the fourth compound represented by Formula 502 or Formula 503.

Electron Transport Region in Interlayer 130

The electron transport region may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron transport region may include a buffer layer, a hole blocking layer, an electron control layer, an electron transport layer, or an electron injection layer.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order.

The electron transport region (e.g., a buffer layer, a hole blocking layer, an electron control layer, and/or an electron transport layer in the electron transport region) may include a metal-free compound including at least one π electron-deficient nitrogen-containing $C_1$-$C_{60}$ cyclic group.

In some embodiments, the electron transport region may include a compound represented by Formula 601:

$$[Ar_{601}]_{xe11}\text{-}[(L_{601})_{xe1}\text{-}R_{601}]_{xe21},$$ Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each be understood by referring to the description of $Q_1$ provided herein, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In some embodiments, when xe11 in Formula 601 is 2 or greater, at least two $Ar_{601}$(s) may be bound via a single bond.

In some embodiments, in Formula 601, $Ar_{601}$ may be a substituted or unsubstituted anthracene group.

In some embodiments, the electron transport region may include a compound represented by Formula 601-1:

Formula 601-1

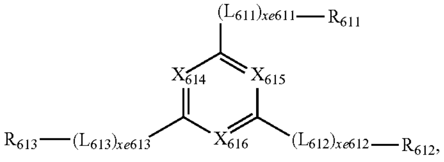

wherein, in Formula 601-1, $X_{614}$ may be N or $C(R_{614})$, $X_{615}$ may be N or $C(R_{615})$, $X_{616}$ may be N or $C(R_{616})$, at least one selected from $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

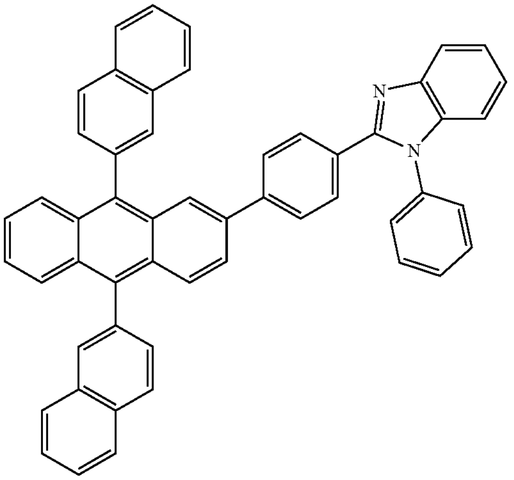

ET2

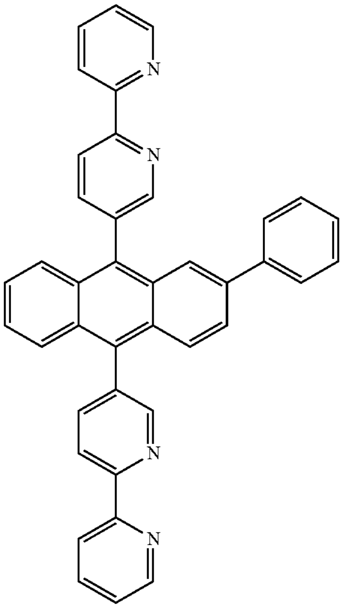

-continued

ET3

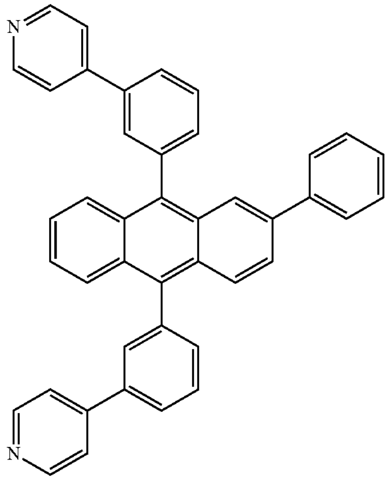

ET4

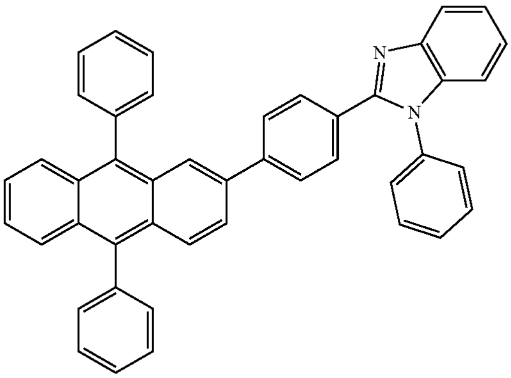

ET5

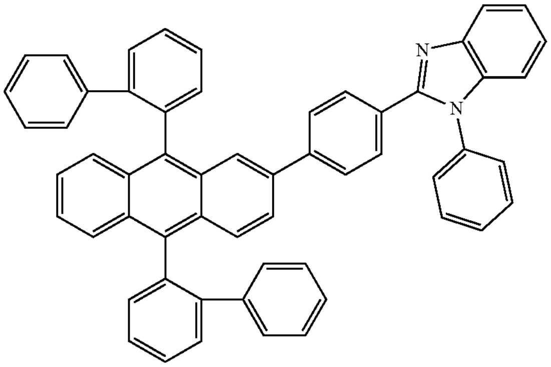

-continued
ET6
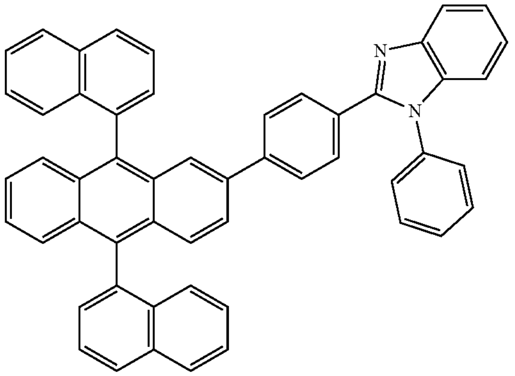
ET7
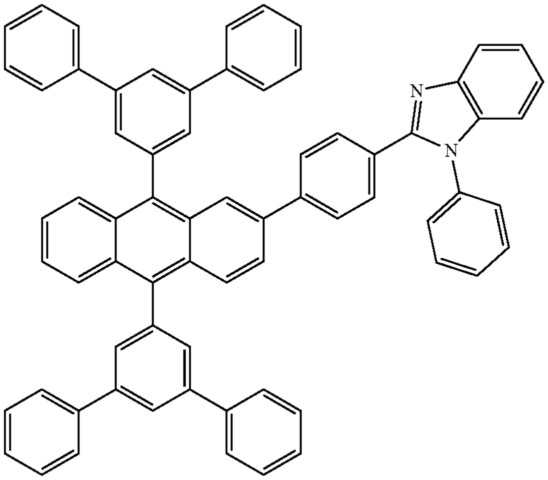
ET8
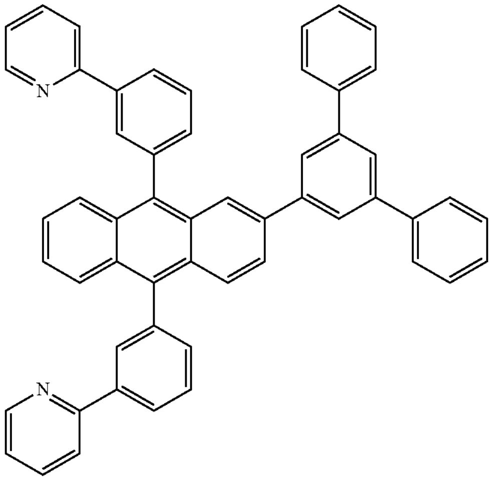
-continued
ET9
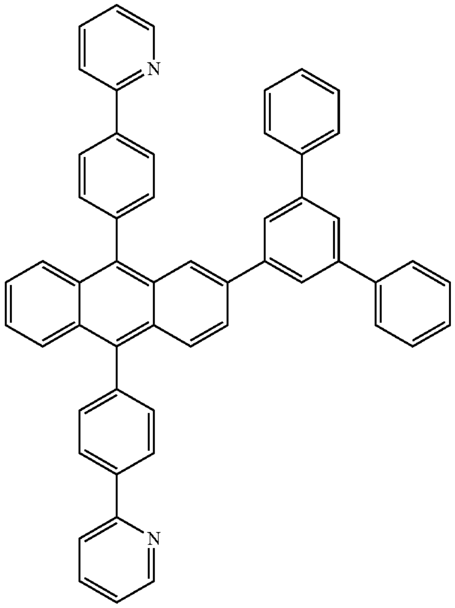
ET10
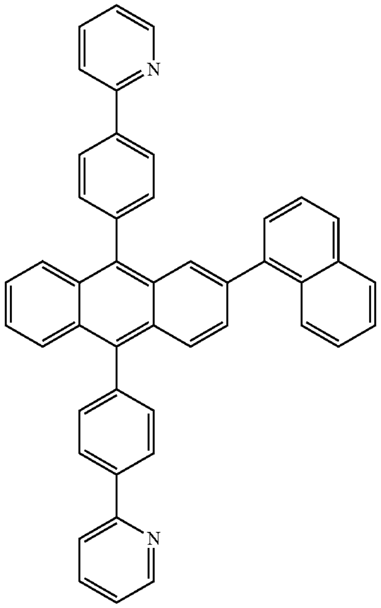

ET11
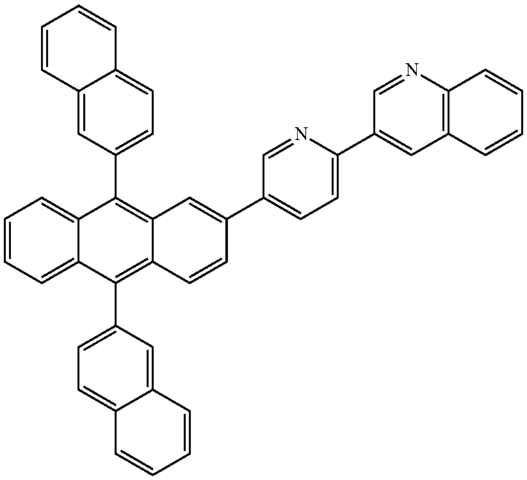
ET12
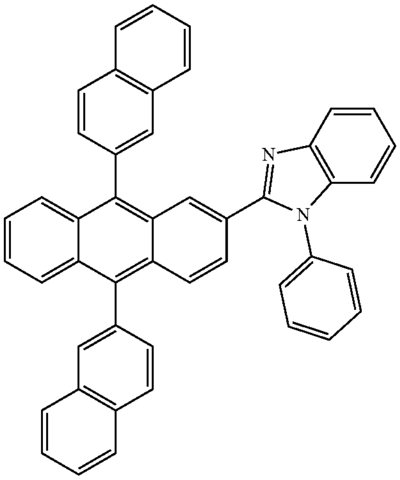
ET13
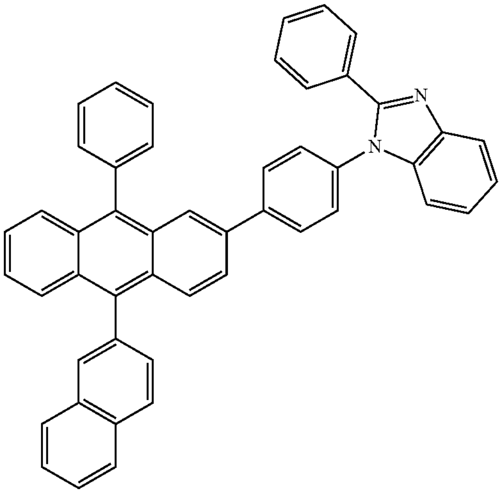
ET14
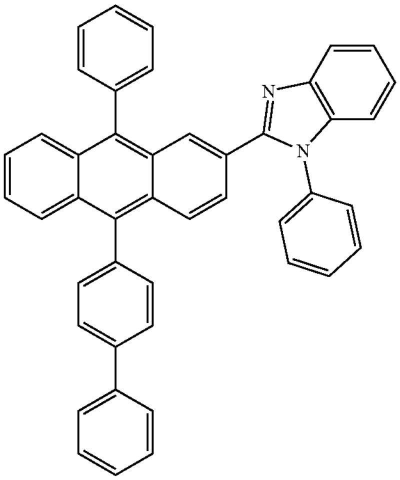
ET15
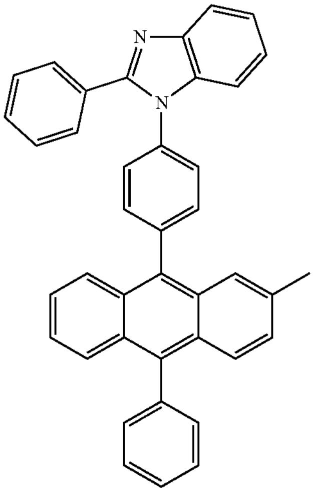
ET16
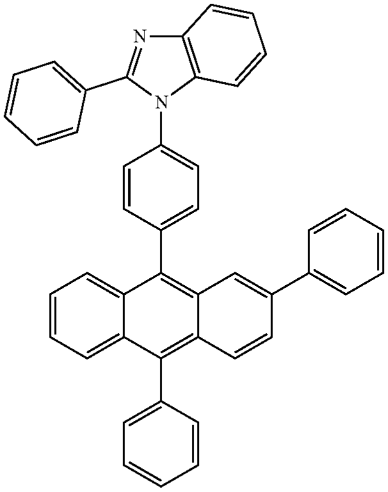

-continued
ET17
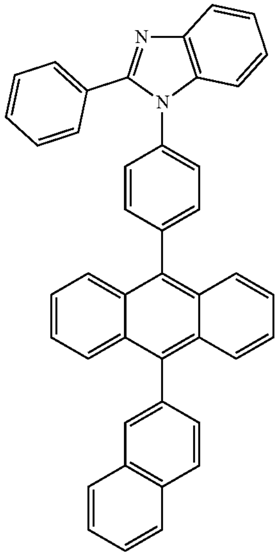
ET18
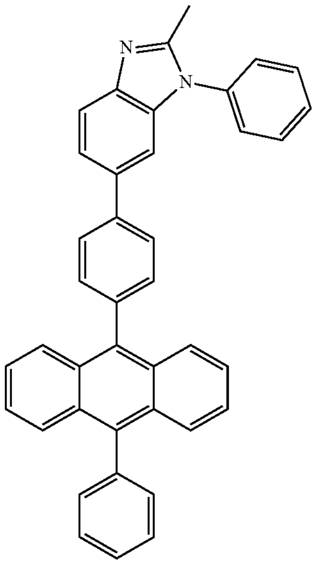
ET19
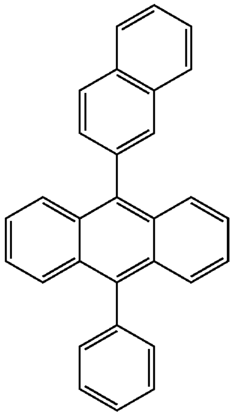
-continued
ET20
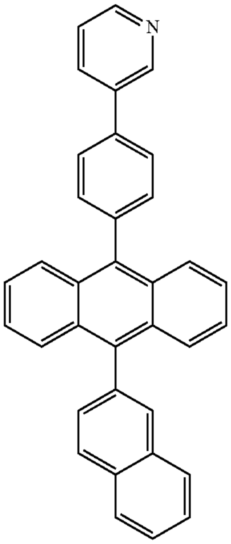
ET21
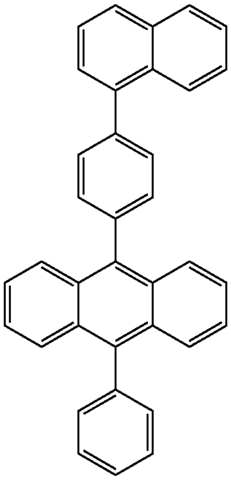
ET22
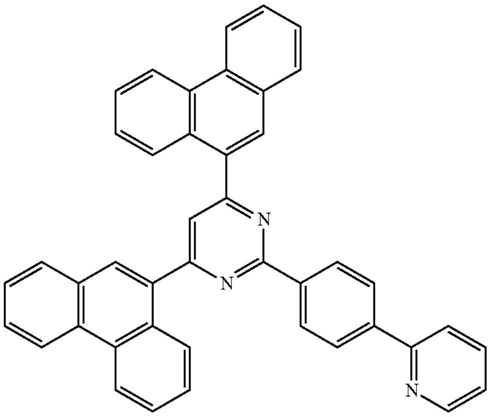

-continued
ET23
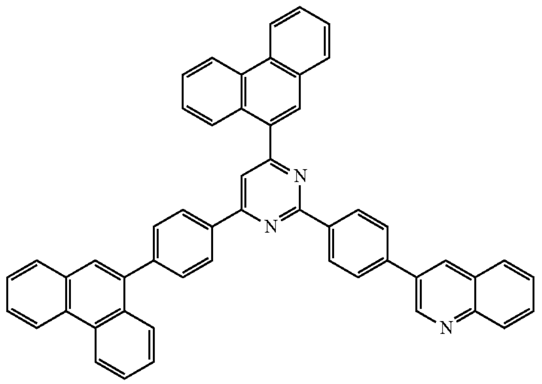
ET24
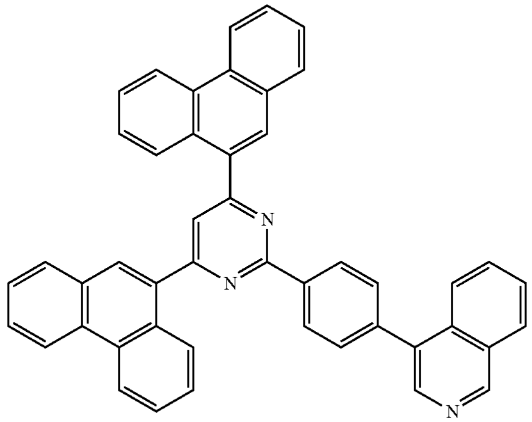
ET25
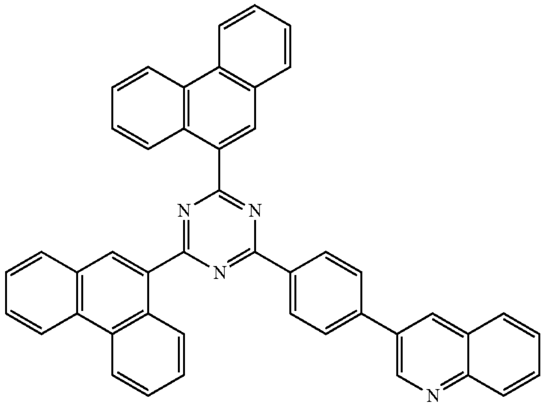
-continued
ET26
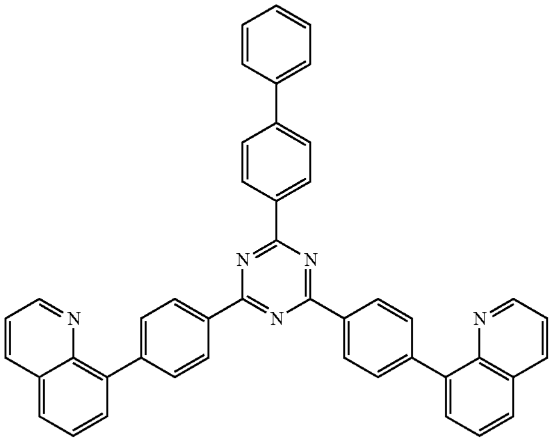
ET27
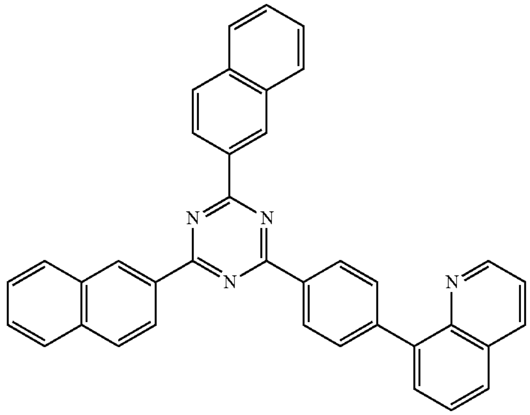
ET28
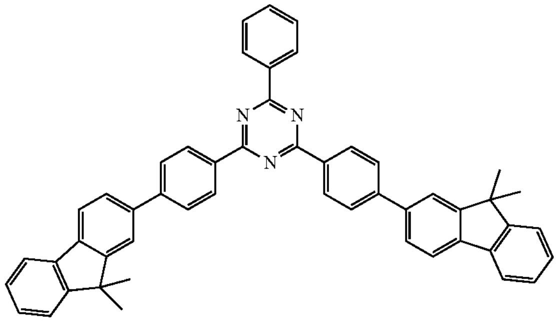

ET29
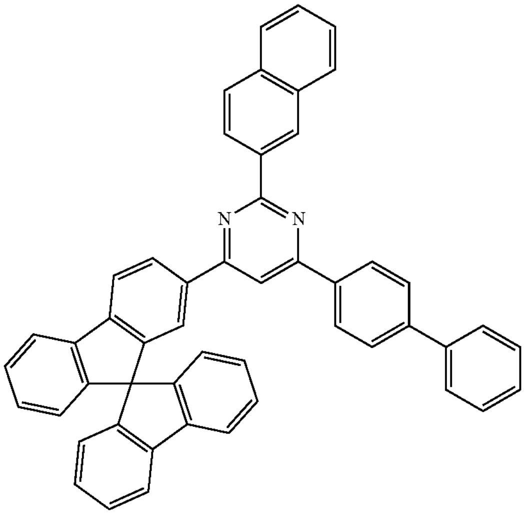
ET30
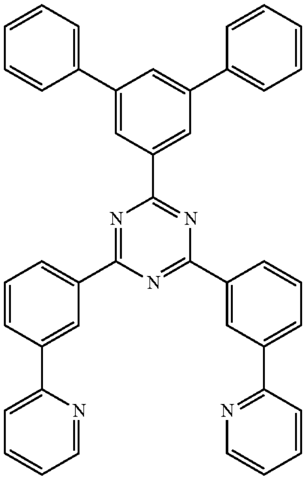
ET31
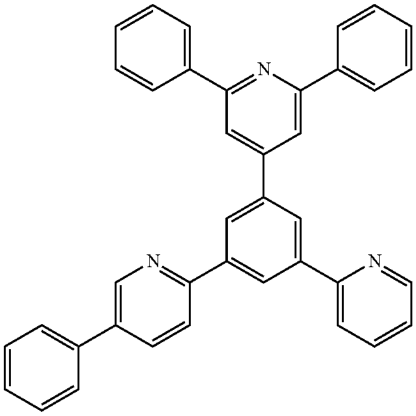
ET32
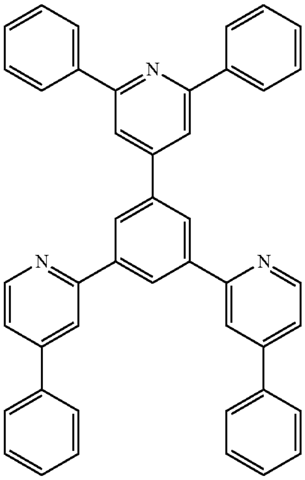
ET33
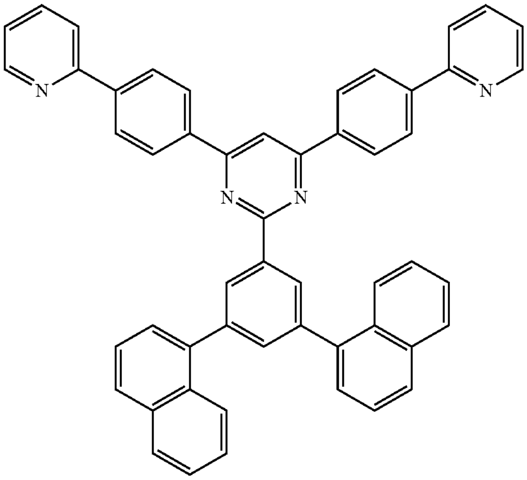
ET34
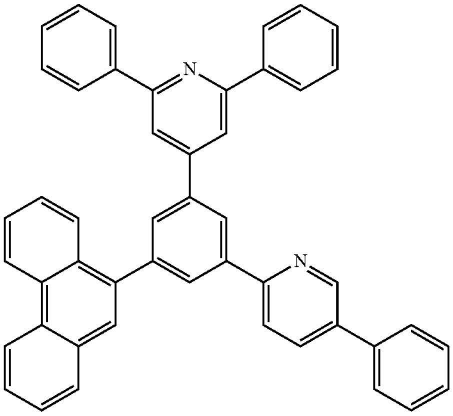

-continued
ET35
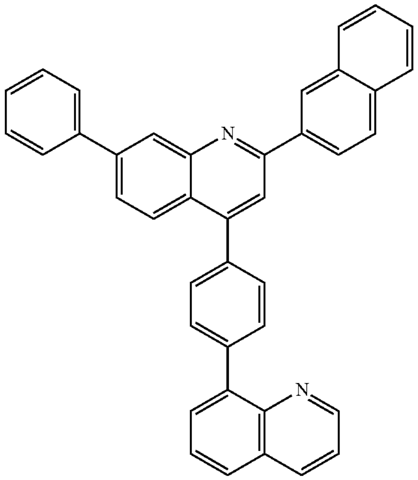
ET36
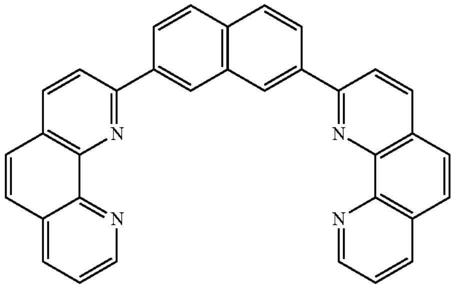
ET37
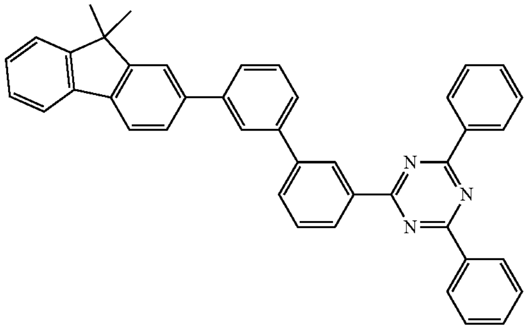
ET38
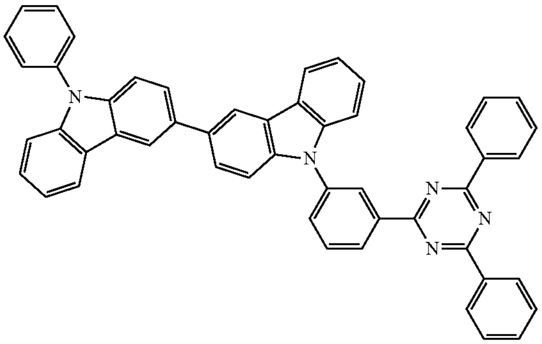
-continued
ET39
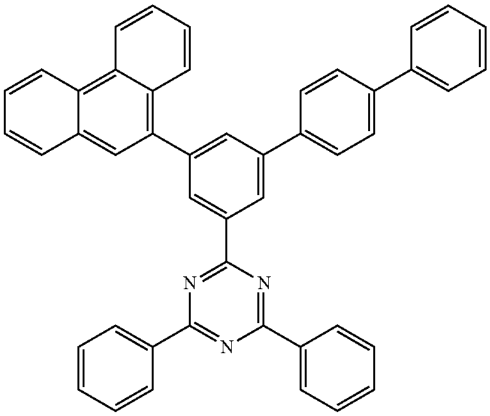
ET40
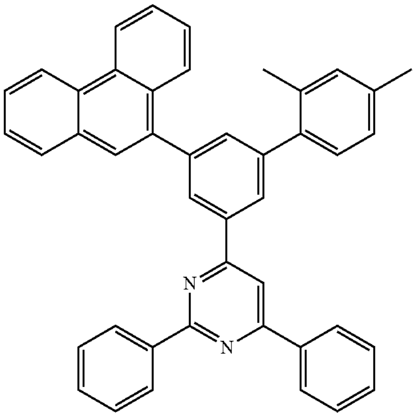
ET41
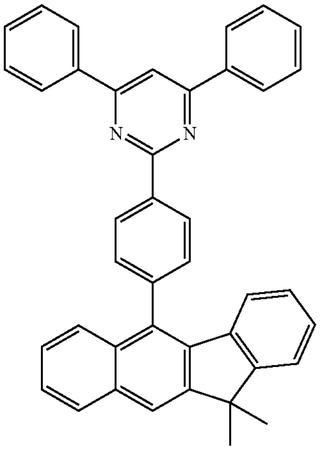

-continued

ET42

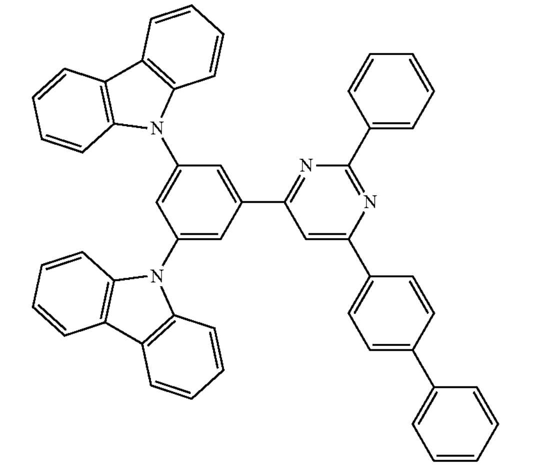

ET43

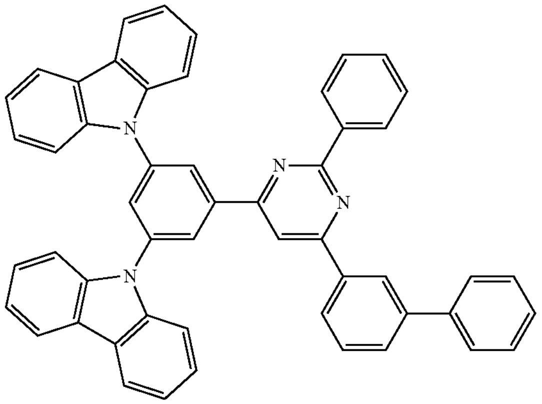

ET44

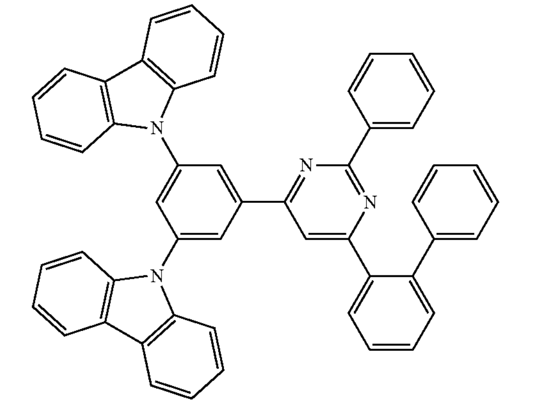

ET45

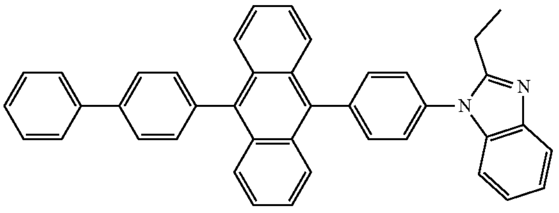

-continued

Alq3

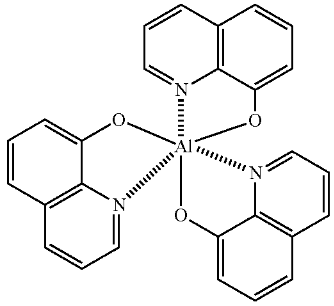

BAlq

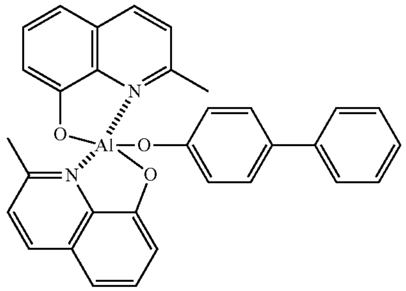

TAZ

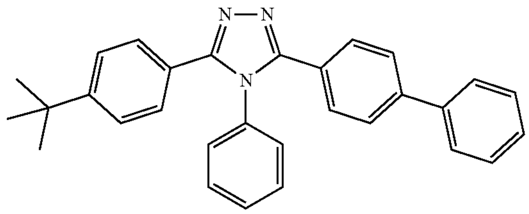

NTAZ

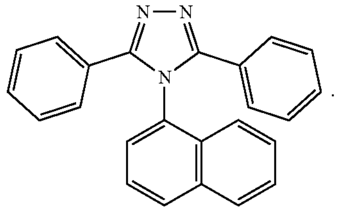

.

The thickness of the electron transport region may be in a range of about 160 Å to about 5,000 Å, and in some embodiments, about 100 Å to about 4,000 Å. When the electron transport region includes a buffer layer, a hole blocking layer, an electron control layer, an electron transport layer, or any combination thereof, the thicknesses of the buffer layer, the hole blocking layer, or the electron control layer may each independently be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport layer are each within their respective ranges, excellent (or improved) electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Ligand coordinated with the metal ion of the alkali metal complex and the alkaline earth metal complex may each independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) and/or Compound ET-D2:

ET-D1

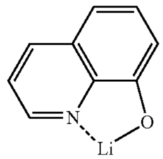

ET-D2

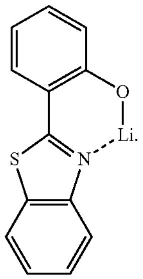

The electron transport region may include an electron injection layer that facilitates injection of electrons from the second electrode 150. The electron injection layer may be in direct contact with the second electrode 150.

The electron injection layer may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, and/or iodines), tellurides, or any combination thereof of the alkali metal, the alkaline earth metal, and the rare earth metal.

The alkali metal-containing compound may be selected from alkali metal oxides (such as $Li_2O$, $Cs_2O$, and/or $K_2O$), alkali metal halides (such as LiF, NaF, CsF, KF, LiI, NaI, CsI, and/or KI), or any combination thereof. The alkaline earth-metal-containing compound may include alkaline earth-metal oxides (such as BaO, SrO, CaO, $Ba_xSr_{1-x}O$ (wherein x is a real number satisfying $0<x<1$), and/or $Ba_xCa_{1-x}O$ (wherein x is a real number satisfying $0<x<1$)). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Non-limiting examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth metal complex, and the rare earth metal complex may respectively include: i) one of metal ions of the alkali metal, alkaline earth metal, and rare earth metal described above and ii) a ligand bound to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In some embodiments, the electron injection layer may further include an organic material (e.g., a compound represented by Formula 601).

In some embodiments, the electron injection layer may include (e.g., consist of) i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In some embodiments, the electron injection layer may be a KI:Yb co-deposition layer, a RbI:Yb co-deposition layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent (or improved) electron injection characteristics may be obtained without a substantial increase in driving voltage.

Second Electrode 150

The second electrode 150 may be on the interlayer 130. In one or more embodiments, the second electrode 150 may be a cathode, that is an electron injection electrode. In this embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

Capping Layer

A first capping layer may be located outside the first electrode 110, and/or a second capping layer may be located outside the second electrode 150. In some embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving luminescence efficiency of the light-emitting device 10.

The first capping layer and the second capping layer may each include a material having a refractive index of 1.6 or higher (at 589 nm).

The first capping layer and the second capping layer may each independently be a capping layer including an organic material, an inorganic capping layer including an inorganic material, or a composite capping layer including an organic material and an inorganic material.

At least one of the first capping layer and the second capping layer may each independently include one or more selected from carbocyclic compounds, heterocyclic compounds, amine group-containing compounds, porphine derivatives, phthalocyanine derivatives, naphthalocyanine derivatives, alkali metal complexes, alkaline earth metal complexes, and any combinations thereof. The carbocyclic compound, the heterocyclic compound, and the amine group-containing compound may optionally be substituted with a substituent containing O, N, S, Se, Si, F, Cl, Br, I, or any combination thereof. In some embodiments, at least one of the first capping layer and the second capping layer may each independently include an amine group-containing compound.

In some embodiments, at least one of the first capping layer and the second capping layer may each independently include the compound represented by Formula 201, the compound represented by Formula 202, or any combination thereof.

In one or more embodiments, at least one of the first capping layer and the second capping layer may each independently include one of Compounds FIT28 to FIT33, one of Compounds CP1 to CP6, β-NPB, or any combination thereof:

CP1

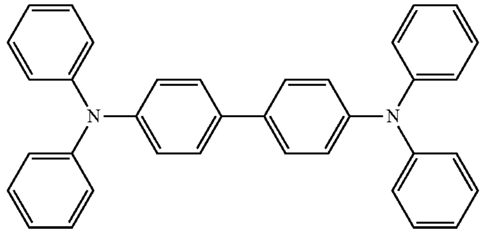

CP2

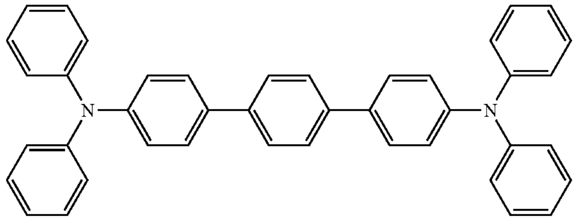

CP3

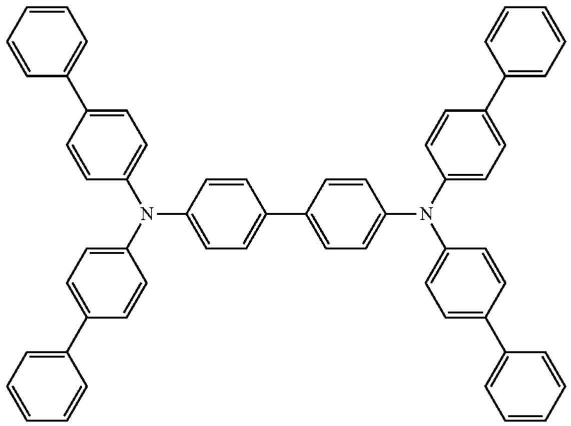

CP4

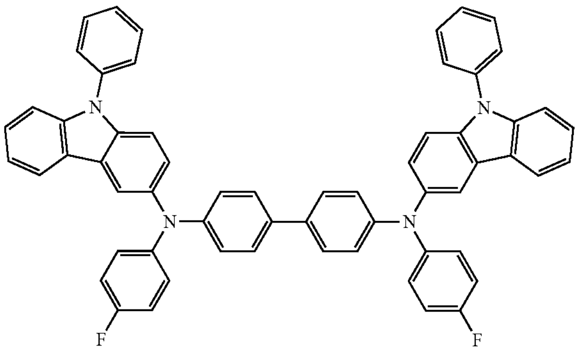

-continued

CP5

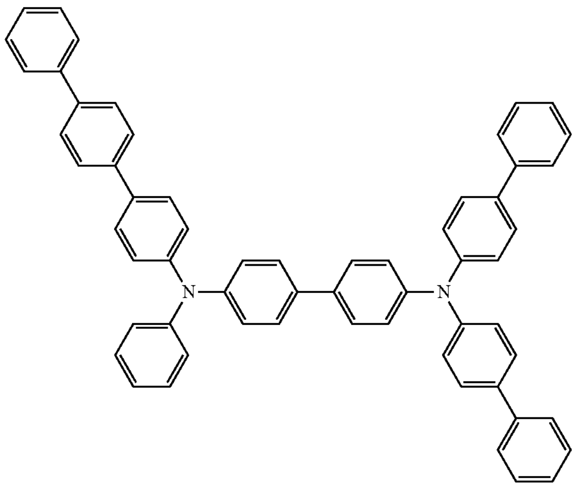

CP6

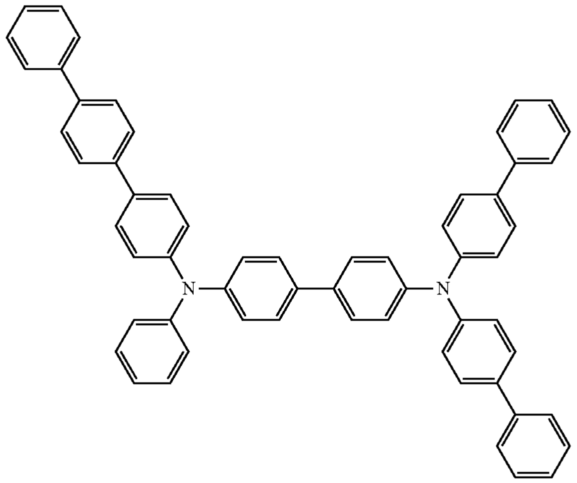

β-NPB

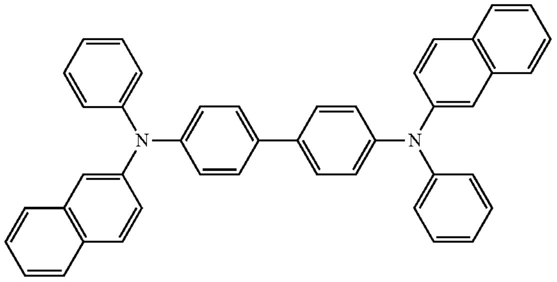

Electronic Apparatus

The light-emitting device may be included in various suitable electronic apparatuses. In some embodiments, an electronic apparatus including the light-emitting device may be an emission apparatus or an authentication apparatus.

The electronic apparatus (e.g., an emission apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the description thereof provided herein. In some embodiments, the color-conversion layer may include quantum dots.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel defining film may be located between the plurality of sub-pixel areas to define each sub-pixel area.

The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (and/or a plurality of color-conversion areas) may include: a first area to emit first color light; a second area to emit second color light; and/or a third area to emit third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (and/or the plurality of color-conversion areas) may each include quantum dots. In some embodiments, the first area may include red quantum dots, the second area may include green quantum dots, and the third area may not include a quantum dot. The quantum dot may be understood by referring to the description of the quantum dot provided herein. The first area, the second area, and/or the third area may each further include an emitter.

In some embodiments, the light-emitting device may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 color light may be blue light.

The electronic apparatus may further include a thin-film transistor, in addition to the light-emitting device. The thin-film transistor may include a source electrode, a drain electrode, and an active layer, wherein one of the source electrode or the drain electrode may be electrically connected to one of the first electrode or the second electrode of the light-emitting device.

The thin-film transistor may further include a gate electrode, a gate insulating film, and/or the like.

The active layer may include a crystalline silicon, an amorphous silicon, an organic semiconductor, and/or an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and may prevent or reduce the permeation of the air and moisture into the light-emitting device at the same time. The encapsulation unit may be a sealing substrate including a transparent glass and/or a plastic substrate. The encapsulation unit may be a thin-film encapsulating layer including at least one of an organic layer or an inorganic layer. When the encapsulation unit is a thin film encapsulating layer, the electronic apparatus may be flexible.

In addition to the color filter and/or the color-conversion layer, one or more functional layers may be disposed on the encapsulation unit, depending on the use of an electronic apparatus. Examples of the functional layer may include a touch screen layer, a polarization layer, and the like. The touch screen layer may be a resistive touch screen layer, a capacitive touch screen layer, or an infrared beam touch screen layer. The authentication apparatus may be, for example, a biometric authentication apparatus that identifies an individual according biometric information (e.g., a fingertip, a pupil, and/or the like).

The authentication apparatus may further include a biometric information collecting unit, in addition to the light-emitting device described above.

The electronic apparatus may be applicable to various suitable displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various measurement devices, gauges (e.g., gauges of an automobile, an airplane, a ship), a projector, and/or the like.

Figure 2:
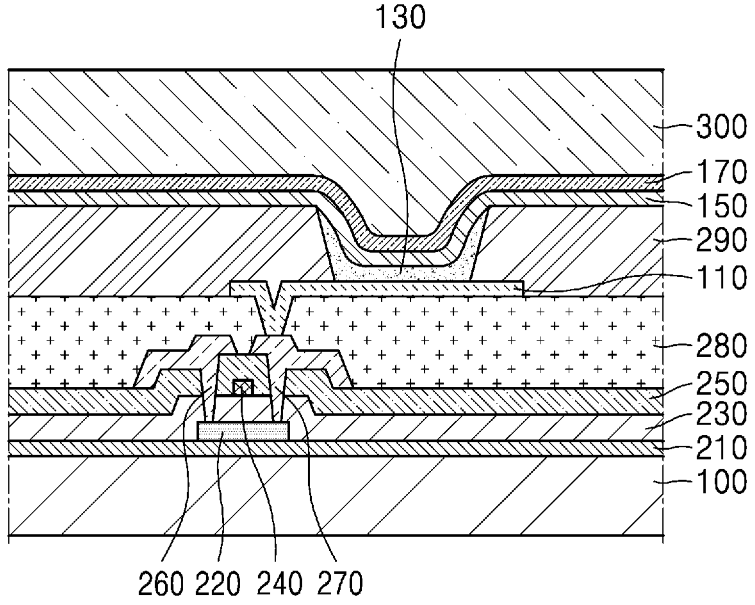
FIG. 2 is a schematic cross-sectional view of an electronic apparatus according to one or more embodiments.
Figure 3:
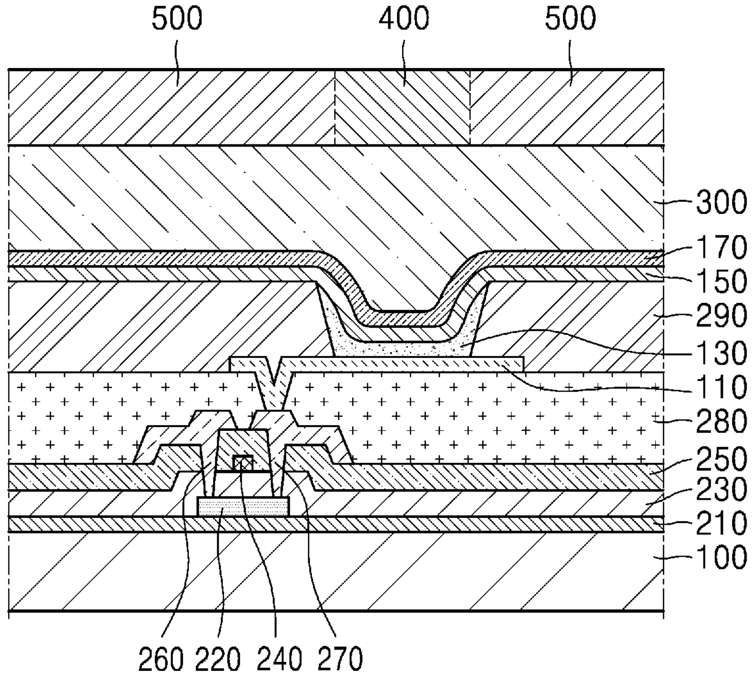
FIG. 3 is a schematic cross-sectional view of an electronic apparatus according to one or more embodiments.

Descriptions of FIGS. 2 and 3

FIG. 2 is a schematic cross-sectional view of a light-emitting apparatus according to one or more embodiments.

An emission apparatus in FIG. 2 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent or reduce penetration of impurities through the substrate 100, and may provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor (such as silicon and/or polysilicon), an organic semiconductor, or an oxide semiconductor, and may include a source area, a drain area and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260, and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected to a light-emitting device to drive the light-emitting device, and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270, and may expose a specific (or set) area of the drain electrode 270, and the first electrode 110 may be disposed to connect to (e.g., to contact) the exposed area of the drain electrode 270.

A pixel-defining film 290 may be on the first electrode 110. The pixel-defining film 290 may expose a specific (or set) area of the first electrode 110, and the interlayer 130 may be formed in the exposed area. The pixel-defining film 290 may be a polyimide or polyacryl organic film. In one or more embodiments, some of the upper layers of the interlayer 130 may extend to the upper portion of the pixel-defining film 290 and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture and/or oxygen. The encapsulation unit 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxy methylene, polyarylate, hexamethyl disiloxane, an acrylic resin (e.g., polymethyl methacrylate, polyacrylic acid, and/or the like), an epoxy resin (e.g., aliphatic glycidyl ether (AGE) and/or the like), or any combination thereof; or a combination of the inorganic film and the organic film.

FIG. 3 is a schematic cross-sectional view of another light-emitting apparatus according to one or more embodiments.

The emission apparatus shown in FIG. 3 may be substantially identical to the emission apparatus shown in FIG. 2, except that a light-shielding pattern 500 and a functional area 400 are additionally located on the encapsulation unit 300. The functional area 400 may be i) a color filter area, ii) a color-conversion area, or iii) a combination of a color filter area and a color-conversion area. In some embodiments, the light-emitting device shown in FIG. 3 included in the emission apparatus may be a tandem light-emitting device.

Manufacturing Method

The layers constituting the hole transport region, the emission layer, and the layers constituting the electron transport region may be formed in a specific region by using one or more suitable methods selected from vacuum deposition, spin coating, casting, Langmuir-Blodgett (LB) deposition, ink-jet printing, laser printing, and laser-induced thermal imaging.

When the layers constituting the hole transport region, the emission layer, and the layers constituting the electron transport region are each independently formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

General Definitions of Terms

The term "$C_3$-$C_{60}$ carbocyclic group" as used herein refers to a cyclic group consisting of carbon atoms only as ring-forming atoms, and having 3 to 60 ring-forming carbon atoms. The term "$C_1$-$C_{60}$ heterocyclic group" as used herein refers to a cyclic group having 1 to 60 ring-forming carbon atoms, in addition to a heteroatom other than a carbon atom. The $C_3$-$C_{60}$ carbocyclic group and the $C_1$-$C_{60}$ heterocyclic group may each independently be a monocyclic group consisting of one ring or a polycyclic group in which at least two rings are condensed. For example, the total number of ring-forming atoms in the $C_1$-$C_{60}$ heterocyclic group may be in a range of 1 to 60.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "TT electron-deficient nitrogen-containing $C_1$-$C_{60}$ cyclic group" as used herein refers to a heterocyclic group having 1 to 60 carbon atoms and *—N=*' as a ring-forming moiety.

In some embodiments, the $C_3$-$C_{60}$ carbocyclic group may be i) a T1 group or ii) a group in which at least two T1 groups are condensed (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a group in which at least two T2 groups are condensed, or iii) a group in which at least one T2 group is condensed with at least one T1 group (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the π electron-rich $C_3$-$C_{60}$ cyclic group may be i) a T1 group, ii) a condensed group in which at least two T1 groups are condensed, iii) a T3 group, iv) a condensed group in which at least two T3 groups are condensed, or v) a condensed group in which at least one T3 group is condensed with at least one T1 group (for example, the π electron-rich $C_3$-$C_{60}$ cyclic group may be a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and/or the like), and the π electron-deficient nitrogen-containing $C_1$-$C_{60}$ cyclic group may be i) a T4 group, ii) a group in which at least twos T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, he π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed with any suitable cyclic group, a monovalent group, or a polyvalent group (e.g., a divalent group, a trivalent group, a quadvalent group, and/or the like), depending on the structure of the formula to which the term is applied. For example, a "benzene group" may be a benzo group, a phenyl group, a phenylene group, and/or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and non-limiting examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle and/or at either terminus of the $C_2$-$C_{60}$ alkyl group. Non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at either terminus of the $C_2$-$C_{60}$ alkyl group. Non-limiting examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_1$ alkyl group). Non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Non-limiting examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, and/or a bicyclo[2.2.2]octyl group). The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group including at least one heteroatom, other than carbon atoms, as a ring-forming atom, and having 1 to 10 carbon atoms. Non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Non-limiting examples thereof include a cyclopentenyl group, a cyclohexenyl group, and a cycloheptenyl group. The term "$C_3$—$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group including at least one heteroatom, other than carbon atoms, as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 6 carbon atoms. The term "$C_6$-$C_{60}$ arylene group" as used herein refers to a divalent group having the same structure as the $C_6$-$C_{60}$ aryl group. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom, other than carbon atoms, as a ring-forming atom, and 1 to 60 carbon atoms. The term "$C_1$-$C_{60}$ heteroarylene group" as used herein refers to a divalent group having the same structure as the $C_1$-$C_{60}$ heteroaryl group. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more rings condensed and only carbon atoms as ring forming atoms (e.g., 8 to 60 carbon atoms), wherein the entire molecular structure (as a whole) is non-aromatic. Non-limiting examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom, other than carbon atoms (e.g., 1 to 60 carbon atoms), as a ring-forming atom, wherein the entire molecular structure (as a whole) is non-aromatic. Non-limiting examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein refers to a monovalent group represented by $—OA_{102}$ (wherein $A_{102}$ is the $C_6$-$C_{60}$ aryl group). The term "$C_6$-$C_{60}$ arylthio group" as used herein refers to a monovalent group represented by $—SA_{103}$ (wherein $A_{103}$ is the $C_6$-$C_{60}$ aryl group).

The term "$R_{10a}$" as used herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each independently unsubstituted or substituted with deuterium, —F, $—C_1$, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group unsubstituted or substituted with deuterium, —F, a cyano group, a $C_1$-$C_{60}$ alkyl group, a $C_1$-$C_{60}$ alkoxy group, a phenyl group, a biphenyl group, a pyridinyl group, a pyrimidinyl group, a pyridazinyl group, a pyrazinyl group, a triazinyl group, or any combination thereof; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each independently unsubstituted or substituted with deuterium, —F, a cyano group, a $C_1$-$C_{60}$ alkyl group, a $C_1$-$C_{60}$ alkoxy group, a phenyl group, a biphenyl group, a pyridinyl group, a pyrimidinyl group, a pyridazinyl group, a pyrazinyl group, a triazinyl group, or any combination thereof.

The term "heteroatom" as used herein refers to any atom other than a carbon atom. Non-limiting examples of the heteroatom may include O, S, N, P, Si, B, Ge, Se, or any combination thereof.

"Ph" used herein represents a phenyl group, "Me" used herein represents a methyl group, "Et" used herein represents an ethyl group, "tert-Bu" or "$Bu^t$" used herein represents a tert-butyl group, "OMe" used herein represents a methoxy group, and "D" as used herein represents deuterium.

The term "biphenyl group" as used herein refers to a phenyl group substituted with at least one phenyl group. The "biphenyl group" belongs to "a substituted phenyl group" having a "$C_6$-$C_{60}$ aryl group" as a substituent.

The term "terphenyl group" as used herein refers to a phenyl group substituted with at least one biphenyl group. The "terphenyl group" belongs to "a substituted phenyl group" having a "$C_6$-$C_{60}$ aryl group substituted with a $C_6$-$C_{60}$ aryl group" as a substituent.

The symbols *, *' and *" as used herein, unless defined otherwise, refer to a binding site to an adjacent atom in a corresponding formula.

Hereinafter, compounds and a light-emitting device according to one or more embodiments will be described in more detail with reference to Synthesis Examples and Examples. The wording "B was used instead of A" used in describing Synthesis Examples means that an amount of B used was identical to an amount of A used in terms of molar equivalents.

EXAMPLES

Synthesis Example 1 (Synthesis of Compound D6)

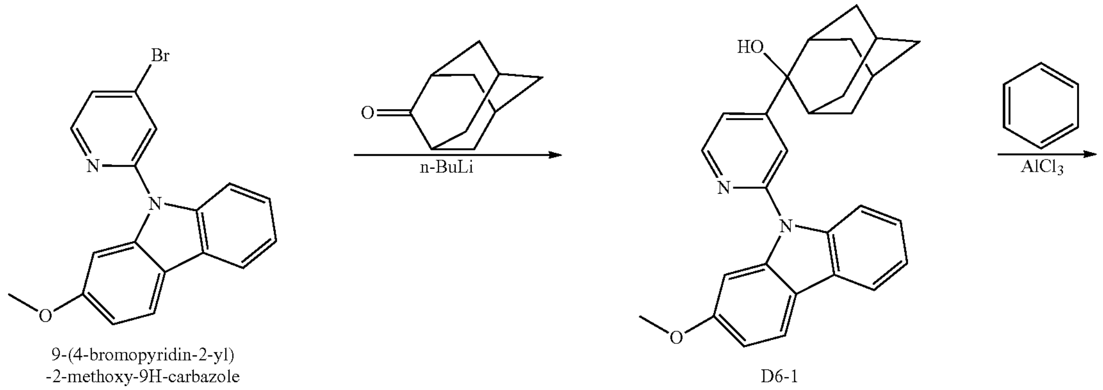

9-(4-bromopyridin-2-yl)-2-methoxy-9H-carbazole

D6-1

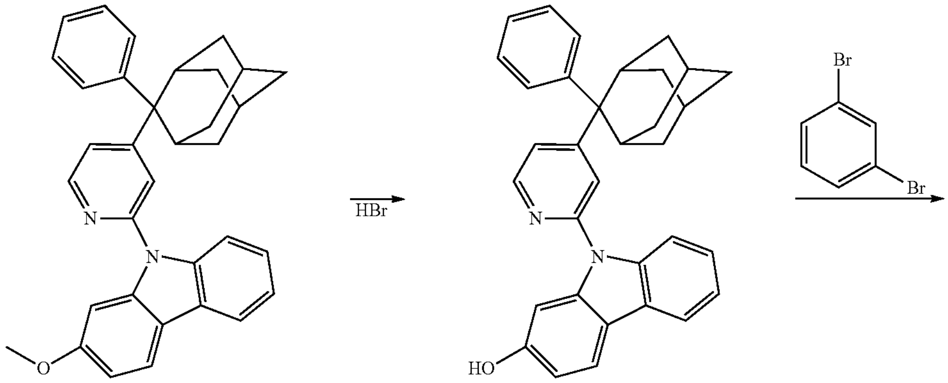

D6-2

D6-3

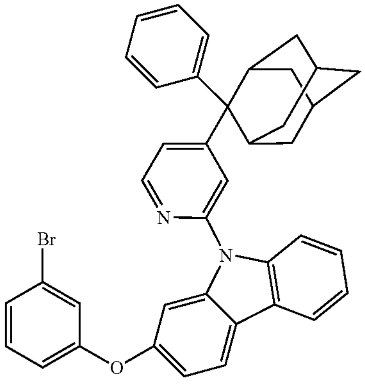

D6-4

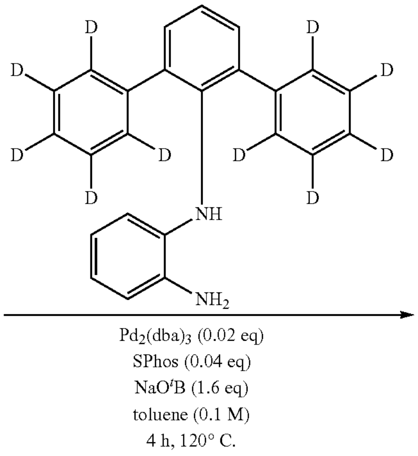

-continued
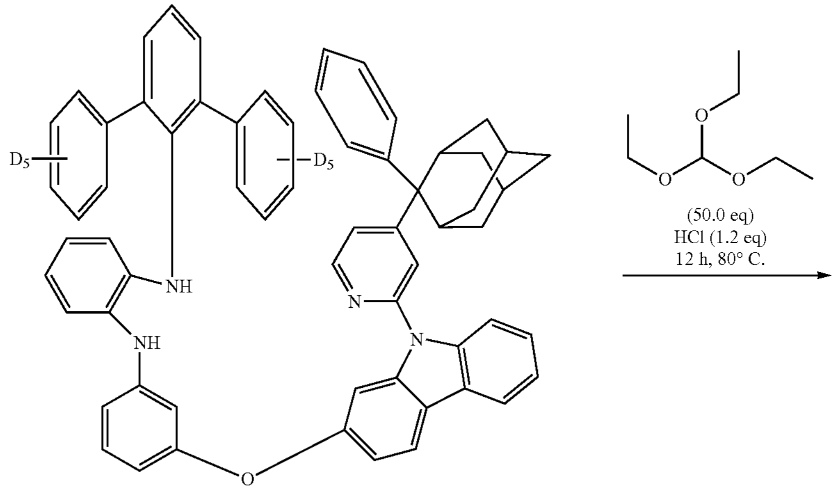
D6-5
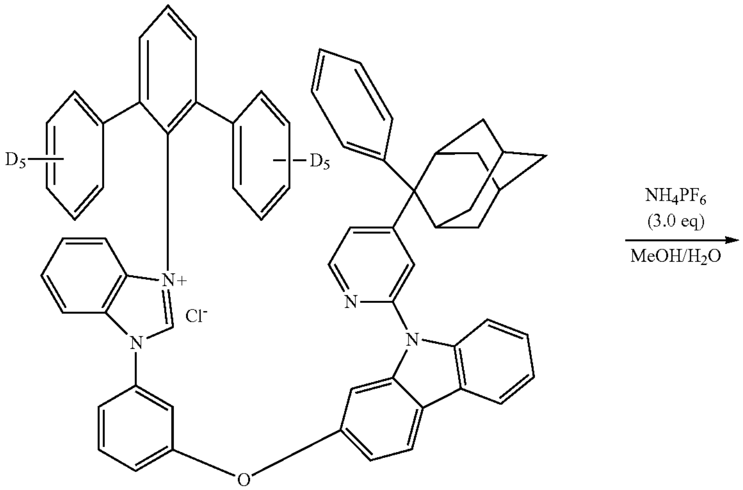
D6-6
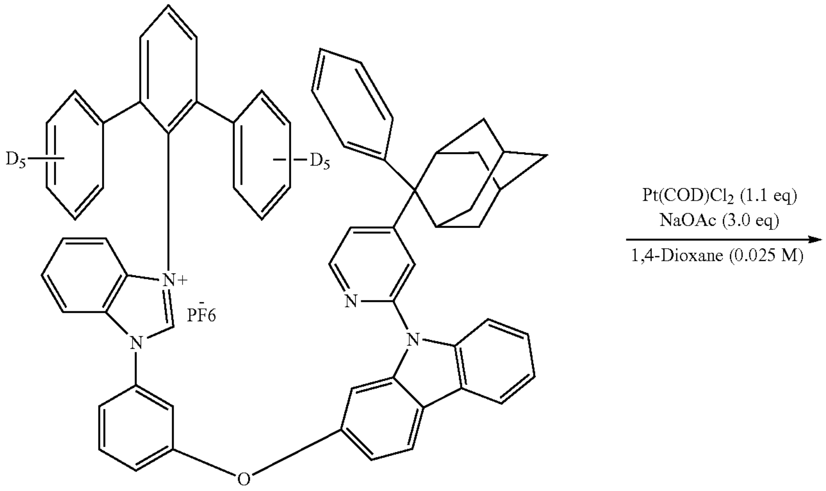
D6-7

-continued

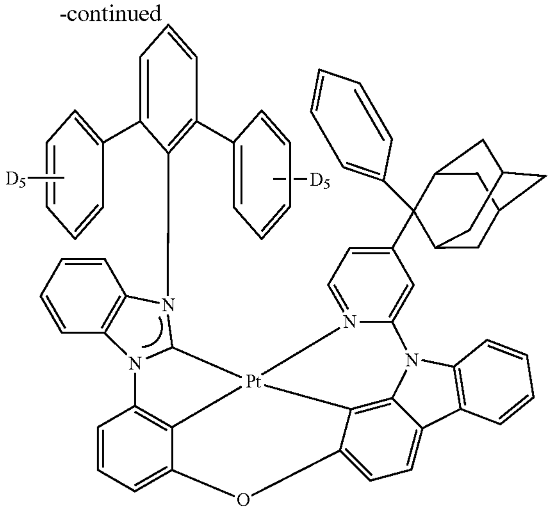

D6

Synthesis of Intermediate D6-1

25.0 g (70.8 mmol) of 9-(4-bromopyridin-2-yl)-2-methoxy-9H-carbazole was mixed with 700 mL of tetrahydrofuran, the temperature was lowered to −78° C., and 39 mL of n-BuLi solution (2.0 molar (M) in hexane) was added thereto, followed by stirring for 1 hour at the same temperature. Then, 21.3 g (141.6 mmol) of 2-adamantanone was added thereto, and the temperature was raised to room temperature, followed by stirring for 24 hours. Once the reaction was complete, a $NaHCO_3$ solution was added thereto, and an organic layer was extracted therefrom using ethyl acetate, and the extracted organic layer was washed with saturated NaCl aqueous solution, followed by drying using sodium sulfate. The resulting product was subjected to column chromatography to thereby obtain 22.3 g (52.5 mmol) of Intermediate D6-1.

Synthesis of Intermediate D6-2

22.3 g (52.5 mmol) of Intermediate D6-1 and 21.0 g (157.5 mmol) of $AlCl_3$ were stirred for 24 hours at room temperature with excess benzene in a nitrogen atmosphere. Once the reaction was complete, a $NaHCO_3$ solution was added thereto for neutralization, and an organic layer was extracted therefrom using ethyl acetate, and the extracted organic layer was washed with saturated NaCl aqueous solution, followed by drying using sodium sulfate. The resulting product was subjected to column chromatography to thereby obtain 20.0 g (41.2 mmol) of Intermediate D6-2.

Synthesis of Intermediate D6-3

20.2 g (41.7 mmol) of Intermediate D6-2 was suspended in an excess hydrobromic acid solution, followed by raising the temperature to 110° C. and stirring for 24 hours. Once the reaction was complete, the temperature was lowered to room temperature, and a proper amount of $NaHCO_3$ was added thereto for neutralization. Then, 300 mL of distilled water was added thereto, and an organic layer was extracted therefrom using ethyl acetate, and the extracted organic layer was washed using saturated sodium chloride aqueous solution, followed by drying using $MgSO_4$. The resulting product was subjected to column chromatography to thereby obtain 18.9 g (39.5 mmol) of Intermediate D6-3.

Synthesis of Intermediate D6-4

15.4 g (32.7 mmol) of Intermediate D6-3, 8.2 g (34.6 mmol) of 1,3-dibromobenzene, 13.9 g (65.4 mmol, 2.0 eq.) of $K_3PO_4$, 0.6 g (3.3 mmol, 0.1 eq.) of CuI, and 1.3 g (3.3 mmol) of di([1,1'-biphenyl]-2-yl)oxalamide were added to a reaction vessel, and the mixture was suspended in 80 mL of dimethyl sulfoxide, followed by raising the temperature to 160° C. and stirring for 12 hours. Once the reaction was complete, the temperature was lowered to room temperature, and 300 mL of distilled water was added thereto. Then, an organic layer was extracted therefrom using ethyl acetate, and the extracted organic layer was washed with saturated NaCl aqueous solution, followed by drying using sodium sulfate. The resulting product was subjected to column chromatography to thereby obtain 16.5 g (26.3 mmol) of Intermediate D6-4.

Synthesis of Intermediate D6-5

23.8 g (38.1 mmol) of Intermediate D6-4, 15.8 g (45.7 mmol) of $N^1$-([1,1':3',1"-terphenyl]-2'-yl-2,2",3,3",4,4",5,5",6,6"-$d_{10}$)benzene-1,2-diamine, 0.4 g (0.76 mmol, 0.02 eq.) of $Pd_2(dba)_3$, 0.6 g (1.52 mmol, 0.04 eq.) of SPhos, and 4.8 g (49.5 mmol, 1.6 eq.) of $NaO^tBu$ were added to a reaction vessel, and the mixture was suspended in 100 mL of toluene (0.1 M), followed by raising the temperature to 120° C. and stirring for 4 hours. Once the reaction was complete, the temperature was lowered to room temperature, and 300 mL of distilled water was added thereto. Then, an organic layer was extracted therefrom using ethyl acetate, and the extracted organic layer was washed with saturated NaCl aqueous solution, followed by drying using sodium sulfate. The resulting product was subjected to column chromatography to thereby obtain 23.6 g (26.5 mmol) of Intermediate D6-5.

Synthesis of Intermediate D6-6

23.2 g (26.0 mmol) of Intermediate D6-5, 216 ml_(1.3 mol, 50.0 eq.) of triethyl orthoformate, and 0.9 ml_(31.2 mmol, 1.2 eq.) of HCl (37%) were added to a reaction vessel, and the temperature was raised to 80° C. and stirred for 12 hours. Once the reaction was complete, the temperature was cooled to room temperature, and the resulting solid was filtered and washed using ether. Then, the washed solid was dried to thereby obtain 22.5 g (23.4 mmol) of Intermediate D6-6.

Synthesis of Intermediate D6-7

21.1 g (22.5 mmol) of Intermediate D6-6 and 11.0 g (67.5 mmol, 3.0 eq.) of $NH_4PF_6$ were added to a reaction vessel, and the mixture was suspended in a mixed solution of 100 mL of methyl alcohol and 50 mL of water (at a volumetric ratio of 2:1), followed by stirring at room temperature for 24 hours. Once the reaction was complete, the resulting solid was filtered and washed using ether. Then, the washed solid was dried to thereby obtain 26.0 g (16.8 mmol) of Intermediate D6-7.

Synthesis of Compound D6

16.5 g (15.8 mmol) of Intermediate D6-7, 6.2 g (16.7 mmol, 1.1 eq.) of dichloro(1,5-cyclooctadiene)platinum, and 3.9 g (47.4 mmol, 3.0 eq.) of NaOAc were suspended in 300 mL of 1,4-dioxane (0.025 M), and the temperature was raised to 110° C., followed by stirring for 72 hours. Once the reaction was complete, the temperature was cooled to room temperature, 250 mL of distilled water was added thereto, and an organic layer was extracted therefrom using ethyl acetate, and the extracted organic layer was washed using NaCl aqueous solution and dried using $MgSO_4$. The resulting product was subjected to column chromatography to thereby obtain 5.5 g (5.1 mmol) of Compound D6.

Synthesis Example 2 (Synthesis of Compound D12)

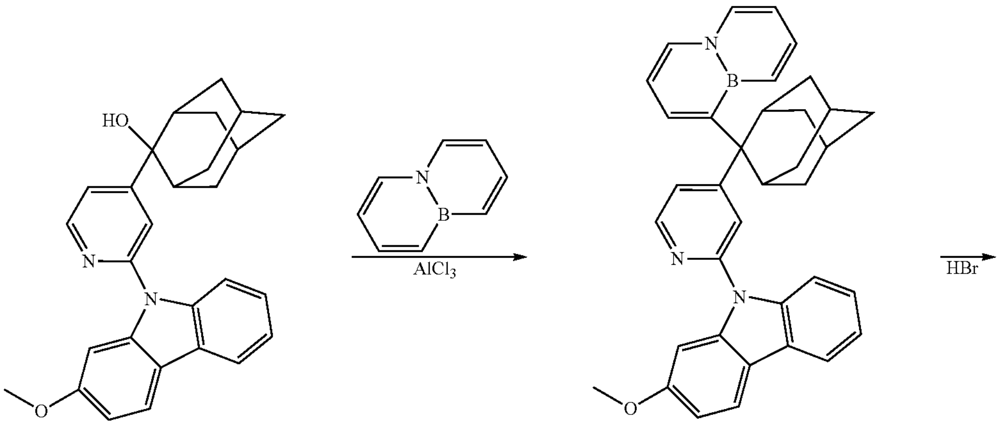

D6-1

D12-2

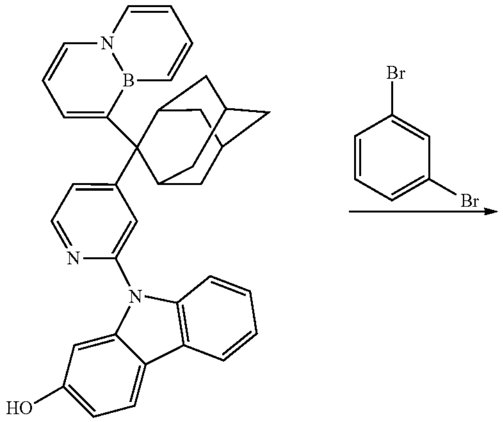

D12-3

-continued
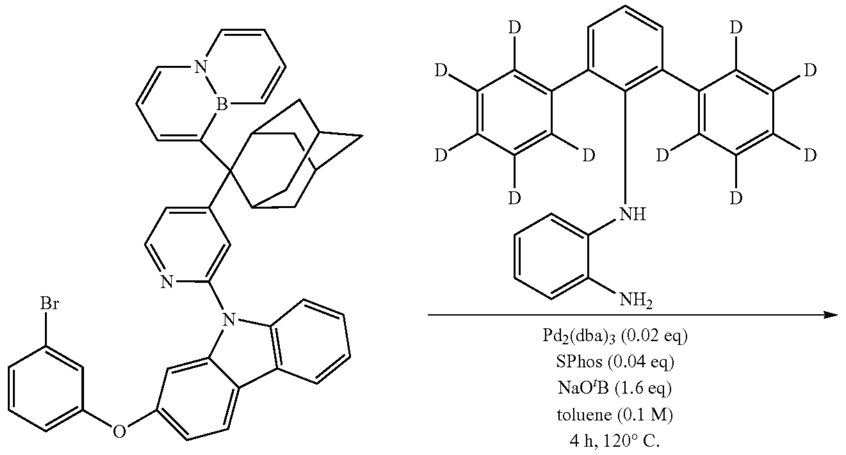
D12-4
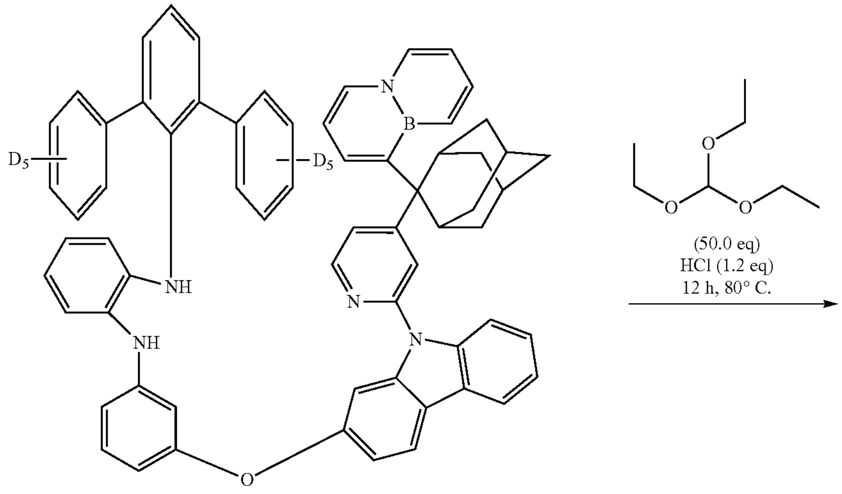
D12-5
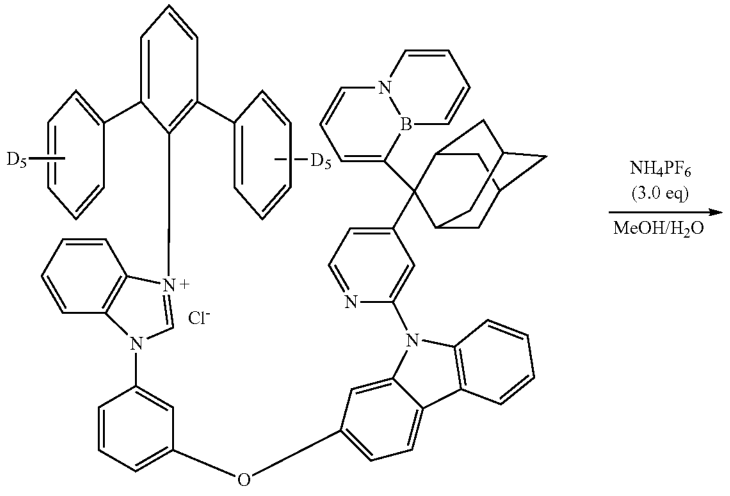
D12-6

-continued

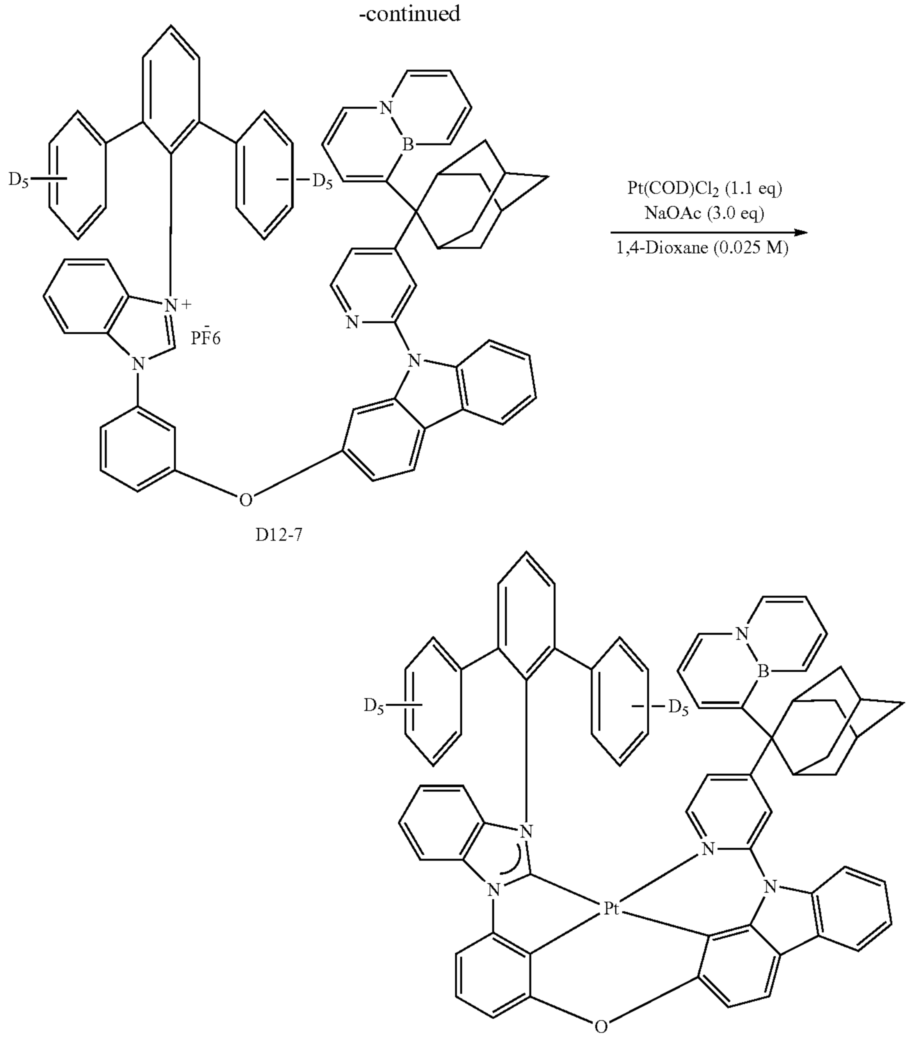

D12-7

D12

Synthesis of Intermediate D12-2

22.3 g (52.5 mmol) of Intermediate D6-1, 21.0 g (157.5 mmol) of $AlCl_3$, and 4a,8a-azaboranaphthalene (1.0 eq.) were stirred for 24 hours at a temperature of 40° C. with excess dichloromethane in a nitrogen atmosphere. Once the reaction was complete, a $NaHCO_3$ solution was added thereto for neutralization, and an organic layer was extracted therefrom using ethyl acetate, and the extracted organic layer was washed with saturated NaCl aqueous solution, followed by drying using sodium sulfate. The resulting product was subjected to column chromatography to thereby obtain Intermediate D12-2.

Synthesis of Intermediate D12-3

Intermediate D12-3 was obtained in substantially the same manner as in Synthesis of Intermediate D6-3 in Synthesis Example 1, except that Intermediate D12-2 was used instead of Intermediate D6-2.

Synthesis of Intermediate D12-4

Intermediate D12-4 was obtained in substantially the same manner as in Synthesis of Intermediate D6-4 in Synthesis Example 1, except that Intermediate D12-3 was used instead of Intermediate D6-3.

Synthesis of Intermediate D12-5

Intermediate D12-5 was obtained in substantially the same manner as in Synthesis of Intermediate D6-5 in Synthesis Example 1, except that Intermediate D12-4 was used instead of Intermediate D6-4.

Synthesis of Intermediate D12-6

Intermediate D12-6 was obtained in substantially the same manner as in Synthesis of Intermediate D6-6 in Synthesis Example 1, except that Intermediate D12-5 was used instead of Intermediate D6-5.

Synthesis of Intermediate D12-7

Intermediate D12-7 was obtained in substantially the same manner as in Synthesis of Intermediate D6-7 in Synthesis Example 1, except that Intermediate D12-6 was used instead of Intermediate D6-6.

Synthesis of Compound D12
5.60 g (4.90 mmol) of Compound D12 was obtained in substantially the same manner as in Synthesis of Compound D6 in Synthesis Example 1, except that Intermediate D12-7 was used instead of Intermediate D6-7.
Synthesis Example 3 (Synthesis of Compound D27)
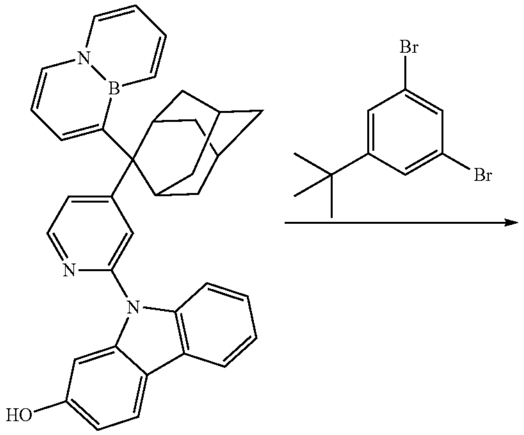
D12-3
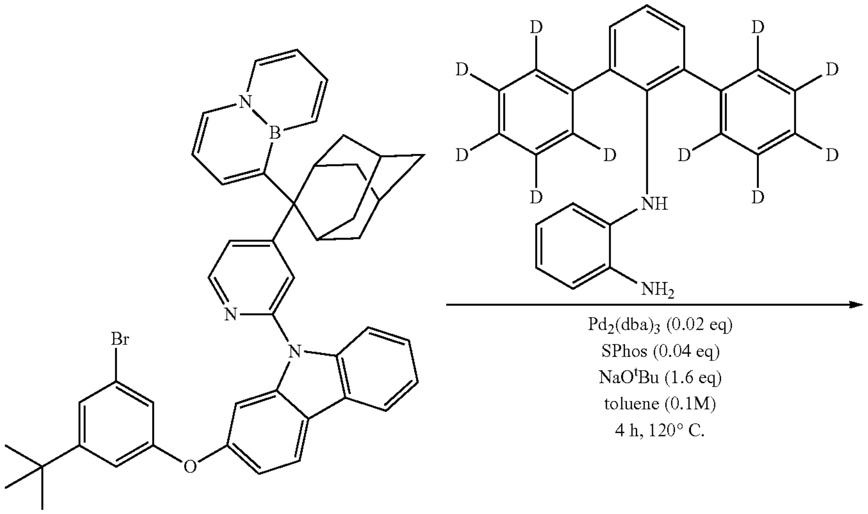
D27-4

-continued
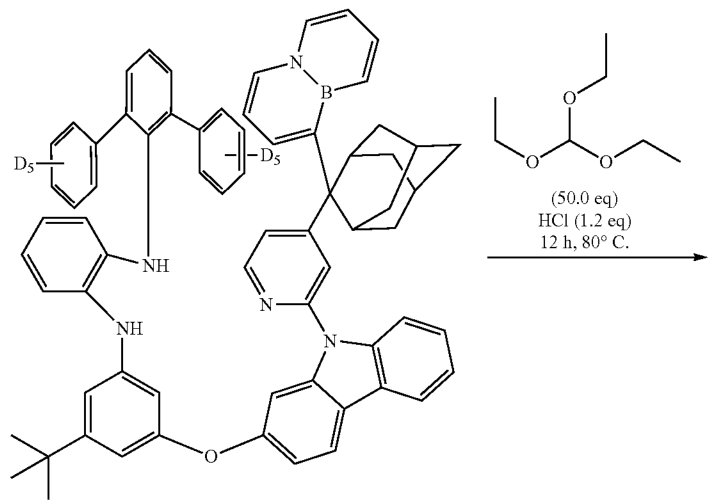
D27-5
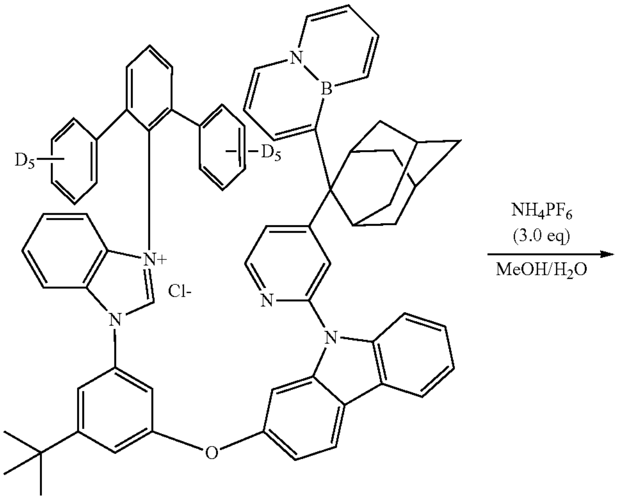
D27-6
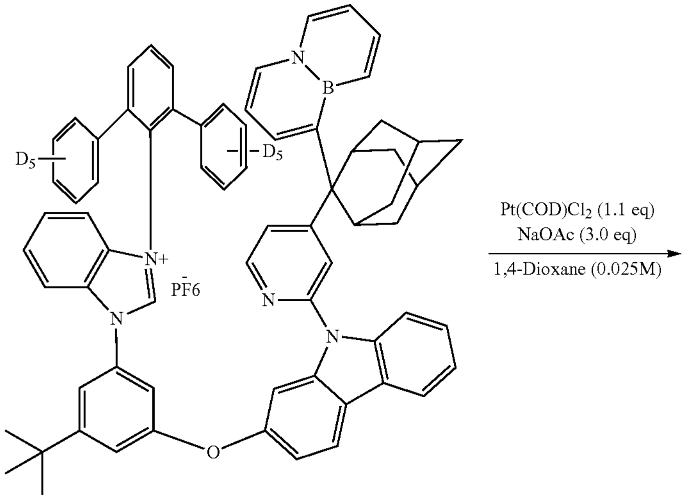
D27-7

-continued

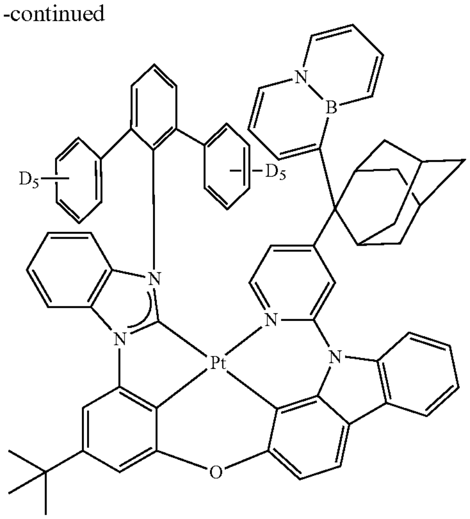

D27

Synthesis of Intermediate D27-4

Intermediate D27-4 was synthesized in substantially the same manner as in Synthesis of Intermediate D12-4 in Synthesis Example 2, except that 1,3-dibromo-5-(tert-butyl) benzene was used instead of 1,3-dibromobenzene.

Synthesis of Intermediate D27-5

Intermediate D27-5 was obtained in substantially the same manner as in Synthesis of Intermediate D12-5 in Synthesis Example 2, except that Intermediate D27-4 was used instead of Intermediate D12-4.

Synthesis of Intermediate D27-6

Intermediate D27-6 was obtained in substantially the same manner as in Synthesis of Intermediate D12-6 in Synthesis Example 2, except that Intermediate D27-5 was used instead of Intermediate D12-5.

Synthesis of Intermediate D27-7

Intermediate D27-7 was obtained in substantially the same manner as in Synthesis of Intermediate D12-7 in Synthesis Example 2, except that Intermediate D27-6 was used instead of Intermediate D12-6.

Synthesis of Compound D27

5.88 g (4.90 mmol) of Compound D27 was obtained in substantially the same manner as in Synthesis of Compound D12 in Synthesis Example 2, except that Intermediate D27-7 was used instead of Intermediate D12-7.

Synthesis Example 4 (Synthesis of Compound D81)

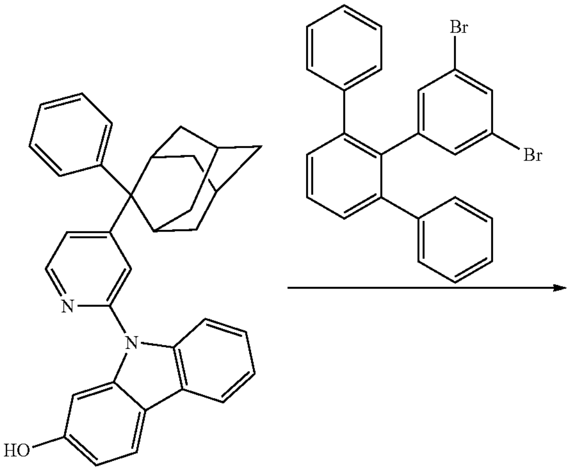

D6-3

-continued
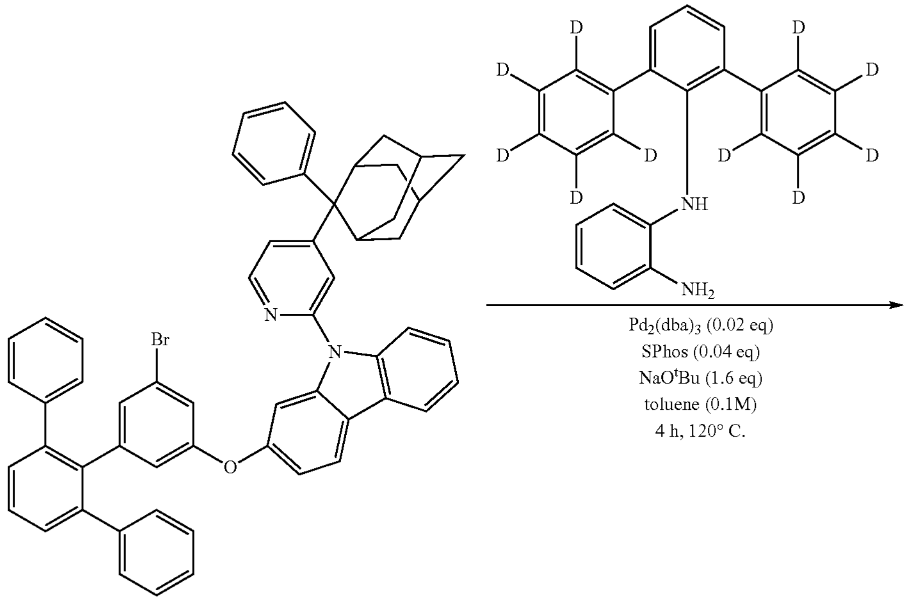
D81-4
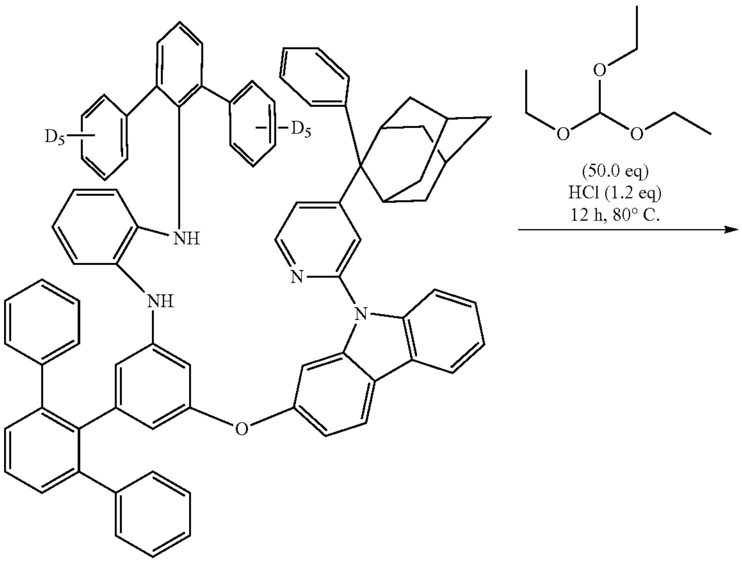
D81-5

-continued
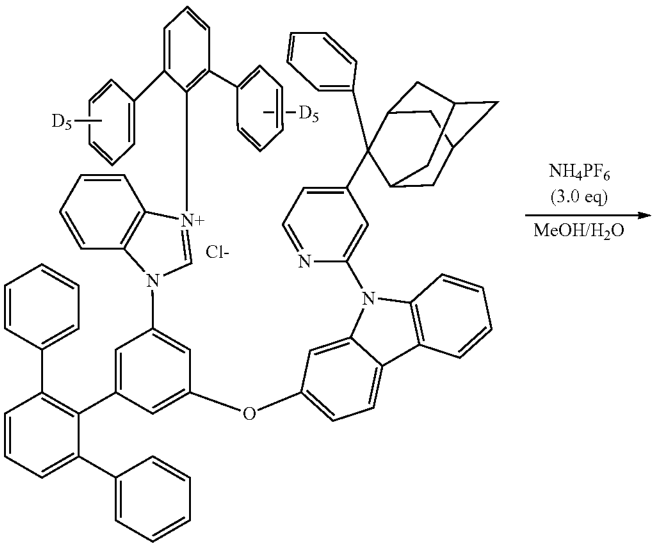
D81-6
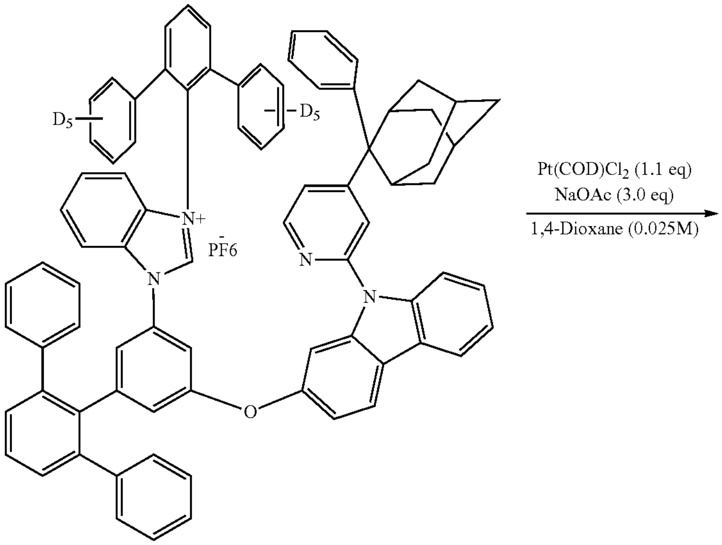
D81-7

-continued

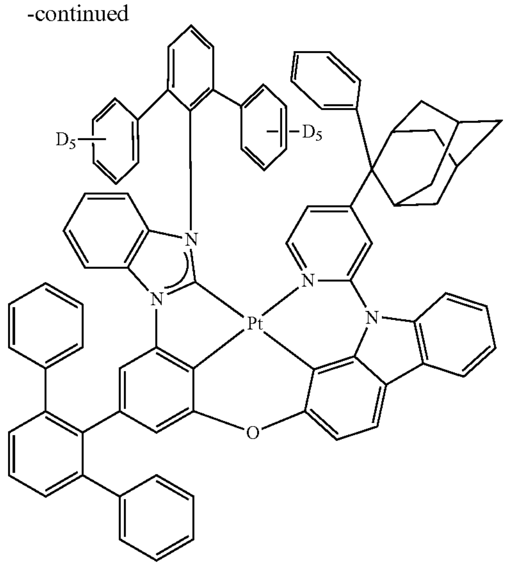

D81

Synthesis of Intermediate D81-4

Intermediate D81-4 was synthesized in substantially the same manner as in Synthesis of Intermediate D6-4 in Synthesis Example 1, except that 3,5-dibromo-6'-phenyl-1,1':2',1"-terphenyl was used instead of 1,3-dibromobenzene.

Synthesis of Intermediate D81-5

Intermediate D81-5 was obtained in substantially the same manner as in Synthesis of Intermediate D6-5 in Synthesis Example 1, except that Intermediate D81-4 was used instead of Intermediate D6-4.

Synthesis of Intermediate D81-6

Intermediate D81-6 was obtained in substantially the same manner as in Synthesis of Intermediate D6-6 in Synthesis Example 1, except that Intermediate D81-5 was used instead of Intermediate D6-5.

Synthesis of Intermediate D81-7

Intermediate D81-7 was obtained in substantially the same manner as in Synthesis of Intermediate D6-7 in Synthesis Example 1, except that Intermediate D81-6 was used instead of Intermediate D6-6.

Synthesis of Compound D81

5.22 g (3.95 mmol) of Compound D81 was obtained in substantially the same manner as in Synthesis of Compound D6 in Synthesis Example 1, except that Intermediate D81-7 was used instead of Intermediate D6-7.

Synthesis Example 5 (Synthesis of Compound D302)

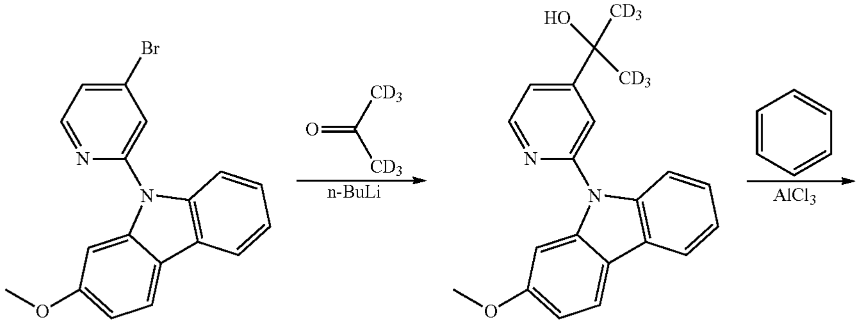

9-(4-bromopyridin-2-yl)-2-methoxy-9H-carbazole

D302-1

-continued
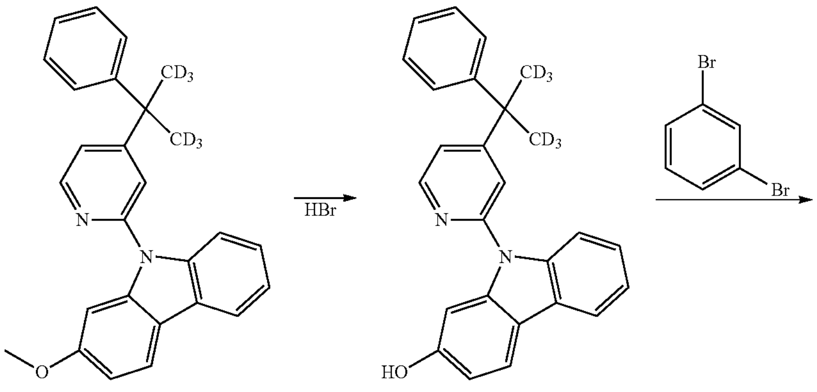
D302-2 D302-3
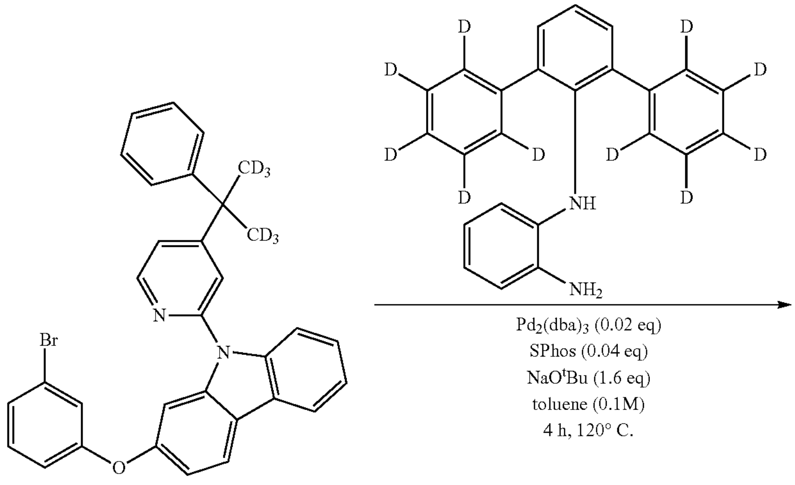
D302-4
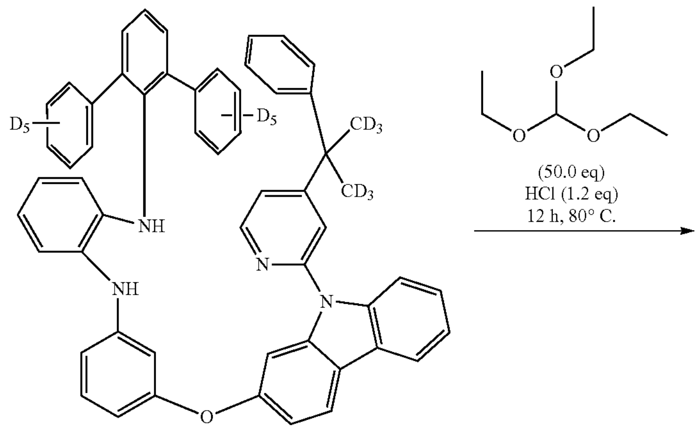
D302-5

-continued

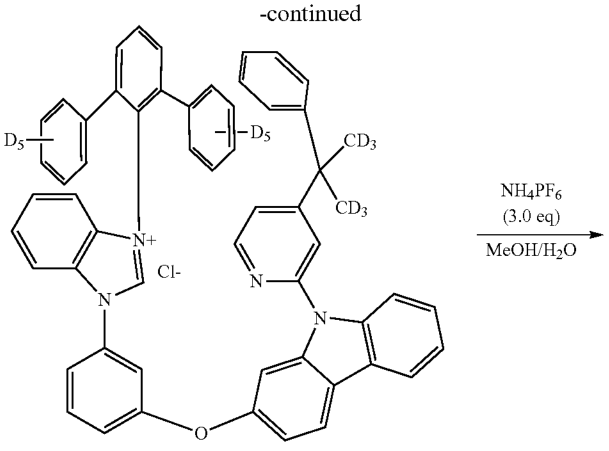

D302-6

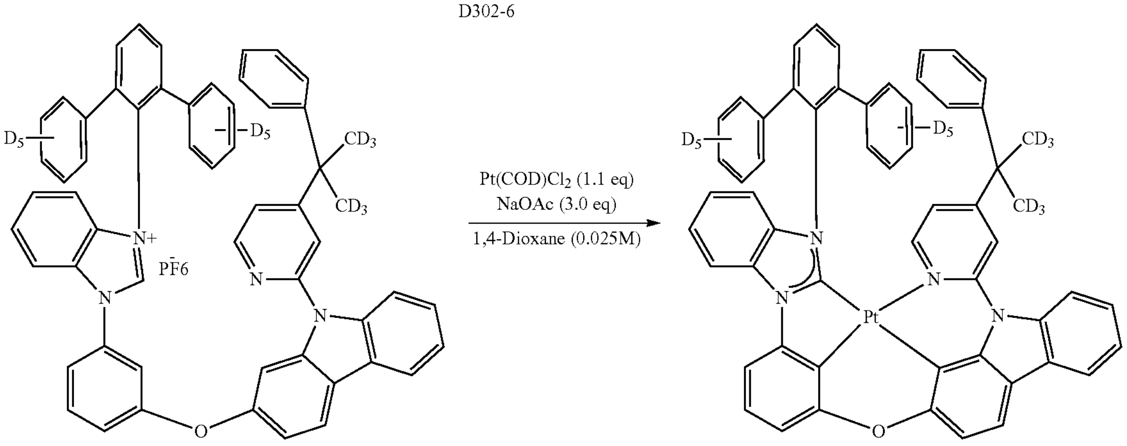

D302-7 D302

Synthesis of Intermediate D302-1

Intermediate D302-1 was synthesized in substantially the same manner as in Synthesis of Intermediate D6-1 in Synthesis Example 1, except that acetone-$d_6$ was used instead of 2-adamantanone.

Synthesis of Intermediate D302-2

Intermediate D302-2 was obtained in substantially the same manner as in Synthesis of Intermediate D6-2 in Synthesis Example 1, except that Intermediate D302-1 was used instead of Intermediate D6-1.

Synthesis of Intermediate D302-3

Intermediate D302-3 was obtained in substantially the same manner as in Synthesis of Intermediate D6-3 in Synthesis Example 1, except that Intermediate D302-2 was used instead of Intermediate D6-2.

Synthesis of Intermediate D302-4

Intermediate D302-4 was obtained in substantially the same manner as in Synthesis of Intermediate D6-4 in Synthesis Example 1, except that Intermediate D302-3 was used instead of Intermediate D6-3.

Synthesis of Intermediate D302-5

Intermediate D302-5 was obtained in substantially the same manner as in Synthesis of Intermediate D6-5 in Synthesis Example 1, except that Intermediate D302-4 was used instead of Intermediate D6-4.

Synthesis of Intermediate D302-6

Intermediate D302-6 was obtained in substantially the same manner as in Synthesis of Intermediate D6-6 in Synthesis Example 1, except that Intermediate D302-5 was used instead of Intermediate D6-5.

Synthesis of Intermediate D302-7

Intermediate D302-7 was obtained in substantially the same manner as in Synthesis of Intermediate D6-7 in Synthesis Example 1, except that Intermediate D302-6 was used instead of Intermediate D6-6.

Synthesis of Compound D302

5.73 g (5.69 mmol) of Compound D302 was obtained in substantially the same manner as in Synthesis of Compound D6 in Synthesis Example 1, except that Intermediate D302-7 was used instead of Intermediate D6-7.

Compounds synthesized in the Synthesis Examples 1 to 5 were identified by $^1H$ nuclear magnetic resonance (NMR)

and matrix-assisted laser desorption/ionization mass spectrometry time-of-flight mass spectroscopy (MALDI-TOF MS). The results thereof are shown in Table 1. Methods of synthesizing compounds other than the compounds synthesized in Synthesis Examples 1 to 5 may be easily understood by those skilled in the art by referring to the synthesis pathways and raw materials described above.

TABLE 1

| Compound | $^{1}$H NMR ($CDCl_3$, 500 MHz) | MALDI-TOF MS [$M^+$] found | MALDI-TOF MS [$M^+$] calc. |
|---|---|---|---|
| D6 | δ 8.87 (d, 1H, $^{3}J_{H-H}$ = 6.4 Hz), 8.10 (d, 1H, $^{3}J_{H-H}$ = 7.1 Hz), 8.04 (s, 1H), 7.96 (d, 1H, $^{3}J_{H-H}$ = 8.3 Hz), 7.92 (d, 1H, $^{3}J_{H-H}$ = 8.1 Hz), 7.76 (d, 1H, $^{3}J_{H-H}$ = 8.3 Hz), 7.56 (td, 1H, $^{3}J_{H-H}$ = 7.1 Hz, $^{4}J_{H-H}$ = 1.1 Hz), 7.46-7.43 (m, 6H), 7.29 (d, 1H, $^{3}J_{H-H}$ = 8.2 Hz), 7.23-7.20 (m 6H), 7.05-7.00 (m, 2H), 6.84 (d, 1H, $^{3}J_{H-H}$ = 8.0 Hz), 6.23 (d, 1H, $^{3}J_{H-H}$ = 5.0 Hz), 3.04 (m, 2H), 1.98-1.69 (m, 12H). | 1093.43 | 1093.41 |
| D12 | δ 8.88 (d, 1H, $^{3}J_{H-H}$ = 6.4 Hz), 8.10-8.08 (m, 2H), 8.02 (s, 1H), 7.96 (d, 1H, $^{3}J_{H-H}$ = 8.3 Hz), 7.94-7.92 (m, 2H) 7.83-7.77 (m, 2H), 7.76 (d, 1H, $^{3}J_{H-H}$ = 8.3 Hz), 7.56 (td, 1H, $^{3}J_{H-H}$ = 7.1 Hz, $^{4}J_{H-H}$ = 1.1 Hz), 7.46-7.43 (m, 3H), 7.29 (d, 1H, $^{3}J_{H-H}$ = 8.2 Hz), 7.23-7.20 (m, 5H), 7.05-7.00 (m, 2H), 6.84 (d, 1H, $^{3}J_{H-H}$ = 8.0 Hz), 6.83-6.81 (m, 2H), 6.23 (d, 1H, $^{3}J_{H-H}$ = 5.0 Hz), 3.05 (m, 2H), 1.98-1.69 (m, 12H). | 1144.47 | 1144.44 |
| D27 | δ 8.87 (d, 1H, $^{3}J_{H-H}$ = 6.4 Hz), 8.11-8.07 (m, 2H), 8.03 (s, 1H), 7.94 (d, 1H, $^{3}J_{H-H}$ = 8.3 Hz), 7.93-7.91 (m, 2H) 7.83-7.77 (m, 2H), 7.75 (d, 1H, $^{3}J_{H-H}$ = 8.3 Hz), 7.54 (td, 1H, $^{3}J_{H-H}$ = 7.1 Hz, $^{4}J_{H-H}$ = 1.1 Hz), 7.47-7.43 (m, 2H), 7.28 (d, 1H, $^{3}J_{H-H}$ = 8.2 Hz), 7.23-7.18 (m, 5H), 7.04-7.01 (m, 2H), 6.85 (d, 1H, $^{3}J_{H-H}$ = 8.0 Hz), 6.84-6.82 (m, 2H), 6.24 (d, 1H, $^{3}J_{H-H}$ = 5.0 Hz), 3.04 (m, 2H), 1.98-1.69 (m, 12H), 1.32 (s, 9H). | 1200.52 | 1200.50 |
| D81 | δ 8.86 (d, 1H, $^{3}J_{H-H}$ = 6.4 Hz), 8.11 (d, 1H, $^{3}J_{H-H}$ = 7.1 Hz), 8.02 (s, 1H), 7.94 (d, 1H, $^{3}J_{H-H}$ = 8.3 Hz), 7.90 (d, 1H, $^{3}J_{H-H}$ = 8.1 Hz), 7.76 (d, 1H, $^{3}J_{H-H}$ = 8.3 Hz), 7.50-7.43 (m, 11H), 7.30 (d, 1H, $^{3}J_{H-H}$ = 8.2 Hz), 7.23-7.20 (m 14H), 7.04-7.01 (m, 2H), 6.83 (d, 1H, $^{3}J_{H-H}$ = 8.0 Hz), 6.22 (d, 1H, $^{3}J_{H-H}$ = 5.0 Hz), 3.03 (m, 2H), 1.98-1.68 (m, 12H). | 1321.51 | 1321.50 |
| D302 | δ 8.88 (d, 1H, $^{3}J_{H-H}$ = 6.4 Hz), 8.04 (d, 1H, $^{3}J_{H-H}$ = 7.7 Hz, $^{4}J_{H-H}$ = 1-3 Hz), 7.98 (d, 1H, $^{3}J_{H-H}$ = 8.3 Hz), 7.89 (d, 1H, $^{4}J_{H-H}$ = 1.8 Hz), 7.74 (d, 1H, $^{3}J_{H-H}$ = 8.2 Hz), 7.67 (d, 1H, $^{3}J_{H-H}$ = 7.6 Hz), 7.48 (d, 1H, $^{3}J_{H-H}$ = 7.6 Hz, $^{4}J_{H-H}$ = 0.8 Hz), 7.44-7.40 (m, 4H), 7.36-7.20 (m, 10H), 7.07 (d, 1H, $^{3}J_{H-H}$ = 8.1 Hz, $^{4}J_{H-H}$ = 0.8 Hz), 7.05 (td, 1H, $^{3}J_{H-H}$ = 8.1 Hz, $^{4}J_{H-H}$ = 0.8 Hz), 6.87 (d, 1H, $^{3}J_{H-H}$ = 7.8 Hz). | 1007.43 | 1007.39 |

Evaluation Example 1

HOMO and LUMO energy levels of Compounds D6, D12, D27, D81, and D302 were evaluated according to the method in Table 2. The results thereof are shown in Table 3.

TABLE 2

| | |
|---|---|
| HOMO energy level evaluation method | A potential (V)-current (A) graph of each compound was obtained by using cyclic voltammetry (CV) (electrolyte: 0.1M $BBu_4NPF_6$/ solvent: dimethylforamide (DMF)/electrode: 3 electrode system (working electrode: GC, reference electrode: Ag/AgCl, auxiliary electrode: Pt)), and then, from oxidation onset of the graph, a HOMO energy level of the compound was calculated. |
| LUMO energy level evaluation method | A potential (V)-current (A) graph of each compound was obtained by using cyclic voltammetry (CV) (electrolyte: 0.1M $BBu_4NPF_6$/ solvent: dimethylforamide (DMF)/electrode: 3 electrode system (working electrode: GC, reference electrode: Ag/AgCl, auxiliary electrode: Pt)), and then, from reduction onset of the graph, a LUMO energy level of the compound was calculated. |

TABLE 3

| Compound No. | HOMO (eV) | LUMO (eV) |
|---|---|---|
| D6 | −5.26 | −2.09 |
| D12 | −5.22 | −2.22 |
| D27 | −5.23 | −2.24 |

TABLE 3-continued

| Compound No. | HOMO (eV) | LUMO (eV) |
|---|---|---|
| D81 | −5.25 | −2.25 |
| D302 | −5.26 | −2.14 |

D6

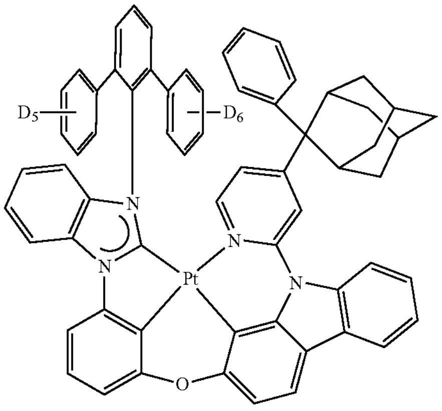

D12

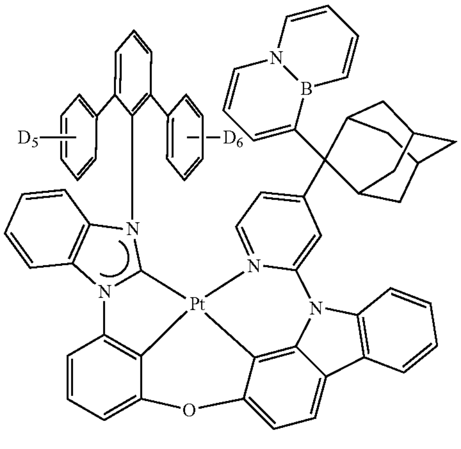

D27

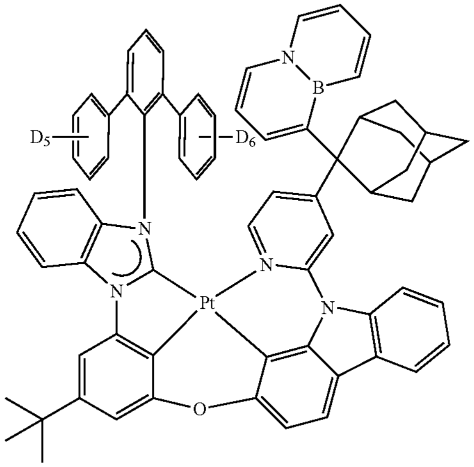

-continued

D81

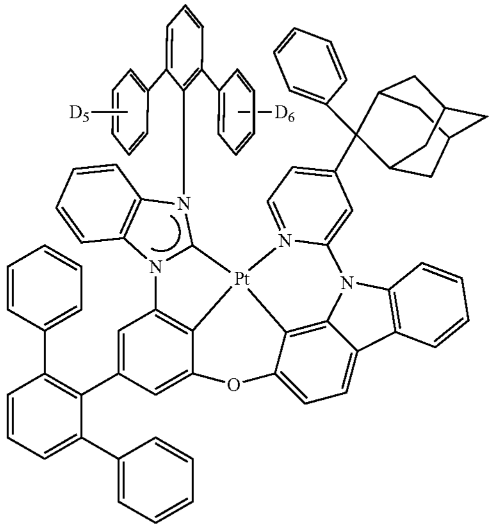

D302

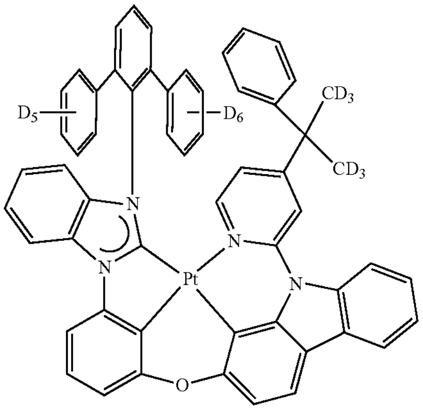

Evaluation Example 2

Film 1 having a thickness of 40 nm was prepared by vacuum-co-depositing ETH66, HTH29, and D6 on a quartz substrate at a vacuum degree of $10^{-7}$ torr. Here, regarding the amounts of Compounds ETH66, HTH29, and D6, a weight ratio of Compound ETH66 to Compound HTH29 was 3:7, and the content of Compound D6 was 10 parts by weight based on 100 parts by weight of the film. Subsequently, Films 2 to 5 were respectively prepared in substantially the same manner as in synthesis of Film 1, except that Compounds D12, D27, D81, or D302 was respectively used instead of Compound D6.

The emission spectrum of each of the Films was measured by using a Hamamatsu Quantaurus-QY absolute PL quantum yield measurement system equipped with a xenon light source, a monochromator, a photonic multichannel analyzer, and an integrating sphere, and utilizing PLQY measurement software (Hamamatsu Photonics, Ltd., Shizuoka, Japan). At the time of measurement, the excitation wavelength was measured by scanning from 320 nm to 380 nm at 10 nm intervals, of which the spectrum measured at the excitation wavelength of 340 nm was taken, and the maximum emission wavelength of the dopant included in each Film was obtained. The results are shown in Table 4.

Subsequently, regarding the emission quantum yield, the excitation wavelengths of Films 1 to 5 were measured by using Quantaurus-QY Absolute PL spectrometer (Hamamatsu) by scanning from 320 nm to 380 nm at 10 nm intervals, of which the spectrum at the excitation wavelength of 340 nm was taken to obtain the emission quantum yield (PLQY). Emission quantum yield of the dopant include in each Film is shown in Table 4.

TABLE 4

| Film No. | Film composition | Maximum emission wavelength (nm) | PLQY (%) |
|---|---|---|---|
| 1 | ETH66:HTH29:D6 | 456 | 93 |
| 2 | ETH66:HTH29:D12 | 457 | 94 |
| 3 | ETH66:HTH29:D27 | 458 | 94 |
| 4 | ETH66:HTH29:D81 | 458 | 95 |
| 5 | ETH66:HTH29:D302 | 456 | 89 |

ETH66

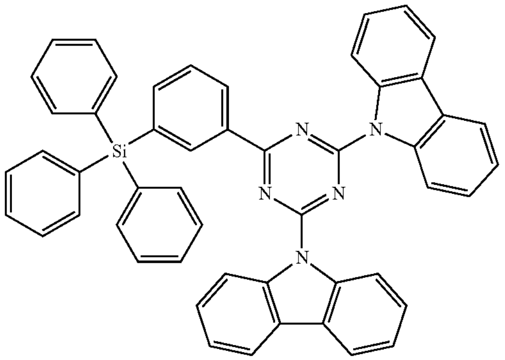

HTH29

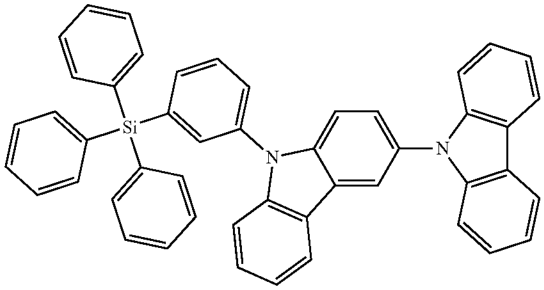

Referring to the results of Table 4, Compounds D6, D12, D27, D81, and D302 were found to emit blue light having excellent PLQY.

Evaluation Example 3

The PL spectrum of each of Films 1 to 5 was evaluated at room temperature by using a time-resolved photoluminescence (TRPL) measurement system, FluoTime 300 (available from PicoQuant), and a pumping source, PLS 340 (available from PicoQuant, excitation wavelength=340 nm, spectral width=20 nm). Then, a wavelength of the main peak in the PL spectrum was determined, and upon photon pulses (pulse width=500 picoseconds, ps) applied to the film by PLS 340, the number of photons emitted at the wavelength of the main peak for each film was repeatedly measured overtime by time-correlated single photon counting (TCSPC), thereby obtaining TRPL curves available for the sufficient fitting. Based on the results obtained therefrom, one or more exponential decay functions were set forth for the fitting, thereby obtaining $T_{decay}$(Ex), i.e., a decay time, for each of Films 1 to 5. The results thereof are shown in Table 5. The functions used for the fitting are as described in Equation 20, and a decay time $T_{decay}$ having the largest value among values for each of the exponential decay functions used for the fitting was taken as $T_{decay}$(Ex), i.e., a decay time. Here, during the same measurement time as the measurement time for obtaining TRPL curves, the same measurement was repeated once more in a dark state (i.e., a state where a pumping signal incident on each of the films was blocked), thereby obtaining a baseline or a background signal curve available as a baseline for the fitting:

$$f(t) = \sum_{i=1}^{n} A_i \exp(-t/T_{decay,i}) \quad \text{Equation 20}$$

TABLE 5

| Film No. | Film composition | Decay time (τ) (microseconds, μs) |
|---|---|---|
| 1 | ETH66:HTH29:D6 | 2.17 |
| 2 | ETH66:HTH29:D12 | 2.05 |
| 3 | ETH66:HTH29:D27 | 2.02 |
| 4 | ETH66:HTH29:D81 | 2.03 |
| 5 | ETH66:HTH29:D302 | 2.31 |

Referring to the results of Table 5, Compounds D6, D12, D27, D81, and D302 were found to have excellent decay time.

Example 1

As an anode, a 15 Ohms per square centimeter ($\Omega/cm^2$) (1,200 Å) ITO glass substrate (available from Corning Inc.) was cut to a size of 50 millimeters (mm)×50 mm×0.7 mm, sonicated in isopropyl alcohol and pure water for 5 minutes in each solvent, cleaned with ultraviolet rays for 30 minutes, and then with ozone, and was mounted on a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter, referred as "NPB") was vacuum-deposited on the hole injection layer to form a hole transport layer having a thickness of 300 Å.

Compound D6 (as the first compound), Compound ETH66 (as the second compound), and Compound HTH29 (as the third compound) were vacuum-deposited on the hole transport layer to form an emission layer having a thickness of 400 Å. Here, the content of Compound D6 was 10 wt %, based on 100 wt % of the total weight of the emission layer, and the weight ratio of Compound ETH66 to Compound HTH29 was 3:7.

Compound ETH2 was deposited on the emission layer to form a hole blocking layer having a thickness of 50 Å, $Alq_3$ was deposited on the hole blocking layer to form an electron transport layer having a thickness of 300 Å, LiF was vacuum-deposited on the electron transport layer to form an electron injection layer having a thickness of 10 Å, and Al was vacuum-deposited on the electron injection layer to form a cathode having a thickness of 3,000 Å, thereby completing the manufacture of an organic light-emitting device.

2-TNATA

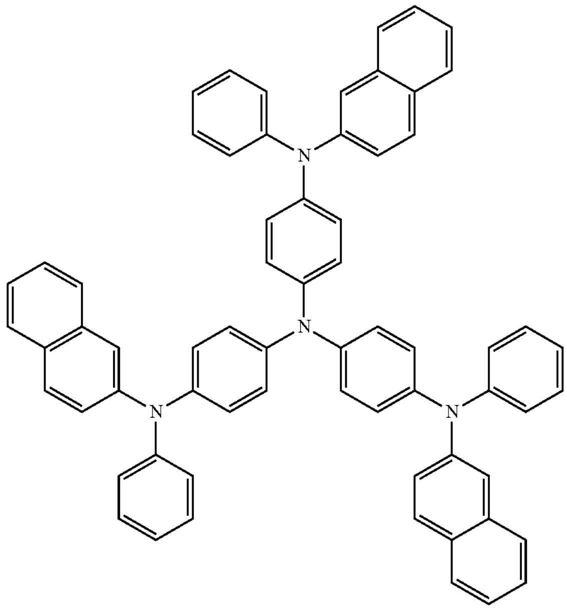

NPB

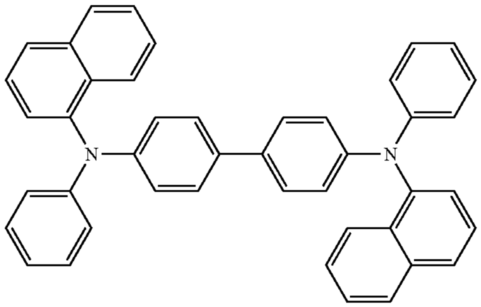

-continued

ETH3

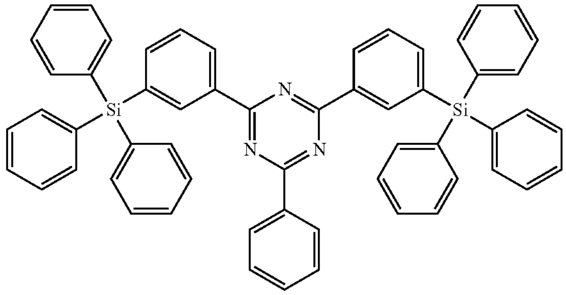

Examples 2 to 6

Organic light-emitting devices were manufactured in substantially the same manner as in Example 1, except that the compounds shown in Table 6 were used instead of the first compound, the second compound, and the third compound in the formation of each respective emission layer.

Evaluation Example 4

Figure 4:
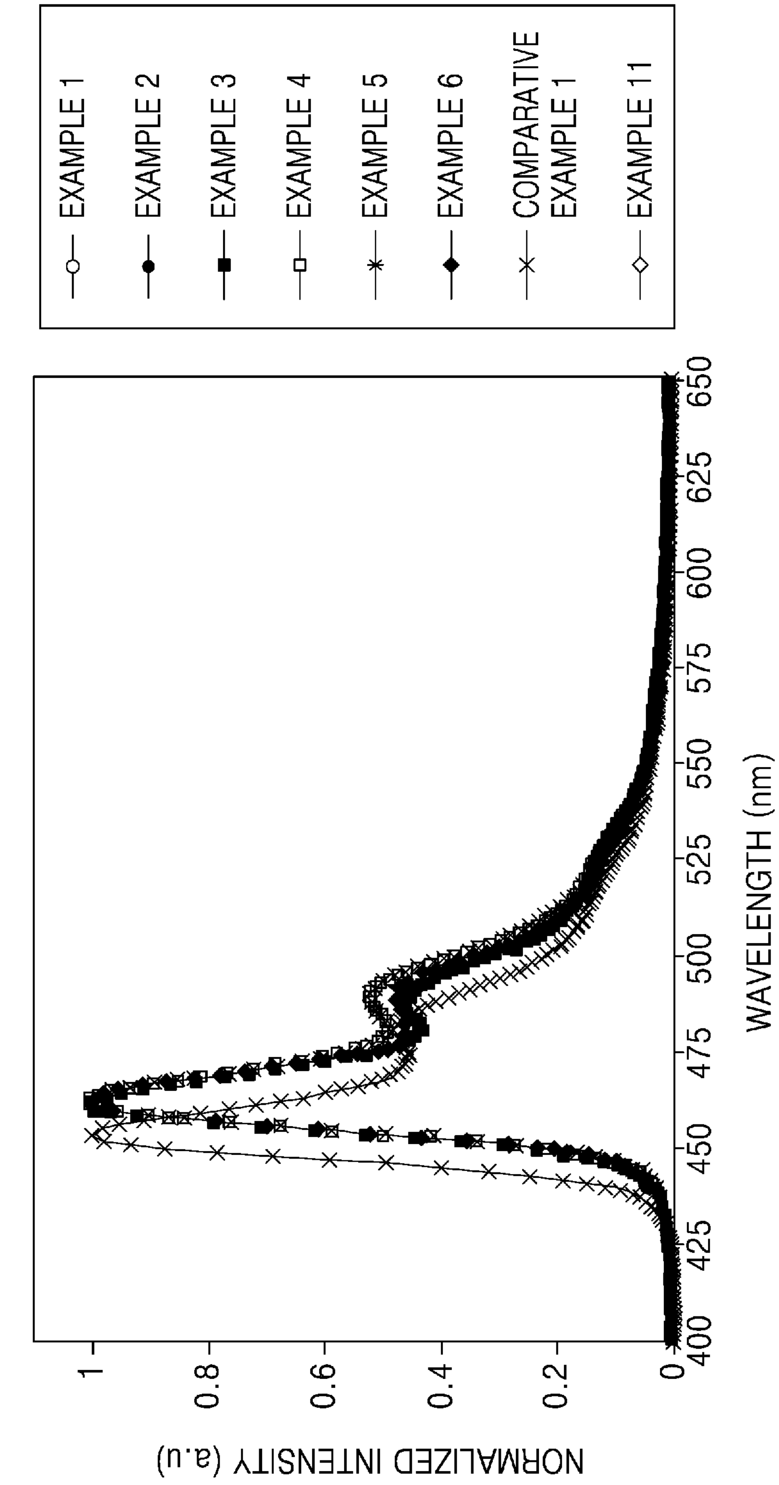
FIG. 4 is a graph showing electroluminescence (EL) spectra of organic light-emitting devices of Examples 1 to 6 and 11 and Comparative Example 1.
Figure 6:
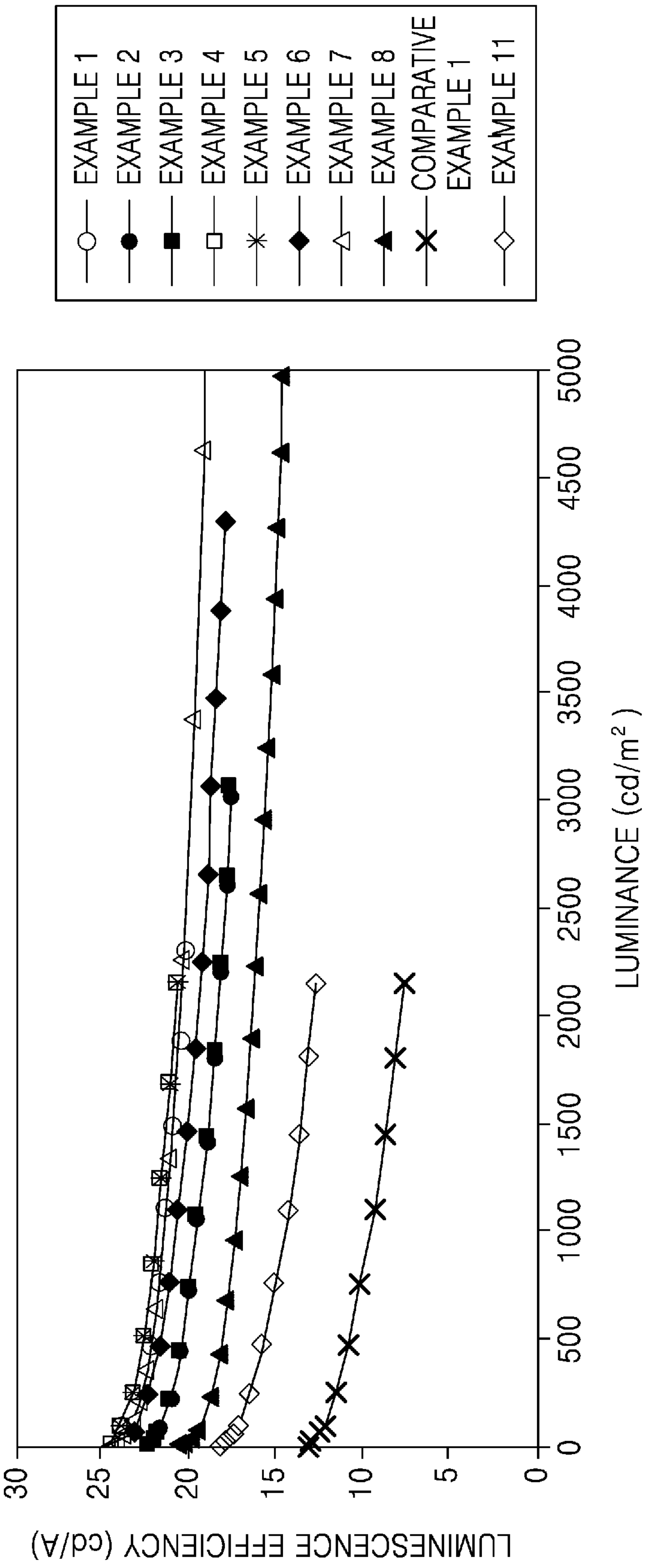
FIG. 6 is a graph of luminance (cd/m$^2$) versus luminescence efficiency (cd/A) of the organic light-emitting devices of Examples 1 to 8 and 11 and Comparative Example 1.
Figure 7:
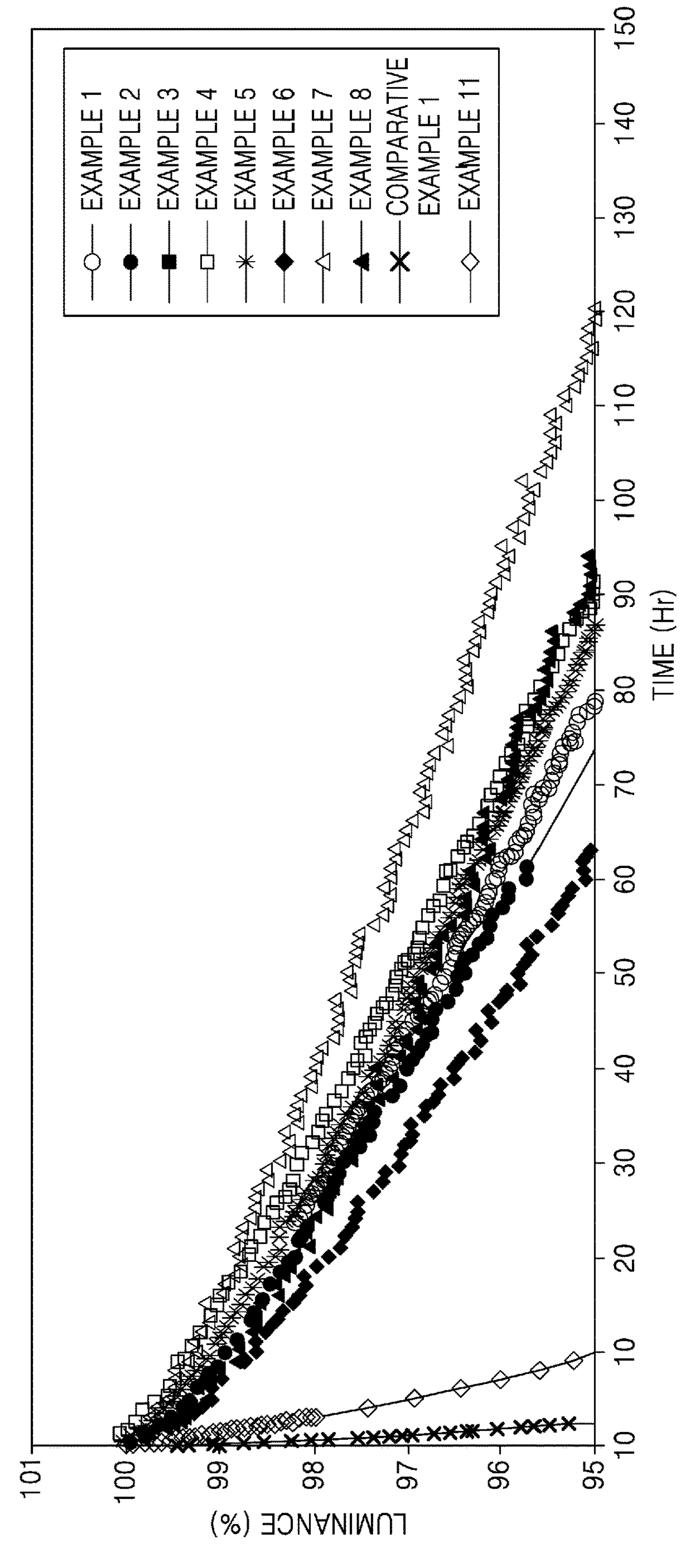
FIG. 7 is a graph of time (hours) versus luminance (percent, %) of the organic light-emitting devices of Examples 1 to 8 and 11 and Comparative Example 1.

The driving voltage (V), color purity (CIEx,y), luminescence efficiency (cd/A), color-conversion efficiency (cd/A/y), maximum emission wavelength (nm), and lifespan ($T_{95}$) at 1,000 cd/m$^2$ of the organic light-emitting devices manufactured in Examples 1 to 6 were measured by using Keithley source-measure unit (SMU) 236 and a luminance meter PR650. The results thereof are shown in Tables 6 and 7. In Table 7, the lifespan ($T_{95}$) indicates a time (in hours) that it took for the luminance of each light-emitting device to decline to 95% of its initial luminance. The electroluminescence spectra, the luminance-luminescence efficiency graph, and the time-luminance graph of Examples 1 to 6 are respectively shown in FIGS. 4, 6, and 7.

TABLE 6

| No. | Dopant First compound | Host Second compound | Host Third compound | Luminance (cd/m$^2$) | Driving voltage (V) | Color purity (CIEx, y) |
|---|---|---|---|---|---|---|
| Example 1 | D6 | ETH66 | HTH29 | 1000 | 5.4 | (0.14, 0.17) |
| Example 2 | D6 | ETH65 | HTH41 | 1000 | 5.5 | (0.14, 0.17) |
| Example 3 | D12 | ETH66 | HTH29 | 1000 | 5.5 | (0.14, 0.17) |
| Example 4 | D27 | ETH66 | HTH29 | 1000 | 5.3 | (0.14, 0.17) |
| Example 5 | D81 | ETH66 | HTH29 | 1000 | 5.3 | (0.14, 0.17) |
| Example 6 | D302 | ETH66 | HTH29 | 1000 | 5.4 | (0.14, 0.17) |

TABLE 7

| No. | Dopant First compound | Host Second compound | Host Third compound | Luminescence efficiency (cd/A) | Color-conversion efficiency (cd/A/y) | Maximum emission wavelength (nm) | Lifespan ($T_{95}$) (hours) |
|---|---|---|---|---|---|---|---|
| Example 1 | D6 | ETH66 | HTH29 | 21.4 | 126.2 | 462 | 78.2 |
| Example 2 | D6 | ETH65 | HTH41 | 19.7 | 118.4 | 462 | 61.1 |
| Example 3 | D12 | ETH66 | HTH29 | 19.7 | 118.3 | 462 | 85.1 |

TABLE 7-continued
| No. | Dopant First compound | Host Second compound | Host Third compound | Luminescence efficiency (cd/A) | Color-conversion efficiency (cd/A/y) | Maximum emission wavelength (nm) | Lifespan ($T_{95}$) (hours) |
|---|---|---|---|---|---|---|---|
| Example 4 | D27 | ETH66 | HTH29 | 21.9 | 126.2 | 463 | 87.2 |
| Example 5 | D81 | ETH66 | HTH29 | 21.9 | 126.4 | 463 | 86.2 |
| Example 6 | D302 | ETH66 | HTH29 | 20.9 | 124.2 | 462 | 63.0 |
D6
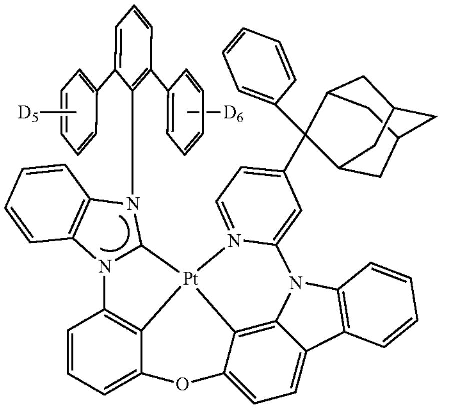
D12
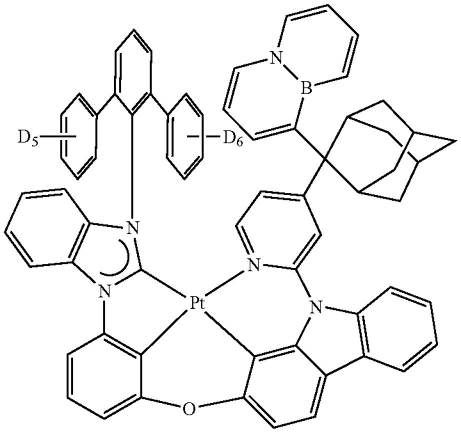
D27
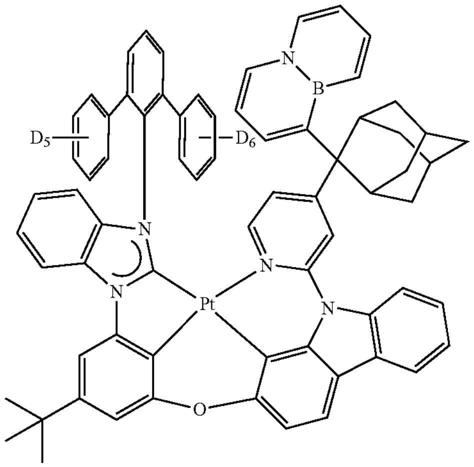
-continued
D81
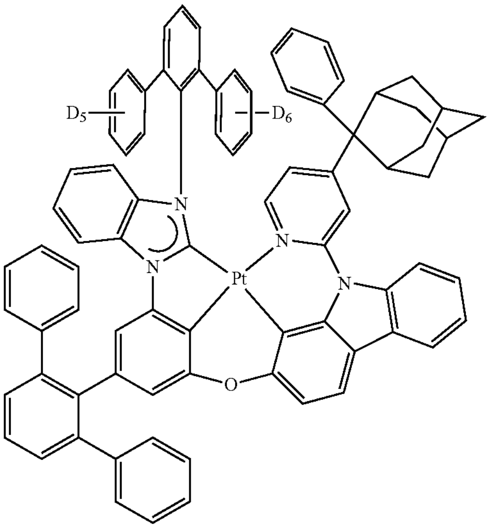
D302
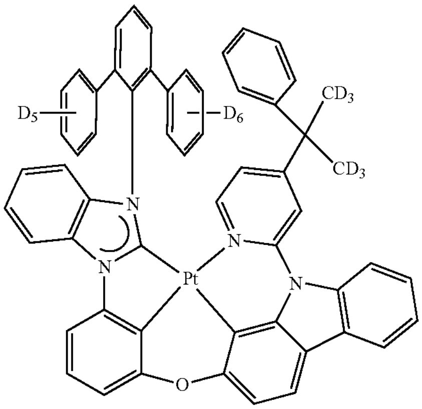
ETH65
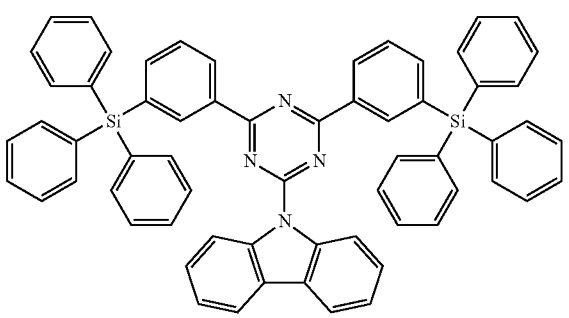

-continued

ETH66

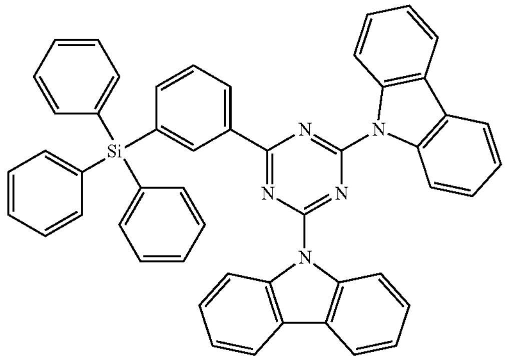

HTH29

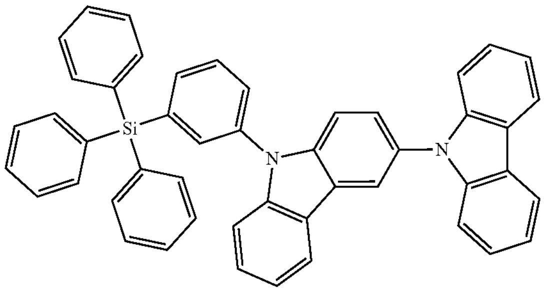

HTH41

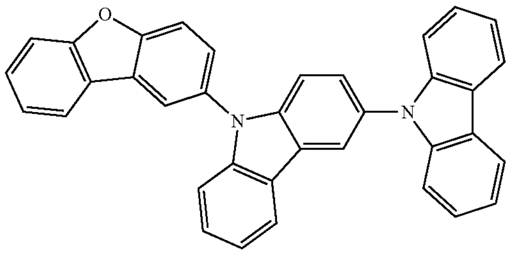

Referring to the results of Tables 6 and 7, the organic light-emitting devices of Examples 1 to 6 were each found to have excellent driving voltage, color purity, luminescence efficiency, color-conversion efficiency, and lifespan characteristics, and to emit dark blue light.

Example 7

An organic light-emitting device was manufactured in substantially the same manner as in Example 1, except that Compound D6 (as the first compound), Compound ETH66 (as the second compound), Compound HTH29 (as the third compound), and Compound DFD1 (as the fourth compound) were vacuum-deposited on the hole transport layer instead of Compound D6 (as the first compound), Compound ETH66 (as the second compound), and Compound HTH29 (as the third compound) in the formation of the emission layer. Here, the content of Compound D6 was 10 wt %, based on 100 wt % of the total weight of the emission layer, the content of Compound DFD1 was 0.5 wt %, based on 100 wt % of the total weight of the emission layer, and the weight ratio of Compound ETH66 to Compound HTH29 was 3:7.

Example 8

An organic light-emitting device was manufactured in substantially the same manner as in Example 7, except that Compound DFD2 was used instead of Compound DFD1 as the fourth compound.

Evaluation Example 5

Figure 5:
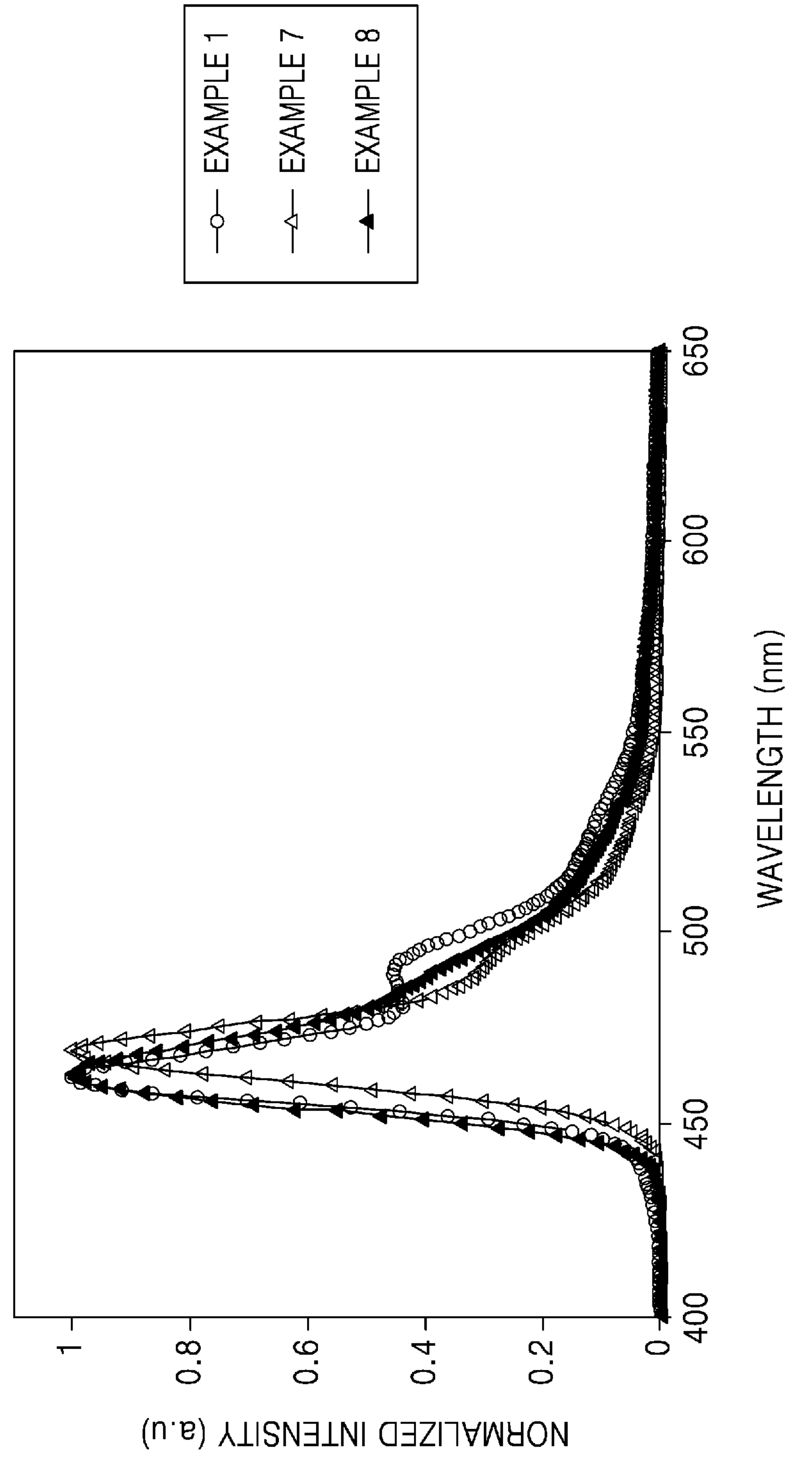
FIG. 5 is a graph of wavelength (nanometers, nm) versus normalized intensity (arbitrary unit, a.u.), showing EL spectra of the organic light-emitting devices of Examples 1, 7, and 8.

The driving voltage (V), color purity (CIEx,y), luminescence efficiency (cd/A), color-conversion efficiency (cd/A/y), maximum emission wavelength (nm), and lifespan ($T_{95}$) at 1,000 cd/m$^2$ of the organic light-emitting devices manufactured in Examples 7 and 8 were measured by using the same methods as those in Evaluation Example 4. The results thereof are shown in Tables 8 and 9. The electroluminescence spectra, the luminance-luminescence efficiency graph, and the time-luminance graph of Examples 7 and 8 are respectively shown in FIGS. 5, 6, and 7.

TABLE 8

| | Dopant | Host | | Ancillary dopant | | Driving | |
|---|---|---|---|---|---|---|---|
| No. | First compound | Second compound | Third compound | Fourth compound | Luminance (cd/m$^2$) | voltage (V) | Color purity (CIEx, y) |
| Example 7 | D6 | ETH66 | HTH29 | DFD1 | 1000 | 4.3 | (0.13, 0.14) |
| Example 8 | D6 | ETH66 | HTH29 | DFD2 | 1000 | 5.6 | (0.14, 0.14) |

TABLE 9

| | Dopant | Host | | Ancillary dopant | Luminescence | Color-conversion | Maximum emission | Lifespan |
|---|---|---|---|---|---|---|---|---|
| No. | First compound | Second compound | Third compound | Fourth compound | efficiency (cd/A) | efficiency (cd/A/y) | wavelength (nm) | ($T_{95}$) (hours) |
| Example 7 | D6 | ETH66 | HTH29 | DFD1 | 21.6 | 152.9 | 469 | 120.3 |
| Example 8 | D6 | ETH66 | HTH29 | DFD2 | 17.4 | 121.8 | 463 | 94.2 |

D6

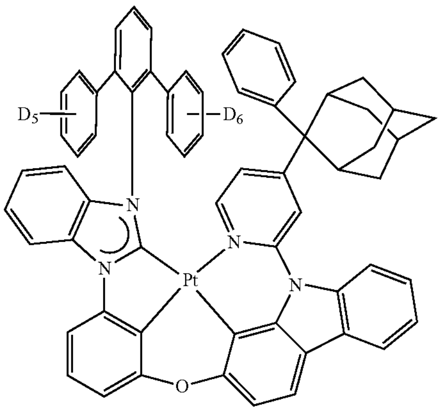

ETH66

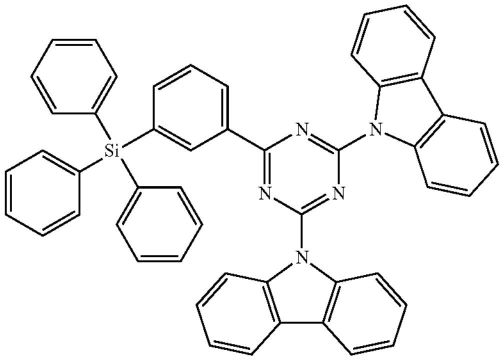

HTH29

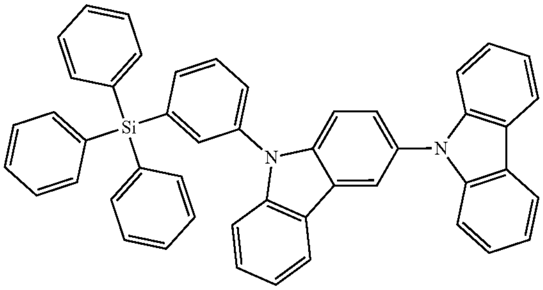

DFD1

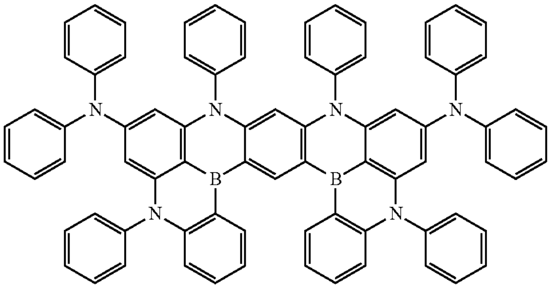

-continued

DFD2

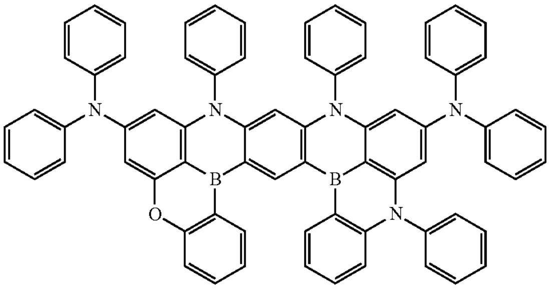

Referring to the results of Tables 8 and 9, the organic light-emitting devices of Examples 7 and 8 were each found to have excellent driving voltage, color purity, luminescence efficiency, color-conversion efficiency, and lifespan characteristics, and to emit dark blue light.

Example 11

An organic light-emitting device was manufactured in substantially the same manner as in Example 1, except that Compound D6 (as the first compound) and Compound HTH29 (as the third compound) were vacuum-deposited on the hole transport layer to form an emission layer having a thickness of 300 Å, instead of Compound D6 (as the first compound), Compound ETH29 (as the second compound), and Compound HTH66 (as the third compound) that were used to form an emission layer having a thickness of 400 Å. Here, the content of Compound D6 was 10 wt %, based on 100 wt % of the total weight of the emission layer.

Comparative Example 1

An organic light-emitting device was manufactured in substantially the same manner as in Example 11, except that Compound CE1 was used instead of Compound D6 to form an emission layer.

Evaluation Example 6

The driving voltage (V), color purity (CIEx,y), luminescence efficiency (cd/A), color-conversion efficiency (cd/A/y), maximum emission wavelength (nm), and lifespan ($T_{95}$ at room temperature) at 1,000 cd/$m^2$ of the organic light-emitting devices manufactured in Example 11 and Comparative Example 1 were measured by using the same methods as those in Evaluation Example 4. The results thereof are shown in Tables 10 and 11. The electroluminescence spectra, the luminance-luminescence efficiency graph, and the time-luminance graph of Example 11 and Comparative Example 1 are respectively shown in FIGS. 4, 6, and 7.

TABLE 10

| No. | Dopant | Host | Luminance (cd/$m^2$) | Driving voltage (V) | Color purity (CIEx, y) |
|---|---|---|---|---|---|
| Example 11 | D6 | HTH29 | 1000 | 6.0 | (0.14, 0.17) |
| Comparative Example 1 | CE1 | HTH29 | 1000 | 6.4 | (0.14, 0.19) |

TABLE 11

| No. | Dopant | Host | Luminescence efficiency (cd/A) | Color-conversion efficiency (cd/A/y) | Maximum emission wavelength (nm) | Lifespan ($T_{95}$) (hours) |
|---|---|---|---|---|---|---|
| Example 11 | D6 | HTH29 | 10.8 | 56.8 | 455 | 5.0 |
| Comparative Example 1 | CE1 | HTH29 | 9.6 | 51.6 | 454 | 2.5 |

D6

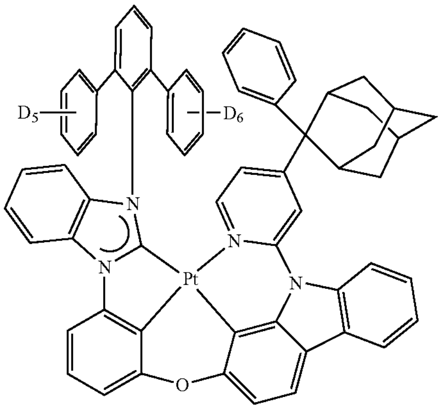

CE1

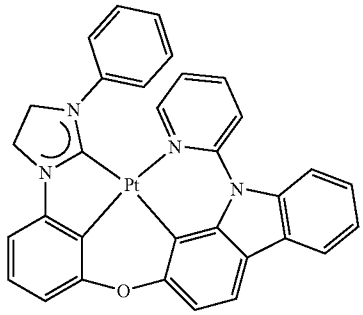

HTH29

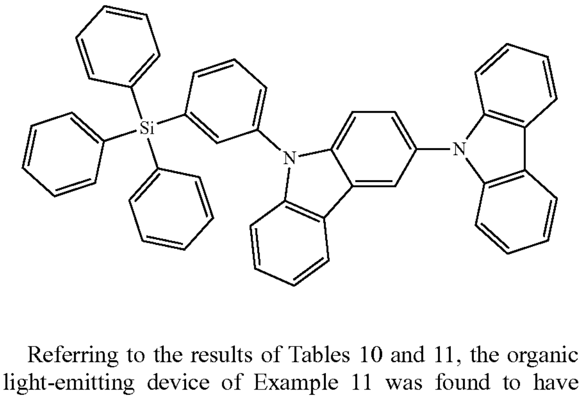

Referring to the results of Tables 10 and 11, the organic light-emitting device of Example 11 was found to have excellent driving voltage, color purity, luminescence efficiency, color-conversion efficiency, and lifespan characteristics, and to emit dark blue light, as compared with Comparative Example 1.

As apparent from the foregoing description, the light-emitting device may have excellent driving voltage, current density, high luminescence efficiency, and long lifespan, and may be used in the manufacture of a high quality electronic apparatus.

As used herein, the terms “use,” “using,” and “used” may be considered synonymous with the terms “utilize,” “utilizing,” and “utilized,” respectively.

In addition, the terms “substantially,” “about,” and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A light-emitting device comprising:

a first electrode;

a second electrode facing the first electrode; and an interlayer between the first electrode and the second electrode, the interlayer comprising an emission layer, wherein the interlayer further comprises:

i) a first compound represented by Formula 1; and ii) a second compound comprising at least one π electron-deficient nitrogen-containing $C_1$-$C_{60}$ cyclic group, a third compound comprising a group represented by Formula 3, or a fourth compound capable of emitting delayed fluorescent light, or any combination thereof, and the first compound, the second compound, the third compound, and the fourth compound are different from one another:

Formula 1

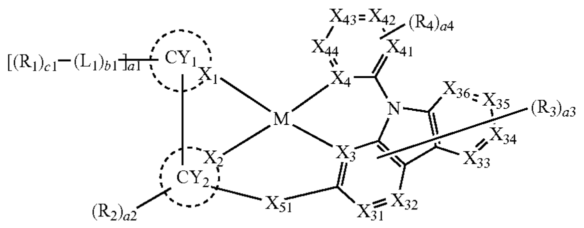

Formula 3

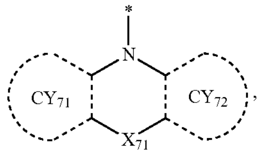

wherein, in Formula 1, M is platinum (Pt), palladium (Pd), gold (Au), nickel (Ni), silver (Ag), or copper (Cu), in Formula 1, $X_1$ to $X_3$ are C and $X_4$ is N, in Formula 1, i) a bond between $X_1$ and M is a coordinate bond, and ii) one of a bond between $X_2$ and M, a bond between $X_3$ and M, and a bond between $X_4$ and M is a coordinate bond, and the other two bonds are each a covalent bond, in Formula 1, ring $CY_1$ is i) a $X_1$-containing 5-membered ring, or ii) a $X_1$-containing 5-membered ring condensed with at least one 6-membered ring, wherein the $X_1$-containing 5-membered ring in ring $CY_1$ in Formula 1 is a pyrrole group, a pyrazole group, an imidazole group, a triazole group, an oxazole group, an isooxazole group, a thiazole group, an isothiazole group, an oxadiazole group, or a thiadiazole group, and the 6-membered ring that is condensed with the $X_1$-containing 5-membered ring in ring $CY_1$ in Formula 1 is a benzene group, a pyridine group, or a pyrimidine group, in Formula 1, ring $CY_2$ is a benzene group, a pyridine group, a pyrimidine group, a naphthalene group, a dibenzofuran group, a dibenzothiophene group, a carbazole group, a fluorene group, or a dibenzosilole group, in Formula 1, $X_{31}$ to $X_{36}$ and $X_{41}$ to $X_{44}$ are each independently C, in Formula 1, $X_{51}$ is *—N($R_5$)—*', *—B($R_5$)—*', *—P($R_5$)—*', *—C($R_{5a}$)($R_{5b}$)—*, *—Si($R_{5a}$)($R_{5b}$)—*', *—Ge($R_{5a}$)($R_{5b}$)—*', *—S—*', *—Se—*', *—O—*', *—C(=O)—*', *—S(=O)—*', *—S(=O)$_2$—*', *—C($R_5$)=*', *=C($R_5$)—*', *—C($R_{5a}$)=C($R_{5b}$)—*', *—C(=S)—*', or *—C≡C—*', and * and *' each indicate a binding site to an adjacent atom, in Formula 1, $L_1$ is a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, in Formula 1, b1 is an integer from 1 to 5, in Formula 1, $R_1$ to $R_5$, $R_{5a}$, and $R_{5b}$ are each independently a group represented by Formula 1-1, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, provided that the $C_1$-$C_{60}$ alkyl group is not substituted with a $C_3$-$C_{60}$ carbocyclic group or a $C_1$-$C_{60}$ heterocyclic group, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), Formula 1-1

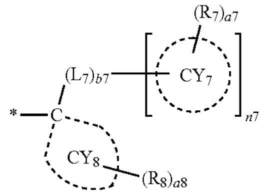

wherein, in Formula 1, c1 is an integer from 0 to 5, a1 and a4 are each independently an integer from 0 to 4, a2 is an integer from 0 to 10, and a3 is an integer from 0 to 6, provided that the sum of a1 to a4 is 1 or greater, and at least one of *-$(L_1)_{b1}$-$(R_1)_{c1}$(s) in the number of a1, at least one of $R_2$(s) in the number of a2, at least one of $R_3$(s) in the number of a3, or at least one of $R_4$(s) in the number of a4, or any combination thereof are each independently the group represented by Formula 1-1, in Formula 1-1, $L_7$ is a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, in Formula 1-1, b7 is an integer from 1 to 5, in Formula 1-1, ring $CY_7$ is a $C_3$-$C_{60}$ carbocyclic group or a $C_1$-$C_{60}$ heterocyclic group, in Formula 1-1, n7 is an integer from 1 to 5, in Formula 1-1, ring $CY_8$ is a non-aromatic $C_3$-$C_{60}$ carbocyclic group or a non-aromatic $C_1$-$C_{60}$ heterocyclic group, in Formula 1-1, $R_7$ and $R_8$ are each understood by referring to the description of $R_1$, in Formula 1-1, a7 and a8 are each independently an integer from 0 to 20, in Formula 3, ring $CY_{71}$ and ring $CY_{72}$ are each independently a π electron-rich $C_3$-$C_{60}$ cyclic group or a pyridine group, in Formula 3, $X_{71}$ is a single bond or a linking group comprising O, S, N, B, C, or Si, or any combination thereof, in Formula 3, * indicates a binding site to an adjacent atom, at least two groups represented by *-$(L_1)_{b1}$-$(R_1)_{c1}$ in the number of a1 are optionally bound to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, at least two of $R_2$(s) in the number of a2 are optionally bound to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, at least two of $R_3$(s) in the number of a3 are optionally bound to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, at least two of $R_4$(s) in the number of a4 are optionally bound to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, at least two of $R_1$ to $R_5$, $R_{5a}$, and $R_{5b}$(s) are optionally bound to form a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, and $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), or —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), or —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; a $C_1$-$C_{60}$ alkyl group unsubstituted or substituted with deuterium, —F, a cyano group, a $C_1$-$C_{60}$ alkyl group, a $C_1$-$C_{60}$ alkoxy group, a phenyl group, a biphenyl group, a pyridinyl group, a pyrimidinyl group, a pyridazinyl group, a pyrazinyl group, a triazinyl group, or any combination thereof; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each independently unsubstituted or substituted with deuterium, —F, a cyano group, a $C_1$-$C_{60}$ alkyl group, a $C_1$-$C_{60}$ alkoxy group, a phenyl group, a biphenyl group, a pyridinyl group, a pyrimidinyl group, a pyridazinyl group, a pyrazinyl group, or a triazinyl group, or any combination thereof, and the following compounds are excluded from the third compound:

CBP

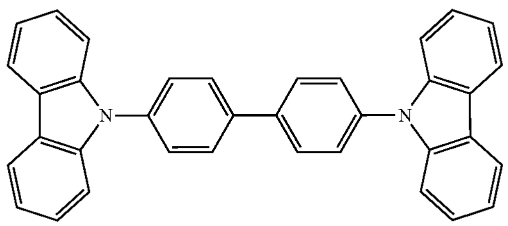

mCBP

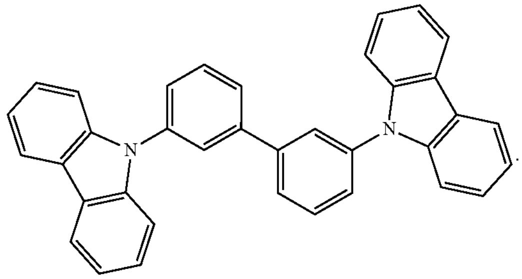

2. The light-emitting device of claim 1, wherein the second compound comprises a pyridine group, a pyrimidine group, a pyrazine group, a pyridazine group, or a triazine group, or any combination thereof.

3. The light-emitting device of claim 1, wherein the interlayer comprises the second compound.

4. The light-emitting device of claim 3, wherein the interlayer further comprises the third compound, or the fourth compound, or any combination thereof.

5. The light-emitting device of claim 1, wherein the fourth compound is a compound comprising at least one cyclic group comprising boron (B) and nitrogen (N) as ring forming atoms.

6. The light-emitting device of claim 5, wherein the fourth compound is a compound represented by Formula 502, or a compound represented by Formula 503, or any combination thereof:

Formula 502

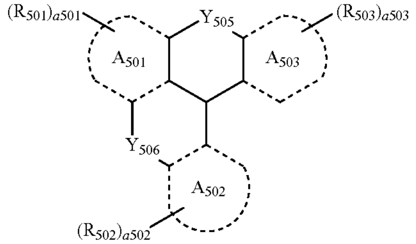

Formula 503

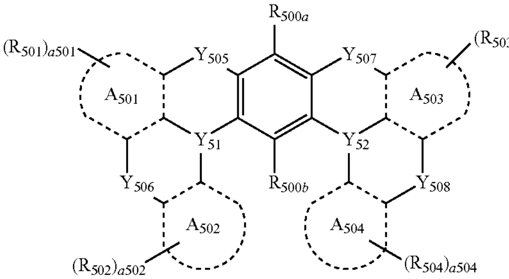

and wherein, in Formulae 502 and 503, ring $A_{501}$ to ring $A_{504}$ are each independently a $C_3$-$C_{60}$ carbocyclic group or a $C_1$-$C_{60}$ heterocyclic group, $Y_{505}$ is O, S, $N(R_{505})$, $B(R_{505})$, $C(R_{505a})(R_{505b})$, or $Si(R_{505a})(R_{505b})$, $Y_{506}$ is O, S, $N(R_{506})$, $B(R_{506})$, $C(R_{506a})(R_{506b})$, or $Si(R_{506a})(R_{506b})$, $Y_{507}$ is O, S, $N(R_{507})$, $B(R_{507})$, $C(R_{507a})(R_{507b})$, or $Si(R_{507a})(R_{507b})$, $Y_{508}$ is O, S, $N(R_{508})$, $B(R_{508})$, $C(R_{508a})(R_{508b})$, or $Si(R_{508a})(R_{508b})$, $Y_{51}$ and $Y_{52}$ are each independently B, P(=O), or S(=O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, and a501 to a504 are each independently an integer from 0 to 20.

7. The light-emitting device of claim 1, wherein the fourth compound comprises a condensed ring in which at least one third ring is condensed with at least one fourth ring, the third ring is a cyclopentane group, a cyclohexane group, a cycloheptane group, a cyclooctane group, a cyclopentene group, a cyclohexene group, a cycloheptene group, a cyclooctene group, an adamantane group, a norbornene group, a norobornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and the fourth ring is a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

8. The light-emitting device of claim 1, wherein the interlayer comprises the fourth compound.

9. The light-emitting device of claim 1, wherein the emission layer comprises: i) the first compound; and ii) the second compound, the third compound, or the fourth compound, or any combination thereof, and the first compound is to emit phosphorescent light or fluorescent light, and the emission layer is to emit the phosphorescent light or the fluorescent light emitted from the first compound.

10. The light-emitting device of claim 1, wherein the first compound is to emit phosphorescent light or fluorescent light, and the phosphorescent light or the fluorescent light is blue light.

11. The light-emitting device of claim 1, wherein, in Formula 1, a4 is an integer from 1 to 4, and one or more of $R_4$(s) in the number of a4 are each independently the group represented by Formula 1-1 .

12. The light-emitting device of claim 1, wherein, in Formula 1-1, ring $CY_7$ is i) a first ring, ii) a second ring, iii) a condensed ring in which at least two first rings are condensed, iv) a condensed ring in which at least two second rings are condensed, or v) a condensed ring in which at least one first ring and at least one second ring are condensed, the first ring is a cyclopentane group, a cyclohexane group, a cycloheptane group, a cyclooctane group, a cyclopentene group, a cyclohexene group, a cycloheptene group, a cyclooctene group, an adamantane group, a norbornene group, a norobornane group, a bicyclo[1.1.1]pentane group, a bicyclo[2.1.1]hexane group, a bicyclo[2.2.2]octane group, or a benzene group, and the second ring is a pyrrole group, a furan group, a thiophene group, a silole group, a pyrazole group, an imidazole group, a triazole group, an oxazole group, an isooxazole group, a thiazole group, an isothiazole group, an oxadiazole group, a thiadiazole group, a pyridine group, a pyrimidine group, a pyridazine group, a pyrazine group, a triazine group, a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

13. The light-emitting device of claim 1, wherein, in Formula 1-1, ring $CY_8$ is a cyclopentane group, a cyclohexane group, a cycloheptane group, a cyclooctane group, a cyclopentene group, a cyclohexene group, a cycloheptene group, a cyclooctene group, an adamantane group, a norbornene group, a norobornane group, a bicyclo[1.1.1]pentane group, a bicyclo[2.1.1]hexane group, or a bicyclo[2.2.2]octane group.

14. The light-emitting device of claim 1, wherein, in Formula 1-1, ring $CY_8$ is a group represented by one of Formulae CY8-1 to CY8-8:

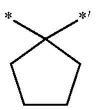

CY8-1

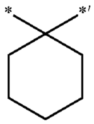

CY8-2

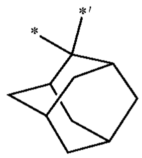

CY8-3

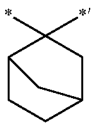

CY8-4

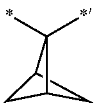

CY8-5

-continued

CY8-6

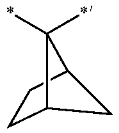

CY8-7

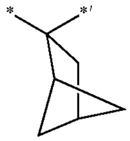

CY8-8

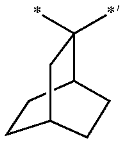

and wherein, in Formulae CY8-1 to CY8-8, * indicates a binding site to an adjacent atom in Formula 1, and *' indicates a binding site to $L_7$ in Formula 1-1.

15. The light-emitting device of claim 1, wherein the second compound comprises a compound represented by Formula 2:

Formula 2

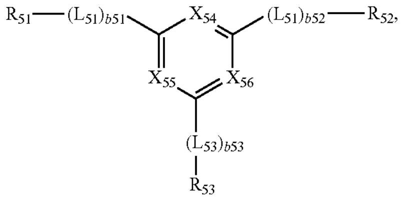

wherein, in Formula 2, $L_{51}$ to $L_{53}$ are each independently a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b51 to b53 are each independently an integer from 1 to 5, $X_{54}$ is N or $C(R_{54})$, $X_{55}$ is N or $C(R_{55})$, $X_{56}$ is N or $C(R_{56})$, and at least one selected from $X_{54}$ to $X_{56}$ is N, and $R_{51}$ to $R_{56}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$.

16. The light-emitting device of claim 1, wherein the third compound comprises a compound represented by Formula 3-1, a compound represented by Formula 3-2, a compound represented by Formula 3-3, a compound represented by Formula 3-4, or a compound represented by Formula 3-5, or any combination thereof:

Formula 3-1

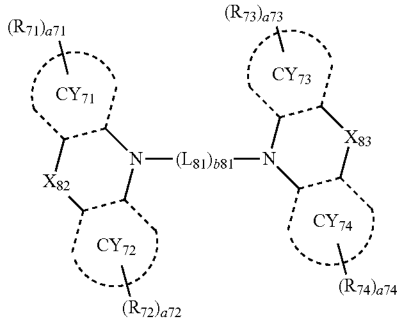

Formula 3-2

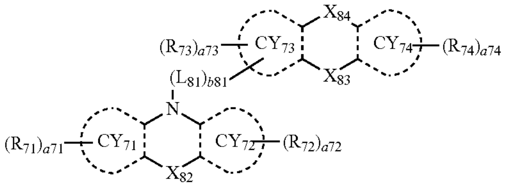

-continued

Formula 3-3

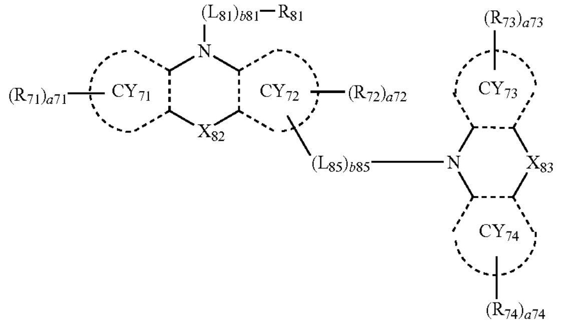

Formula 3-4

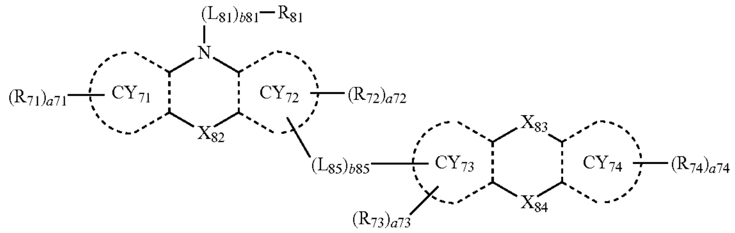

Formula 3-5

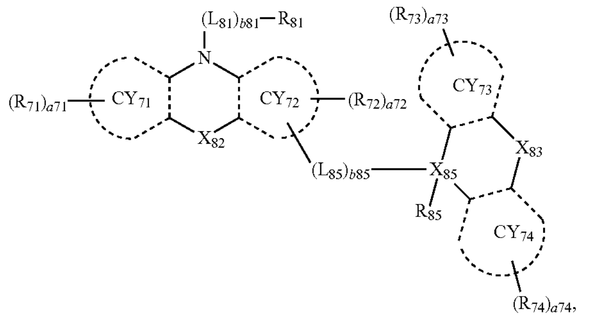

wherein, in Formulae 3-1 to 3-5, ring $CY_{71}$ to ring $CY_{74}$ are each independently a π electron-rich $C_3$-$C_{60}$ cyclic group or a pyridine group, $X_{82}$ is a single bond, O, S, N-[$(L_{82})_{b82}$-$R_{82}$], $C(R_{82a})(R_{82b})$, or $Si(R_{82a})(R_{82b})$, $X_{83}$ is a single bond, O, S, N-[$(L_{83})_{b83}$-$R_{83}$], $C(R_{83a})(R_{83b})$, or $Si(R_{83a})(R_{83b})$, $X_{84}$ is O, S, N-[$(L_{84})_{b84}$-$R_{84}$], $C(R_{84a})(R_{84b})$, or $Si(R_{84a})(R_{84b})$, $X_{85}$ is C or Si, $L_{81}$ to $L_{85}$ are each independently a single bond, *—$C(Q_4)(Q_5)$-*', *—$Si(Q_4)(Q_5)$-*, a π electron-rich $C_3$-$C_{60}$ cyclic group unsubstituted or substituted with at least one $R_{10a}$, or a pyridine group unsubstituted or substituted with at least one $R_{10a}$, wherein $Q_4$ and $Q_5$ are each understood by referring to the description of $Q_1$, b81 to b85 are each independently an integer from 1 to 5, and $R_{71}$ to $R_{74}$, $R_{81}$ to $R_{85}$, $R_{82a}$, $R_{82b}$, $R_{83a}$, $R_{83b}$, $R_{84a}$, and $R_{84b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —C(=)$(Q_1)$, —$S(=O)_2(Q_1)$, or —$P(=O)(Q_1)(Q_2)$, a71 to a74 are each independently an integer from 0 to 20,

* and *' each indicate a binding site to an adjacent atom.

17. An electronic apparatus comprising the light-emitting device of claim 1.

18. The electronic apparatus of claim 17, further comprising a thin-film transistor, wherein the thin-film transistor comprises a source electrode and a drain electrode, and the first electrode of the light-emitting device is electrically connected to one of the source electrode or the drain electrode of the thin-film transistor.

19. The electronic apparatus of claim 17, further comprising: a color filter, a color-conversion layer, a touchscreen layer, and/or a polarization layer.

* * * * *